US008090549B2

(12) United States Patent
Swarztrauber et al.

(10) Patent No.: US 8,090,549 B2

(45) **Date of Patent: *Jan. 3, 2012**

(54) APPARATUS AND METHODS FOR MULTI-CHANNEL METERING

(75) Inventors: Sayre Swarztrauber, New York, NY (US); Doron Shafrir, Suffern, NY (US); Siddharth Malik, New York, NY (US); Robert Hayward, Belleville (CA)

(73) Assignee: Quadlogic Controls Corporation, Long Island City, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/541,852

(22) Filed: Aug. 14, 2009

(65) Prior Publication Data

US 2010/0156664 A1 Jun. 24, 2010

Related U.S. Application Data

(60) Continuation of application No. 11/600,234, filed on Nov. 14, 2006, now Pat. No. 7,596,459, and a continuation-in-part of application No. 11/431,849, filed on May 9, 2006, now Pat. No. 7,539,581, which is a division of application No. 11/030,417, filed on Jan. 6, 2005, now Pat. No. 7,054,770, which is a division of application No. 09/795,838, filed on Feb. 28, 2001, now Pat. No. 6,947,854.

(60) Provisional application No. 60/737,580, filed on Nov. 15, 2005, provisional application No. 60/739,375, filed on Nov. 23, 2005, provisional application No. 60/813,901, filed on Jun. 15, 2006.

(51) Int. Cl.
*G01R 21/00* (2006.01)

(52) U.S. Cl. ........... 702/62; 702/116; 702/122; 702/189

(58) Field of Classification Search .................... 702/57, 702/60–62, 116, 122, 188, 189; 340/565, 340/568.2, 870.02, 870.03; 324/110, 500, 324/509
See application file for complete search history.

(56) References Cited

U.S. PATENT DOCUMENTS 3,857,027 A * 12/1974 Carlson et al. ................. 703/18
4,218,655 A 8/1980 Johnston et al.
4,668,934 A 5/1987 Shuey (Continued)

OTHER PUBLICATIONS

PCT International Search Report; PCT/US06/44762; Mar. 11, 2008.

(Continued)

*Primary Examiner* — Mohamed Charioui
*Assistant Examiner* — Elias Desta
(74) *Attorney, Agent, or Firm* — Cowan, Liebowitz & Latman; Steven D. Underwood

(57) ABSTRACT

A device for measuring electricity usage is disclosed. The device is capable of remote disconnection via power line communication and detecting electricity theft, tampering, and reverse voltage. In another aspect, the device is capable of multi-channel metering of electricity, using: (a) a meter head operable to measure electricity usage for a plurality of electricity consumer lines; (b) a transponder operable to transmit data received from the meter head via power line communication to a remotely located computer, and to transmit data received via power line communication from the remotely located computer to the meter head; and (c) a load control module operable to actuate connection and disconnection of each of a plurality of relays, each relay of the plurality of relays corresponding to one of the plurality of electricity consumer lines.

21 Claims, 352 Drawing Sheets

U.S. PATENT DOCUMENTS

| | | | | |
|---|---|---|---|---|
| 4,700,188 | A | 10/1987 | James | |
| 5,422,565 | A | 6/1995 | Swanson | |
| 5,862,391 | A | 1/1999 | Salas et al. | |
| 5,963,146 | A | 10/1999 | Johnson et al. | |
| 6,301,527 | B1 * | 10/2001 | Butland et al. | 700/286 |
| 6,618,628 | B1 * | 9/2003 | Davlin et al. | 700/3 |
| 7,596,459 | B2 * | 9/2009 | Swarztrauber et al. | 702/62 |
| 2003/0001754 | A1 | 1/2003 | Johnson et al. | |
| 2004/0257005 | A1 | 12/2004 | Poehlman et al. | |
| 2005/0137813 | A1 | 6/2005 | Swarztrauber | |

OTHER PUBLICATIONS

Hakki Cavdar, a Solution to Remote Detection of Illegal Electricity Usage via Power Lime Communications, IEEE Trans. On Power Delivery, Oct. 2004, vol. 19, No. 4, pp. 1663-1667.

* cited by examiner

| | | | | | | |
|---|---|---|---|---|---|---|
| FIG.6A | FIG.6B | FIG.6C | FIG.6D | FIG.6E | FIG.6F | FIG.6G |
| FIG.6H | FIG.6I | FIG.6J | FIG.6K | FIG.6L | FIG.6M | FIG.6N |
| FIG.6O | FIG.6P | FIG.6Q | FIG.6R | FIG.6S | FIG.6T | FIG.6U |

FIG.6

| | | | | |
|---|---|---|---|---|
| FIG.8C-1 | FIG.8C-2 | FIG.8C-3 | FIG.8C-4 | FIG.8C-5 |
| FIG.8C-6 | FIG.8C-7 | FIG.8C-8 | FIG.8C-9 | FIG.8C-10 |

NOTE: FOR INPUTS 1 AND 2, REFER TO H4 OF FIG.3

FIG.8C

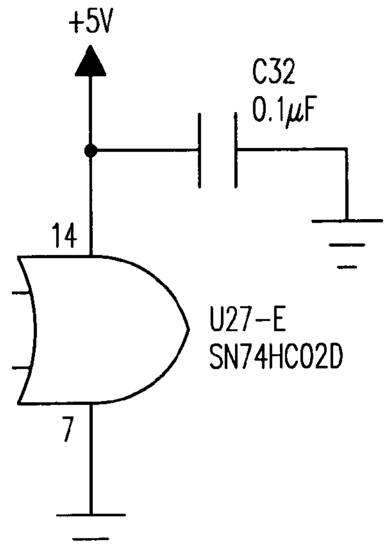
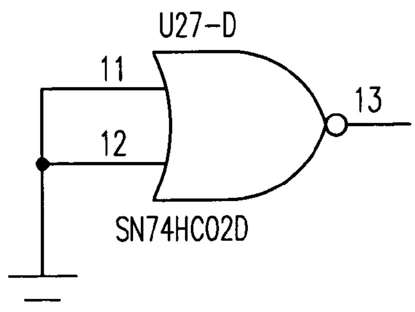
FIG.8C-10

TO RJ11 OPTION BOARD

BUS BAR B

BUS BAR A

TRANSITION BAR FOR PHASES
A AND C

TRANSITION BAR FOR
PHASE B

ACCEPTOR MODULE

ACCEPTOR MODULE

ACCEPTOR MODULE

SENSING AND RELAYING MODULE

METER V PCB203

KWH LEDS PCB203

EG24 BLADE METER PCB203

EG24 BLADE METER PCB203

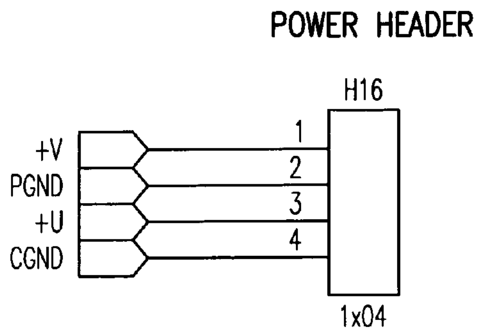
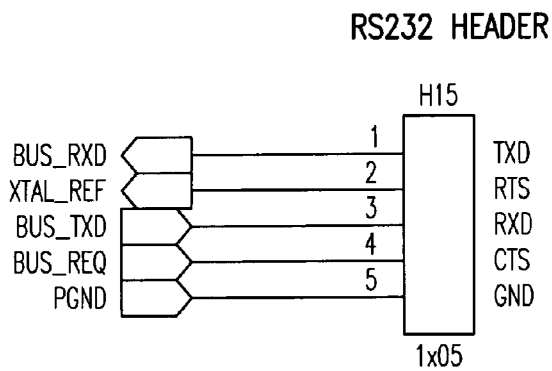
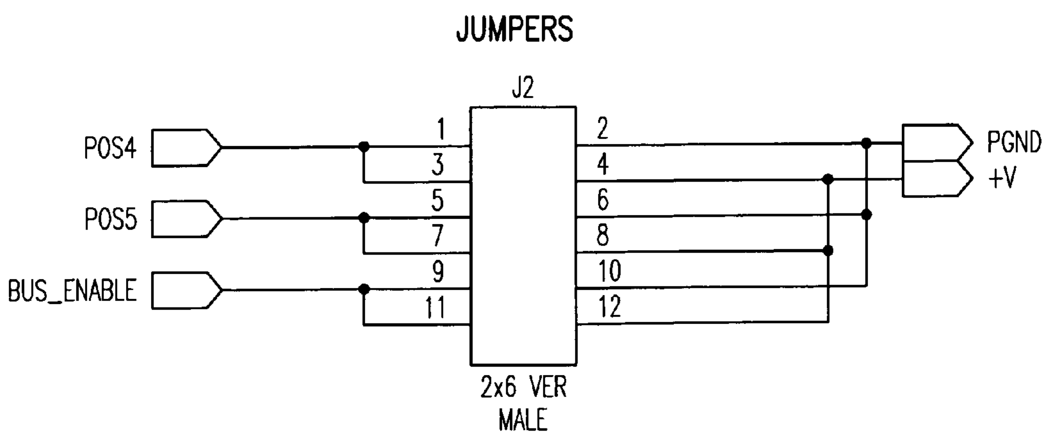
FIG.28C-2

PCB230 POWER SUPPLY

GP10 PCB230

CPU SCH202-3

METER I PCB202-3

| | | |
|---|---|---|
| FIG.31H-1 | FIG.31H-2 | FIG.31H-3 |
| FIG.31H-4 | FIG.31H-5 | FIG.31H-6 |
| FIG.31H-7 | FIG.31H-8 | FIG.31H-9 |

FIG.31H

PLC SCH202-3

SERIAL I/O

DSP

FLASH MEMORY

METER I PCB202-3

PLC RCV PCB202-3

PLC SCH202-3

LEDS/SWITCHES PCB202-3

ID HARDWARE BLOCK DIAGRAM

APPARATUS AND METHODS FOR MULTI-CHANNEL METERING

CROSS-REFERENCE TO RELATED APPLICATIONS

This application is a continuation of U.S. patent application Ser. No. 11/600,234 (now U.S. Pat. No. 7,596,459), filed Nov. 14, 2006, which claims the benefit of U.S. Provisional Patent Application No. 60/737,580, filed Nov. 15, 2005, U.S. Provisional Patent Application No. 60/739,375, filed Nov. 23, 2005, and U.S. Provisional Application No. 60/813,901, filed Jun. 15, 2006, and is a continuation-in-part of U.S. patent application Ser. No. 11/431,849, filed May 9, 2006 now U.S. Pat. No. 7,539,581, which is a divisional of U.S. patent application Ser. No. 11/030,417, filed Jan. 6, 2005 (now U.S. Pat. No. 7,054,770), which is a divisional of U.S. patent application Ser. No. 09/795,838, filed Feb. 28, 2001 (now U.S. Pat. No. 6,947,854). The entire contents of each of those applications are incorporated herein by reference.

BACKGROUND AND SUMMARY

One embodiment of the present invention comprises a metering device that is related to the Quadlogic ASIC-based family of meters (see U.S. Pat. No. 6,947,854, and U.S. Pat. App. Pub. No. 20060036388, the entire contents of which are incorporated herein by reference). Specifically, this embodiment (referred to herein for convenience as “Energy Guard”) is a multi-channel meter that preferably is capable of providing much of the functionality of the above-mentioned family of meters, and further provides the improvements, features, and components listed below.

Used in at least one embodiment, a MiniCloset is a 24-channel metering device that can measure electric usage for up to 24 single-phase customers, 12 two-phase customer, or 8 three-phase customers. Preferably connected to the MiniCloset are one or more Load Control Modules (LCMs), discussed below.

Energy Guard preferably comprises a MiniCloset meter head module and two LCMs mounted into a steel box. Relays that allow for an electricity customer to be remotely disconnected and reconnected, along with current transformers, also are mounted into the box. See FIG. 1.

Upon installation, an electricity customer’s electricity supply line is tapped off the main electric feeder, passed through the Energy Guard apparatus, and run directly to the customer’s home. The construction and usage of the Energy Guard will be apparent to those skilled in the art upon review of the description below and related figures. Source code is supplied in the attached Appendix.

Energy Guard meters preferably are operable to provide:

(A) Remote Disconnect/Reconnect: The meter supports full duplex (bi-directional) communication via power line communication (“PLC”) and may be equipped with remotely operated relays (60 amp, 100 amp, or 200 amp) that allow for disconnect and reconnect of electric users remotely.

(B) Theft Prevention: The system is designed with three specific features to prevent theft. First, an Energy Guard apparatus preferably is installed on a utility pole above the medium-tension lines, making it difficult for customers to reach and tamper with. Second, because there are no additional signal wires with the system (i.e., all communication is via the power line), any severed communication wires are immediately detectable. That is, if a communication wire is cut, service is cut, which is readily apparent. A third theft prevention feature is that the meter may be used to measure the transformer energy in order to validate the measured totals of individual clients. Discrepancies can indicate theft of power.

(C) Tamper Detection: The Energy Guard preferably provides two modes of optical tamper detection. Each unit contains a light that reflects against a small mirror-like adhesive sticker. The absence of this reflective light indicates that the box has been opened. This detection will automatically disconnect all clients measured by that Energy Guard unit. In addition, if the Energy Guard enclosure is opened and ambient light enters, this will also automatically disconnect all clients measured by that Energy Guard unit. These two modes of tamper detection are continuously engaged and alternate multiple times per second for maximum security.

(D) Reverse Voltage Detection: In some cases, a utility company can disconnect power to an individual client and that client is able to obtain power via an alternative feed. If the utility were to reconnect power under these conditions, damage could occur to the metering equipment and/or the distribution system. Energy Guard preferably is able to detect this fault condition. The Energy Guard can detect any voltage that feeds back into the open disconnect through the lines that connect to the customers’ premises. If voltage is detected, the firmware of the Energy Guard will automatically prevent the reconnection.

(E) Pre-Payment: Pre-payment for energy can be done via phone, electronic transaction, or in person. The amount of kWh purchased is transmitted to the meter and stored in its memory. The meter will count down, showing how much energy is still available before reaching zero and disconnecting. As long as the customer continues to purchase energy, there will be no interruption in service, and the utility company will have a daily activity report.

(F) Load Limiting: As an alternative to disconnection for nonpayment or part of a pre-payment system, Energy Guard meters can allow the utility to remotely limit the power delivered to a set level, disconnecting when that load is exceeded. If the customer exceeds that load and is disconnected, the customer can reset a button on the optional remote display unit to restore load as long as the connected load is less than the pre-set limit. Alternatively, clients can call an electric utility service line by telephone to have the service restored. This feature allows electric utilities to provide electricity for critical systems even, for example, in the case of a non-paying customer.

(G) Monthly Consumption Limiting: Some customers benefit from subsidized rates and are given a maximum total consumption per month. The Energy Guard firmware is capable of shutting down power when a certain consumption level is reached. However, this type of program is best implemented when advanced notification to customers is provided. This can be achieved either with a display in the home whereby a message or series of messages notifies customers that their rate of consumption is approaching the projected consumption for the month. Alternatively (or in conjunction) timed service interruptions can be programmed so that as the limit is approaching, power is disconnected for periods of time with longer and longer increments to notify the residents. These planned interruptions in service act as a warning to customers that their limit is nearing so that they have time to alter their consumption patterns.

(H) Meter Validation: The integrated module of the system preferably is removable. This permits easy laboratory re-validation of meter accuracy in the event of client billing disputes.

(I) Operational Benefits for Utility: The Energy Guard has extensive onboard event logs and diagnostic functions, providing field technicians with a wealth of data for commissioning and trouble shooting the electrical and communication systems. Non billing parameters include: amps, volts, temperature, total harmonic distortion, frequency, instantaneous values of watts, vars and volt-amperes, V2 hrs, 12 hrs, power factor, and phase angle.

These features and others will be apparent to those skilled in the art after reviewing the attached descriptions, software code, and schematics.

In one aspect, the invention comprises a device for measuring electricity usage, comprising: means for remote disconnection via power line communication; means for detection of electricity theft; means for tamper detection; and means for reverse voltage detection.

In another aspect, the invention comprises an apparatus for multi-channel metering of electricity, comprising: (a) a meter head operable to measure electricity usage for a plurality of electricity consumer lines; (b) a transponder in communication with the meter head and operable to transmit data received from the meter head via power line communication to a remotely located computer, and to transmit data received via power line communication from the remotely located computer to the meter head; and (c) a load control module in communication with the meter head and operable to actuate connection and disconnection of each of a plurality of relays, each relay of the plurality of relays corresponding to one of the plurality of electricity consumer lines.

In various embodiments: (1) the apparatus further comprises a tamper detector in communication with the meter head; (2) the tamper detector comprises a light and a reflective surface, and the meter head is operable to instruct the load control module to disconnect all of the customer lines if the tamper detector provides notification that the light is not detected reflecting from the reflective surface; (3) the apparatus further comprises a box containing the meter head, the load control module, and the relays, and wherein the tamper detector comprises a detector of ambient light entering the box; (4) the apparatus further comprises a box containing the meter head, the load control module, and the relays, and wherein the box is installed on a utility pole; (5) the apparatus further comprises means for comparing transformer energy to total energy used by the consumer lines; (6) the apparatus further comprises means for detecting reverse voltage flow through the consumer lines; (7) the apparatus further comprises a computer readable memory in communication with the meter head and a counter in communication with the meter head, the counter corresponding to a customer line and operable to count down an amount of energy stored in the memory, and the meter head operable to send a disconnect signal to the load control module to disconnect the customer line when the counter reaches zero; (8) the apparatus further comprises a computer readable memory in communication with the meter head, the memory operable to store a load limit for a customer line, and the meter head operable to send a disconnect signal to the load control module to disconnect the customer line when the load limit is exceeded; (9) the apparatus further comprises a computer readable memory in communication with the meter head, the memory operable to store a usage limit for a customer line, and the meter head operable to send a disconnect signal to the load control module to disconnect the customer line when the usage limit is exceeded; (10) the transponder is operable to communicate with the remotely located computer over medium tension power lines; (11) the apparatus further comprises a display unit in communication with the meter head and operable to display data received from the meter head; (12) the display unit is operable to display information regarding a customer's energy consumption; (13) the display unit is operable to display warnings regarding a customer's energy usage or suspected theft of energy; and (14) the display unit is operable to transmit to said meter head information entered by a customer.

DETAILED DESCRIPTION OF PREFERRED EMBODIMENTS

In one embodiment, an Energy Guard metering apparatus comprises a MiniCloset (that is, a metering apparatus operable to meter a plurality of customer lines); a Scan Transponder; one or more relays operable to disconnect service to selected customers; a Load Control Module; and optical tamper detection means.

The MiniCloset and Scan Transponder referred to herein are largely the same as described in U.S. Pat. No. 6,947,854. That is, although each has been improved over the years, the functionality and structure relevant to this description may be taken to be the same as described in that patent.

One aspect of the invention comprises taking existing multichannel metering functionality found in the MiniCloset and adding remote connect and disconnect via PLC. Providing such additional functionality required adding new hardware and software. The added hardware comprises a Load Control Module (LCM) and connect/disconnect relays. Also added was support circuitry to route signal traces to and from the main meter processor—the MiniCloset5 Meter Head. The software additions include code modules that communicate with the added hardware, as described in the tables below.

Figure 1:
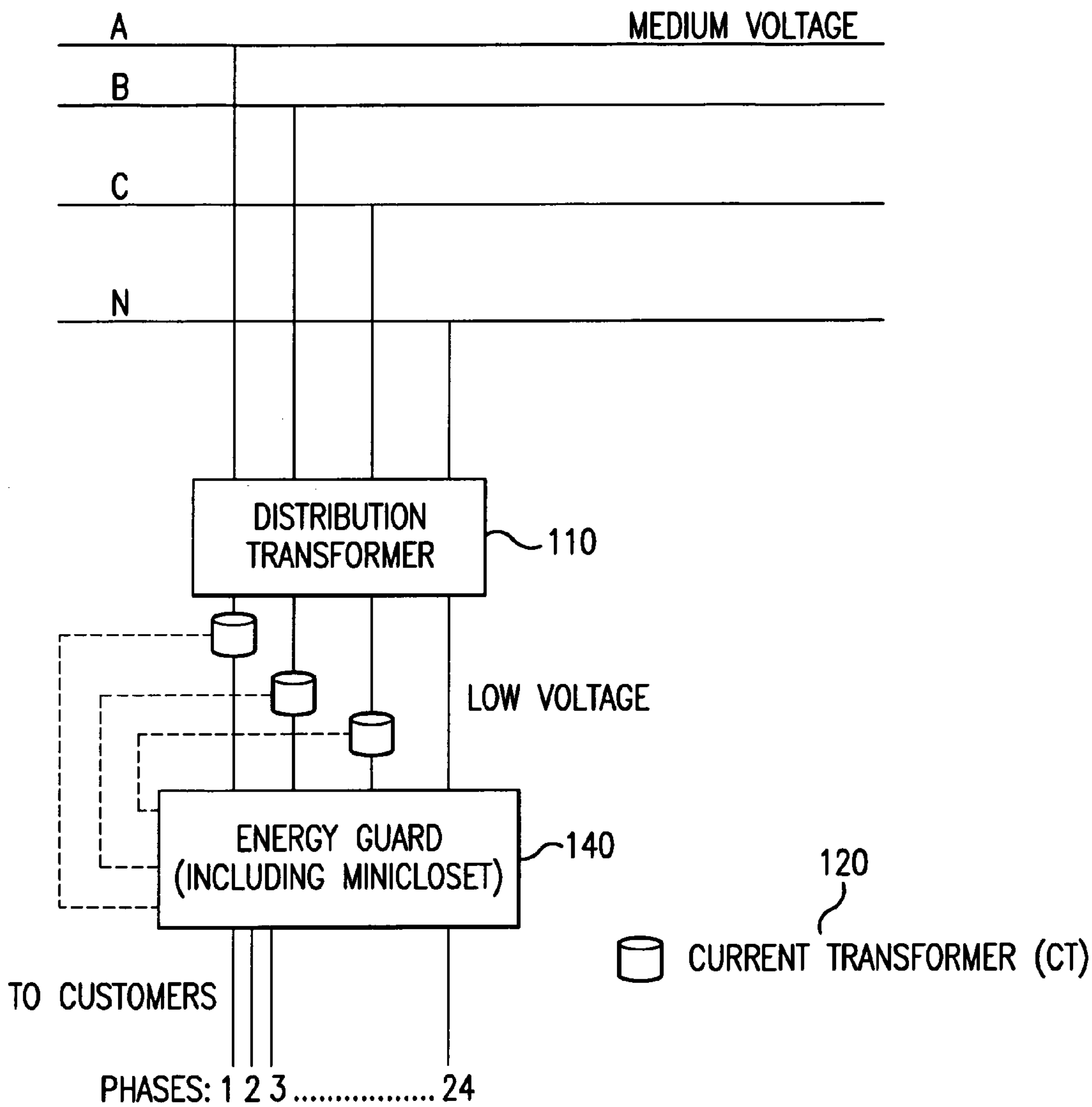
FIG. 1 is a block/wiring diagram showing connection of preferred embodiments.

FIG. 1 is a block diagram of connections of a preferred embodiment. Medium voltage power lines A, B, C, and N (neutral) feed into Distribution Transformer 110. Low voltage lines connect (via current transformers 120) Distribution Transformer 110 to Energy Guard unit 140. Energy Guard unit 140 monitors current transformers 120, and feeds single phase customer lines 1-24.

Figure 2:
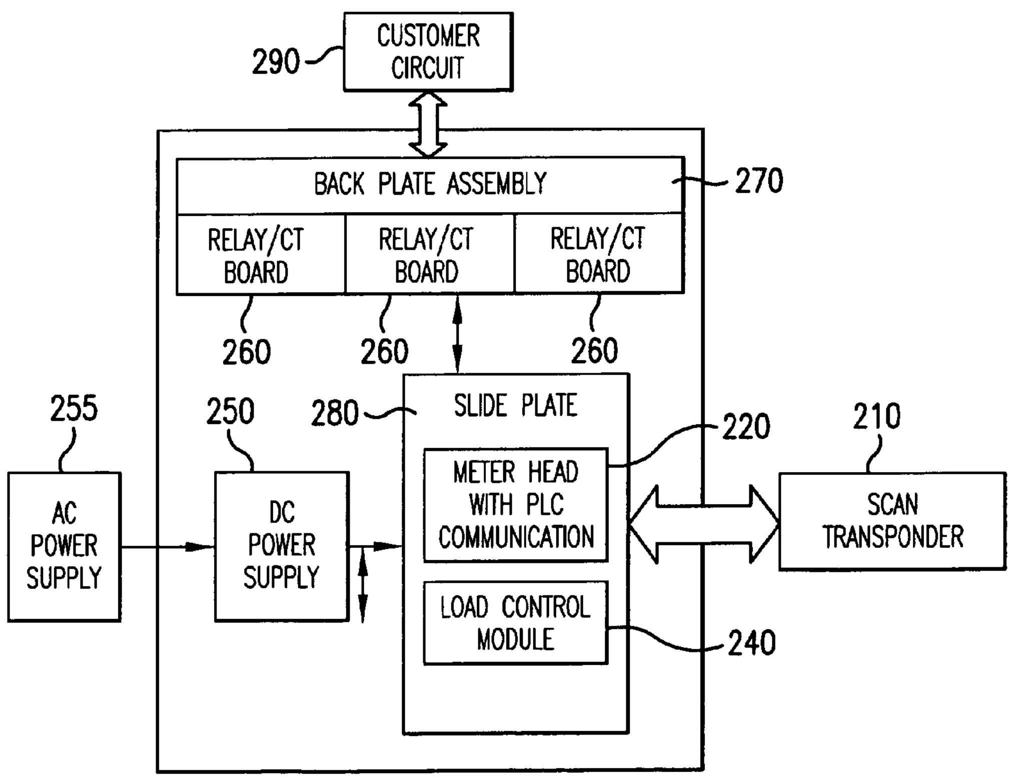
FIG. 2 is a block diagram showing physical configuration of preferred embodiments.

FIG. 2 is a block diagram of preferred structure of an Energy Guard unit 140.

Scan Transponder 210 is the preferred data collector for the unit 140, may be located external to or inside the MiniCloset, and may be the main data collector for more than one MiniCloset at a time. The Scan Transponder 210 preferably: (a) verifies data (each communication preferably begins with clock and meter identity verification to ensure data integrity); (b) collects data (periodically it collects a data block from each meter unit, with each block containing previously collected meter readings, interval readings, and event logs); (c) stores data (preferably the data is stored in non-volatile memory for a specified period (e.g., 40 days)); and (d) reports data (either via PLC, telephone modem, RS-232 connection, or other means).

The slide plate 280 comprises a Minicloset meter head and a load control module 240 that provides the control signals to activate the relays. All of the electronics preferably is powered up by power supply 250. The back plate assembly 270 comprises multiple (e.g., 24) Current Transformers and relays—grouped, in this example, as three sets of 8 CTs and relays. Customer cables are wired through the CTs and connect to the circuit on customer premises 290. The remotely located Scan Transponder 210 accesses the Energy Guard meter head and bi-directionally communicates using power line carrier communication.

The signal flow shown in FIGS. 1 and 2 preferably is accomplished by implementing different software code modules that work concurrently to enable remote connect/disconnect ability in the Minicloset. These software modules, provided in the Appendix below, are:

| Code Module | Location | Function |
|---|---|---|
| lcm.def and pic.def | Load Control Module | Actuate connect and disconnect of relays. |
| pulse.c and pulse.h | Meter Head | Establish communication with LCM. |
| picend.def and picvars.def | Meter Head | Provide control signals to LCM. |
| pulselink.def and pulseoutm.c | Meter Head | Provides LCM with pulses to be used for connecting and disconnecting relays. |

FIGS. 3-10 are schematics of preferred components, as described below. The preferred connect/disconnect relays are series K850 KG relays, but those skilled in the art will recognize that other relays may be used without departing from the scope of the invention.

| FIG. | Schematic | Detail |
|---|---|---|
| 3 | PCB 107D | CPU board of the Scan Transponder and MiniCloset. |
| 4 | PCB 135C | Power Supply for Scan Transponder. |
| 5 | PCB 144C | Power Supply for MiniCloset. |
| 6 | PCB 146C | This board brings back the Current Transformer information back to MiniCloset meter head. |
| 7 | PCB 160A | Board for Load Control Module. |
| 8 | PCB 170 | EG power supply board that adds capability for optical tamper detection. |
| 9 | PCB 171 | EG Connection board. A board with traces to route the signal. |
| 10 | PCB 172 | Control circuitry board for Relay control. |

In another embodiment, the implementation of Energy Guard takes advantage of the similarity of architecture of traditional circuit breaker panels, with the multichannel metering environment. In a circuit breaker panel, electricity is fed to the panel and distributed among various customer circuits via circuit breakers that provide the ability to connect or disconnect the customer circuits.

In the MiniCloset/Energy Guard, multiple current transformers measure the current in customer circuits and bring this data back to a central processing unit where the metering quantities are calculated. However, the MiniCloset/Energy Guard has several key differences with a circuit breaker panel. For example, whereas circuit breakers are found near customer premises, the Energy Guard typically is installed near the utility distribution transformer. The advantages offered by this alternate embodiment will be apparent to those skilled in the art. For example, this embodiment offers improved dimensions and overall size over the embodiments discussed above. Space is always a constraint when equipment additions are made to existing electrical installations. This version of the Energy Guard ("EG"), with preferred dimensions of 28"×22"×11" provides a substantial advantage in situations where volumetric constraints exist.

The following description includes preferred construction details, detailed schematics, and software descriptions. As with the embodiments discussed above, this embodiment is operable to providing remote disconnect/connect operations, preventing theft, detecting tampering, detecting reverse voltage, performing pre-payment and limiting load, and performing meter validation.

Preferred EG Construction Details

In this embodiment, primary components of the EG are:

1. Energy Guard Base Assembly
2. Energy Guard Assembly
 a. Phase Bus Bars and Neutral Bars
 b. Transition Bars
 c. Acceptor Module
3. Energy Guard Metering Modules
 a. Metering Modules
  i. Integrated Current Sensing and Relay Modules
4. Energy Guard Electronics
 a. PCB 203
 b. PCB 204
 c. PCB 234
 d. PCB 235
 e. PCB 202
 f. PCB 210
 g. PCB 230
 h. PCB 206

EG Base Assembly

Figure 3A:
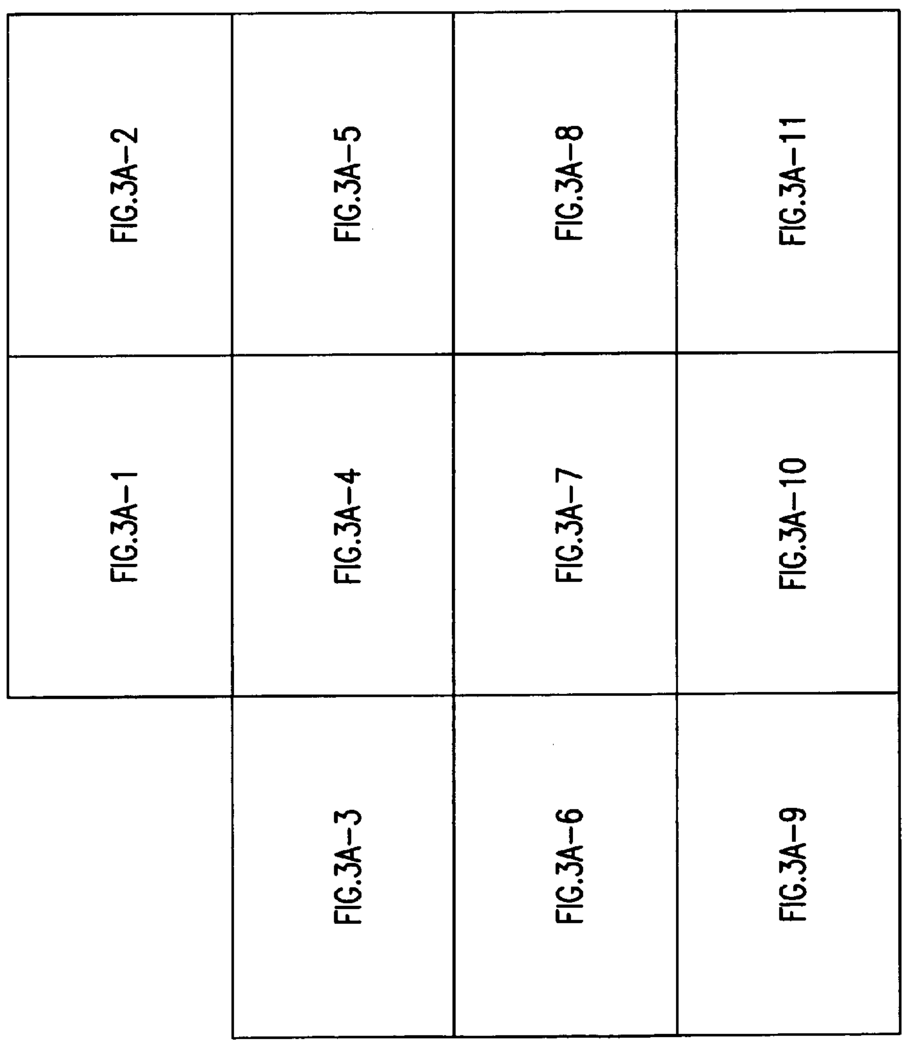
FIGS. 3A-3B illustrate a schematic diagrams of a preferred CPU board of a Scan Transponder and MiniCloset.
Figures 1, 3A:
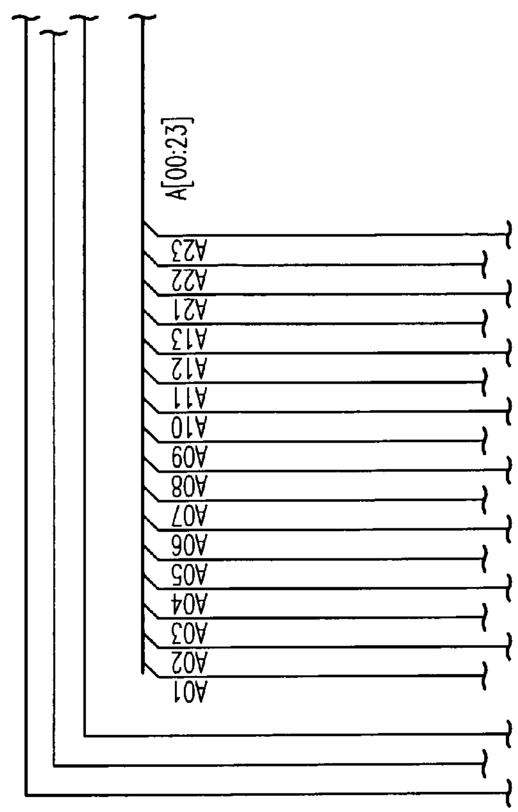
Figures 2, 3A:
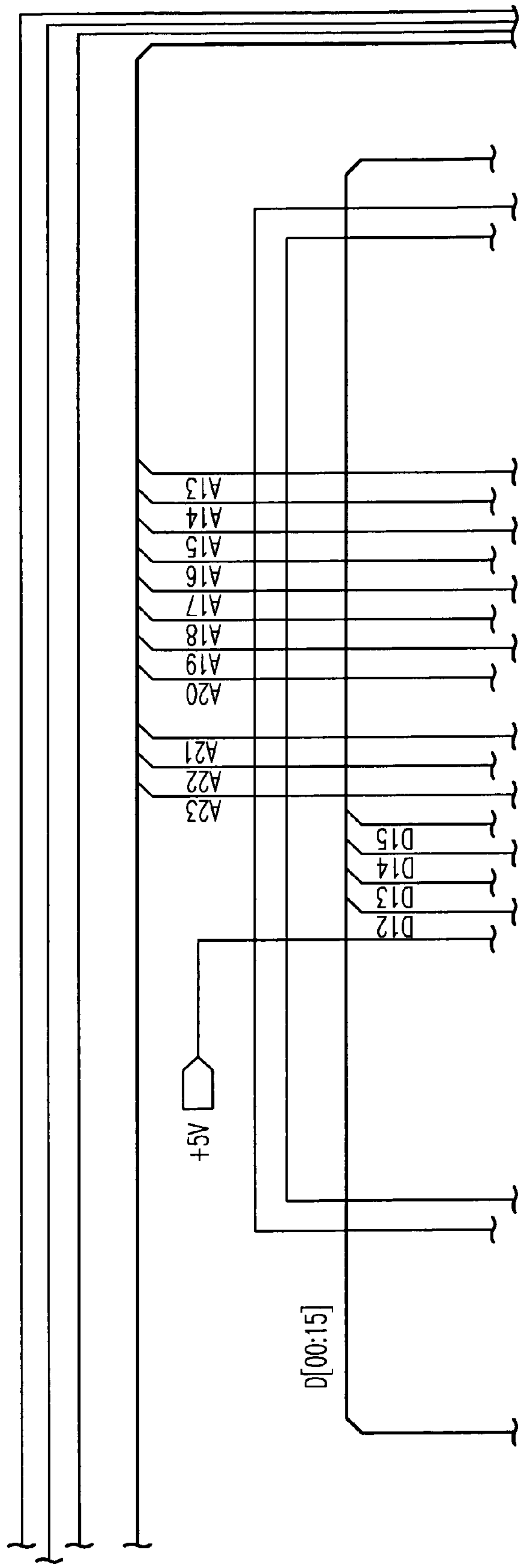
Figures 3, 3A:
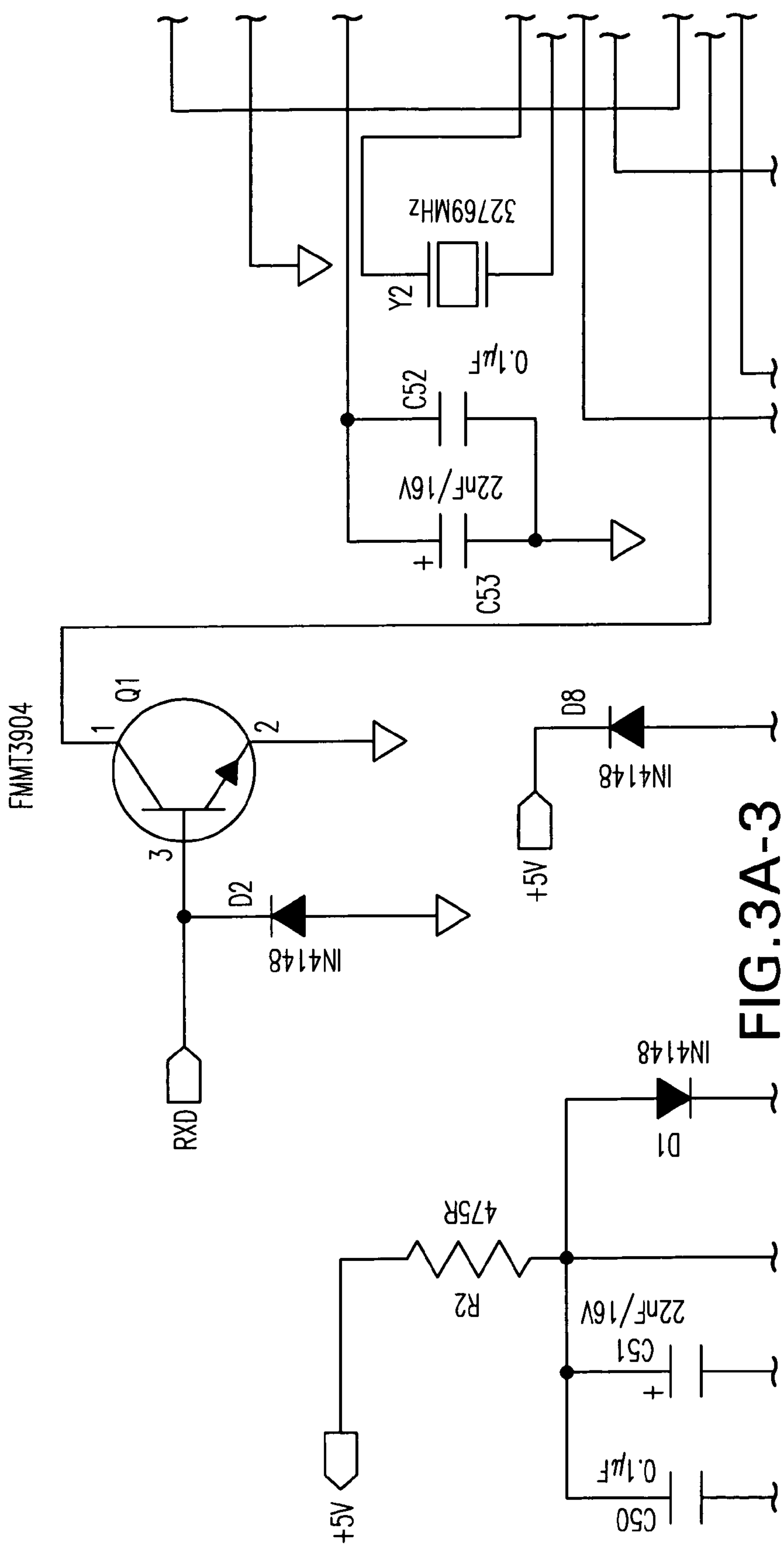
Figures 3, 3A, 4:
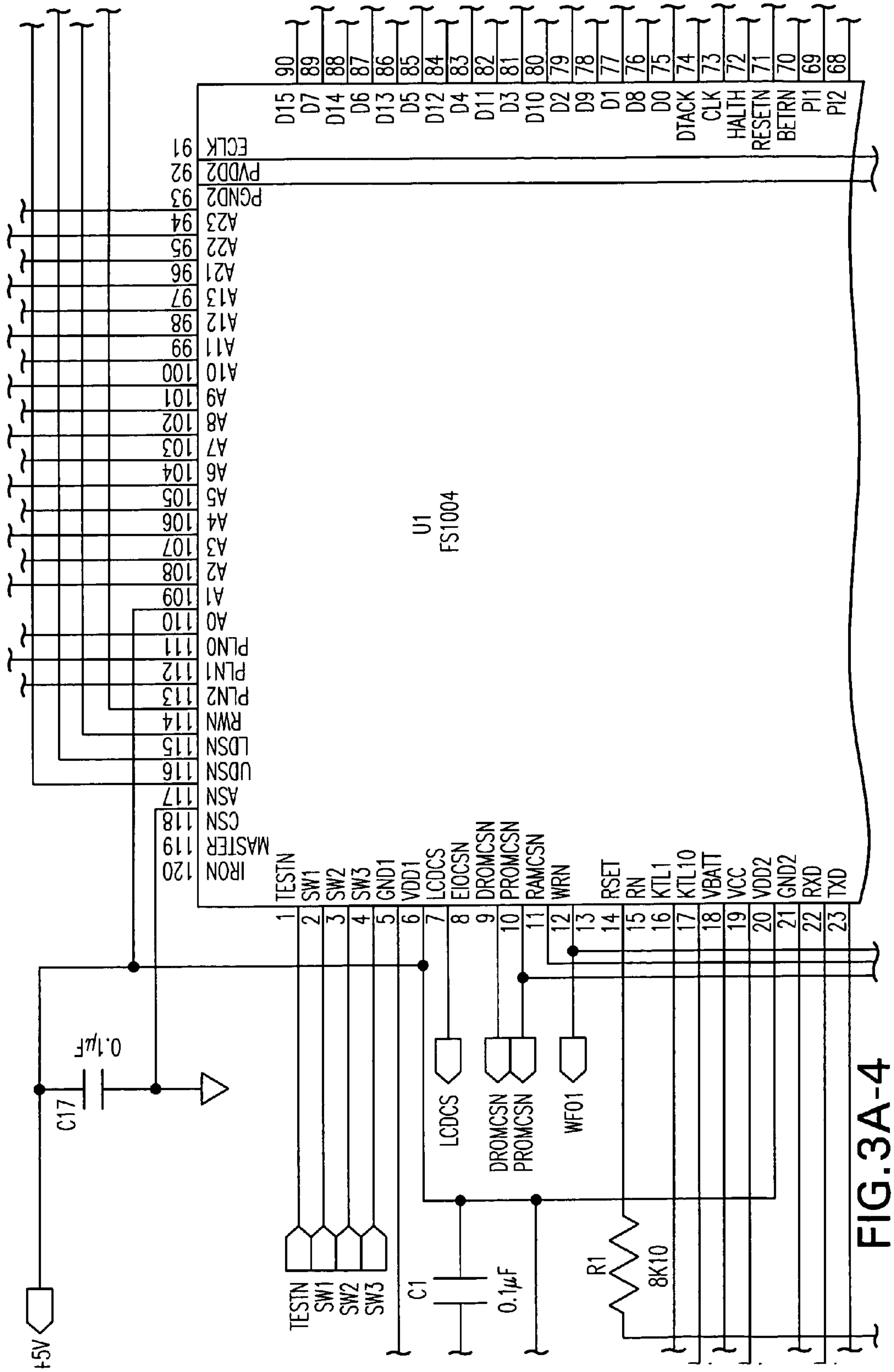
Figures 3, 3A, 4, 5:
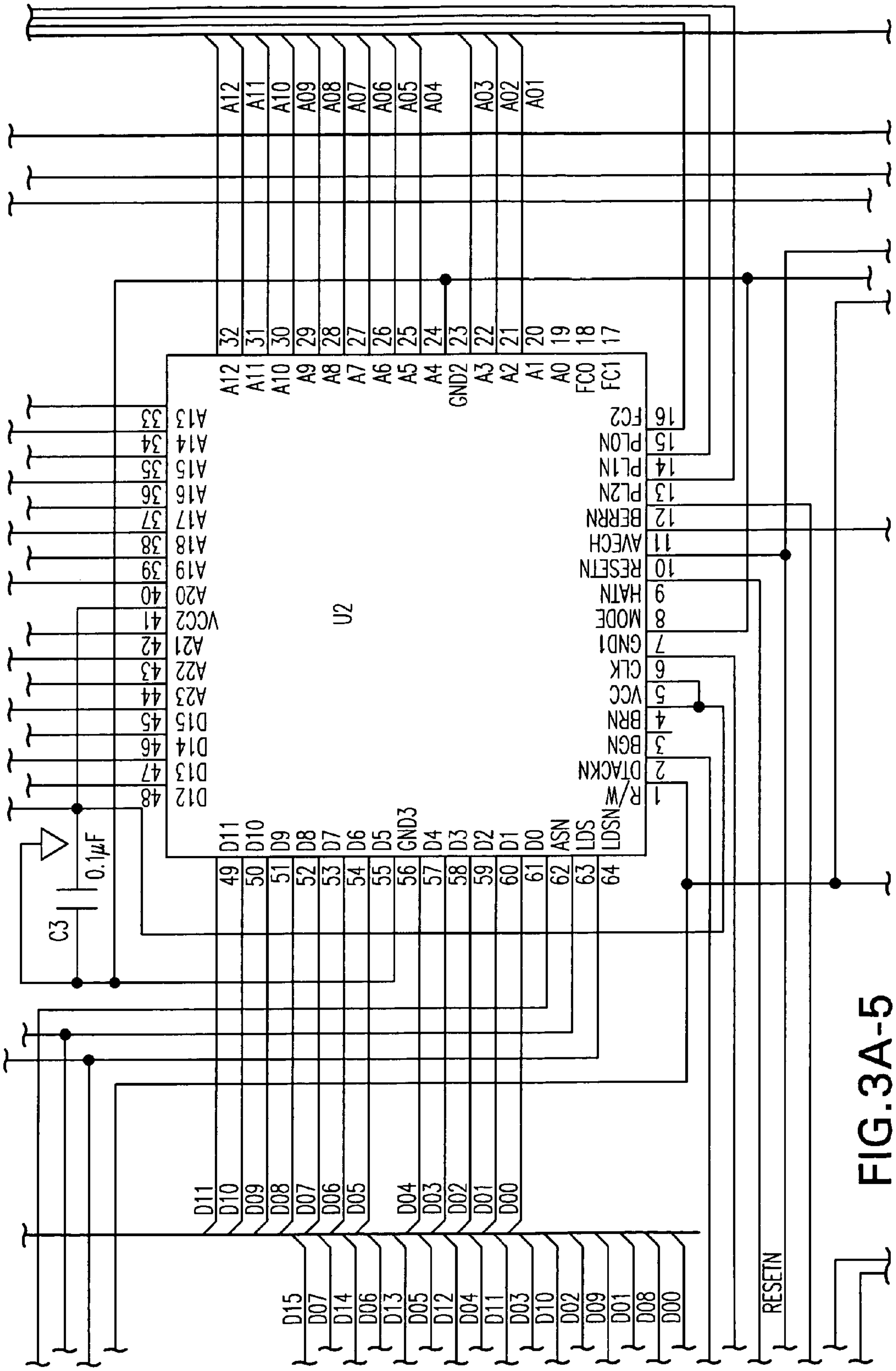
Figures 3, 3A, 4, 5, 6:
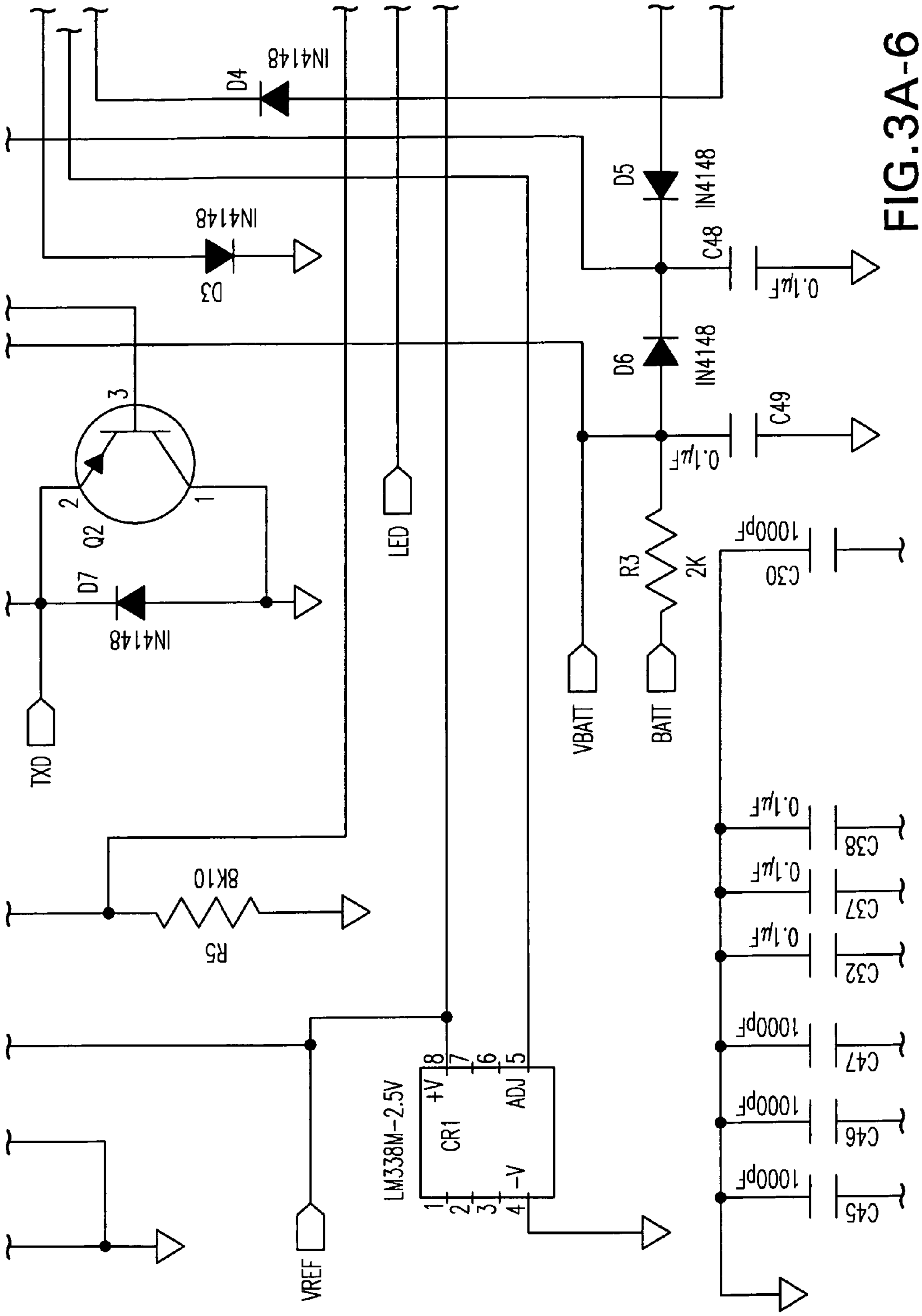
Figures 3, 3A, 4, 5, 6, 7:
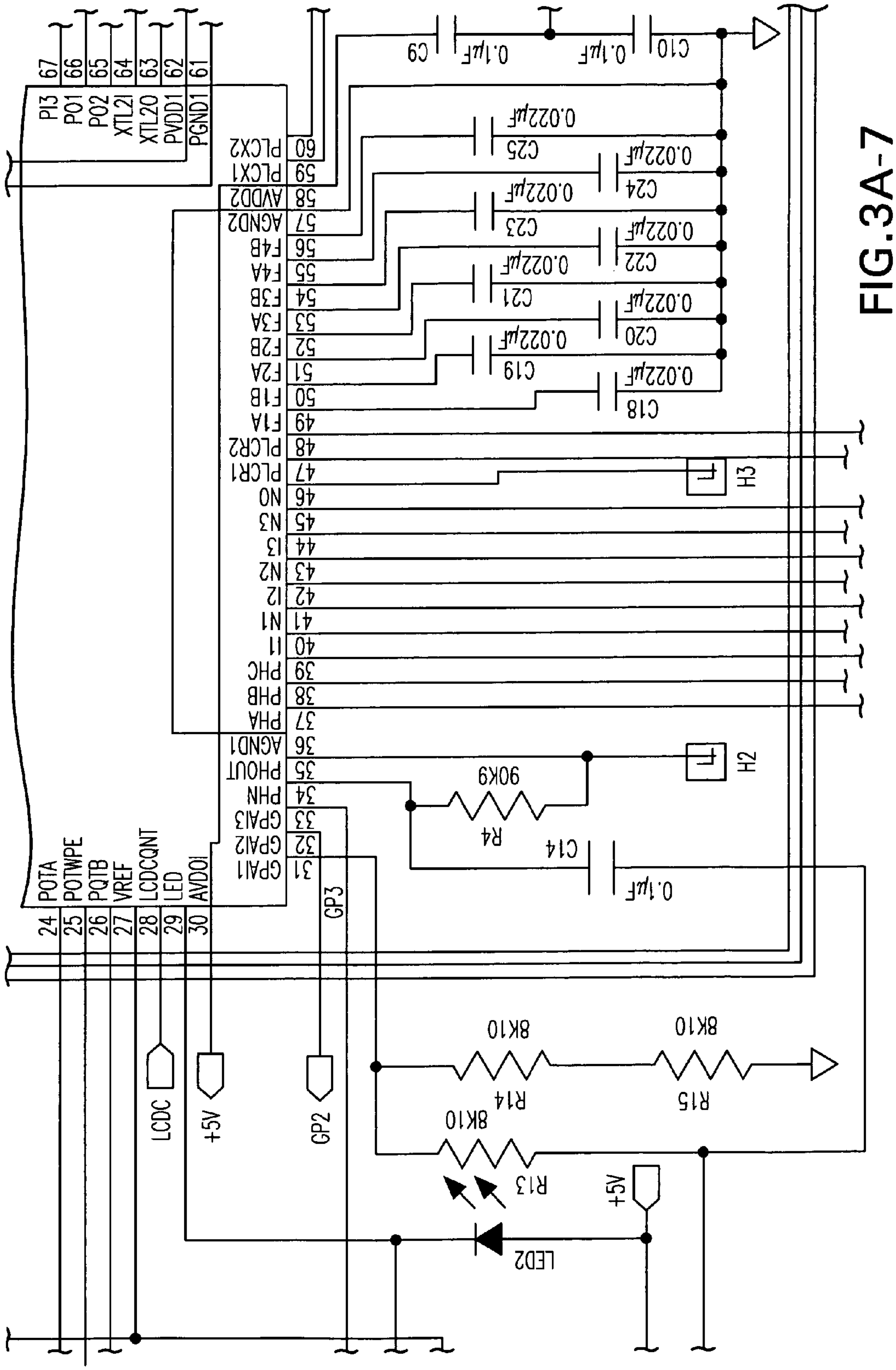
Figures 3, 3A, 4, 5, 6, 7, 8:
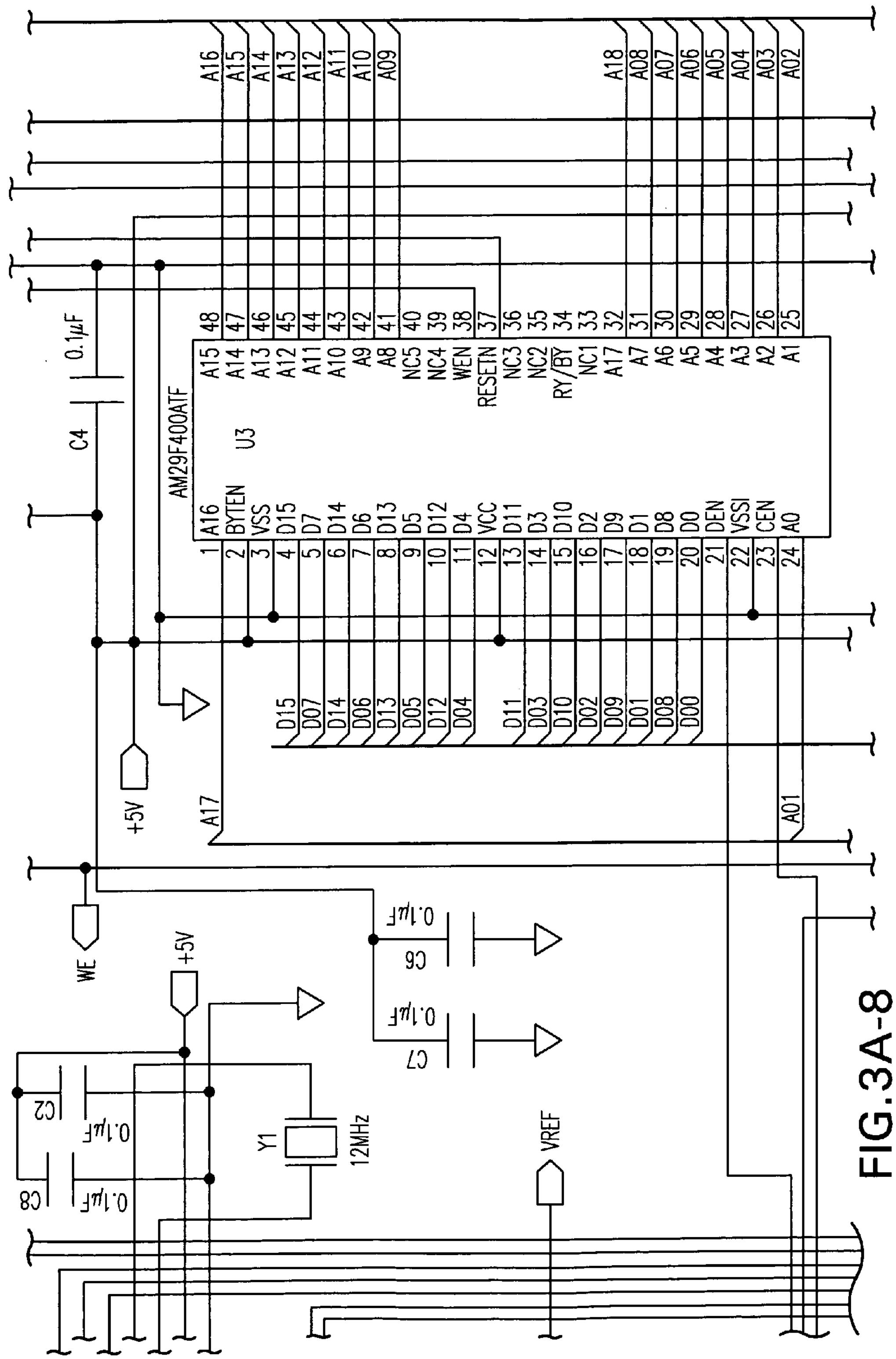
Figures 3, 3A, 4, 5, 6, 7, 8, 9:
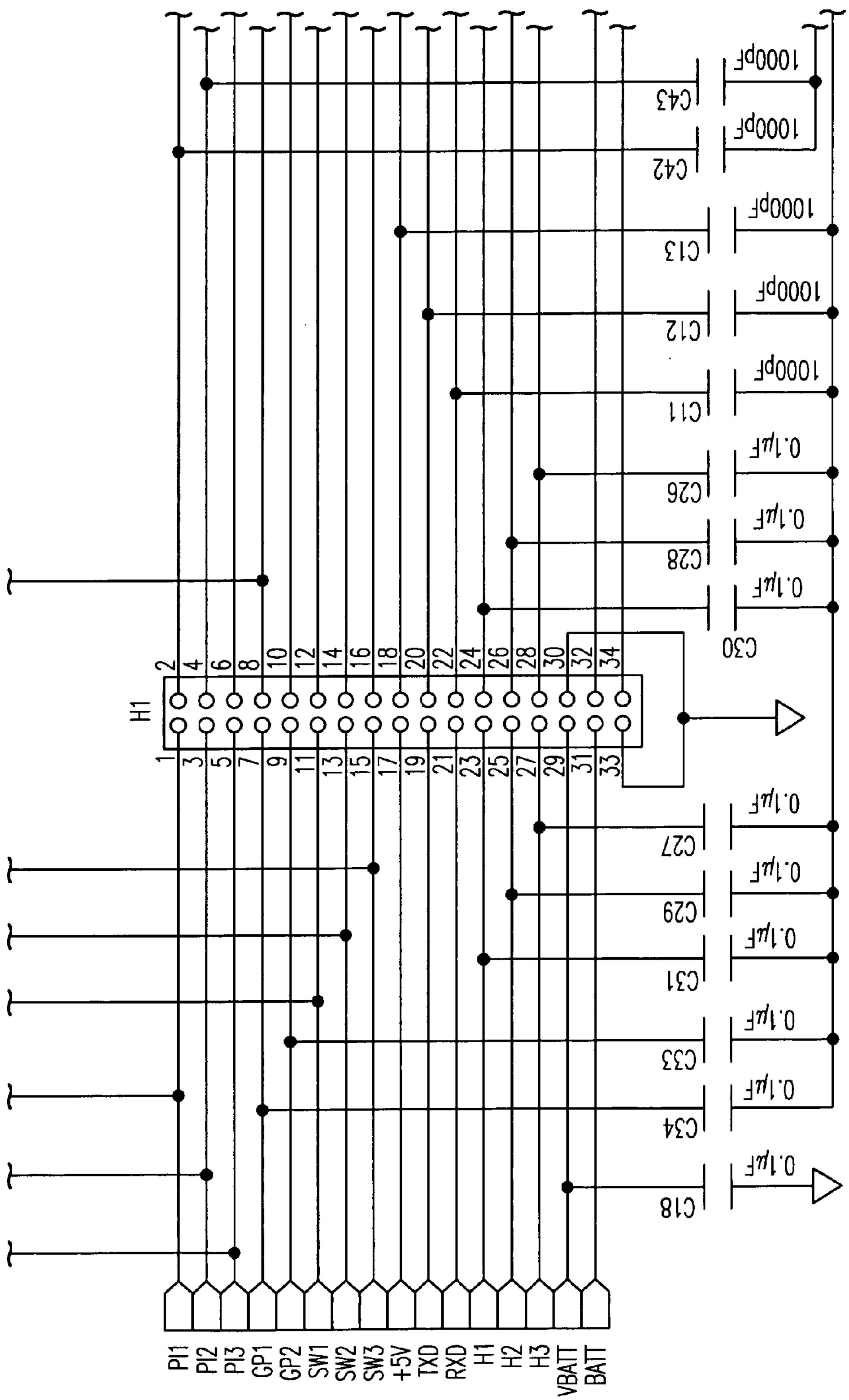
Figures 3, 3A, 4, 5, 6, 7, 8, 9, 10:
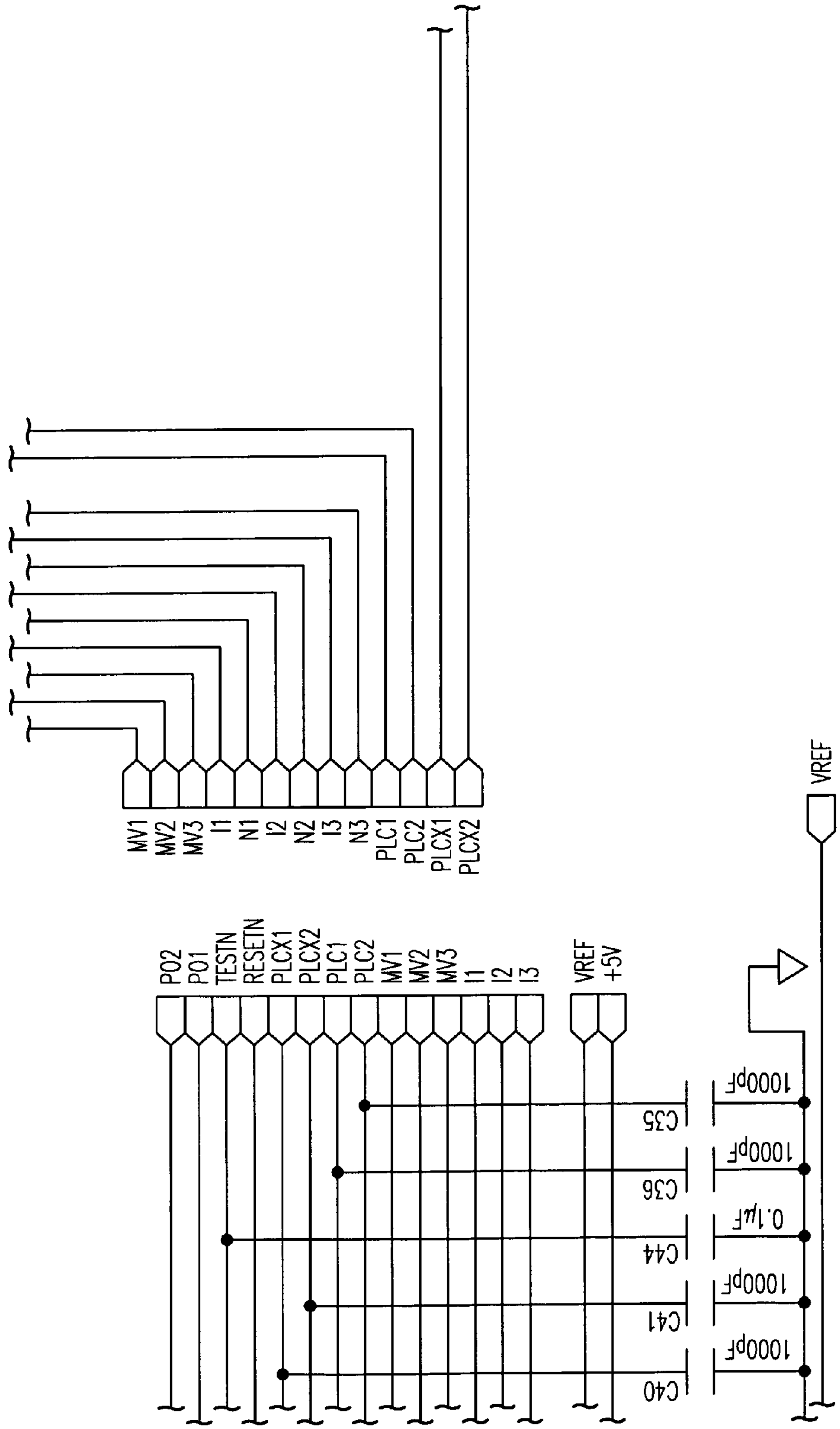
Figures 3, 3A, 4, 5, 6, 7, 8, 9, 10, 11:
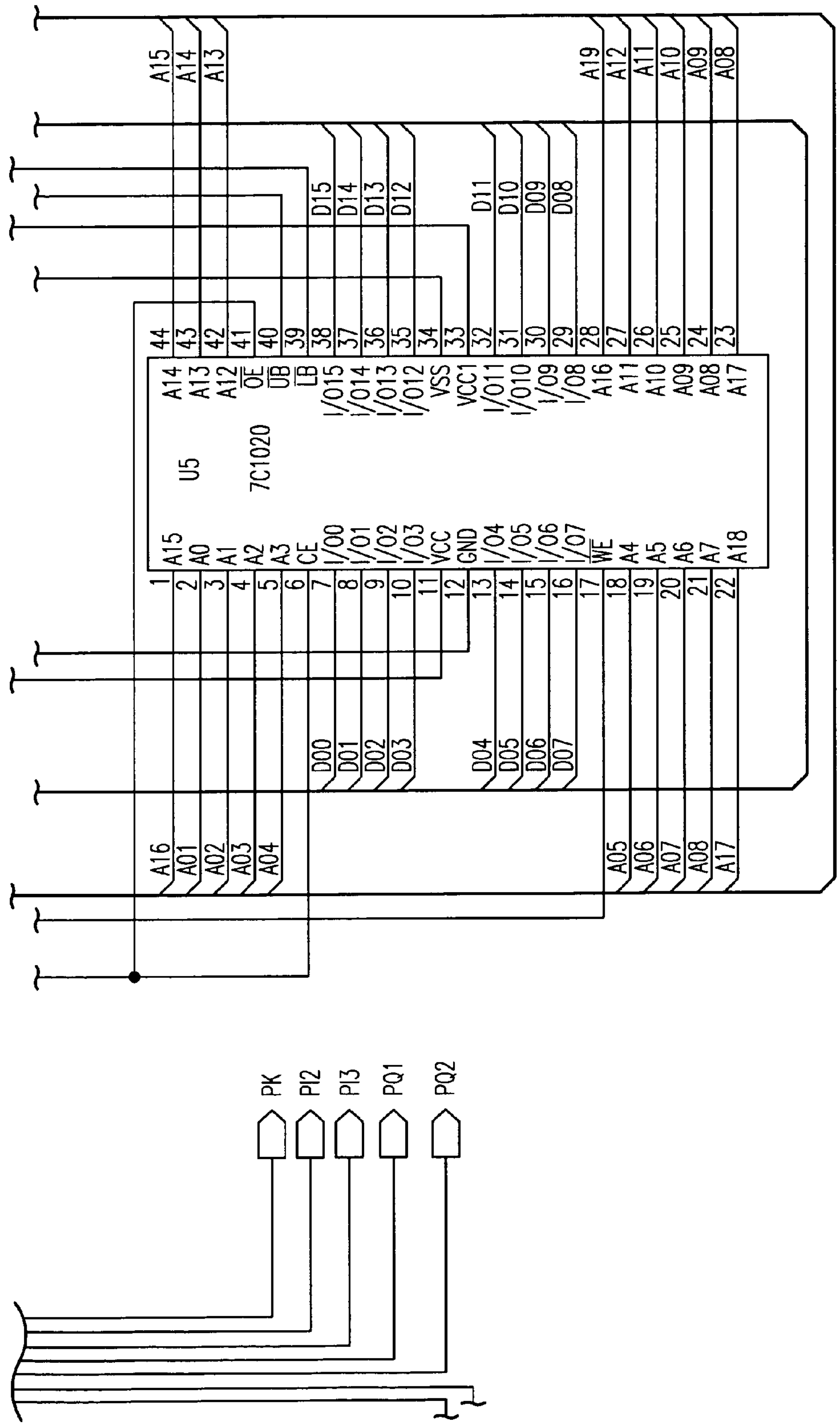
FIG. 11 is a diagram of preferred Energy Guard base assembly.
Figure 3B:
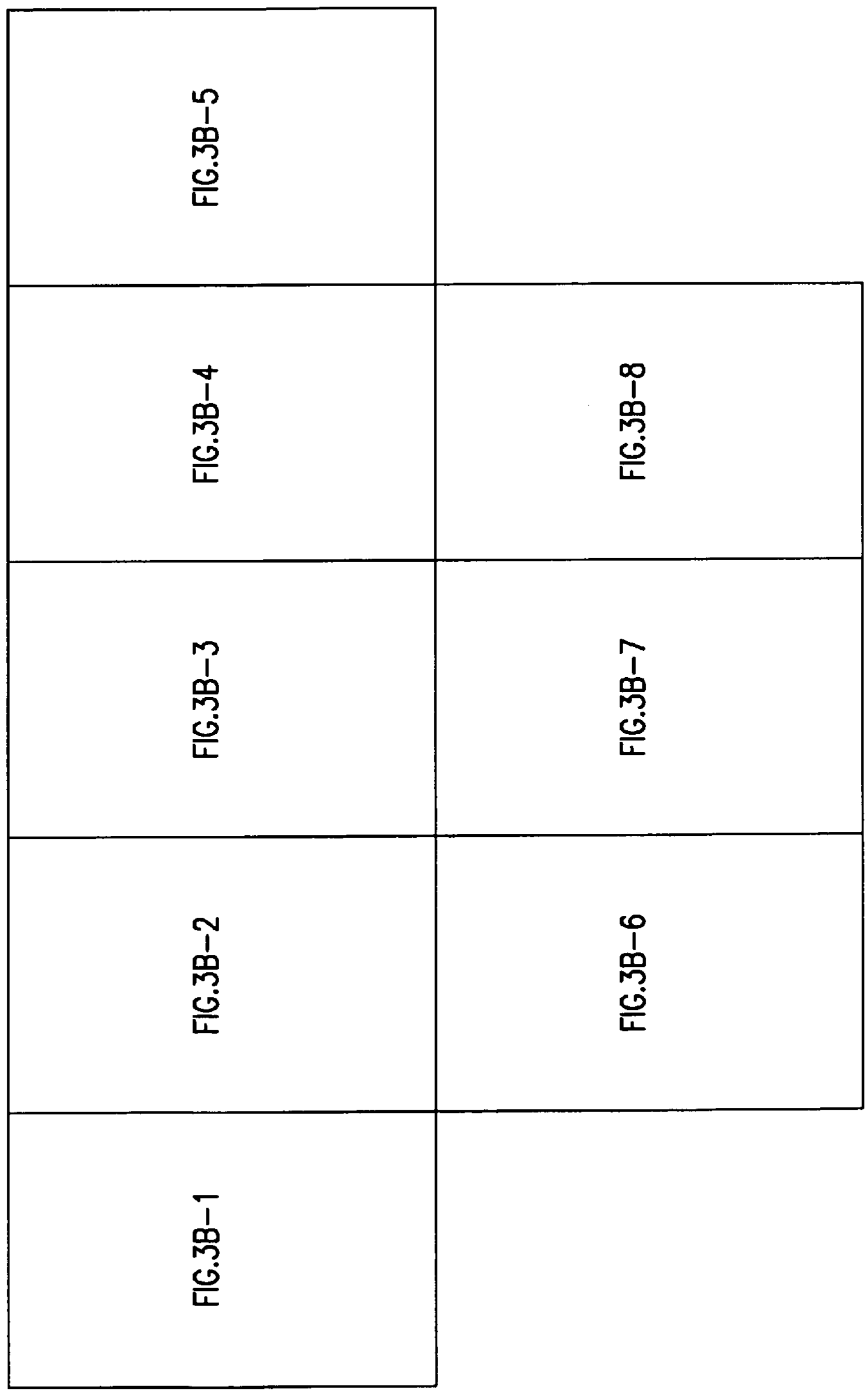
Figures 1, 3B:
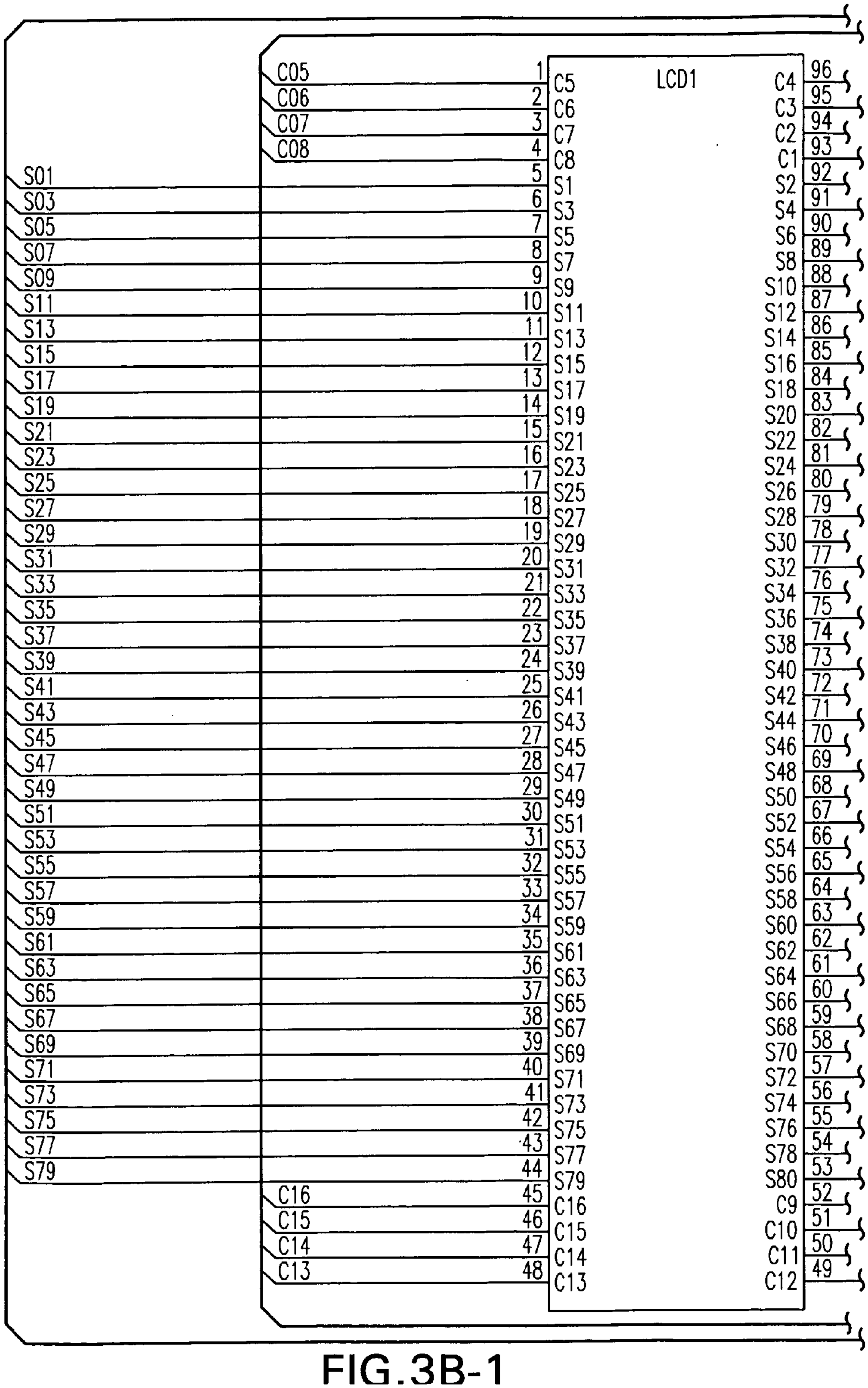
Figures 2, 3B:
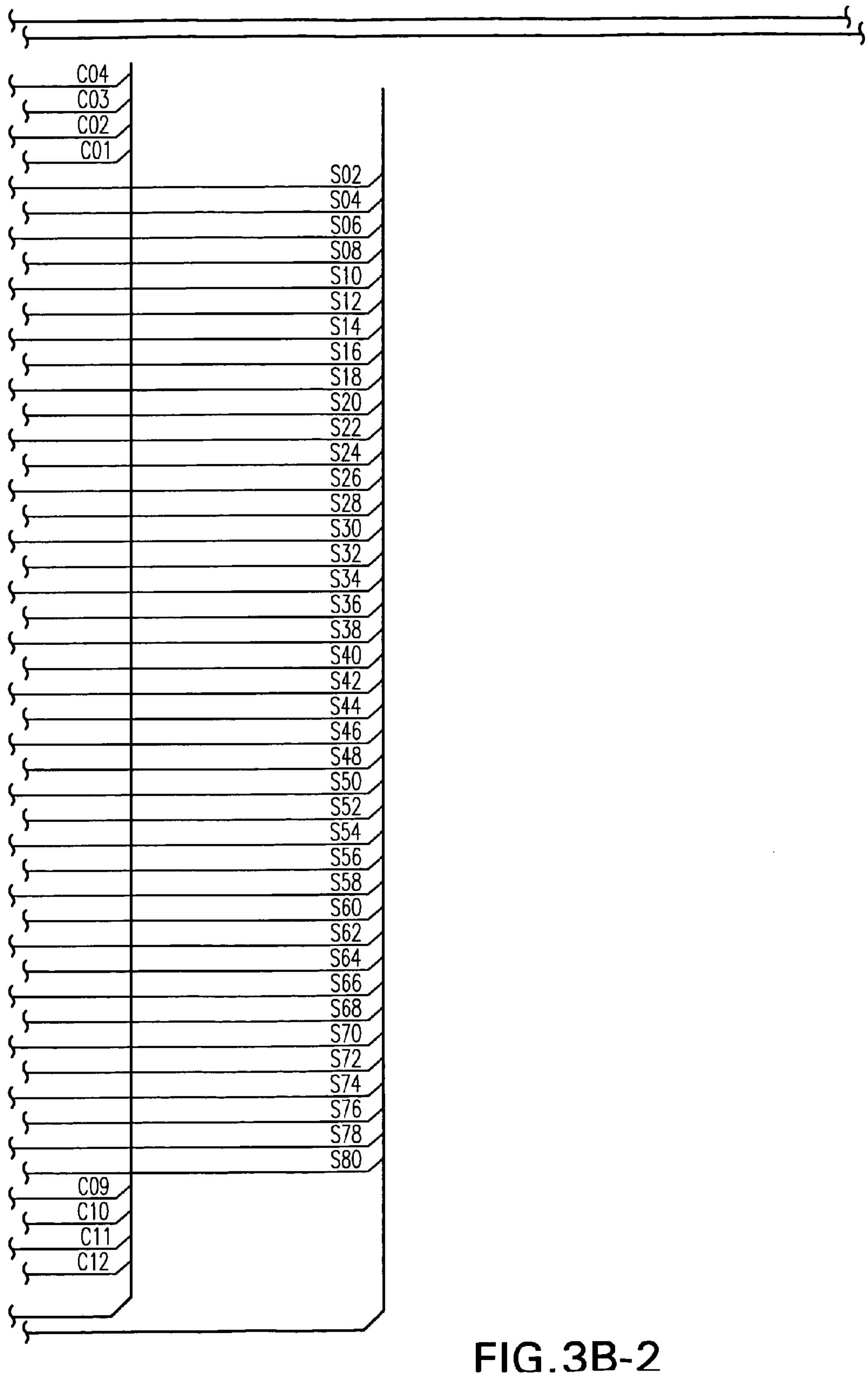
Figures 3, 3B:
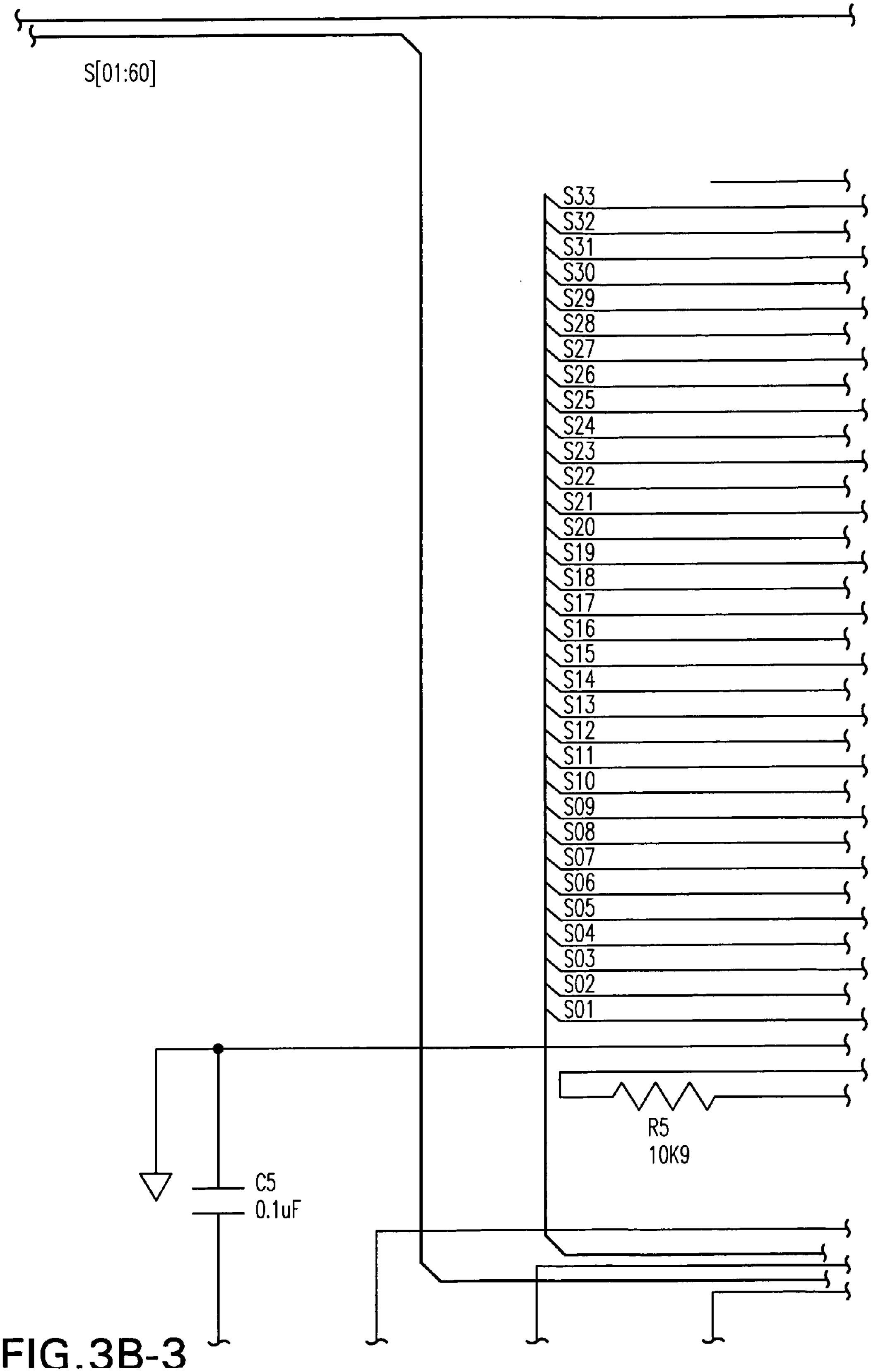
Figures 3, 3B, 4:
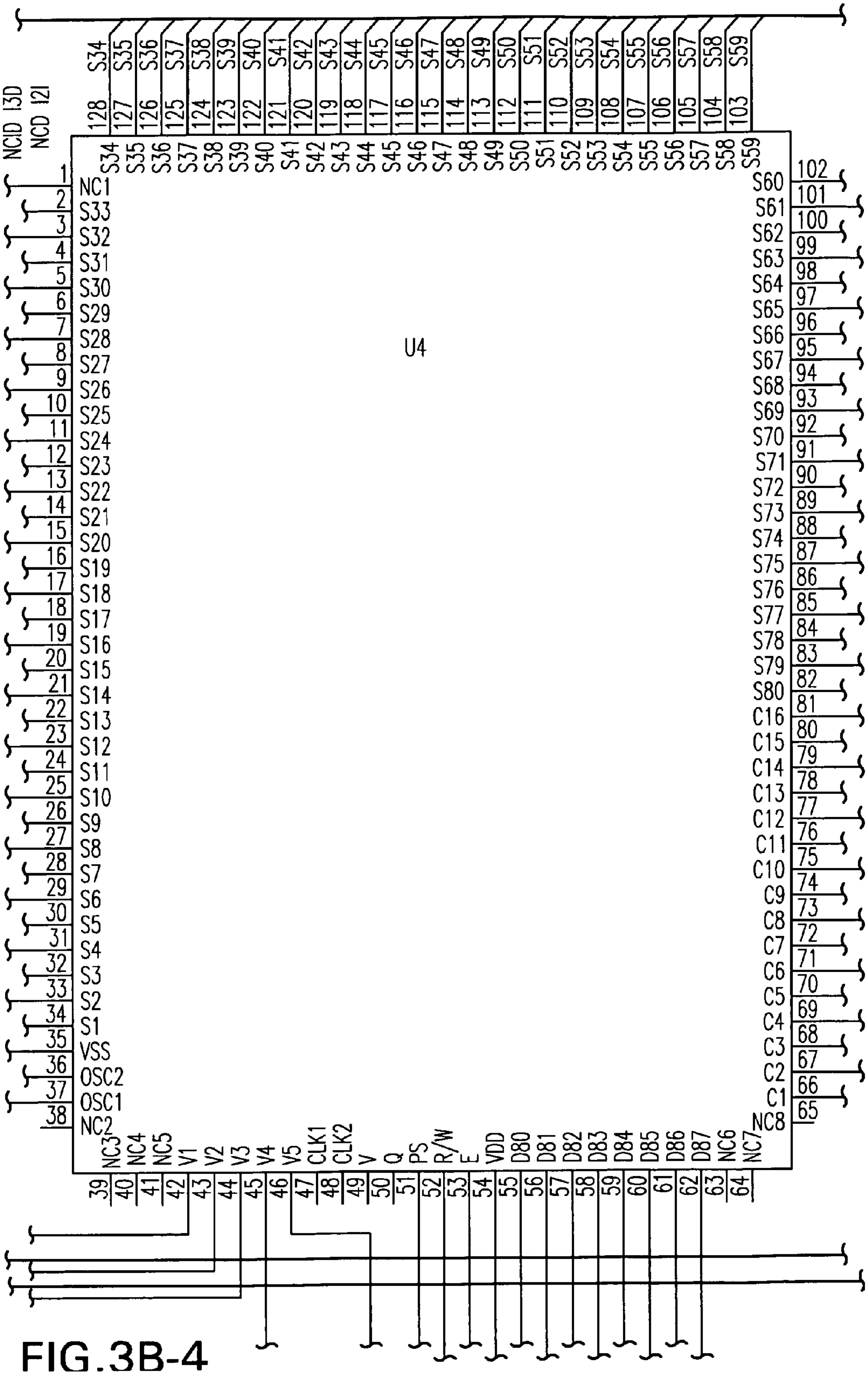
Figures 3, 3B, 4, 5:
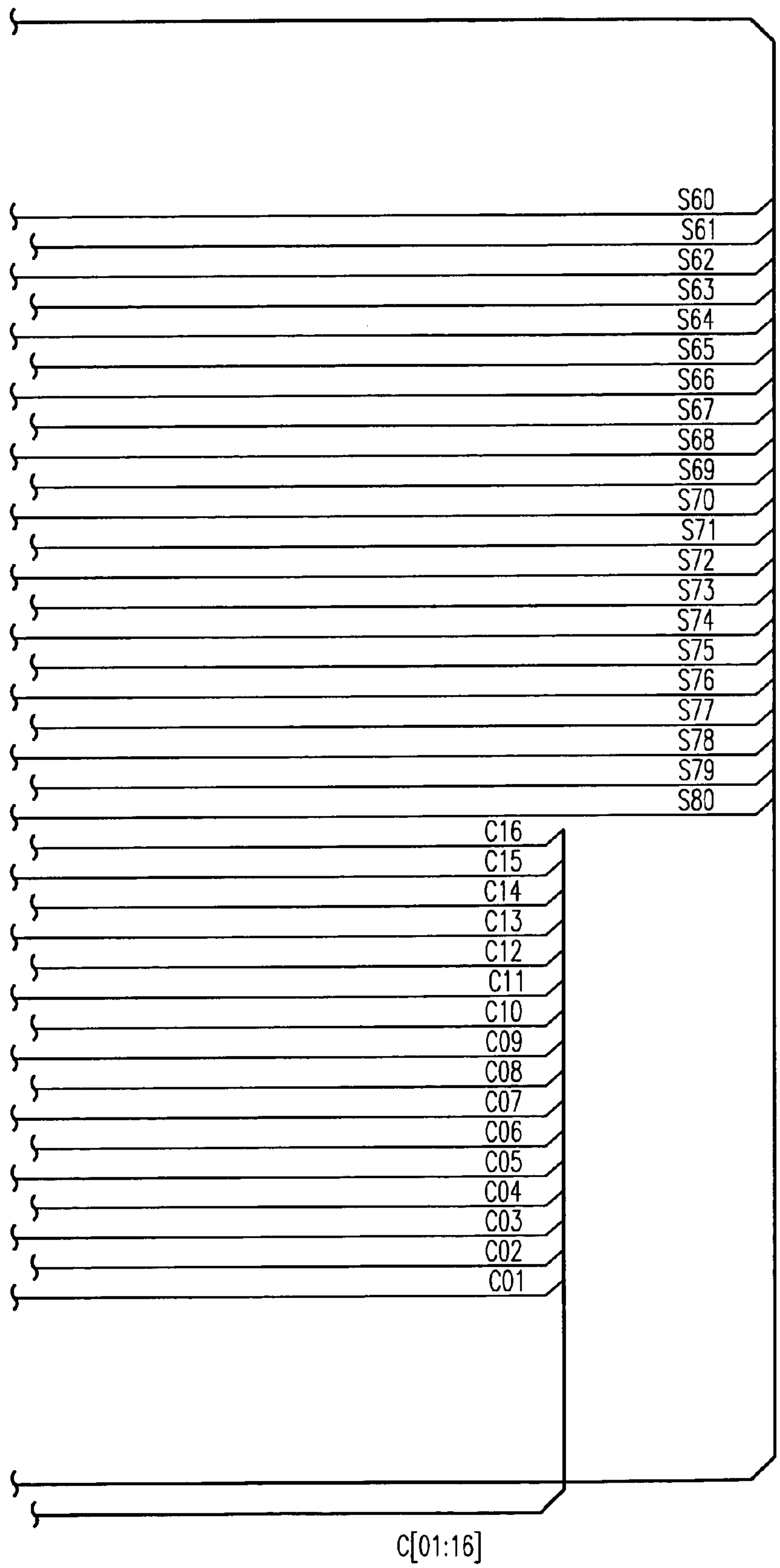
Figures 3, 3B, 4, 5, 6:
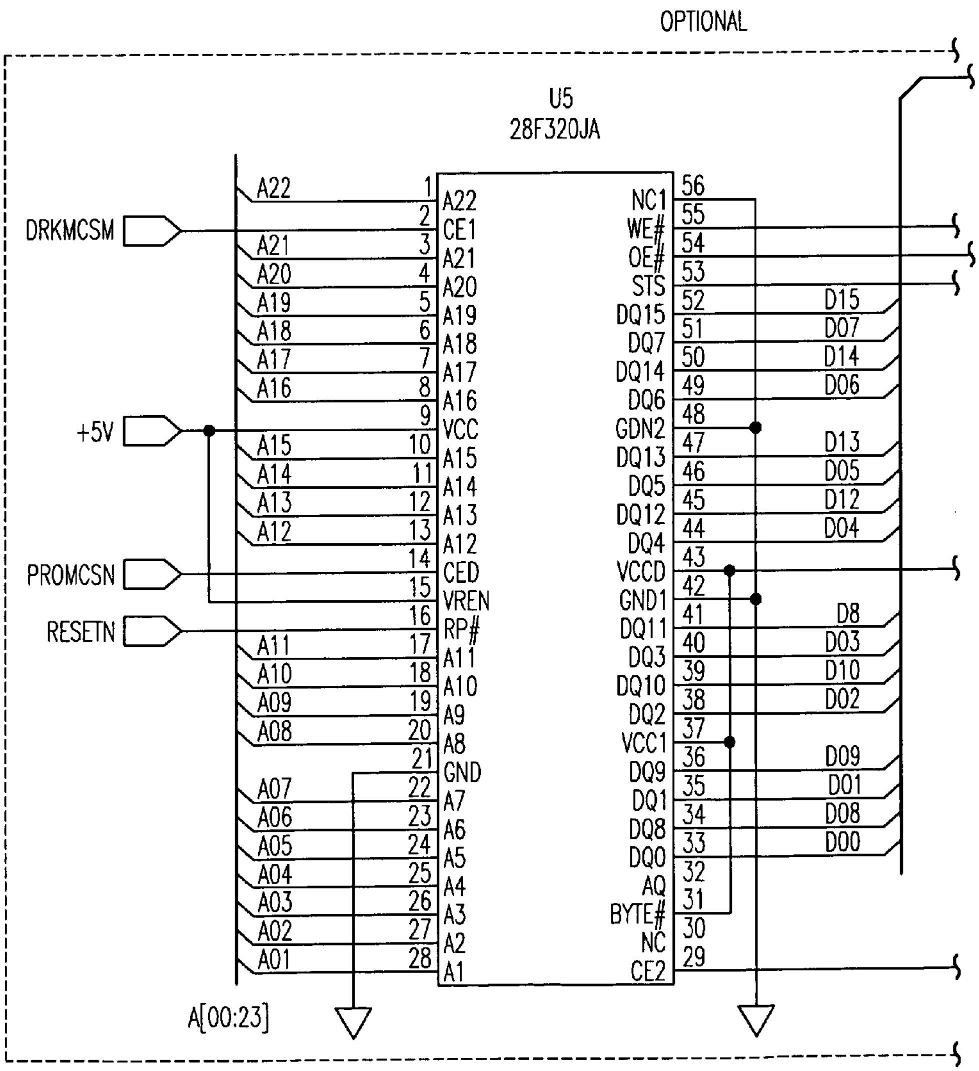
Figures 3, 3B, 4, 5, 6, 7:
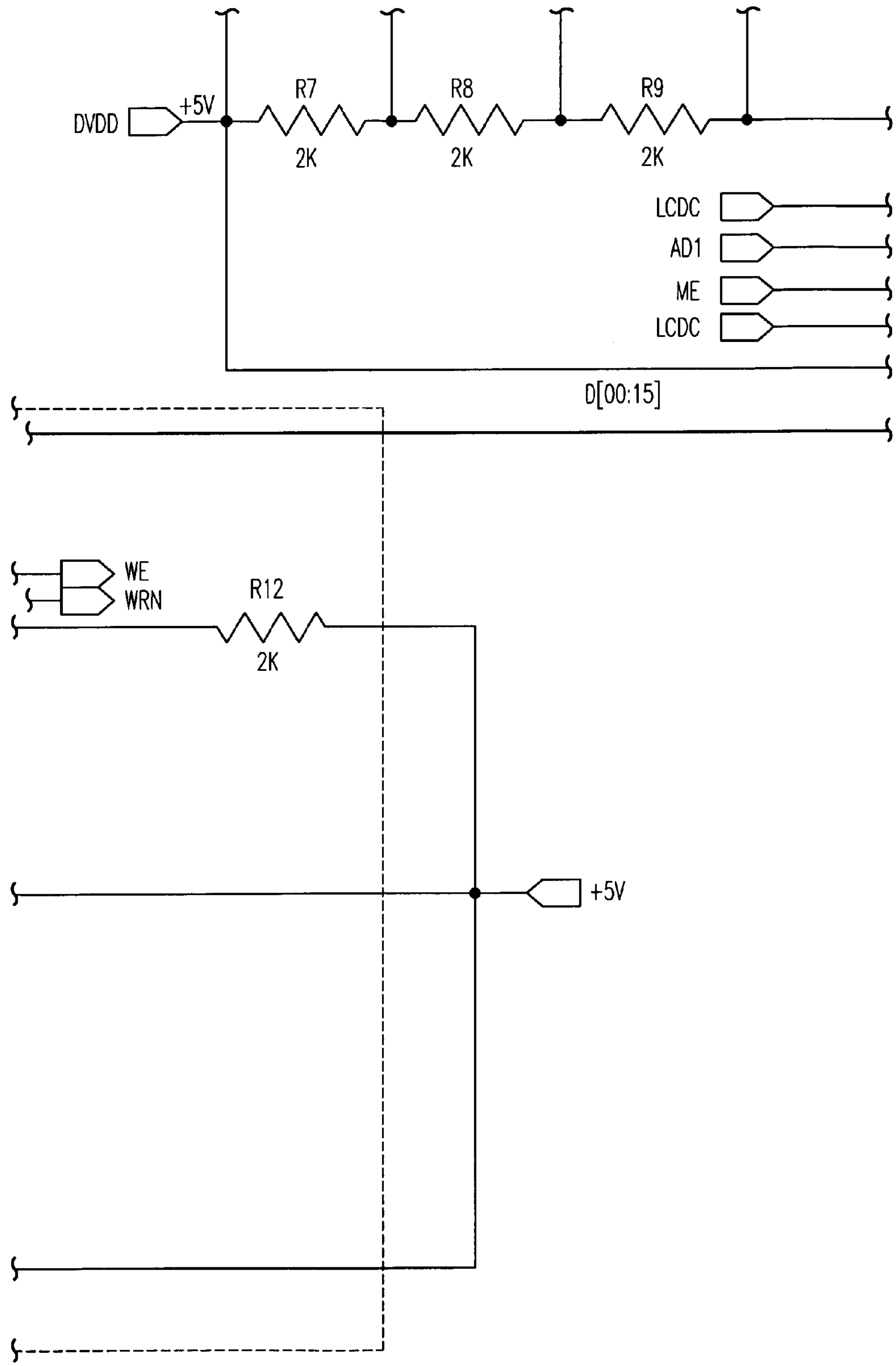
Figures 3, 3B, 4, 5, 6, 7, 8:
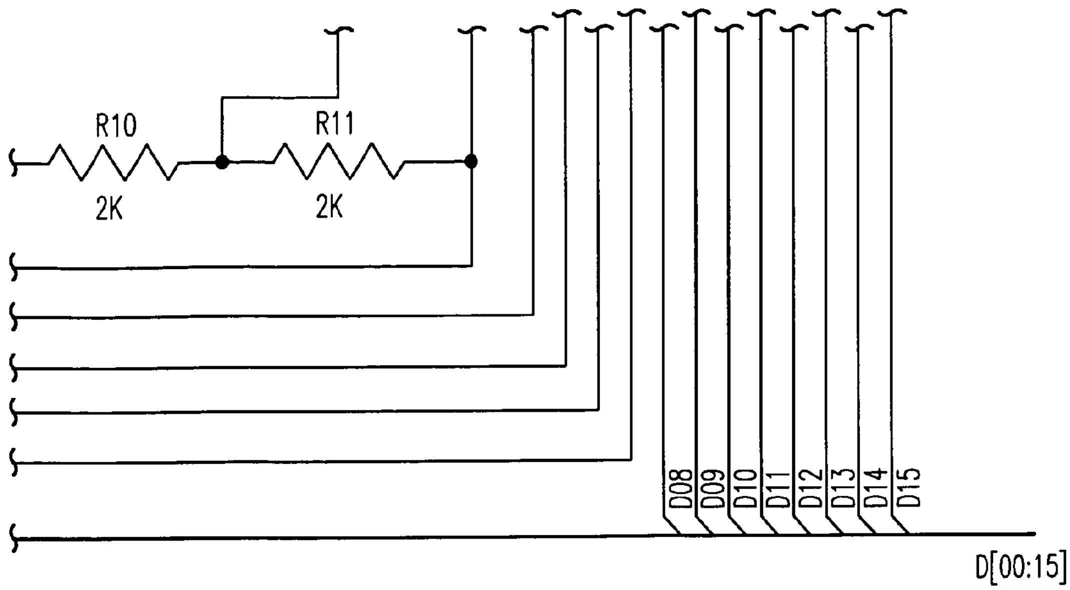
Figure 4:
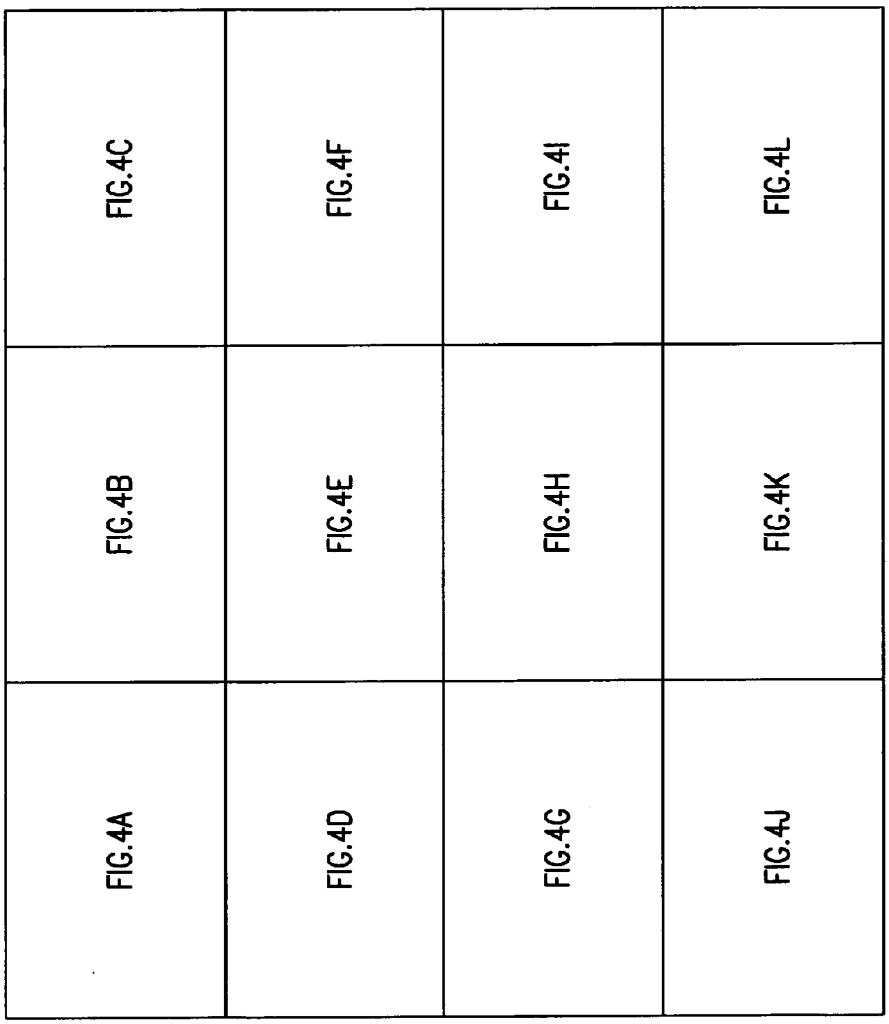
FIGS. 4A-L illustrate a schematic diagram of a preferred Scan Transponder power supply.
Figure 4A:
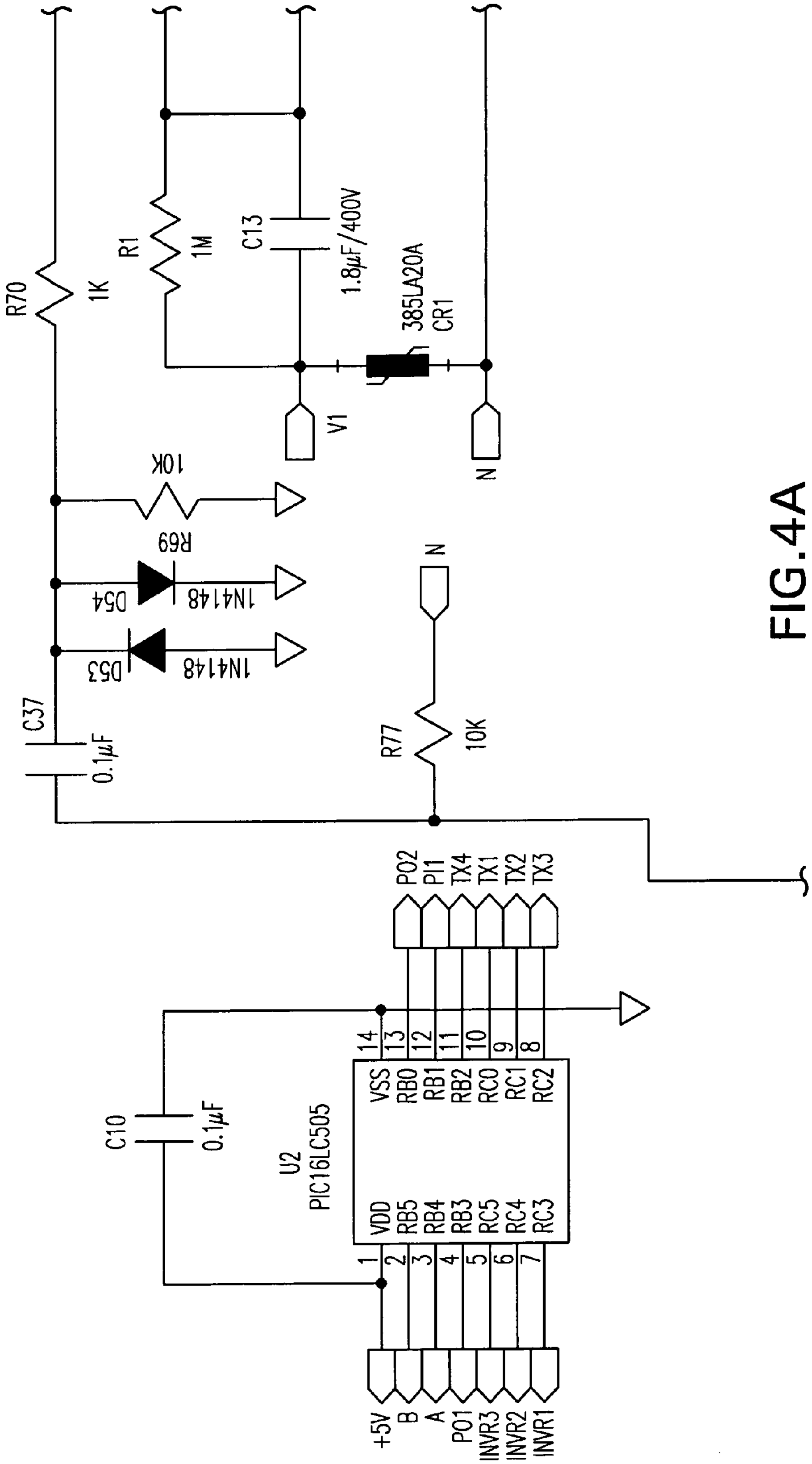
Figure 4B:
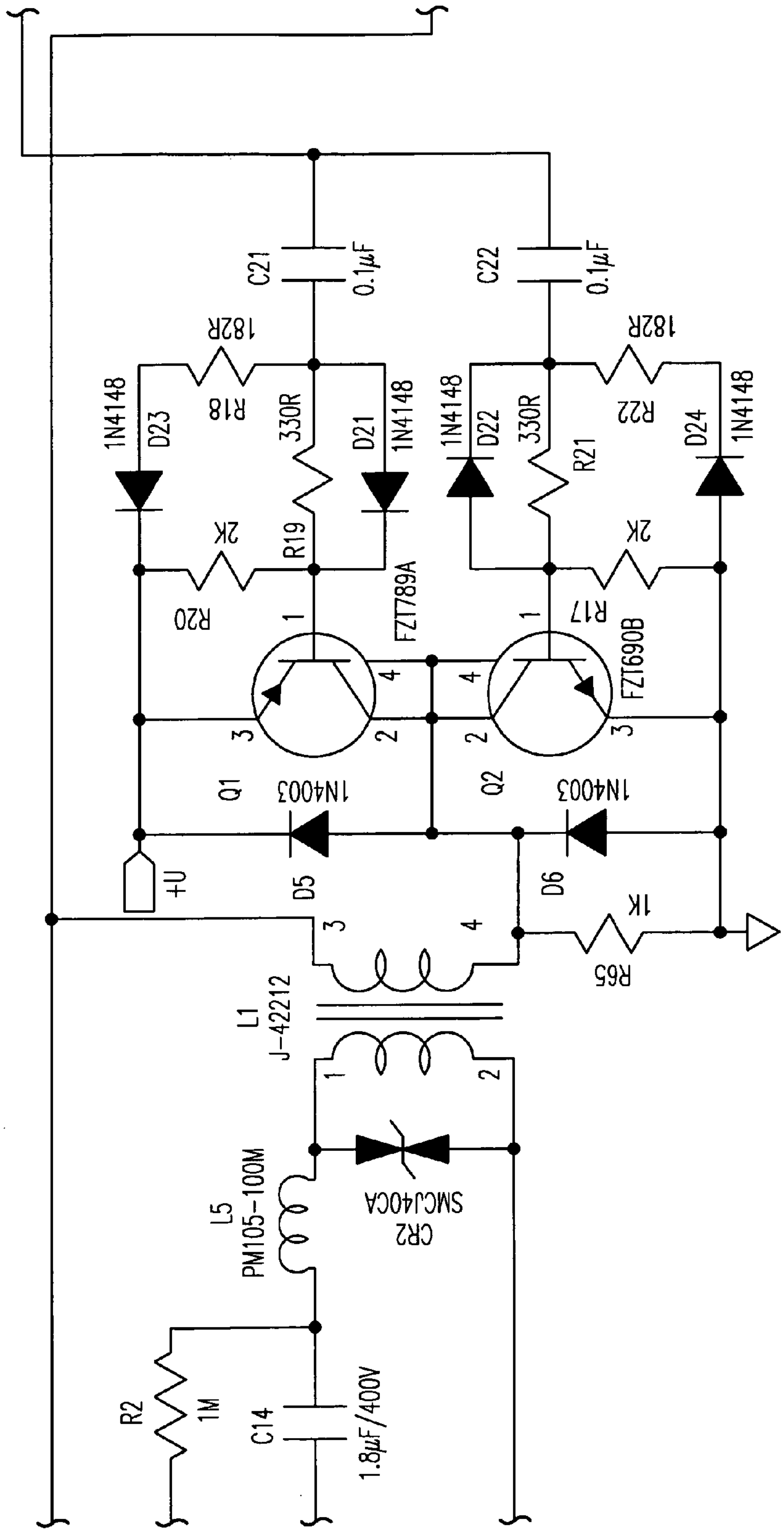
Figure 4C:
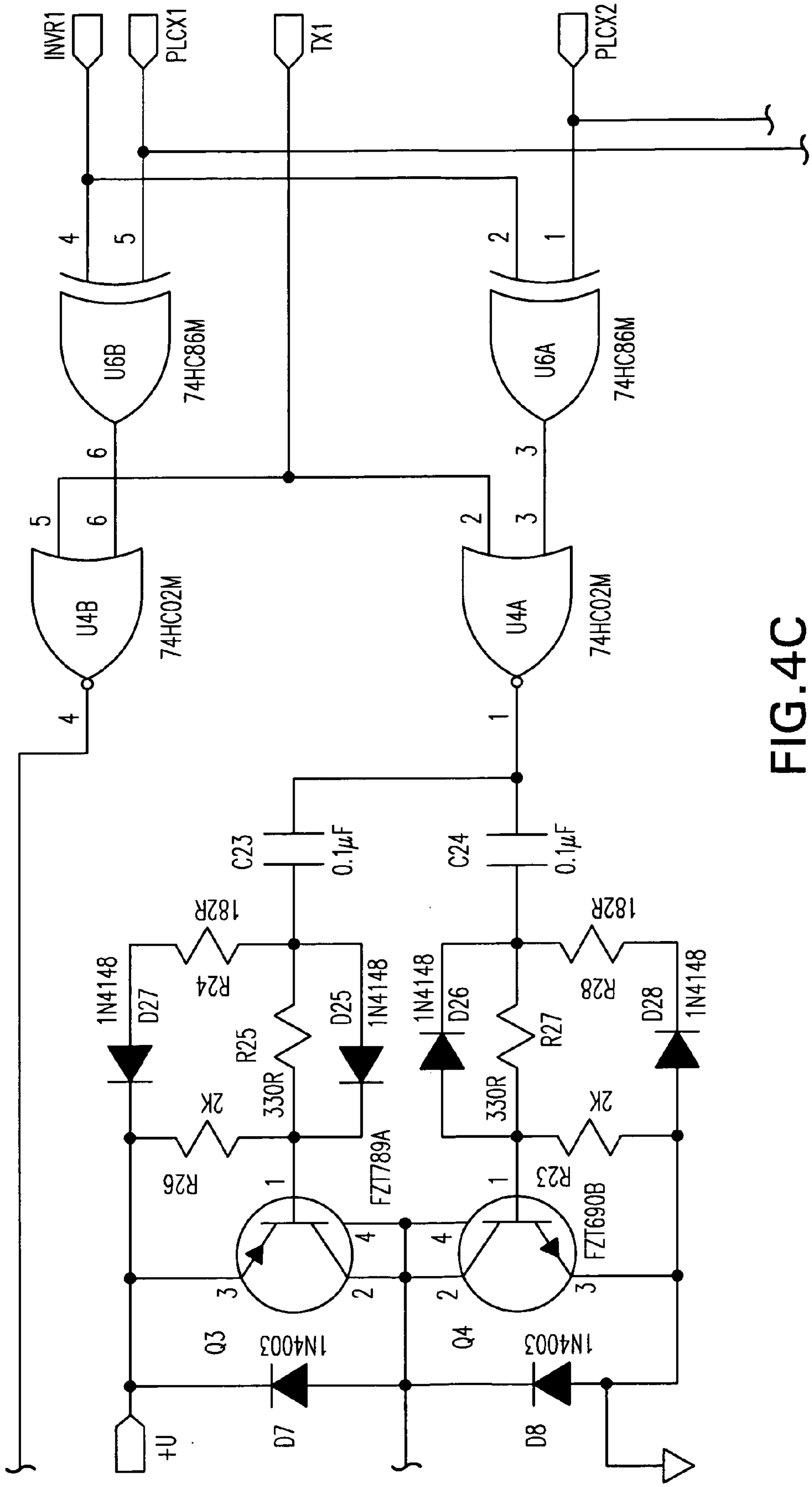
Figure 4D:
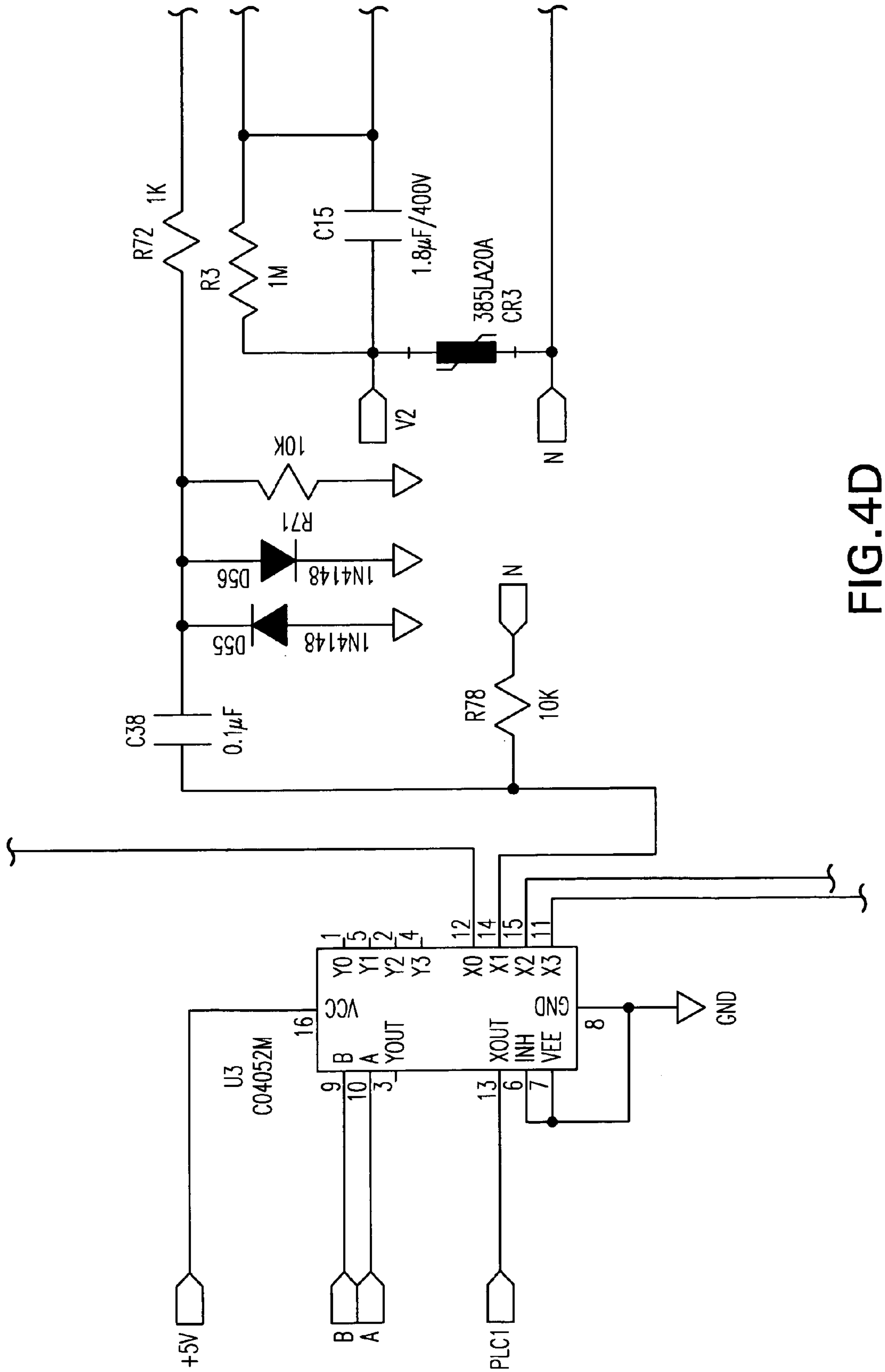
Figure 4E:
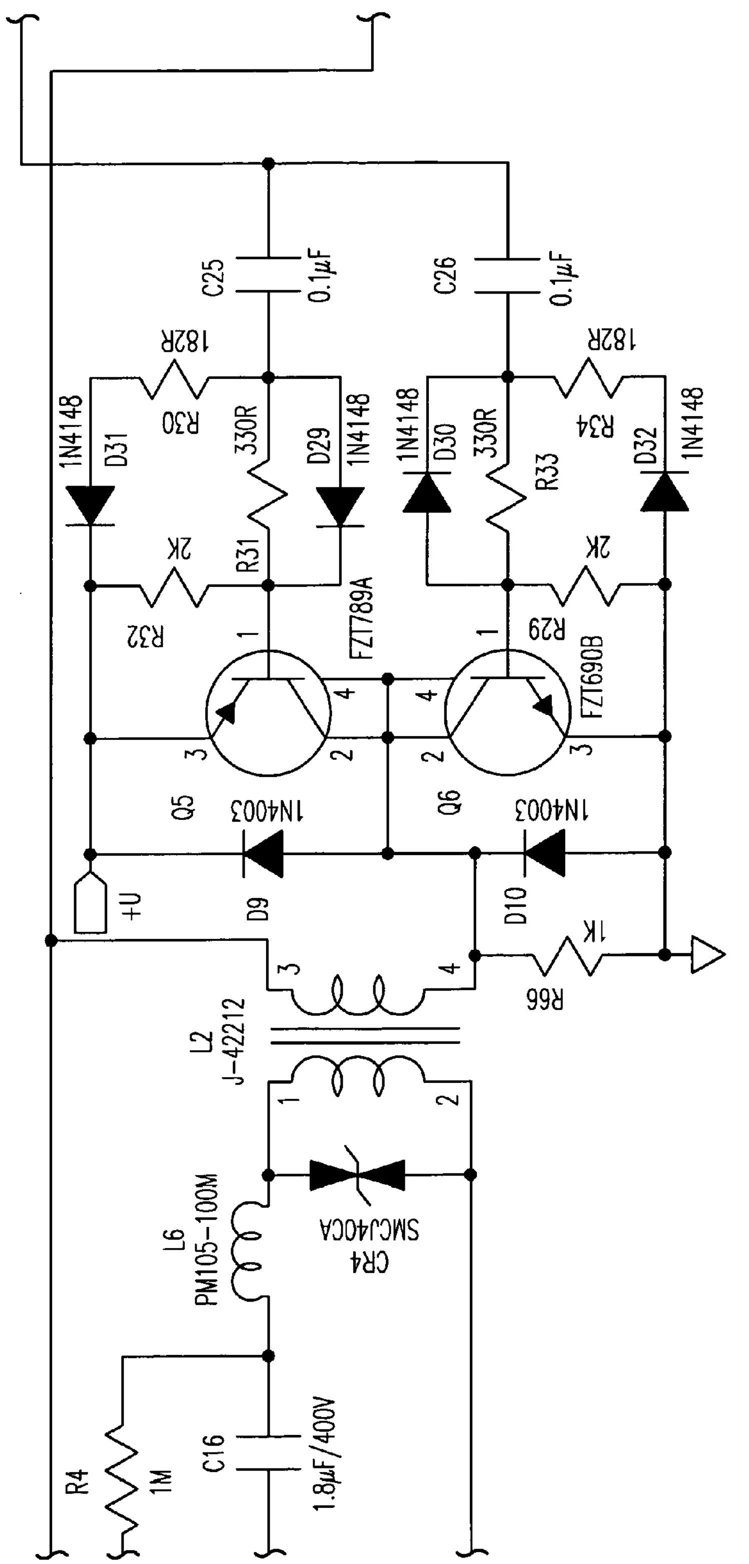
Figure 4F:
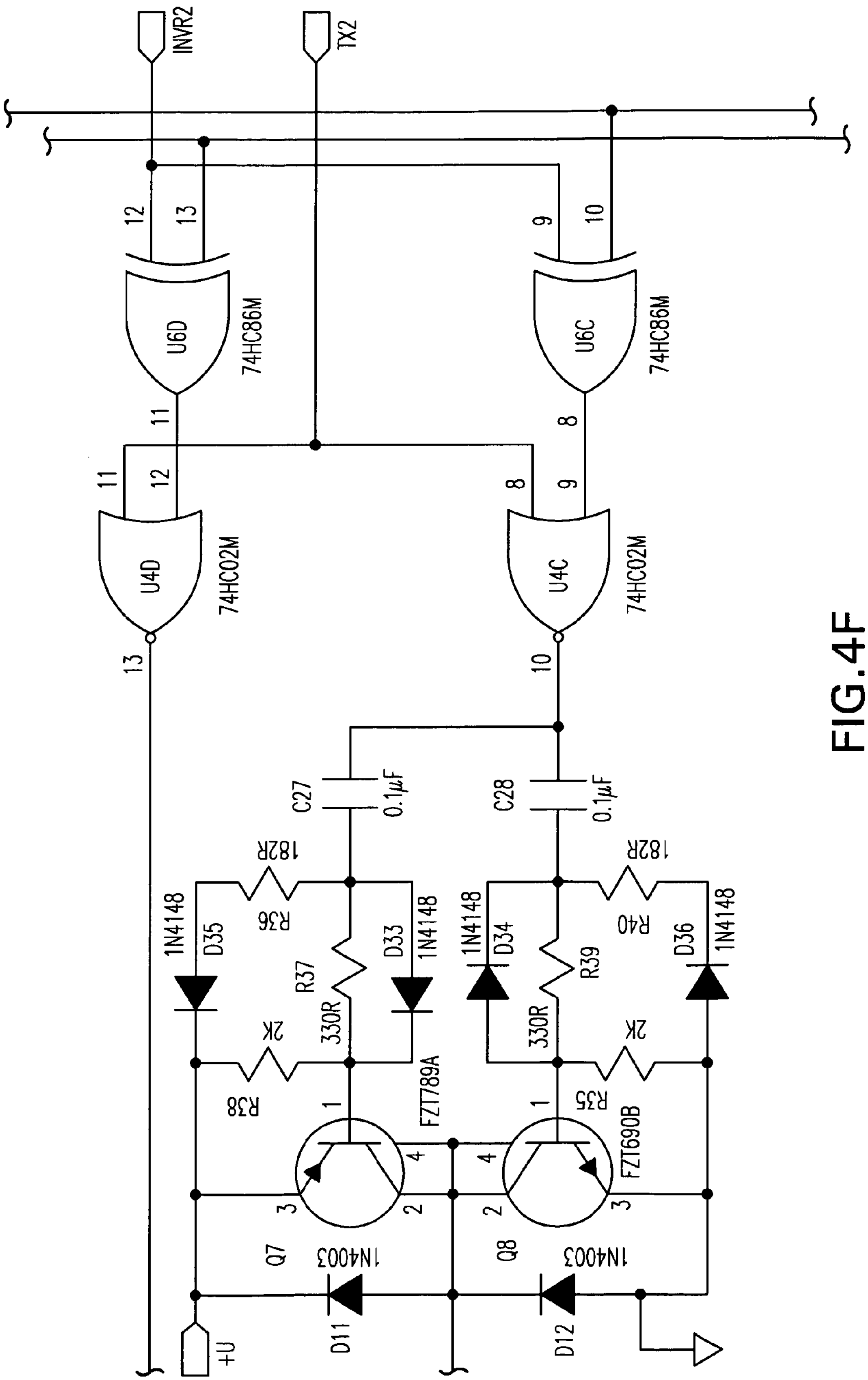
Figure 4G:
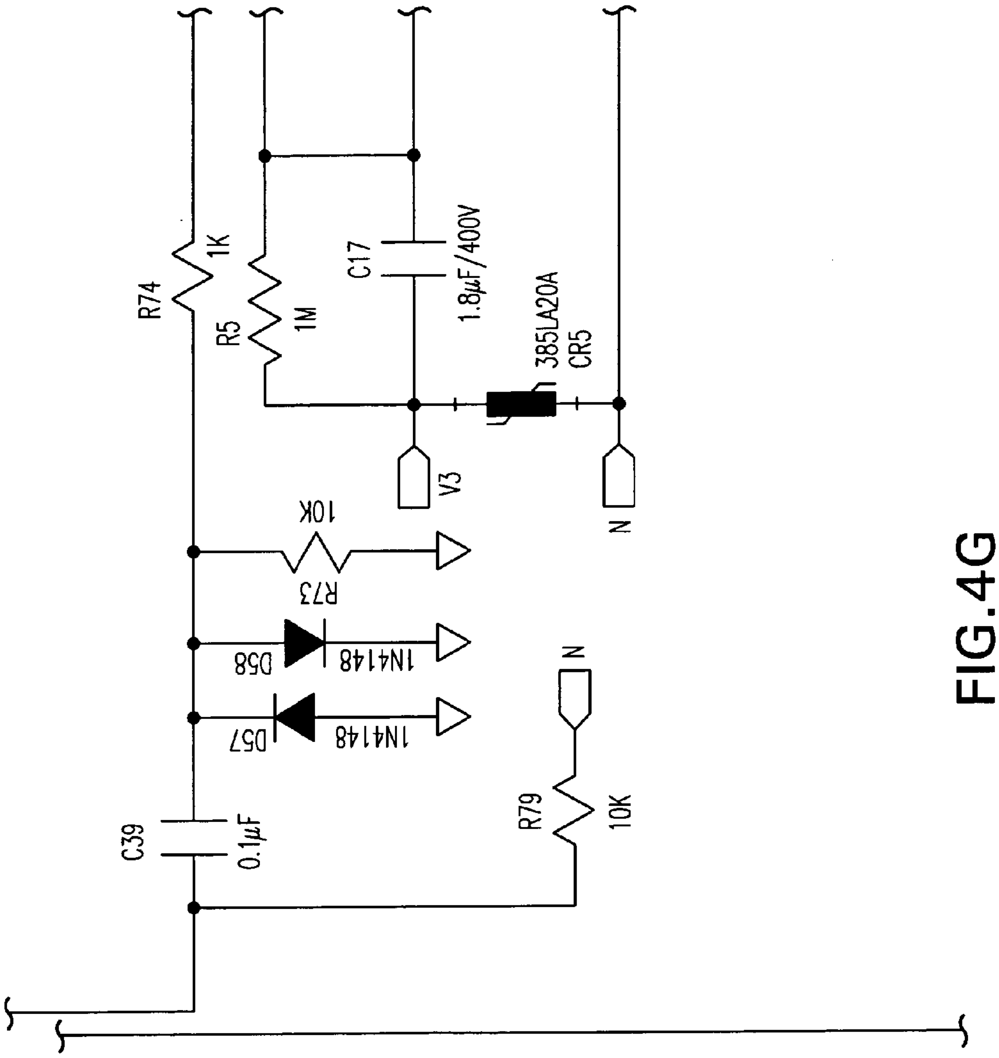
Figure 4H:
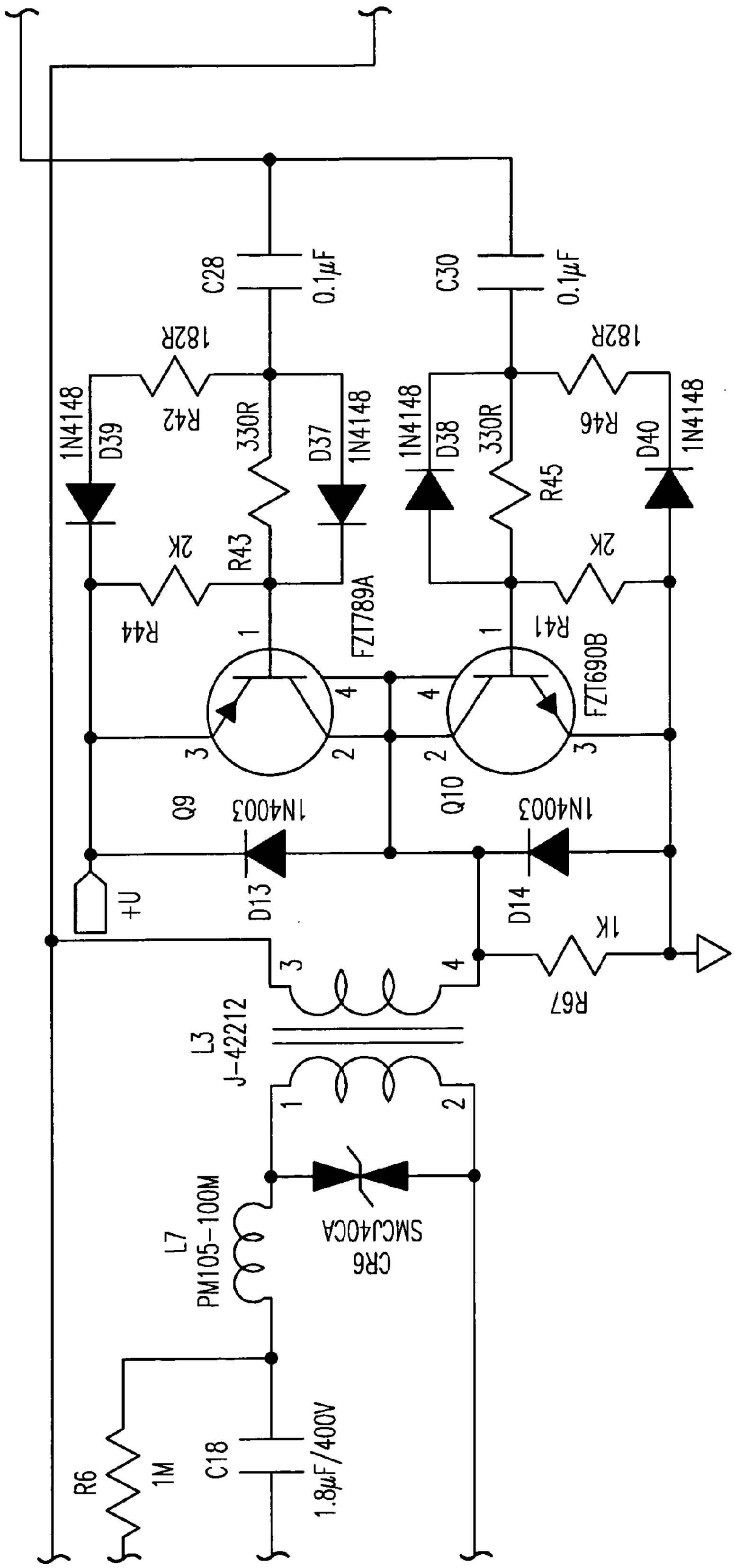
Figure 4I:
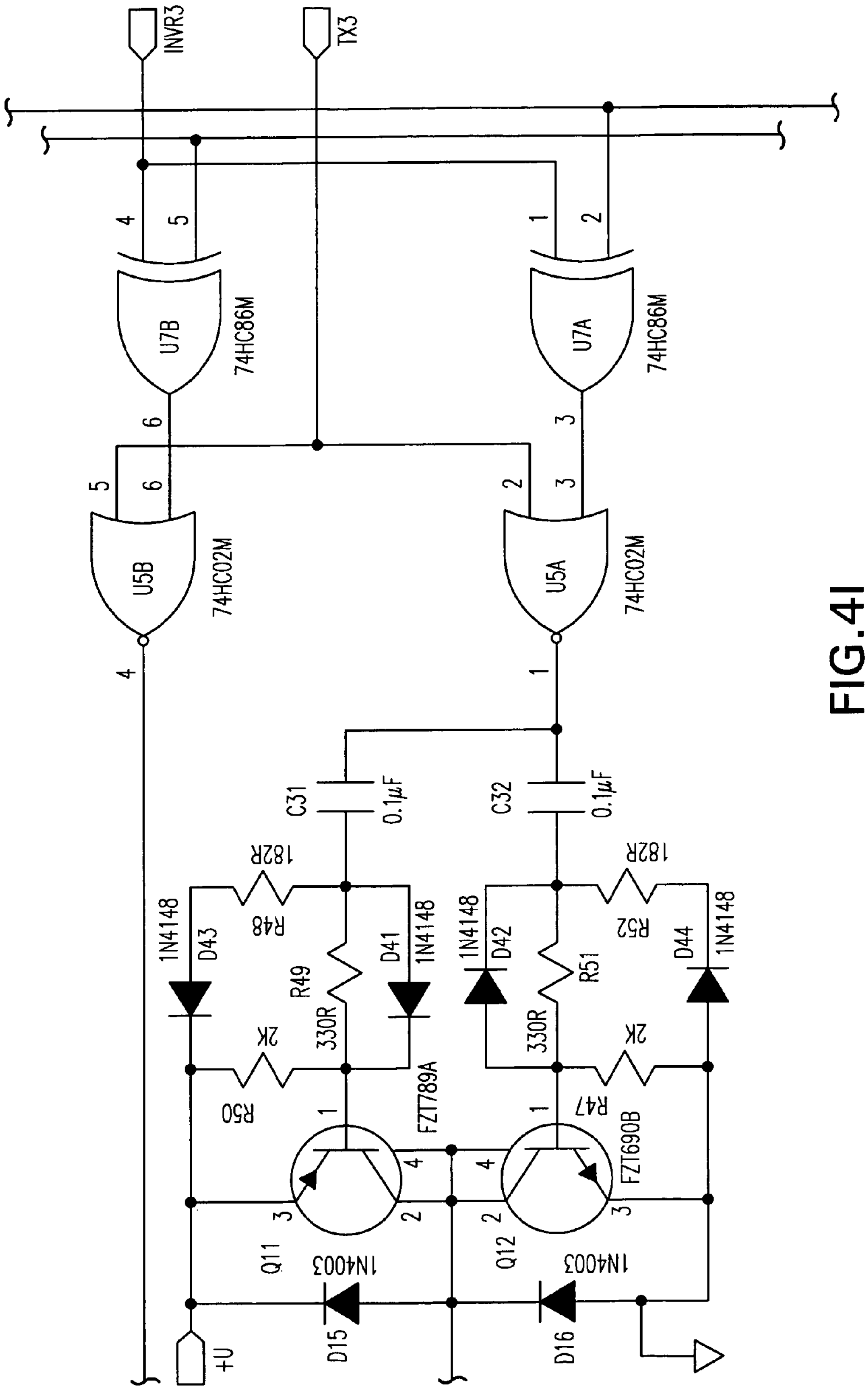
Figure 4J:
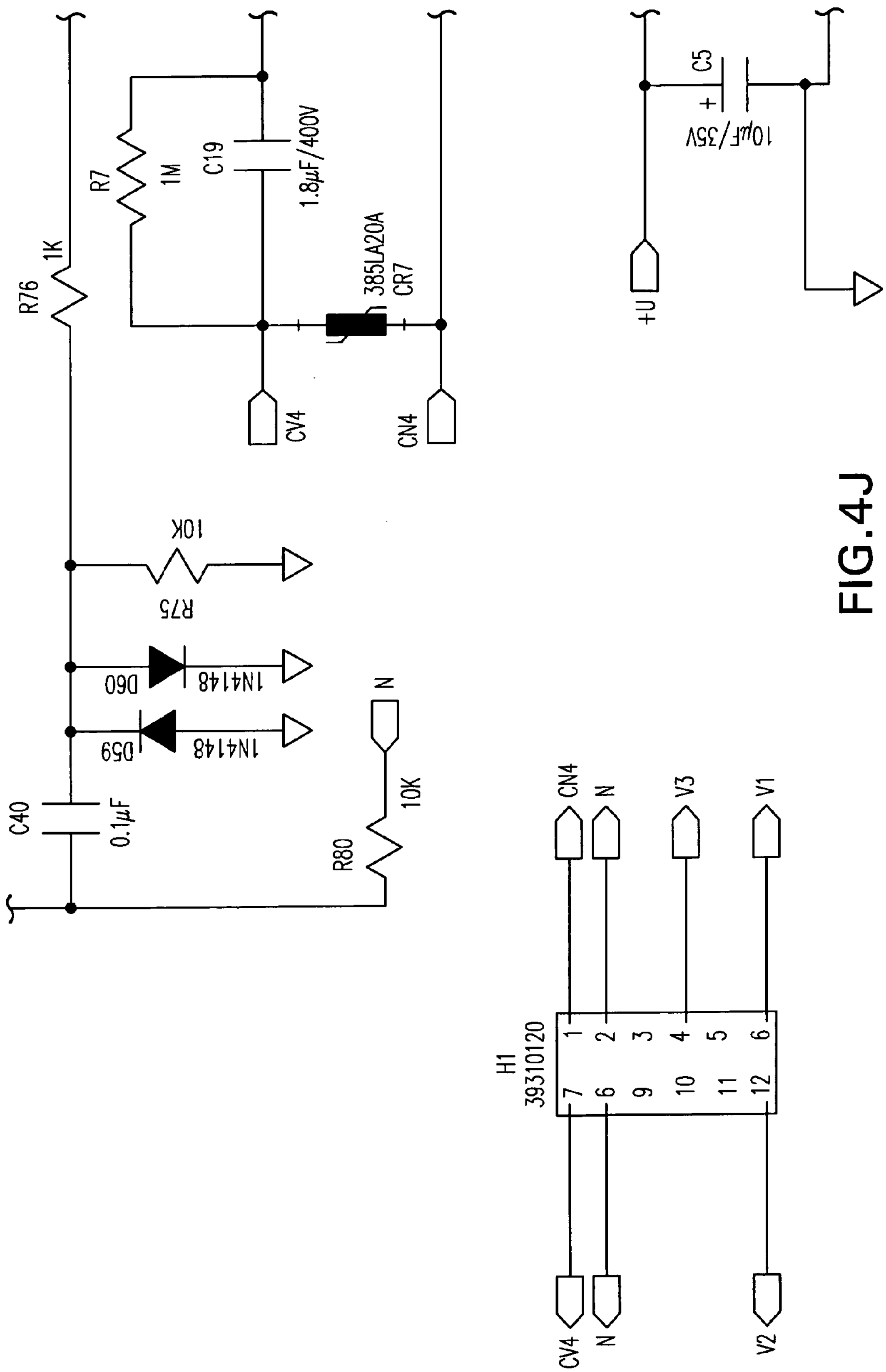
Figure 4K:
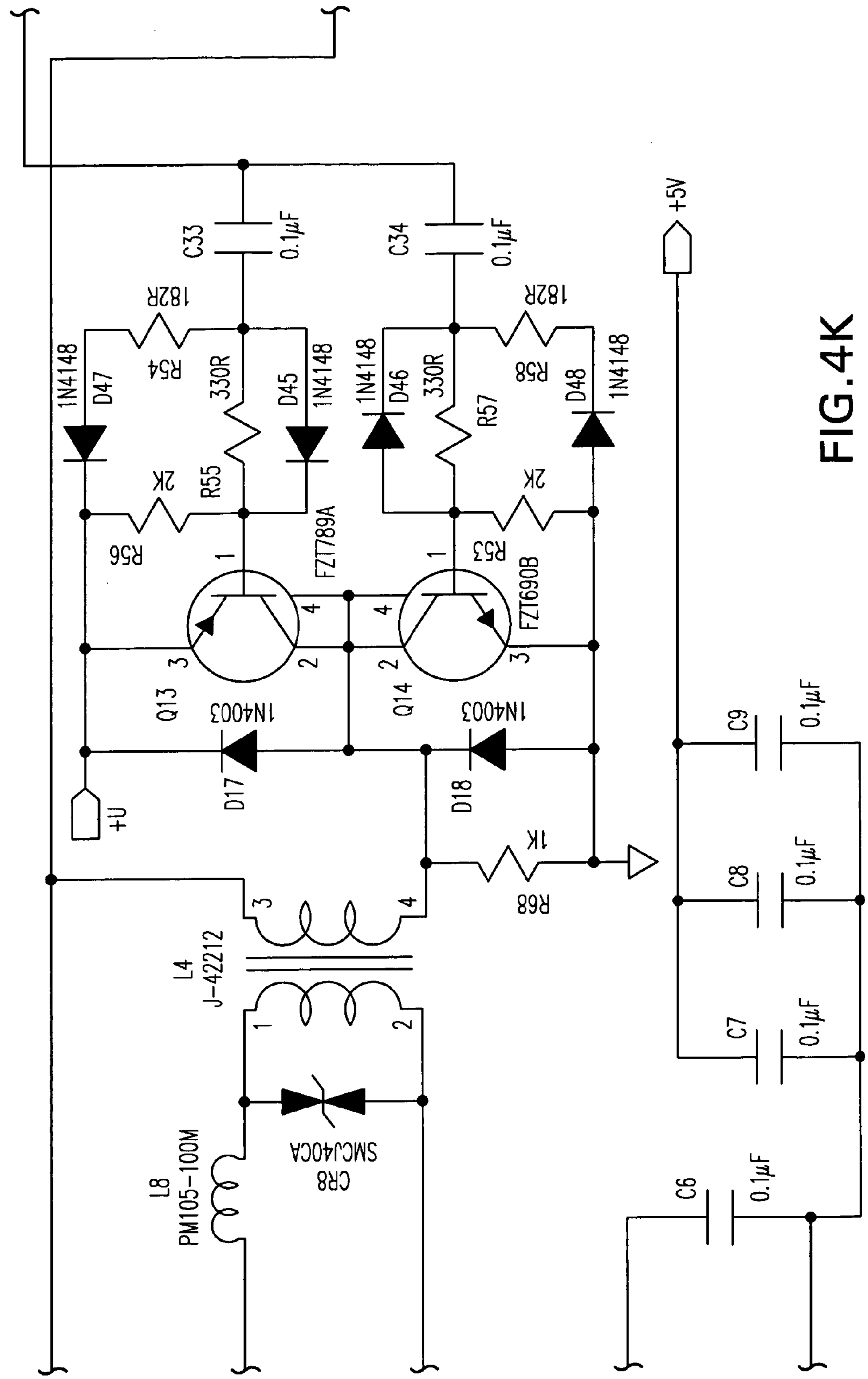
Figure 4L:
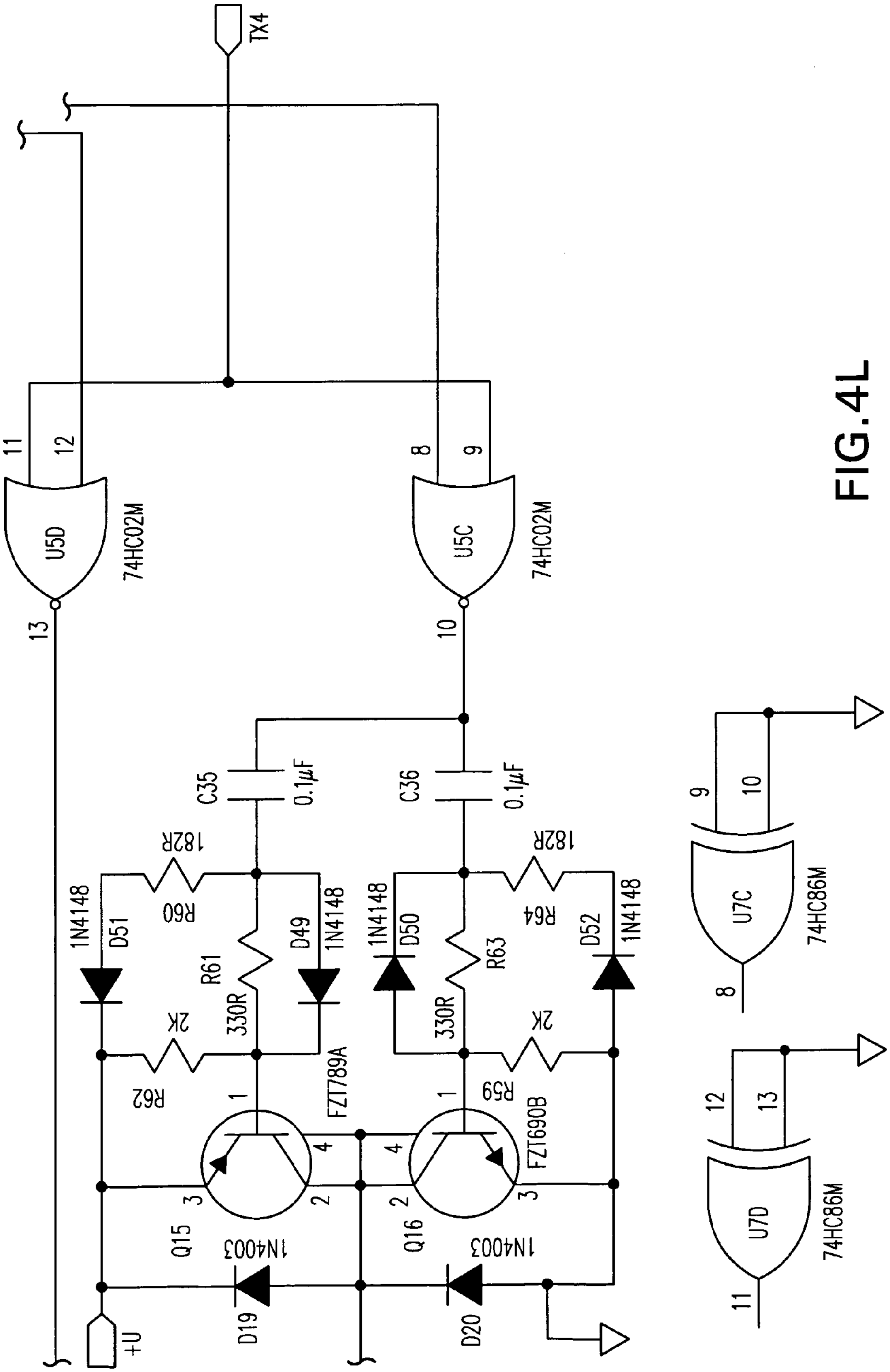
Figure 5:
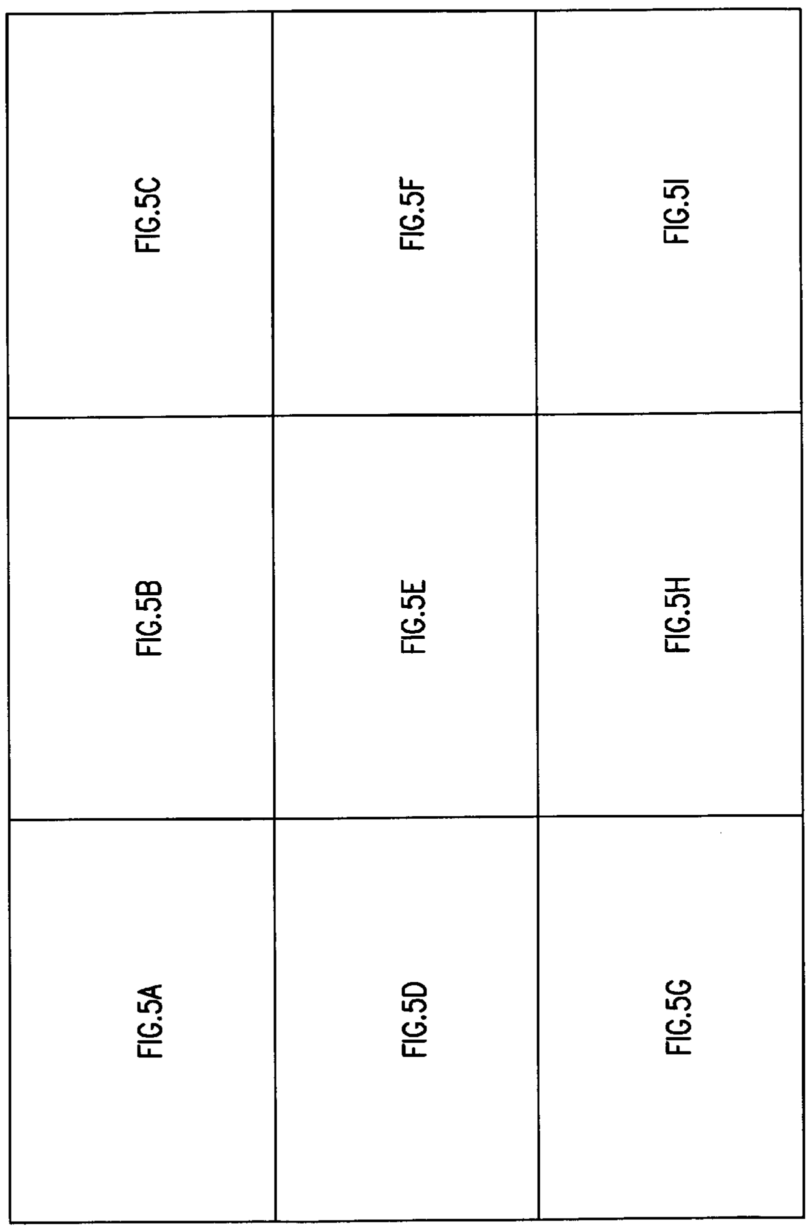
FIGS. 5A-I illustrate a schematic diagram of a preferred MiniCloset power supply.
Figure 5A:
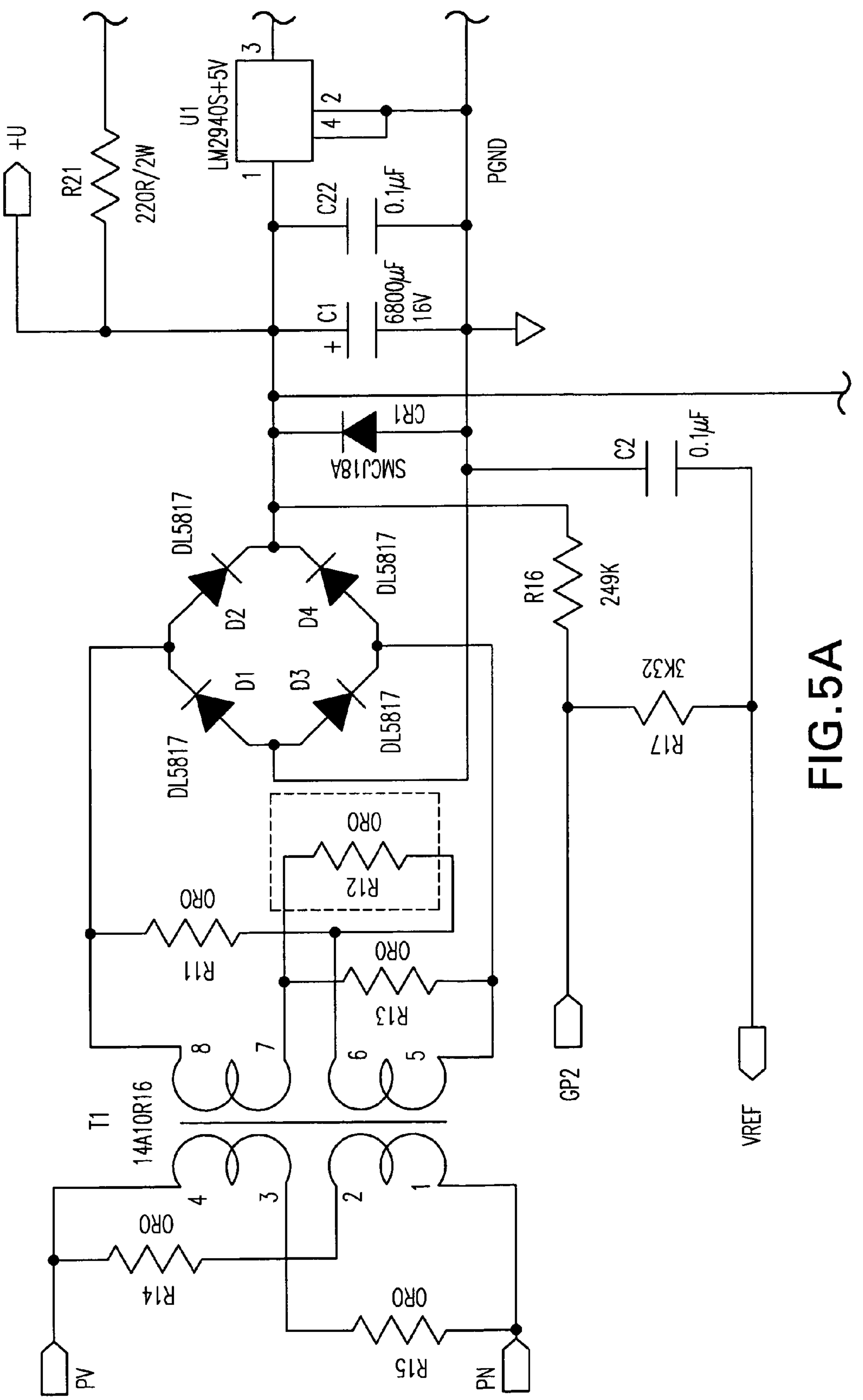
Figure 5B:
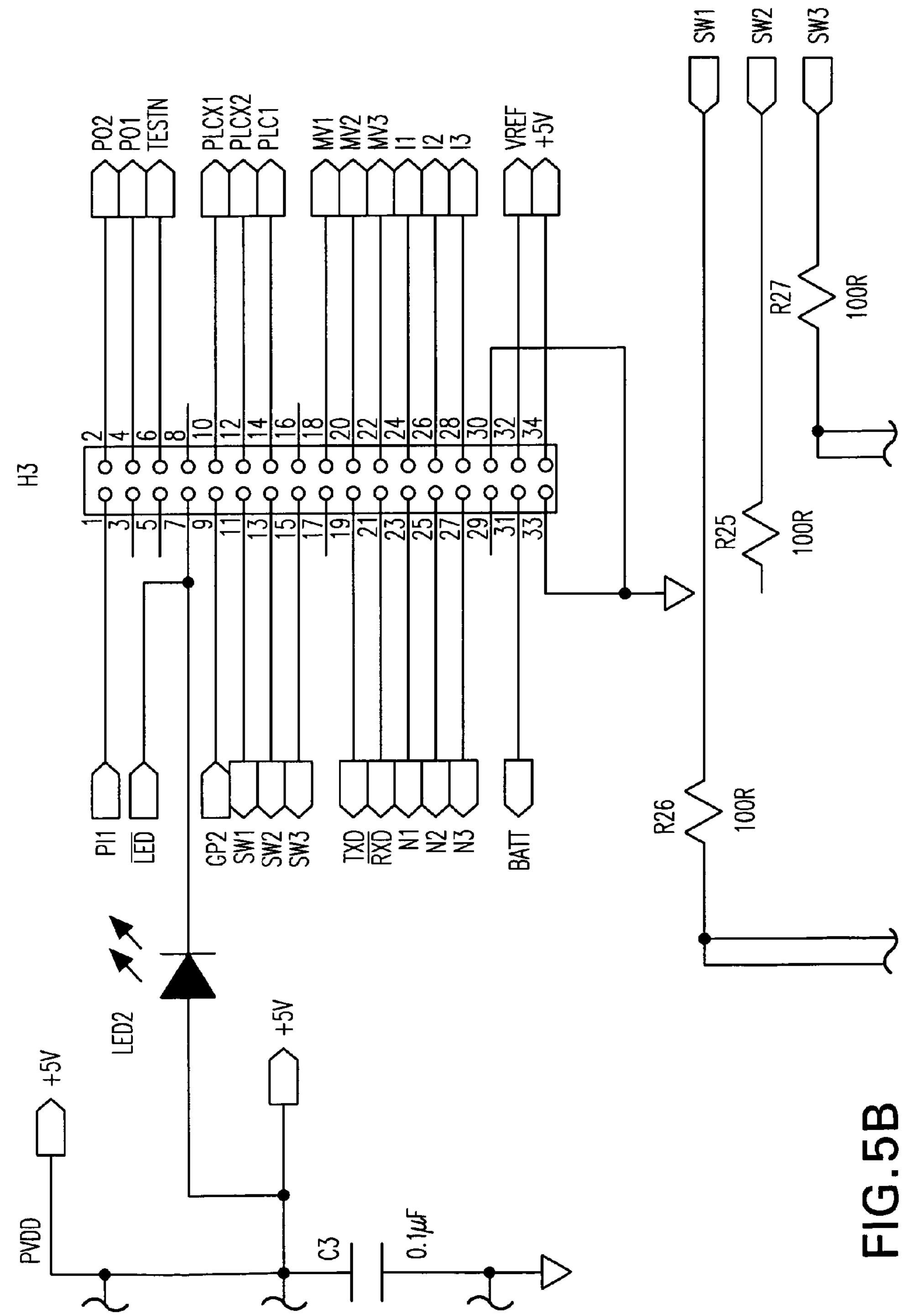
Figure 5C:
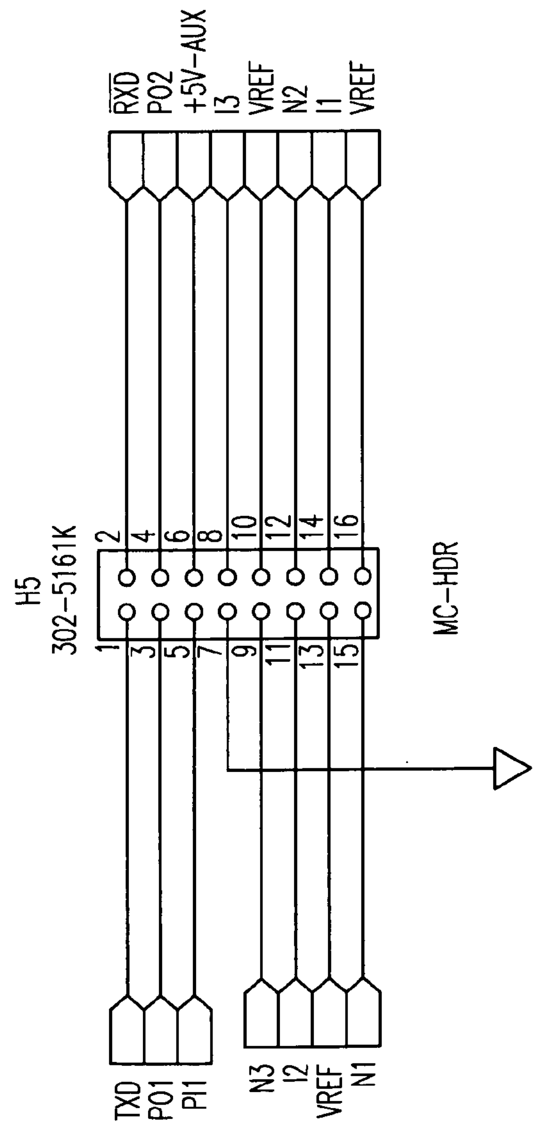
Figure 5D:
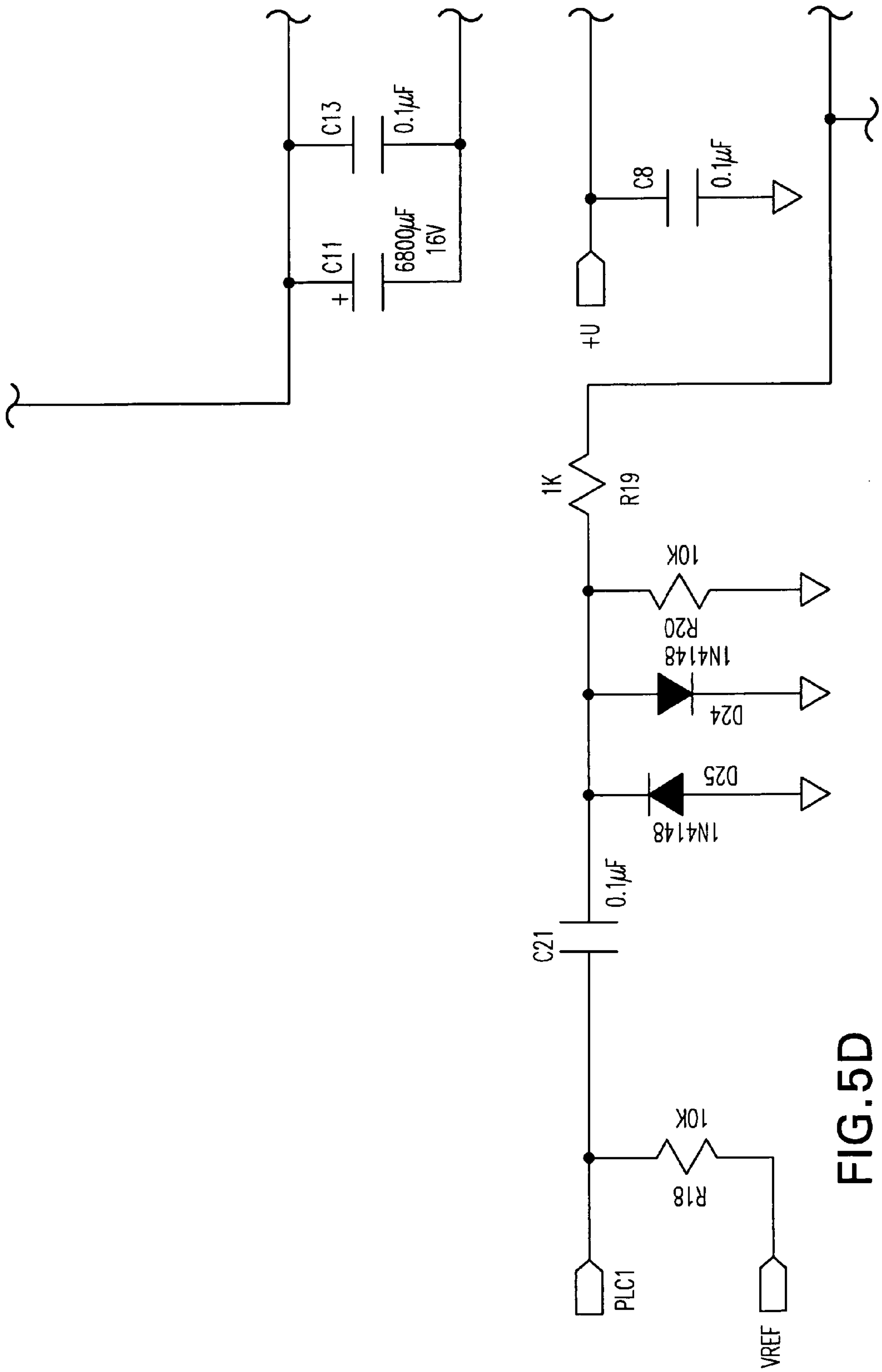
Figure 5E:
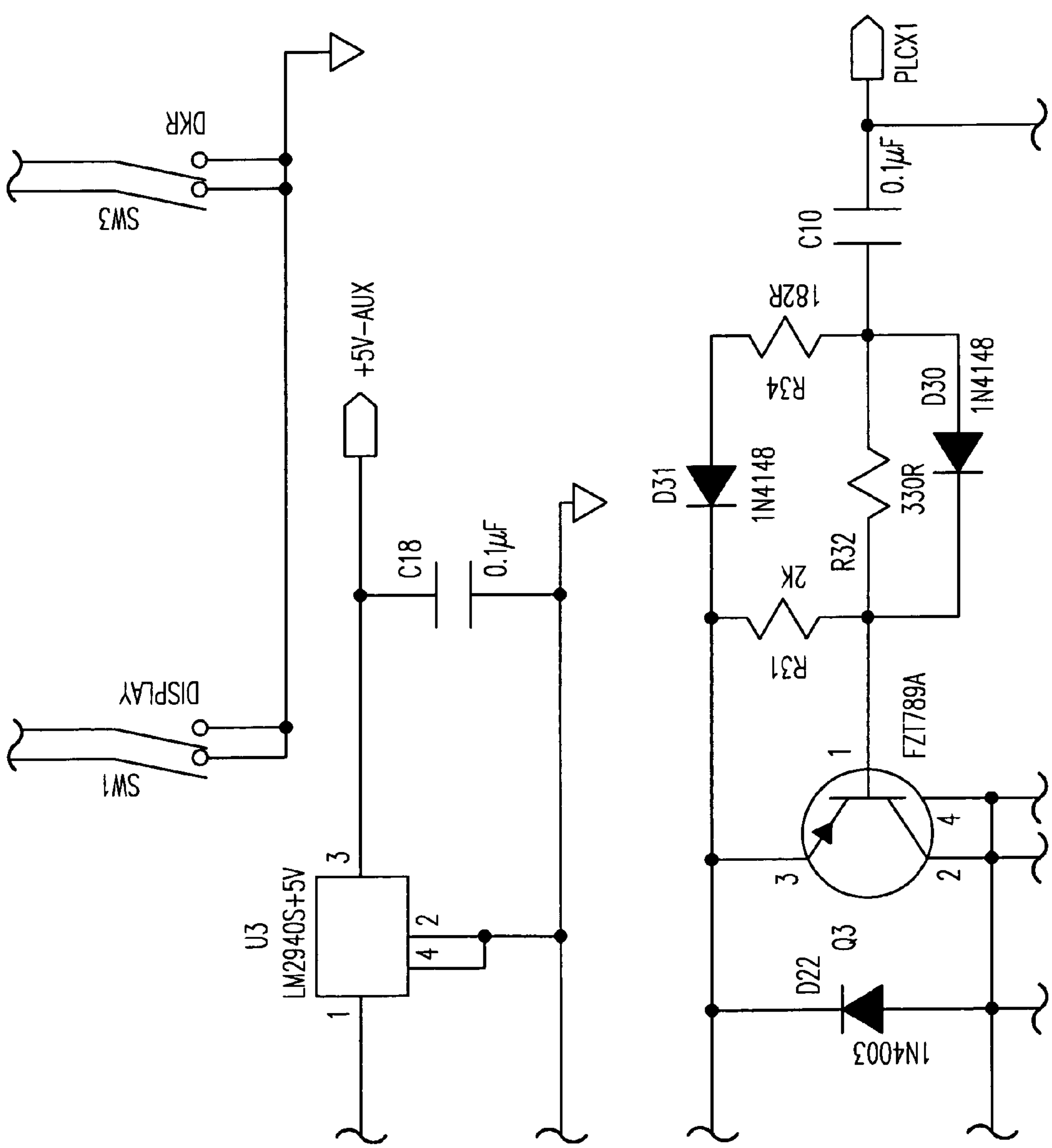
Figure 5F:
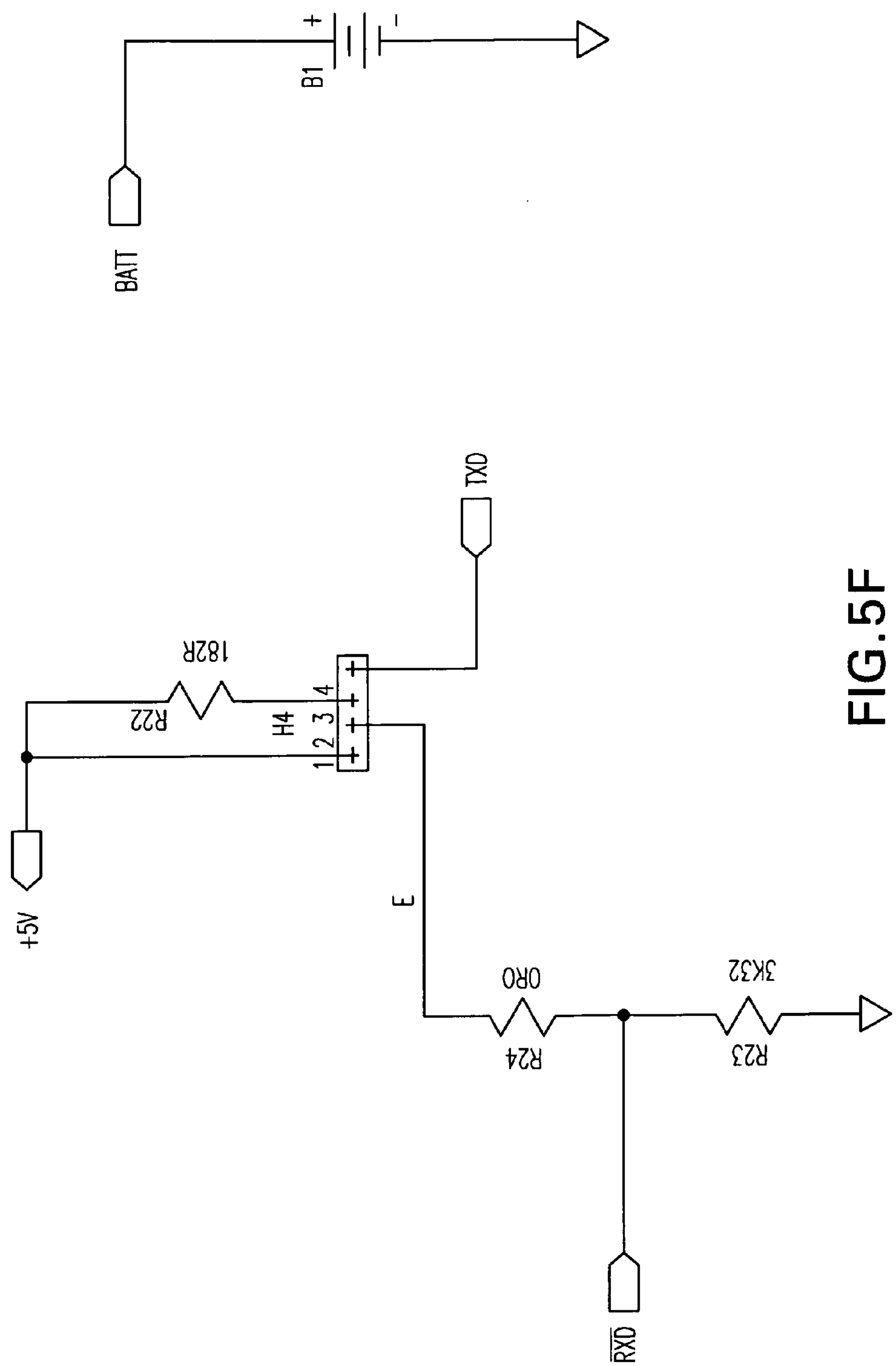
Figure 5G:
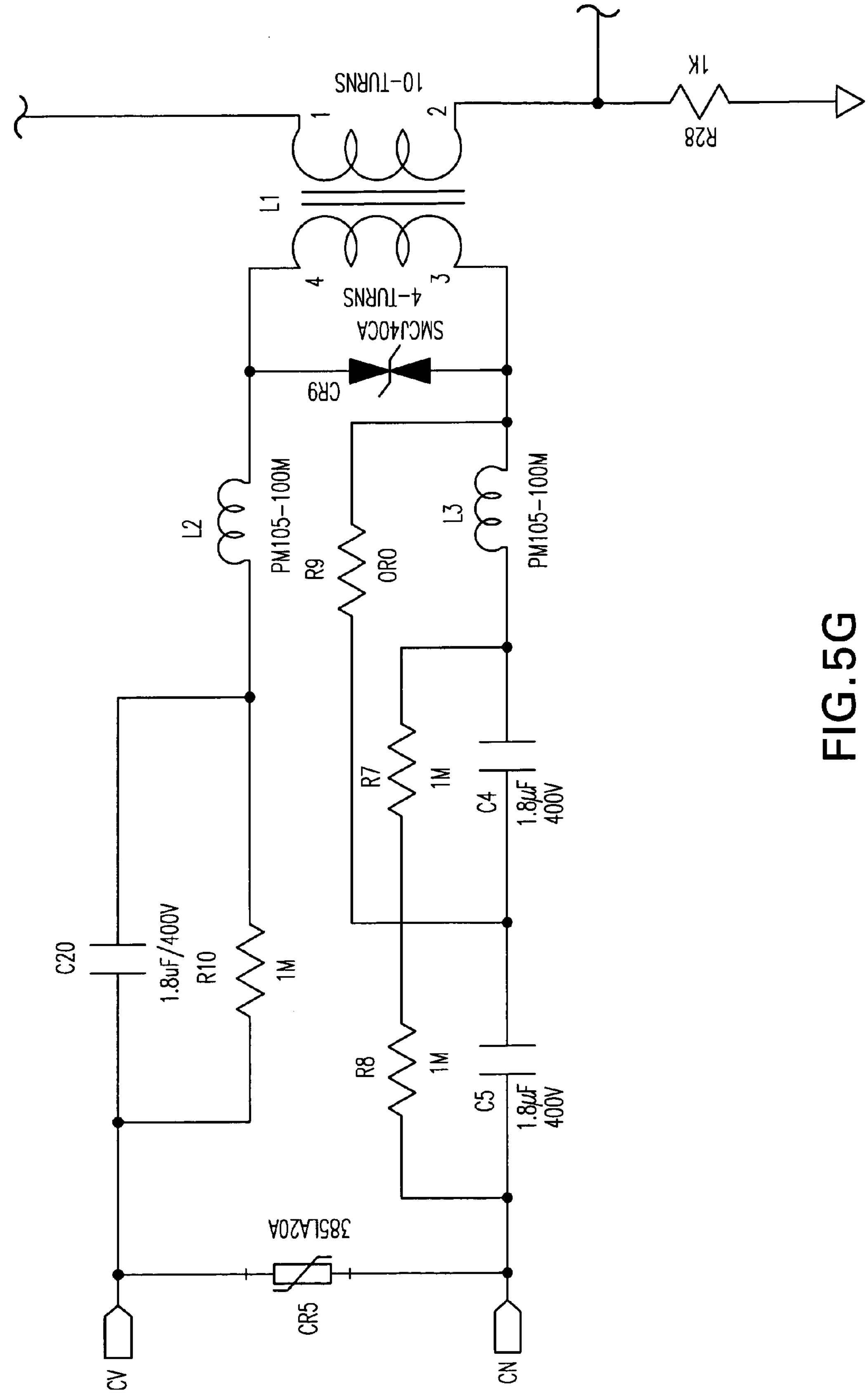
Figure 5H:
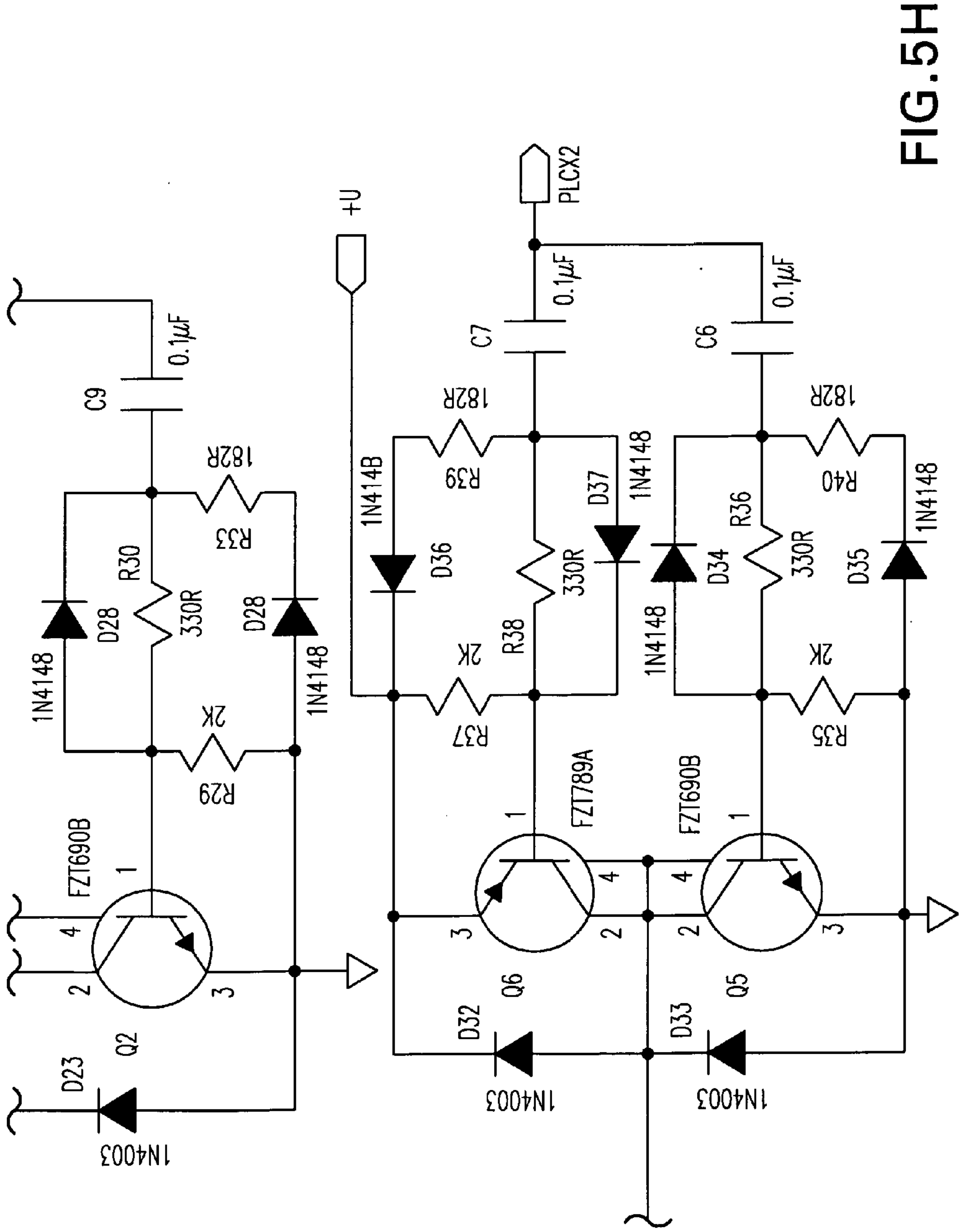
Figure 5I:
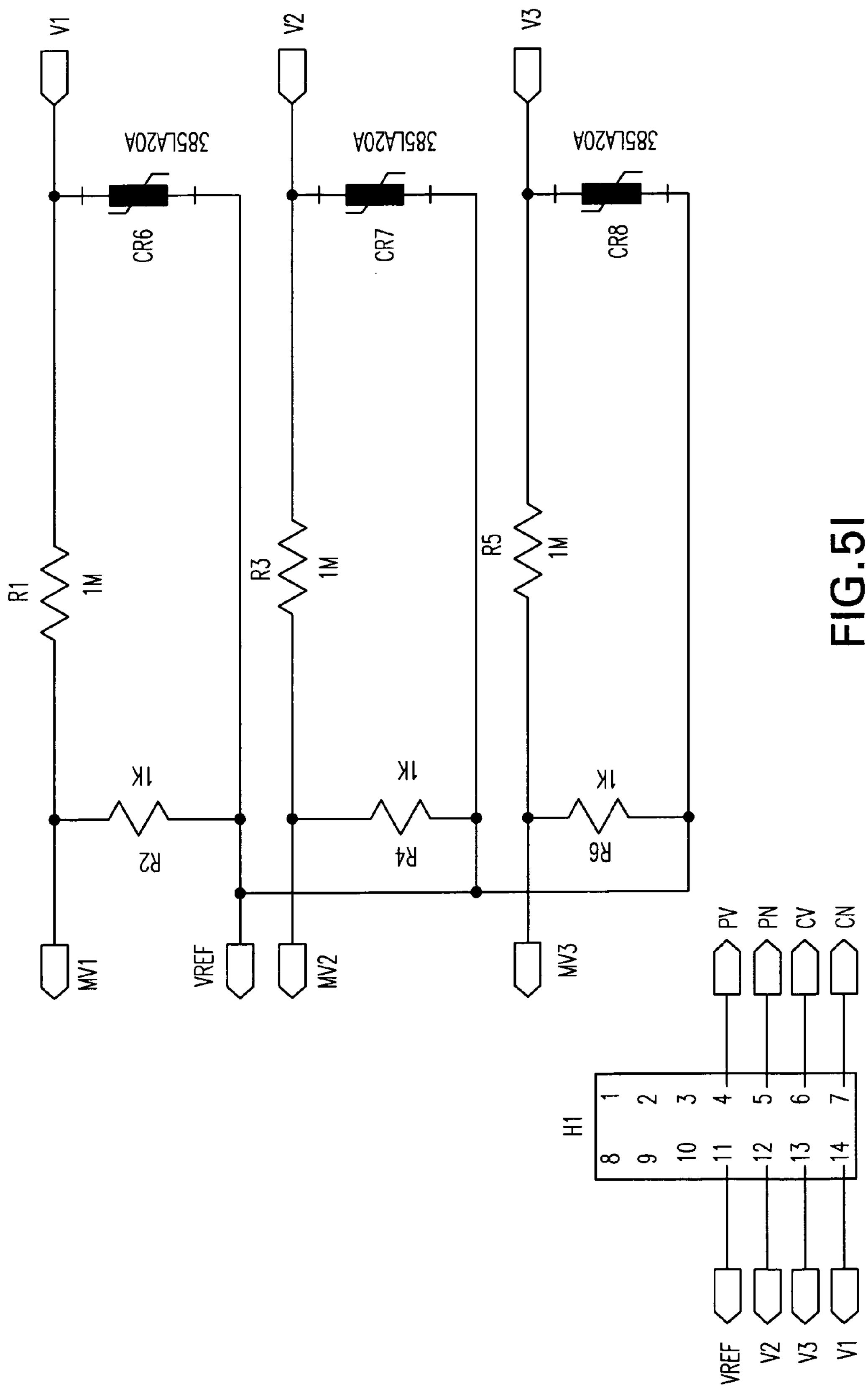
Figure 6A:
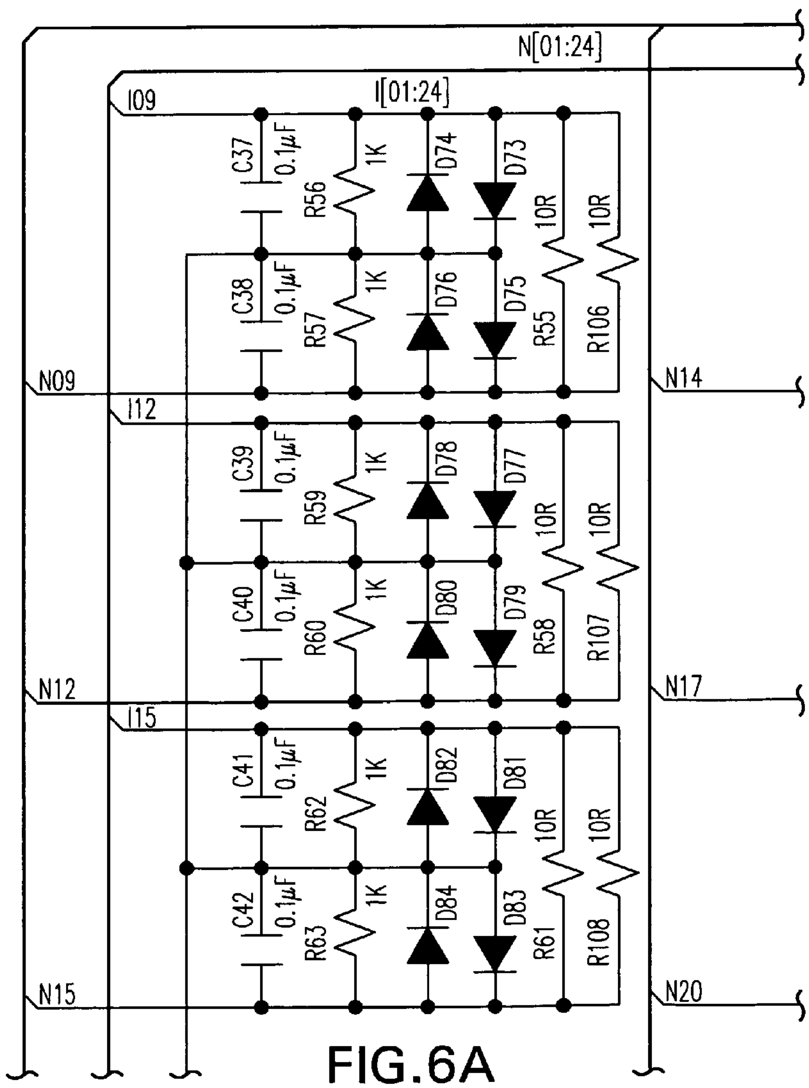
FIGS. 6A-U illustrate a schematic diagram of a preferred circuit board for returning current transformer information to a MiniCloset meter head.
Figure 6B:
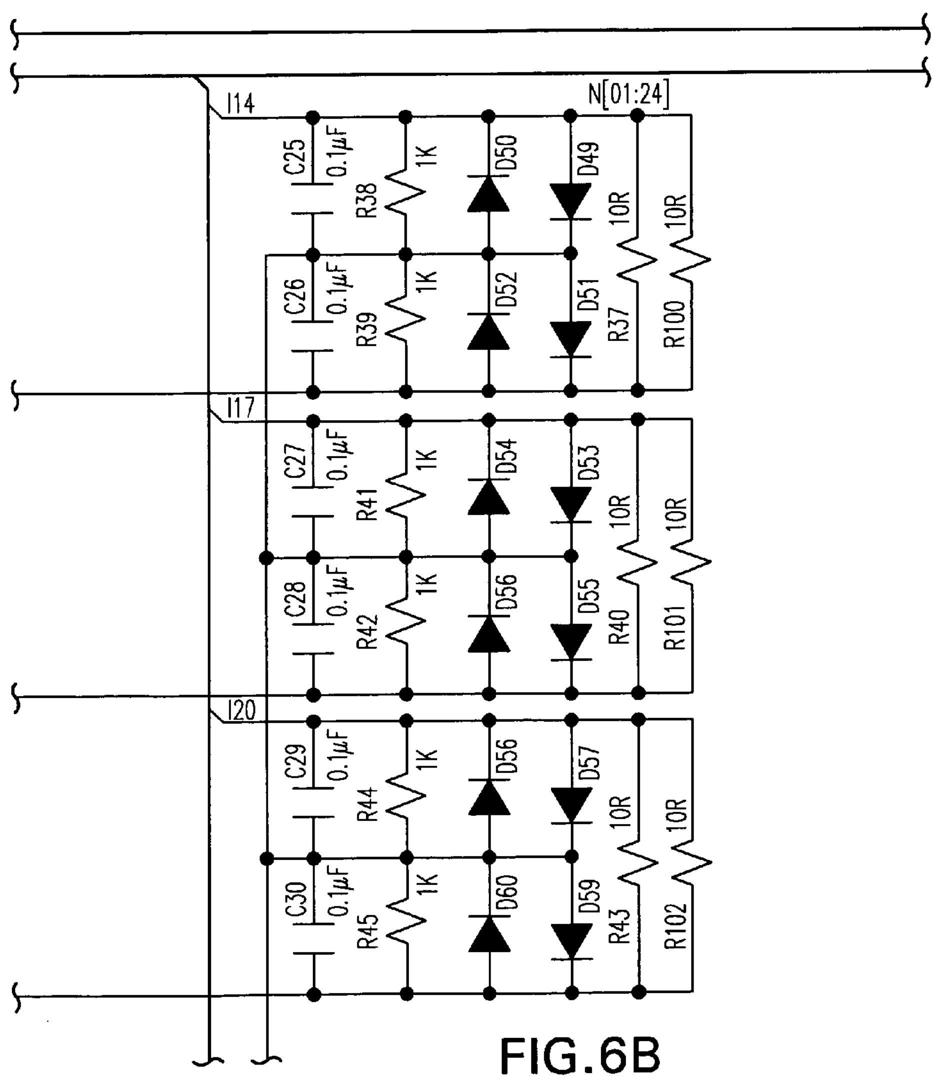
Figure 6C:
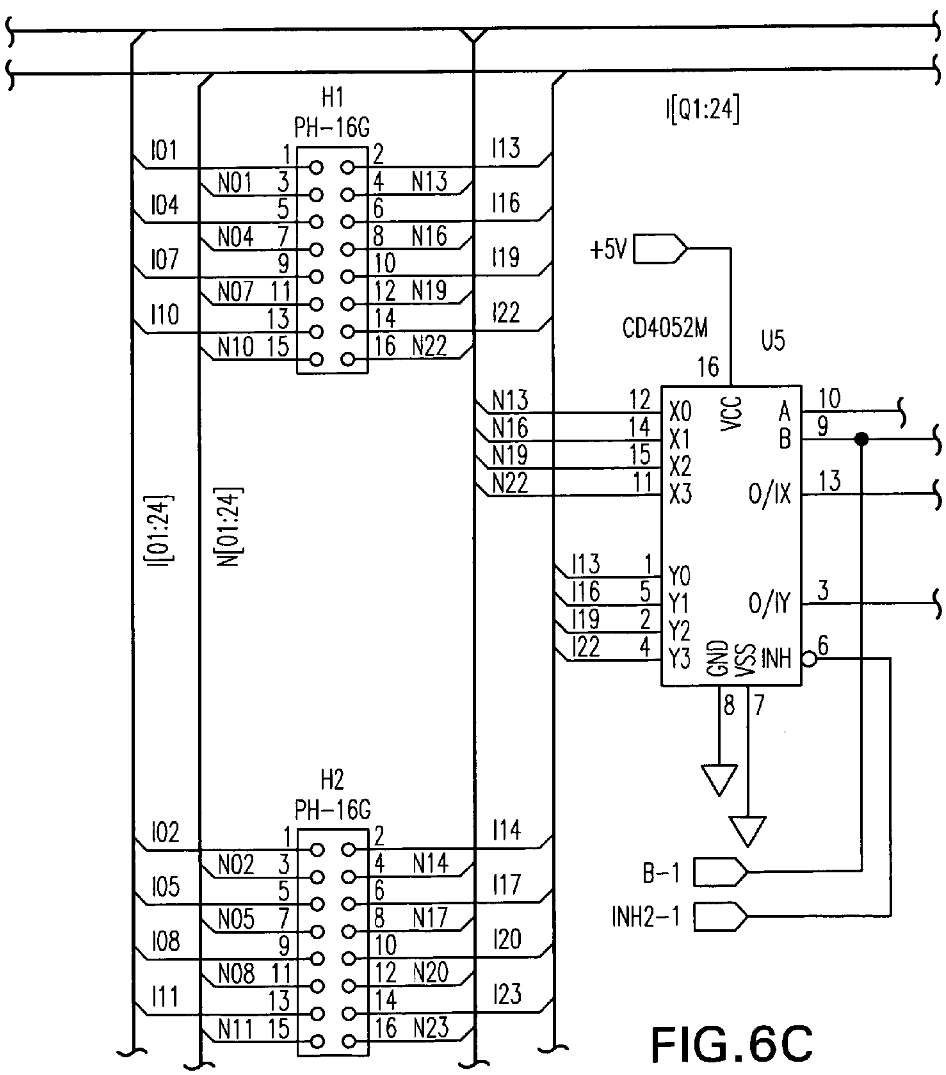
Figure 6D:
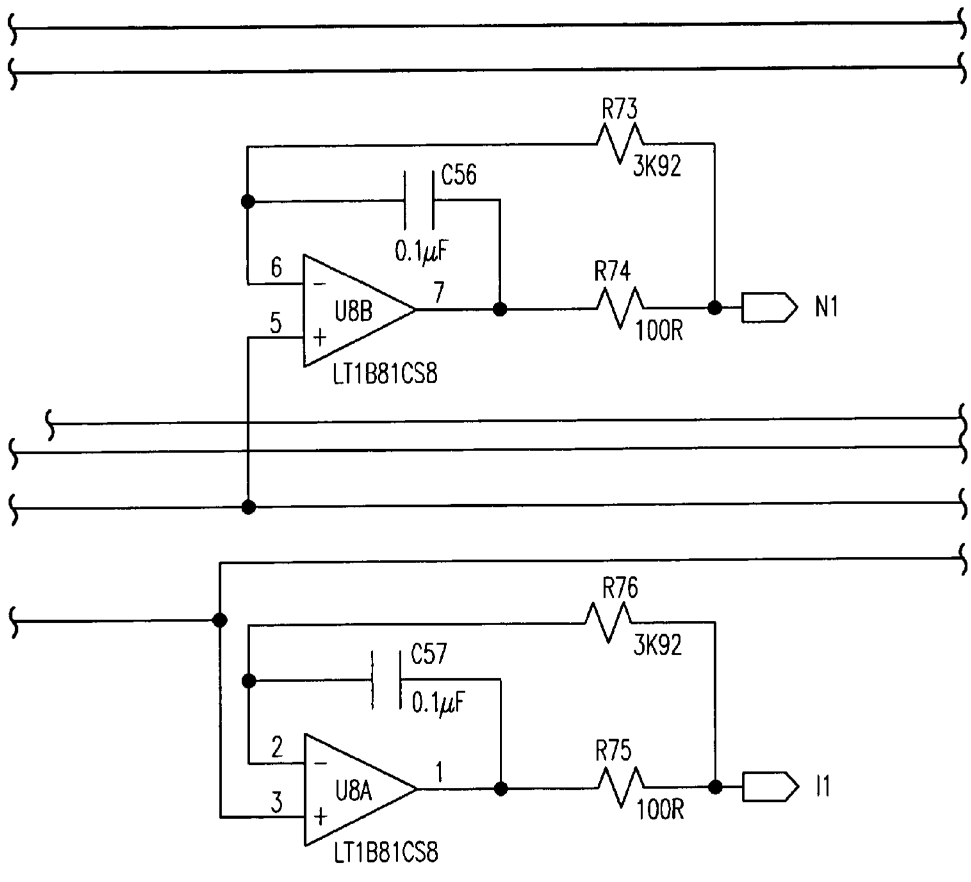
Figure 6E:
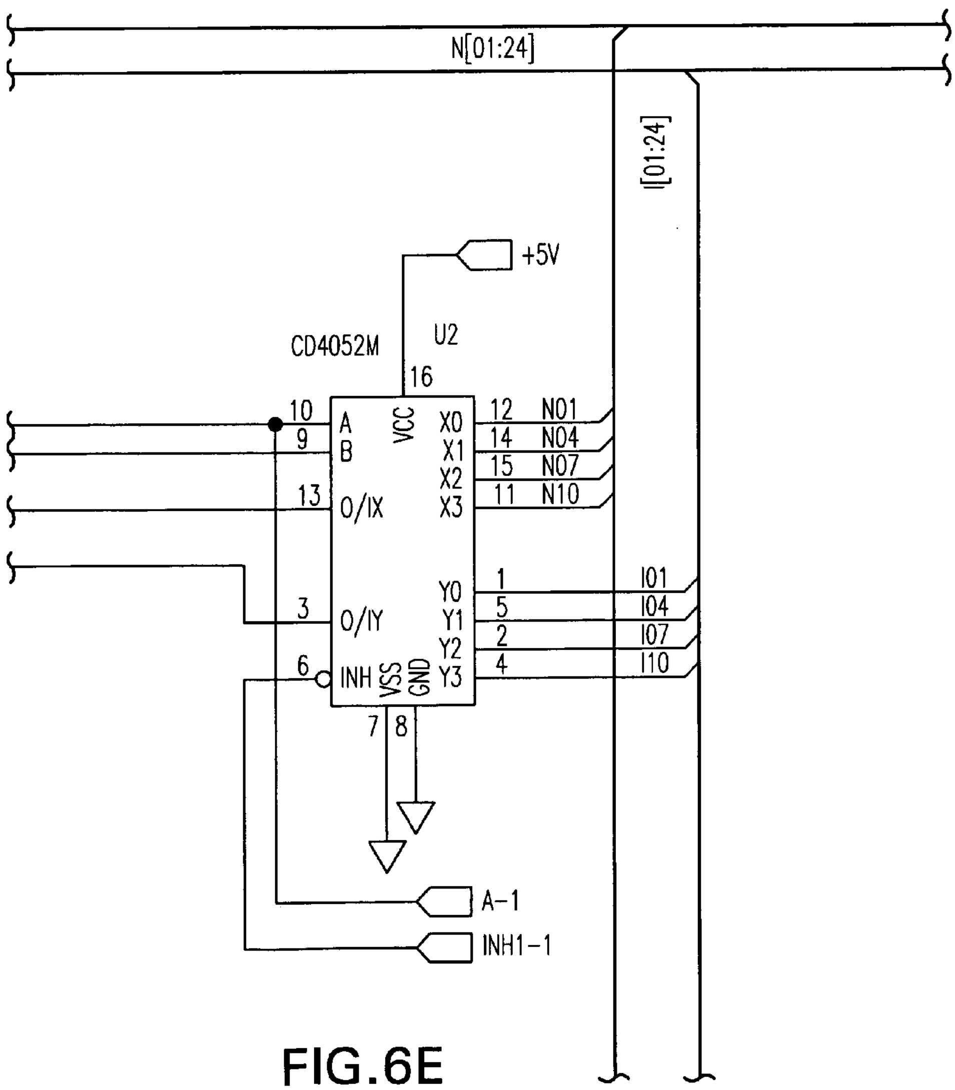
Figure 6F:
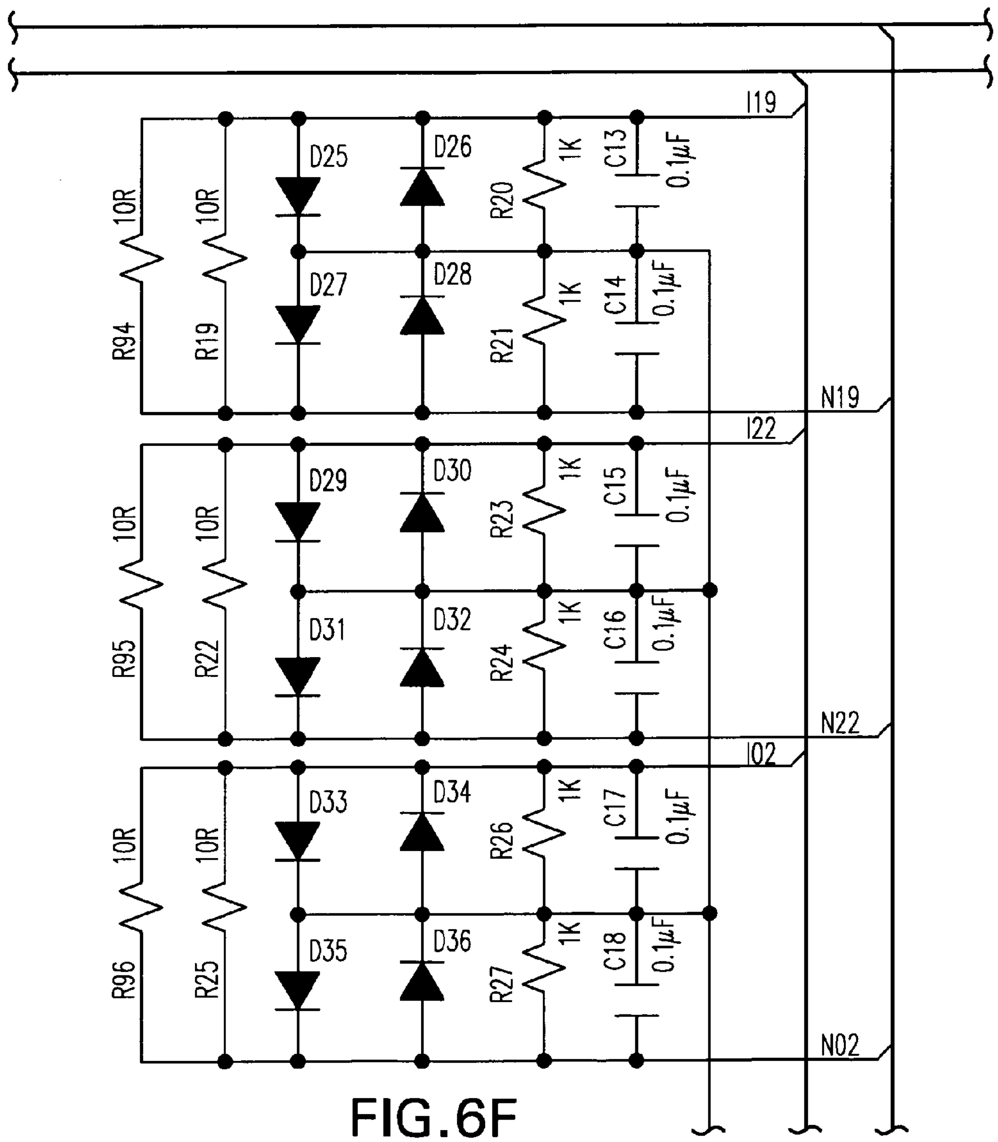
Figure 6G:
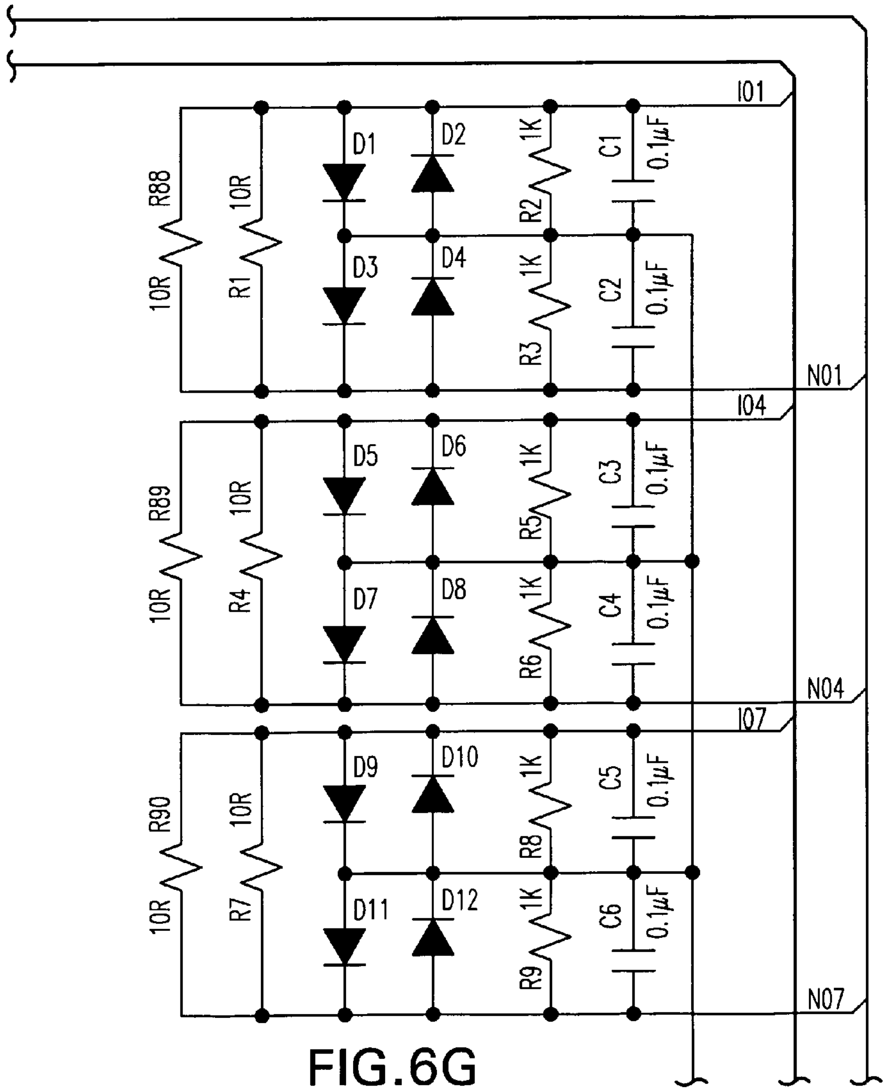
Figure 6H:
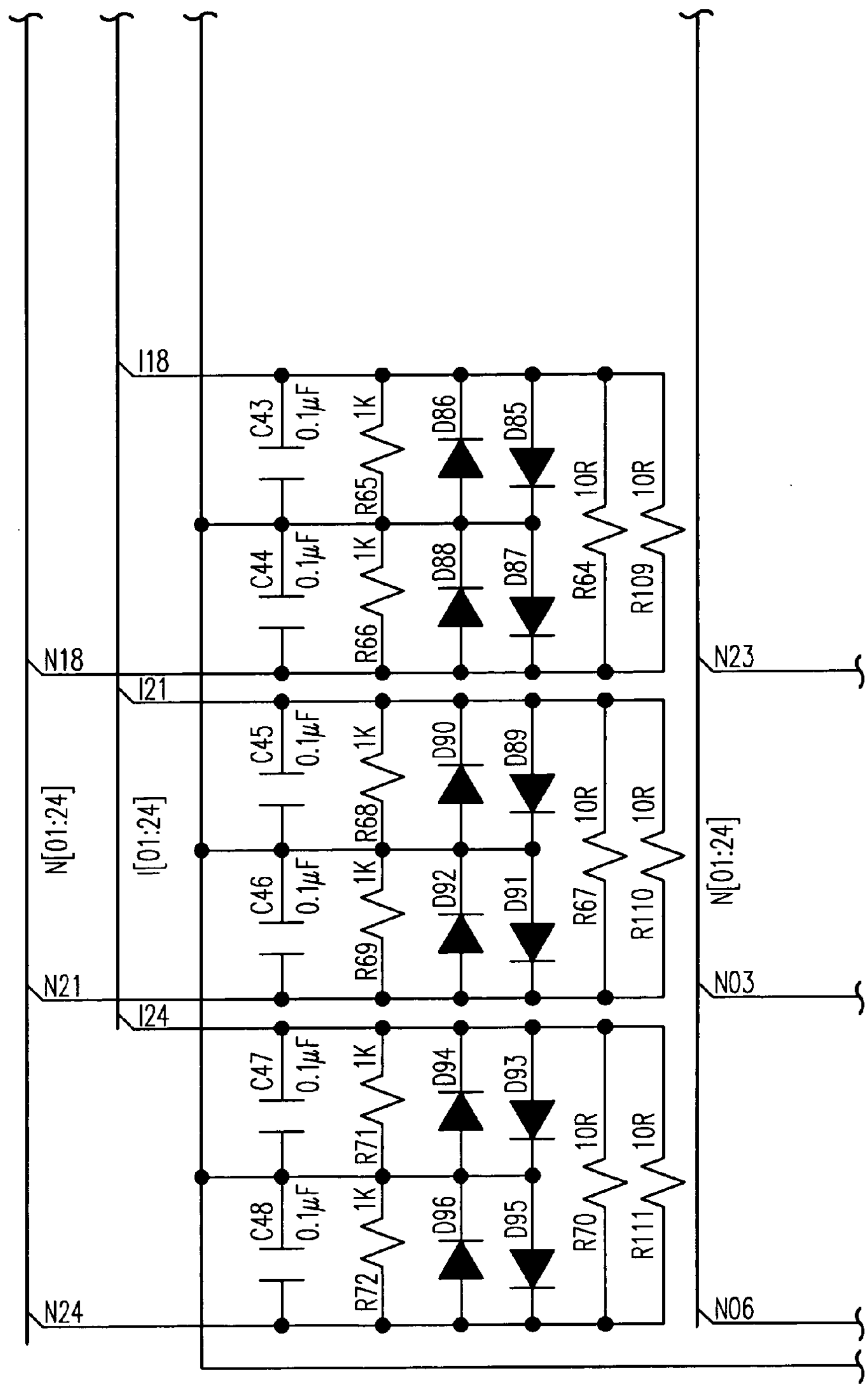
Figure 6I:
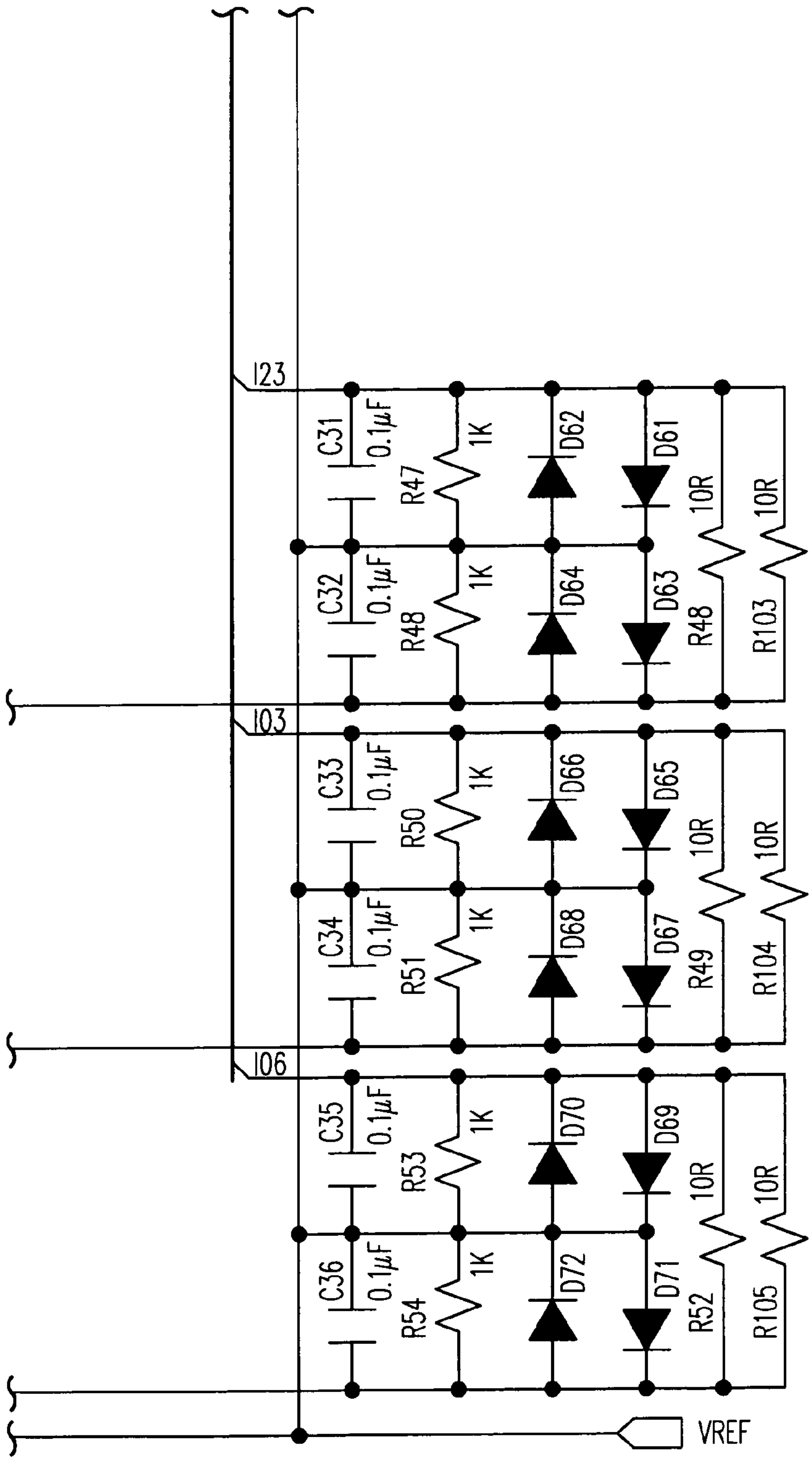
Figure 6J:
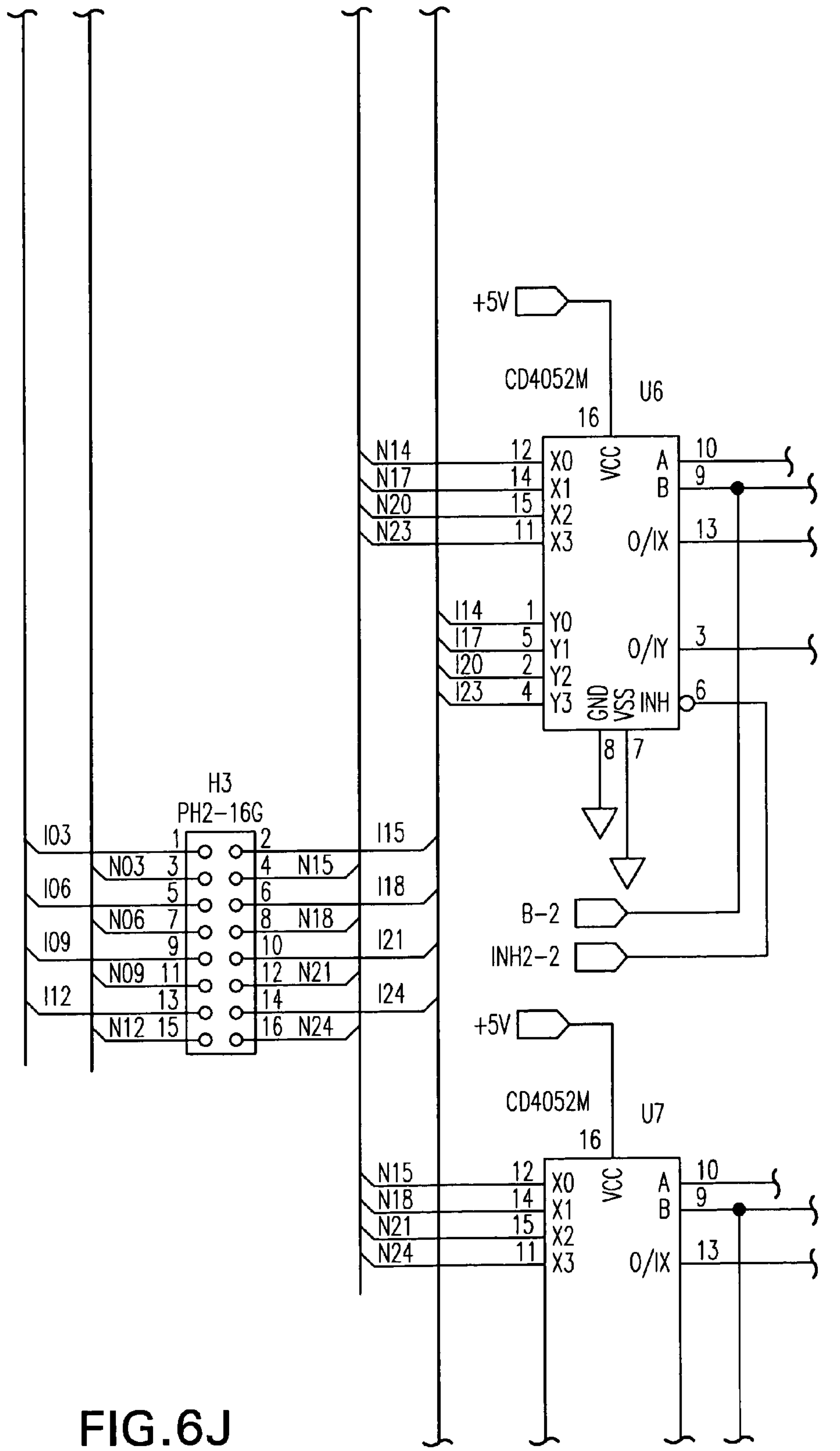
Figure 6K:
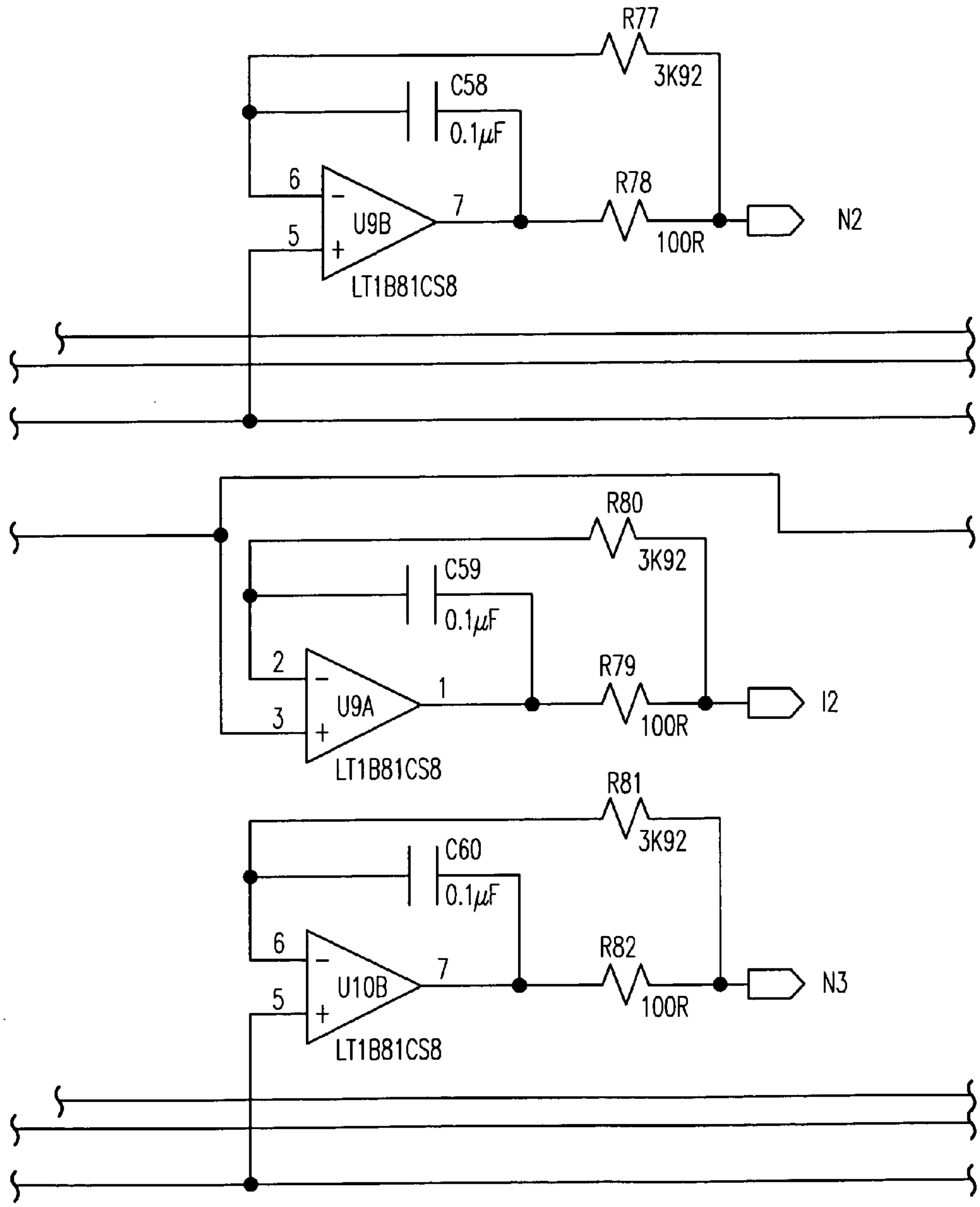
Figure 6L:
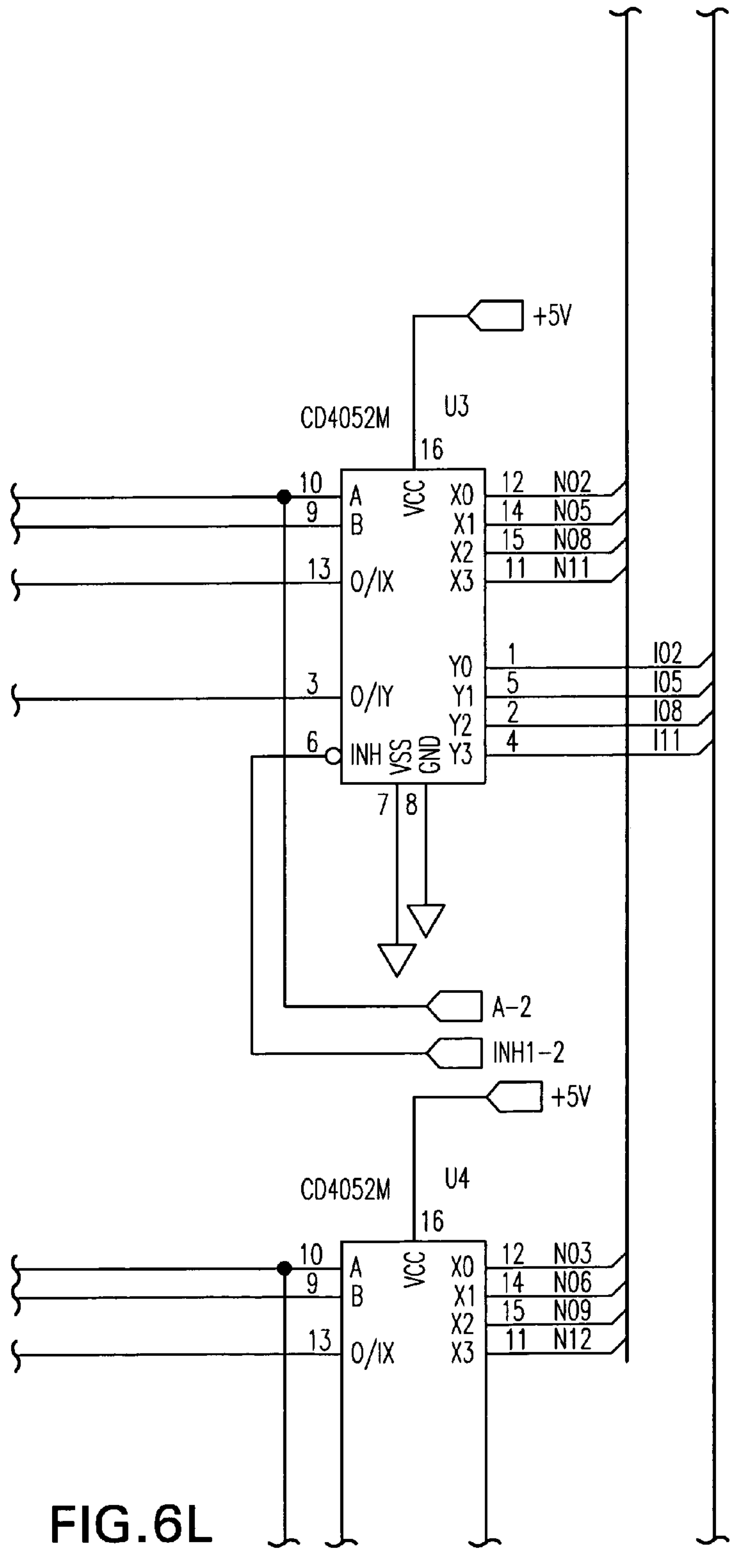
Figure 6M:
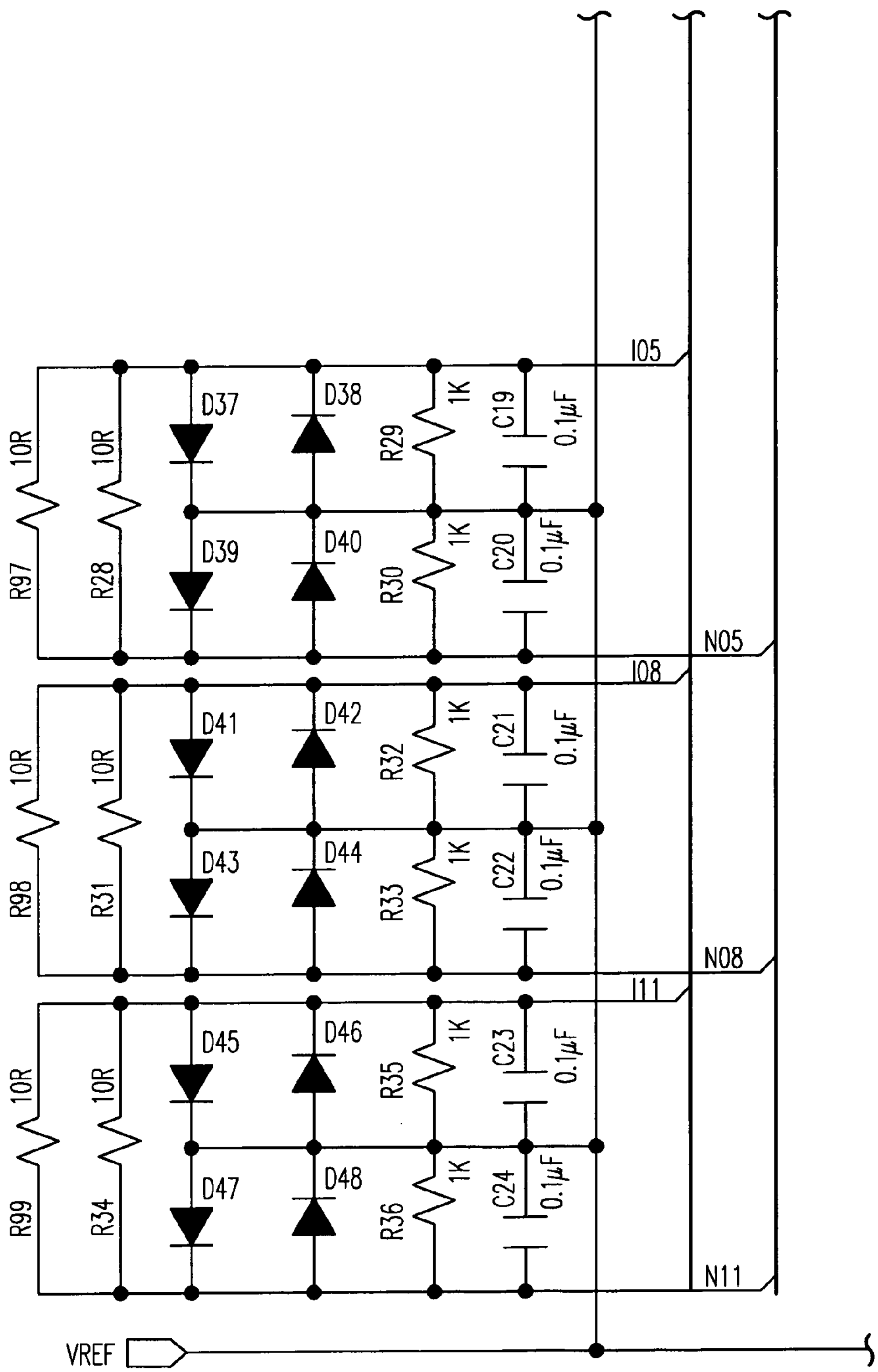
Figure 6N:
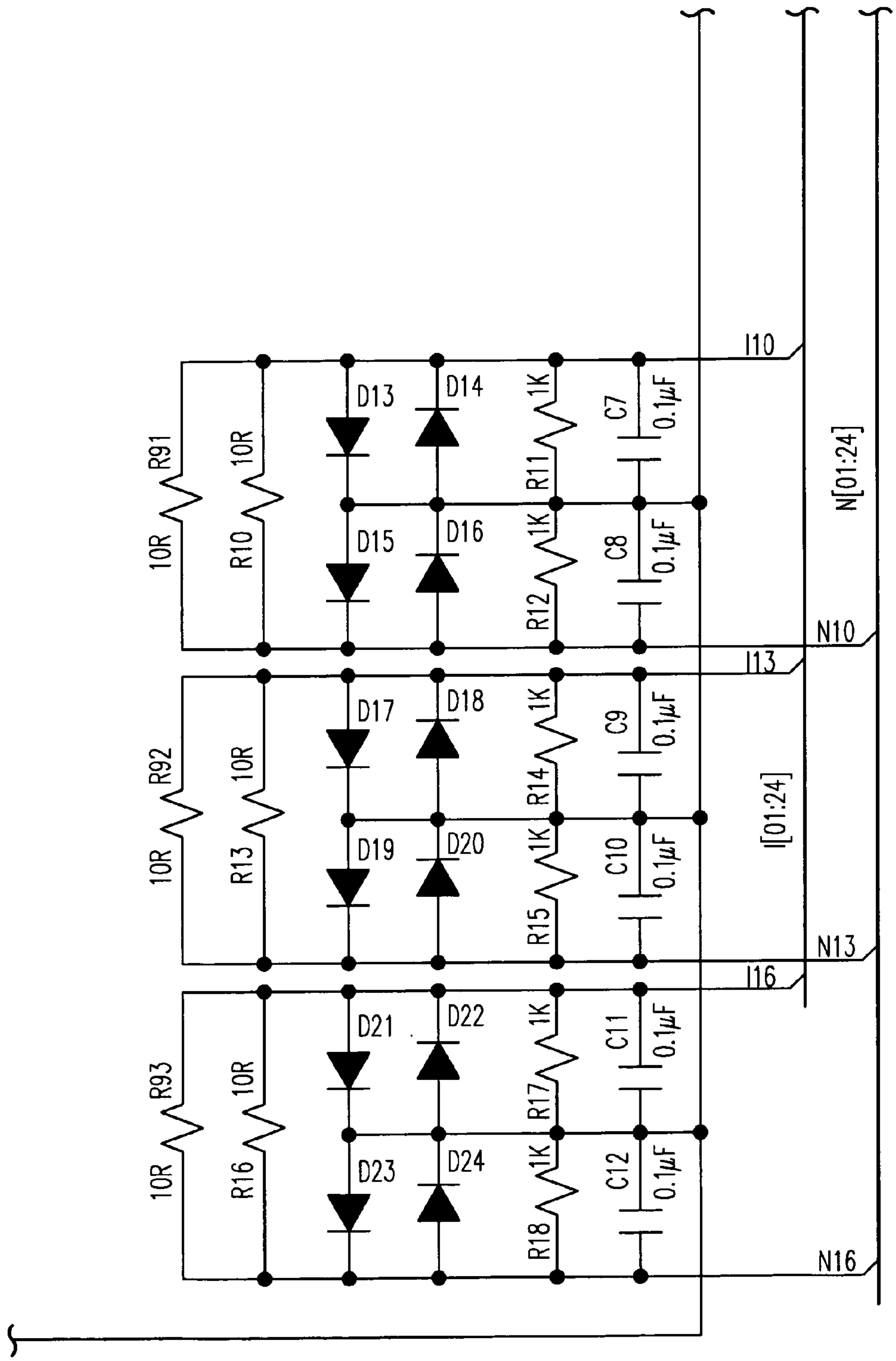
Figure 6O:
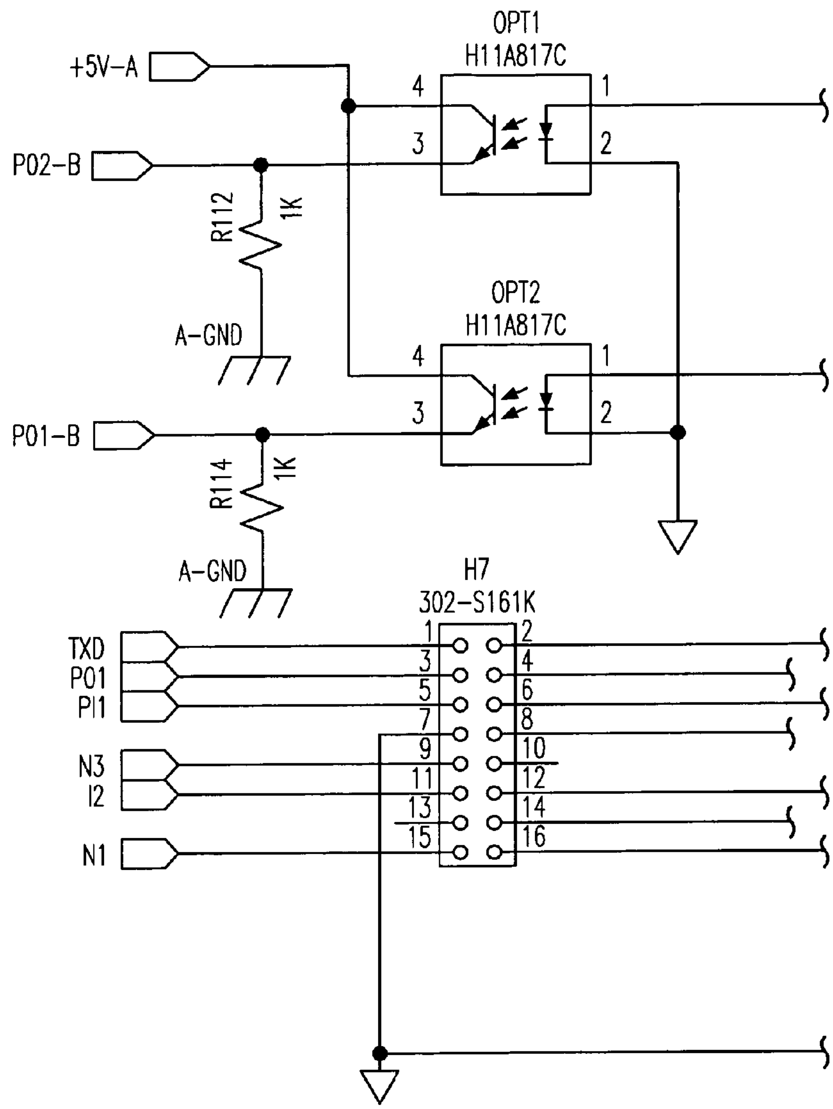
Figure 6P:
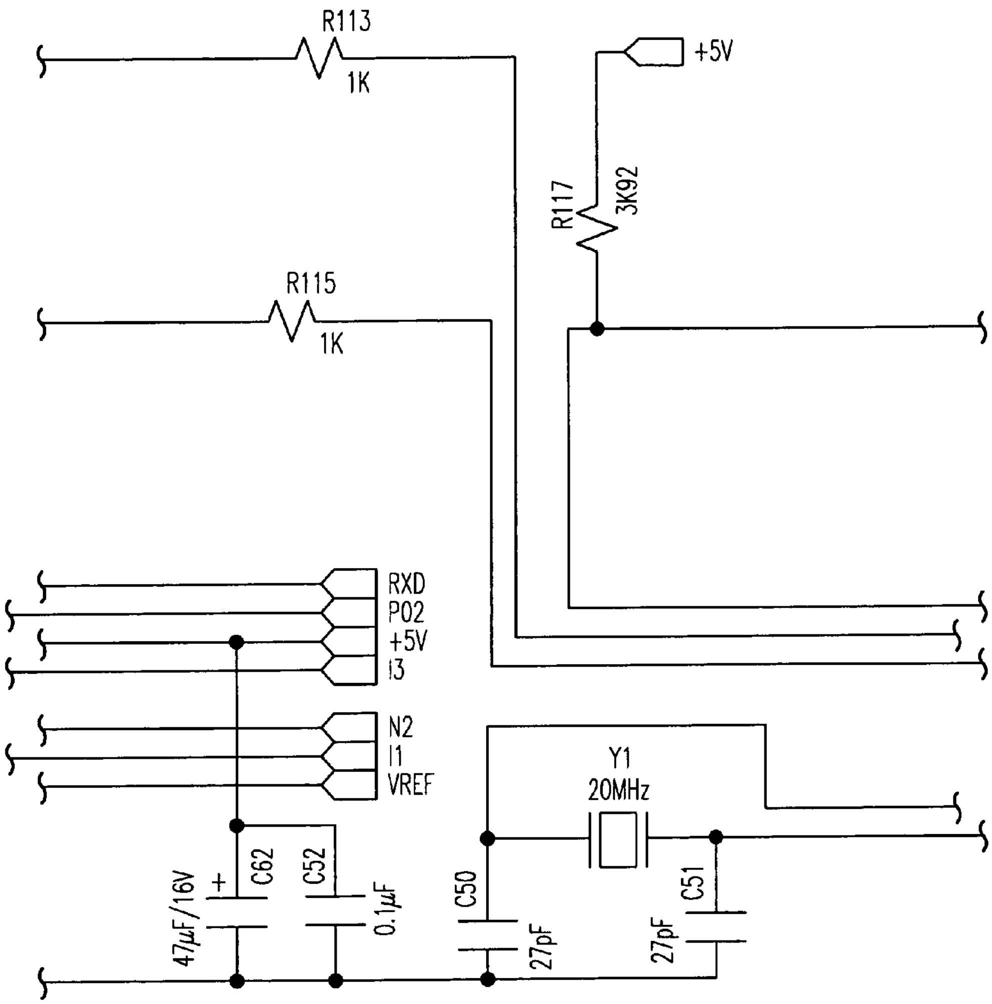
Figure 6Q:
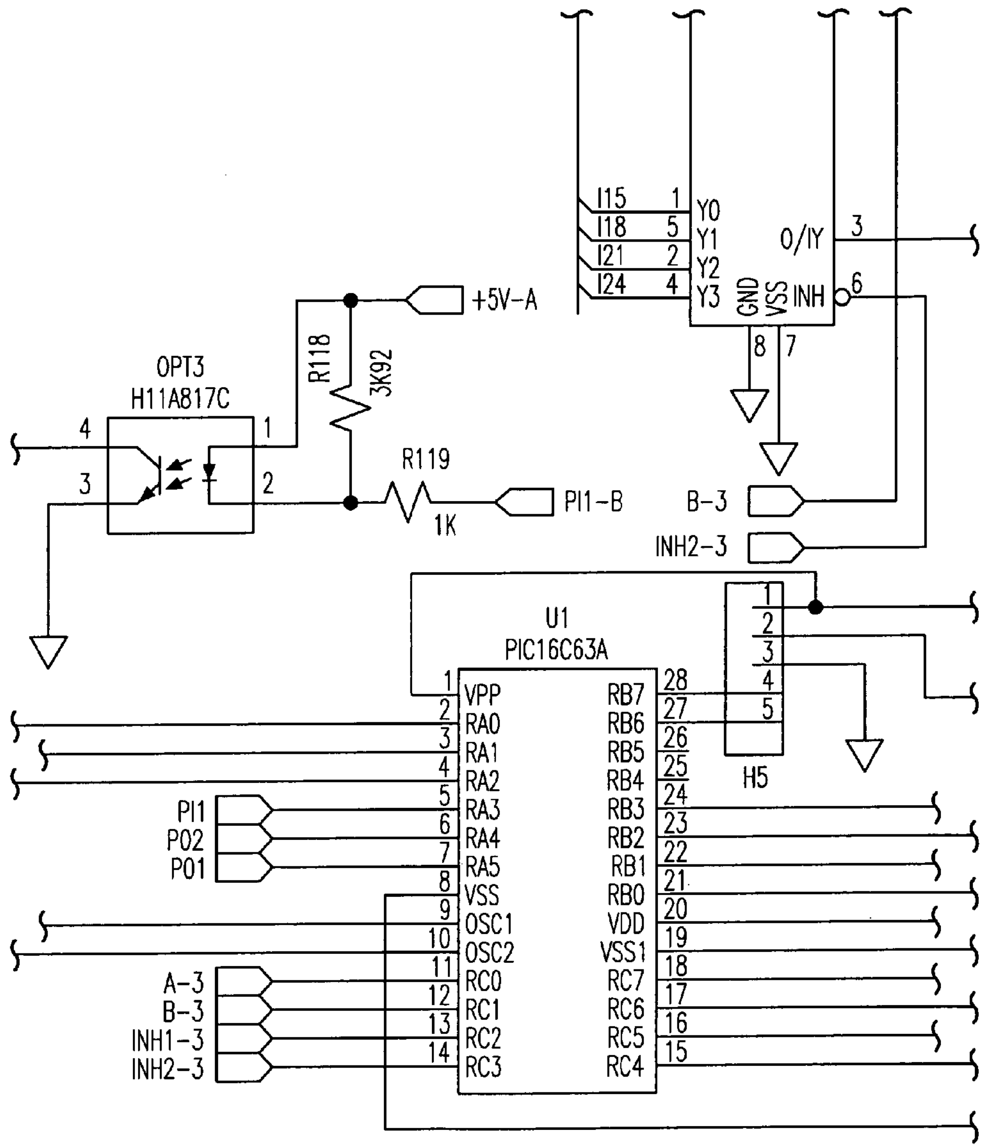
Figure 6R:
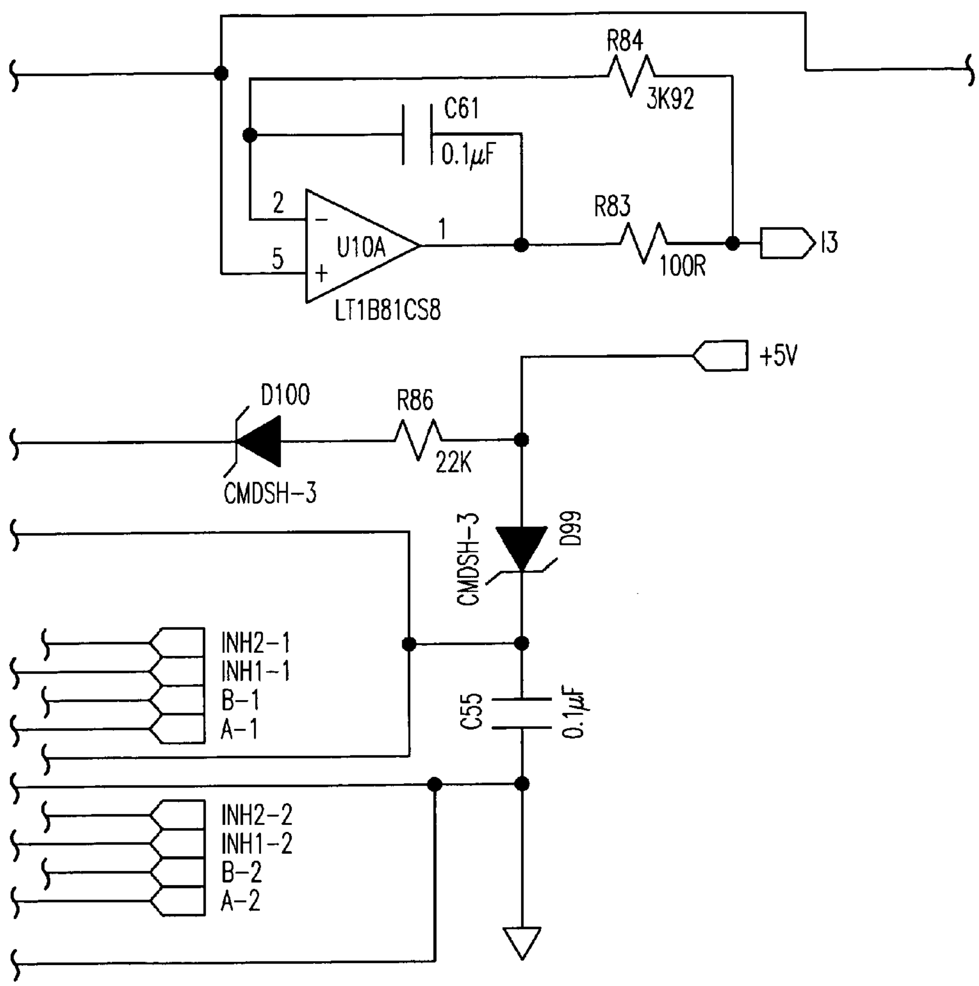
Figure 6S:
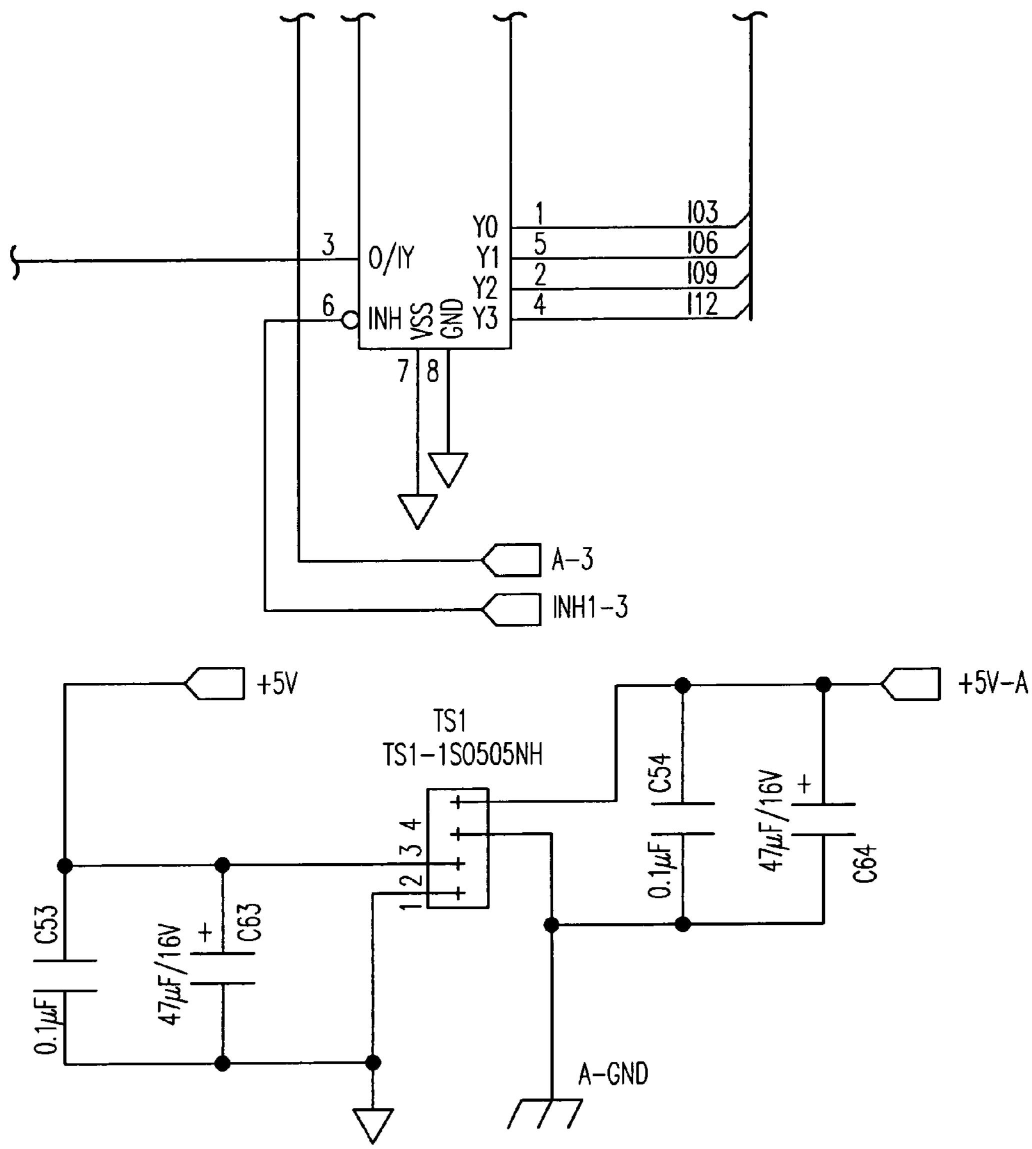
Figure 6T:
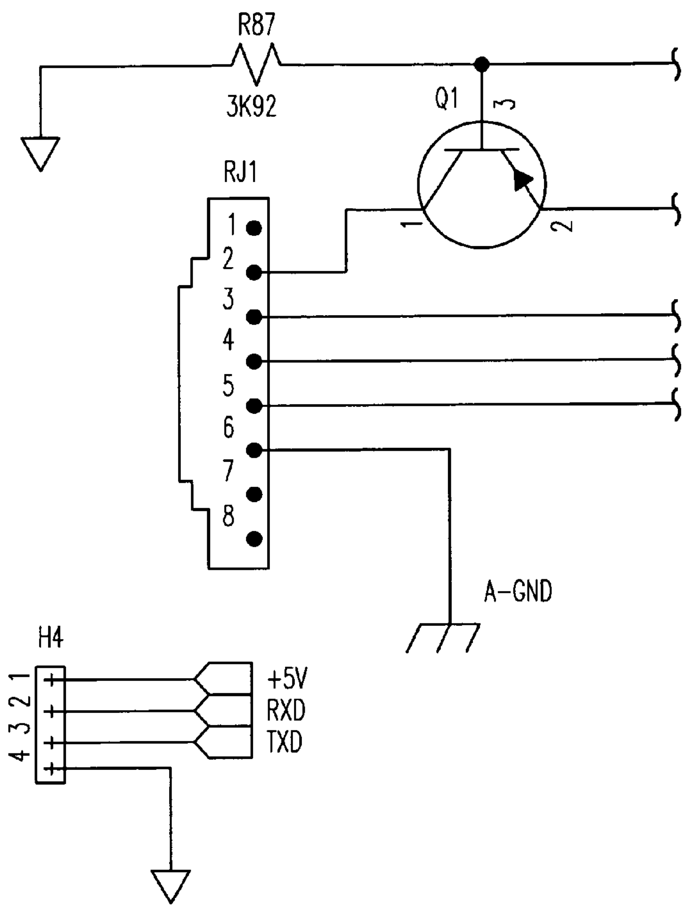
Figure 6U:
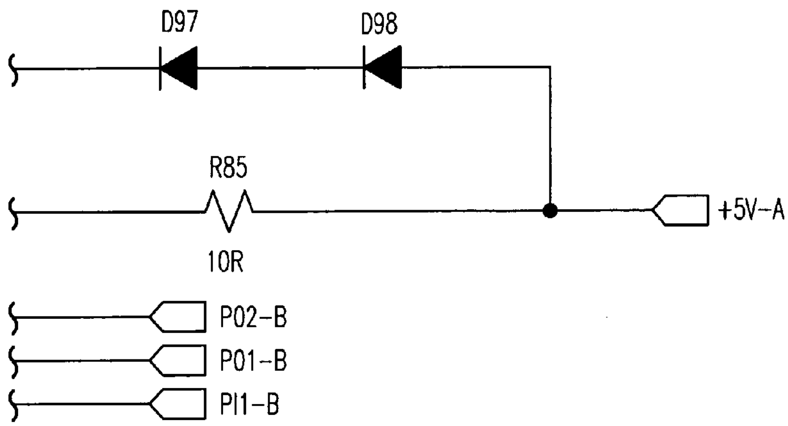
Figure 7A:
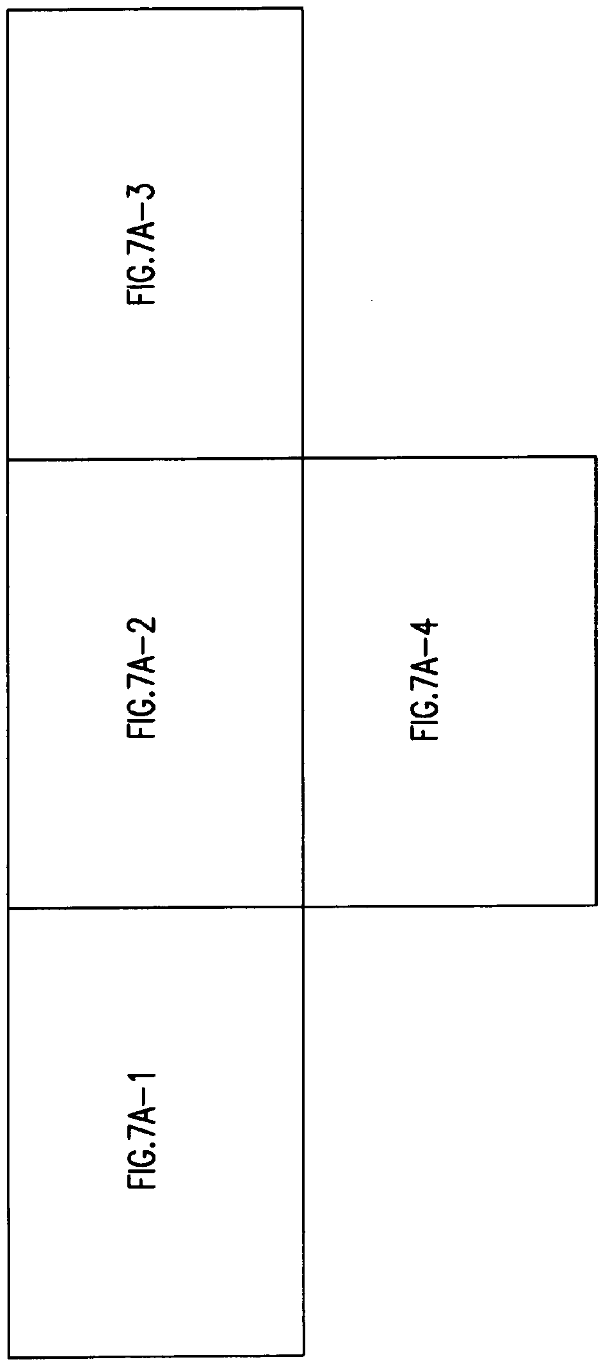
FIGS. 7A-7C illustrate a schematic diagrams of a preferred Load Control Module circuit board.
Figures 1, 7A:
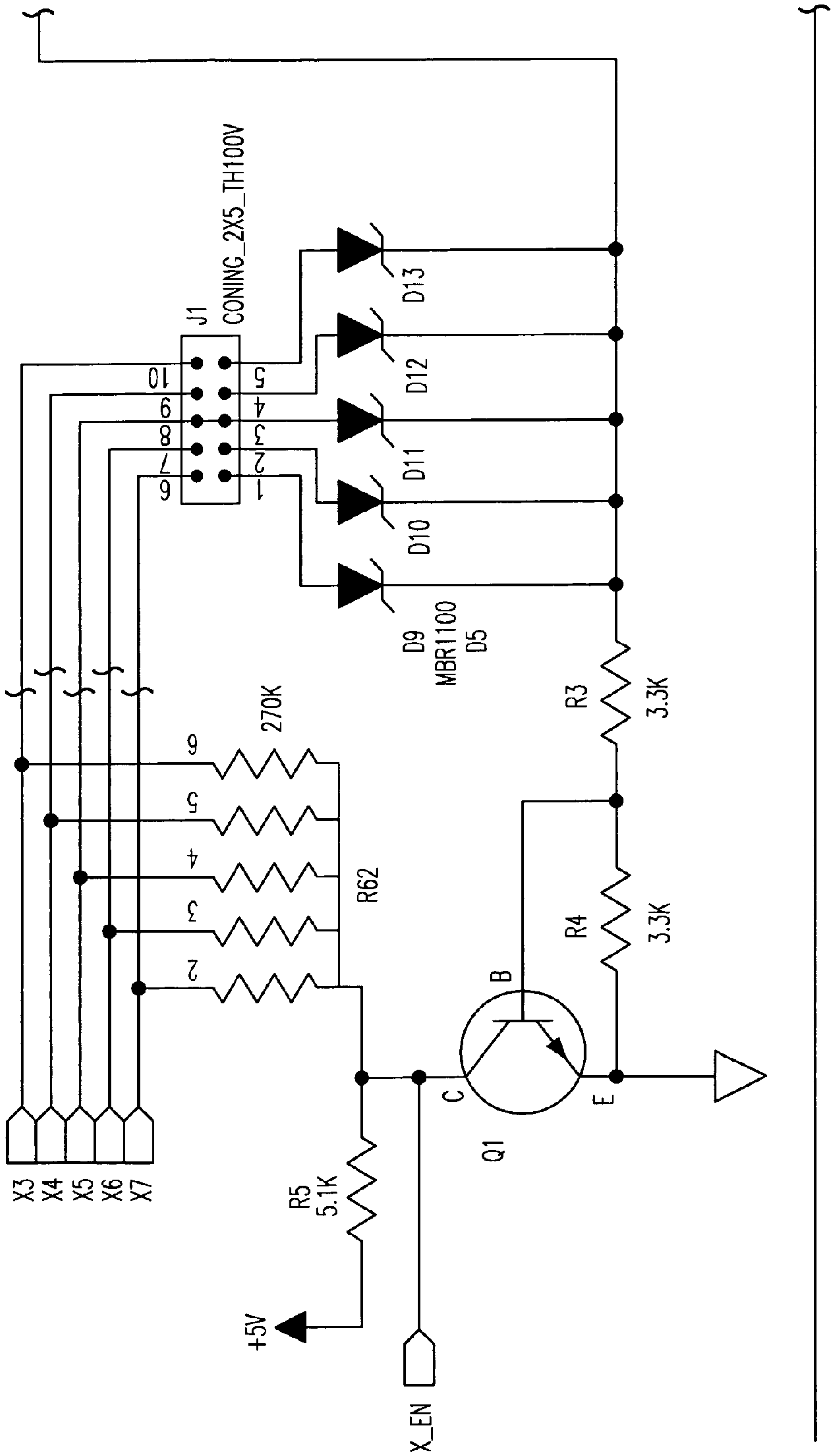
Figures 2, 7A:
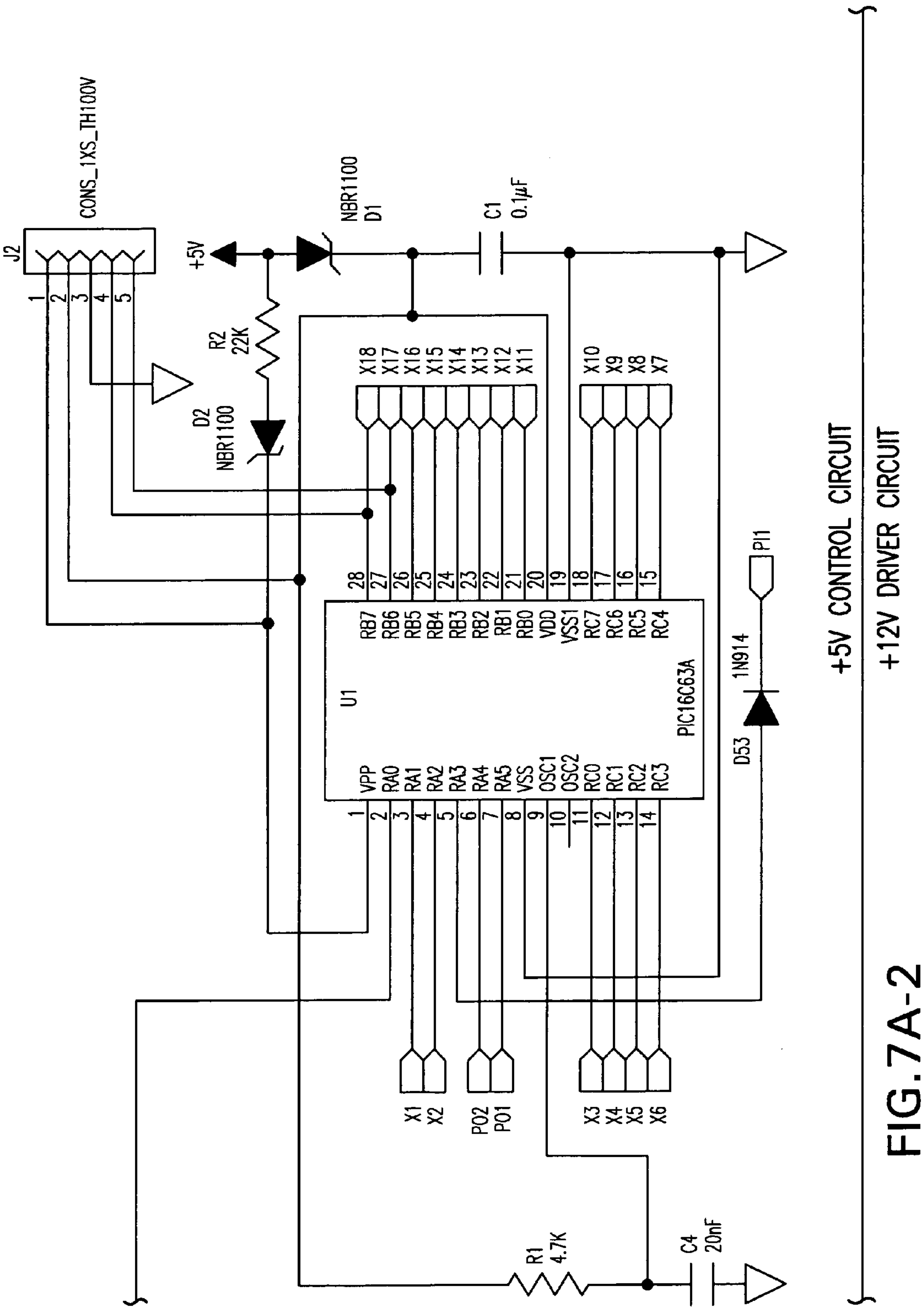
Figures 3, 7A:
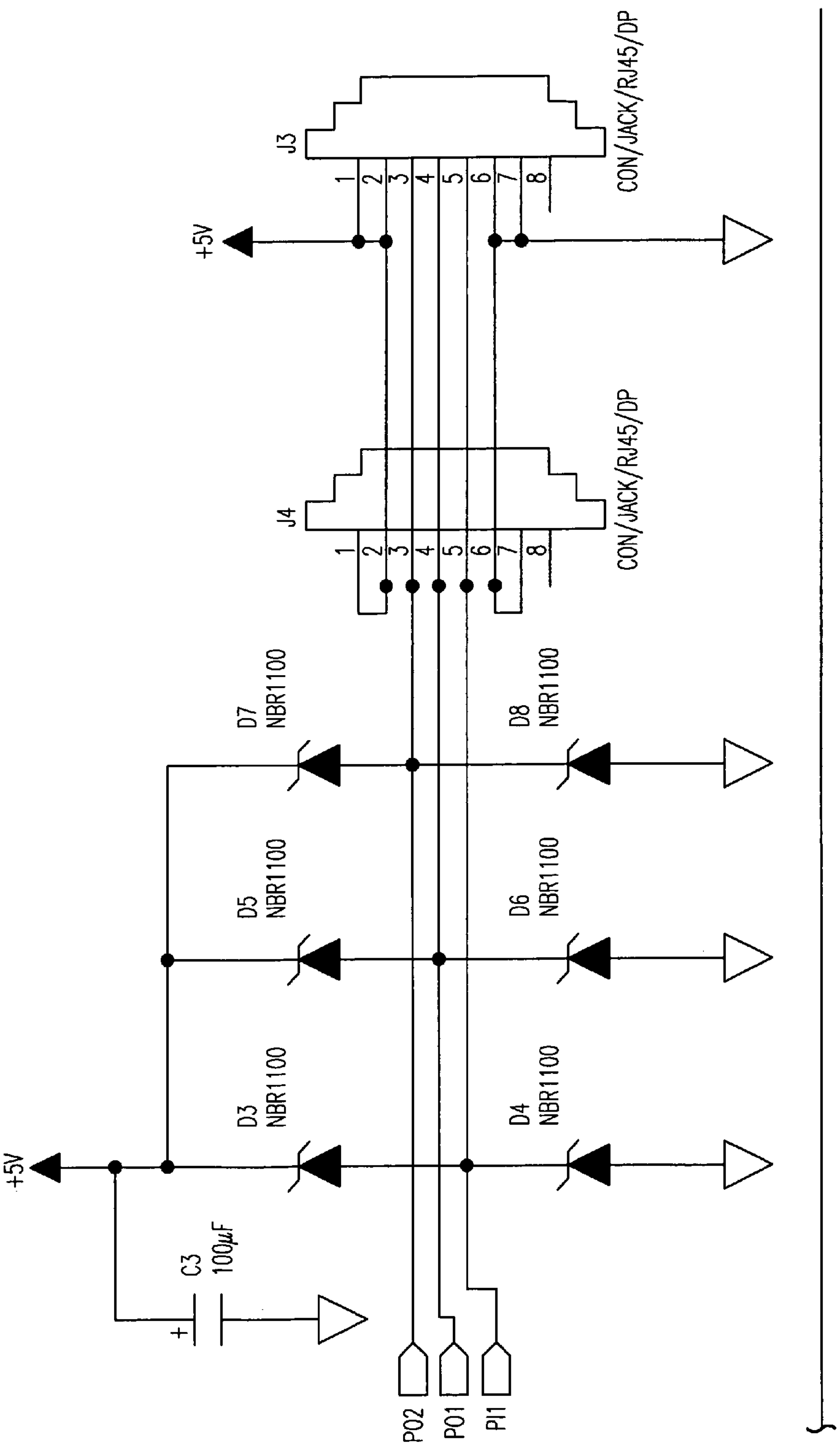
Figures 4, 7A:
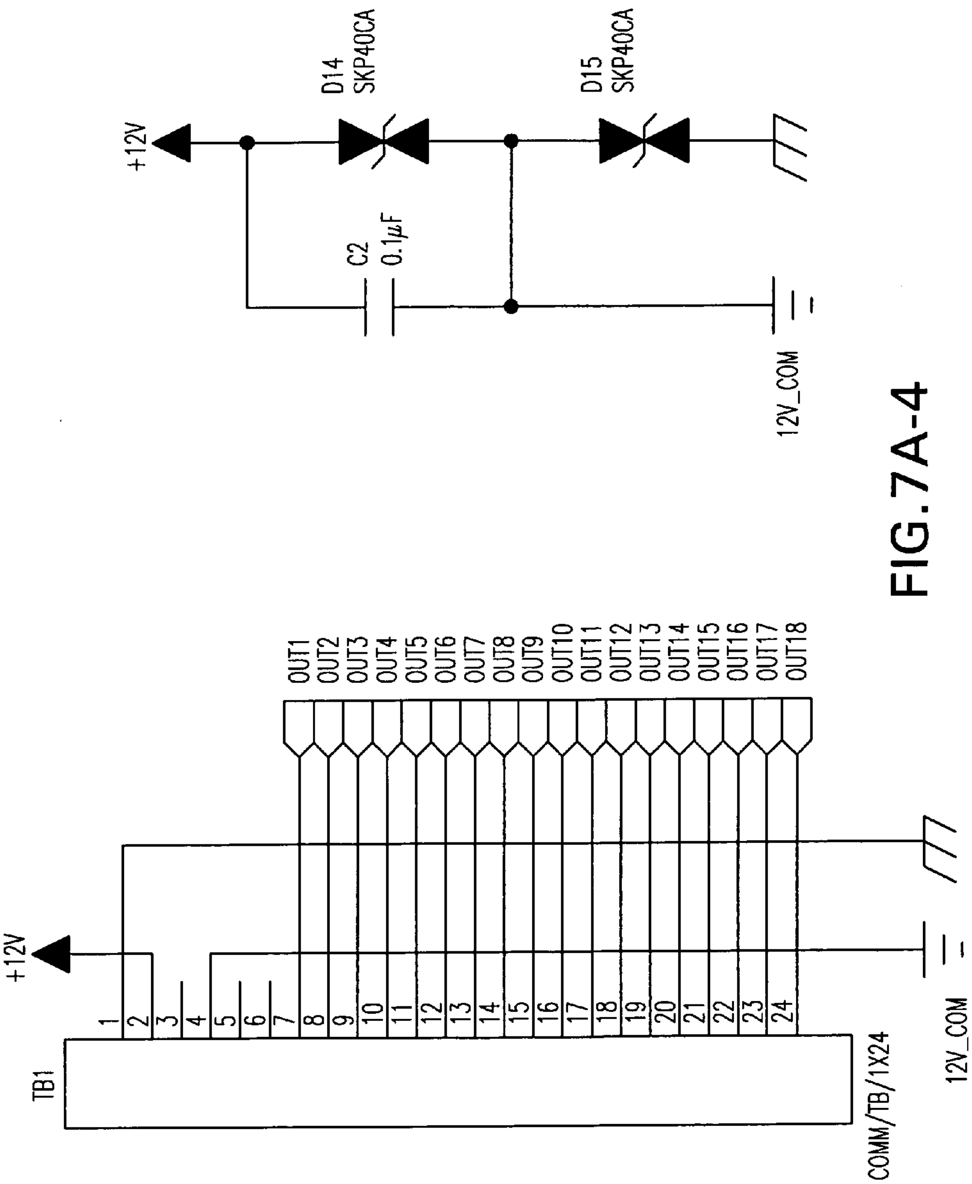
Figure 7B:
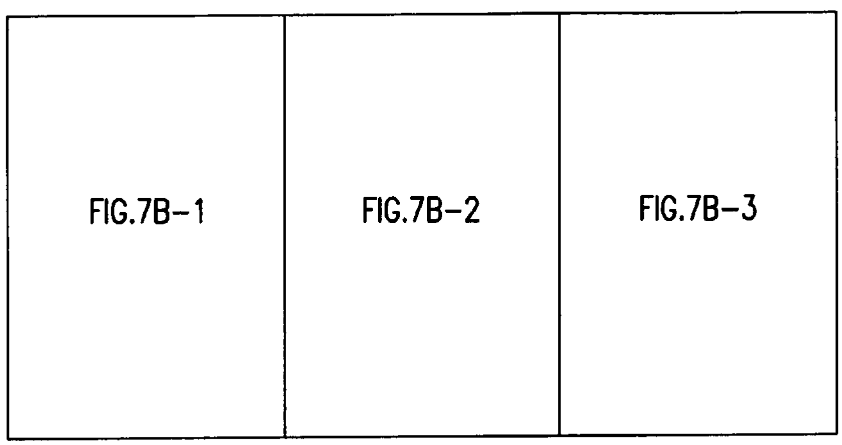
Figures 1, 7B:
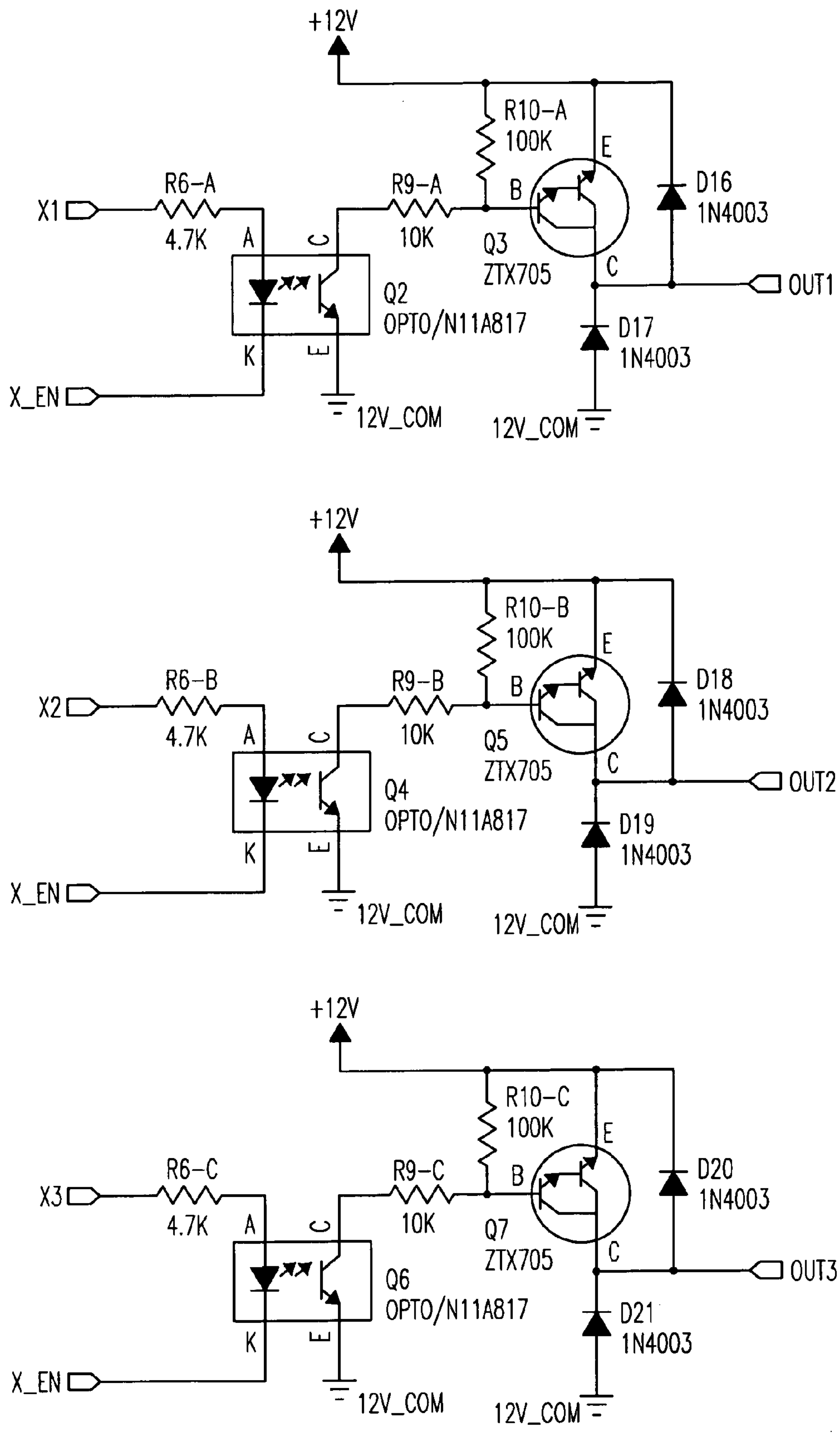
Figures 2, 7B:
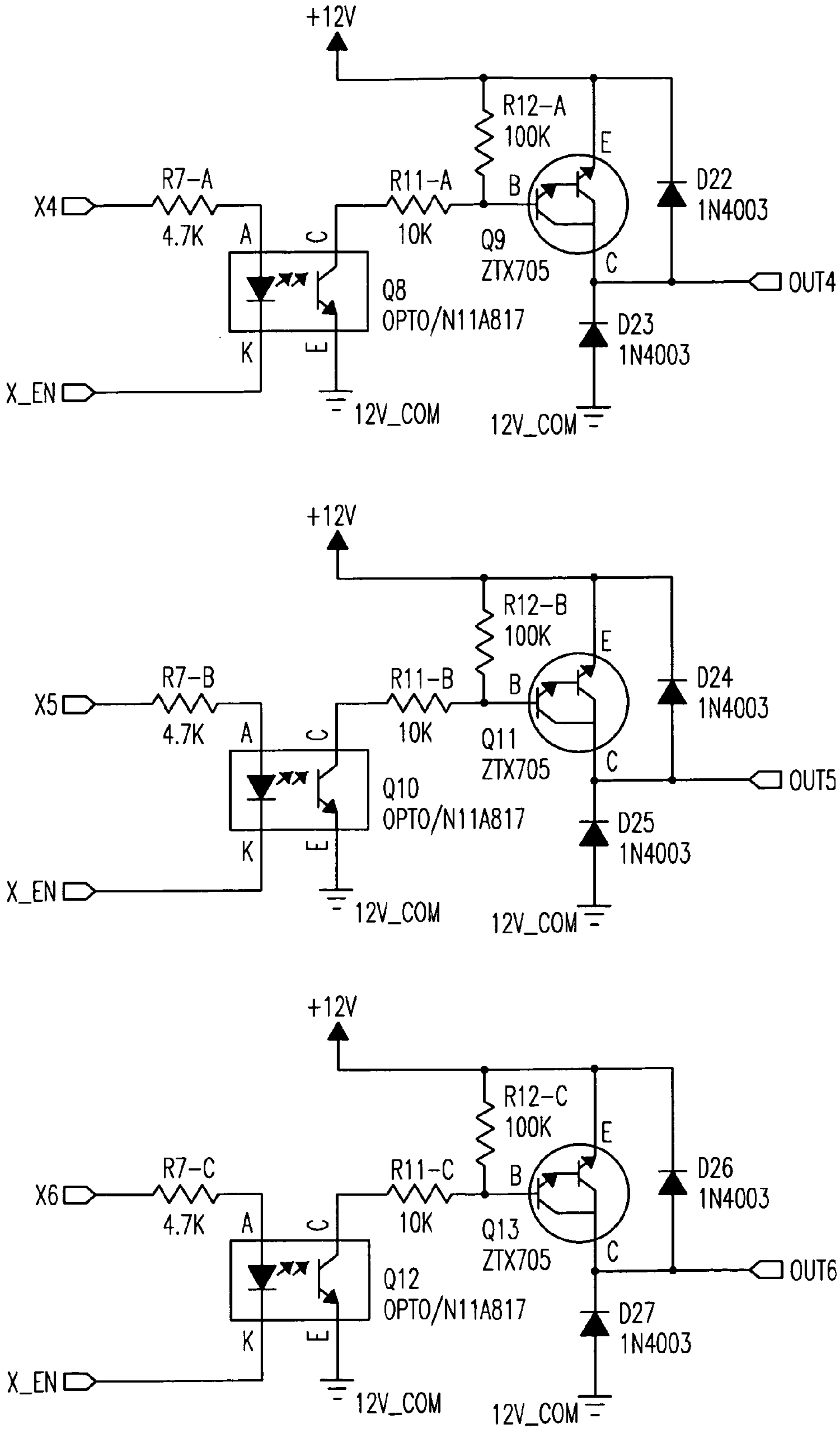
Figures 3, 7B:
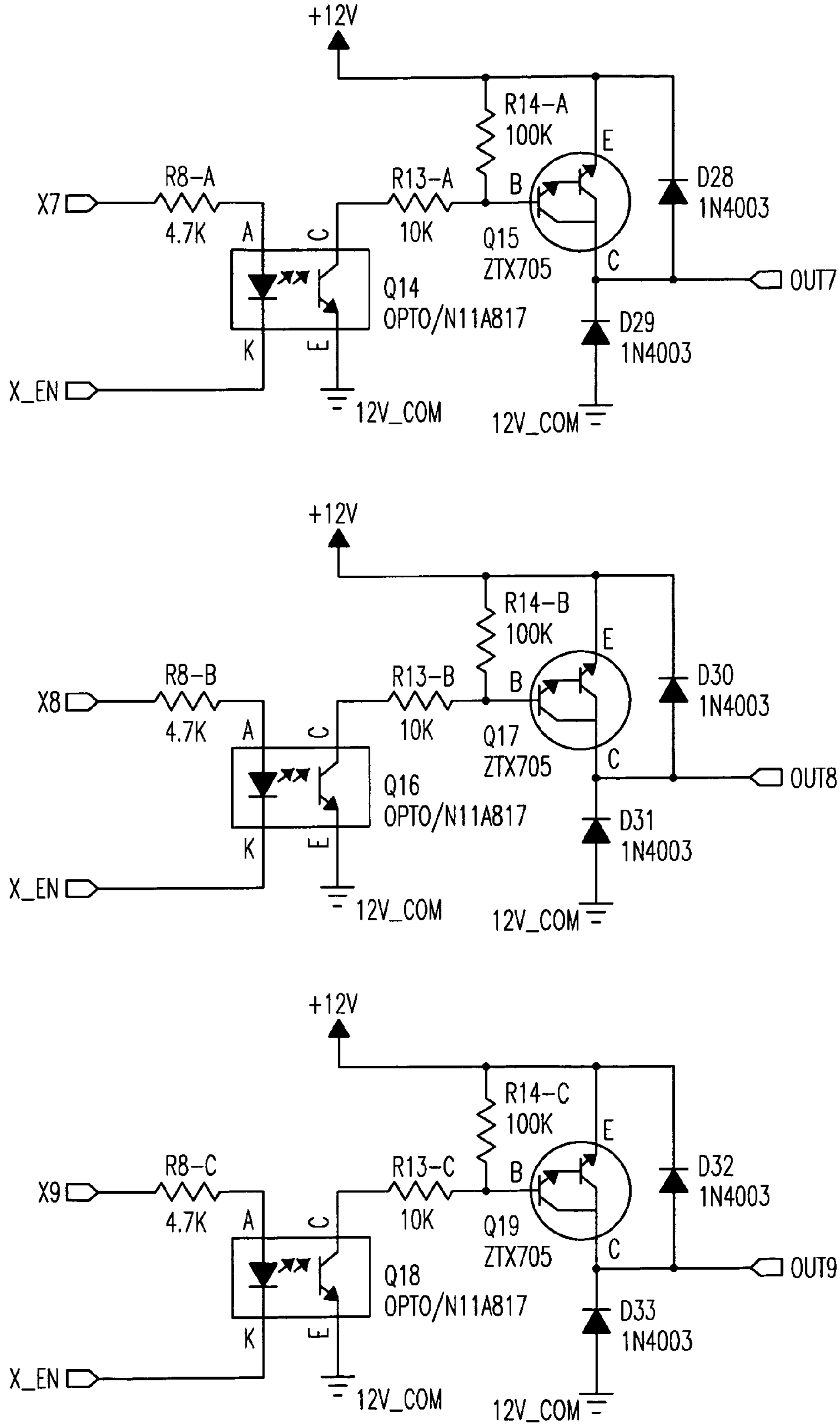
Figure 7C:
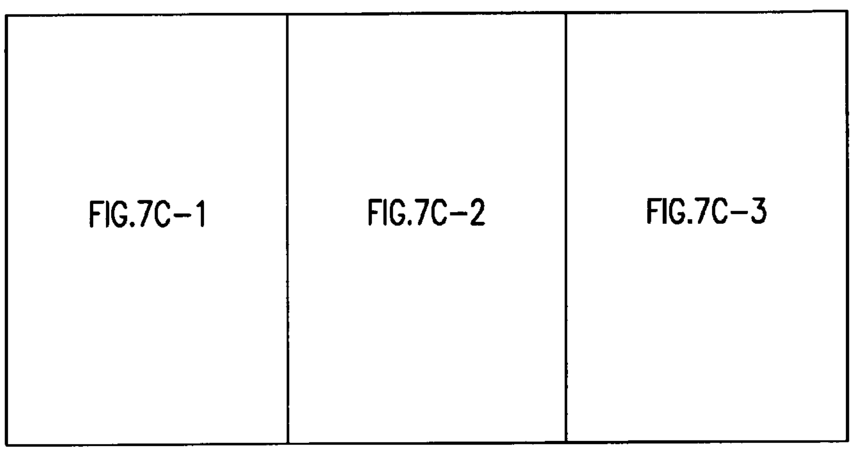
Figures 1, 7C:
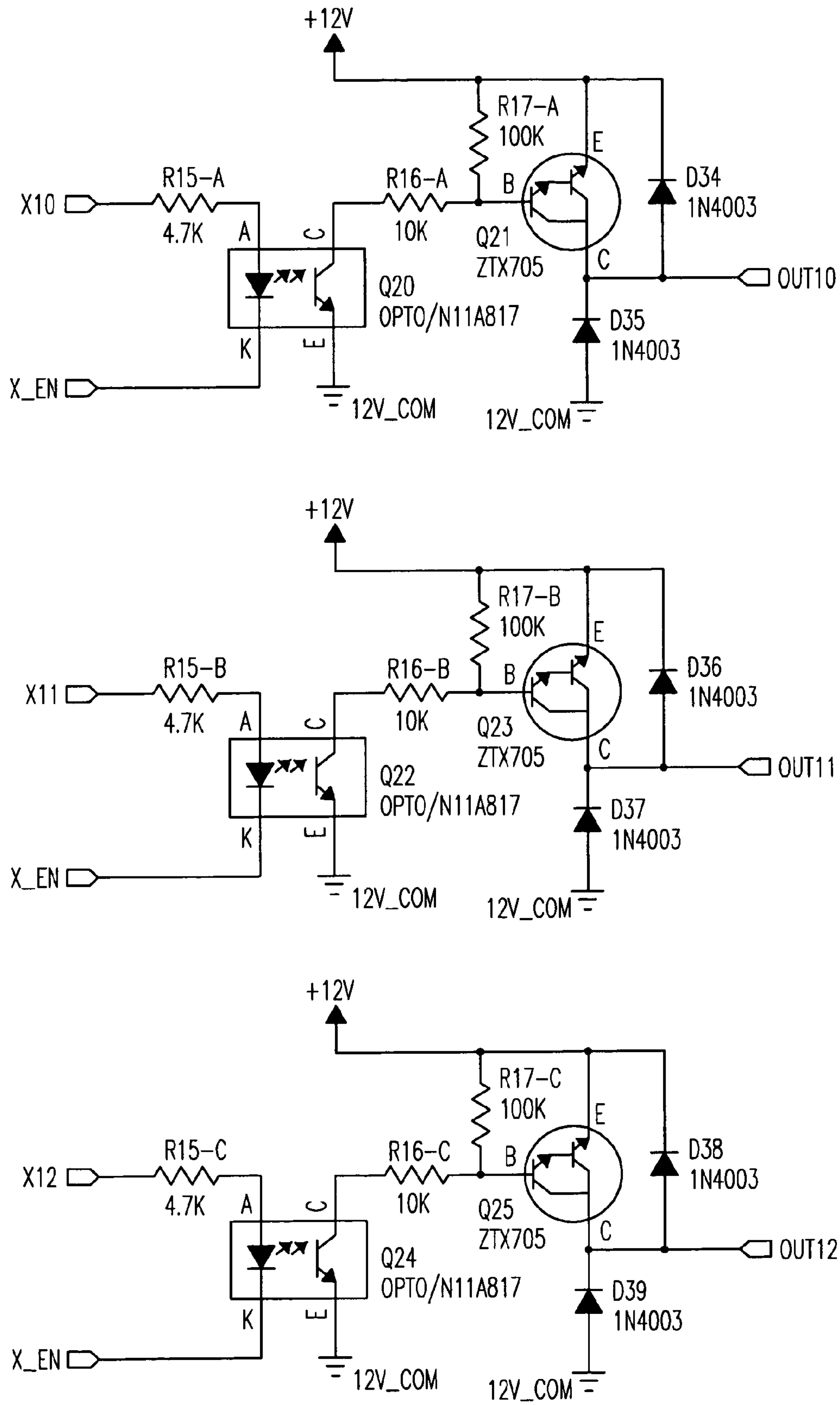
Figures 2, 7C:
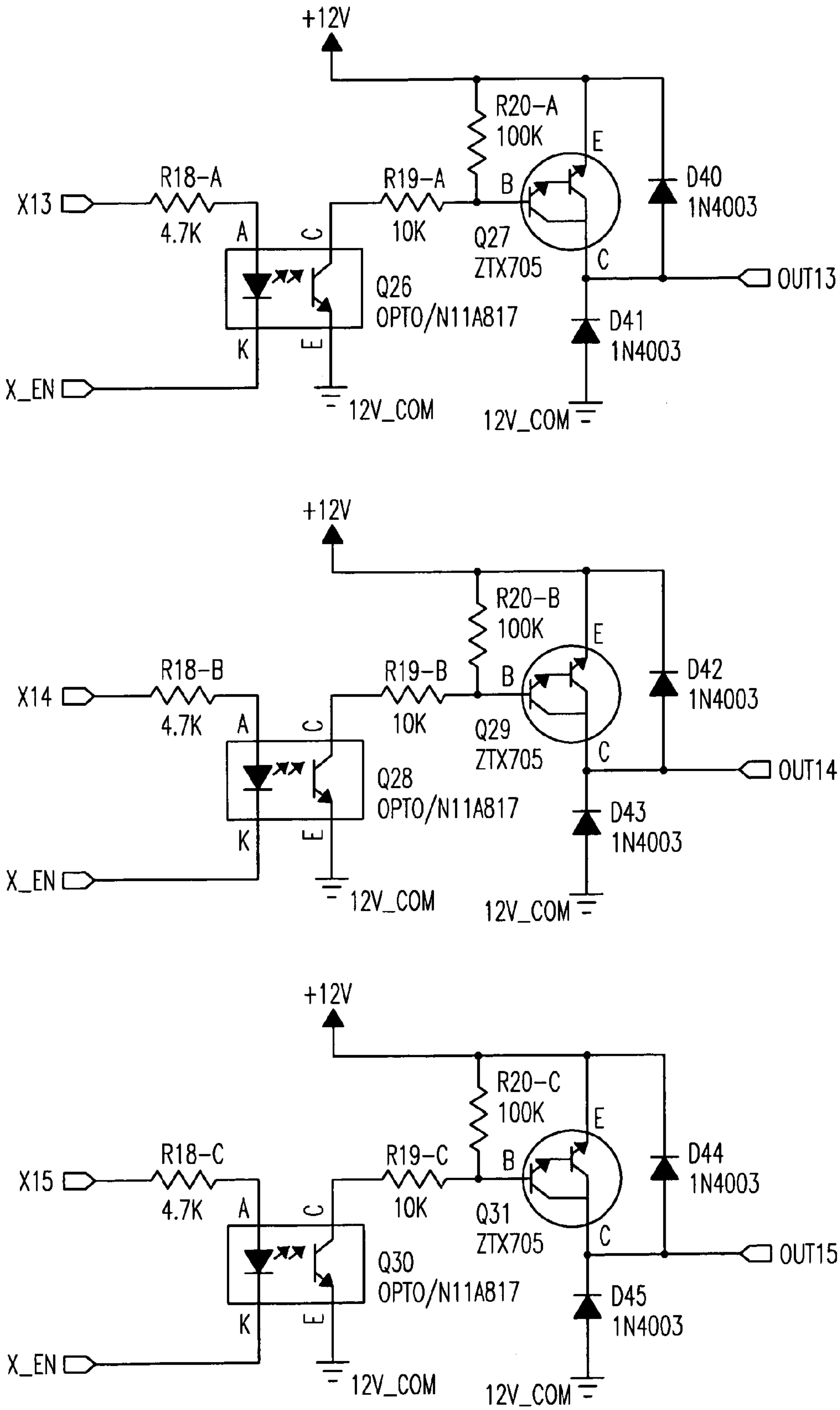
Figures 3, 7C:
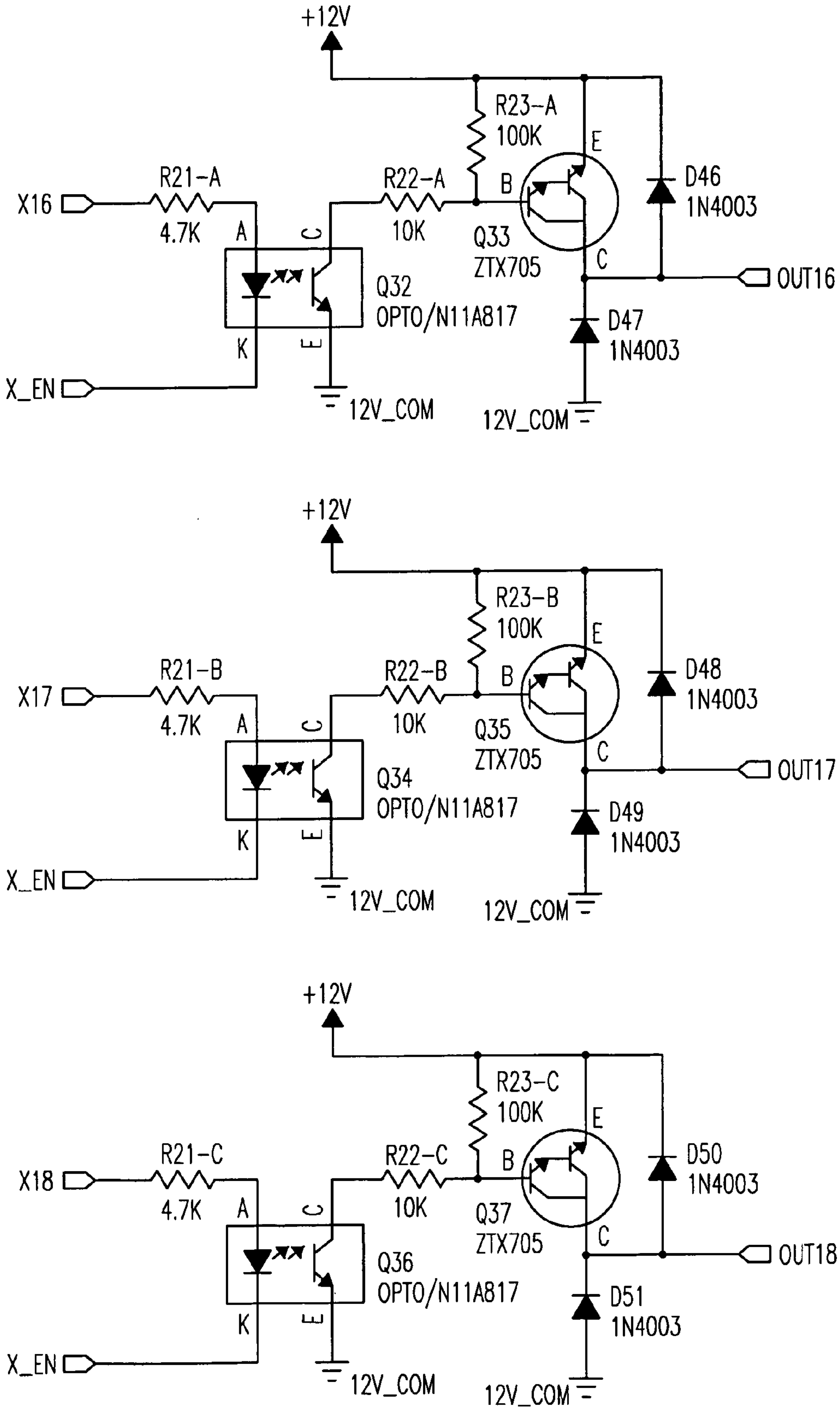
Figure 8A:
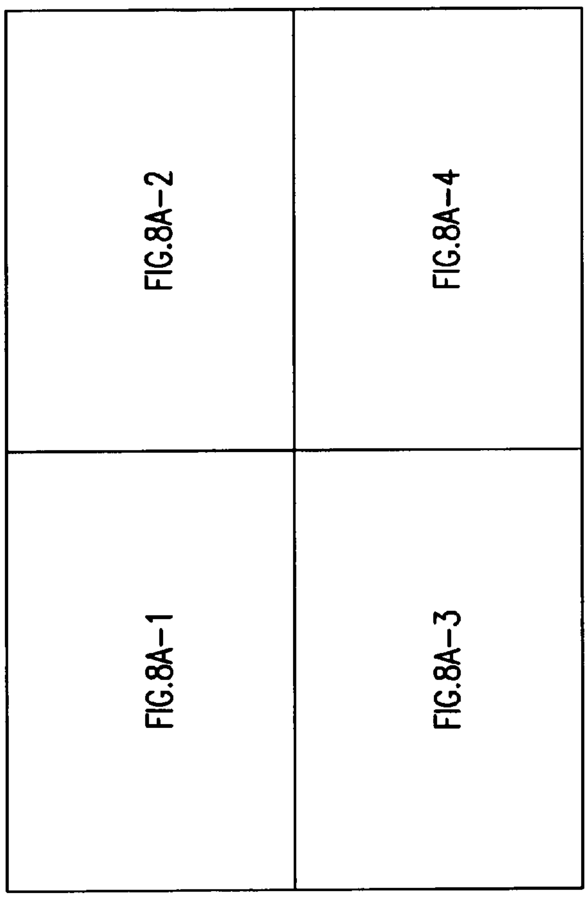
FIGS. 8A-8D illustrate a schematic diagrams of a preferred power supply board that provides for optical tamper detection.
Figures 1, 8A:
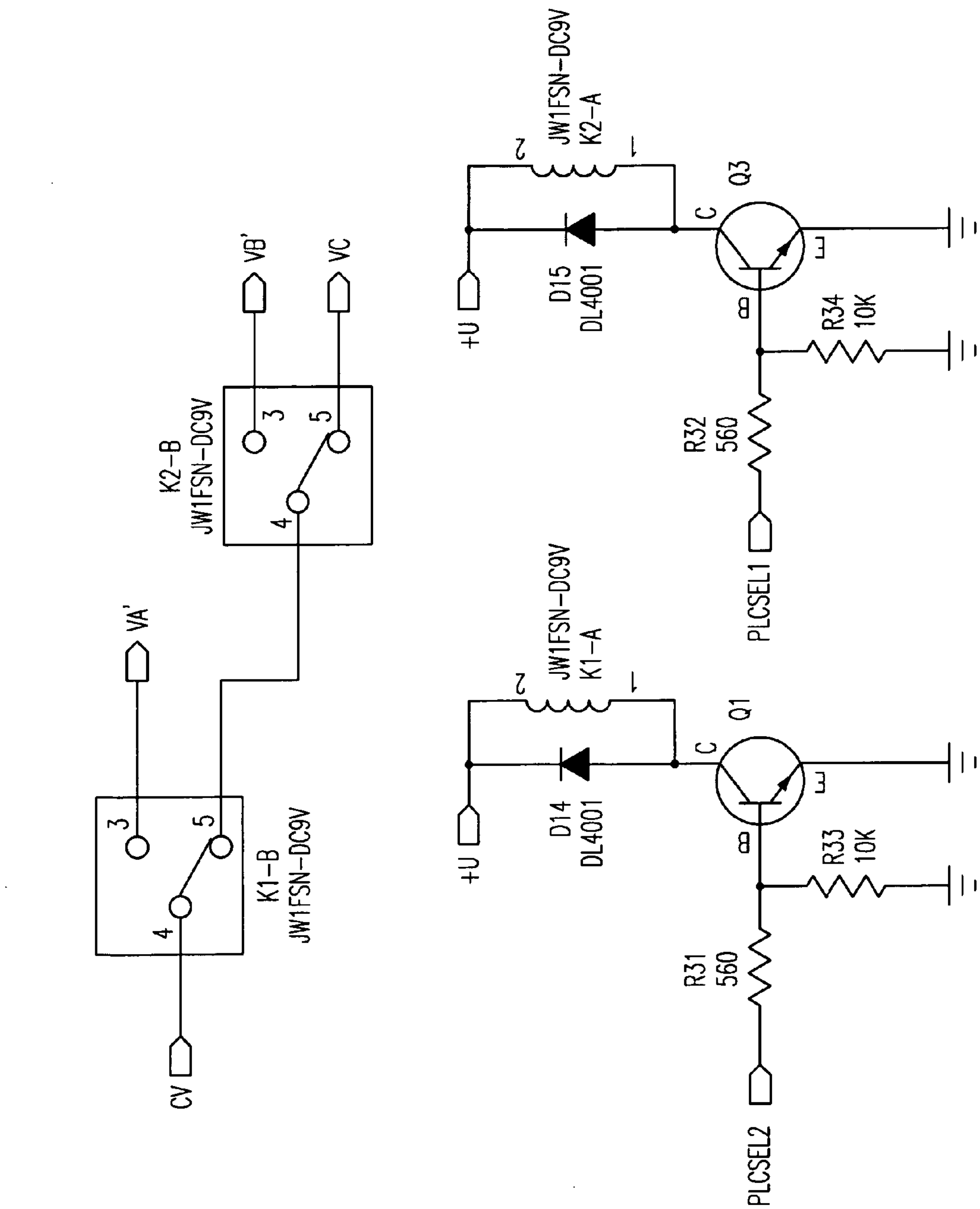
Figures 2, 8A:
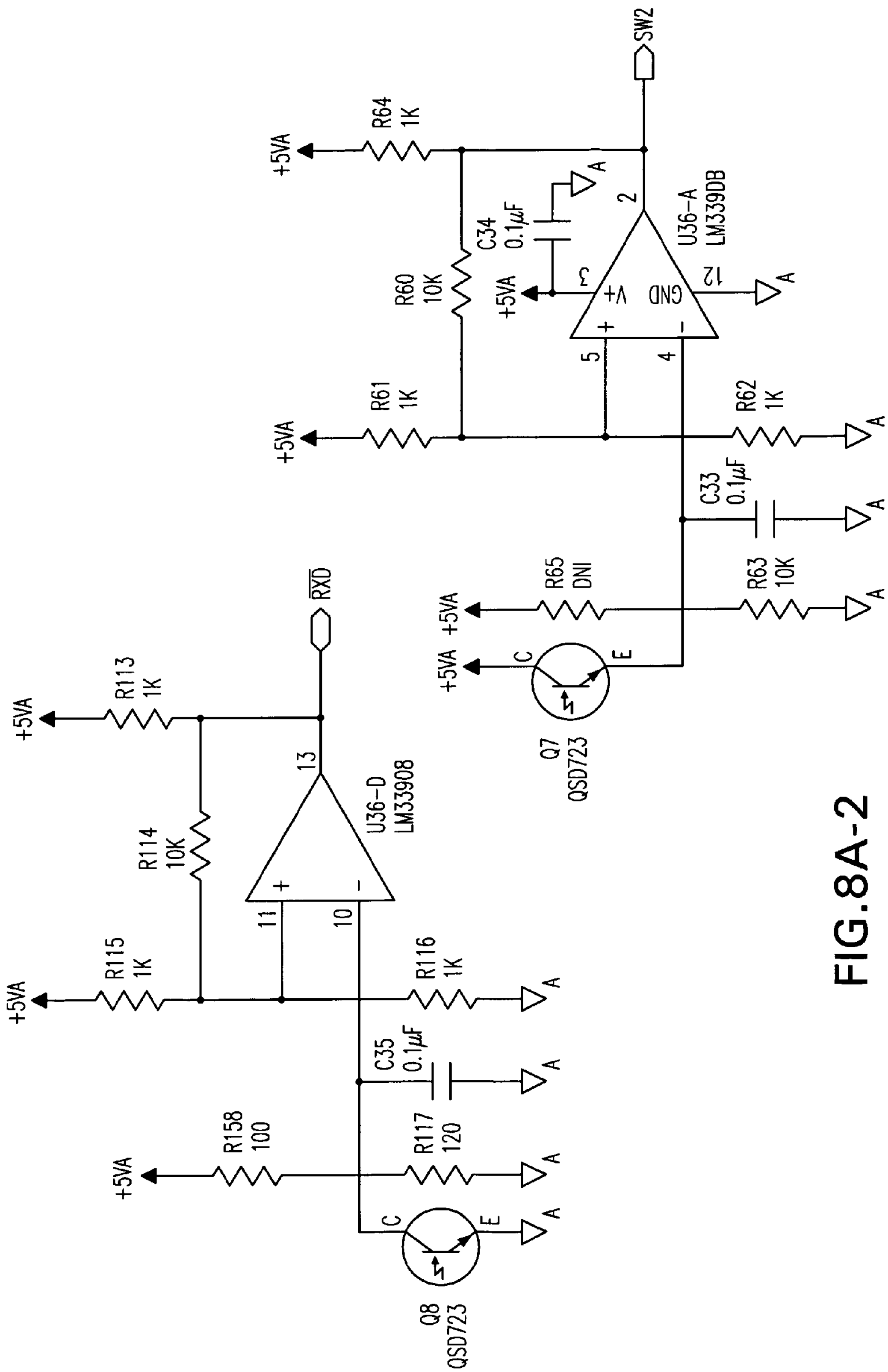
Figures 3, 8A:
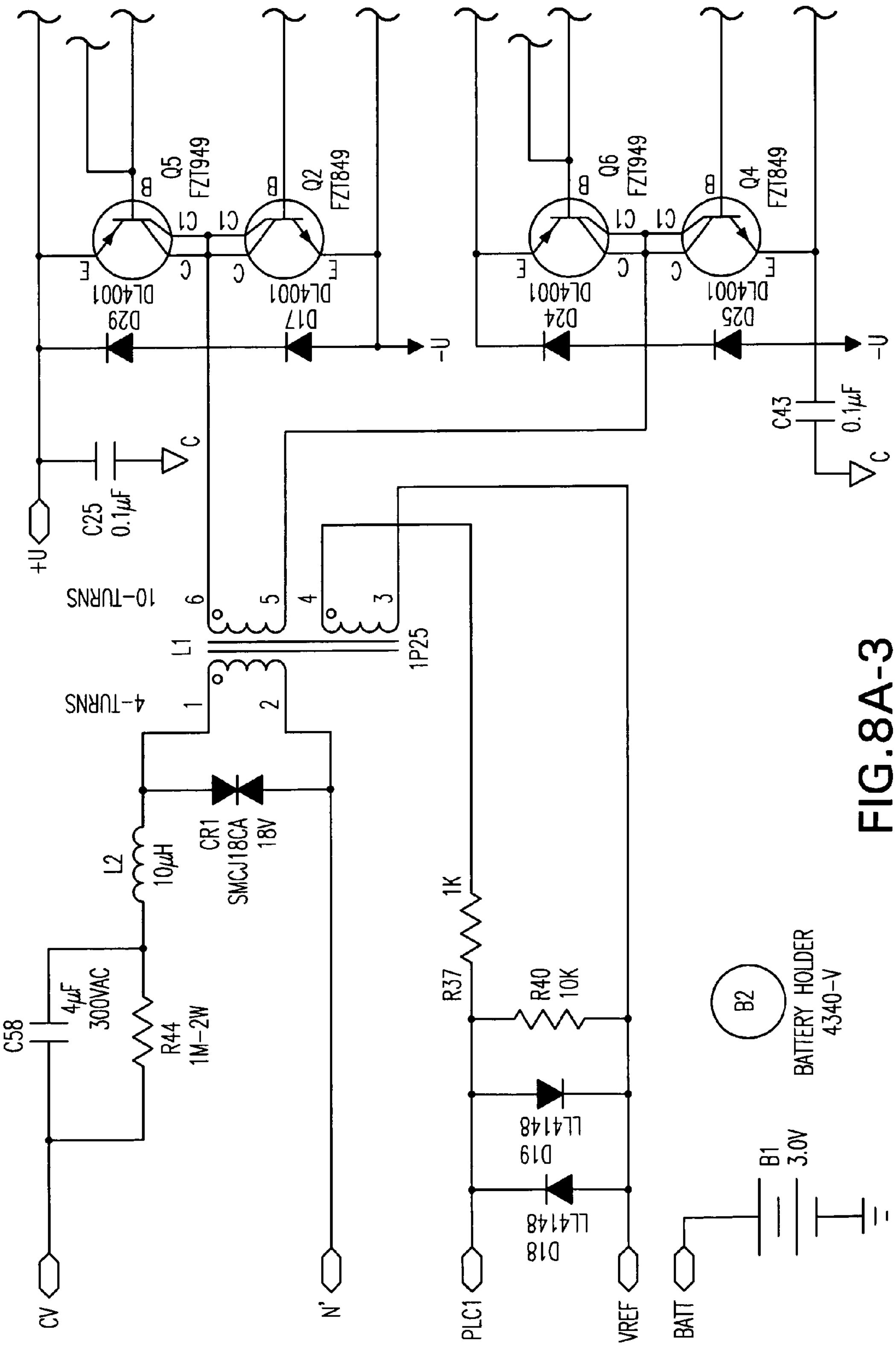
Figures 4, 8A:
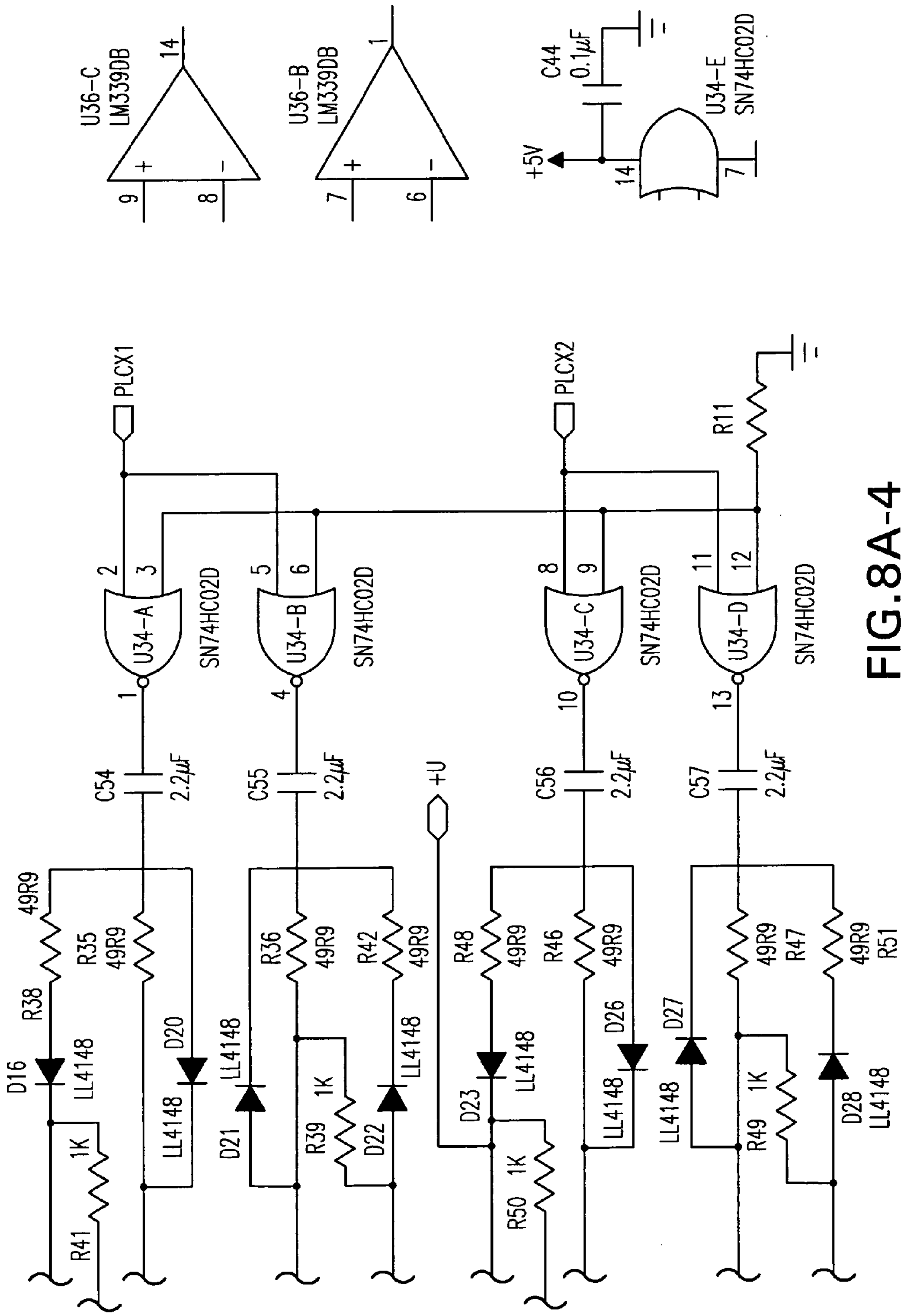
Figure 8B:
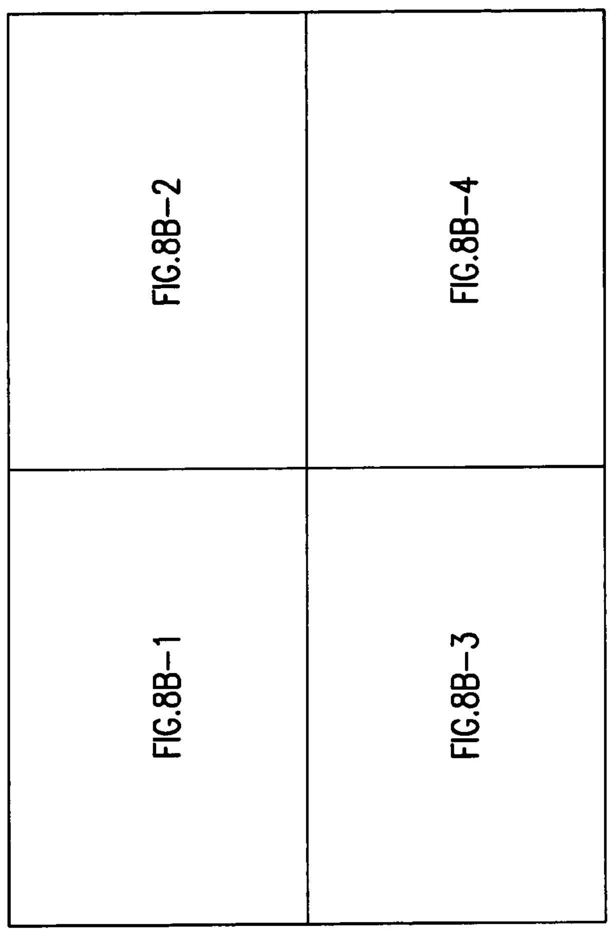
Figures 1, 8B:
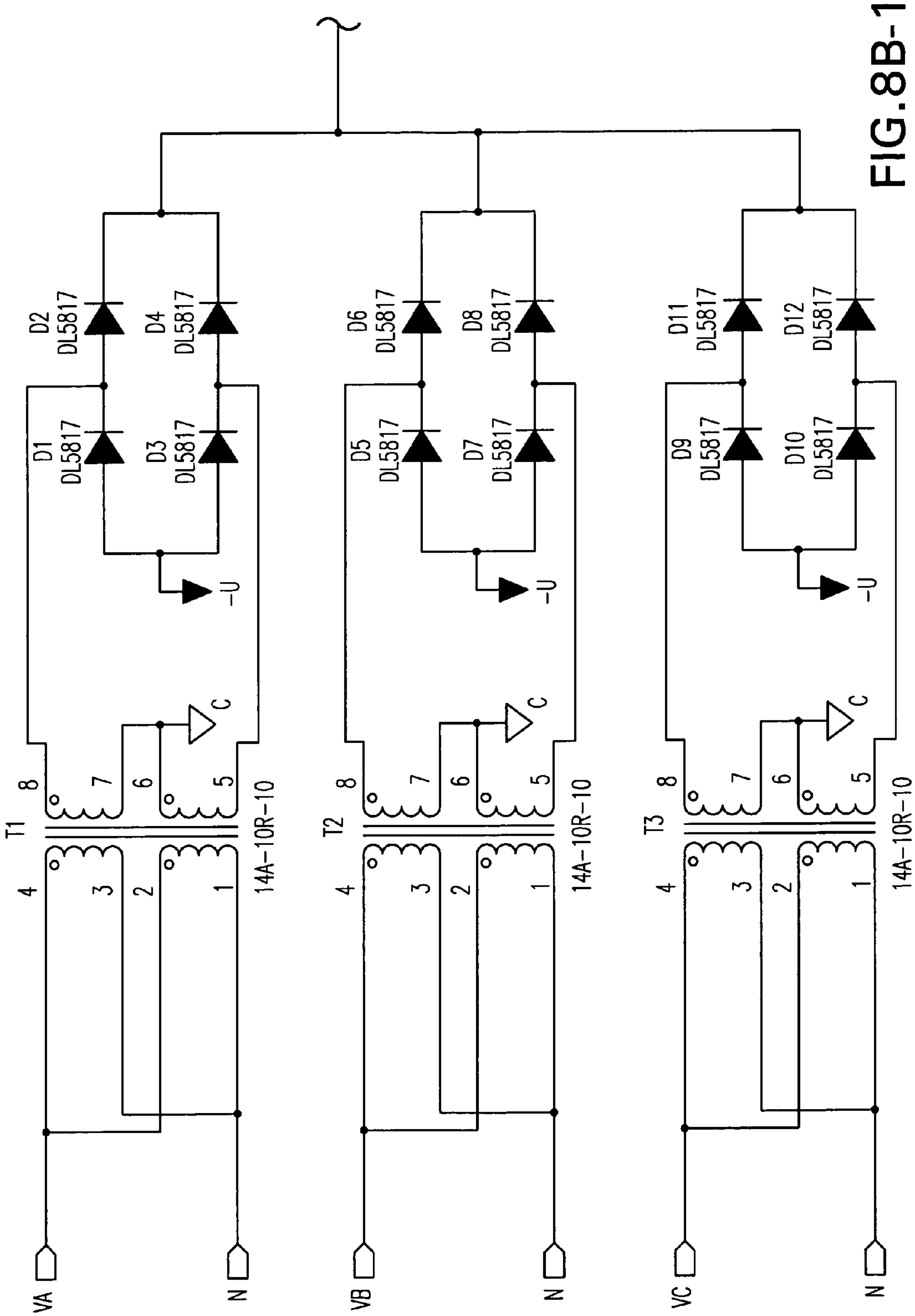
Figures 2, 8B:
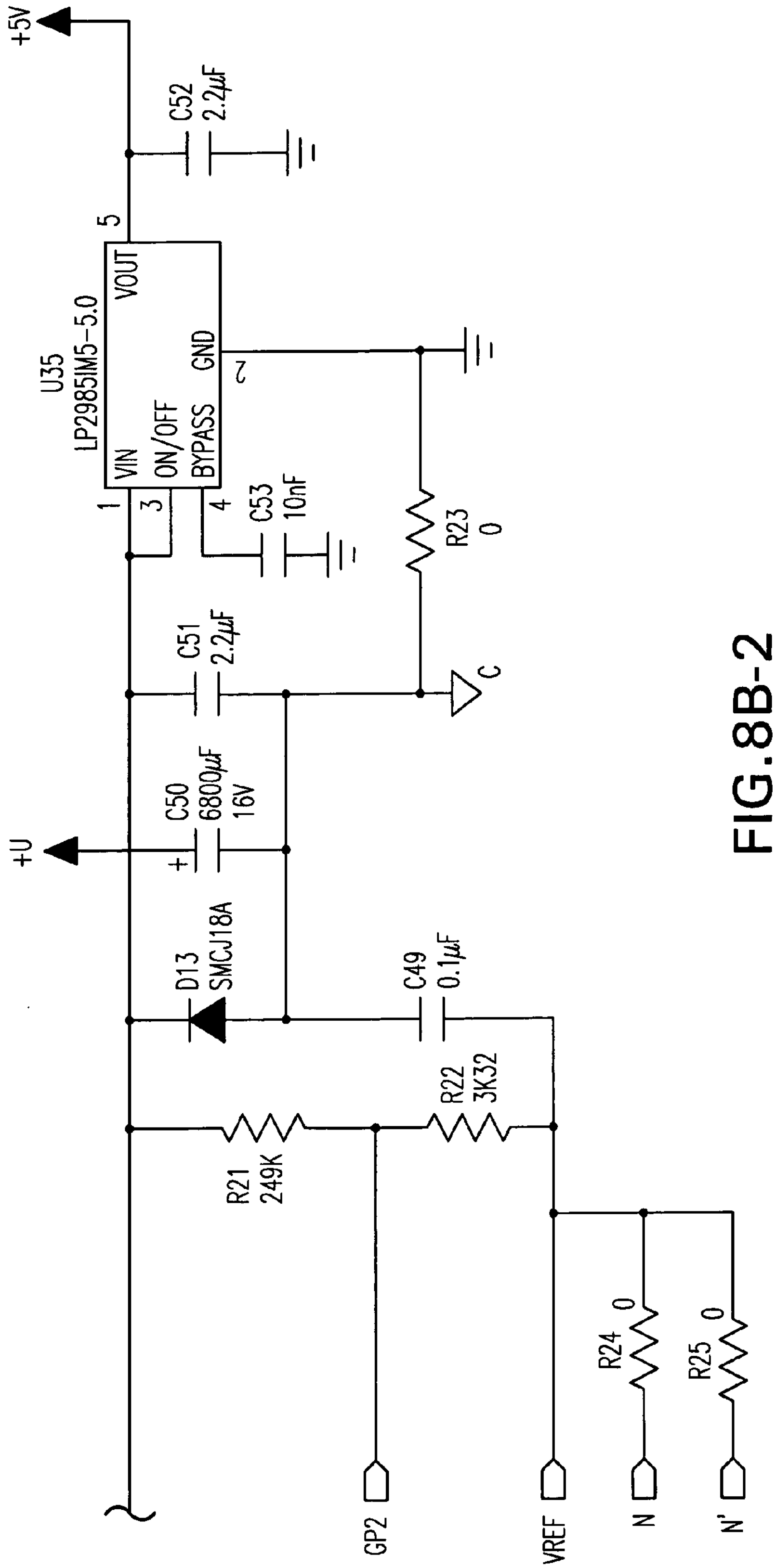
Figures 3, 8B:
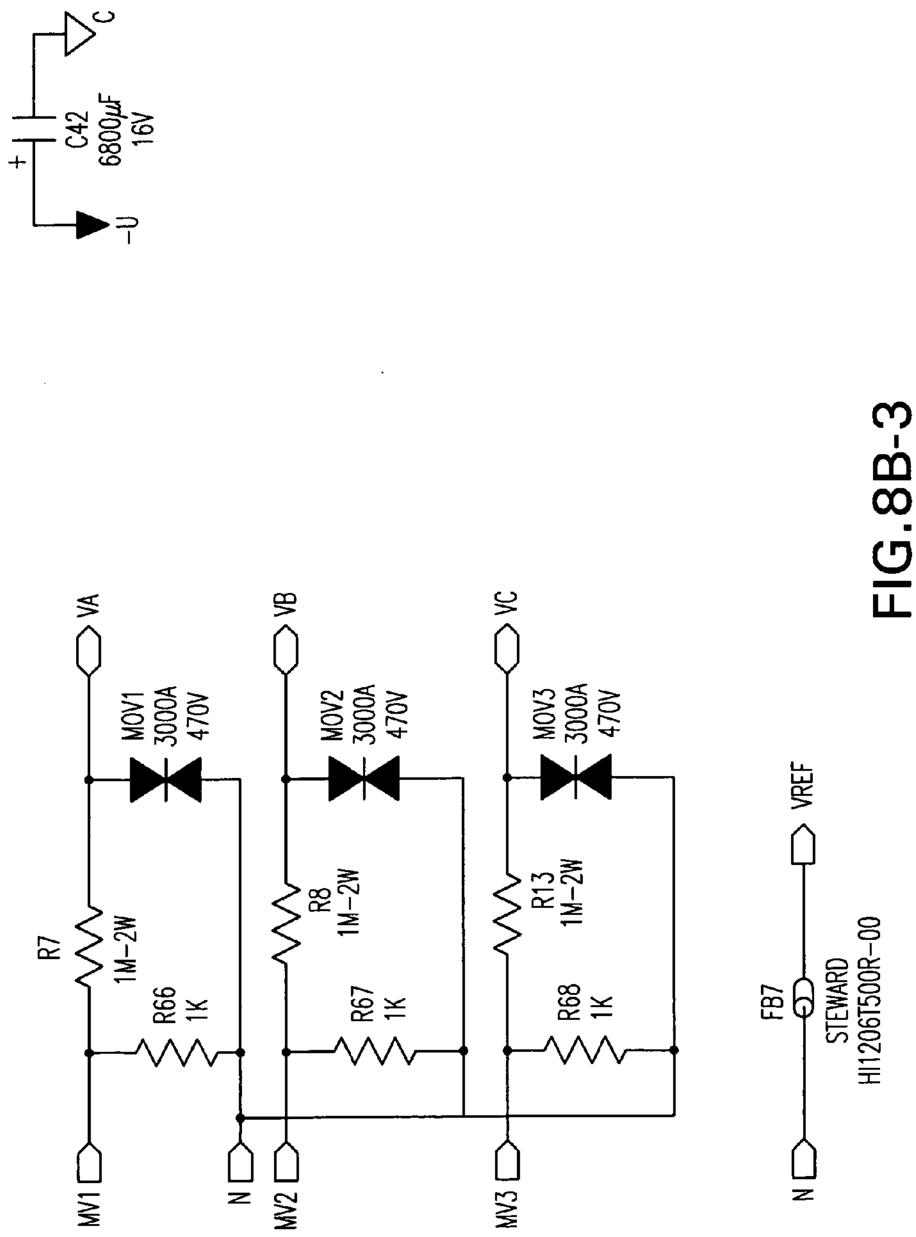
Figures 4, 8B:
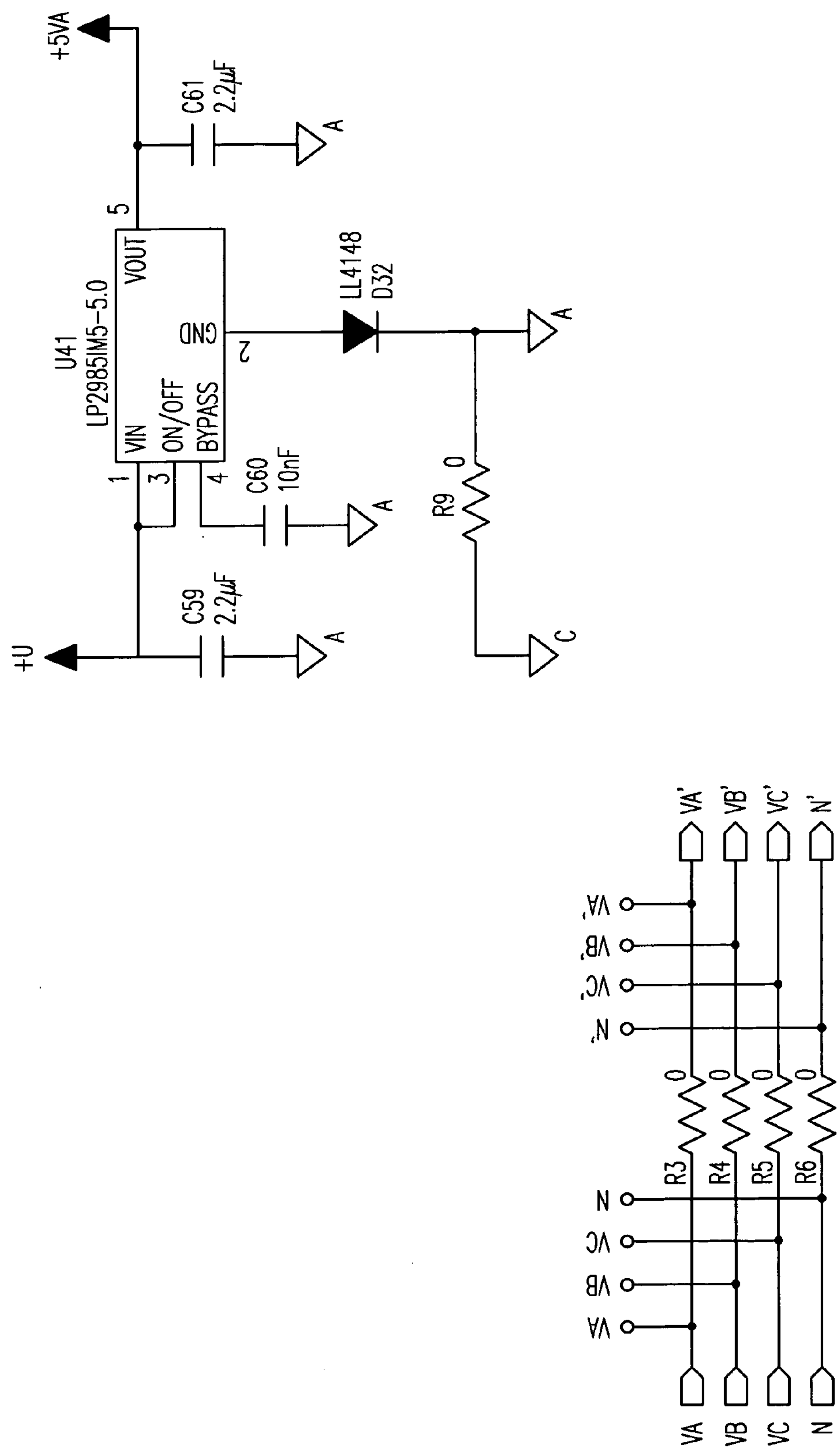
Figures 1, 8C:
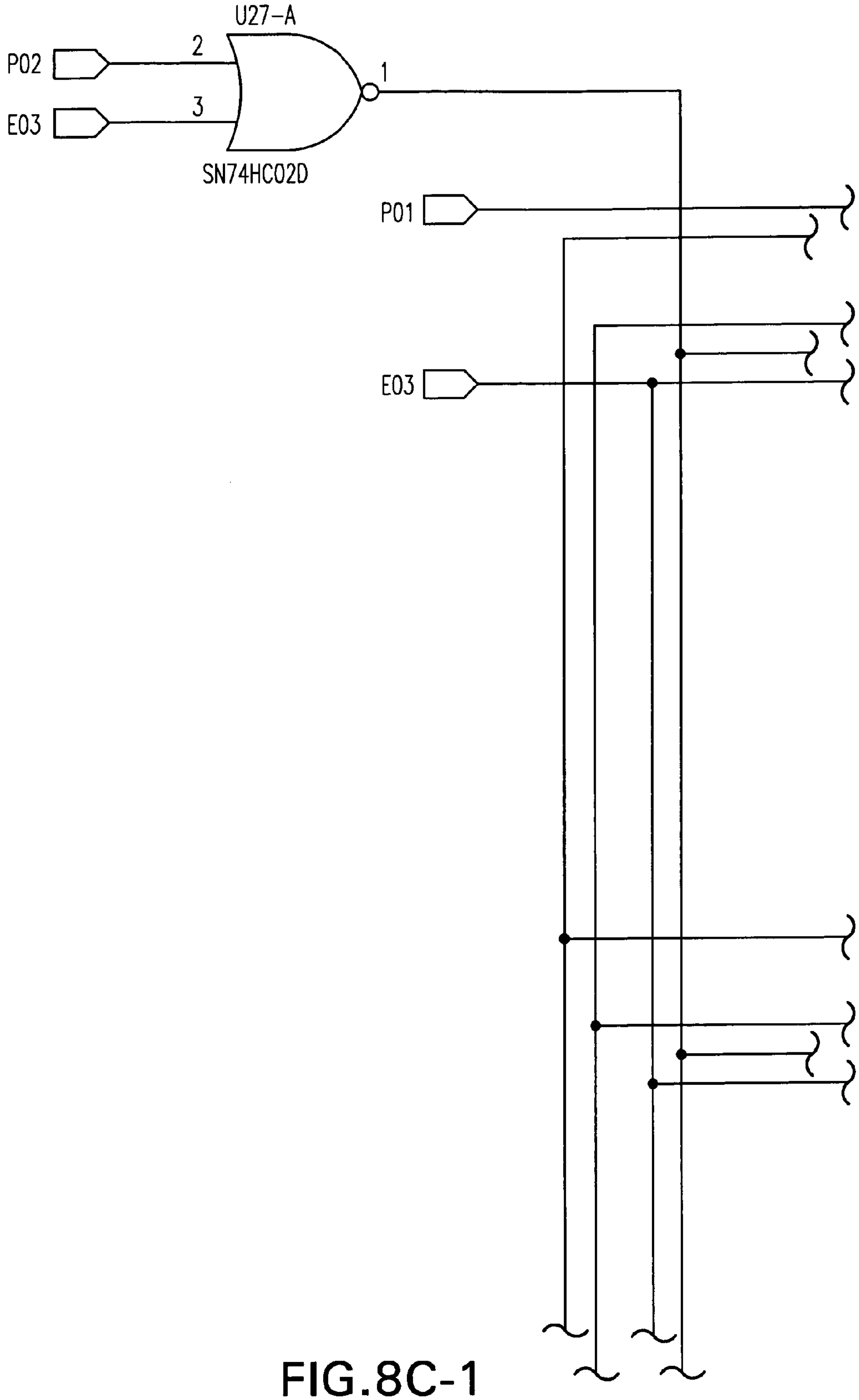
Figures 2, 8C:
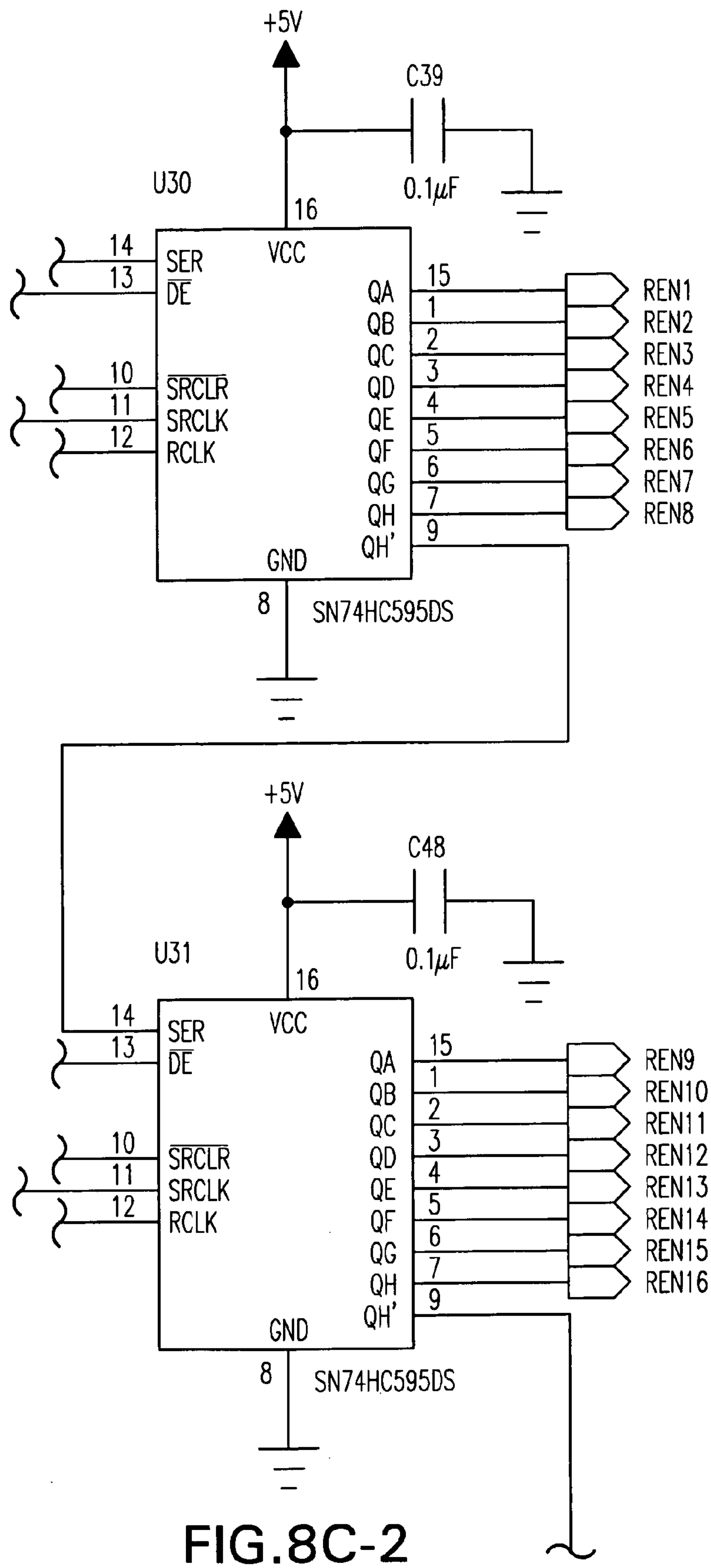
Figures 3, 8C:
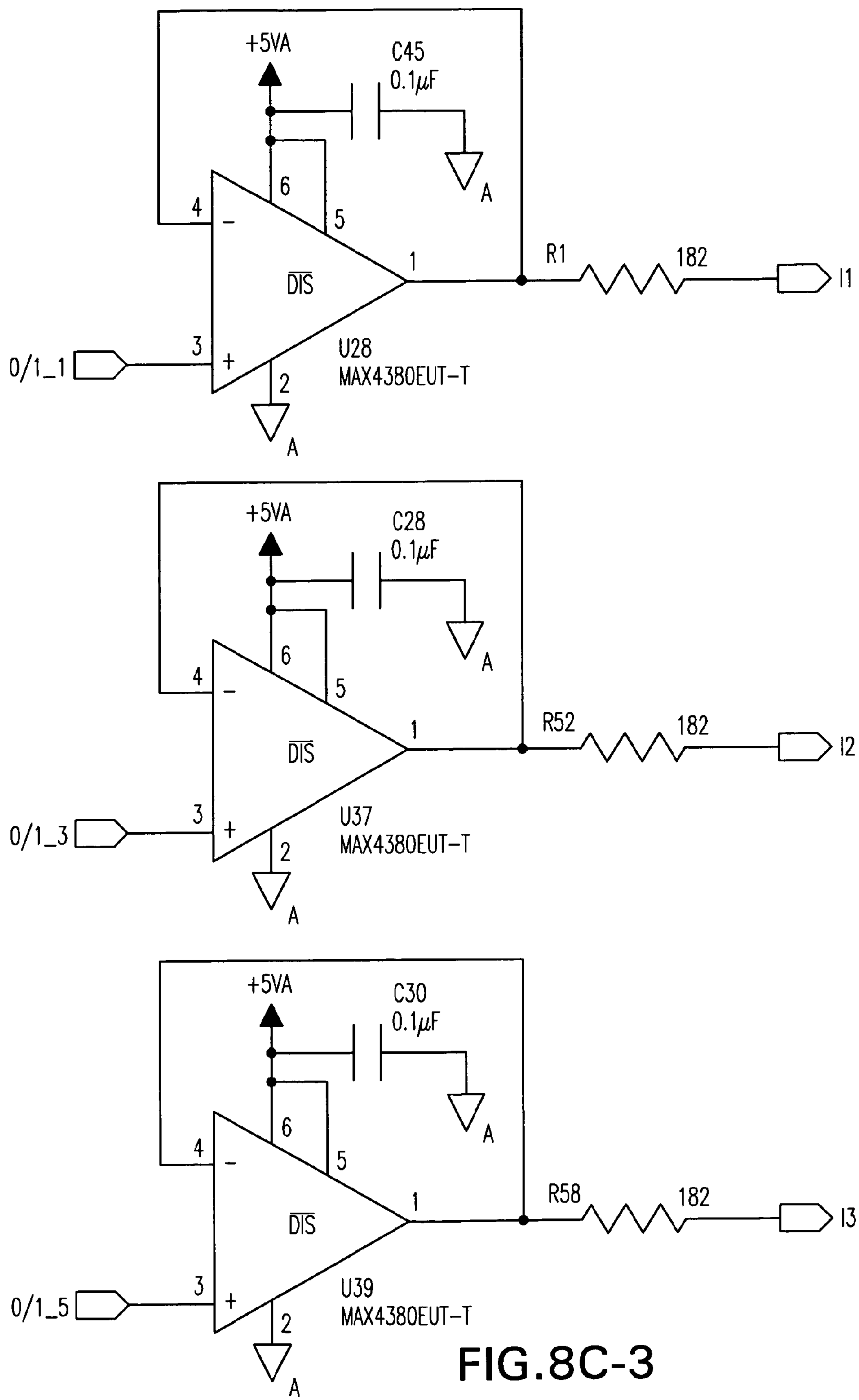
Figures 4, 8C:
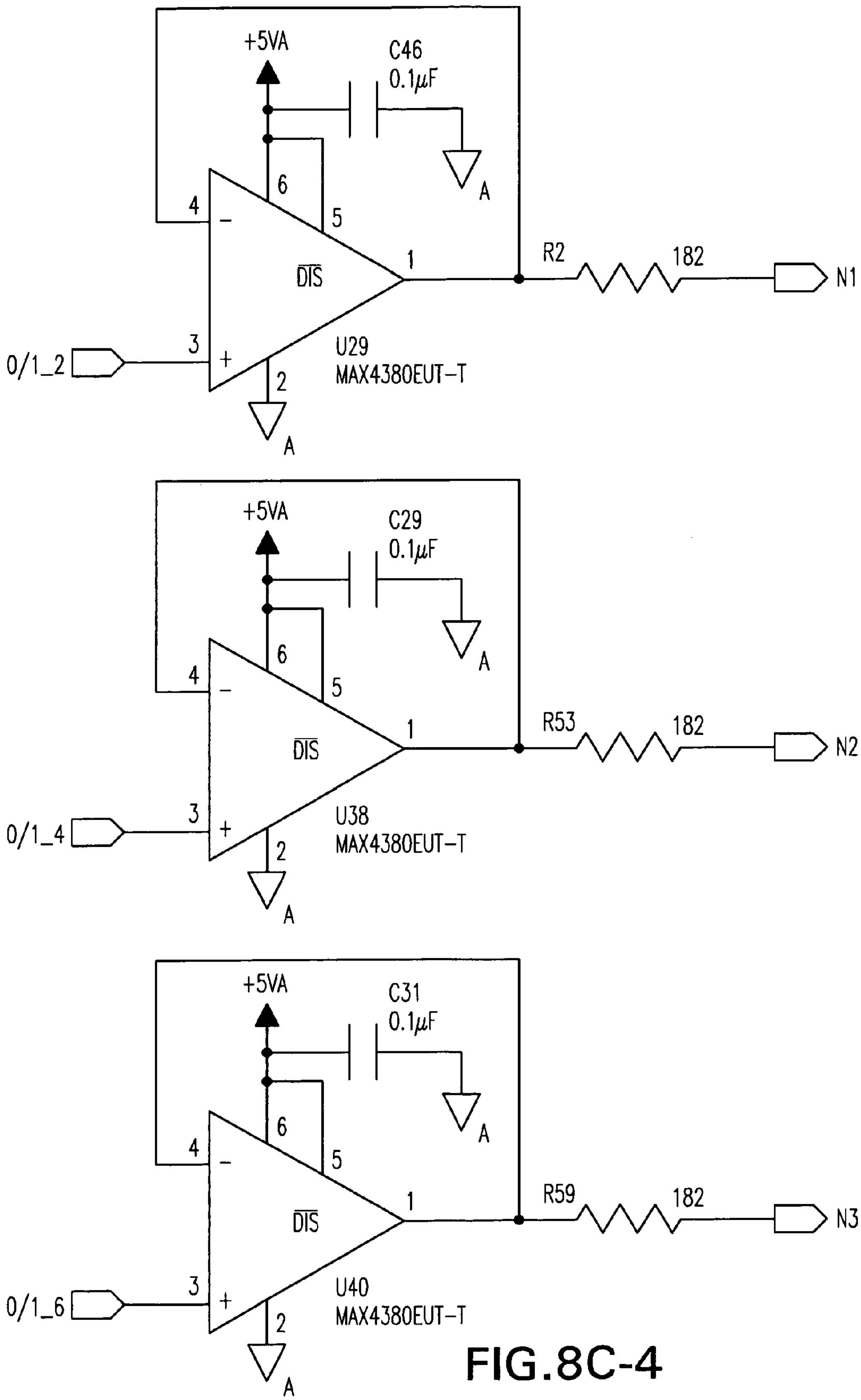
Figures 5, 8C:
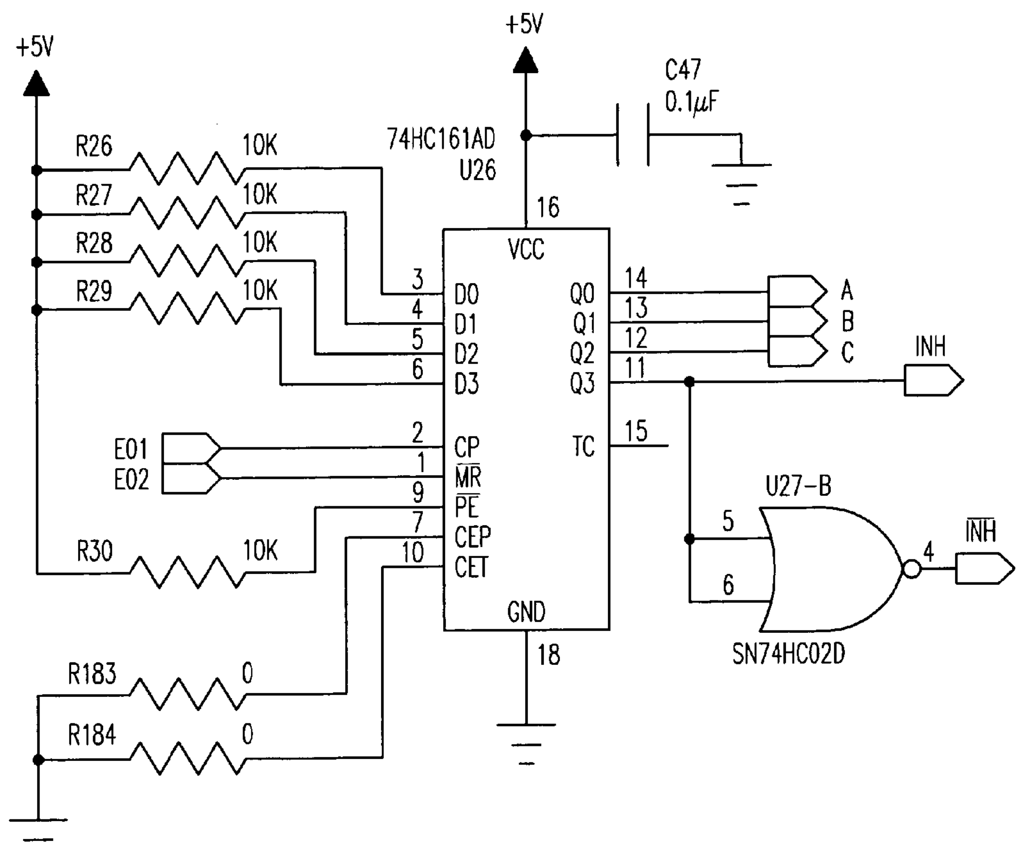
Figures 6, 8C:
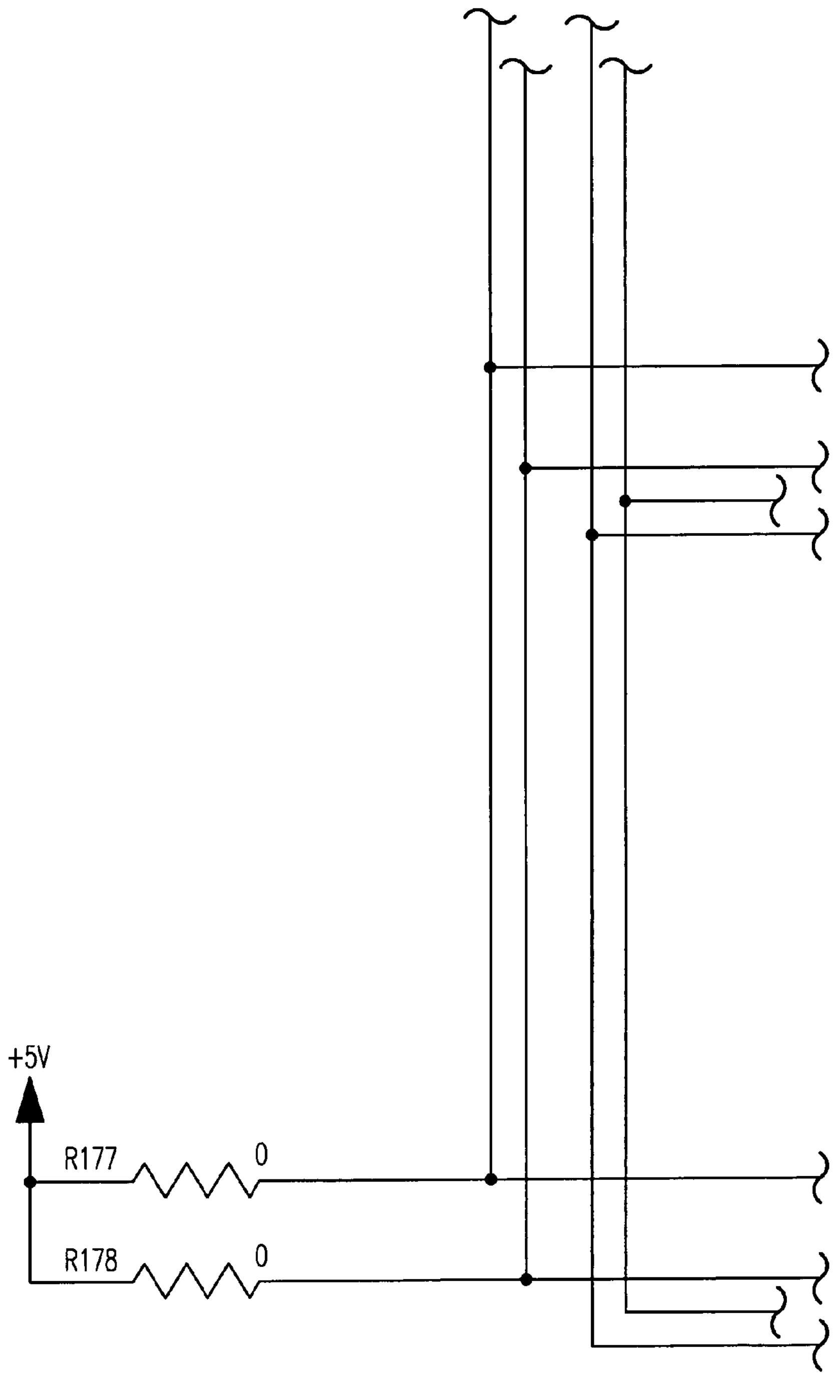
Figures 7, 8C:
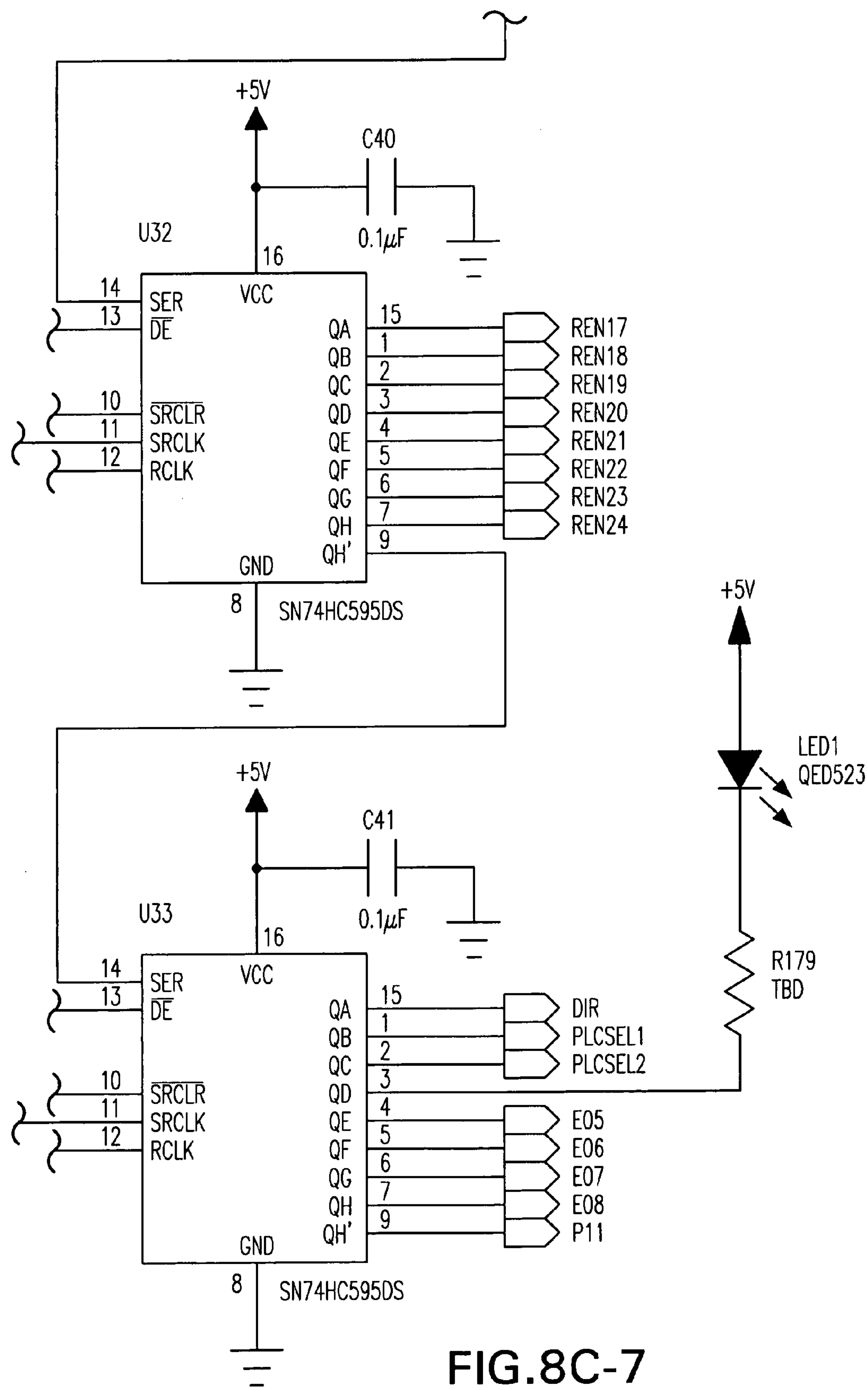
Figures 8, 8C:
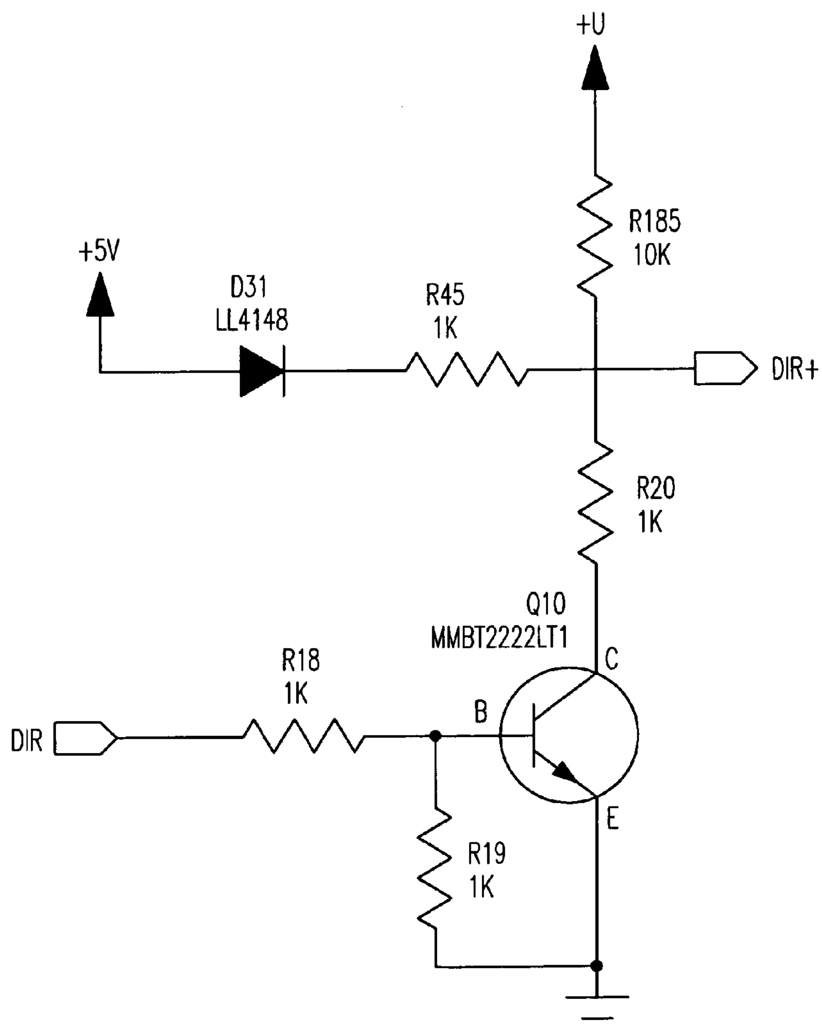
Figures 8, 8C, 9:
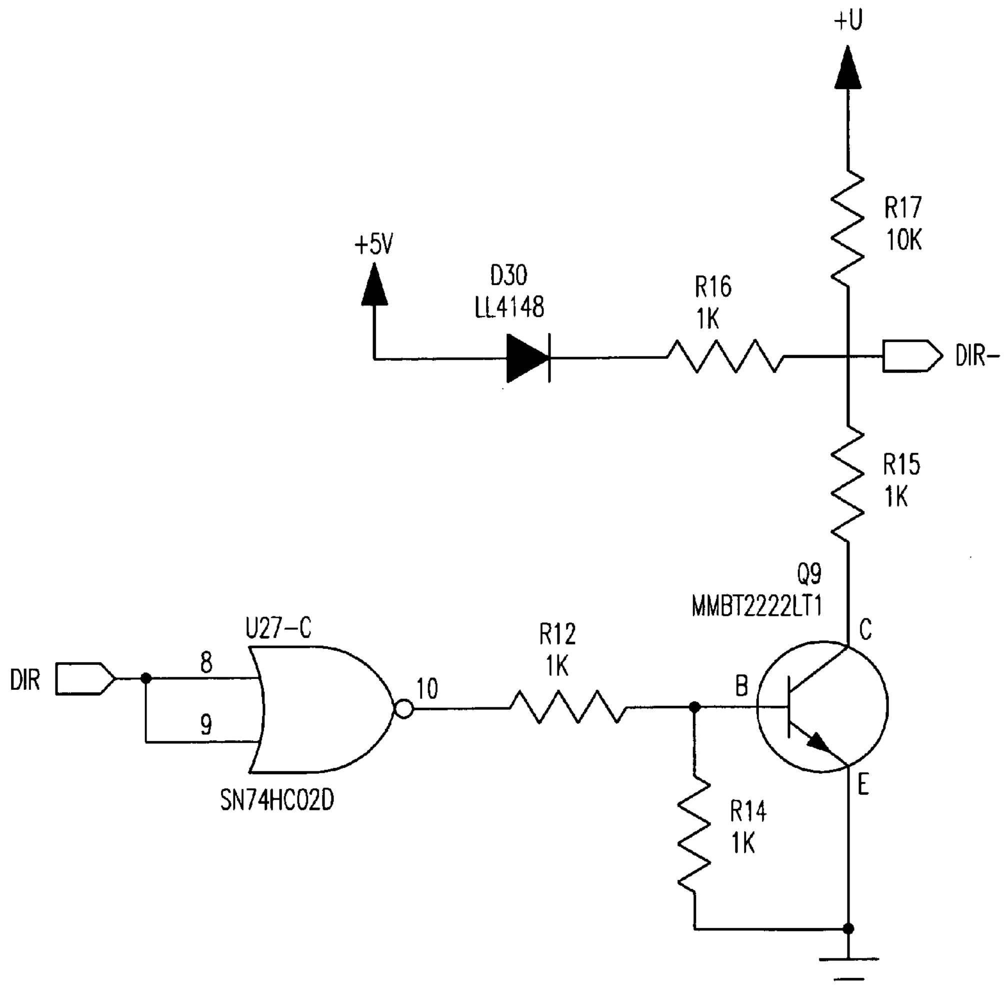
Figure 8D:
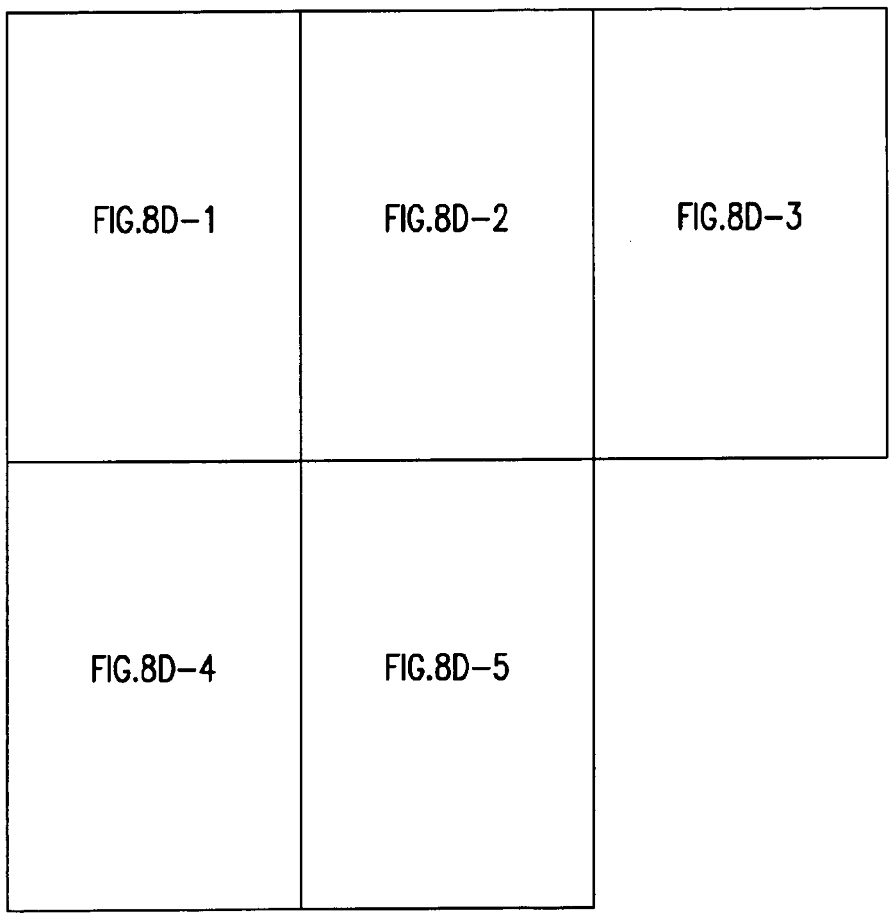
Figure 8D:
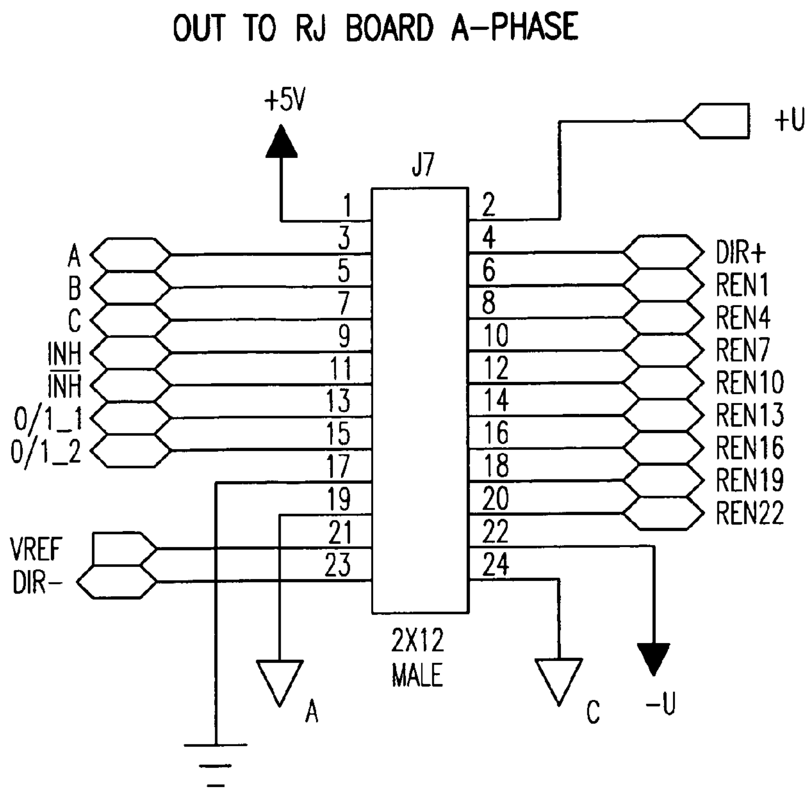
Figure 1:
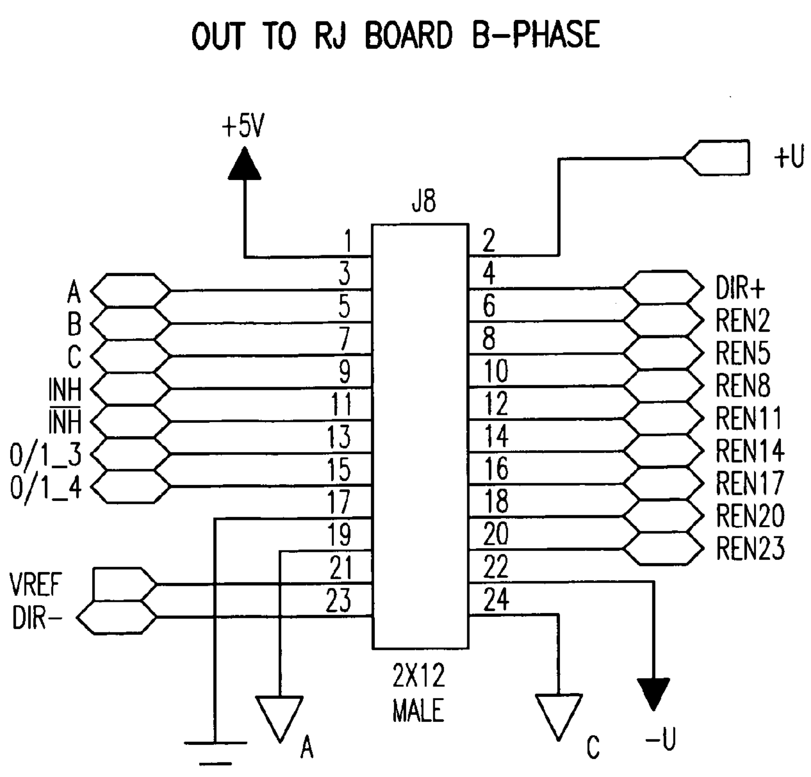
Figures 2, 8D:
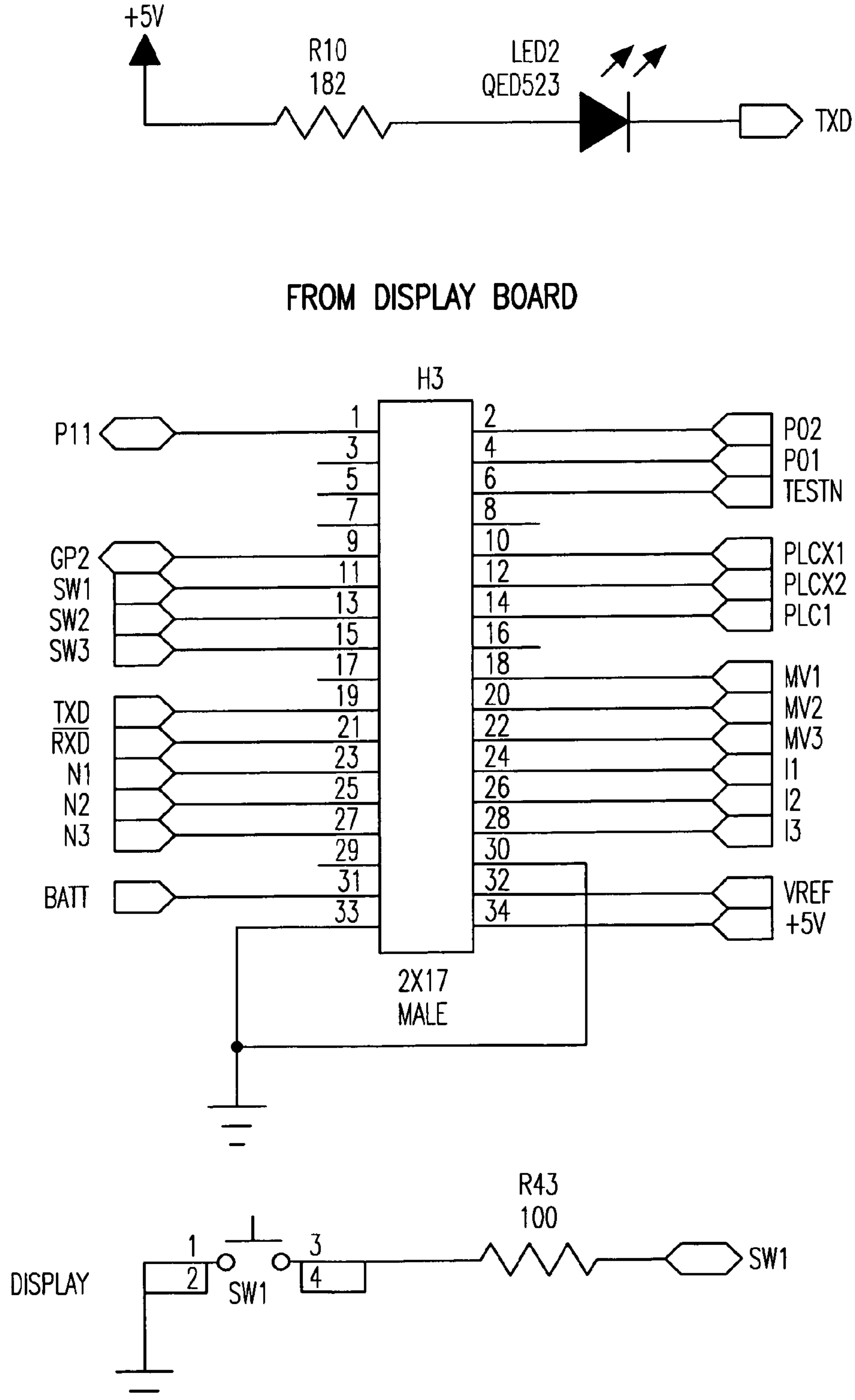
Figures 3, 8D:
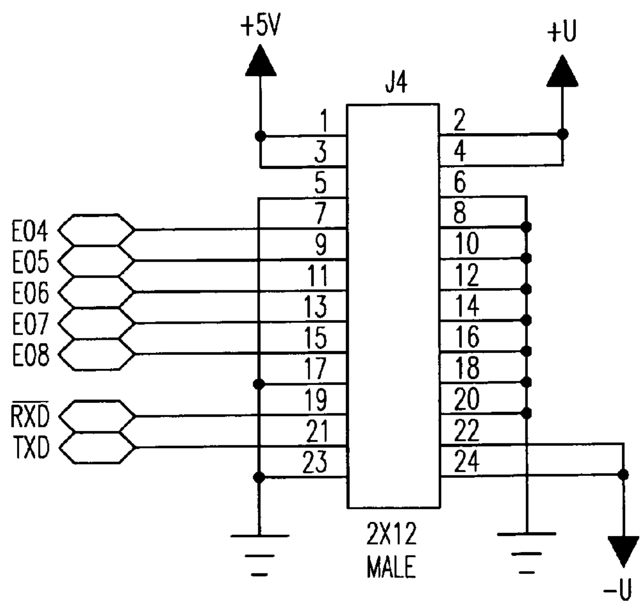
Figures 4, 8D:
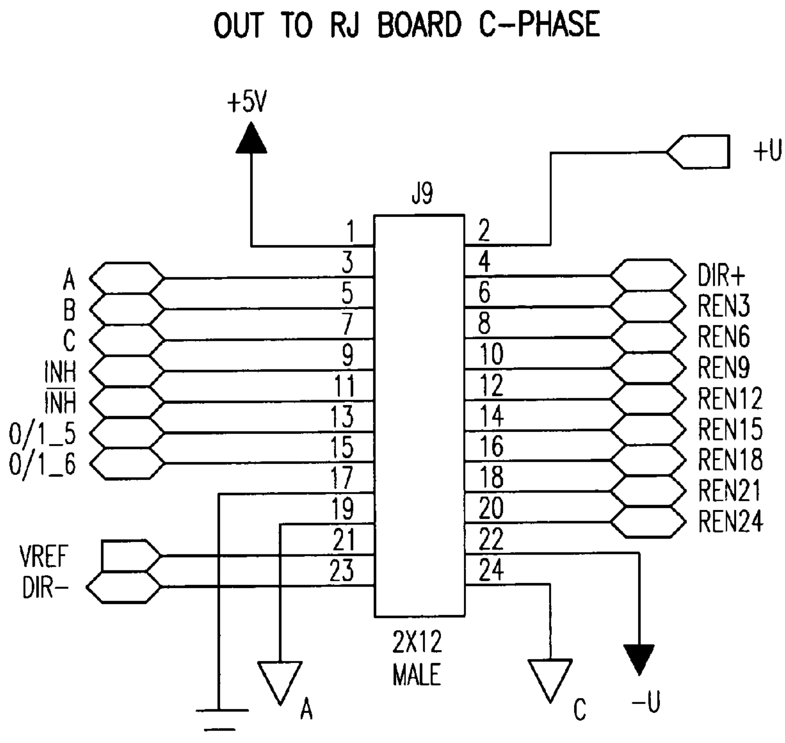
Figures 5, 8D:
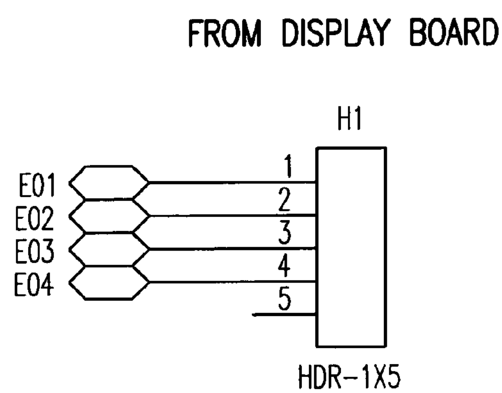
Figure 9A:
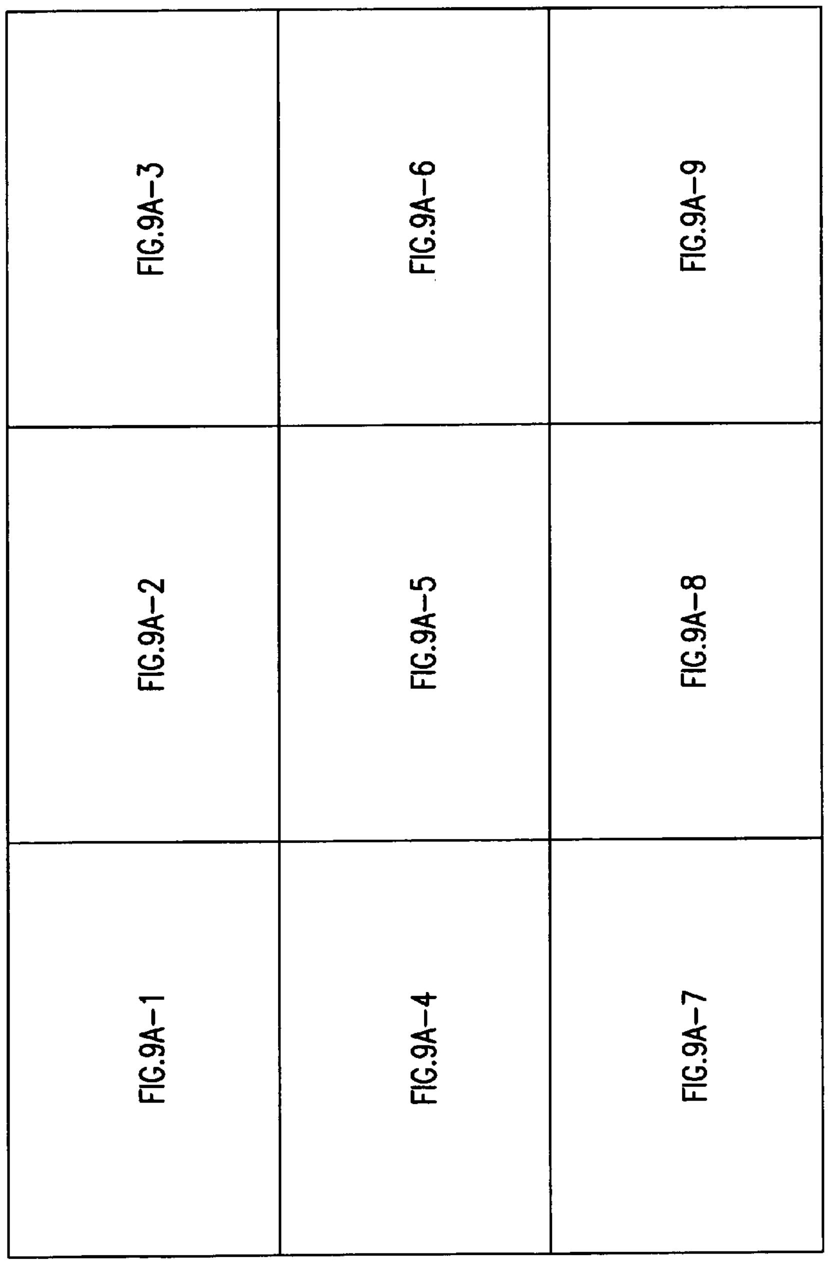
FIGS. 9A-9C illustrate a schematic diagrams of a preferred Energy Guard connection board.
Figures 1, 9A:
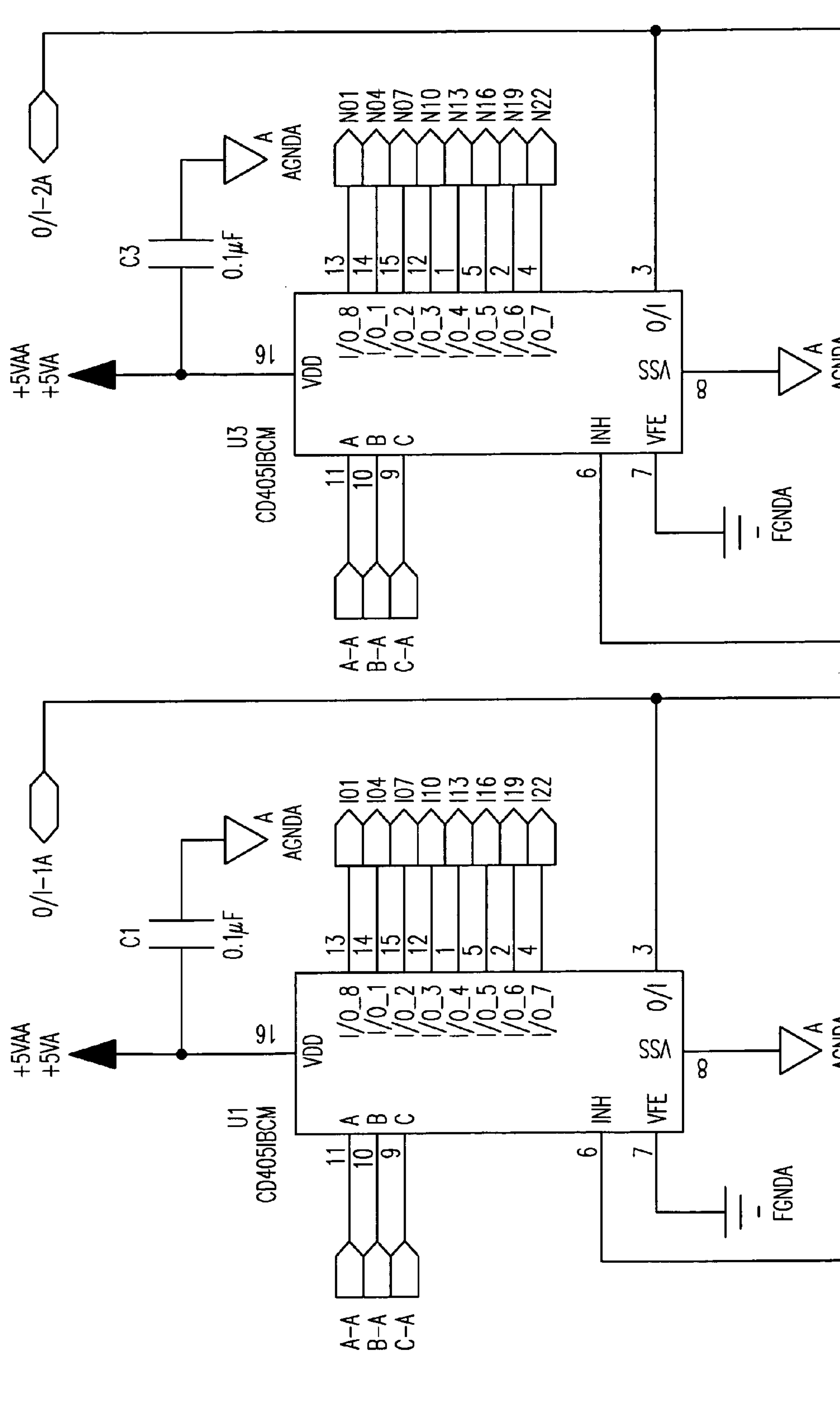
Figures 2, 9A:
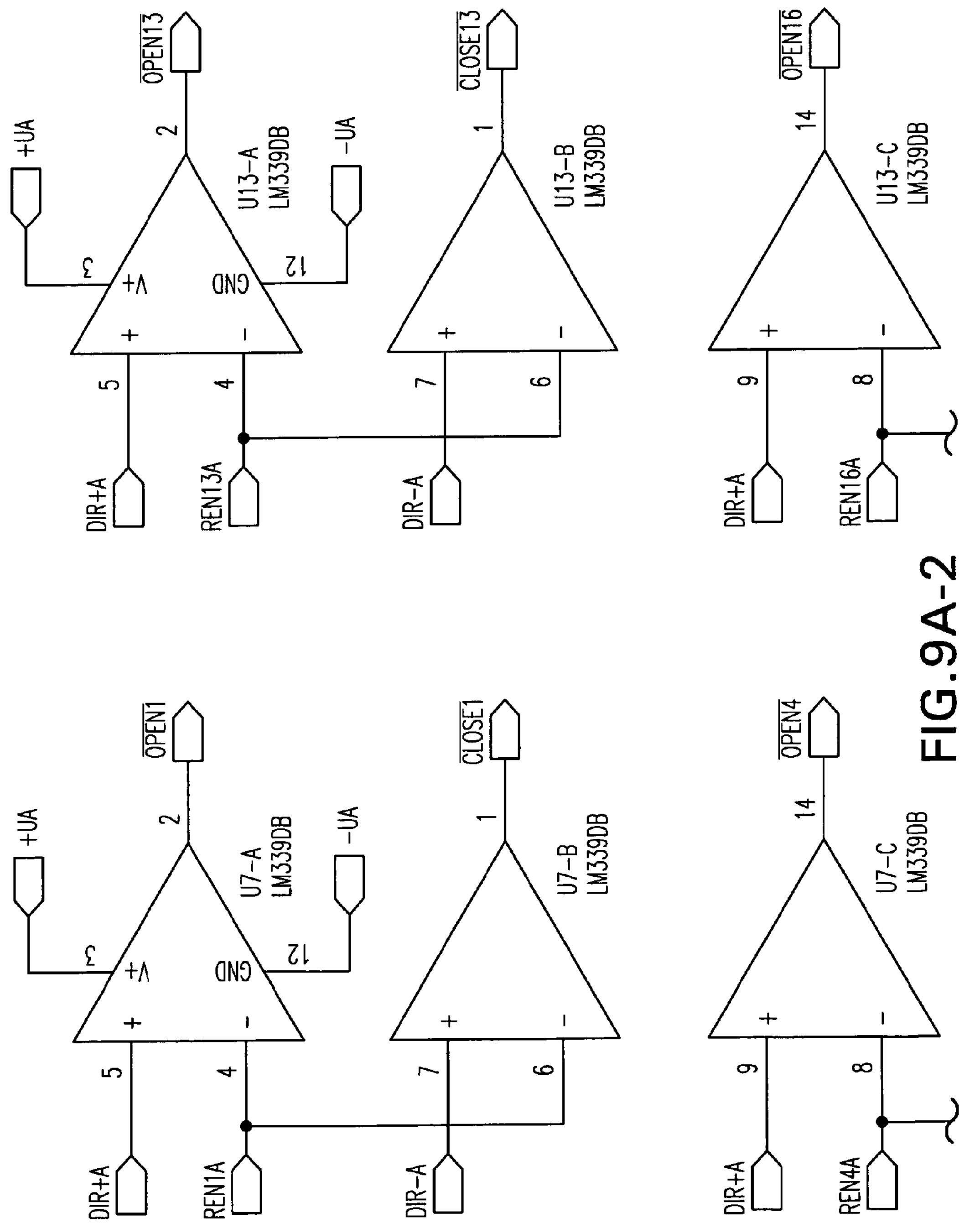
Figures 3, 9A:
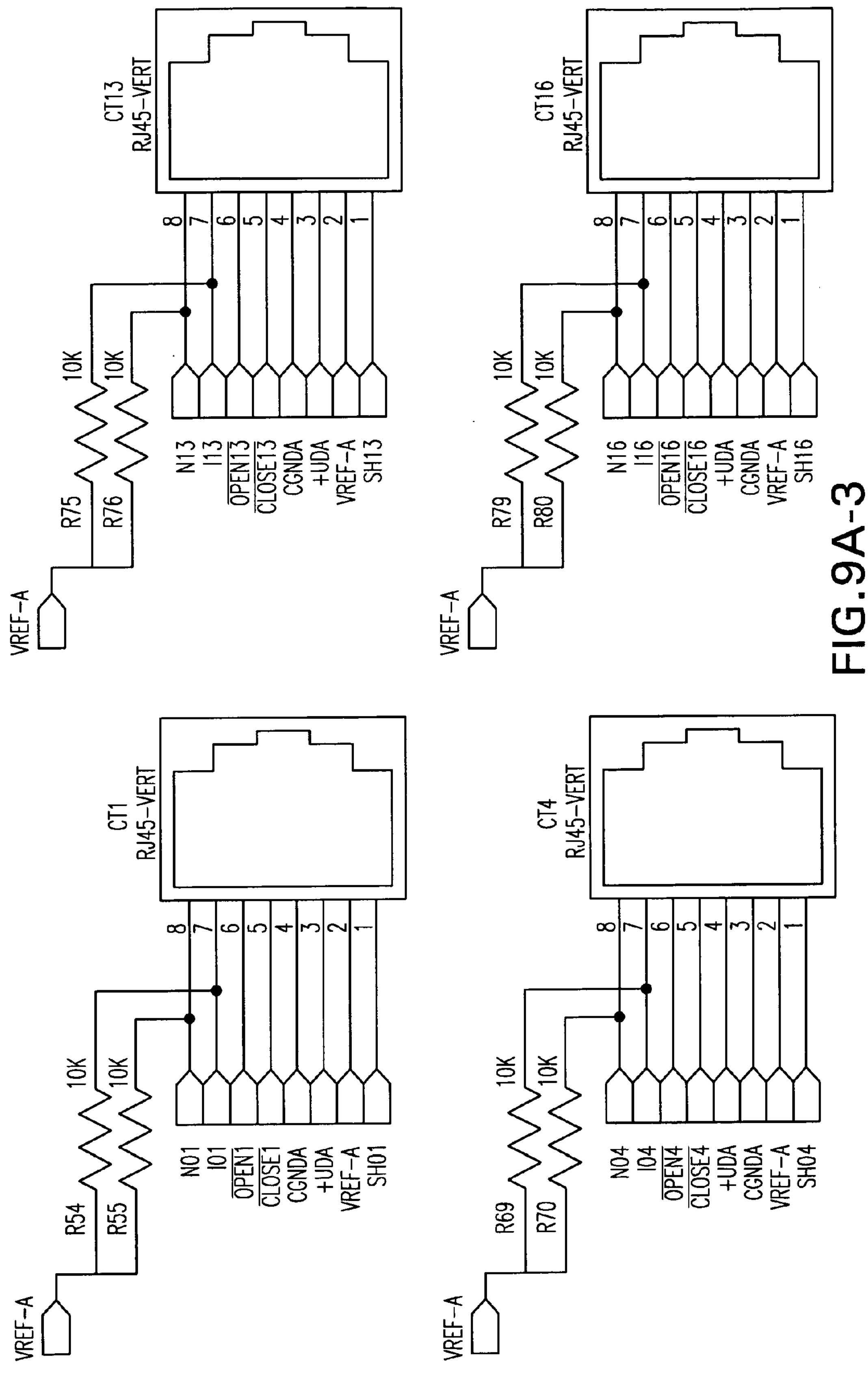
Figures 4, 9A:
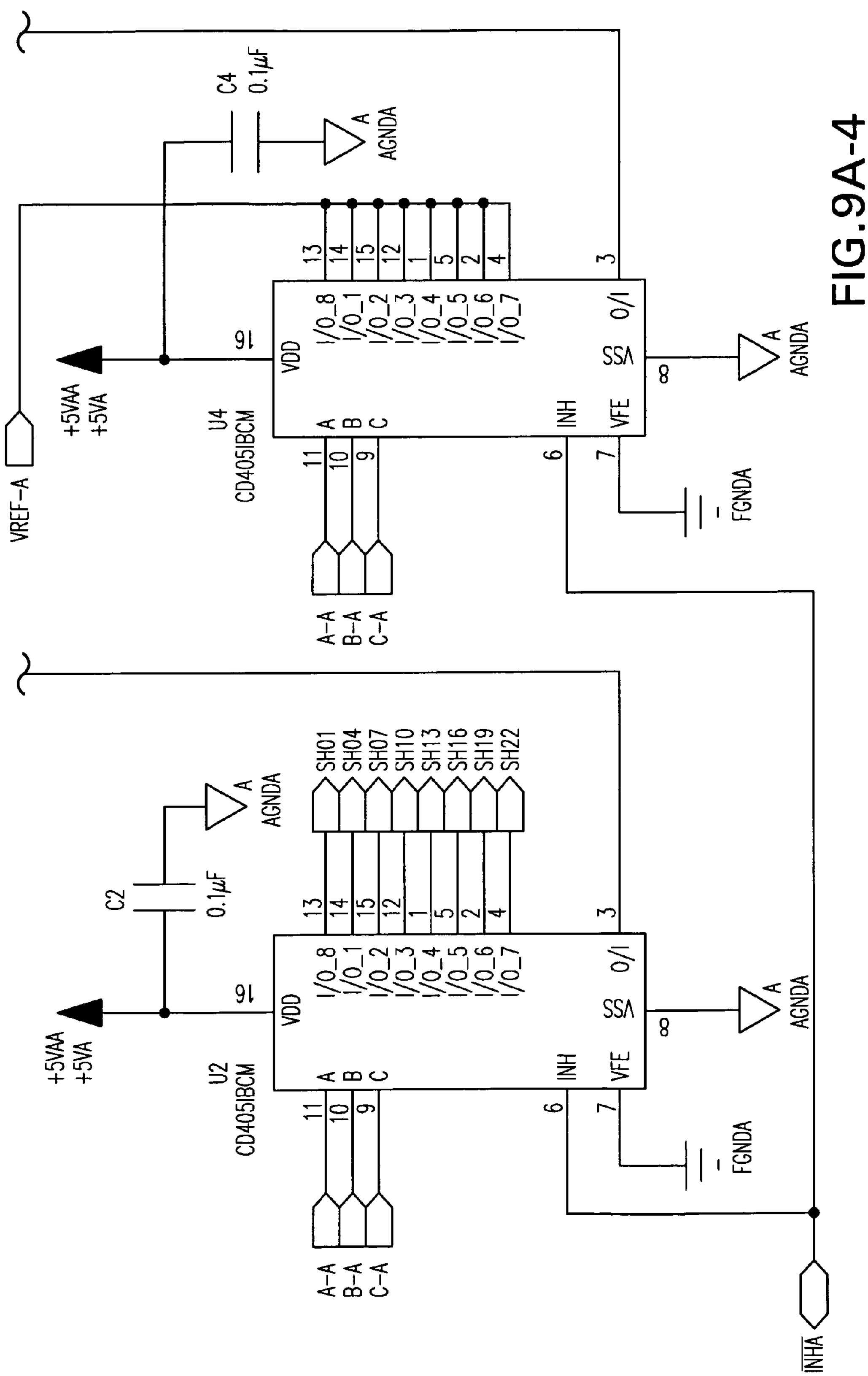
Figures 5, 9A:
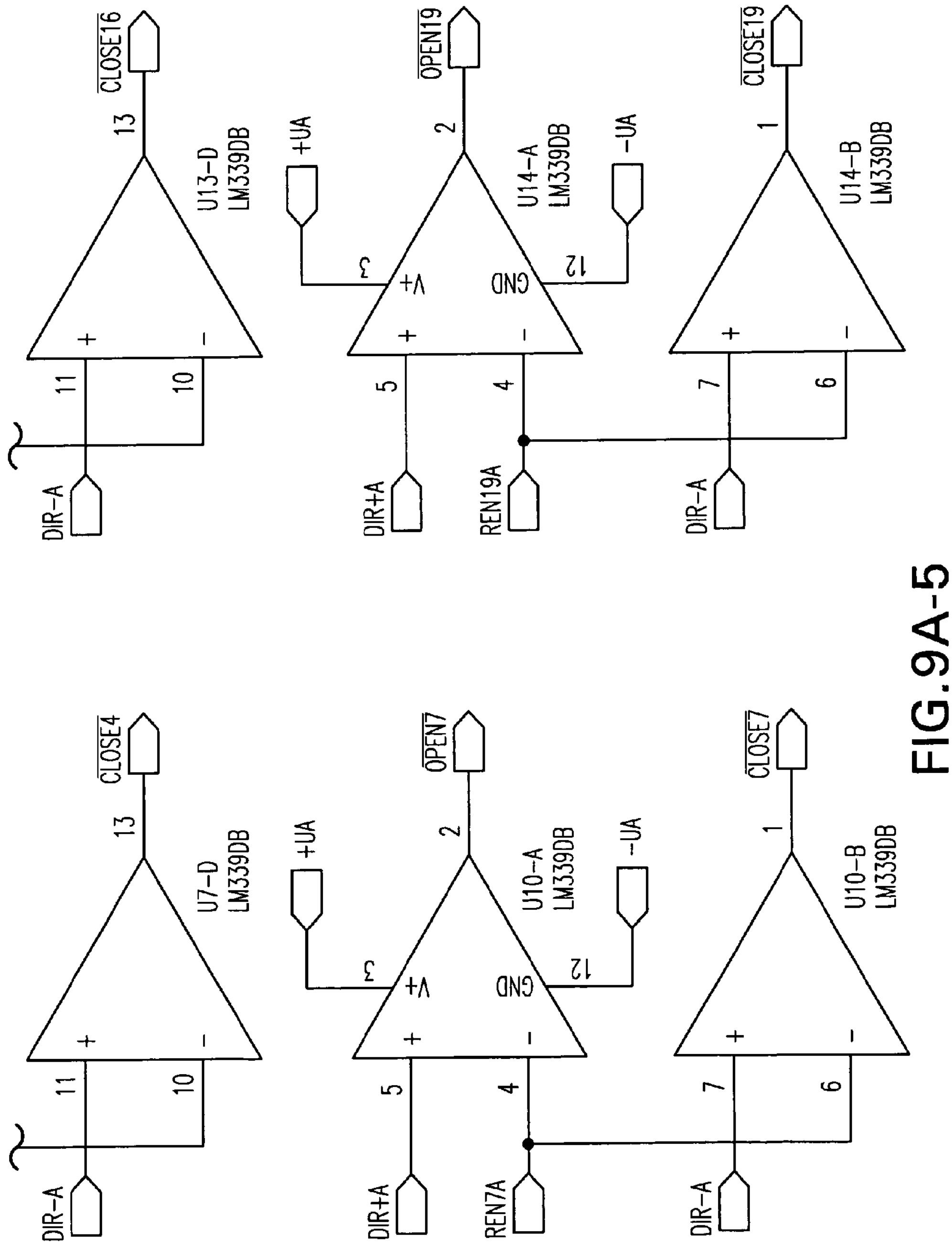
Figures 6, 9A:
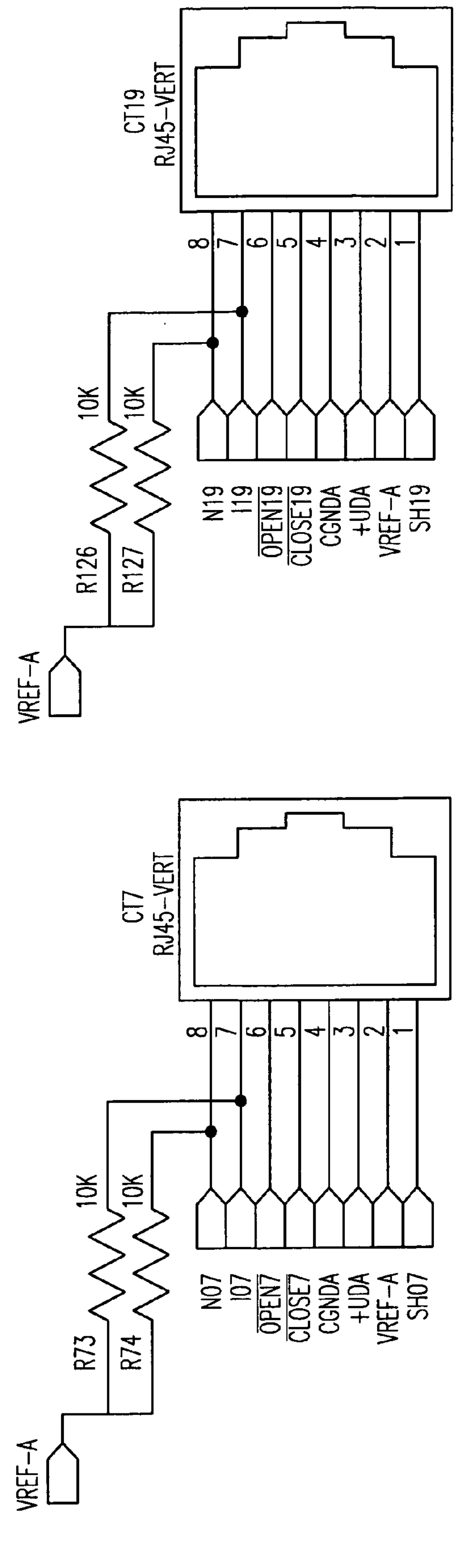
Figures 7, 9A:
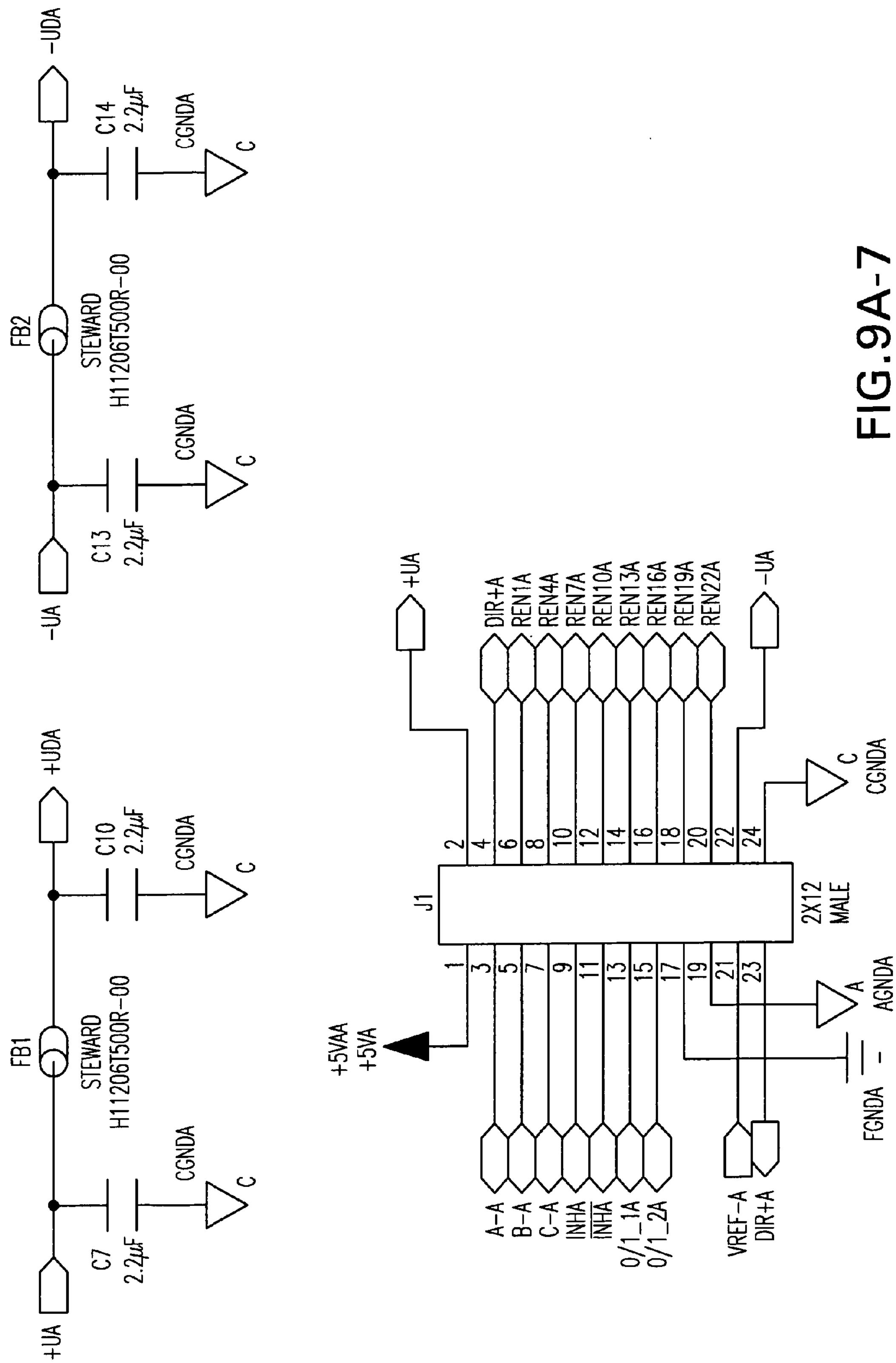
Figures 8, 9A:
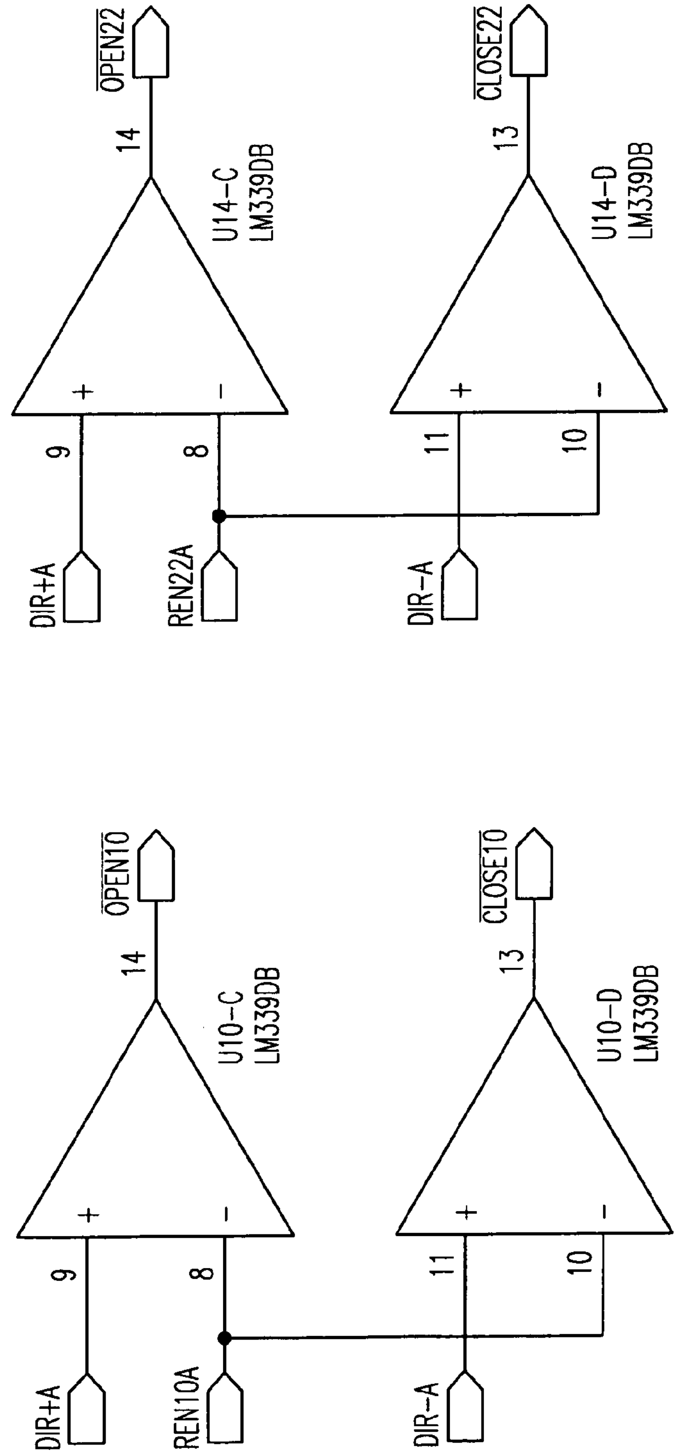
Figures 9, 9A:
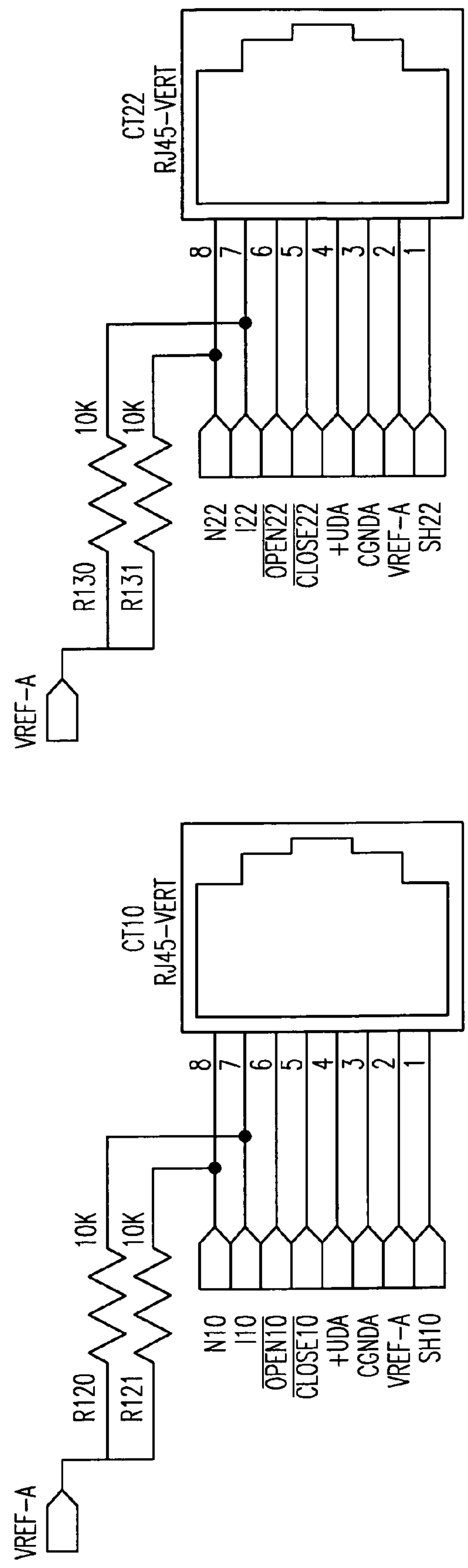
Figure 9B:
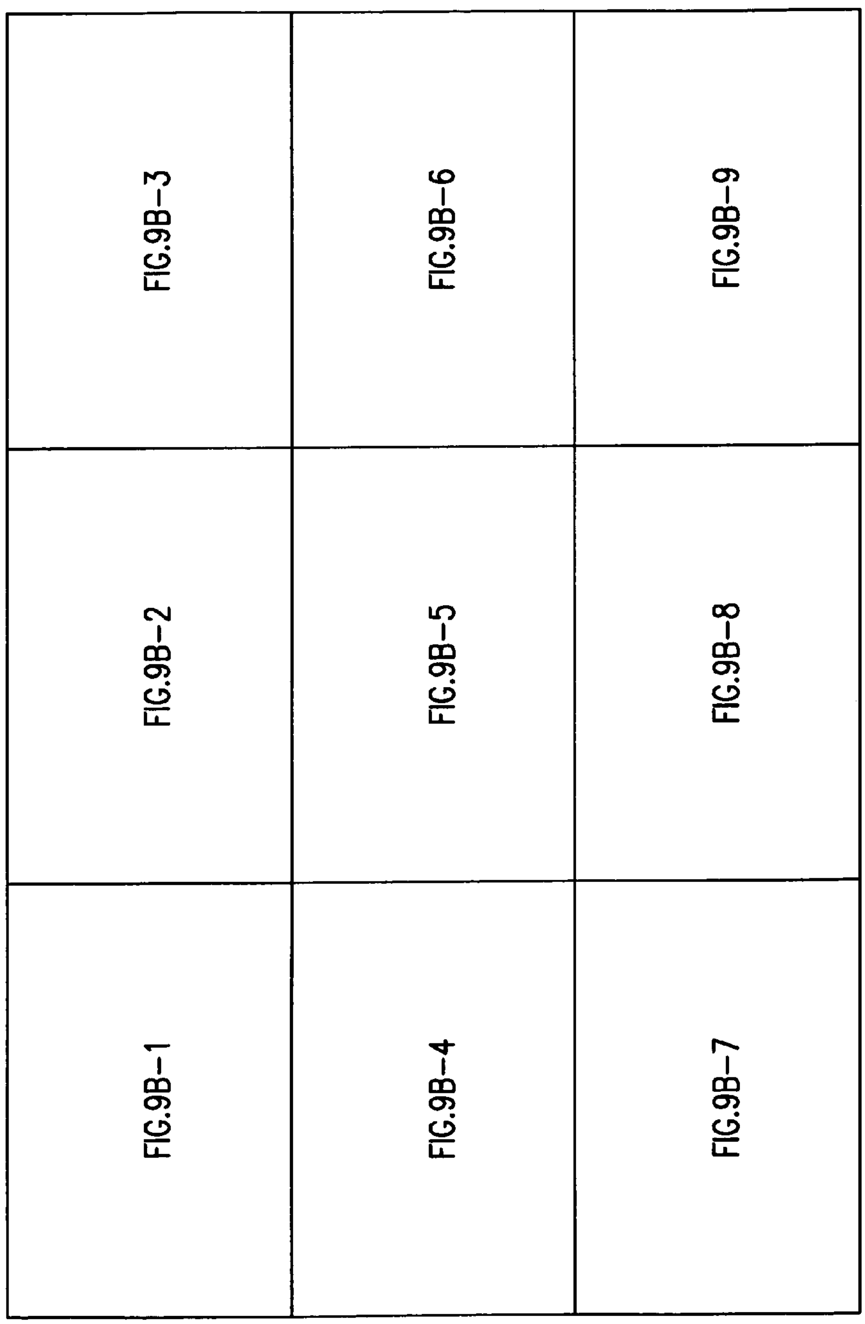
Figures 1, 9B:
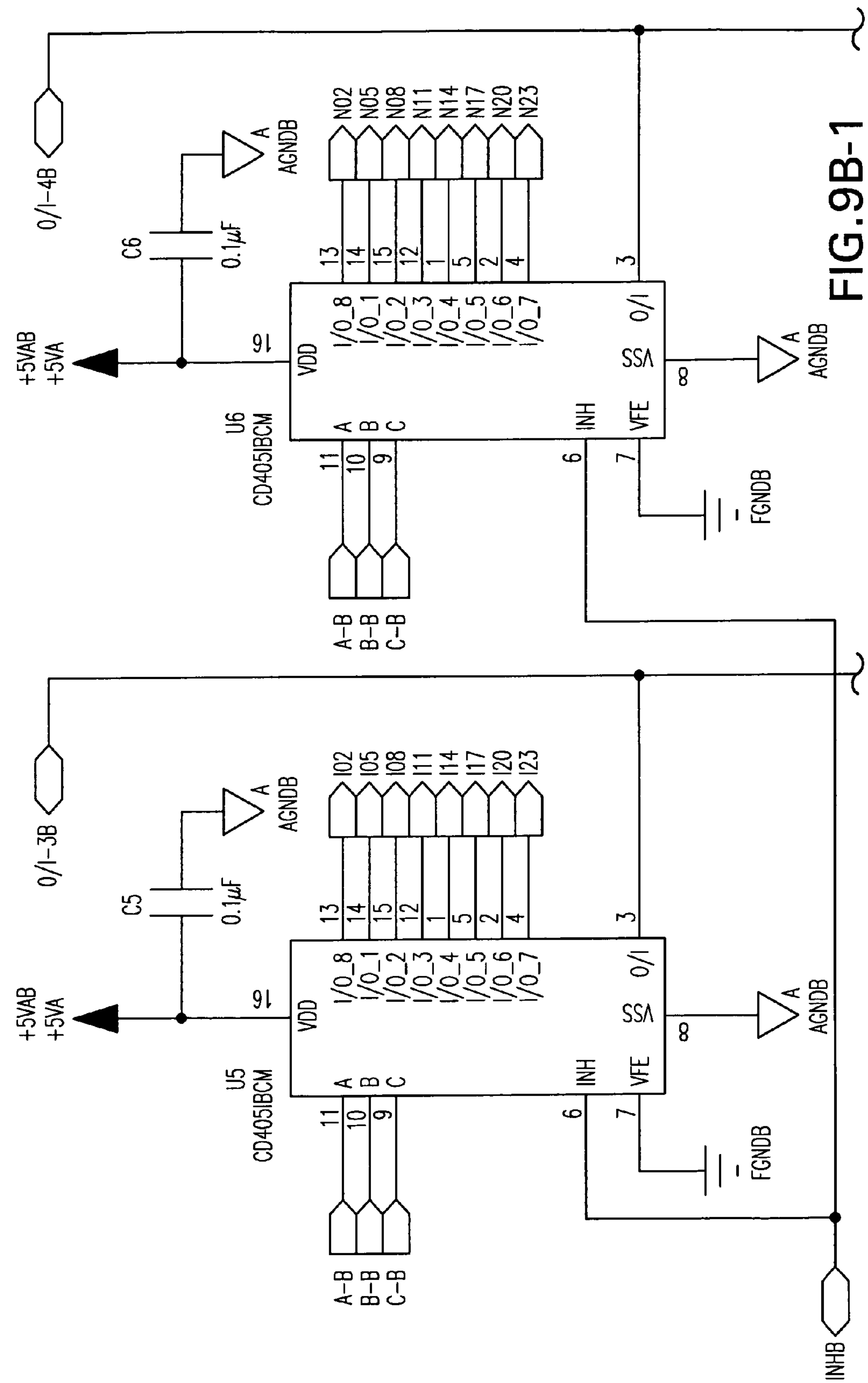
Figures 2, 9B:
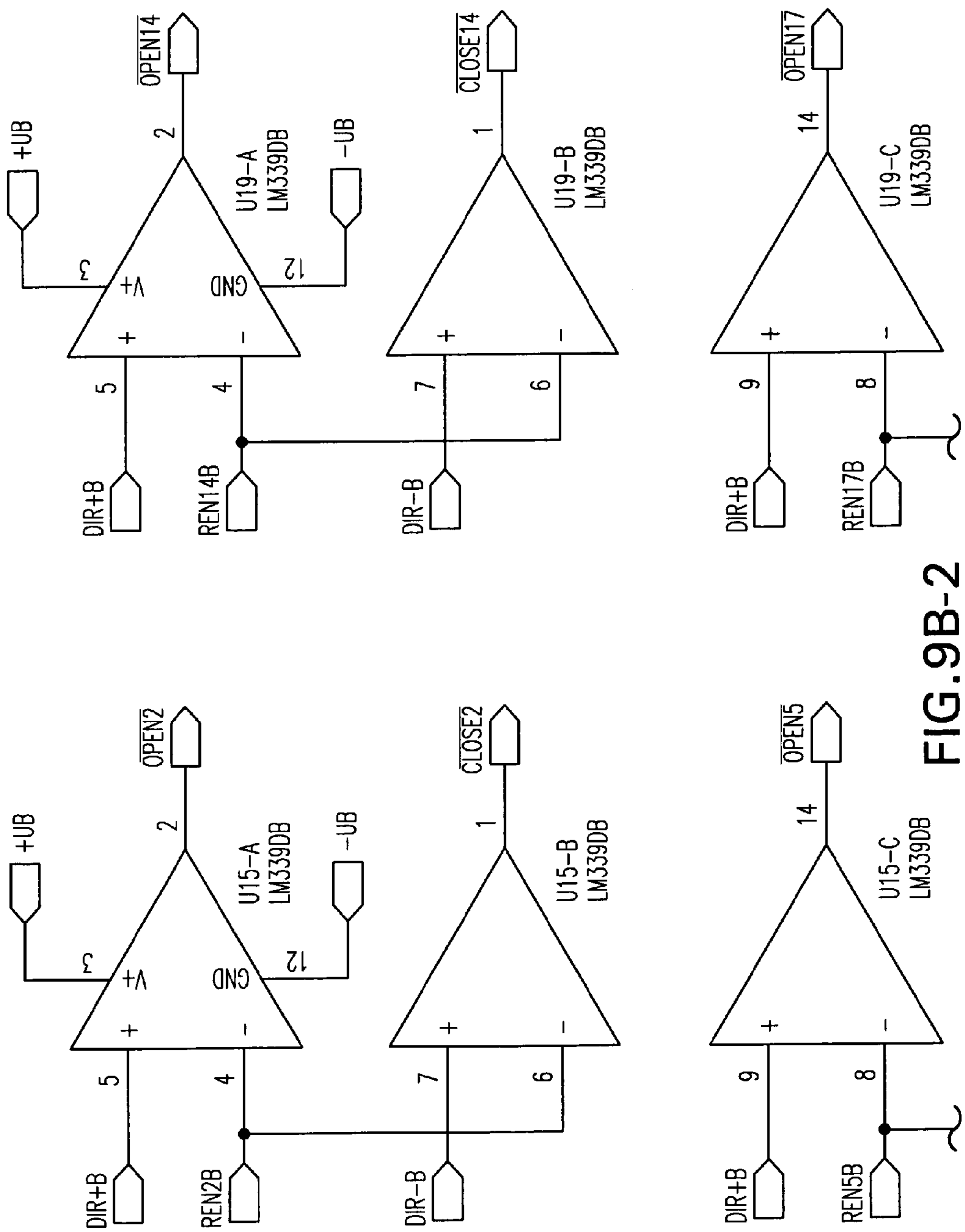
Figures 3, 9B:
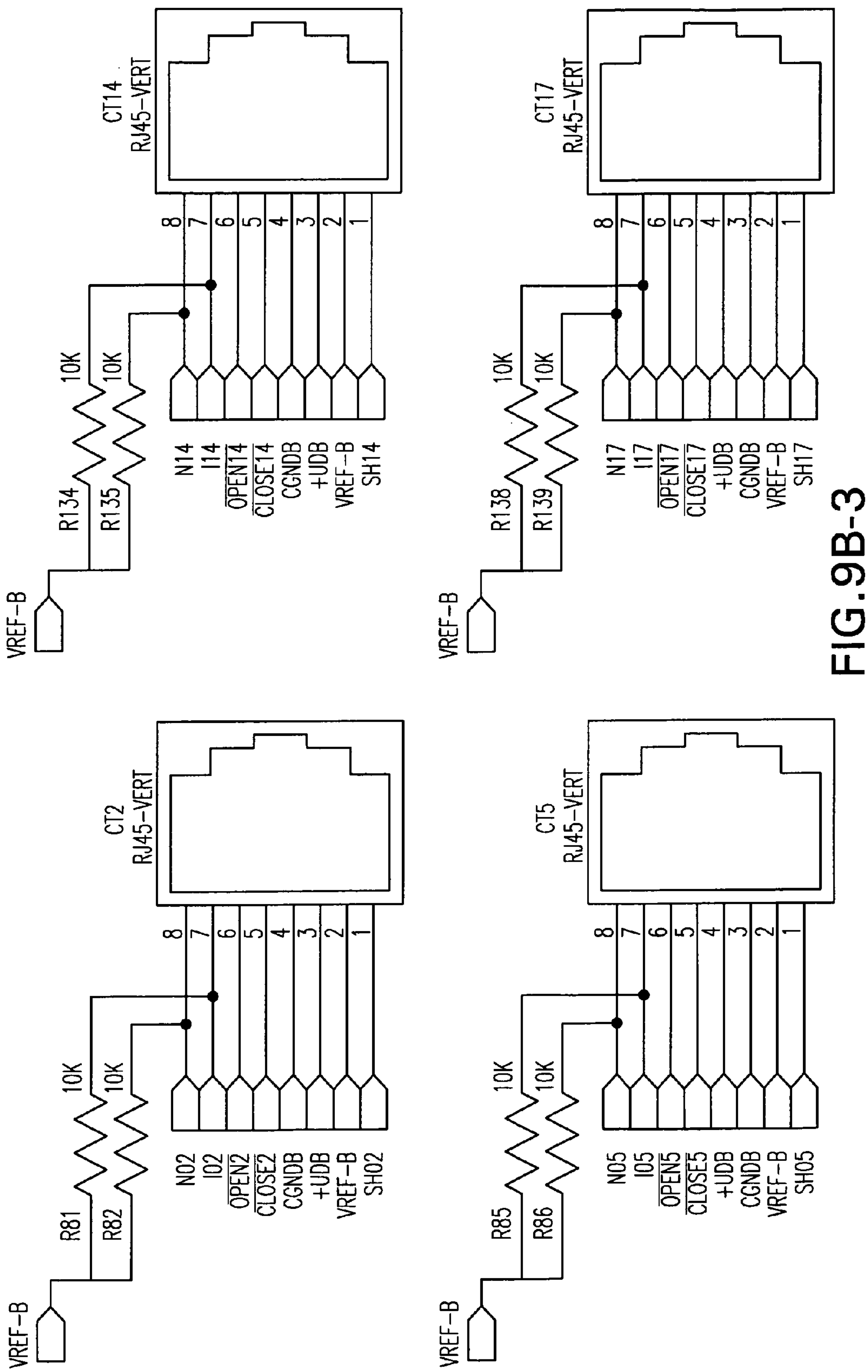
Figures 4, 9B:
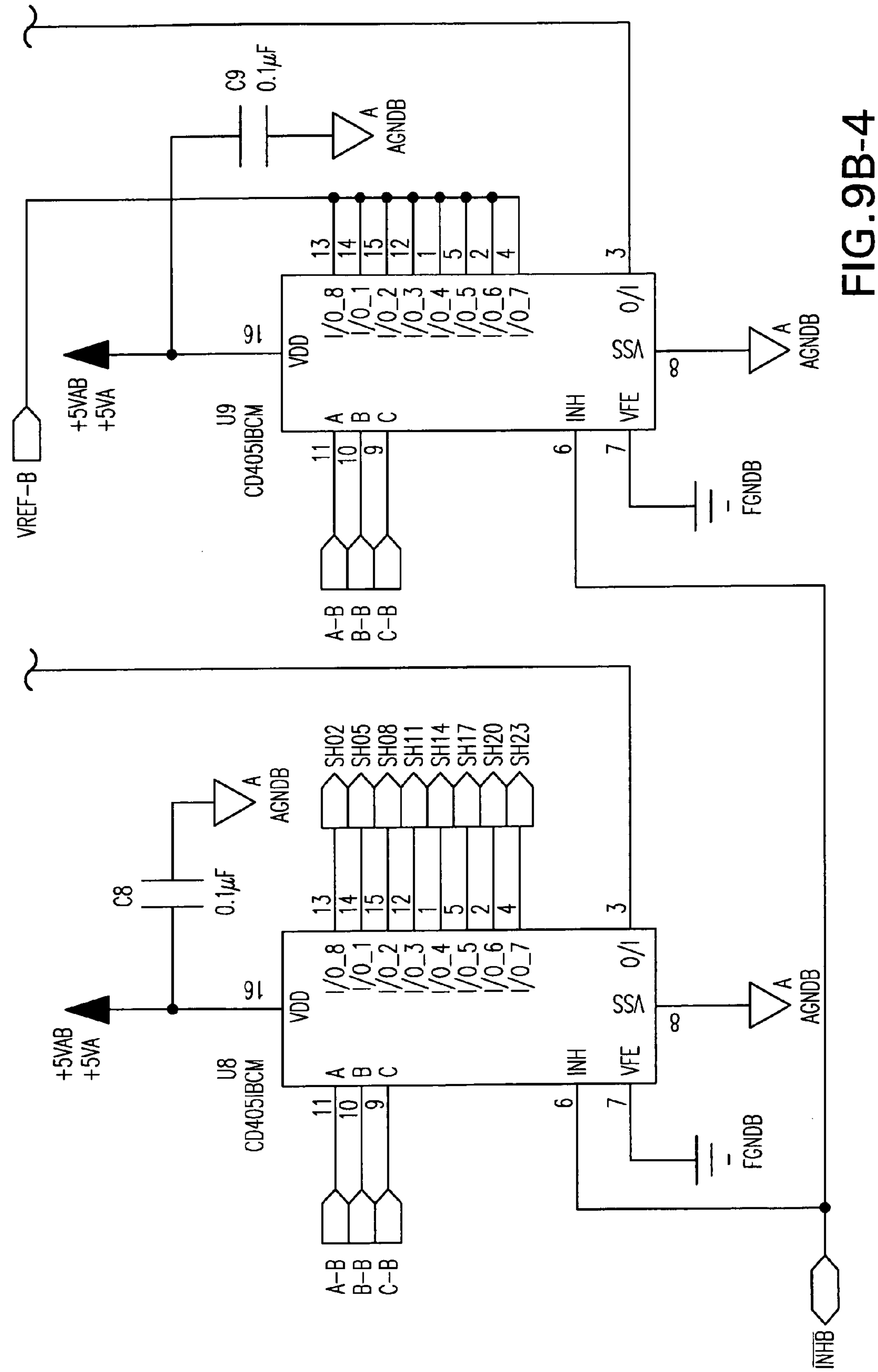
Figures 5, 9B:
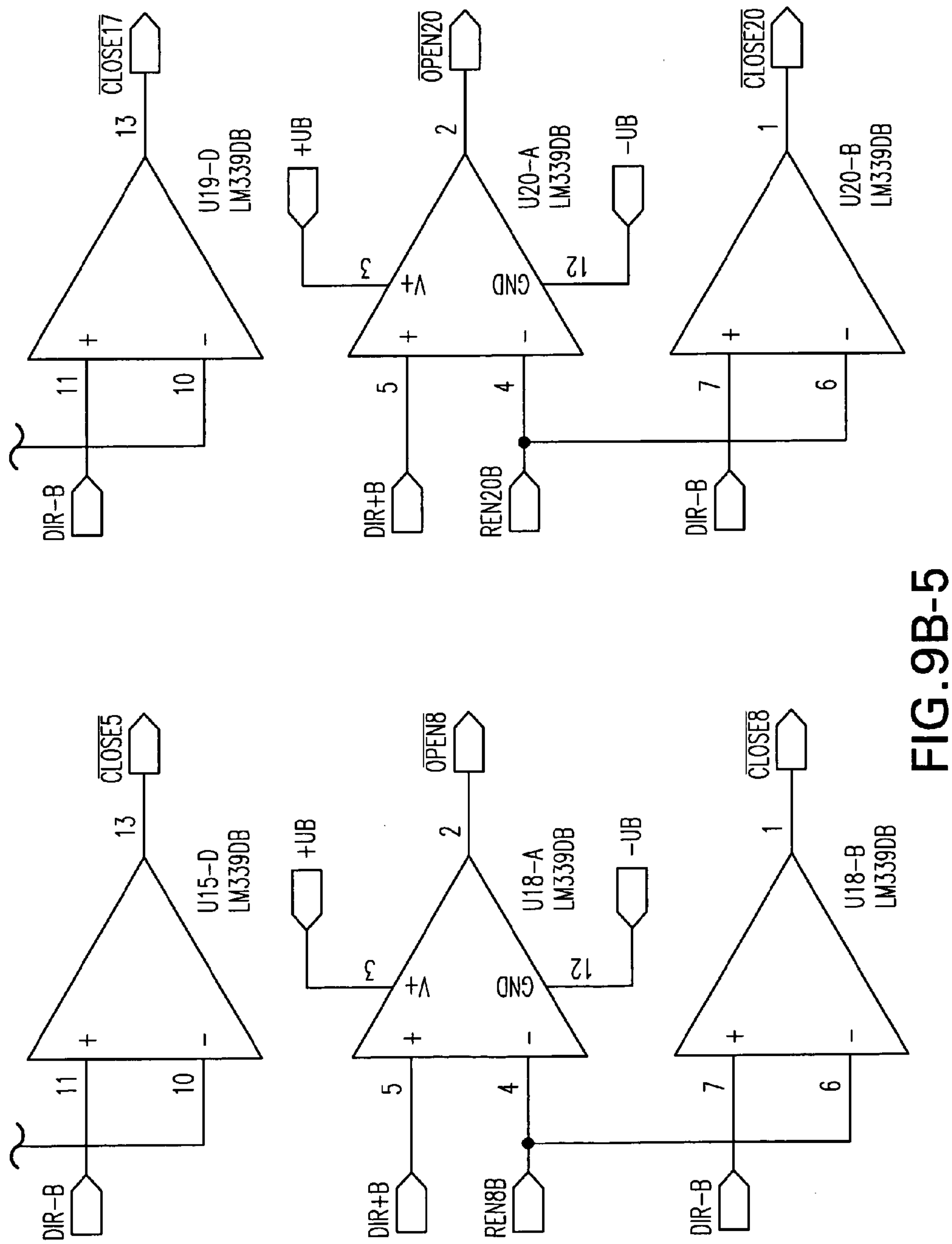
Figures 6, 9B:
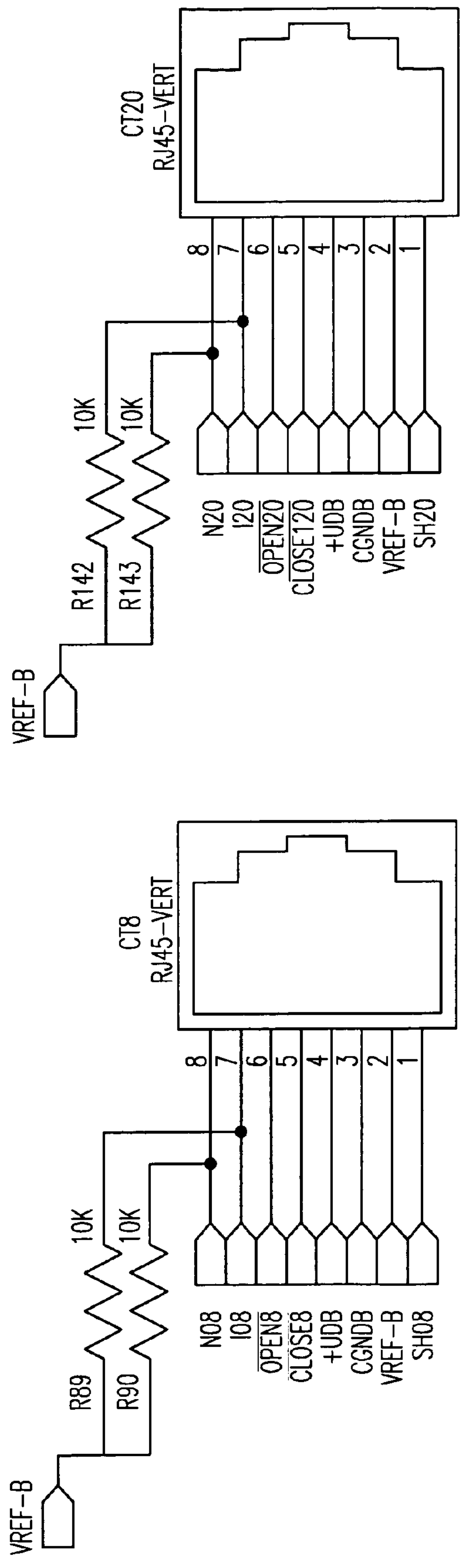
Figures 7, 9B:
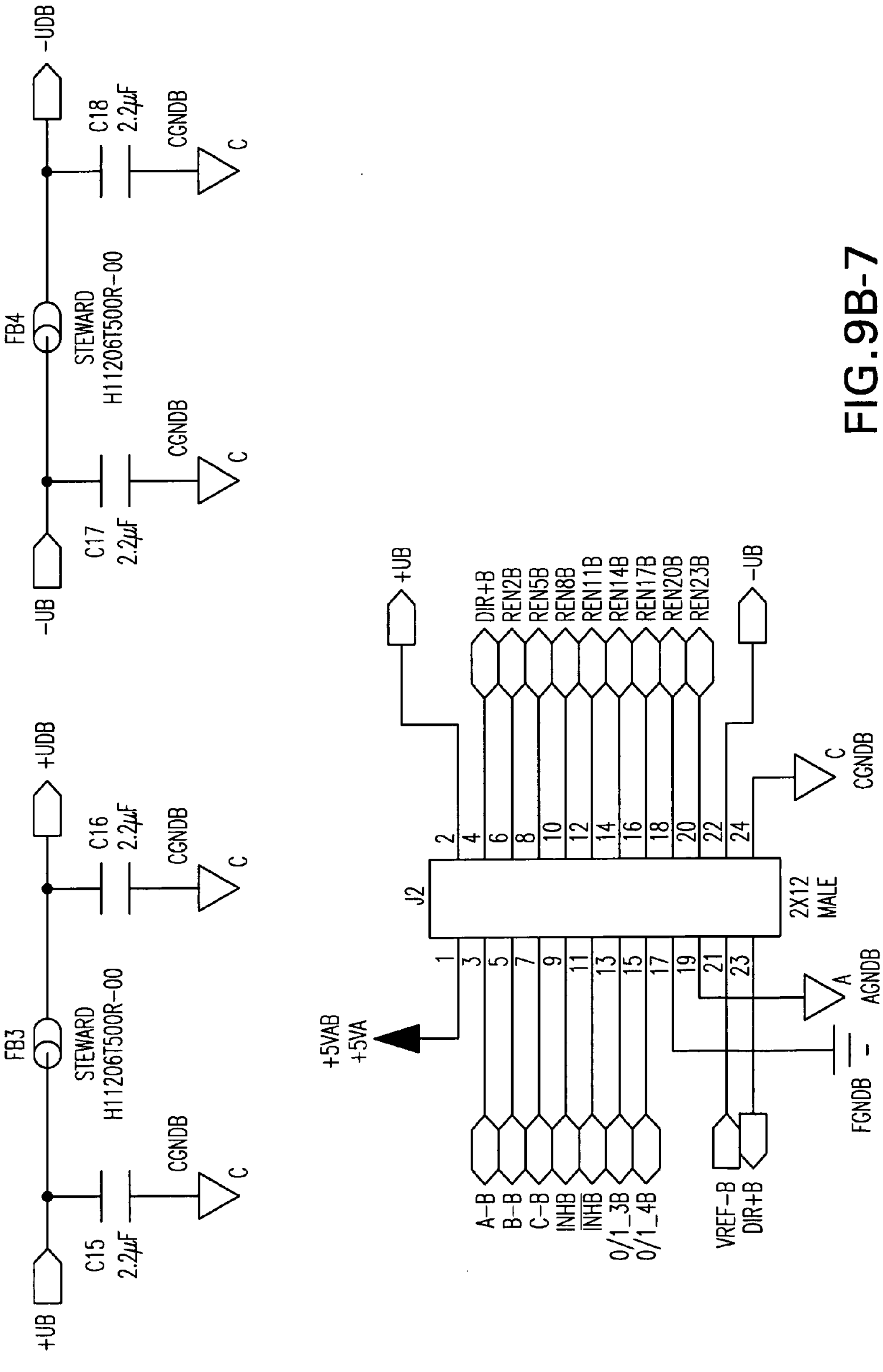
Figures 8, 9B:
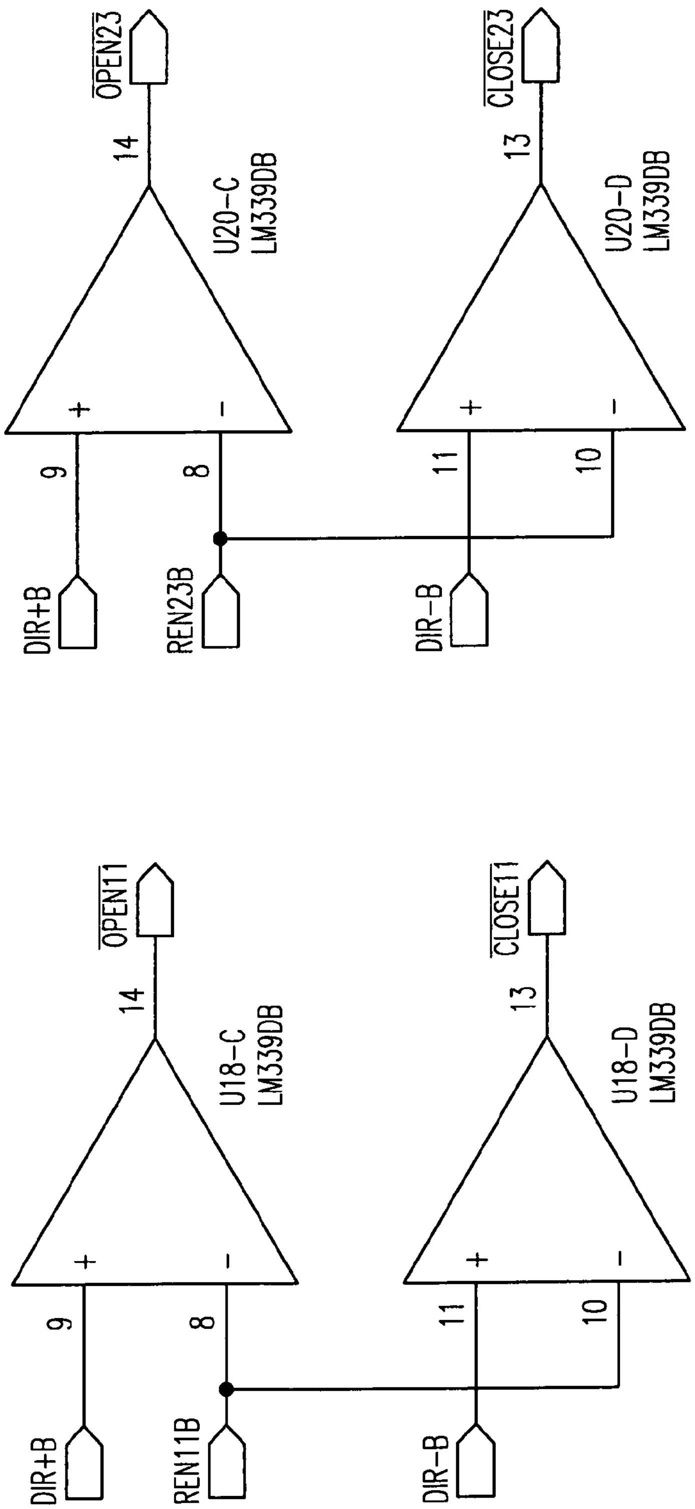
Figures 9, 9B:
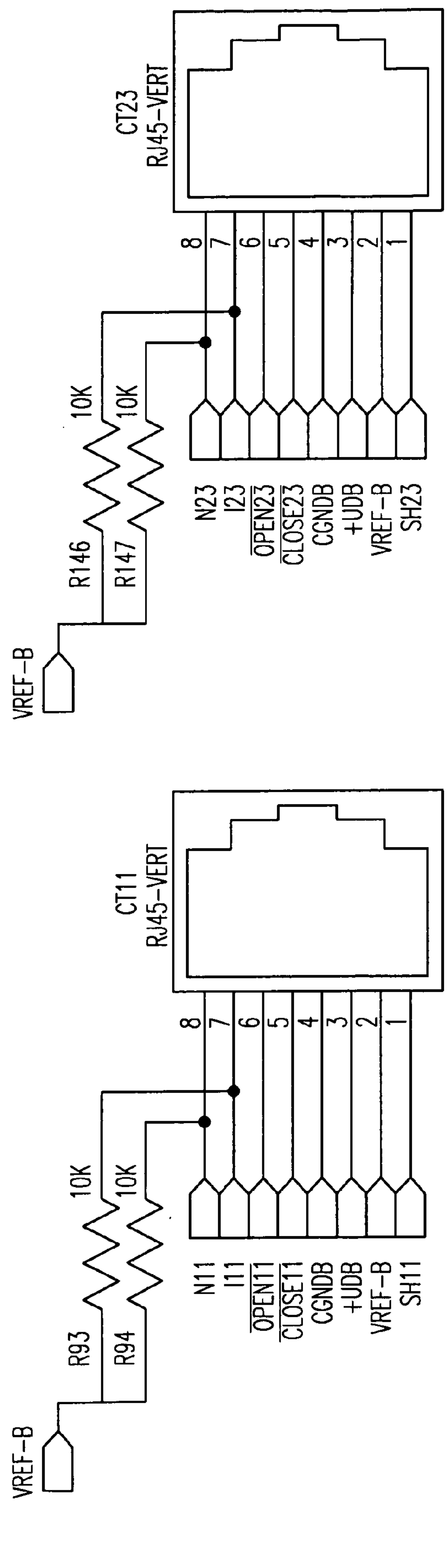
Figure 9C:
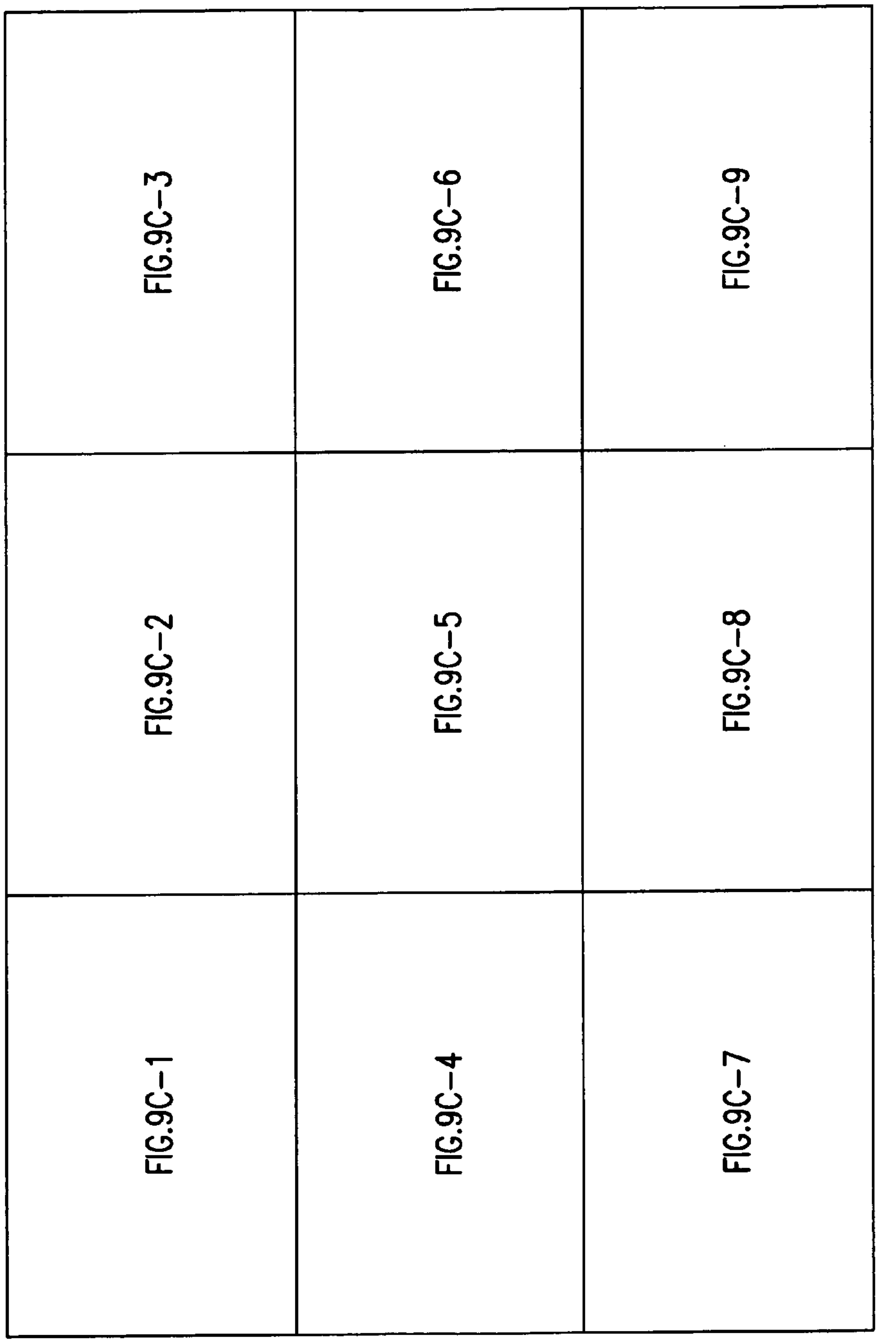
Figures 1, 9C:
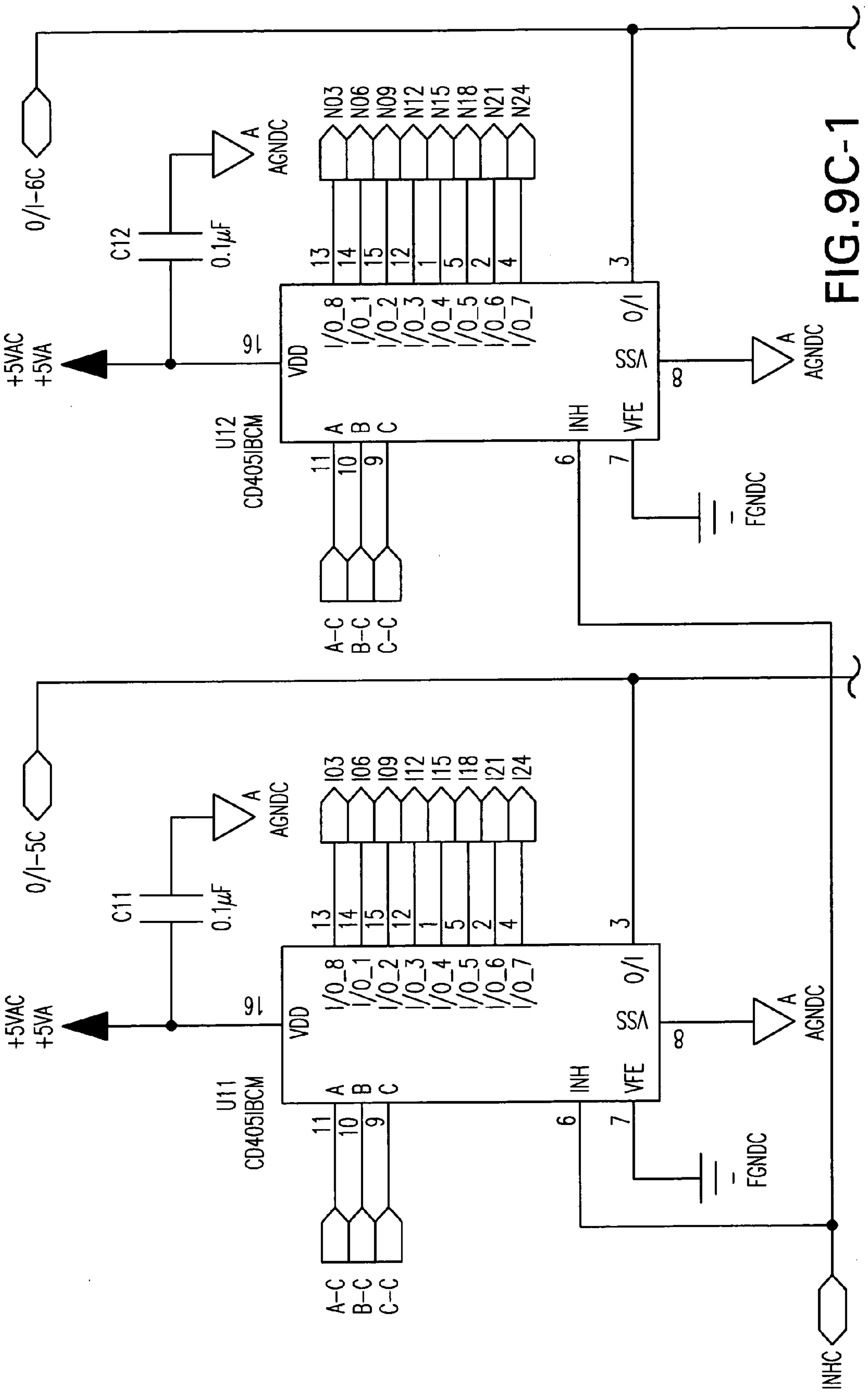
Figures 2, 9C:
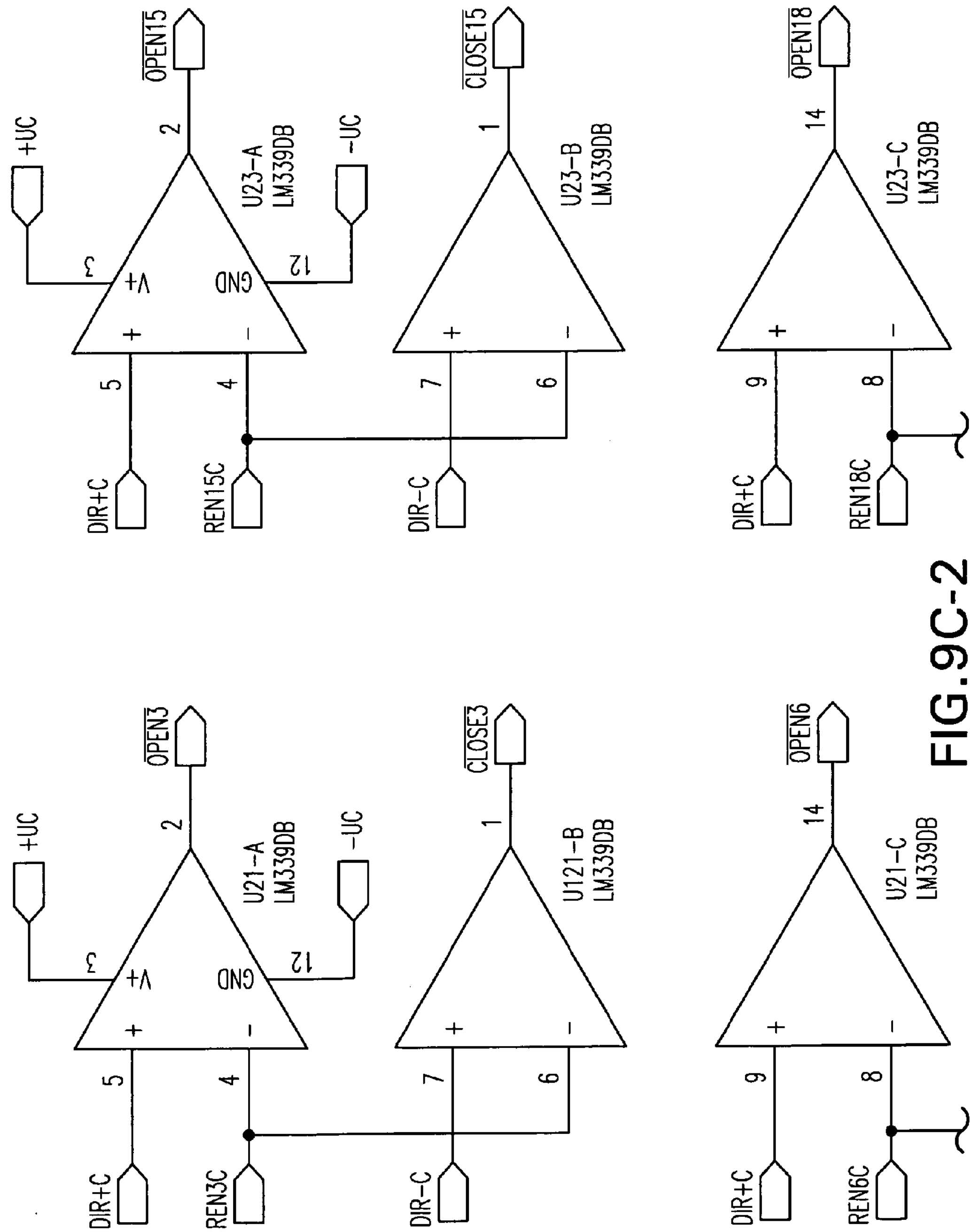
Figures 3, 9C:
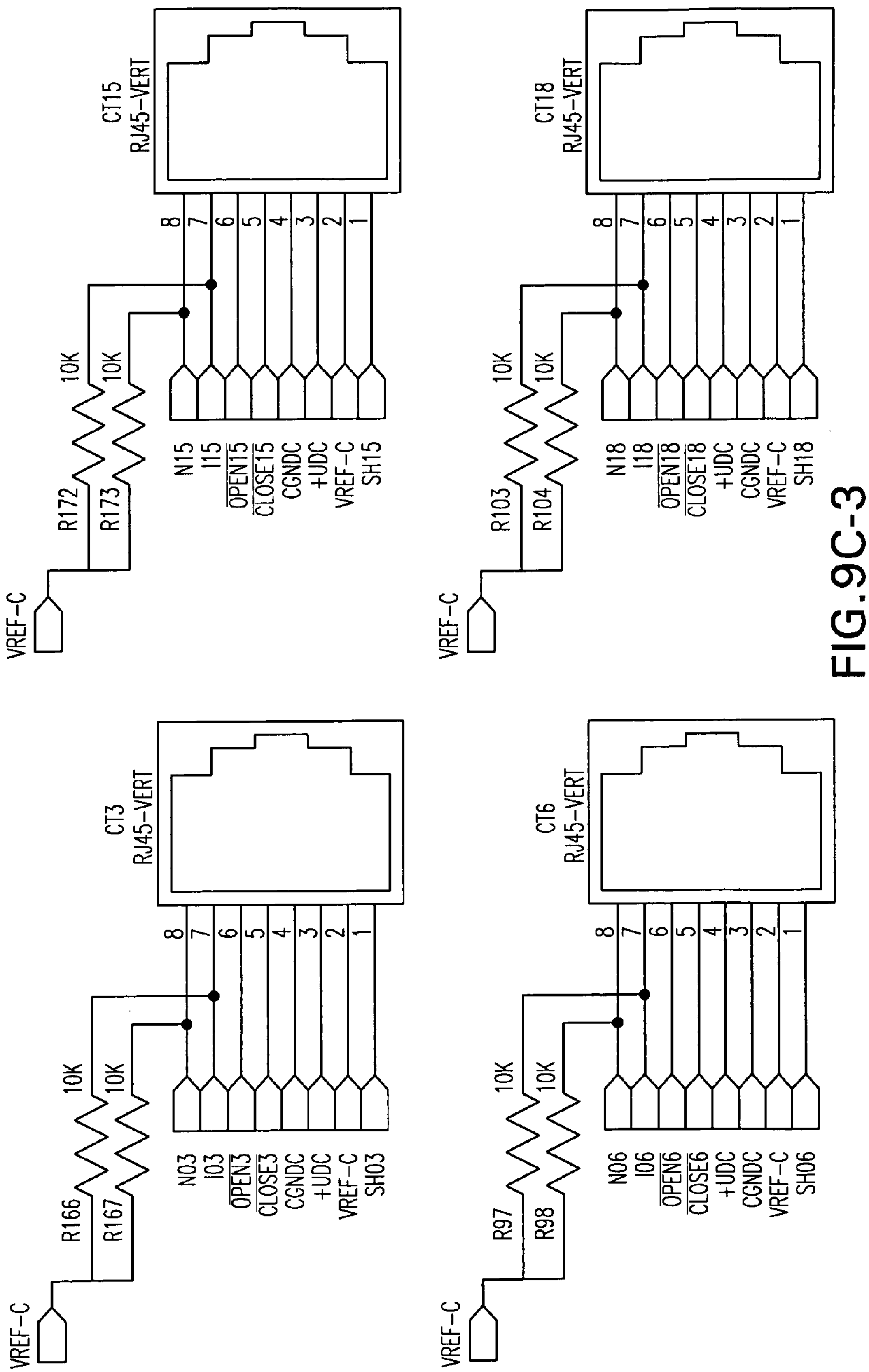
Figures 4, 9C:
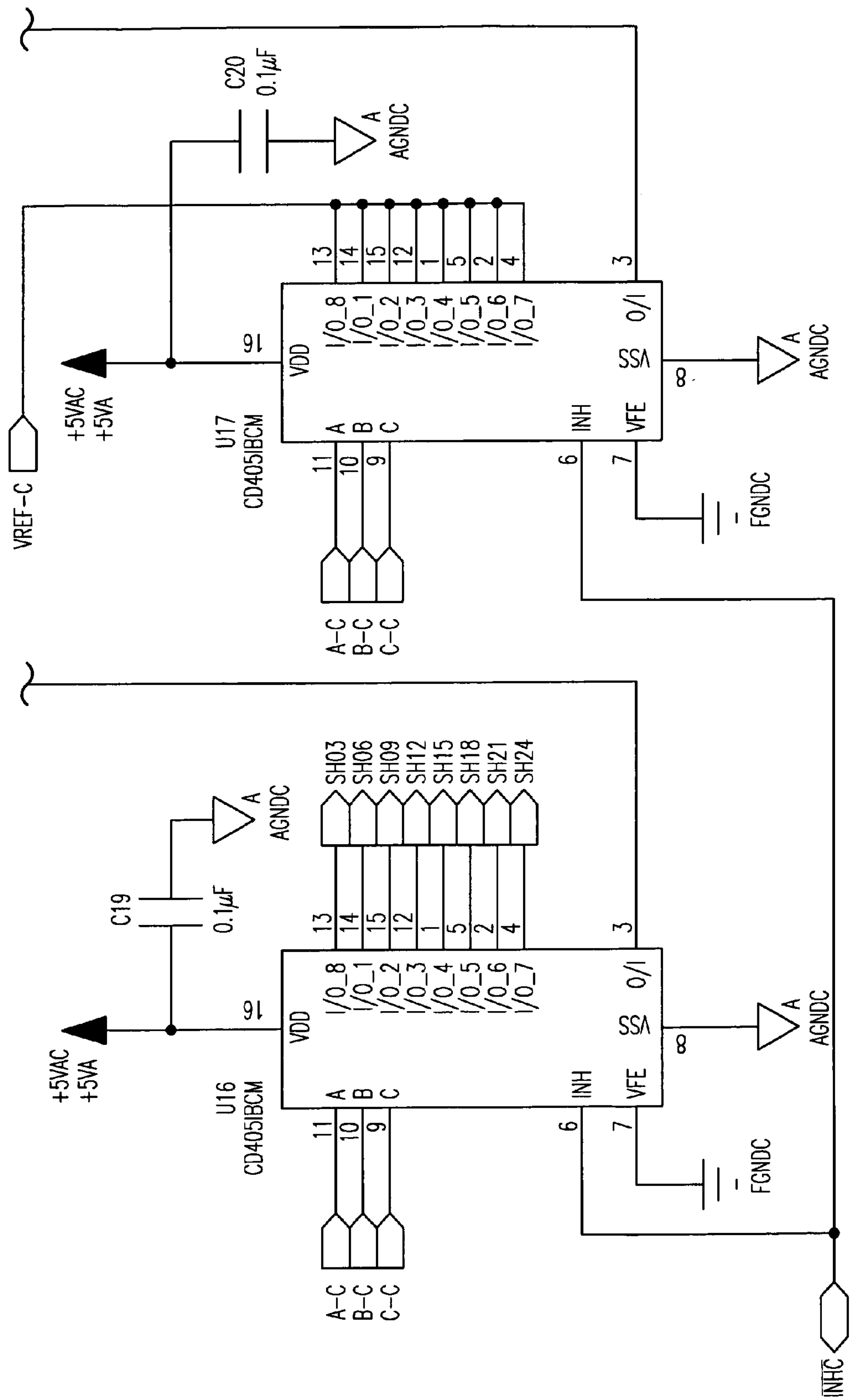
Figures 5, 9C:
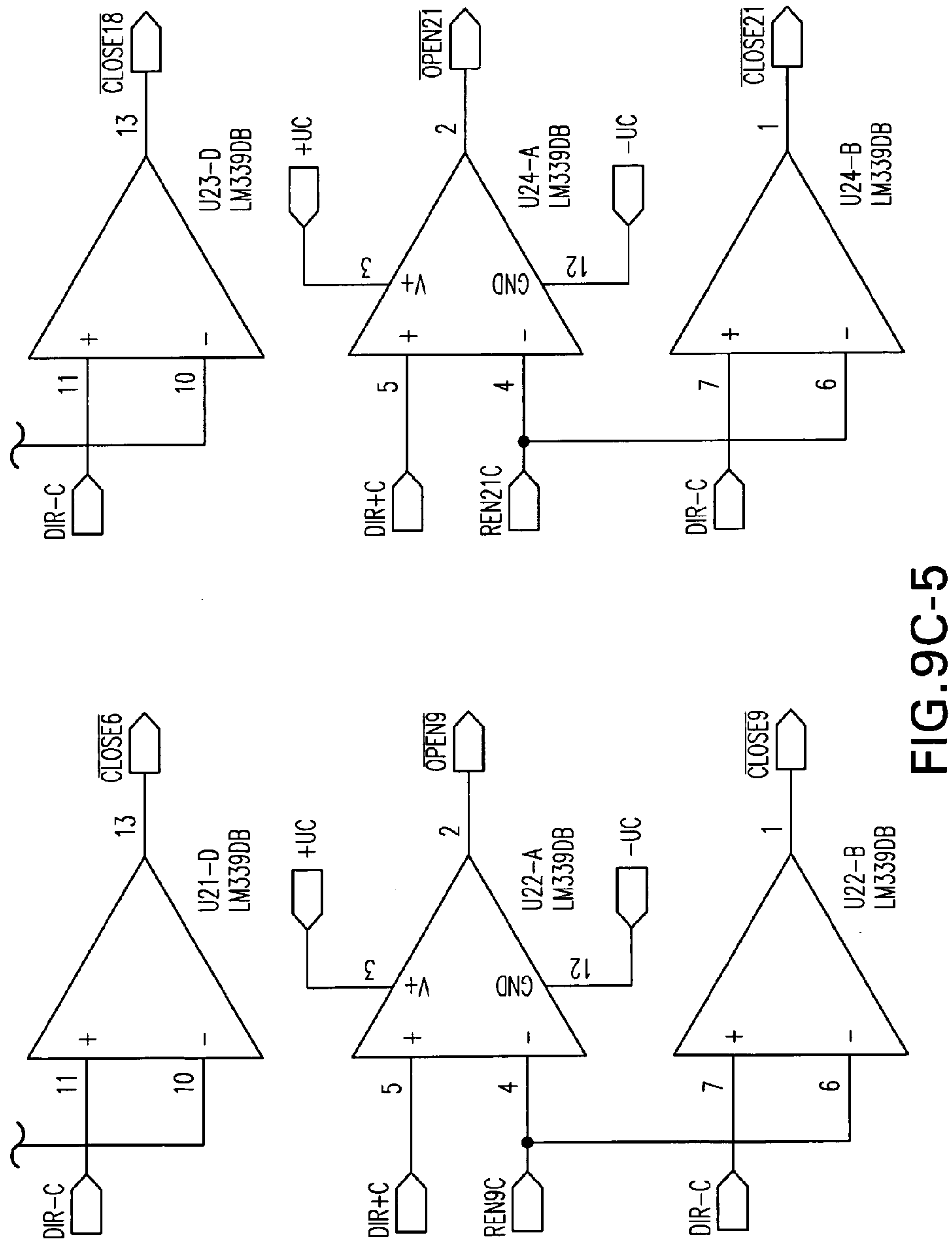
Figures 6, 9C:
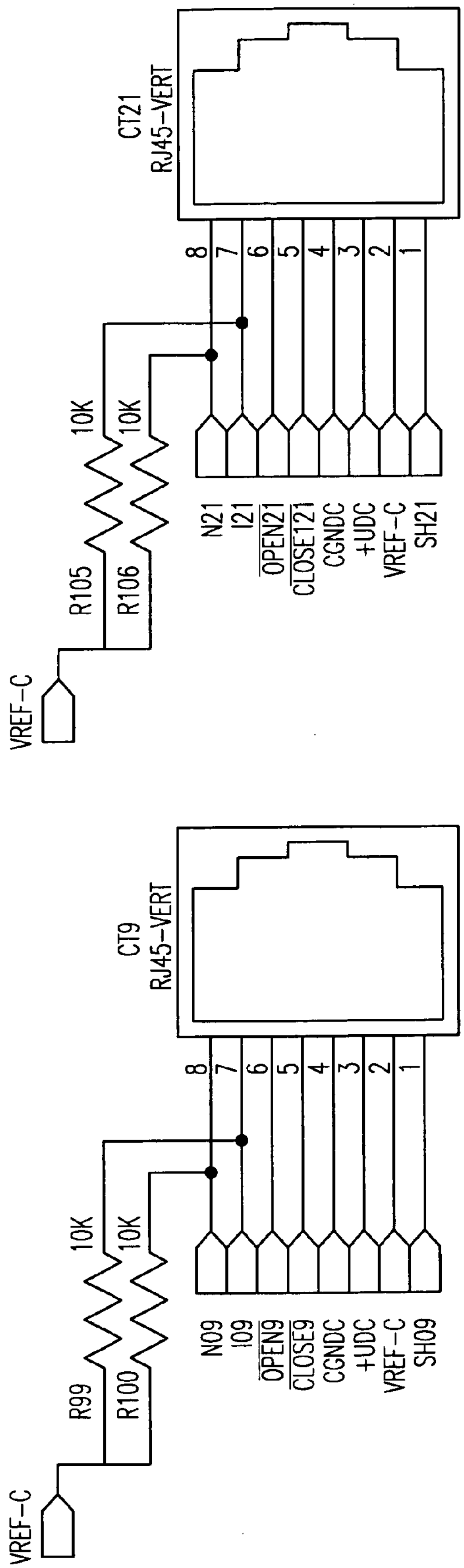
Figures 7, 9C:
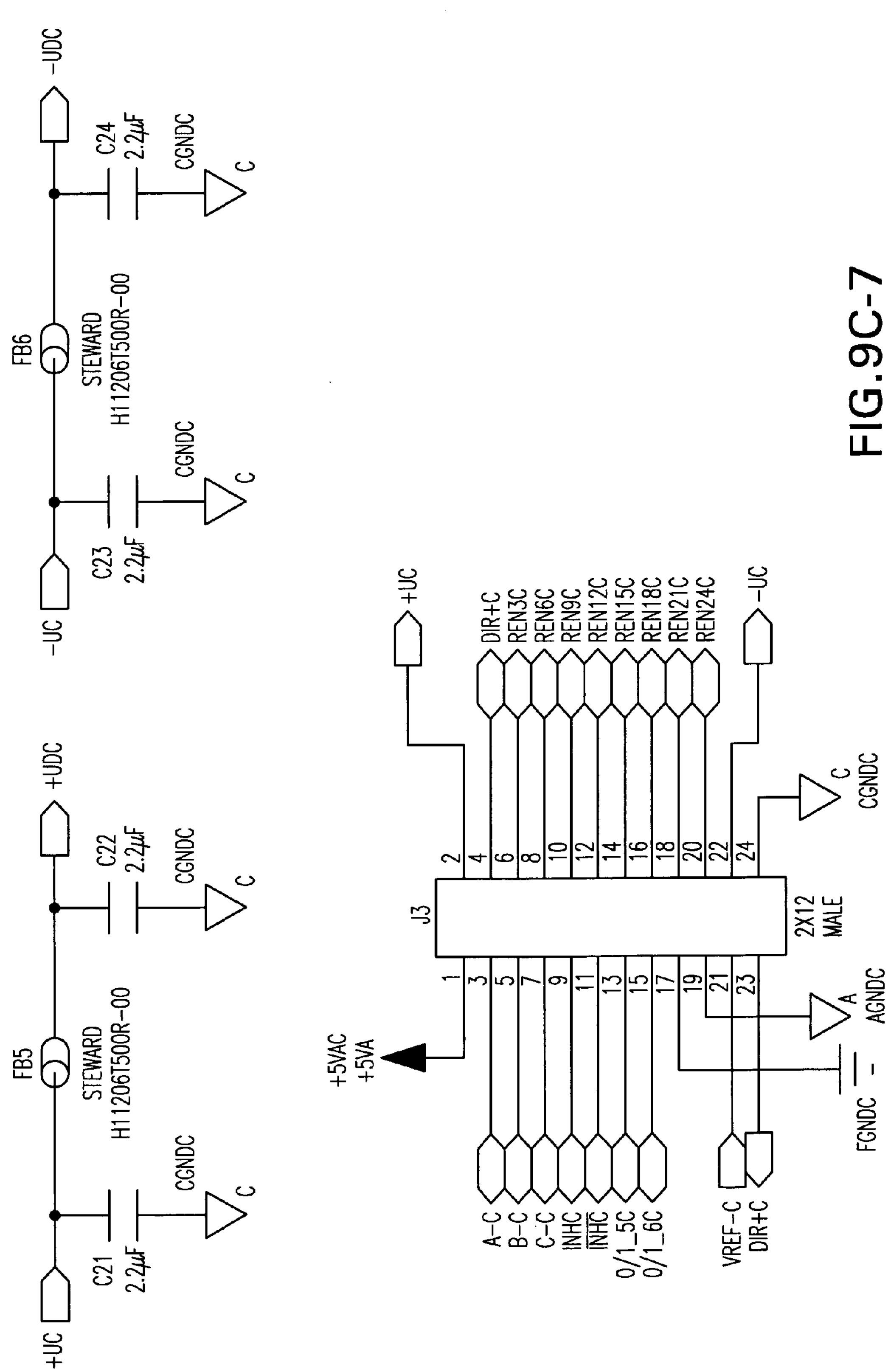
Figures 8, 9C:
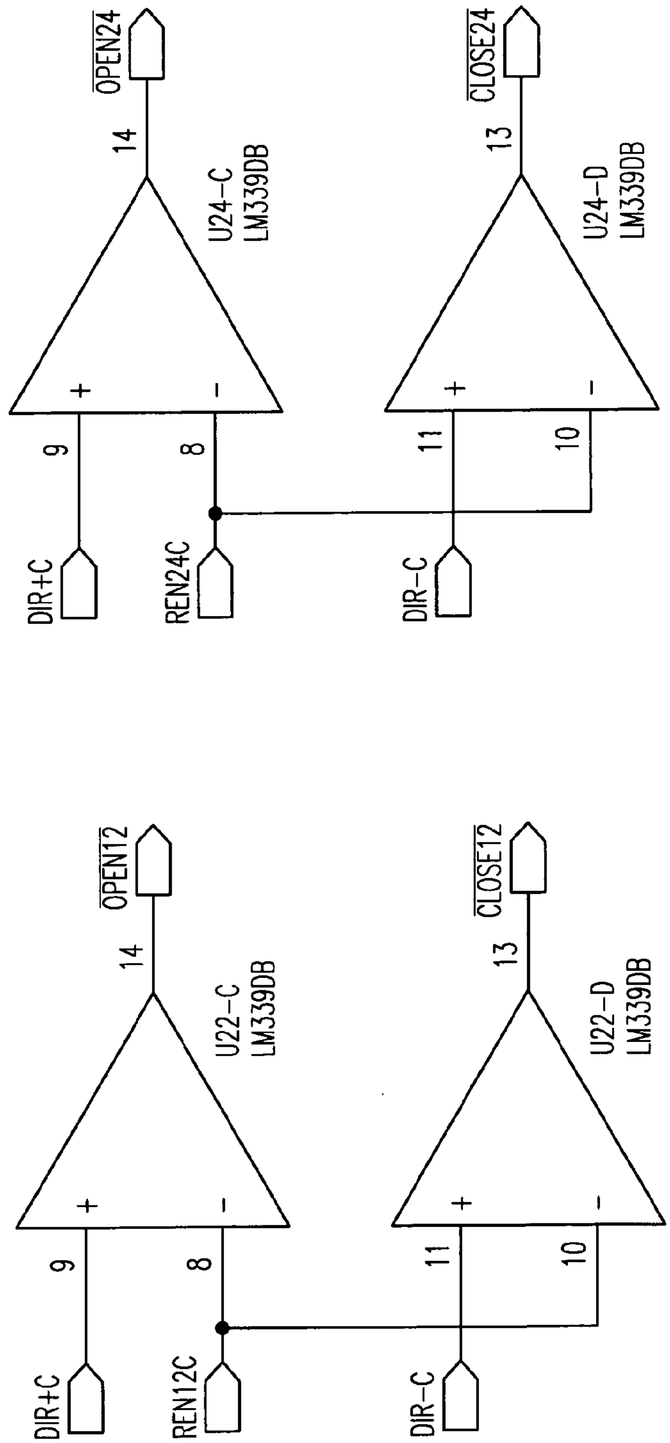
Figures 9, 9C:
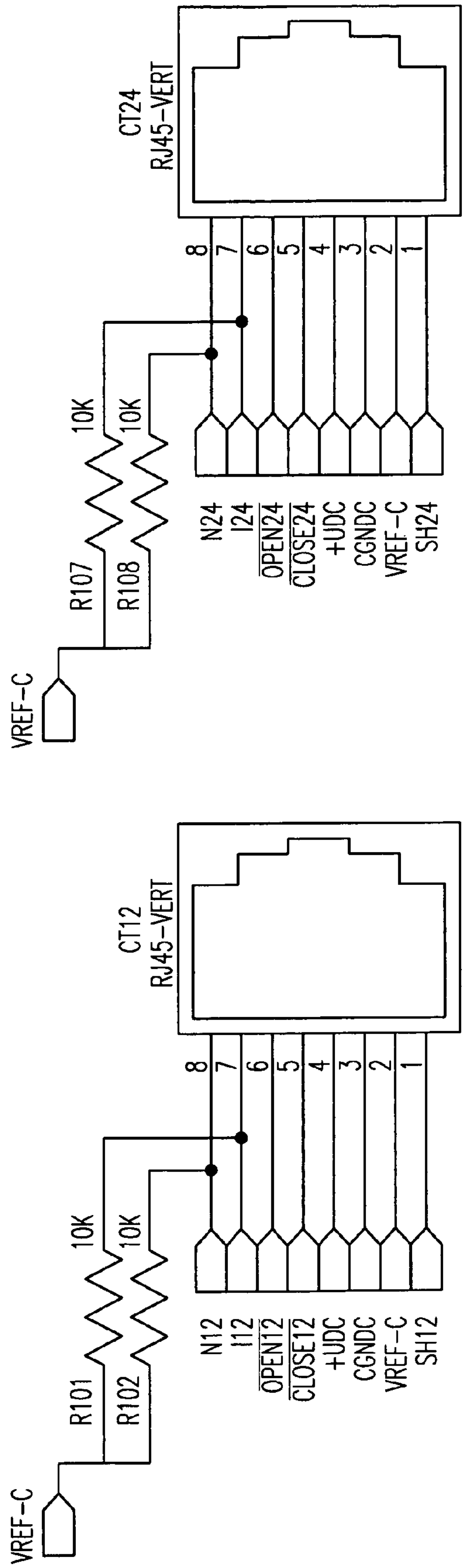
Figure 10:
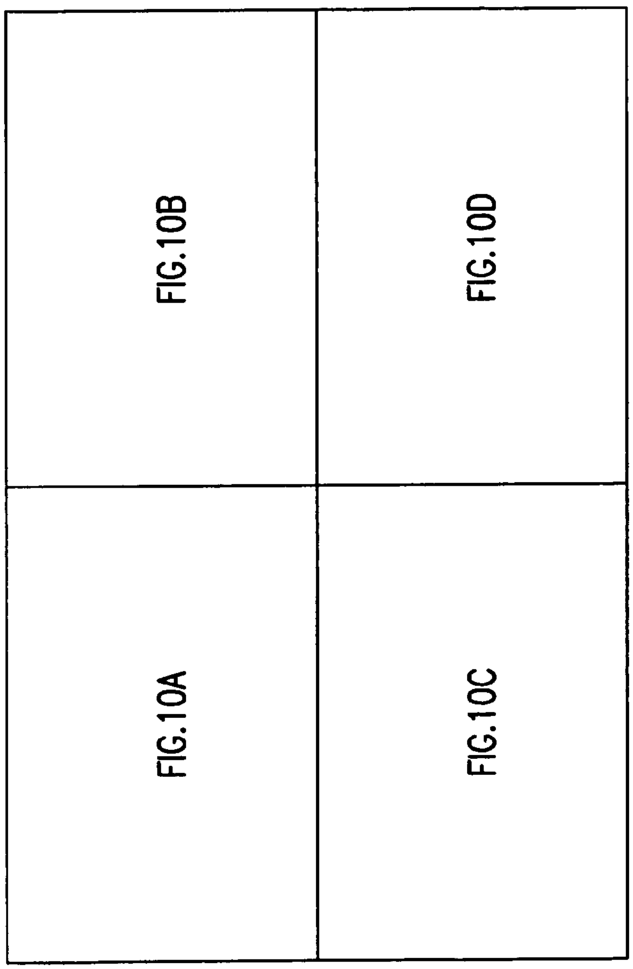
FIGS. 10A-D illustrate a schematic diagram for a control circuitry board operable to provide relay control.
Figure 10A:
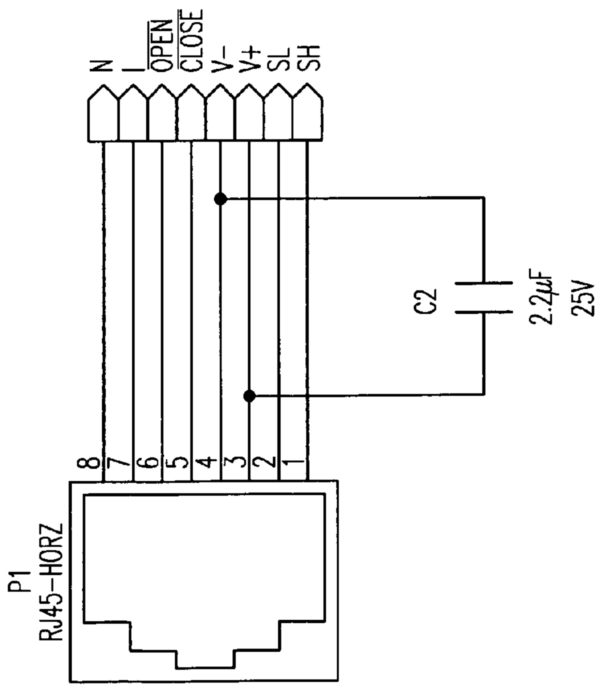
Figure 10B:
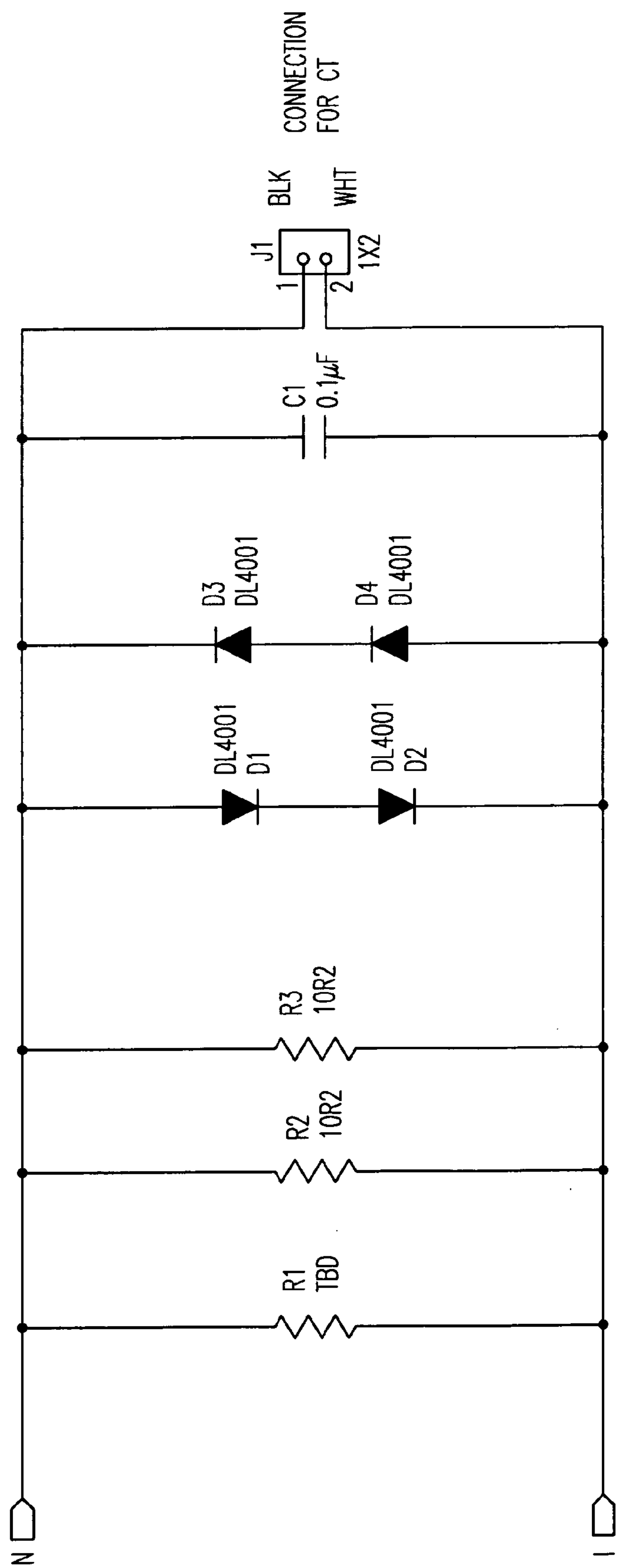
Figure 10C:
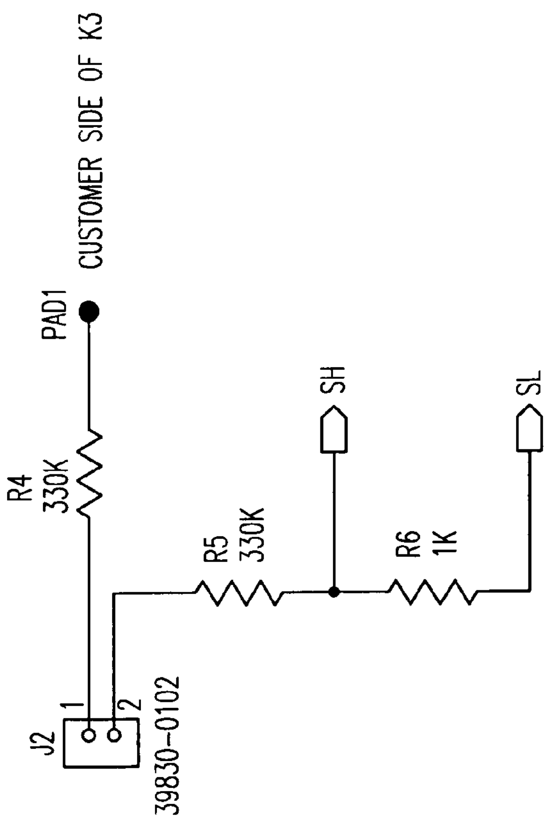
Figure 10D:
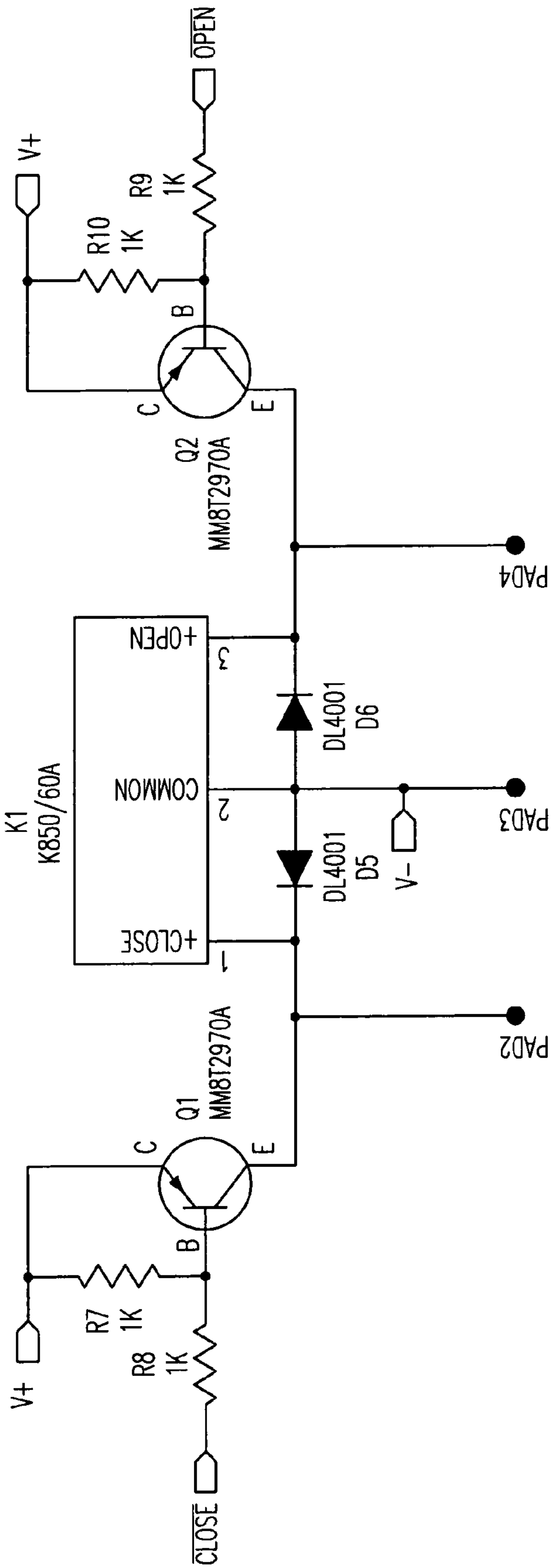
Figure 11:
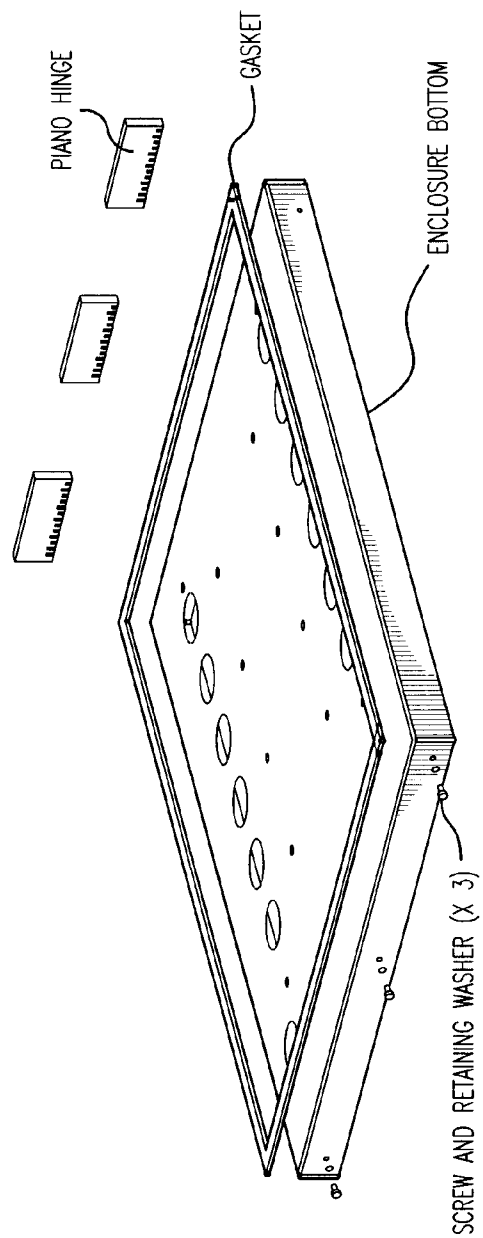

The EG base comprises an enclosure bottom with screws and retaining washers as a locking mechanism for the top cover of EG, which is connected on one side by piano hinges. See FIG. 11. The enclosure bottom provides routing for the customer cables.

EG Assembly—Phase Bus Bars

Figure 12:
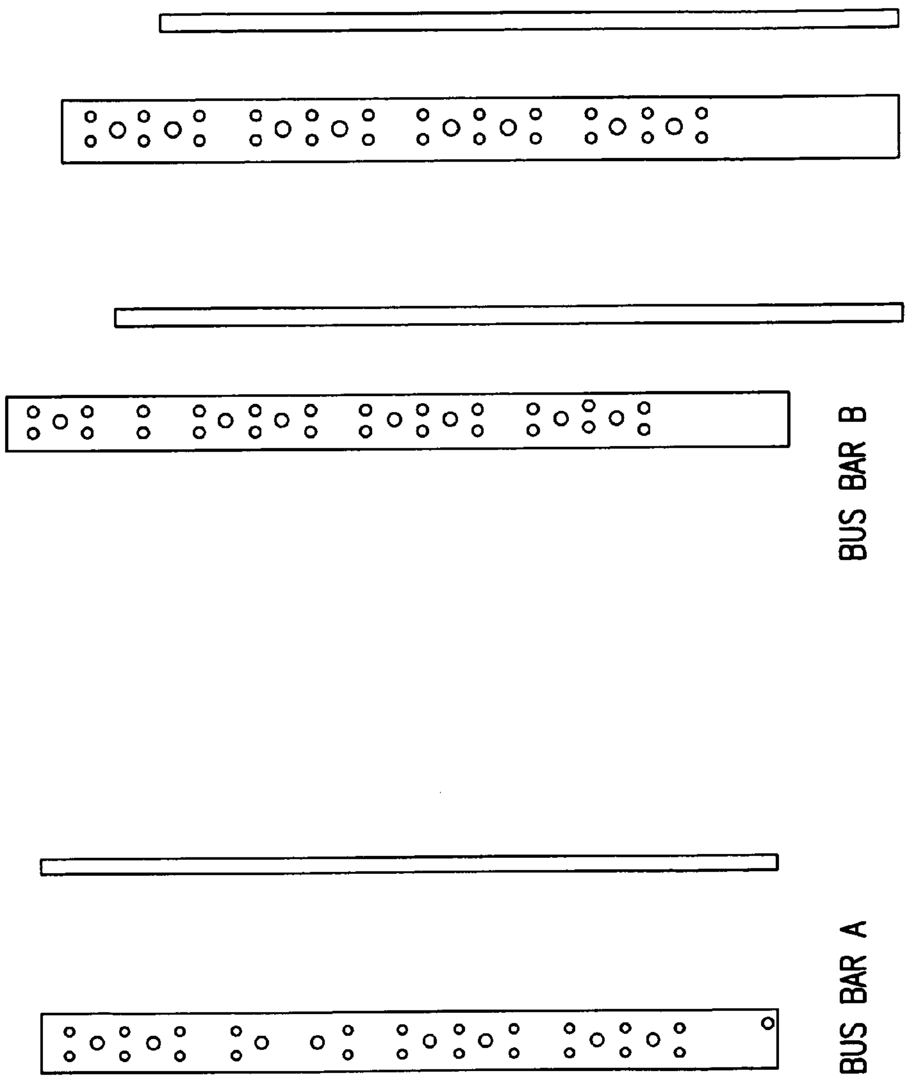
FIGS. 12 and 13 are diagrams of preferred phase bus bars and construction of same.
Figure 13:
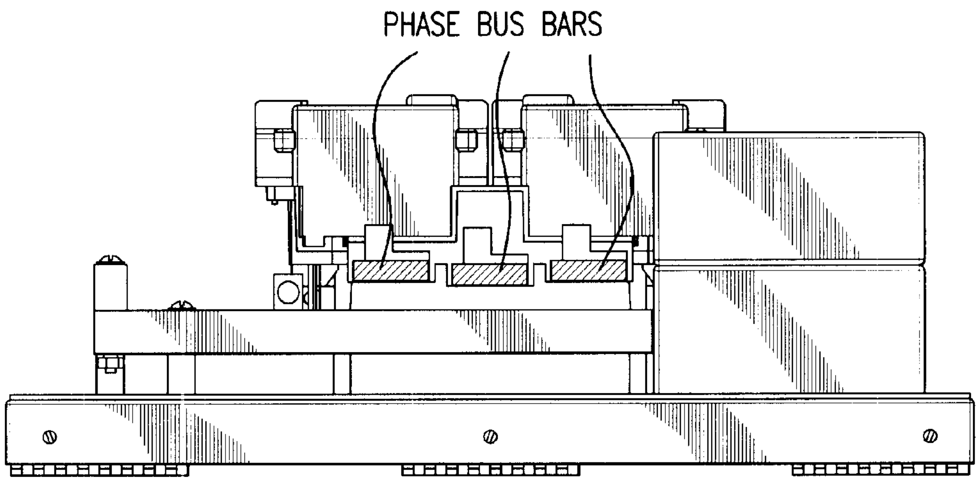

Three aluminum phase bus bars are placed towards the center of the Energy Guard assembly and staggered. See FIGS. 12 and 13. These provide connection to the customer metering modules by the use of transition bars. A staggered bus bar layout is depicted in FIG. 13. Bus bars are shown in black.

Neutral Bars

Figure 14:
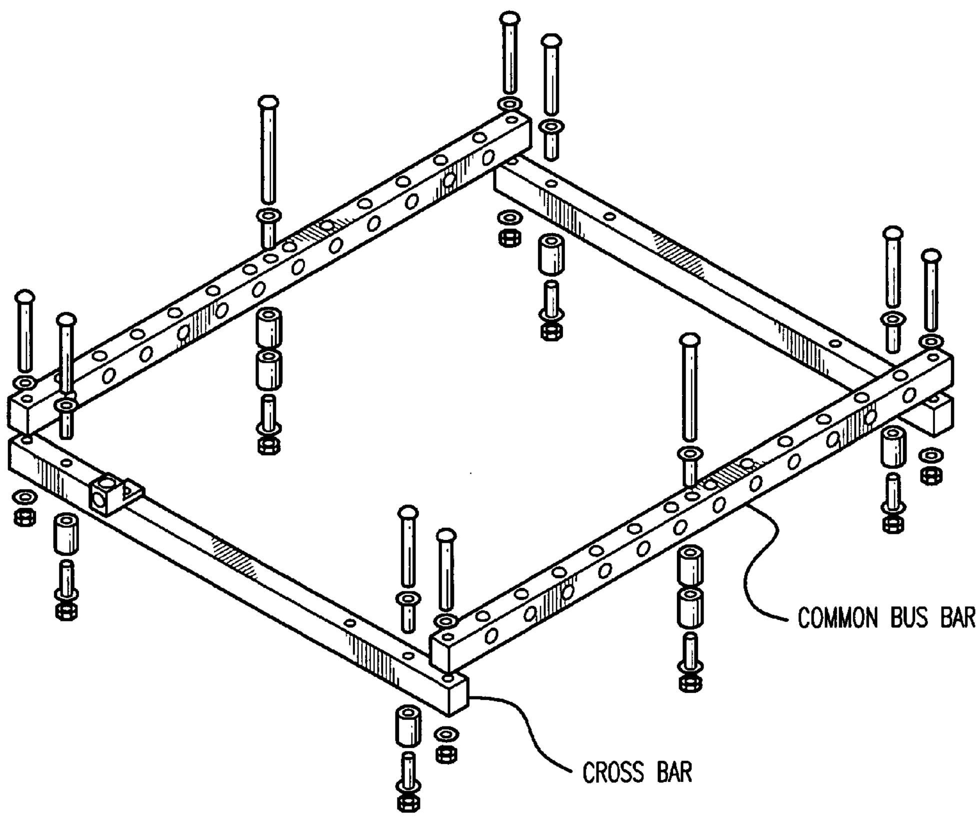
FIG. 14 is a diagram depicting preferred neutral bar frame construction and assembly.

The EG preferably comprises 4 neutral bars that form a frame for EG assembly, thereby providing a path for the neutral current. This is shown in FIG. 14. The lug on the cross bar provides the neutral feed from the utility distribution transformer. Also, there are 2 mother board neutral bars that carry the neutral current to the control module.

Transition Bars

Figure 15A:
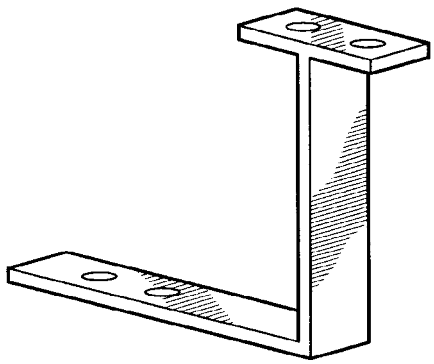
FIGS. 15A-B depict preferred transition bars.
Figure 15B:
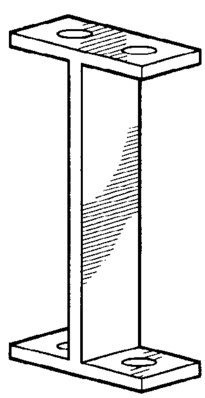
Figure 16:
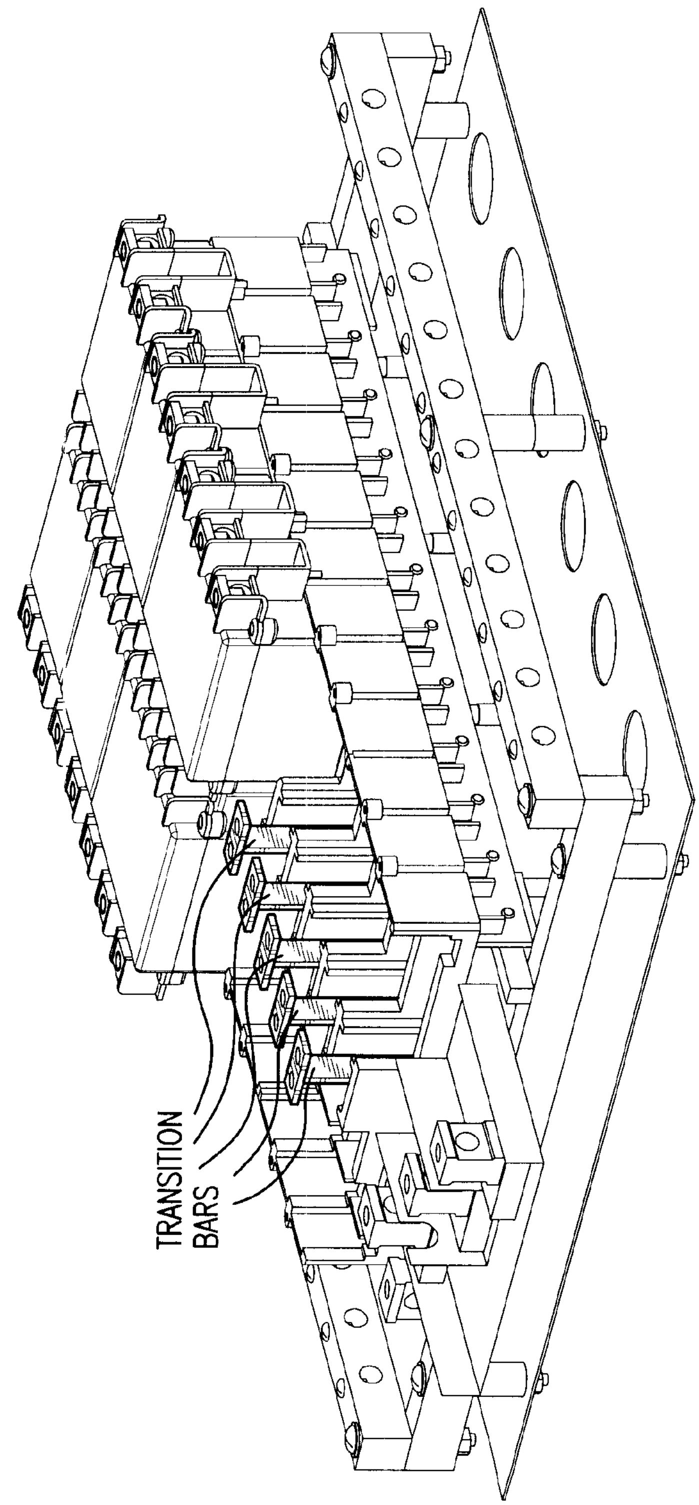
FIG. 16 depicts preferred placement of transition bars.

The transition bars complete the mechanical and electrical connection between the customer metering modules and the phase bus bars. See FIG. 15. A transition bar for phase A and C is shown in FIG. 15A; a transition bar for phase B is shown in FIG. 15B. FIG. 16 shows the transition bars in black.

Acceptor Module

Figure 17:
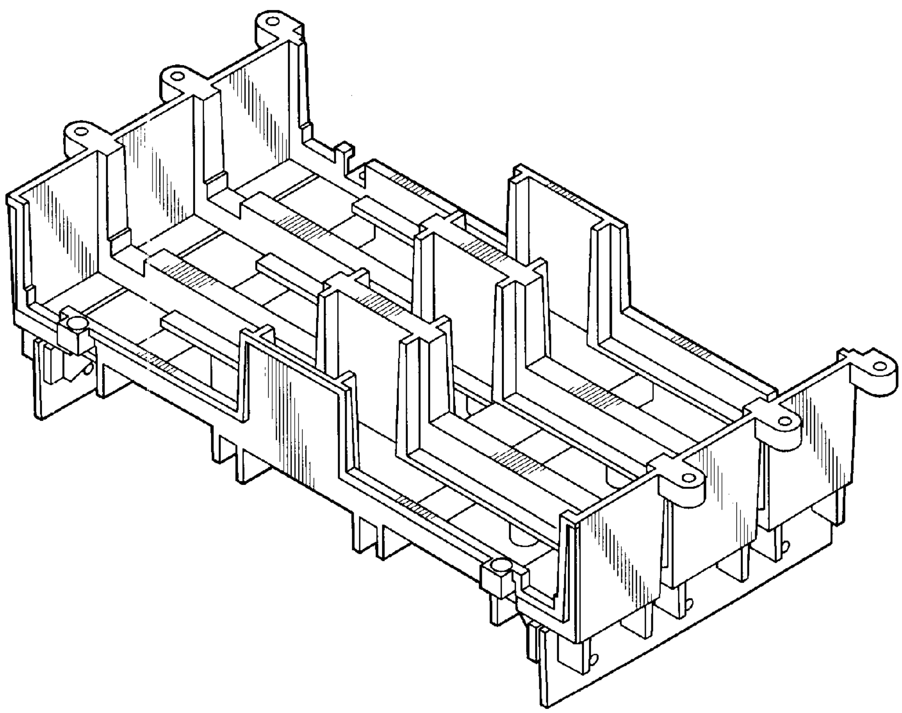
FIGS. 17 and 18A-B depict preferred acceptor module construction.
Figure 18A:
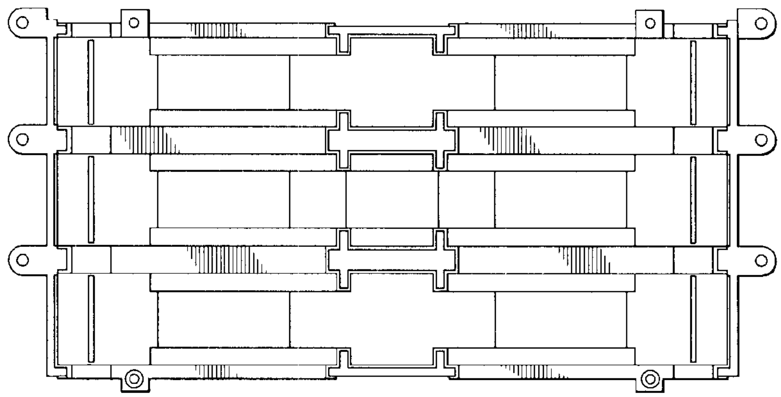
Figure 18B:
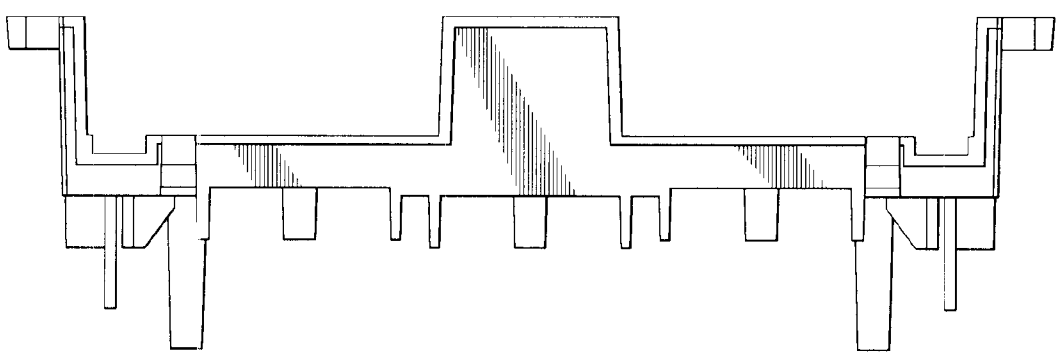

An acceptor module preferably is made of plastic and mechanically accepts the metering modules that can be easily fitted in the EG assembly. Each EG has 4 acceptor modules that are stacked together and can accommodate either 12 two-phase or 8 three-phase metering modules. See FIG. 17. The acceptor module also provides a mechanical route for the motherboard neutral bar which connects to the control module. See FIG. 18.

Customer Metering Modules

Figure 19:
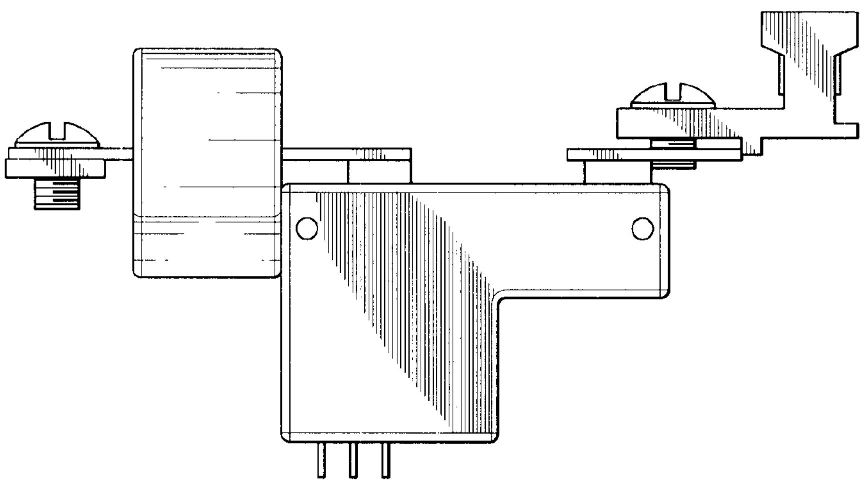
FIG. 19 depicts a preferred integrated current sensing and relay module.
Figure 20:
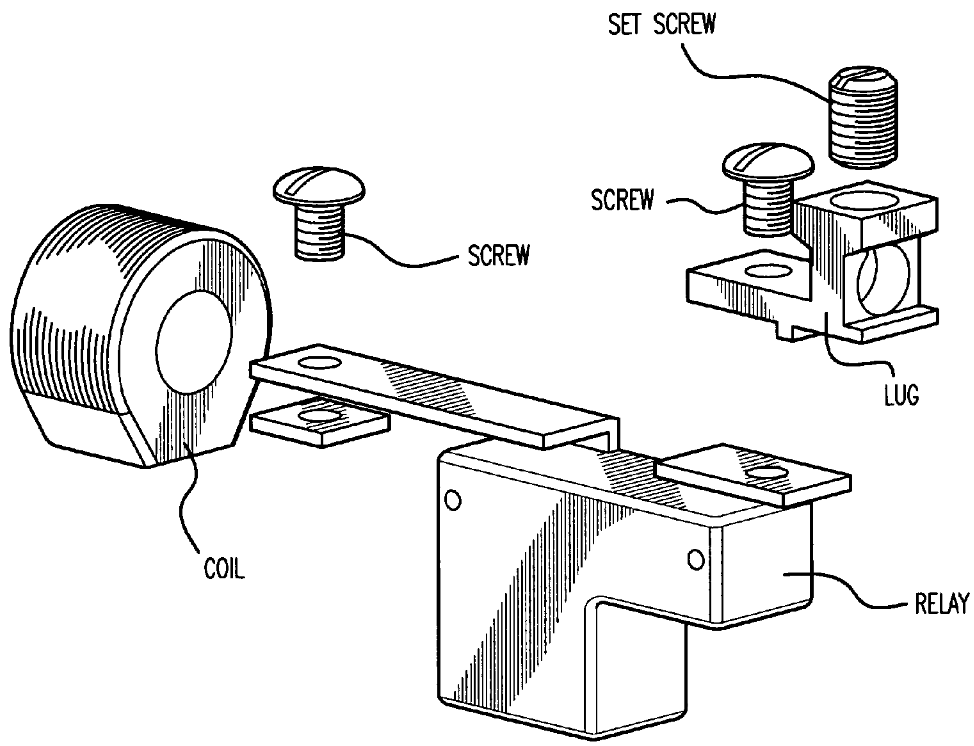
FIG. 20 depicts an exploded view of a preferred integrated current sensing and relay module.
Figure 21A:
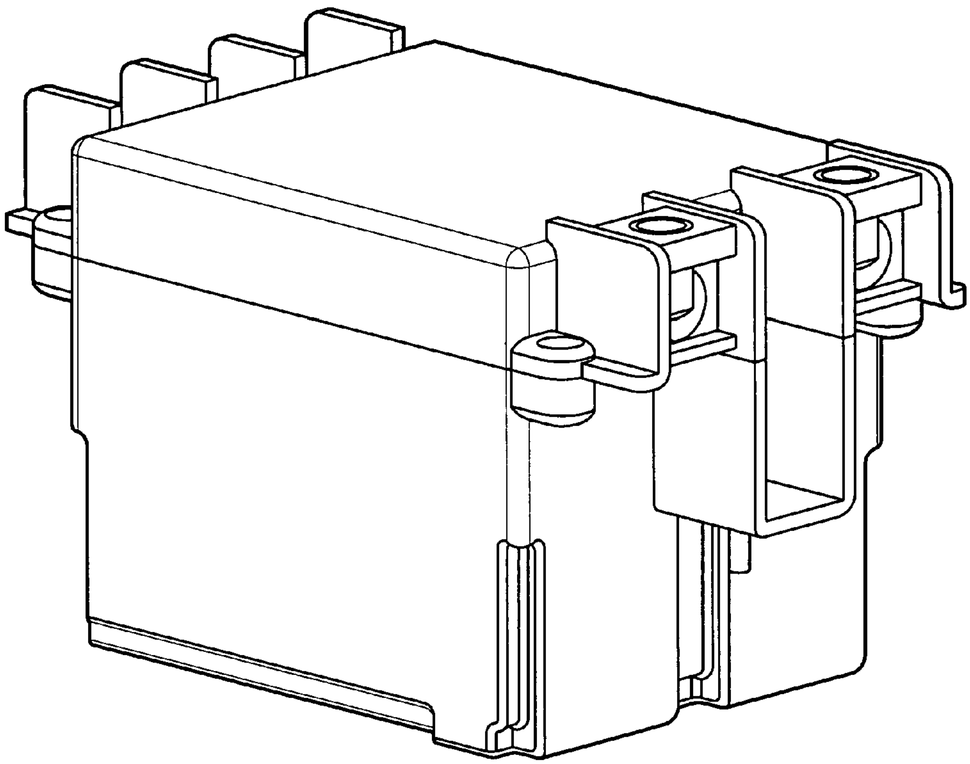
FIGS. 21A-D illustrate exploded views of preferred metering modules.
Figure 21B:
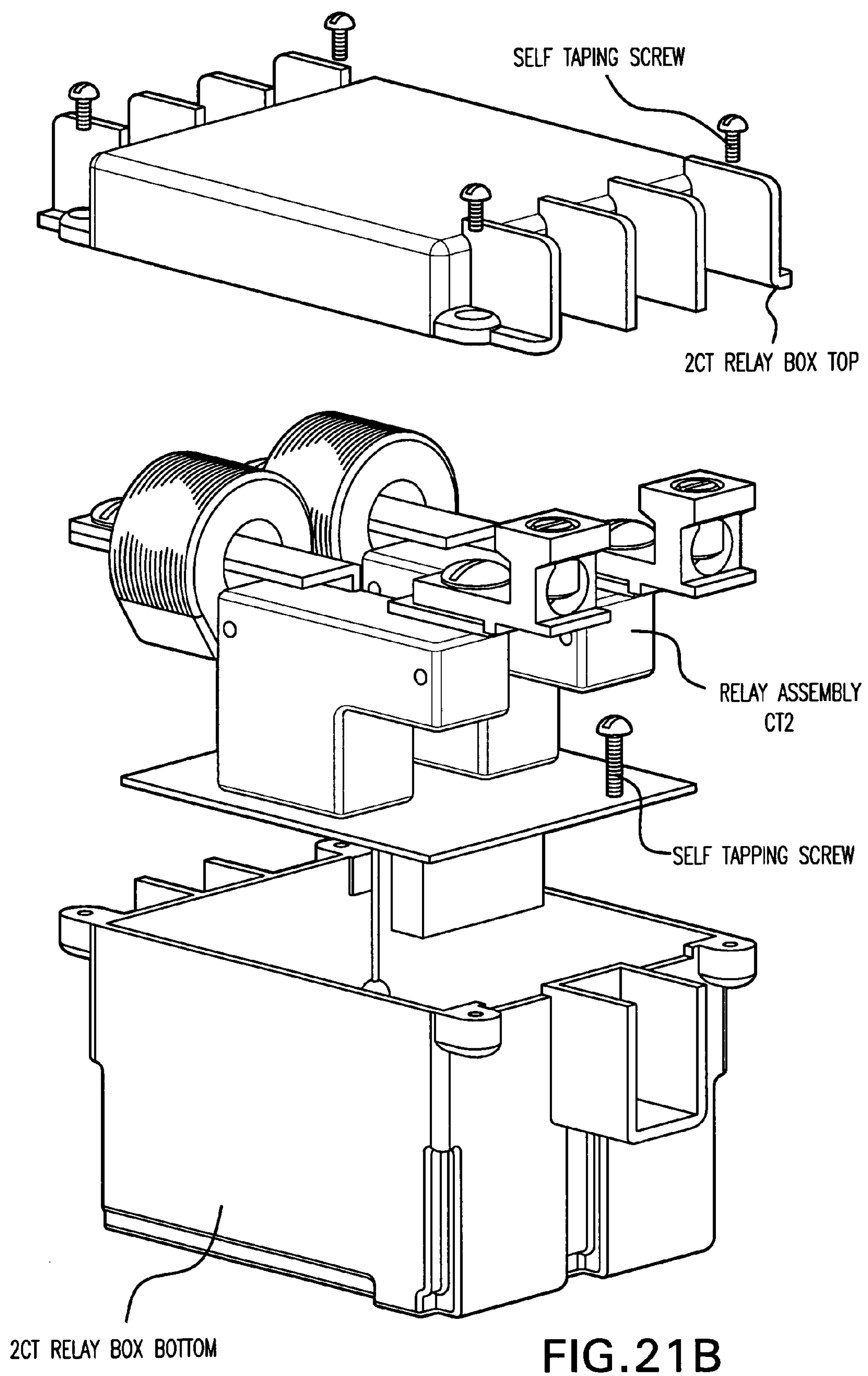
Figure 21C:
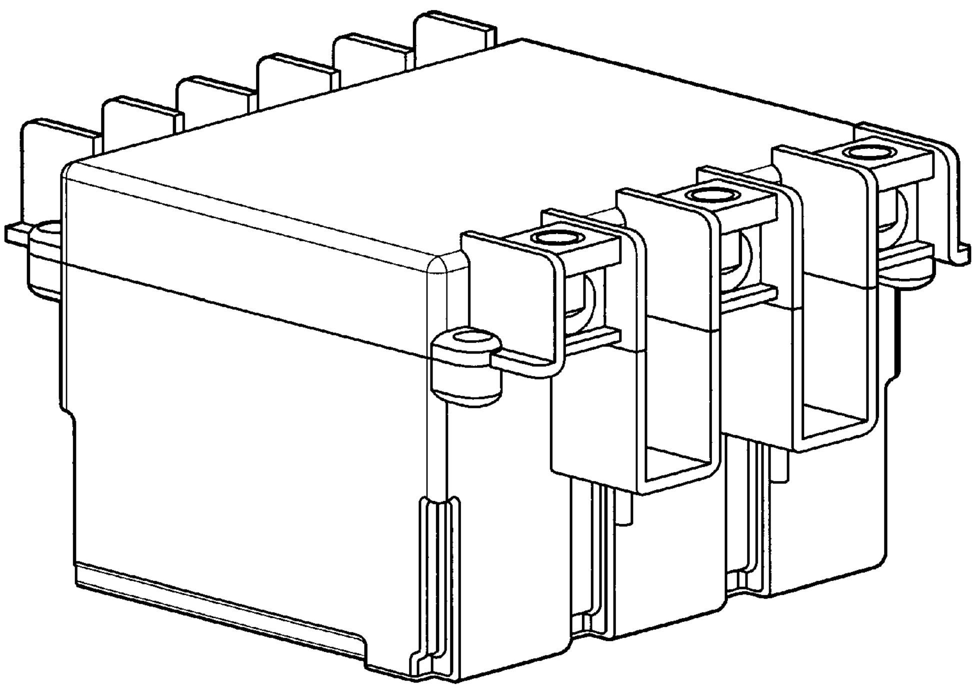
Figure 21D:
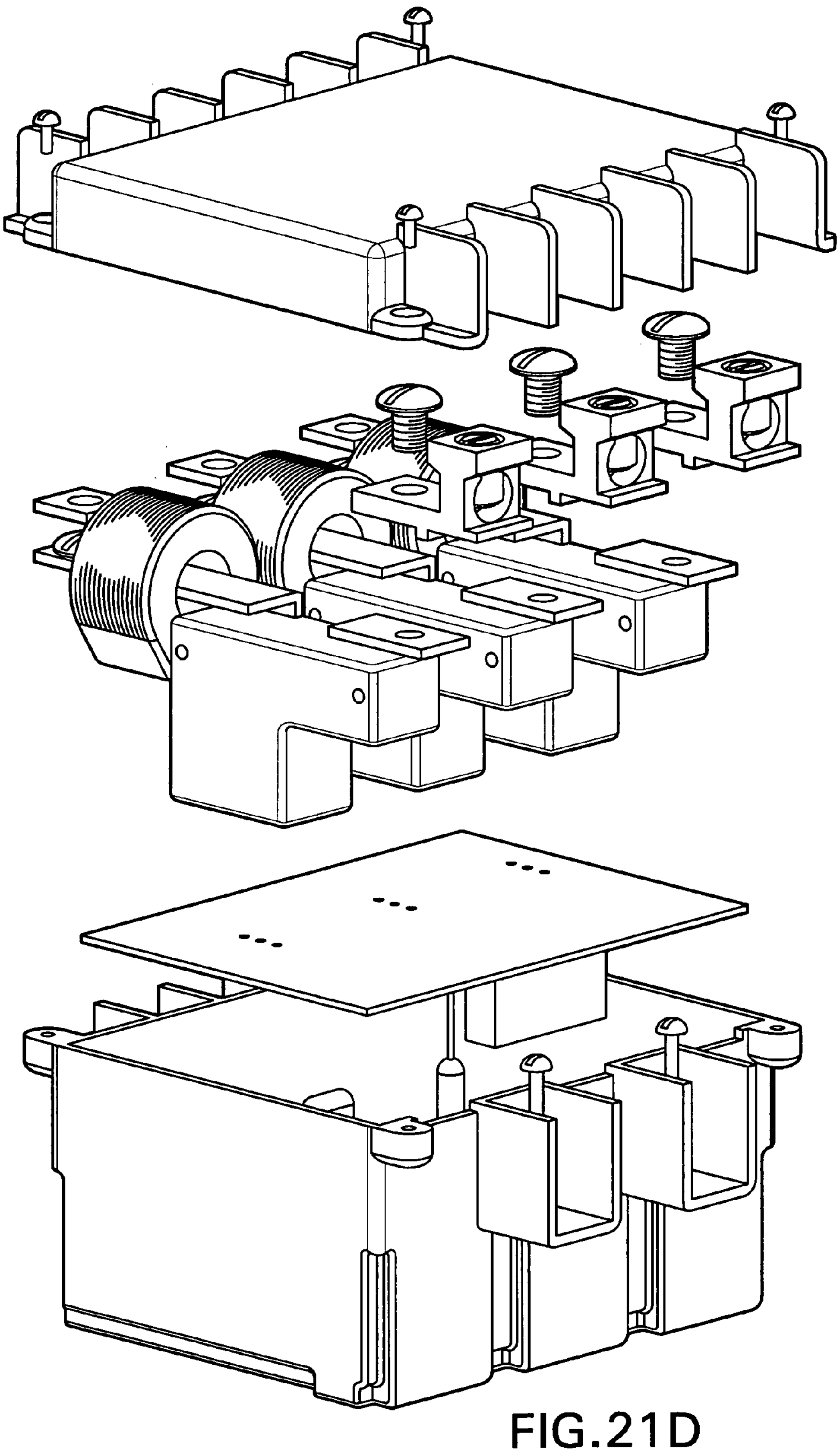

Preferred customer metering modules provide metrology required to measure the consumption for a single phase, two phase, or three phase customer. An individual module functions as a complete stand-alone meter that can be tested and evaluated as a separate metering unit. Each module preferably comprises an integrated current sensing and relay module and metrology electronics, and provides a connection between the customer circuit and the phase bus bars. FIG. 19 depicts a preferred integrated current sensing and relay module. FIG. 20 depicts an exploded view of a preferred integrated current sensing and relay module.

Figure 22:
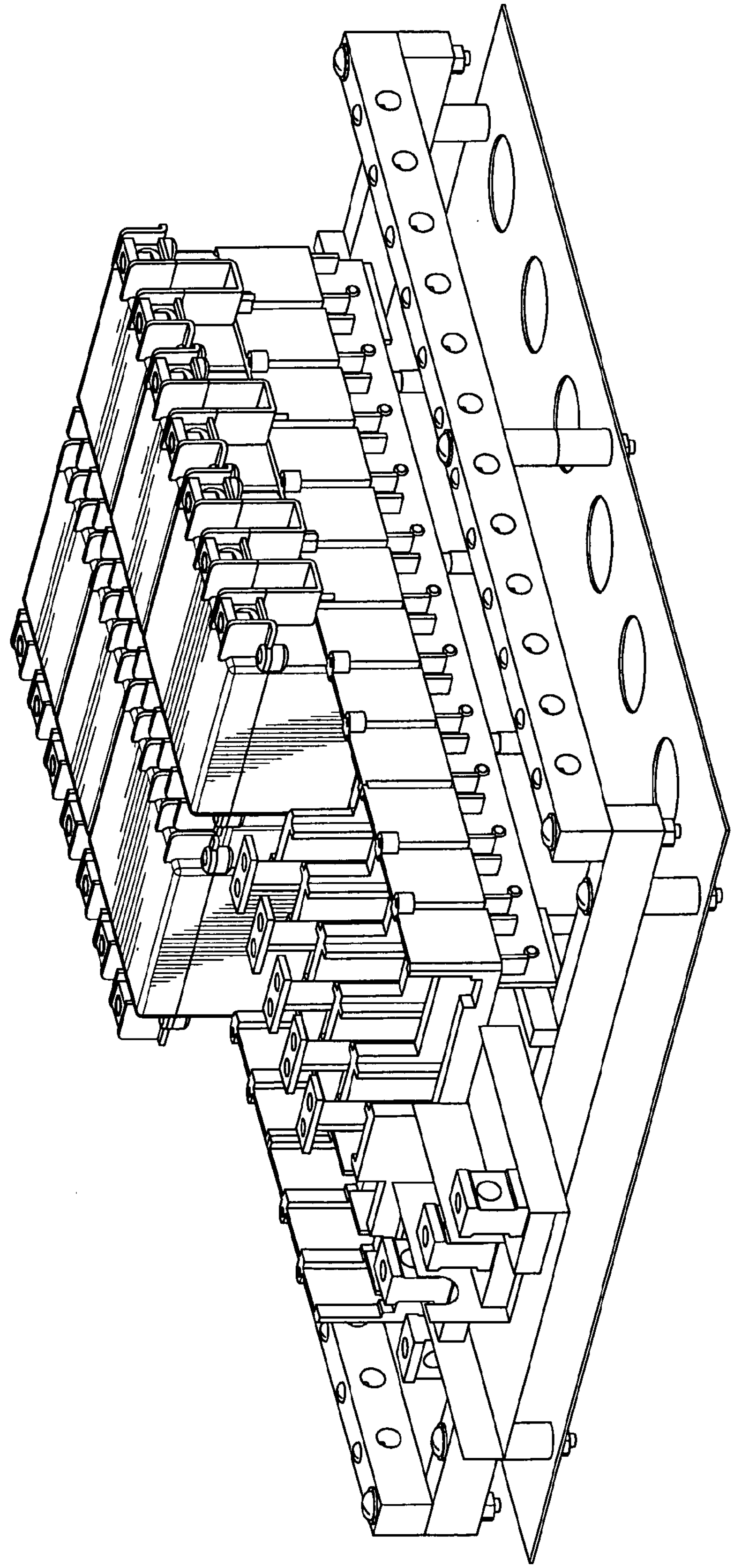
FIG. 22 shows the metering modules placed in an EG frame assembly and acceptor module.

FIG. 21 shows exploded views of preferred metering modules. FIG. 22 shows the metering modules (shown in black) placed in the EG frame assembly and acceptor module.

Figure 23:
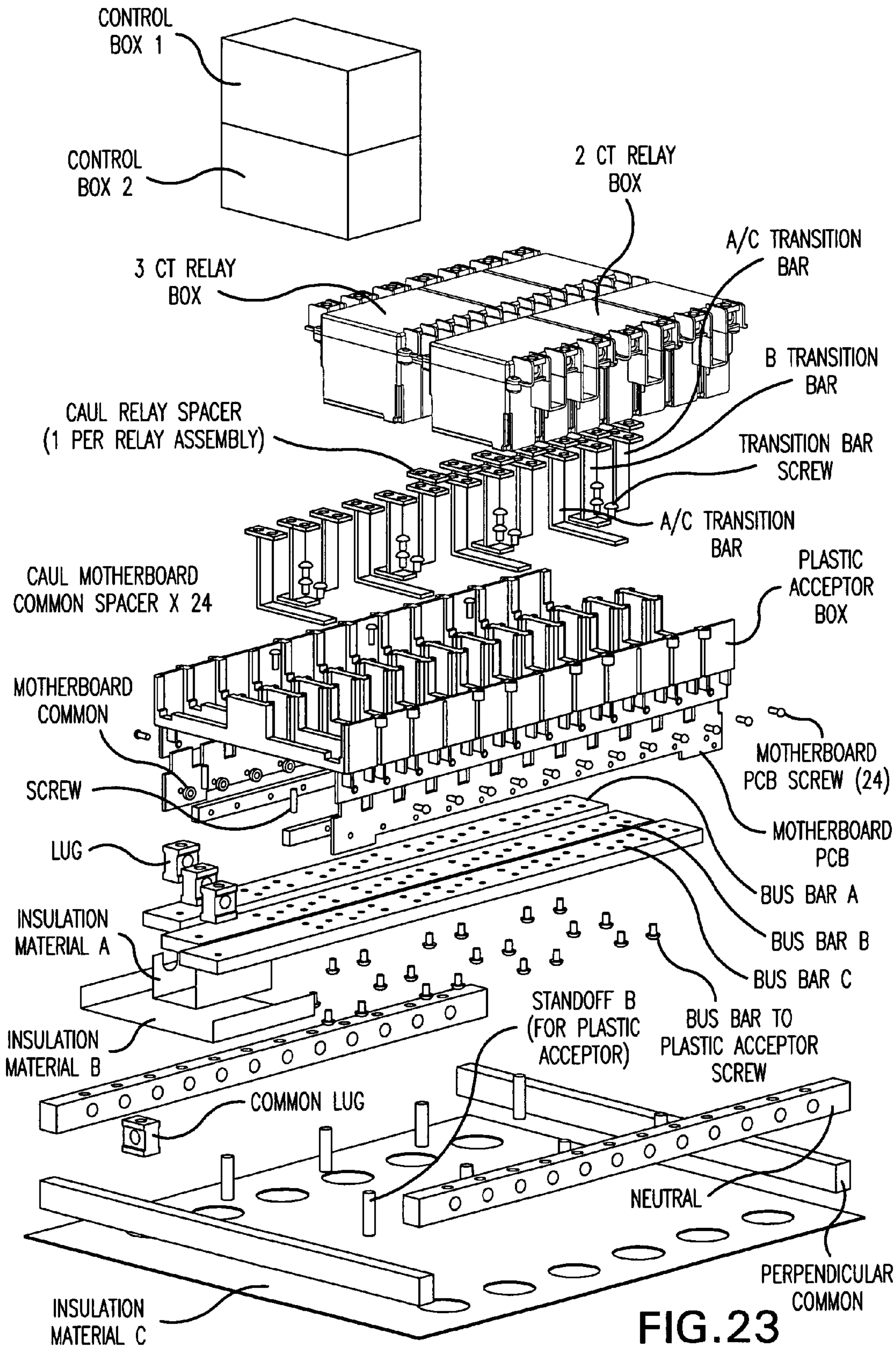
FIG. 23 shows an exploded view a preferred embodiment of Energy Guard.
Figure 24:
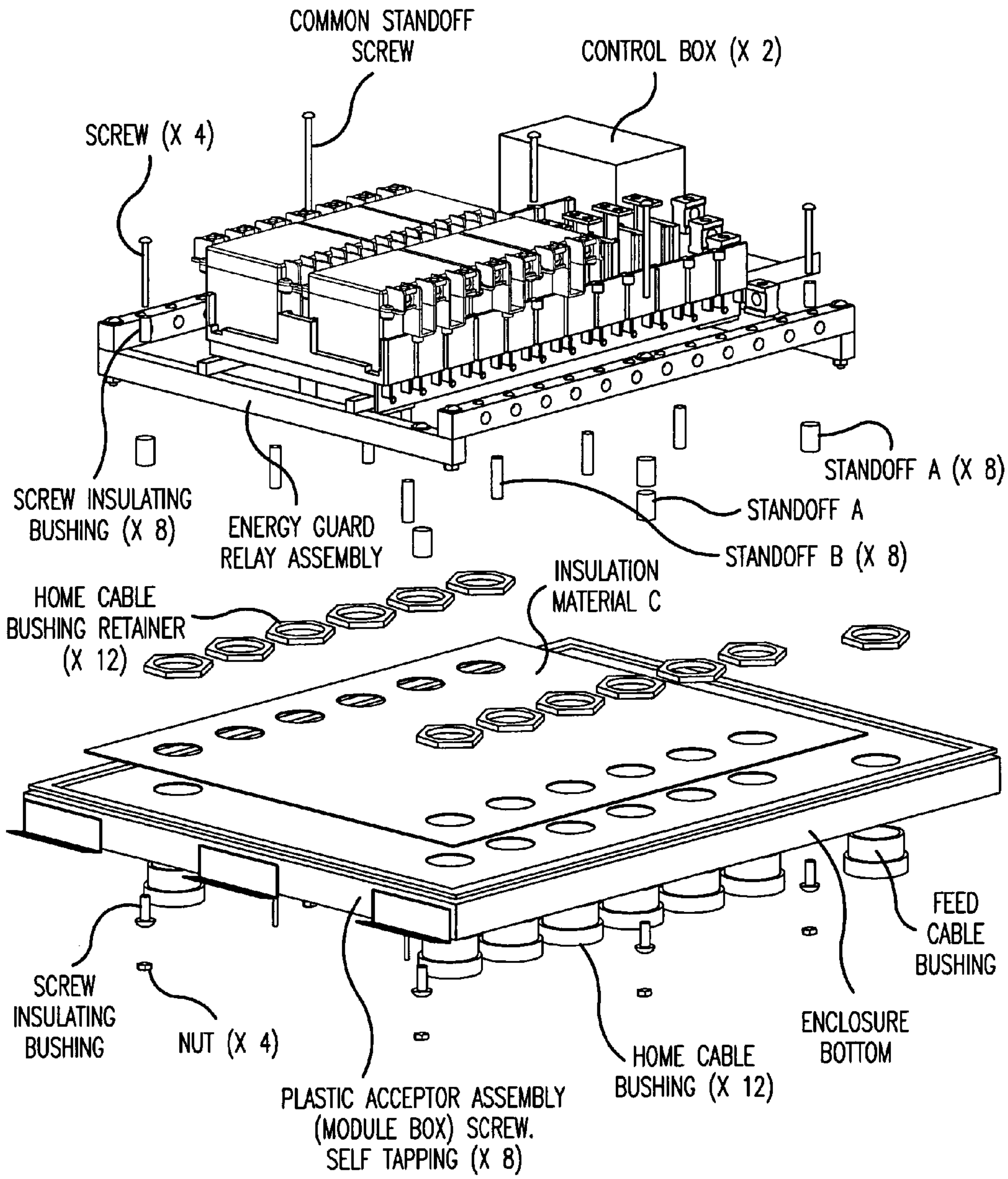
FIG. 24 shows an exploded view of a preferred EG assembly and base assembly.

FIG. 23 shows an exploded view of Energy Guard, and FIG. 24 shows an exploded view of a preferred EG Assembly and EG Base Assembly.

Electronics

The Control Module boxes preferably comprise various PCBs that work concurrently to collect metering data from the individual metering modules and communicate over power lines to transmit this data to a master device, such as a Scan Transponder ("ST").

Figure 25:
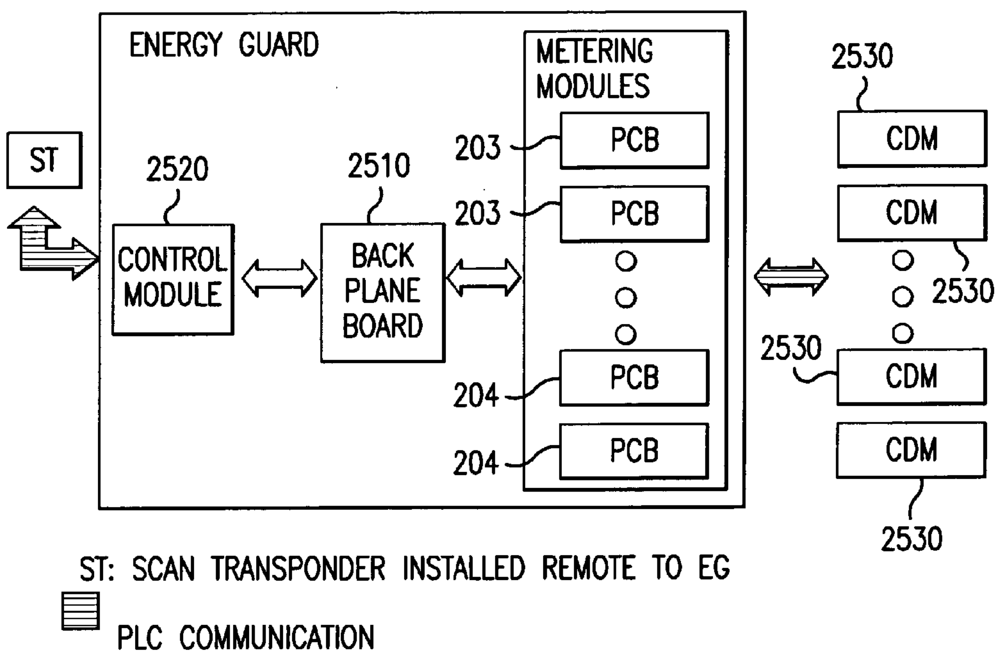
FIG. 25 shows a preferred EG layout.
Figure 26A:
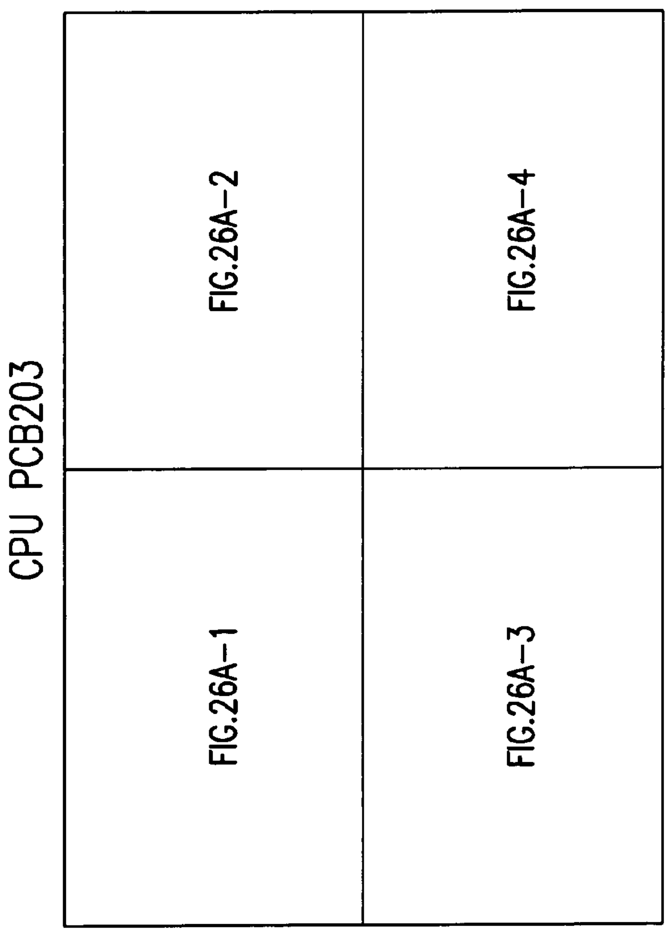
FIGS. 26A-H and 27A-B are preferred metering module schematics.
Figures 1, 26A:
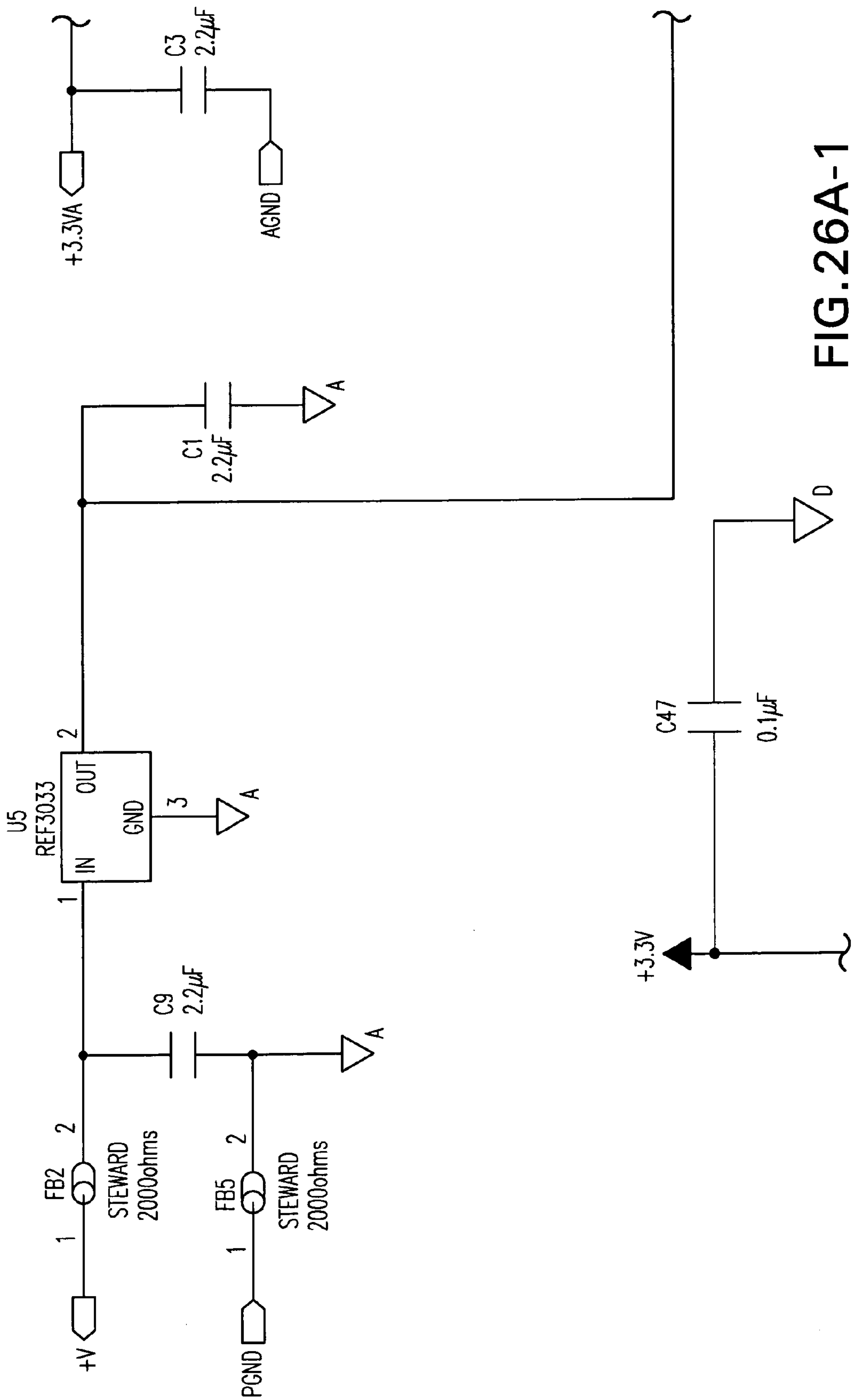
Figures 2, 26A:
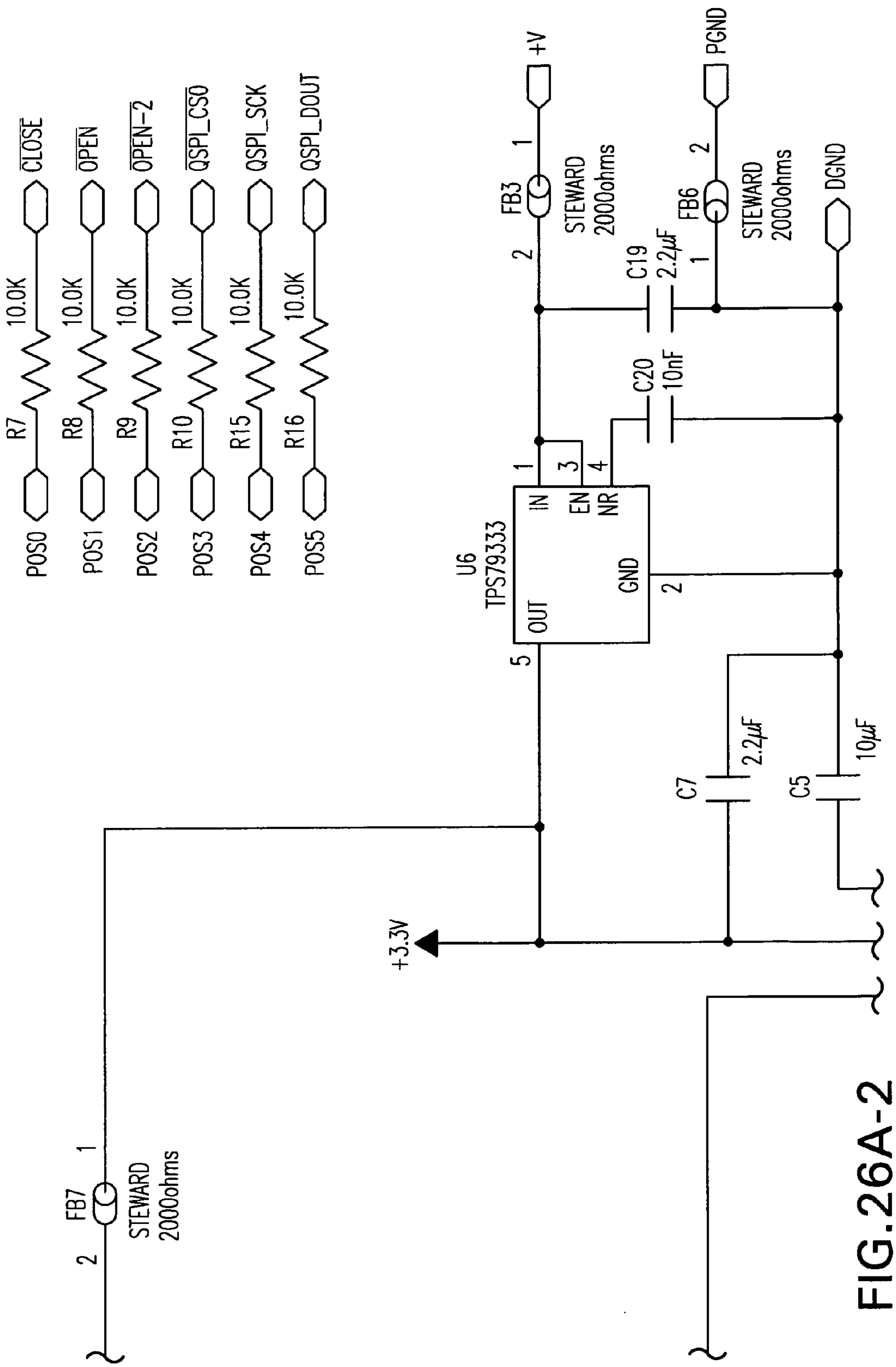
Figures 3, 26A:
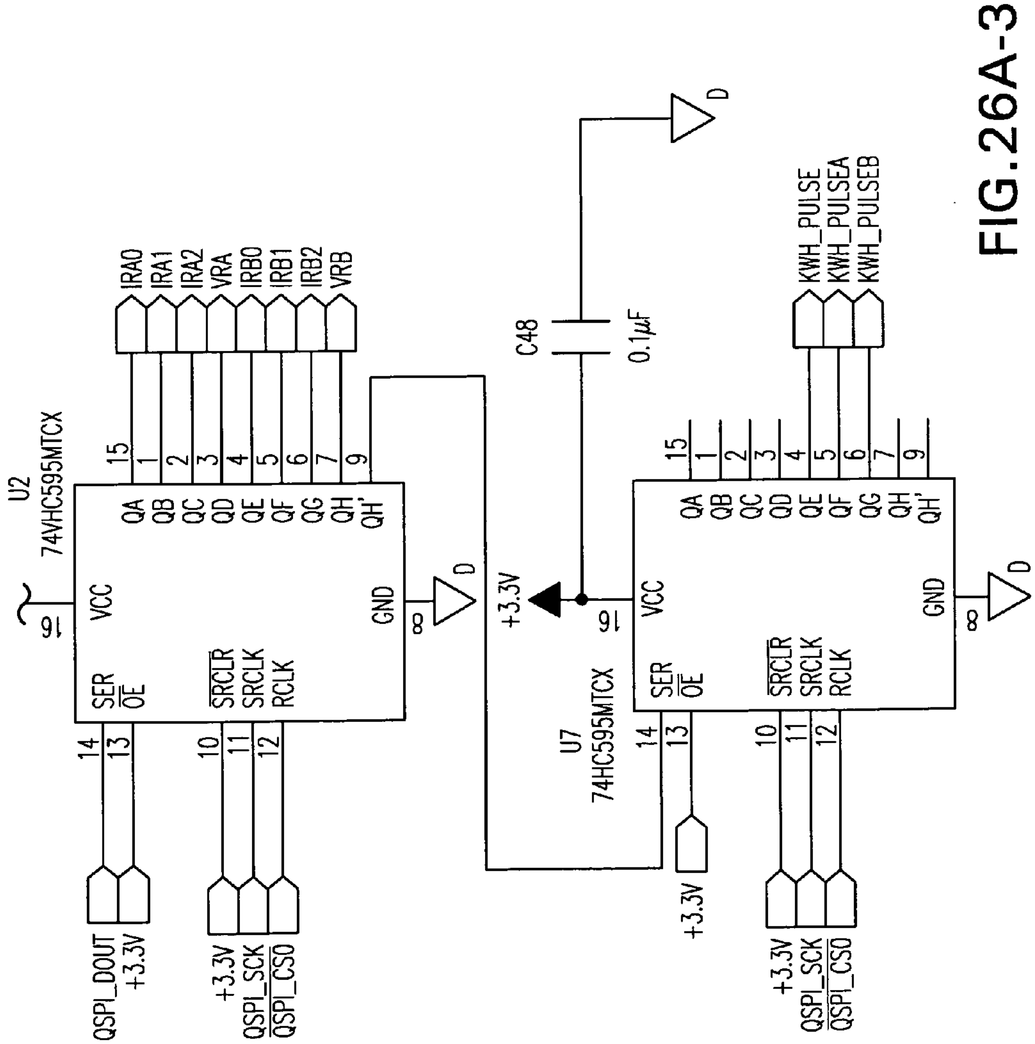
Figures 4, 26A:
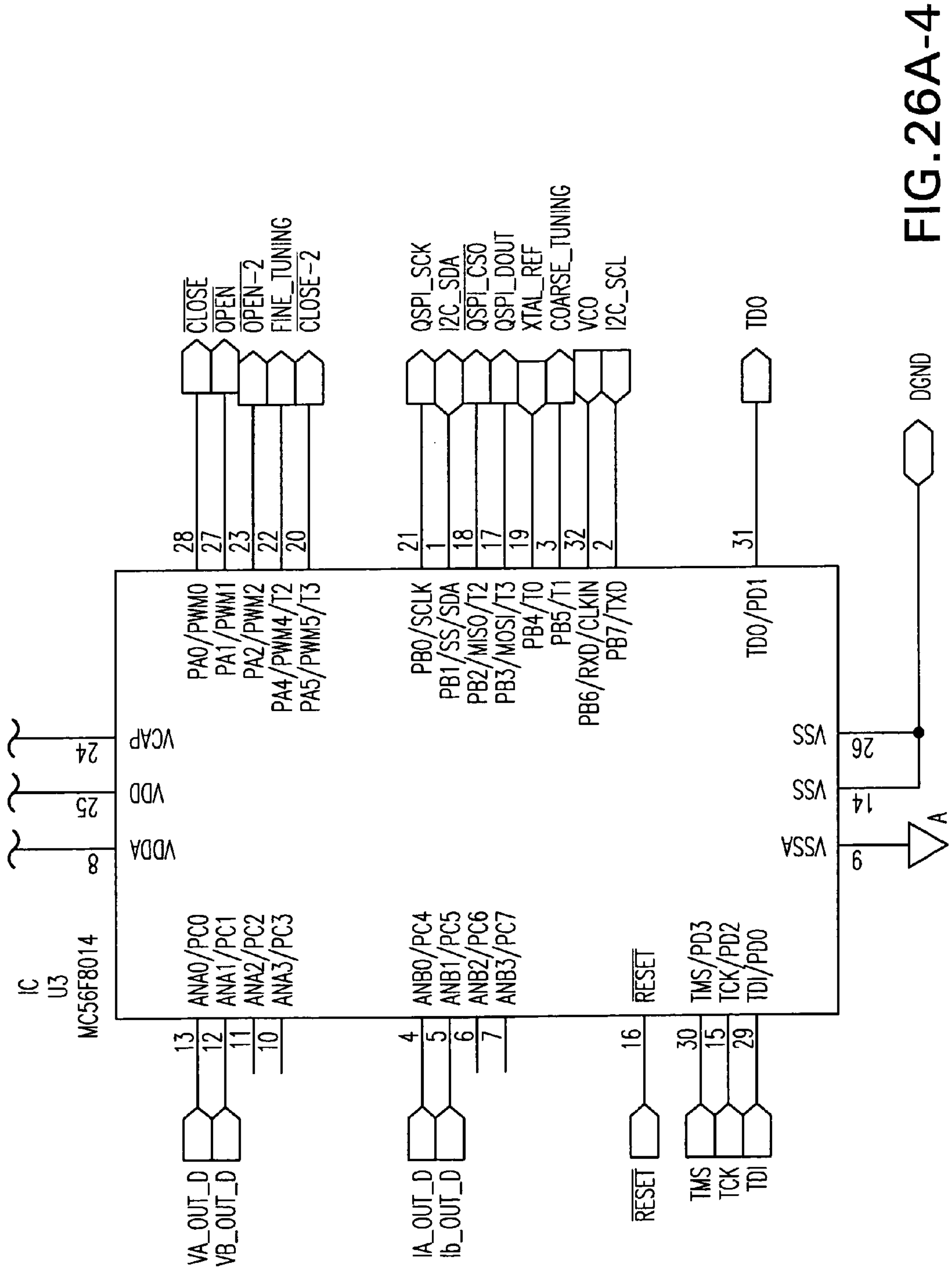
Figure 26B:
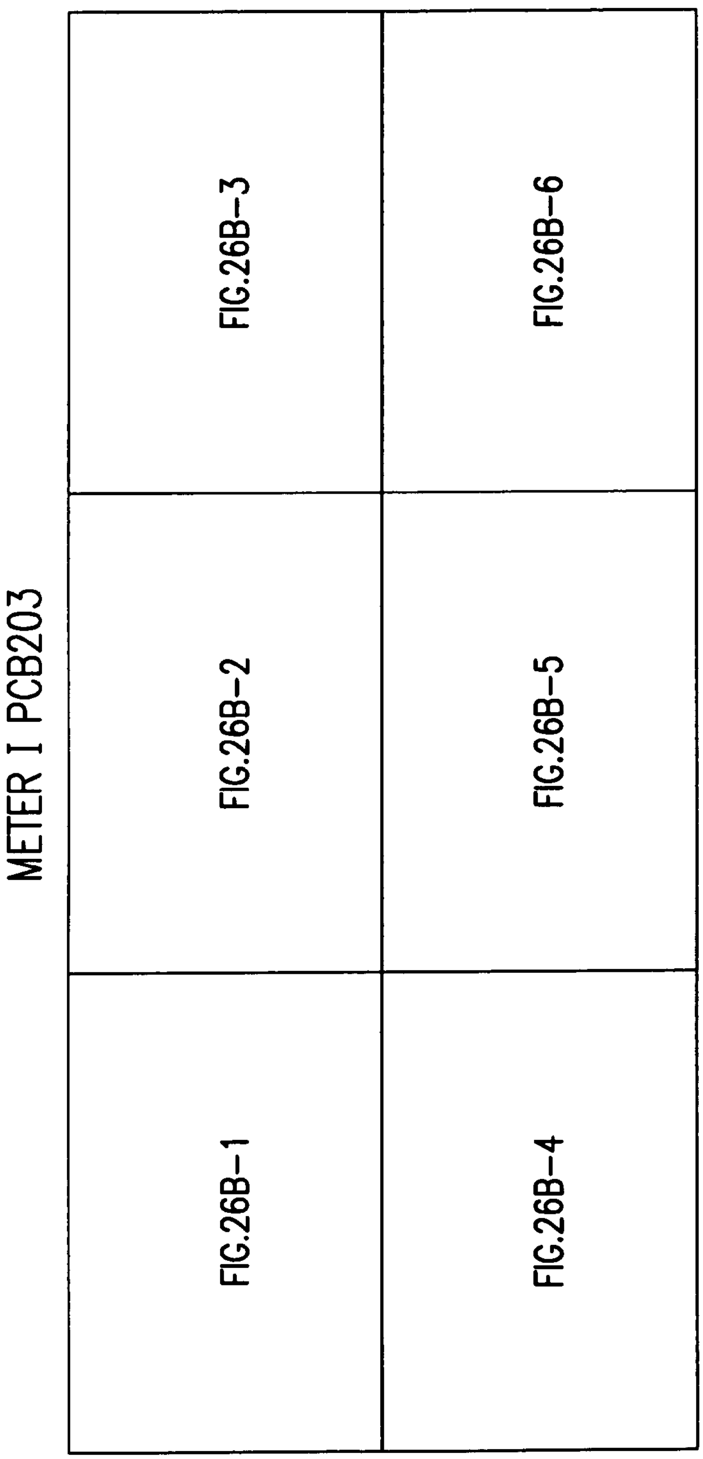
Figures 1, 26B:
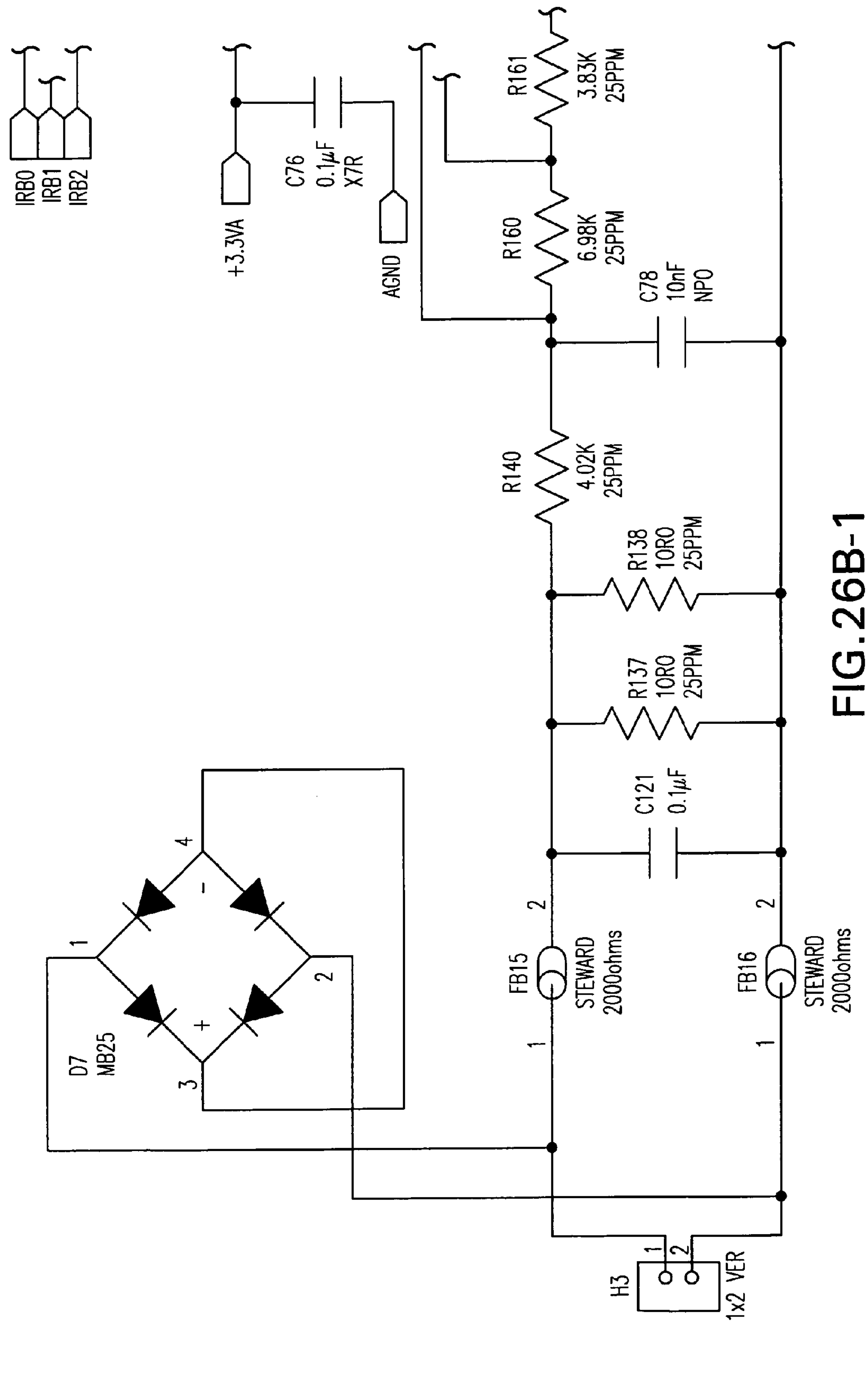
Figures 2, 26B:
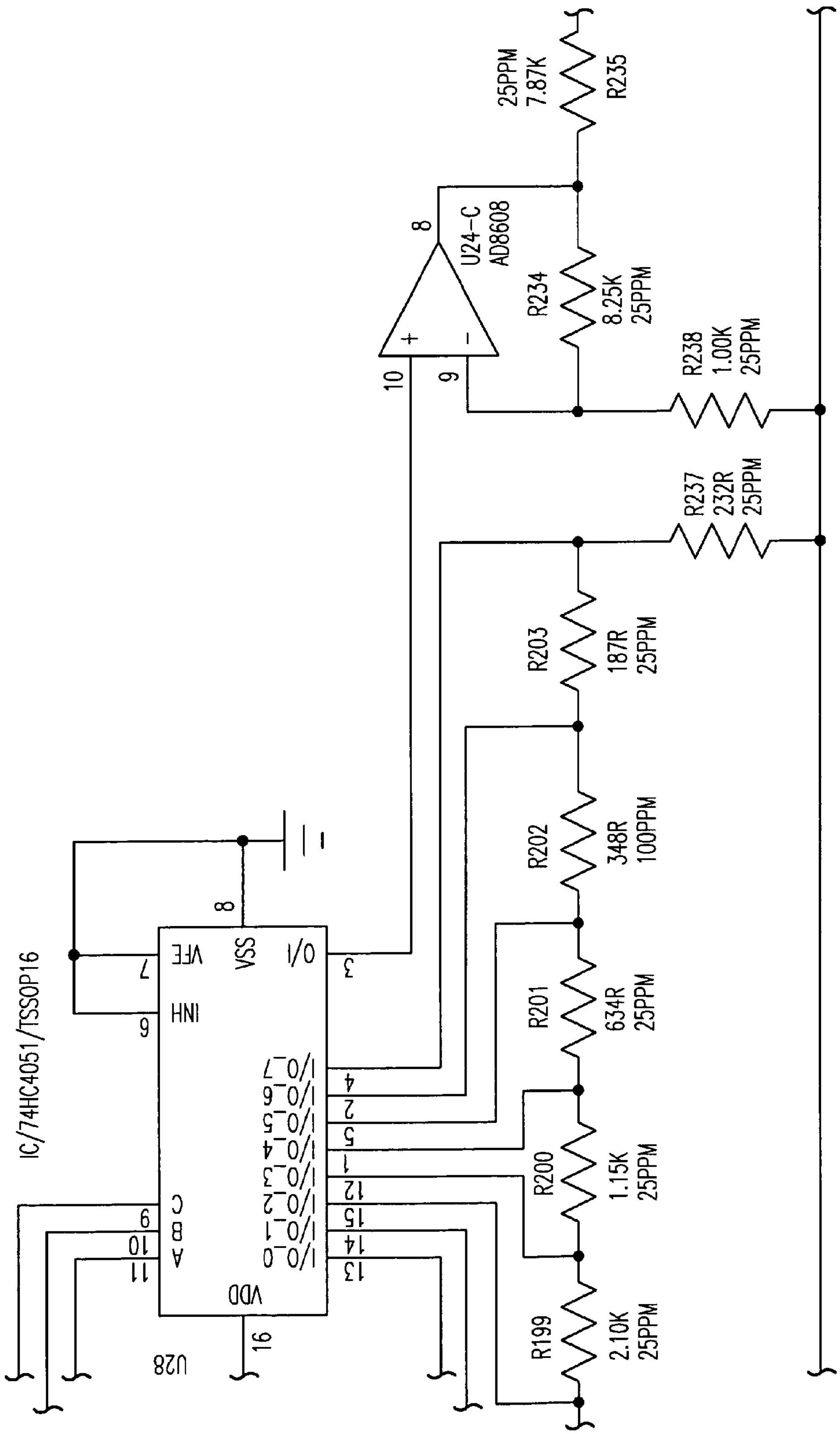
Figures 3, 26B:
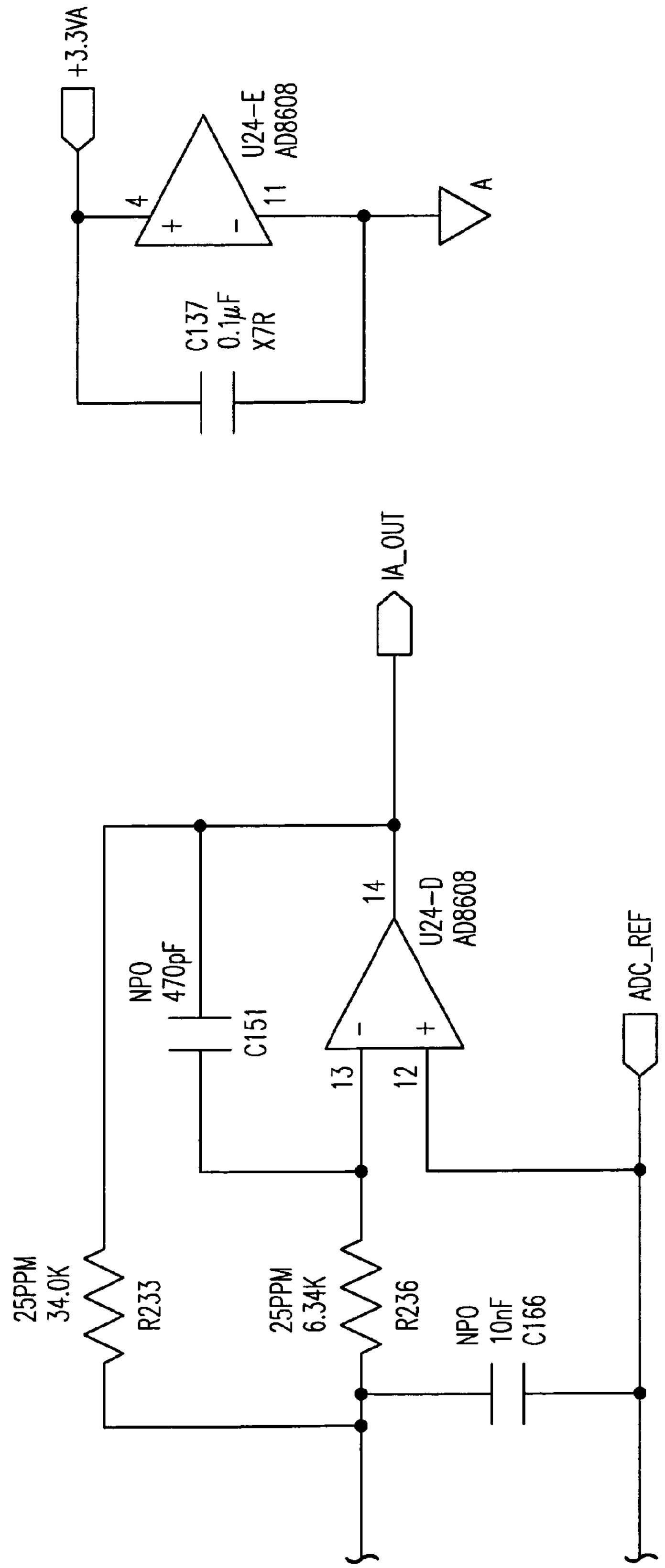
Figures 4, 26B:
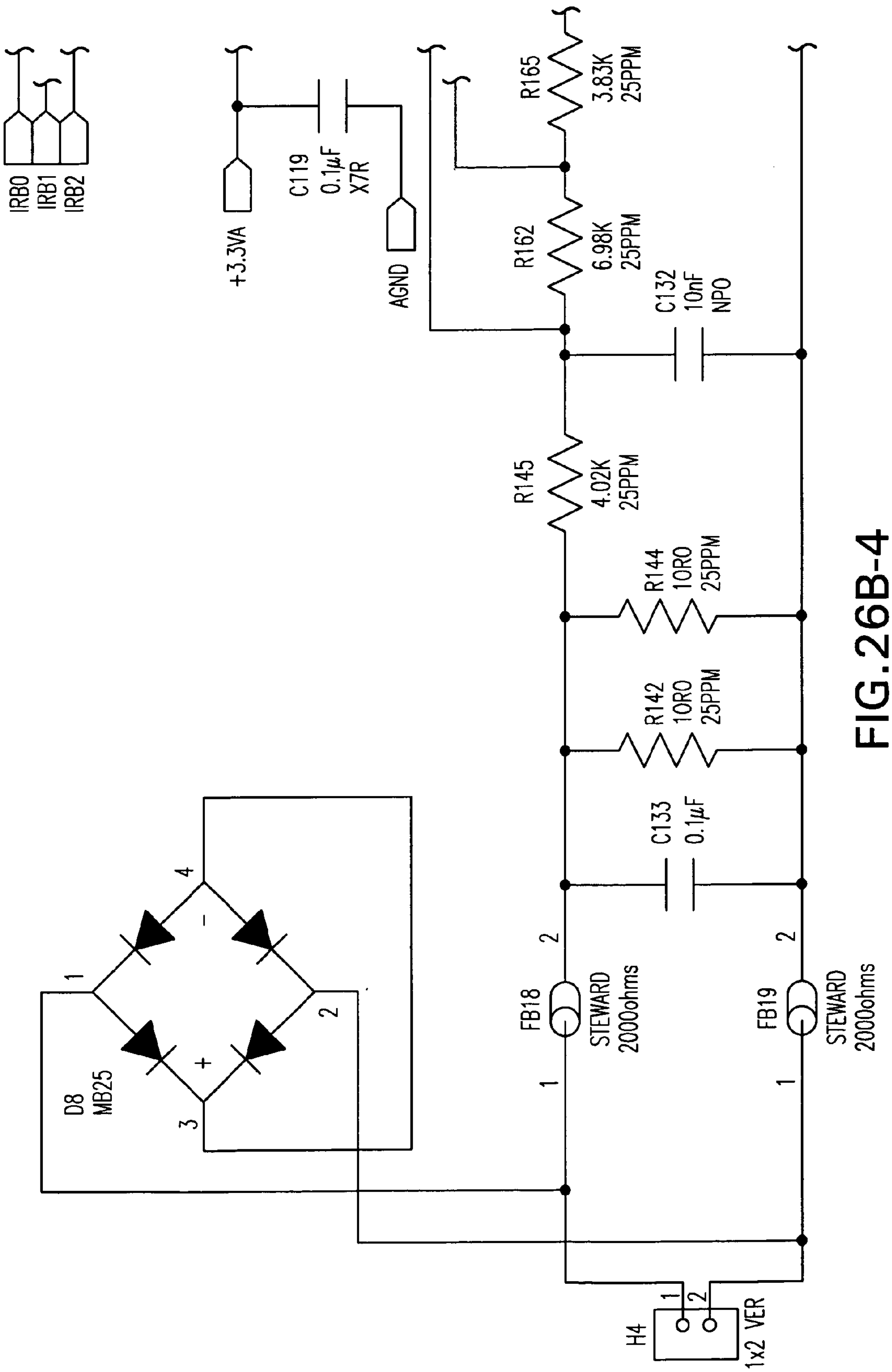
Figures 5, 26B:
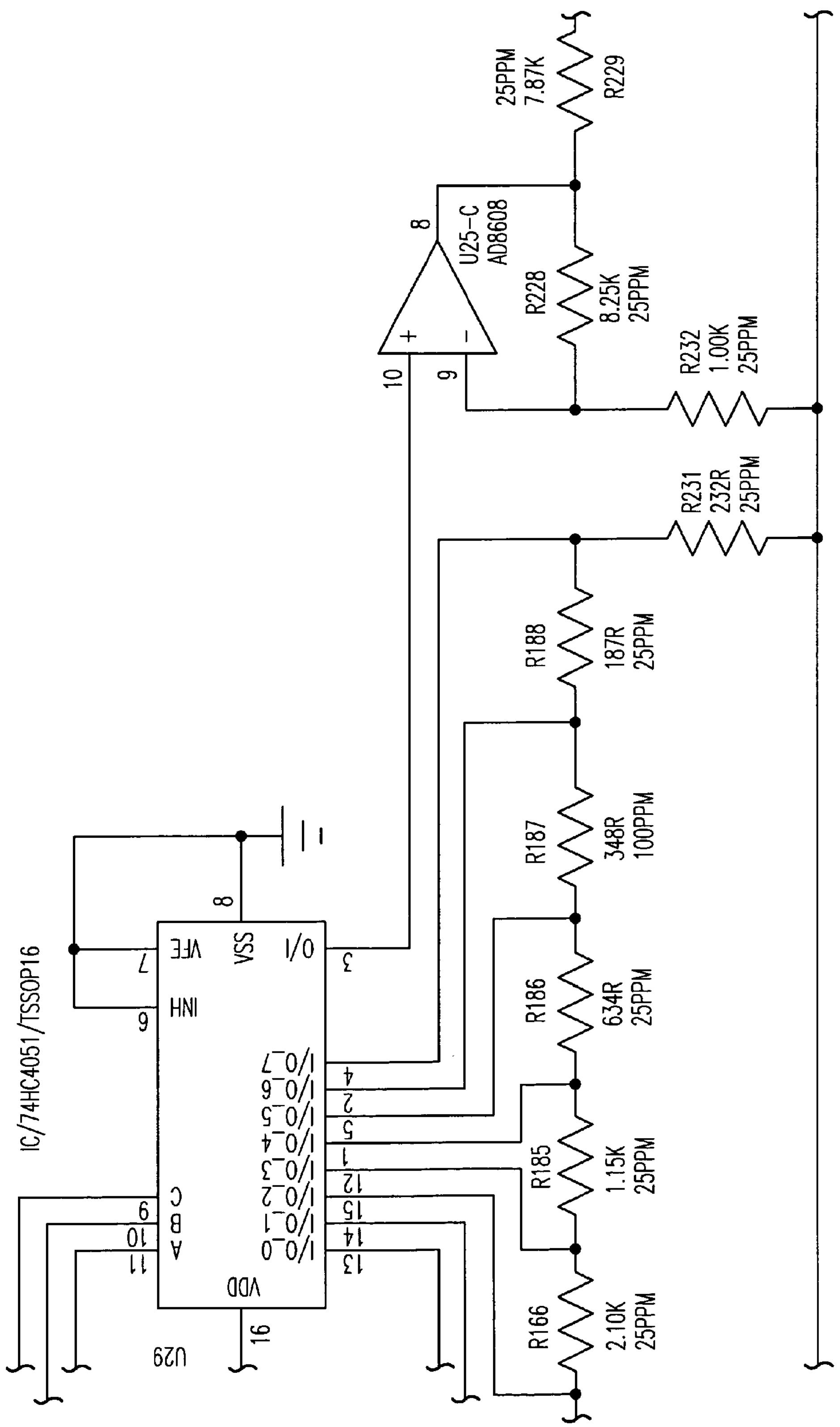
Figures 6, 26B:
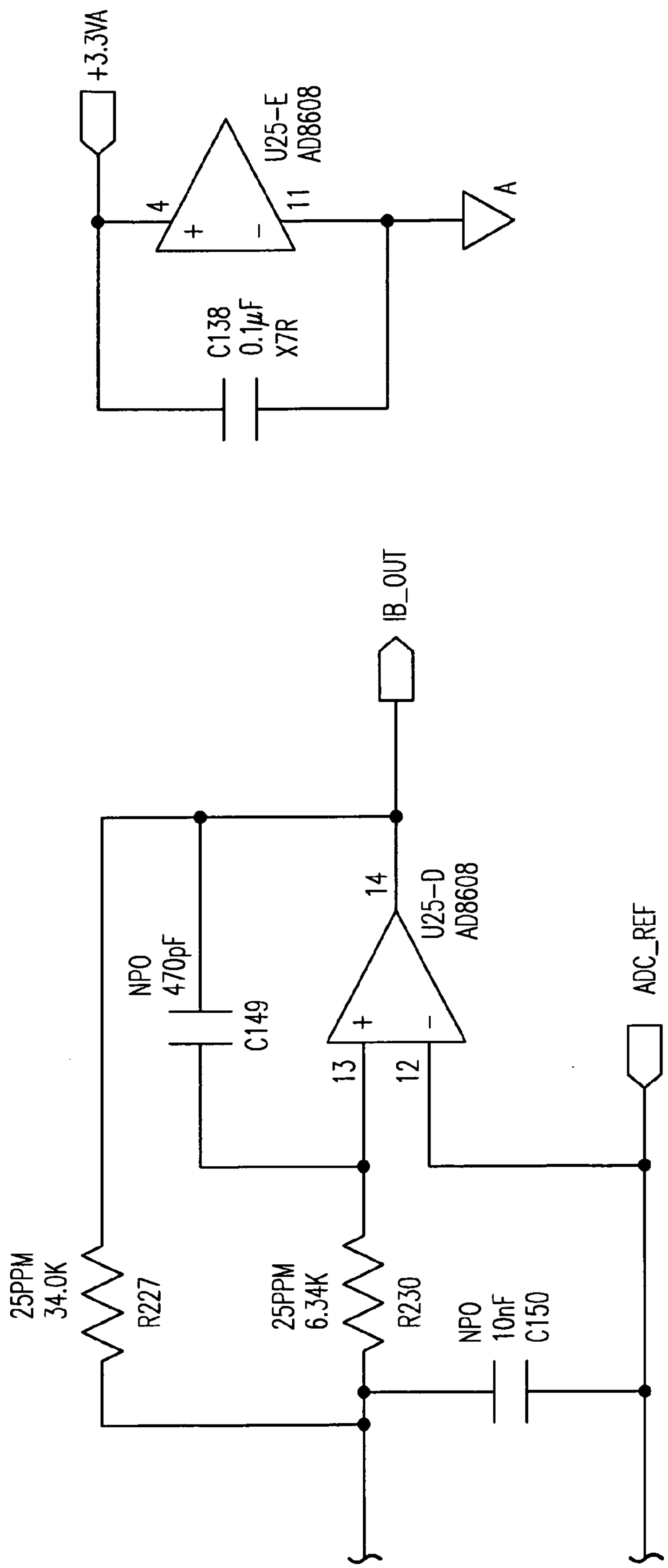
Figure 26C:
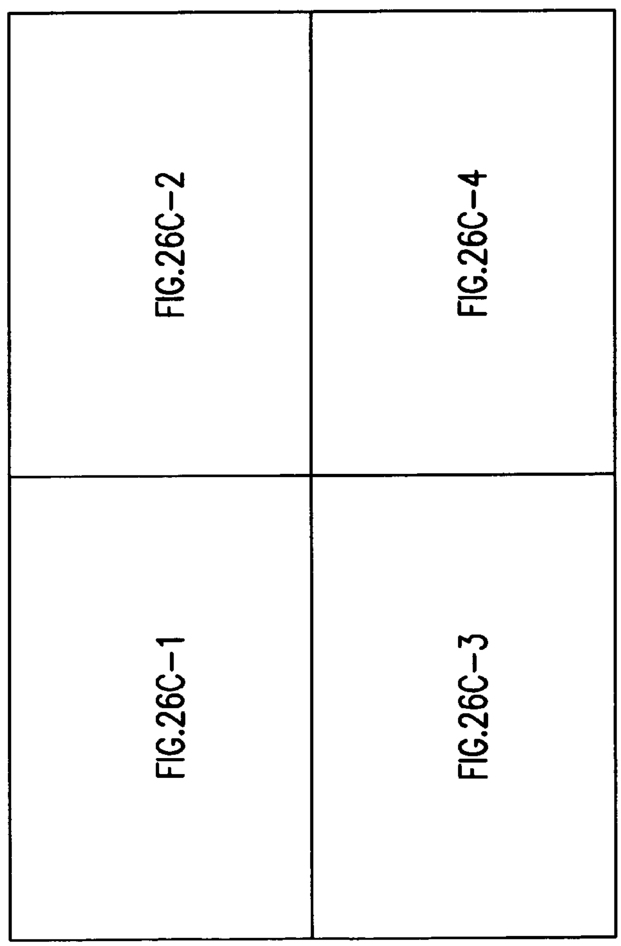
Figures 1, 26C:
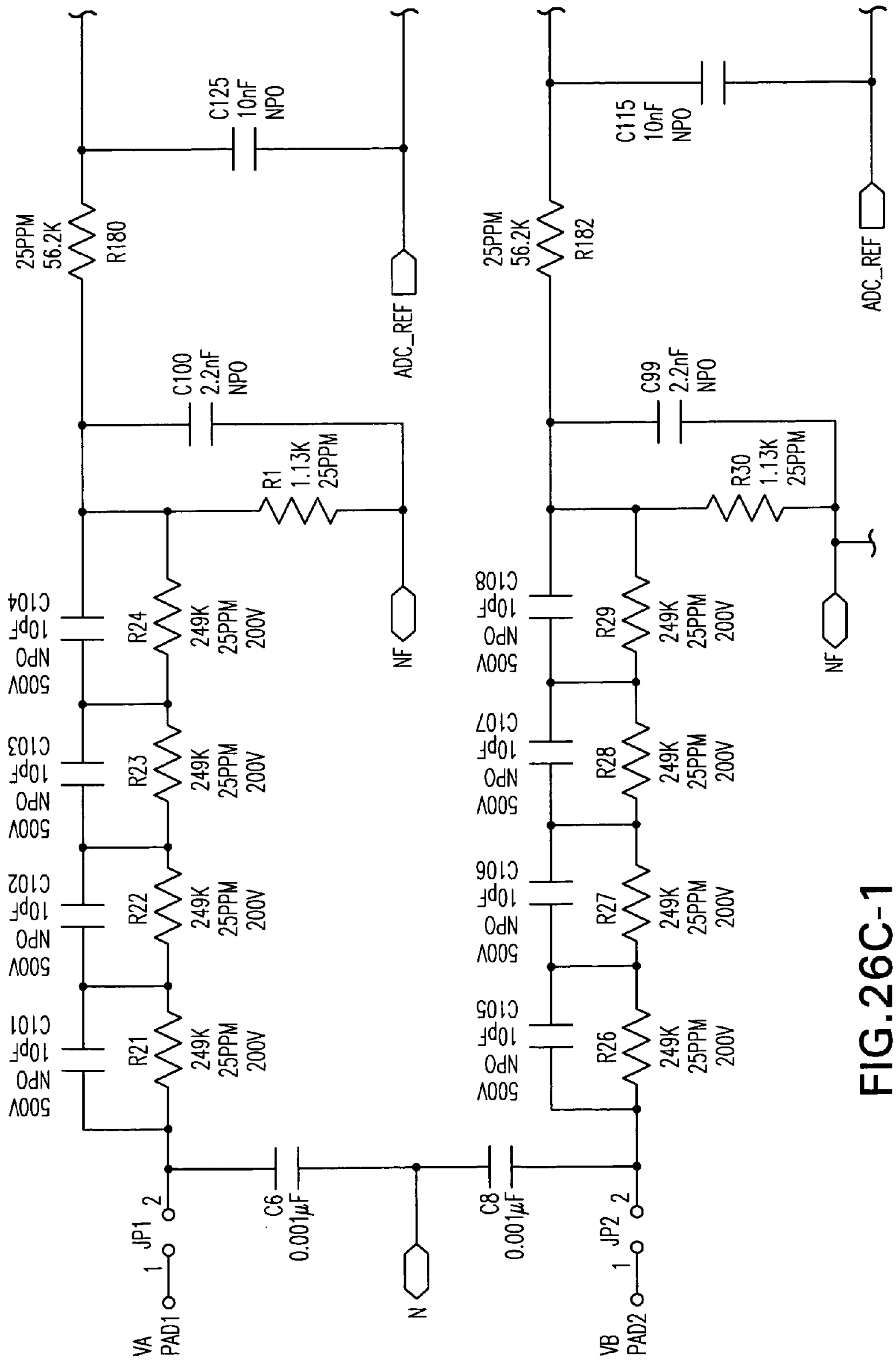
Figures 2, 26C:
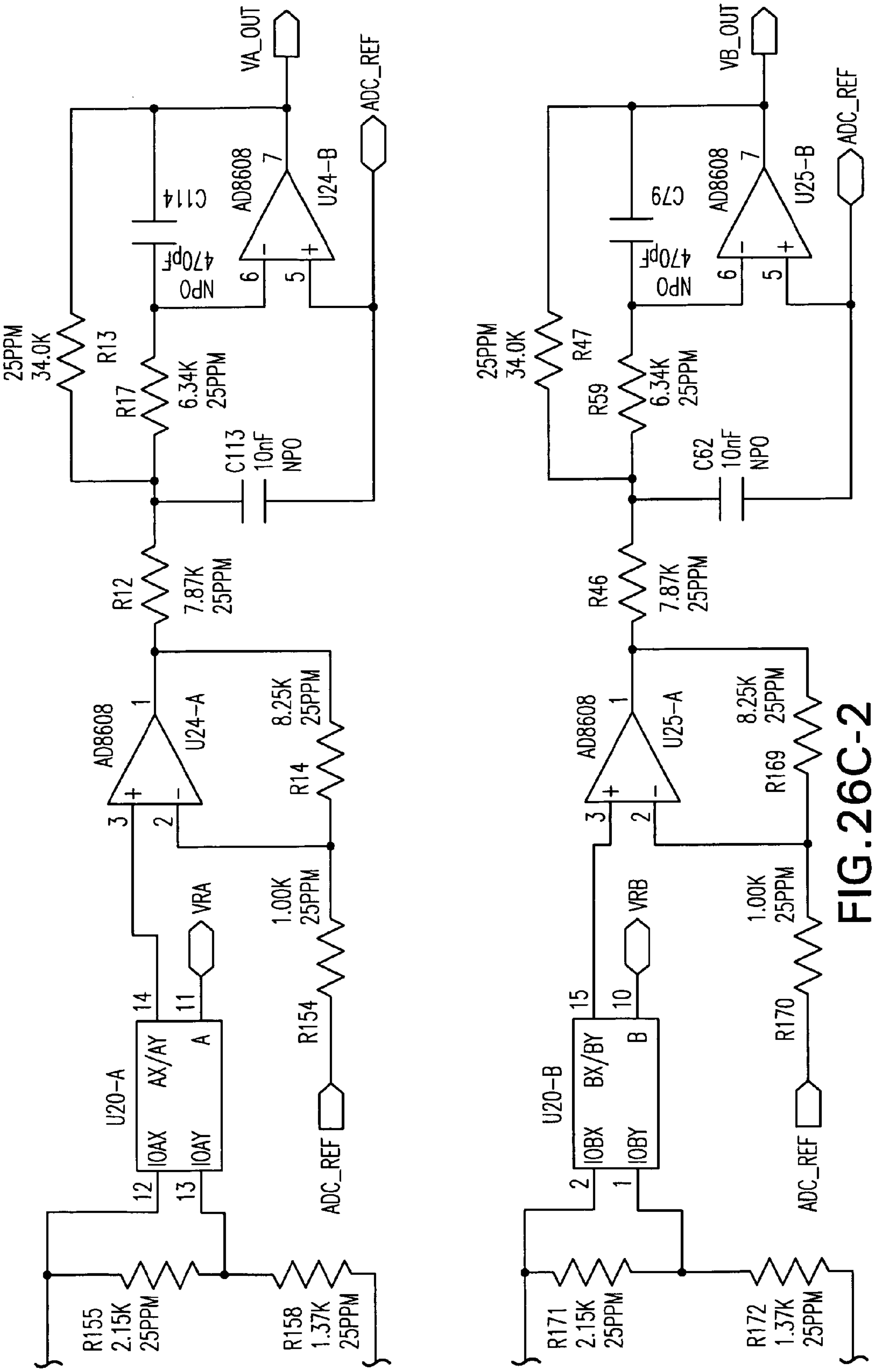
Figures 3, 26C:
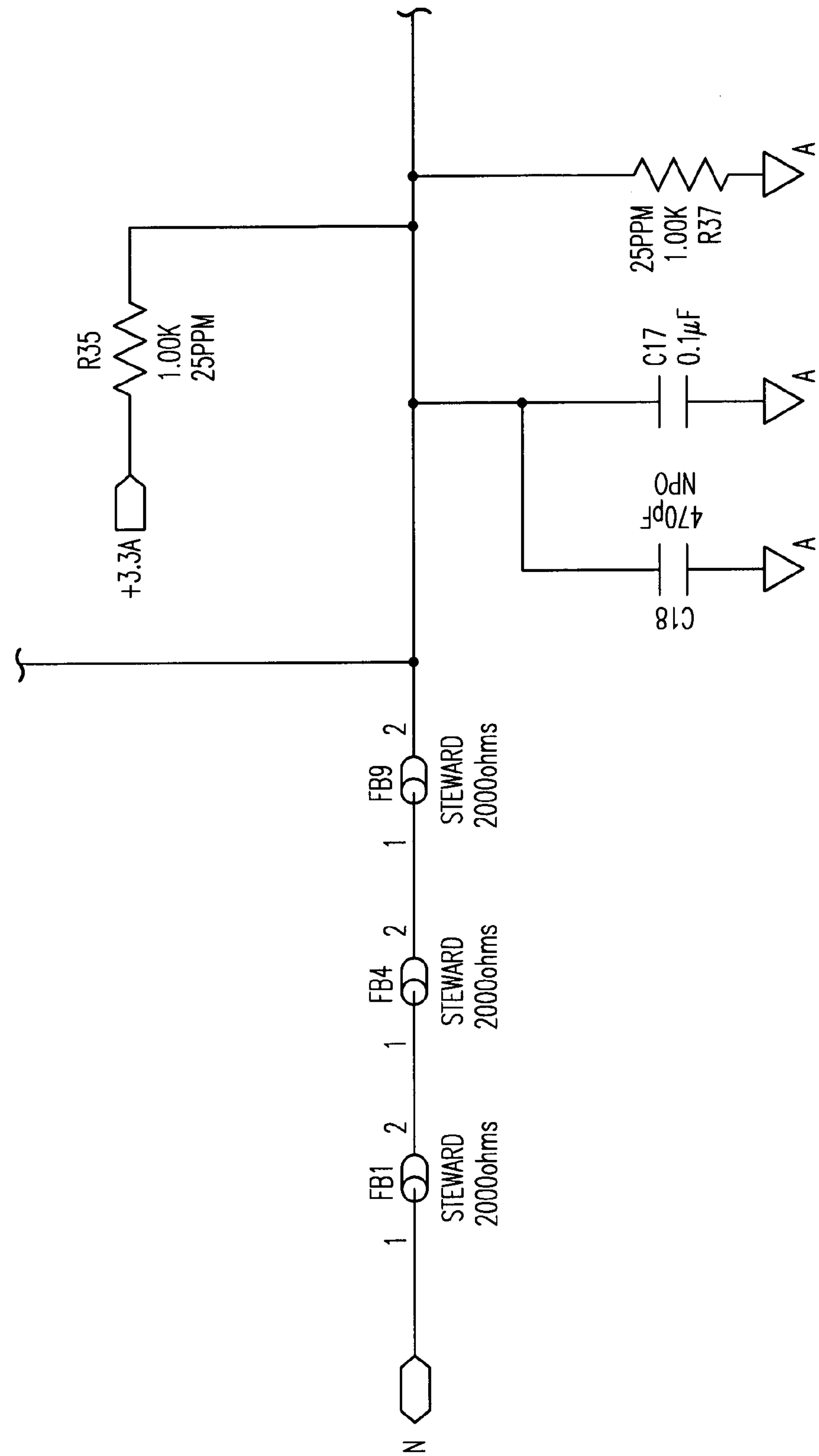
Figures 4, 26C:
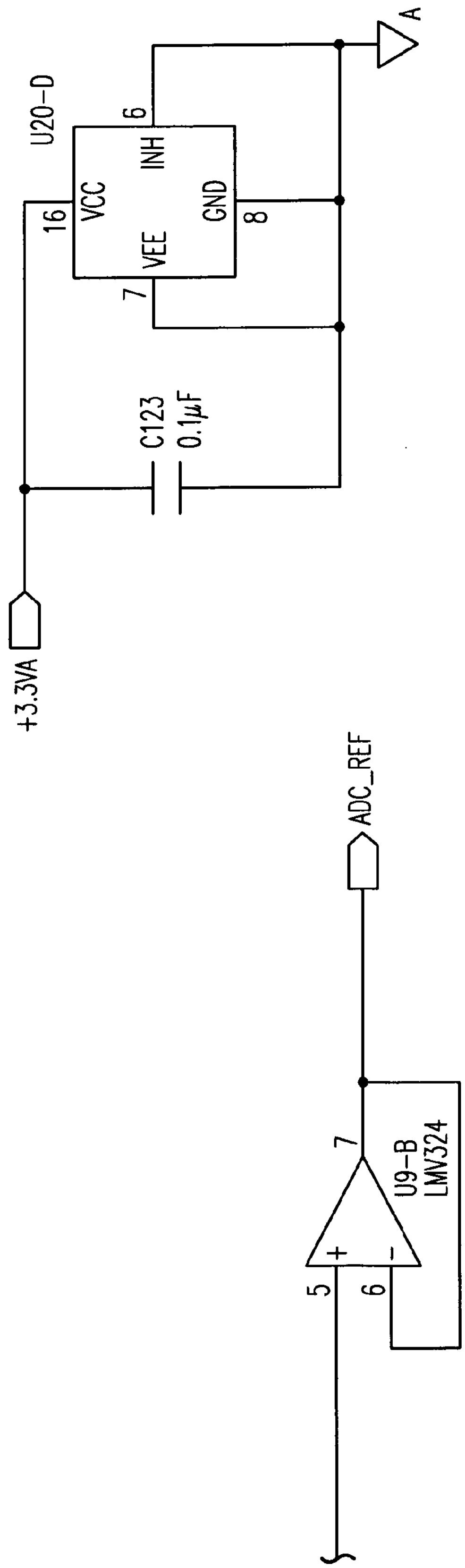
Figure 26D:
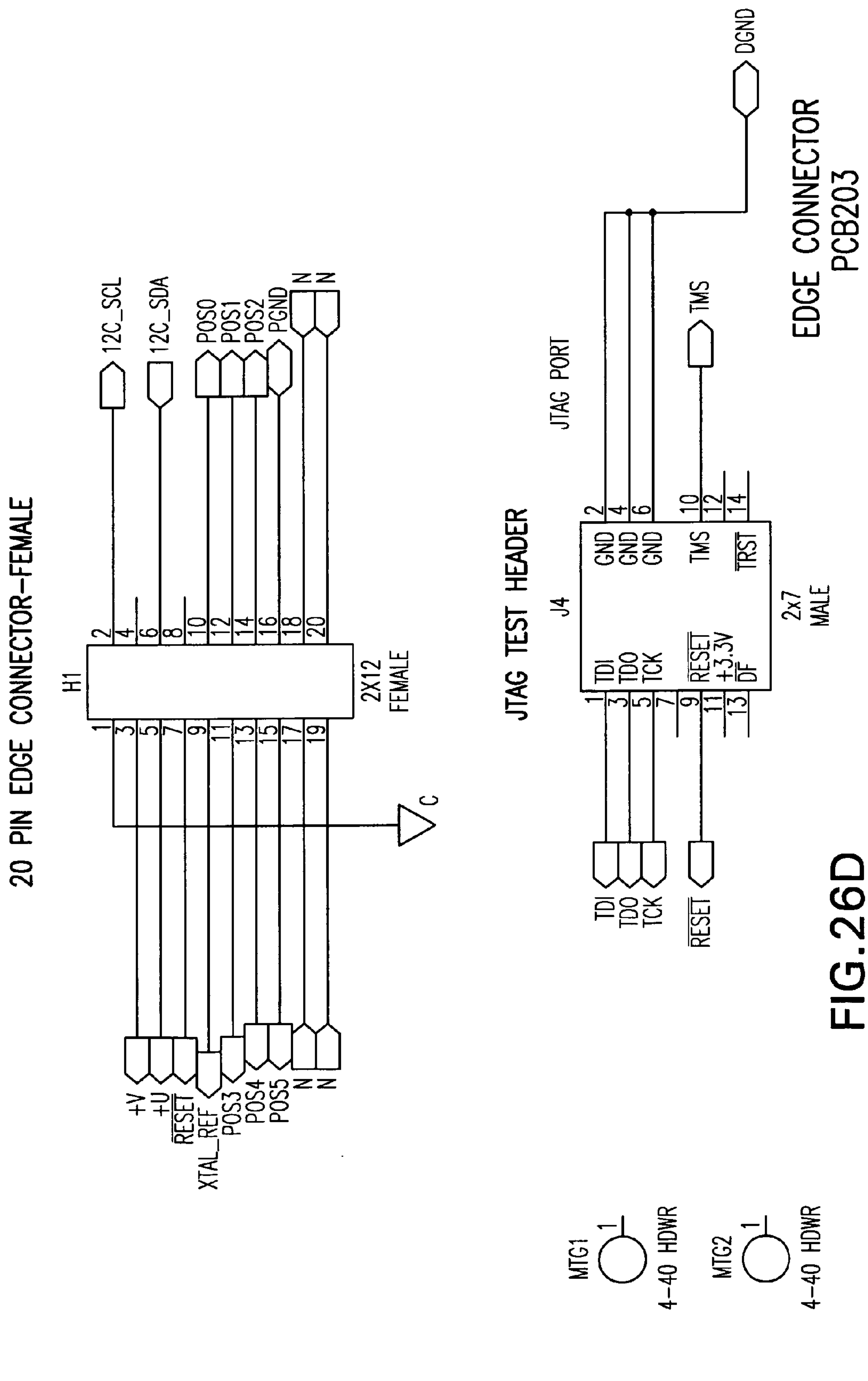
Figure 26E:
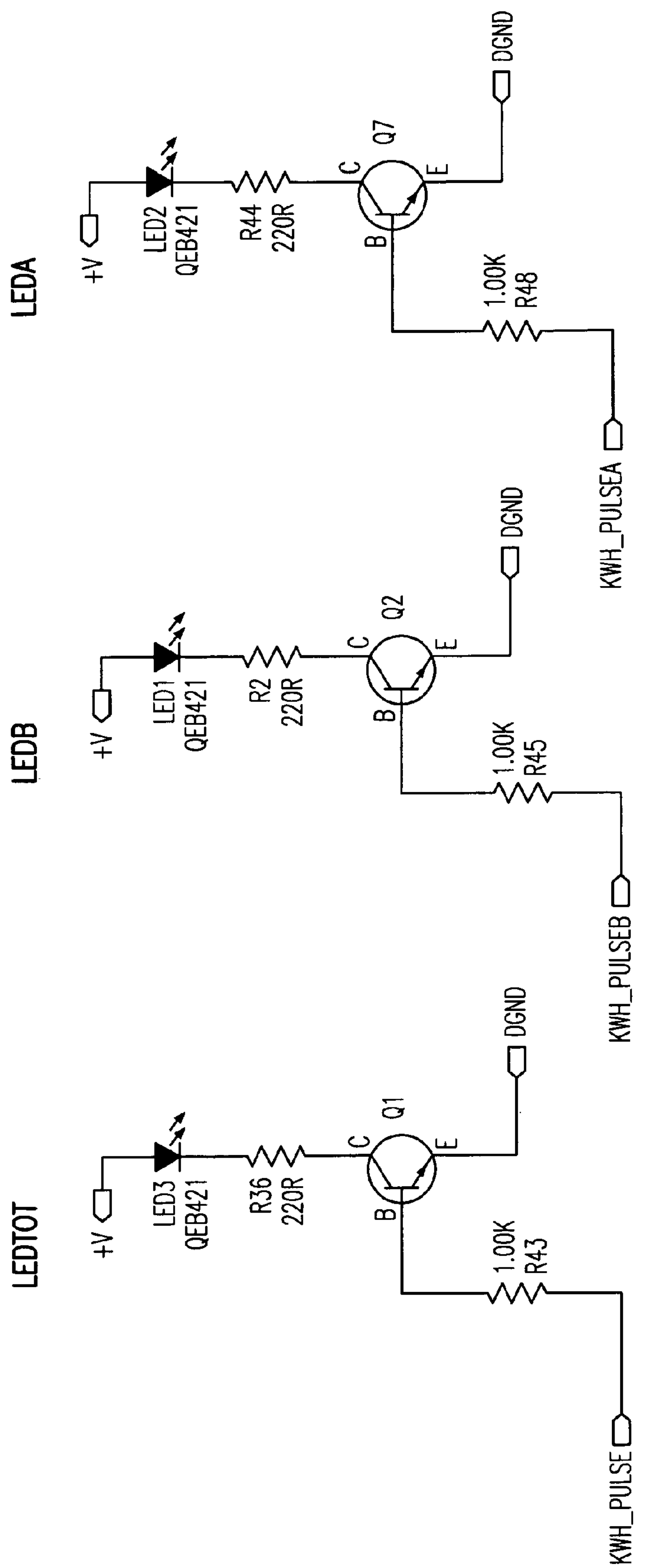
Figure 26F:
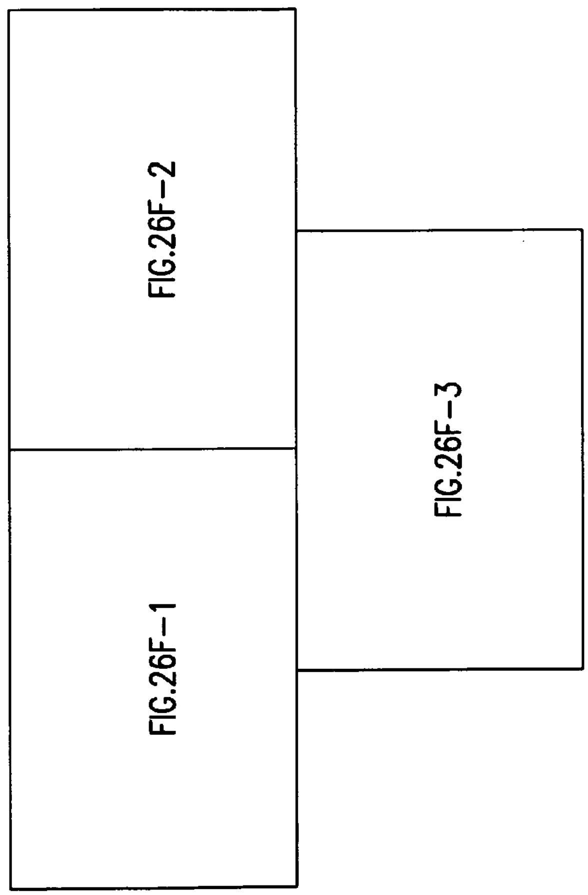
Figures 1, 26F:
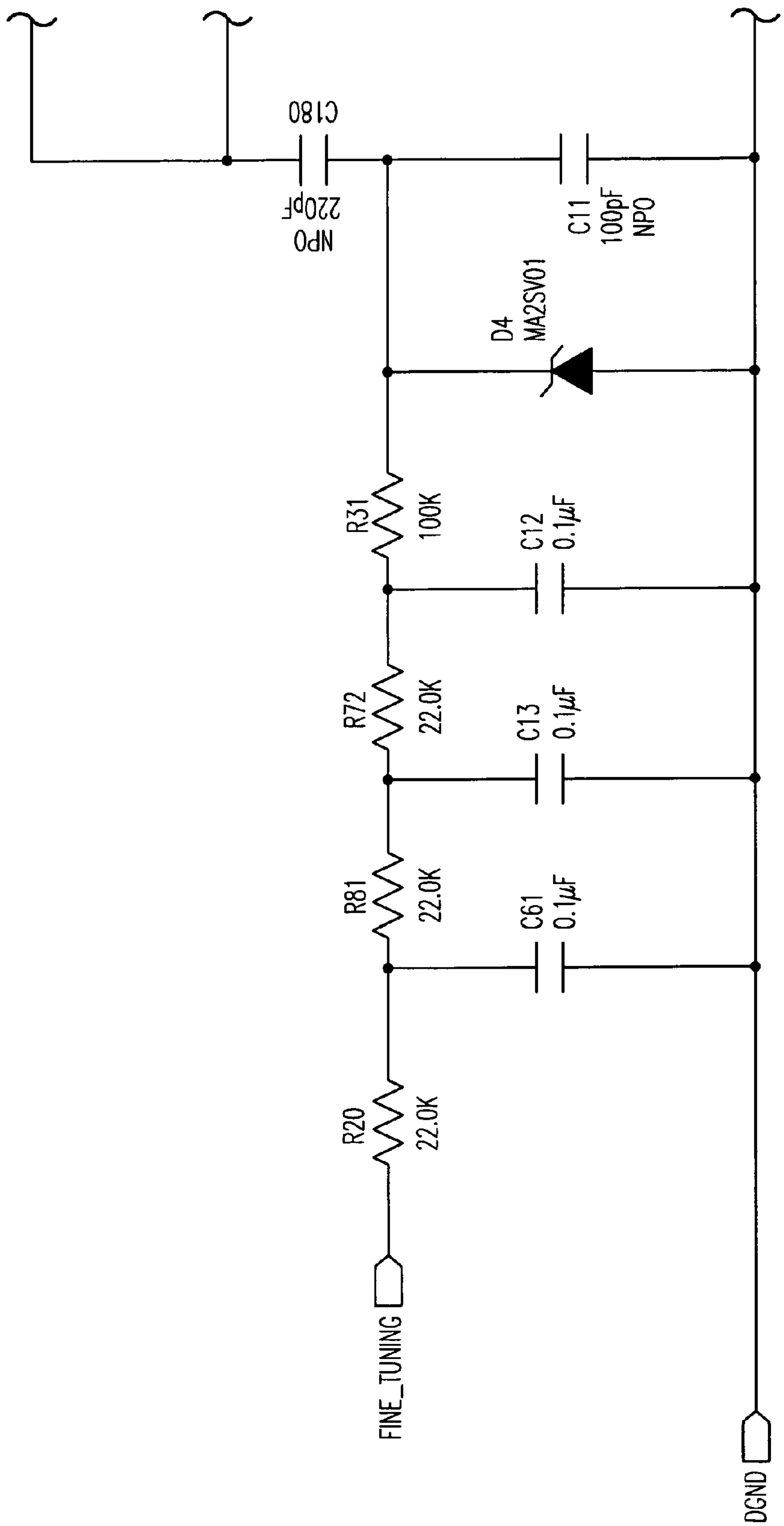
Figures 2, 26F:
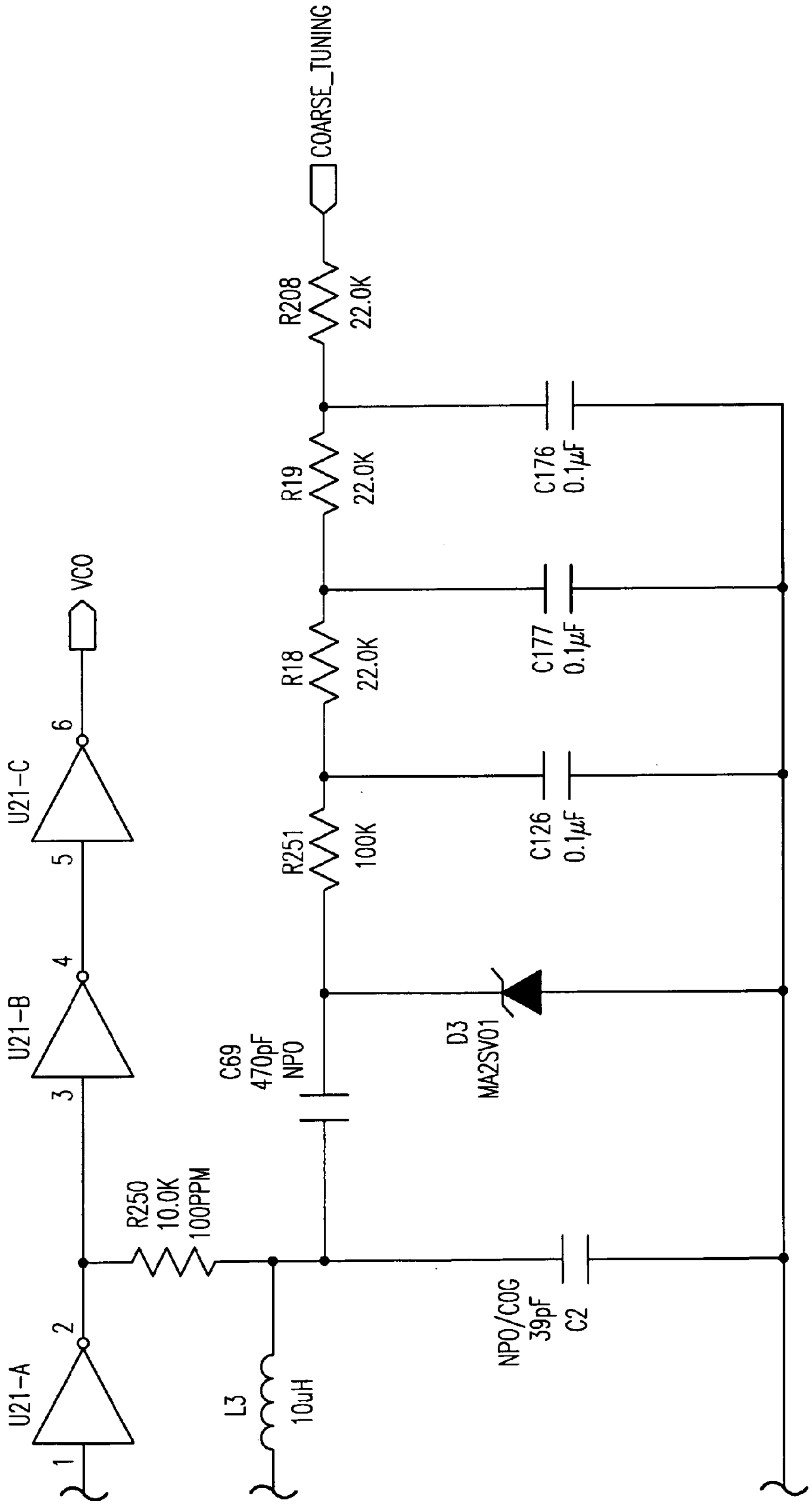
Figures 3, 26F:
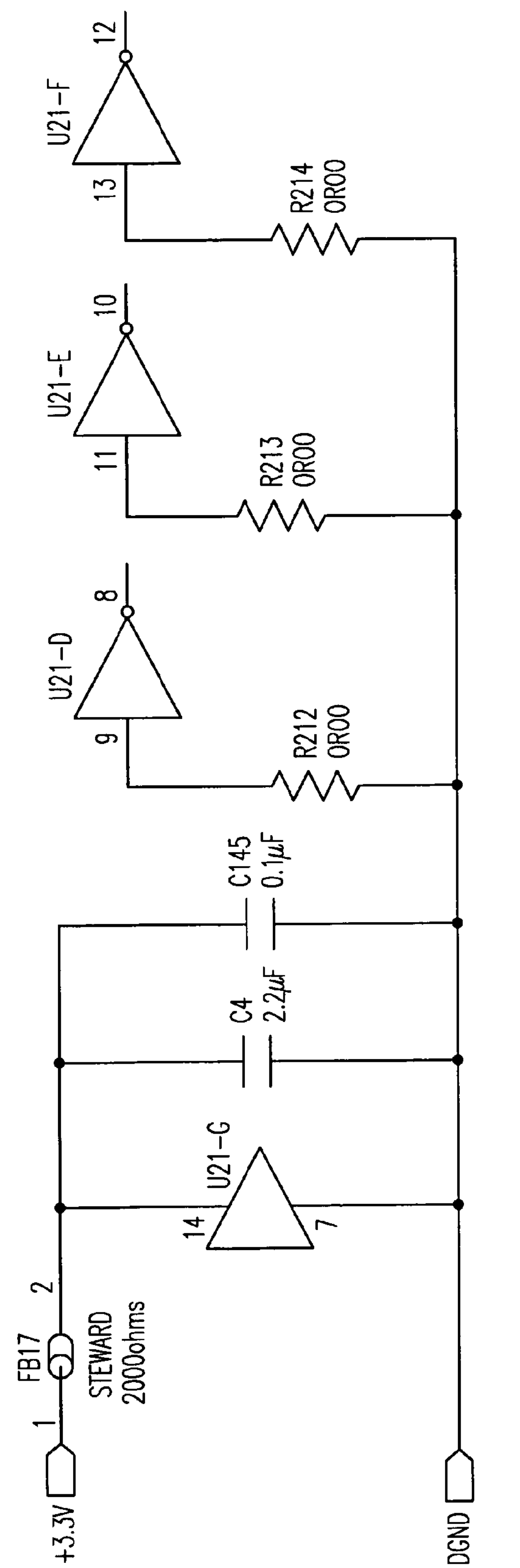
Figure 26G:
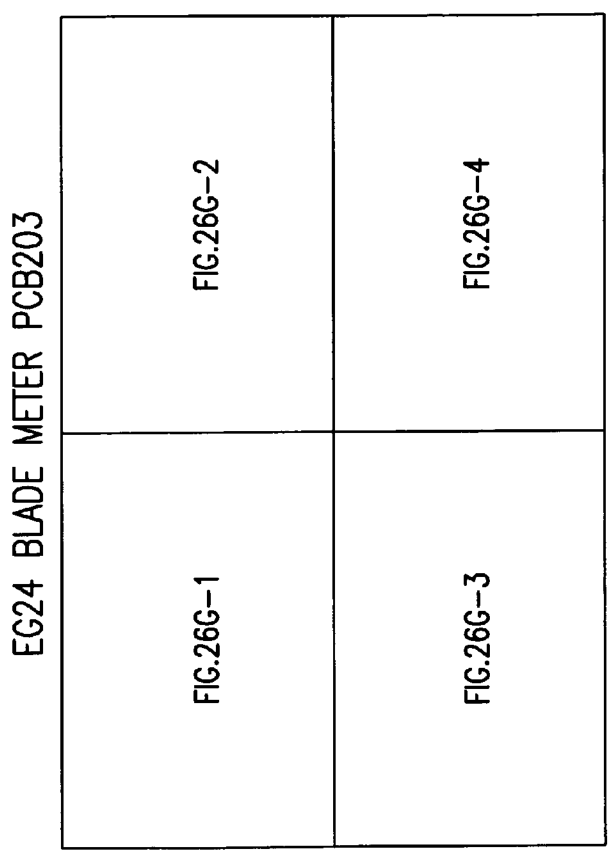
Figures 1, 26G:
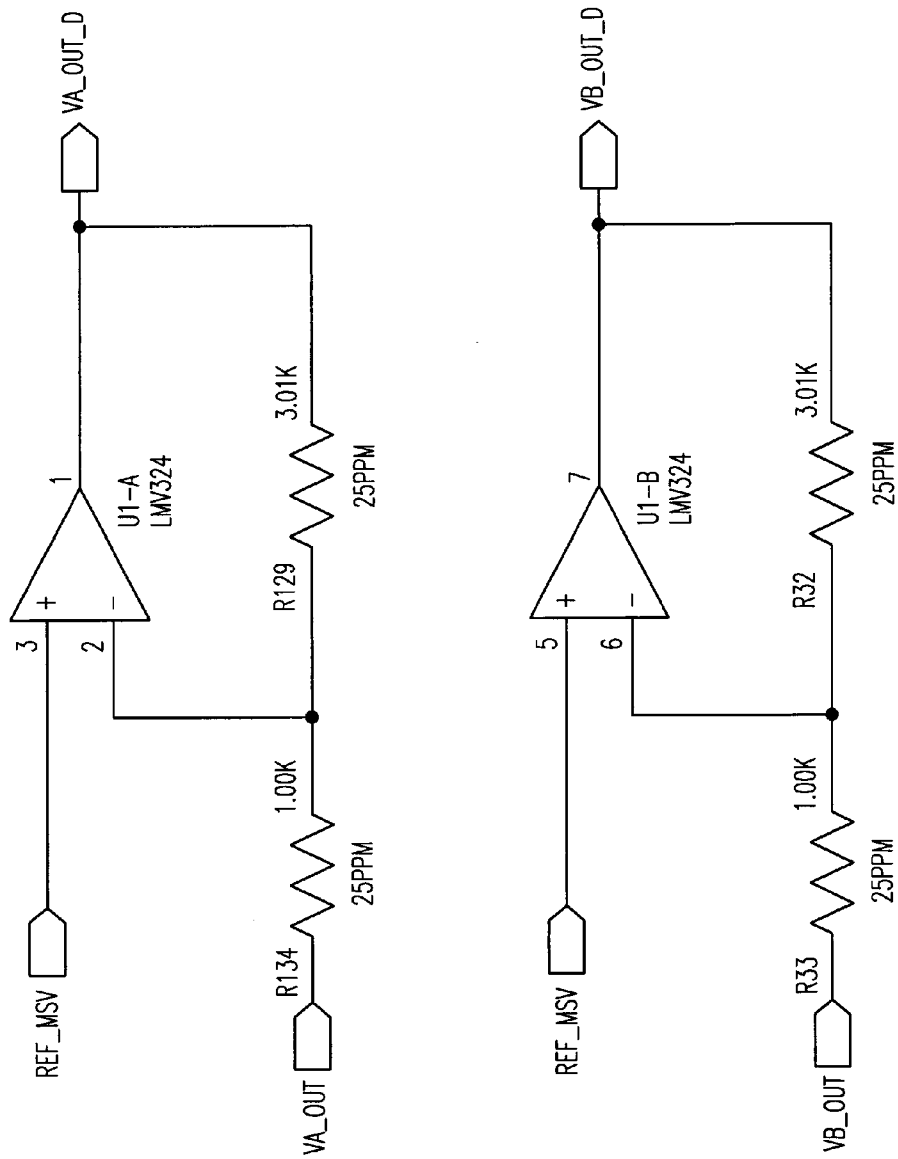
Figures 2, 26G:
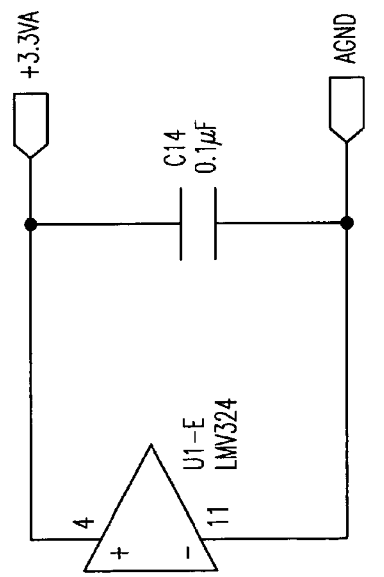
Figures 3, 26G:
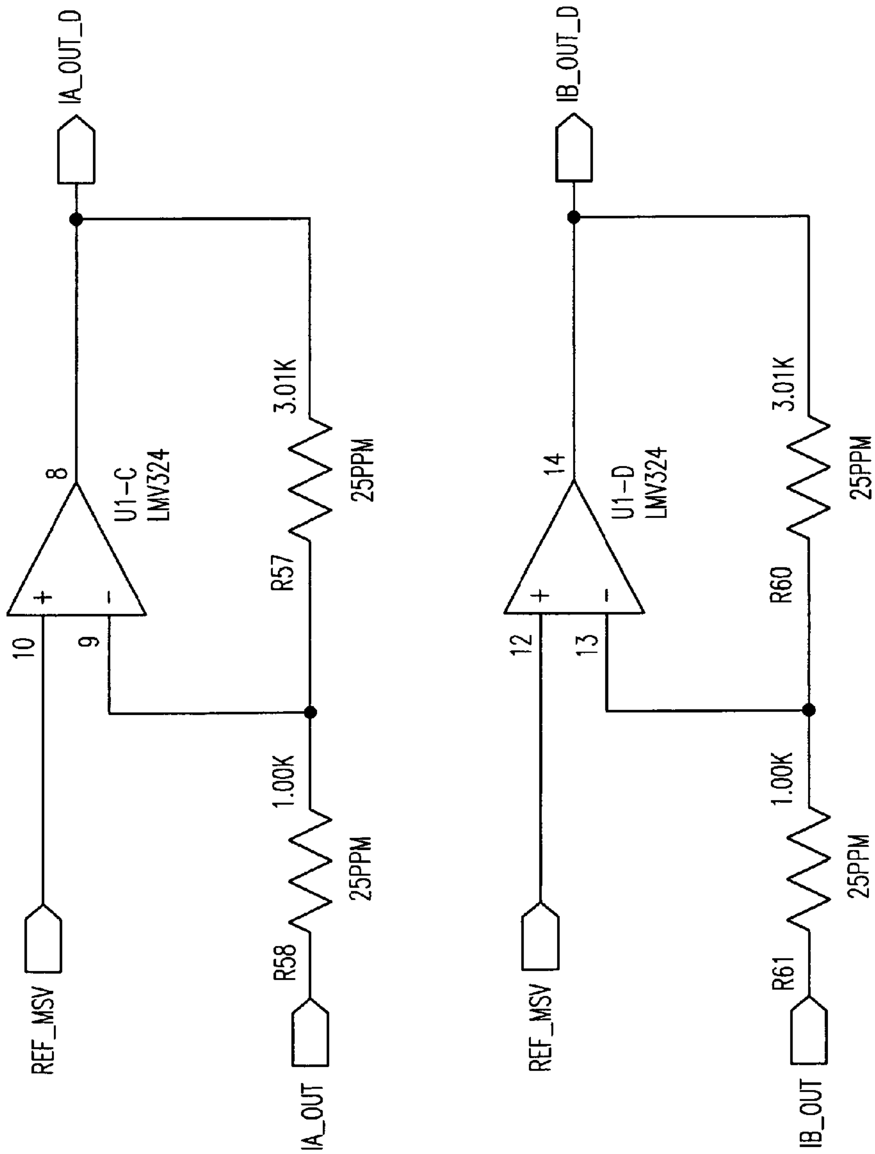
Figures 4, 26G:
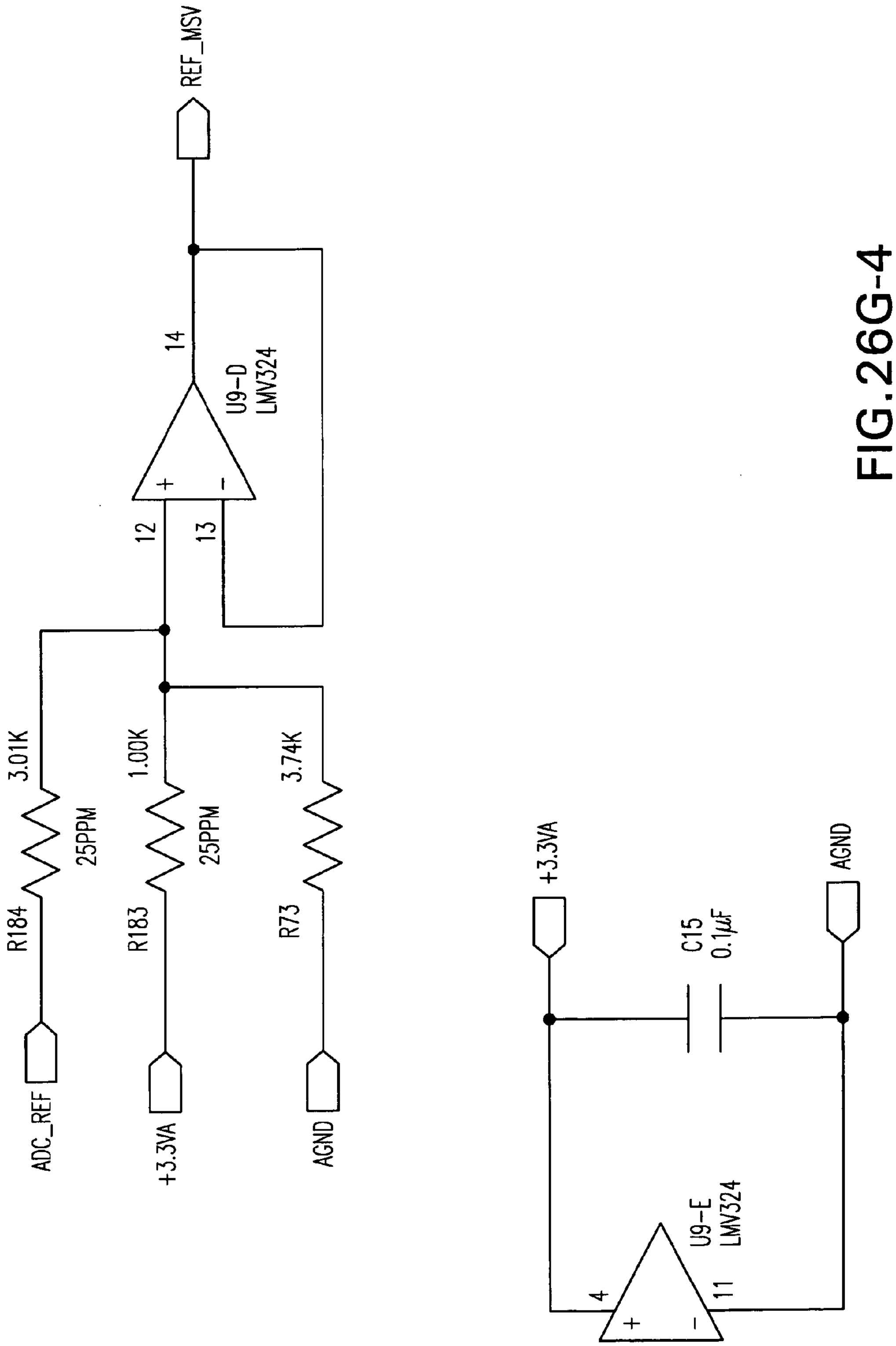
Figure 26H:
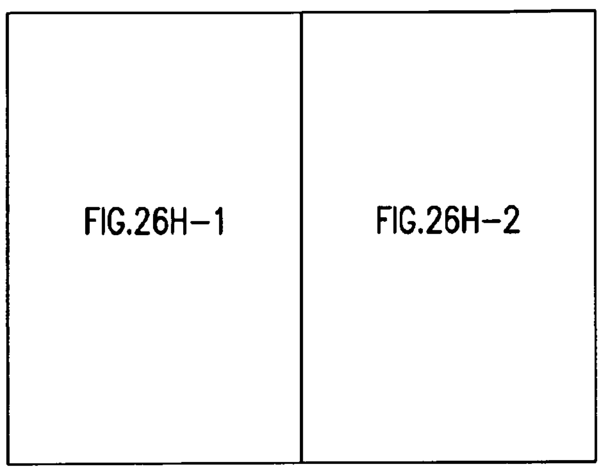
Figures 1, 26H:
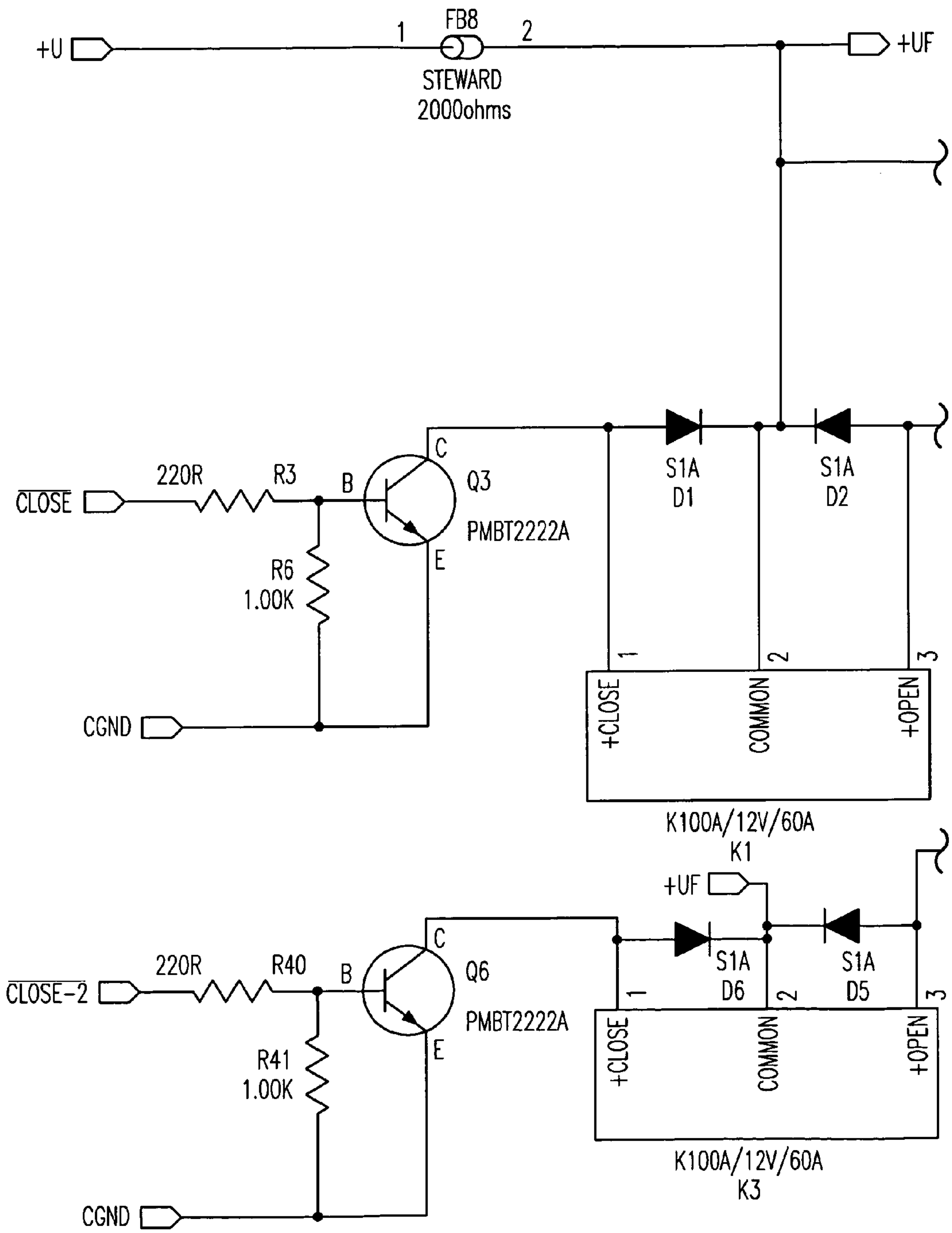
Figures 2, 26H:
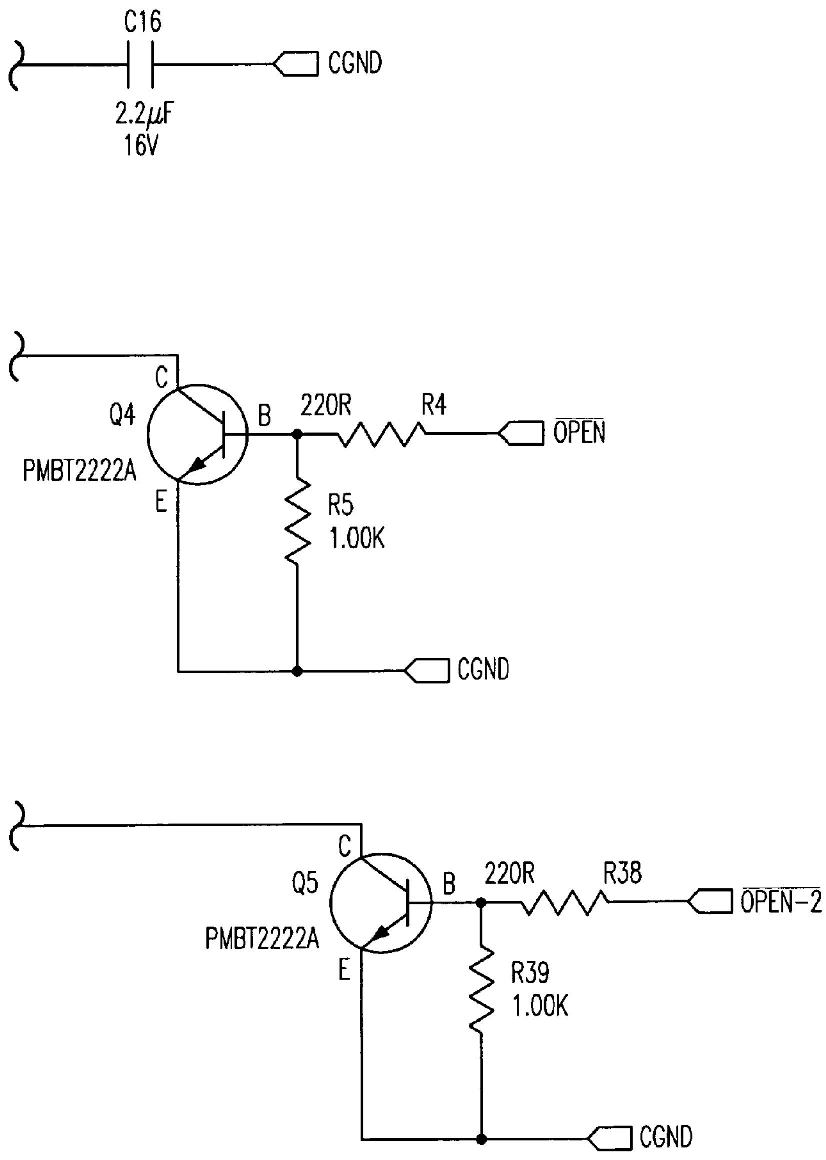
Figure 27:
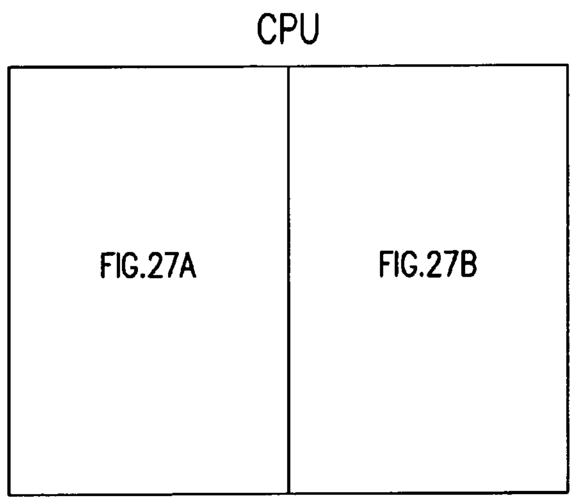
Figure 27A:
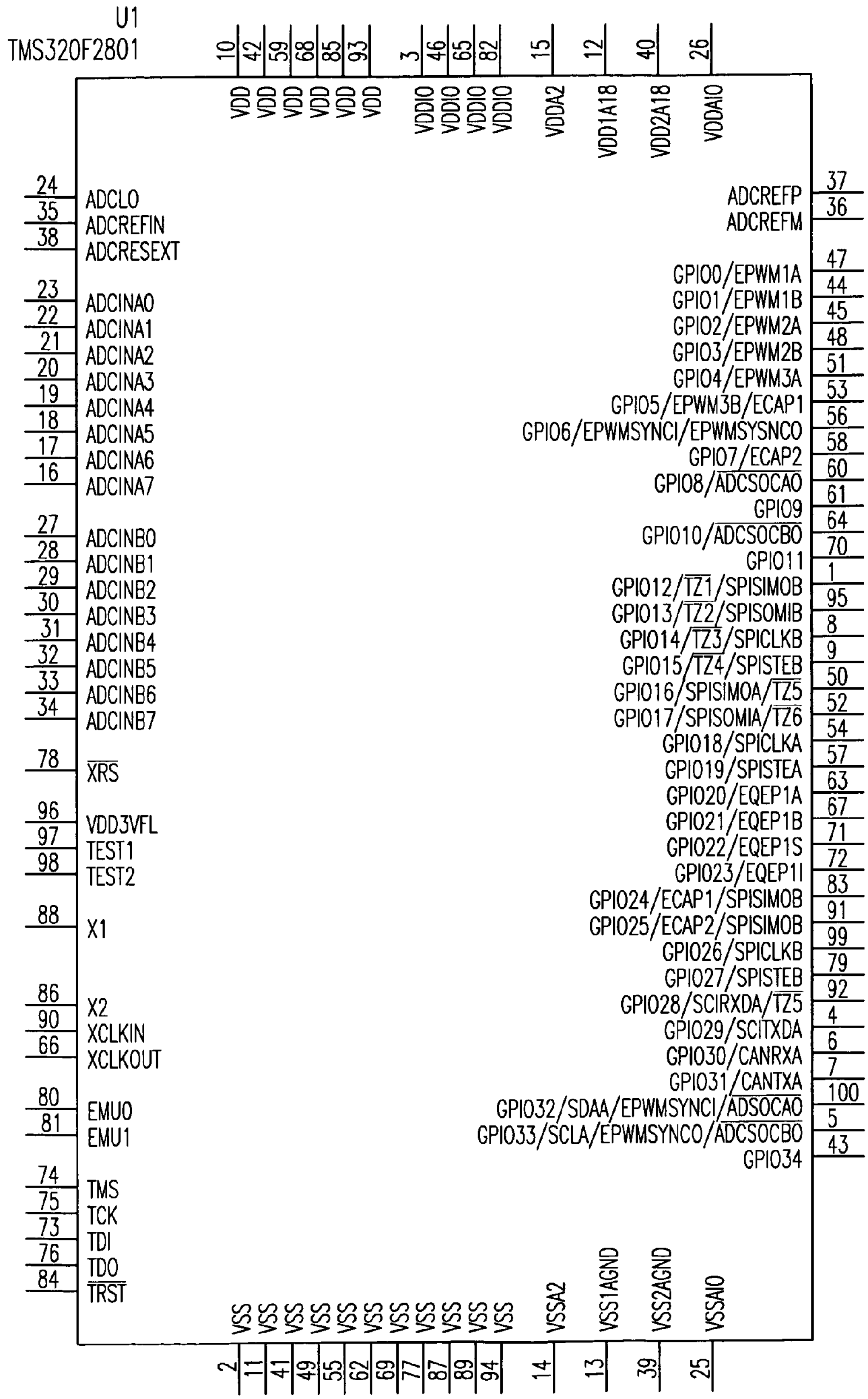
Figure 27B:
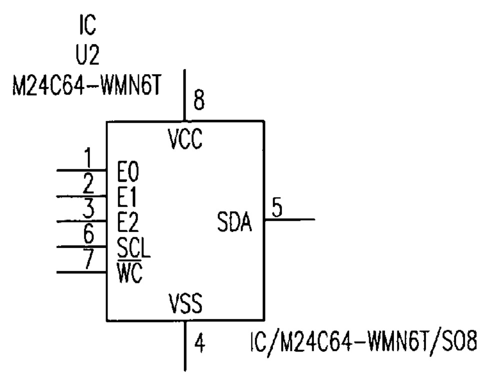
Figure 28A:
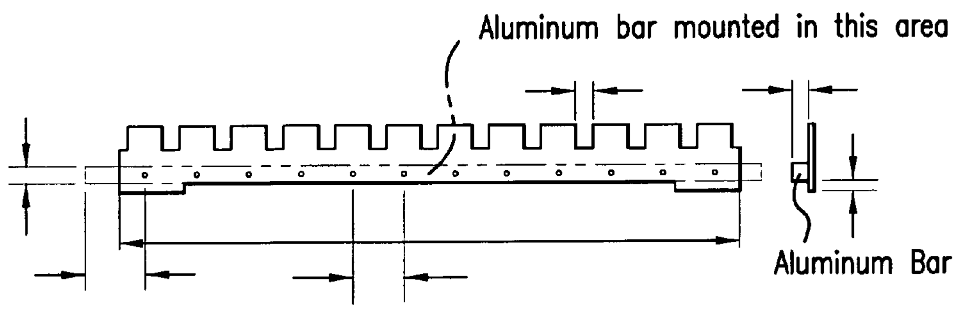
FIGS. 28A-C illustrate preferred schematics for a back place board.
Figure 28B:
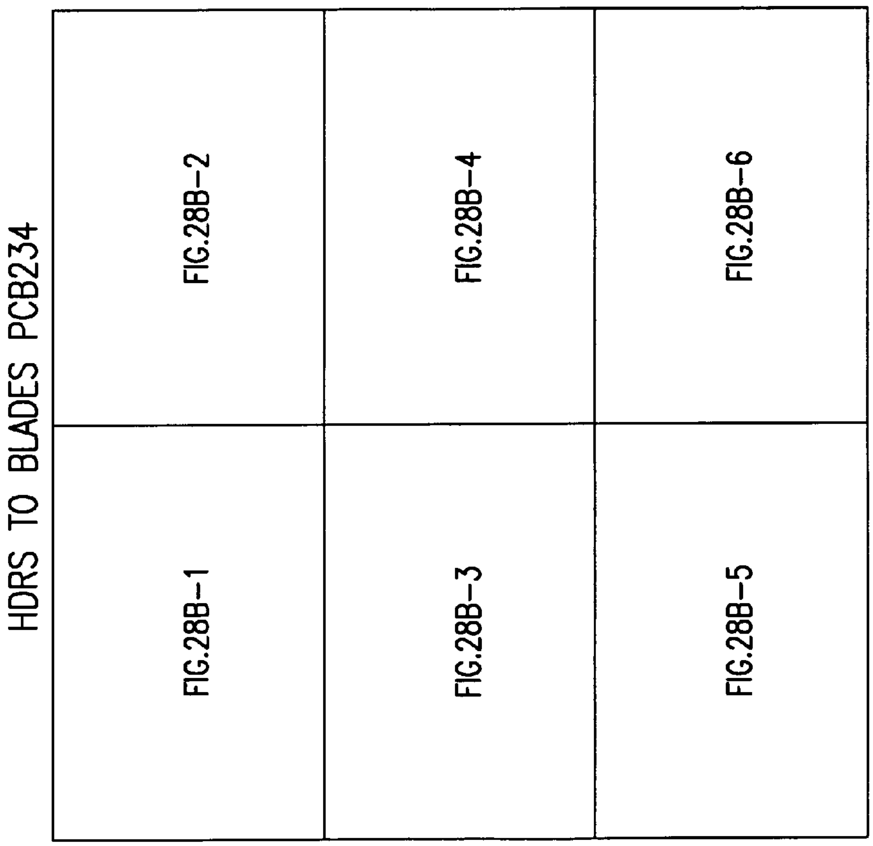
Figures 1, 28B:
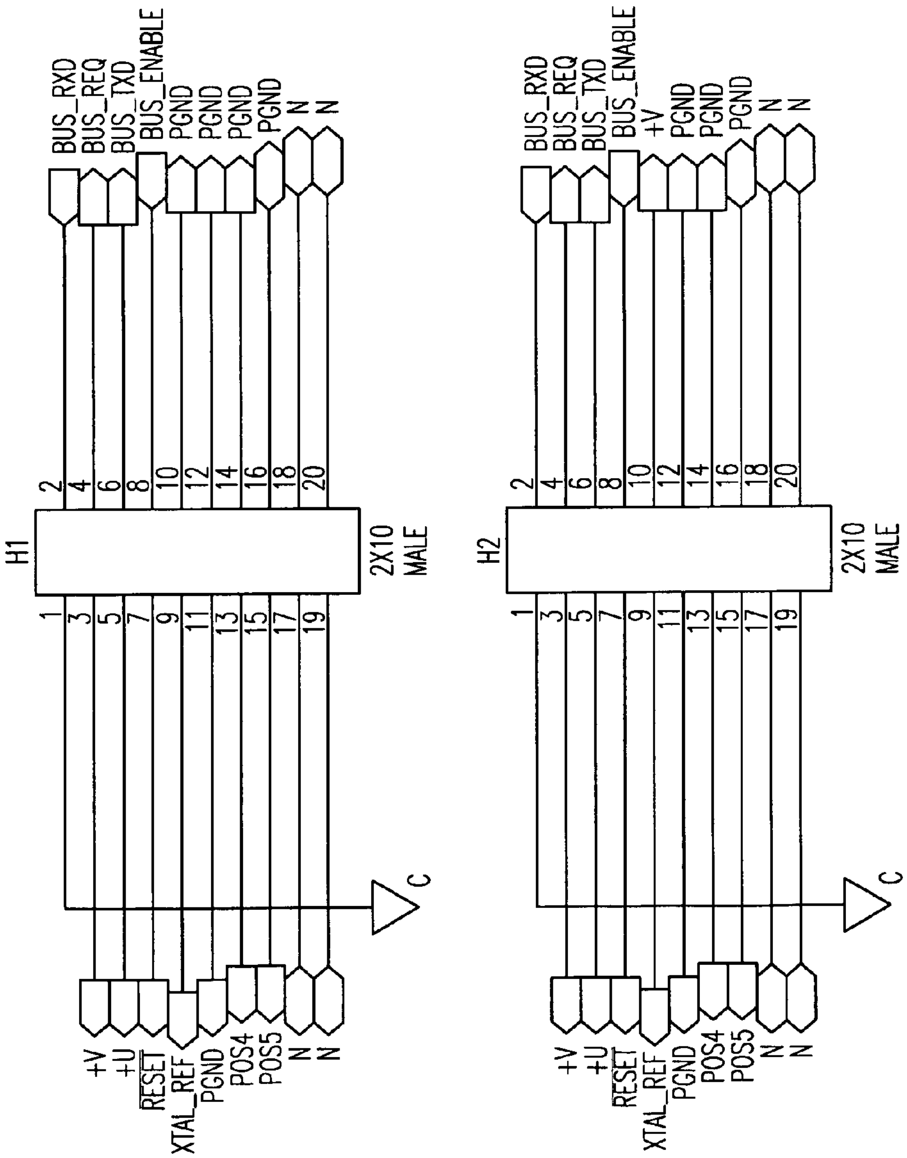
Figures 2, 28B:
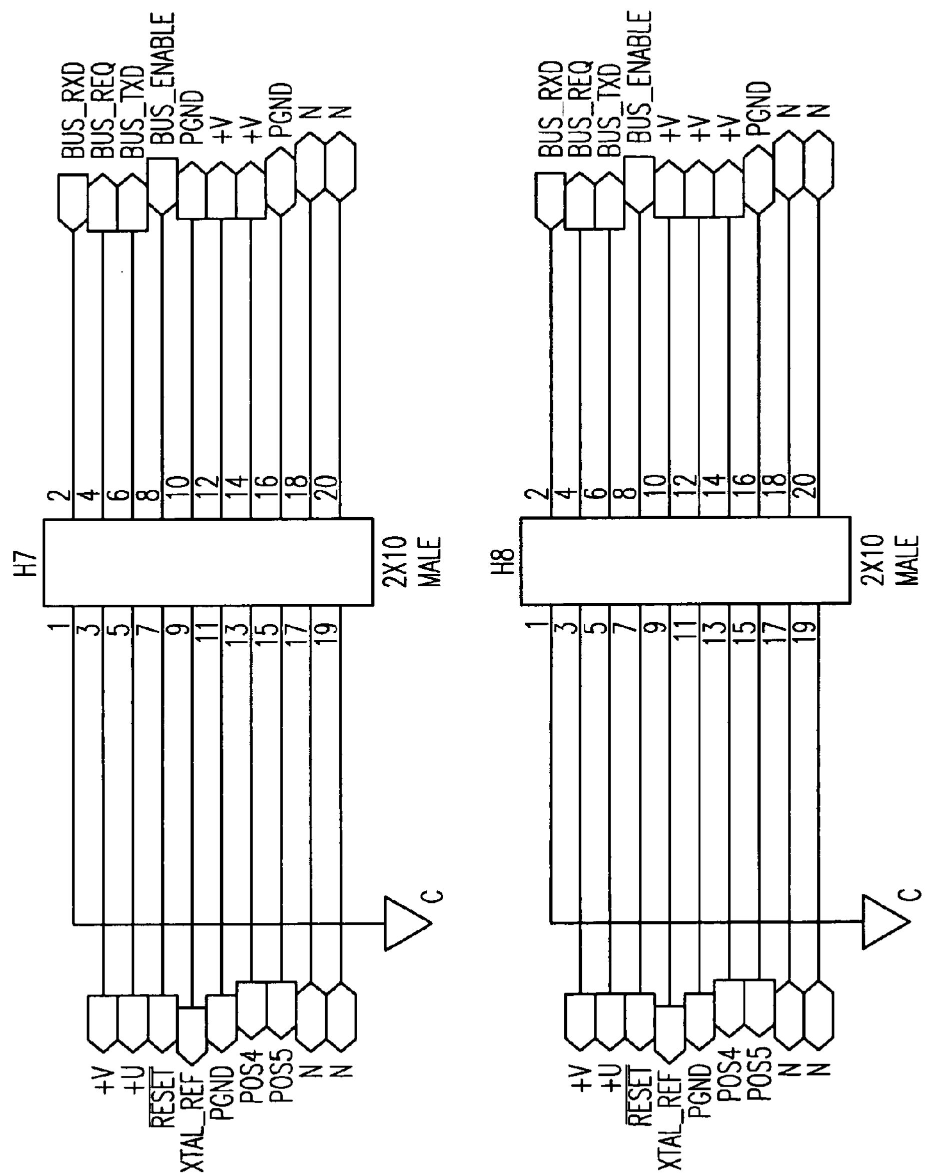
Figures 3, 28B:
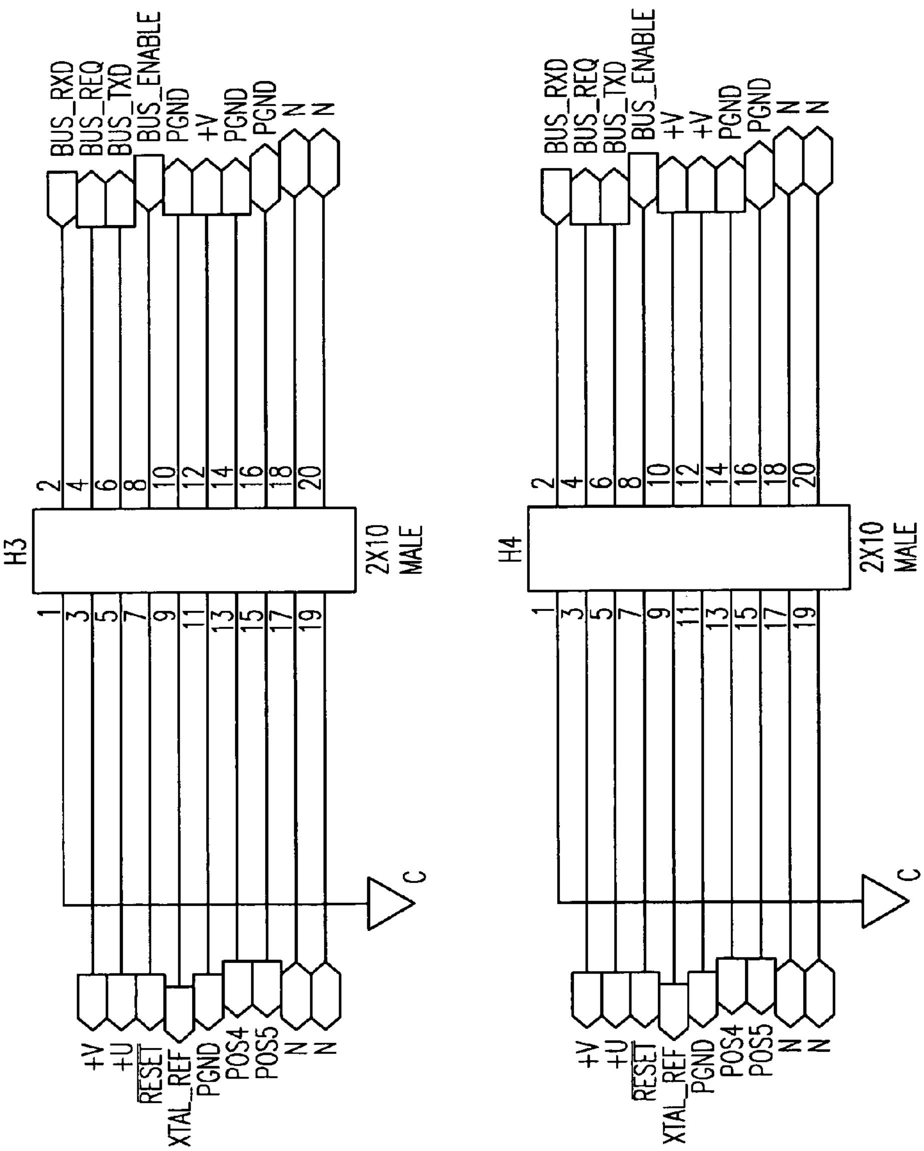
Figures 4, 28B:
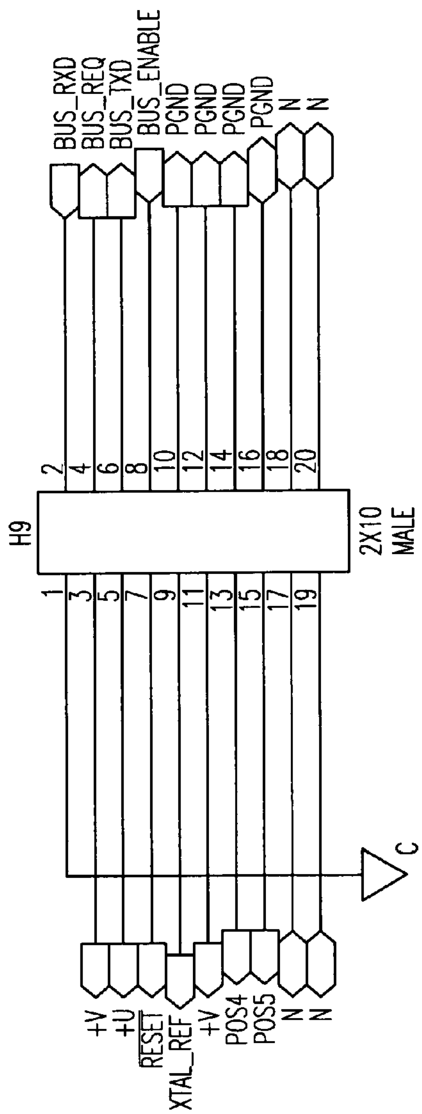
Figures 5, 28B:
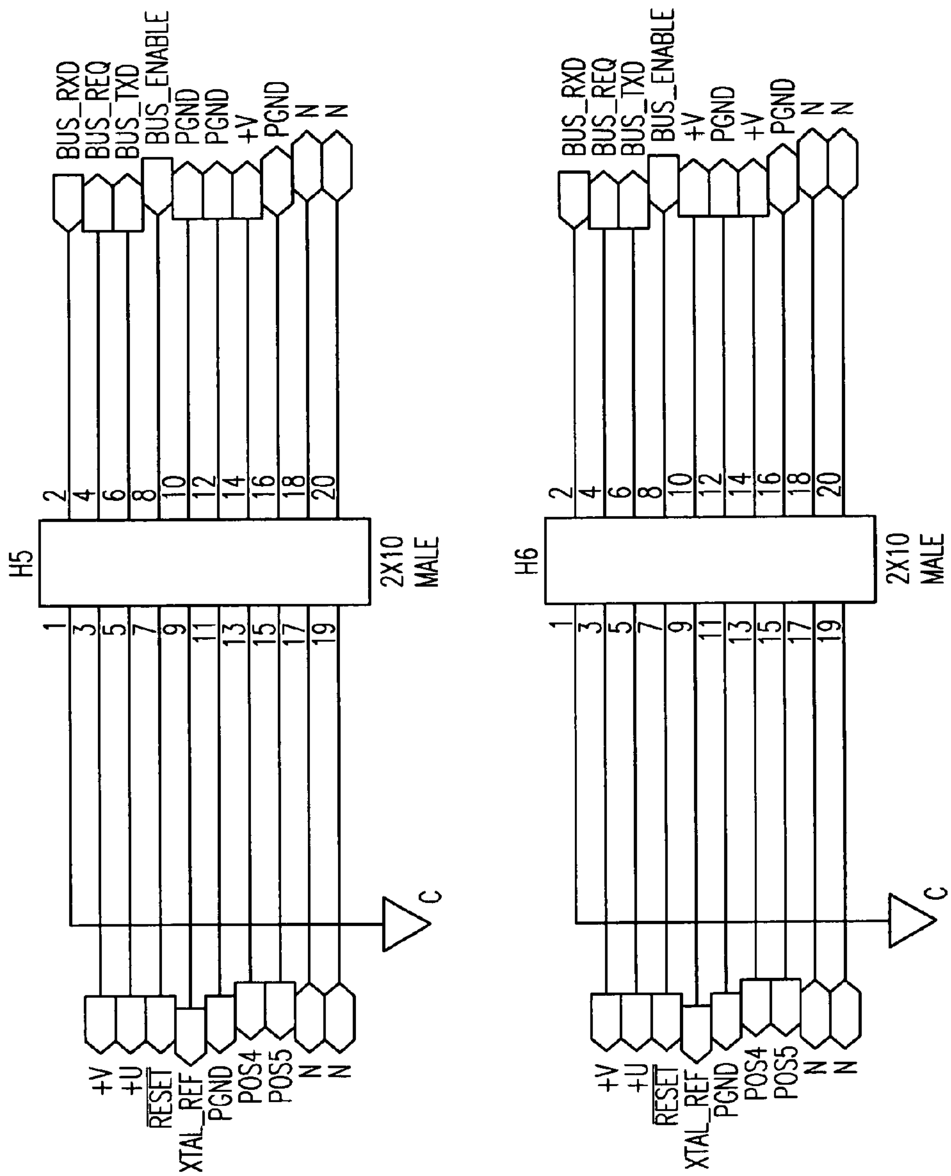
Figures 6, 28B:
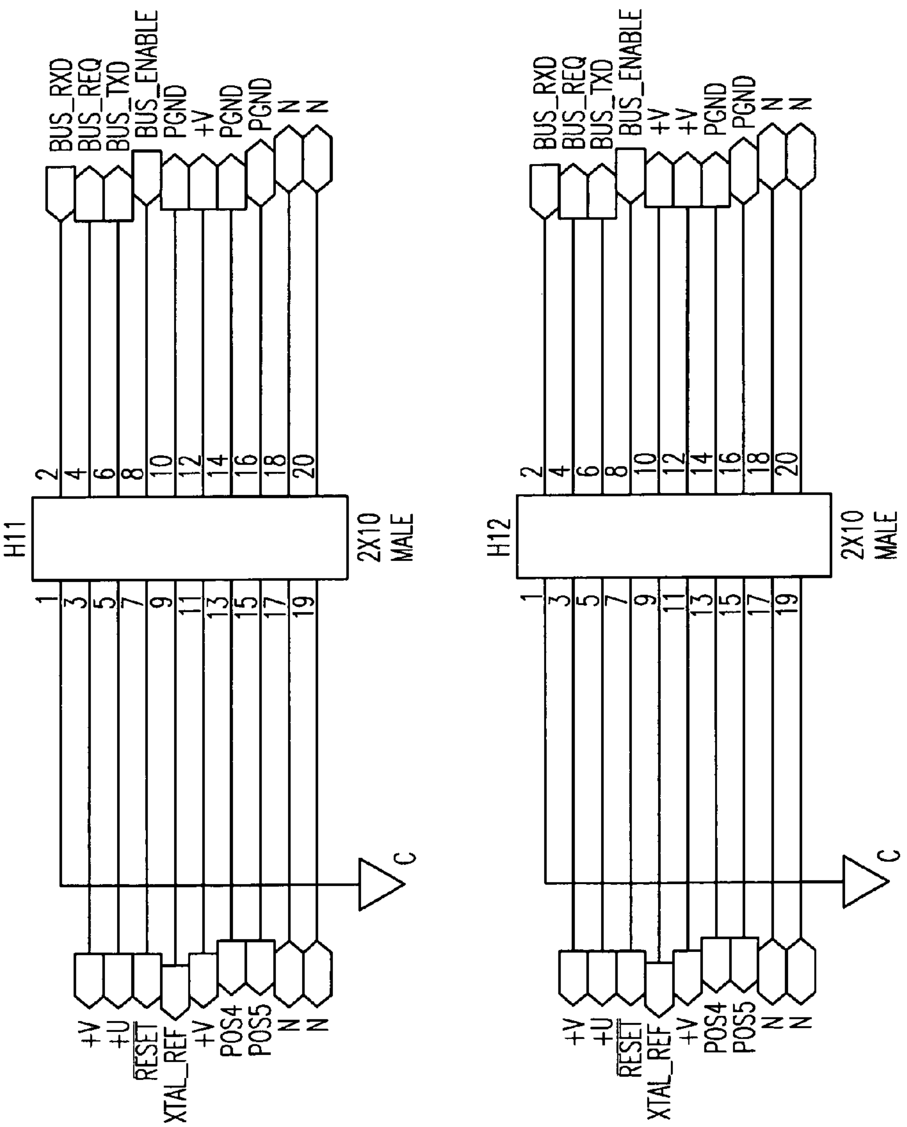
Figure 28C:
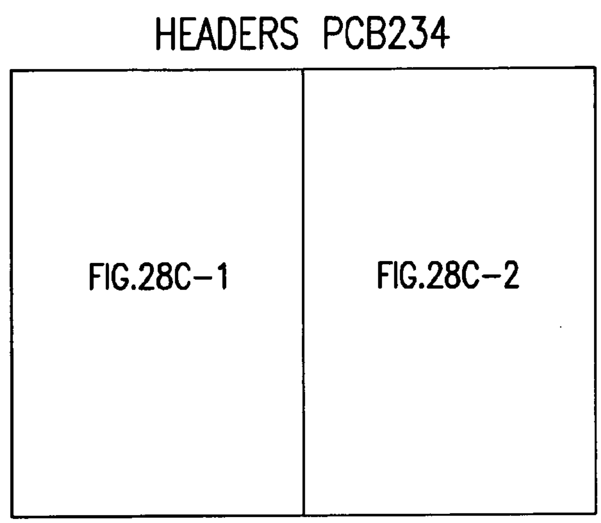
Figures 1, 28C:
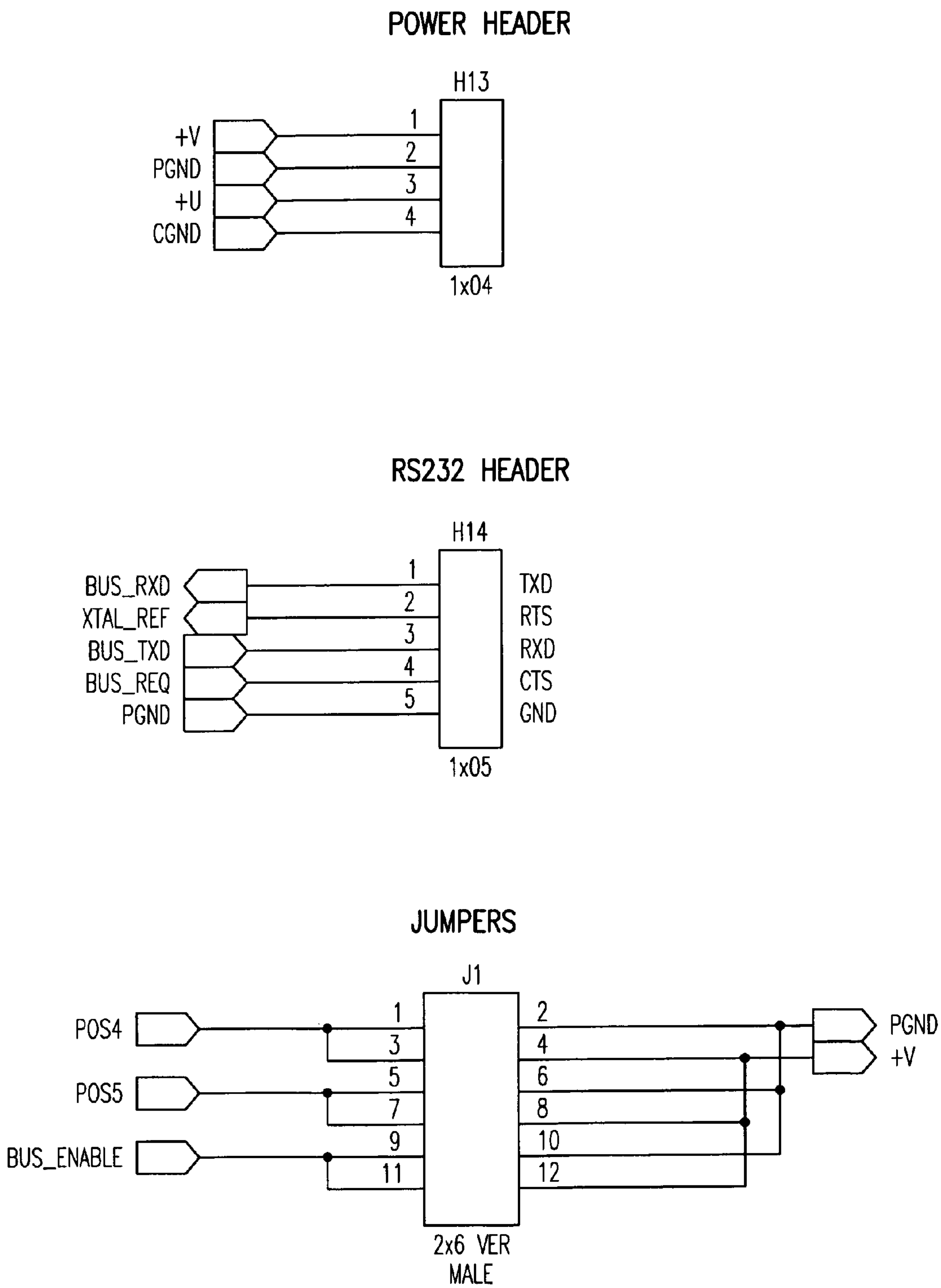
Figure 29A:
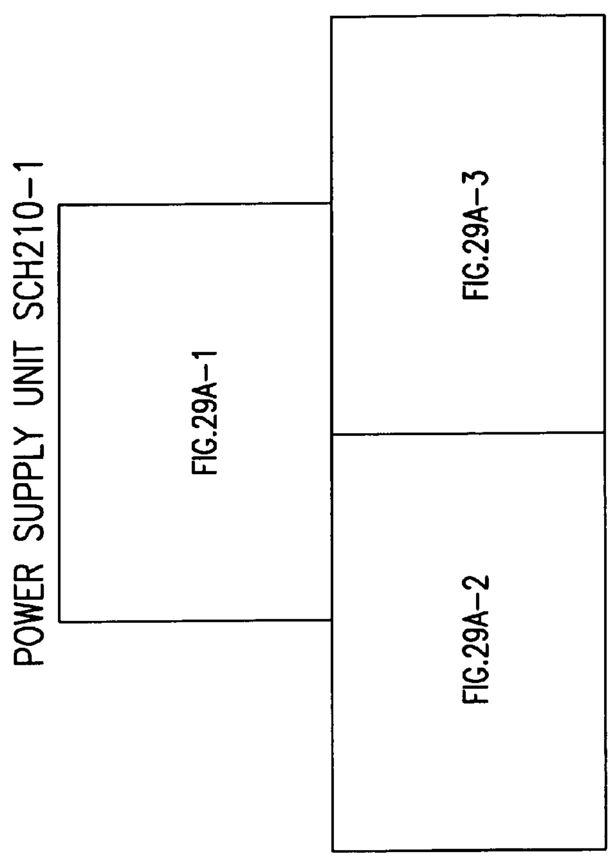
FIGS. 29A-B illustrate preferred schematics for a power board.
Figures 1, 29A:
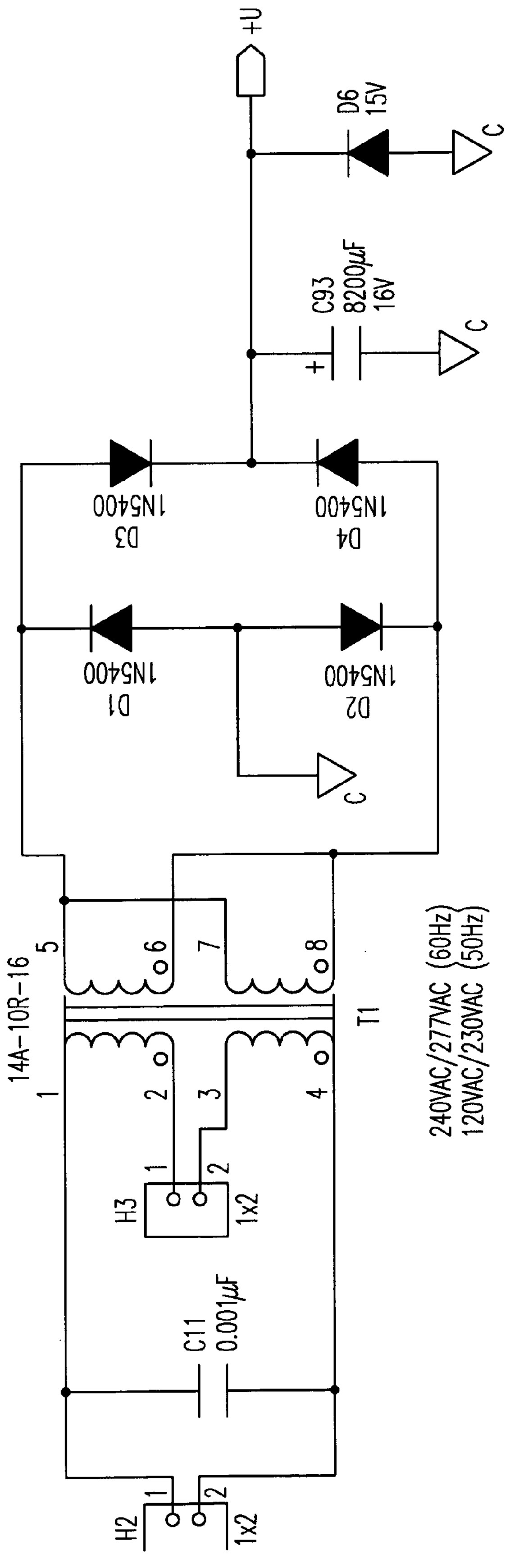
Figures 2, 29A:
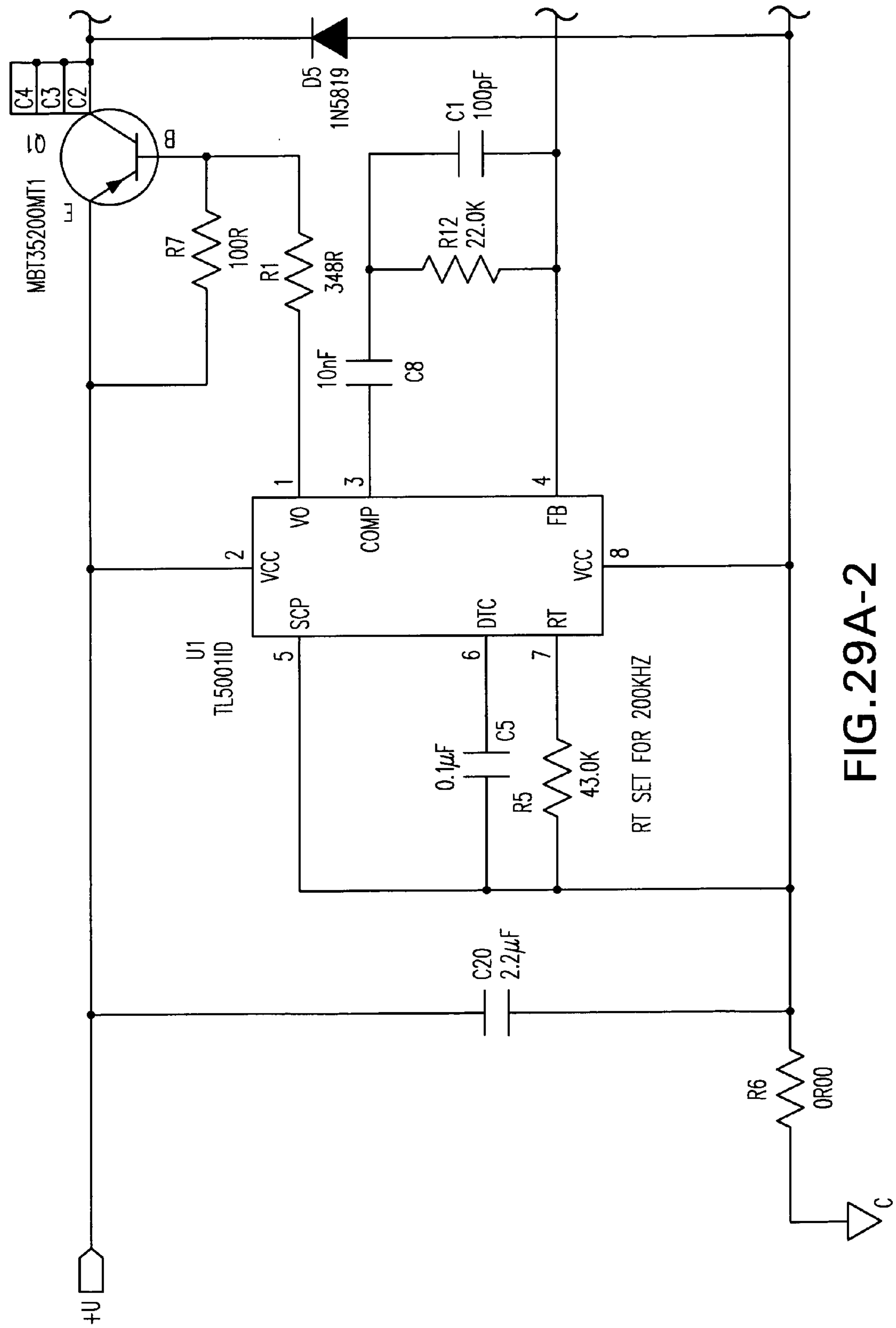
Figures 3, 29A:
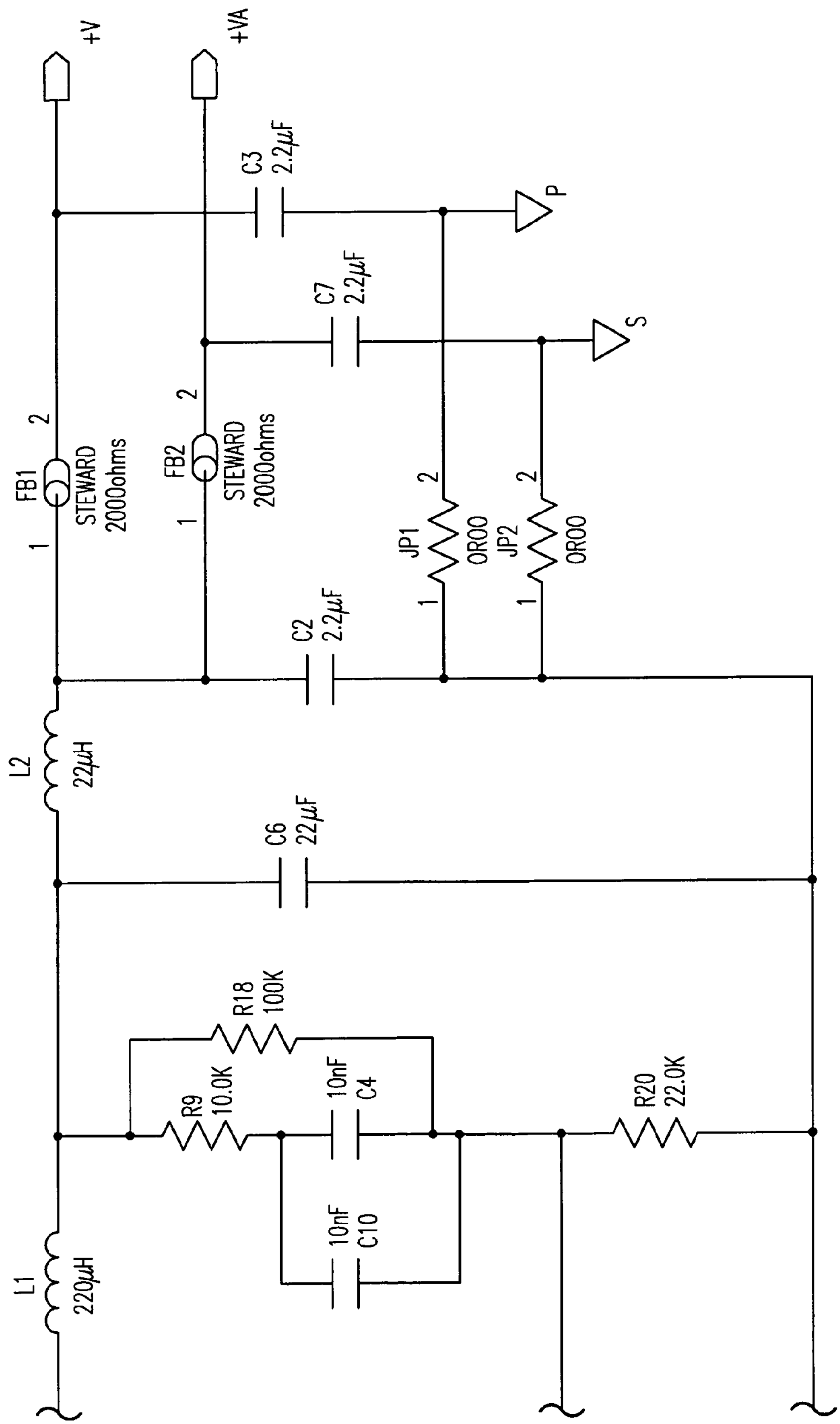
Figure 29B:
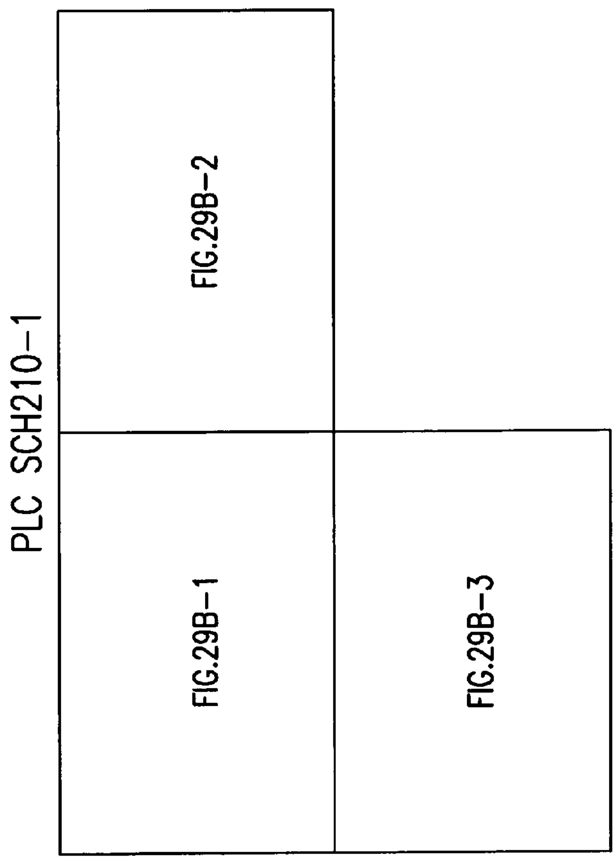
Figures 1, 29B:
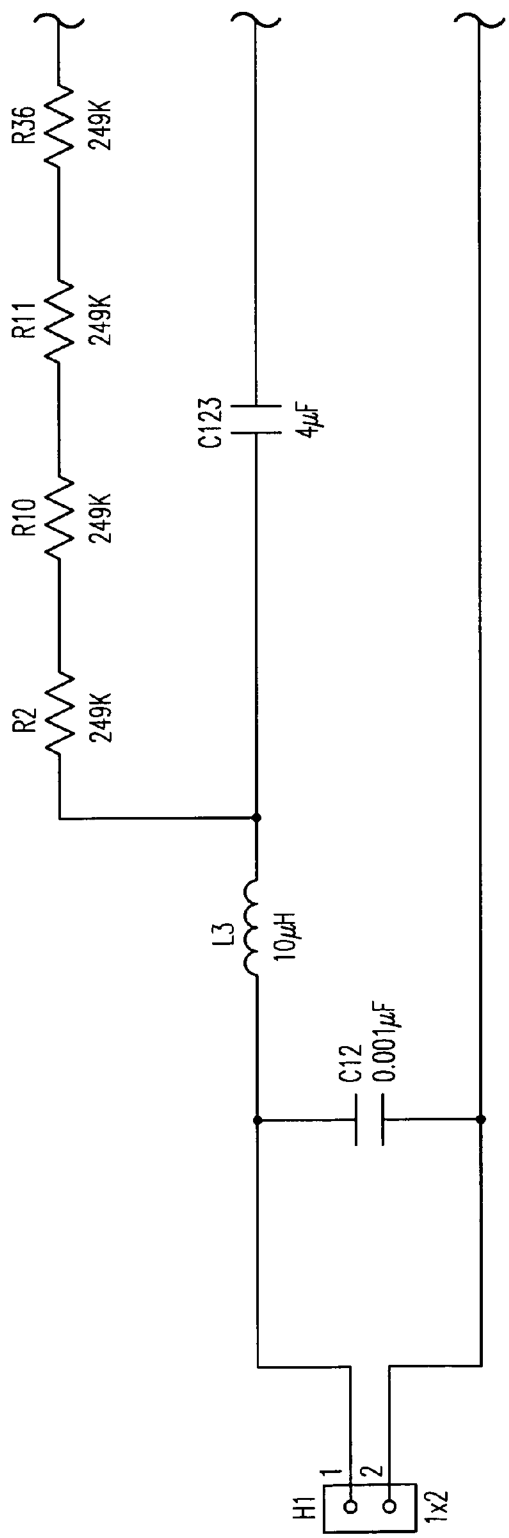
Figures 2, 29B:
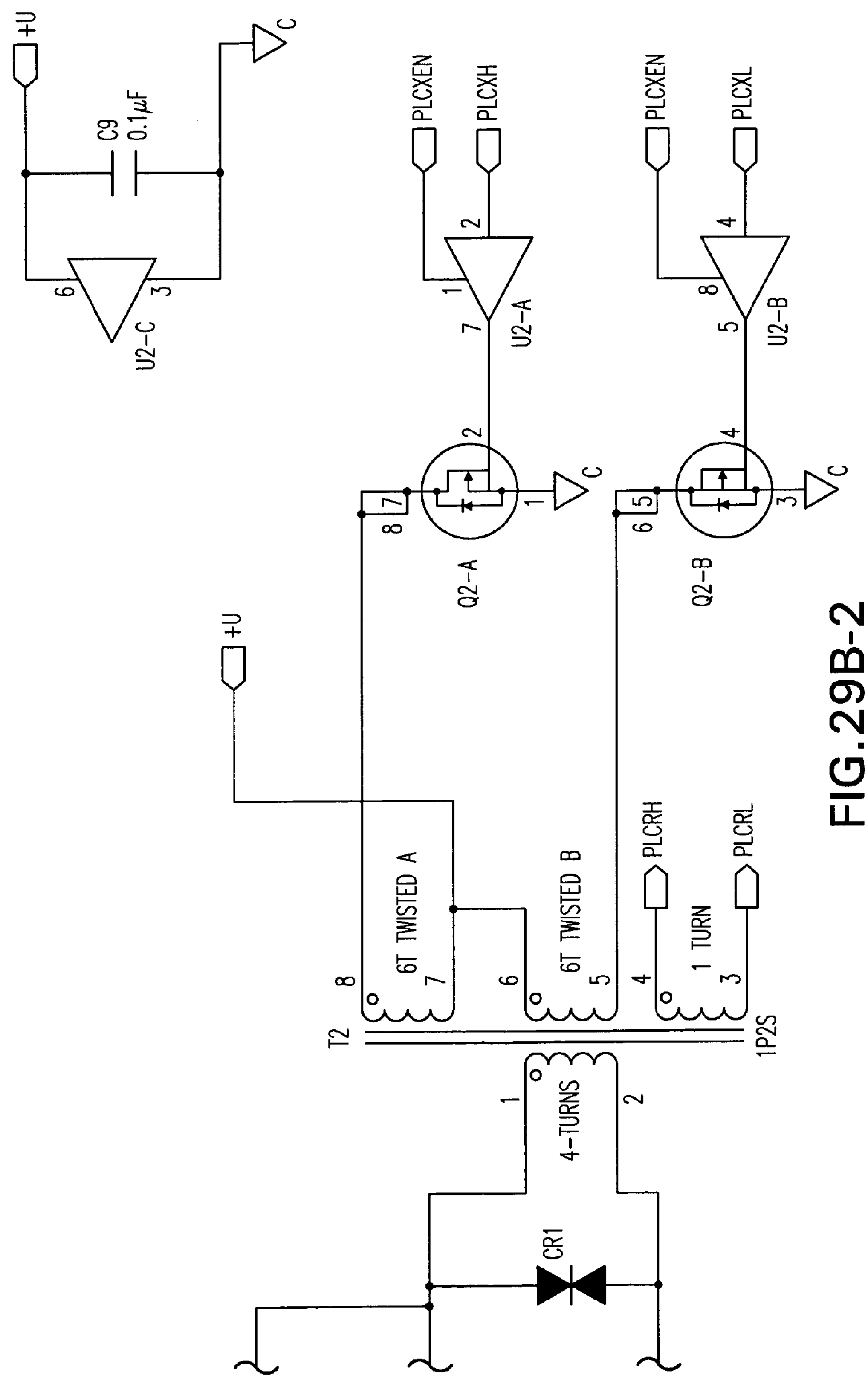
Figures 3, 29B:
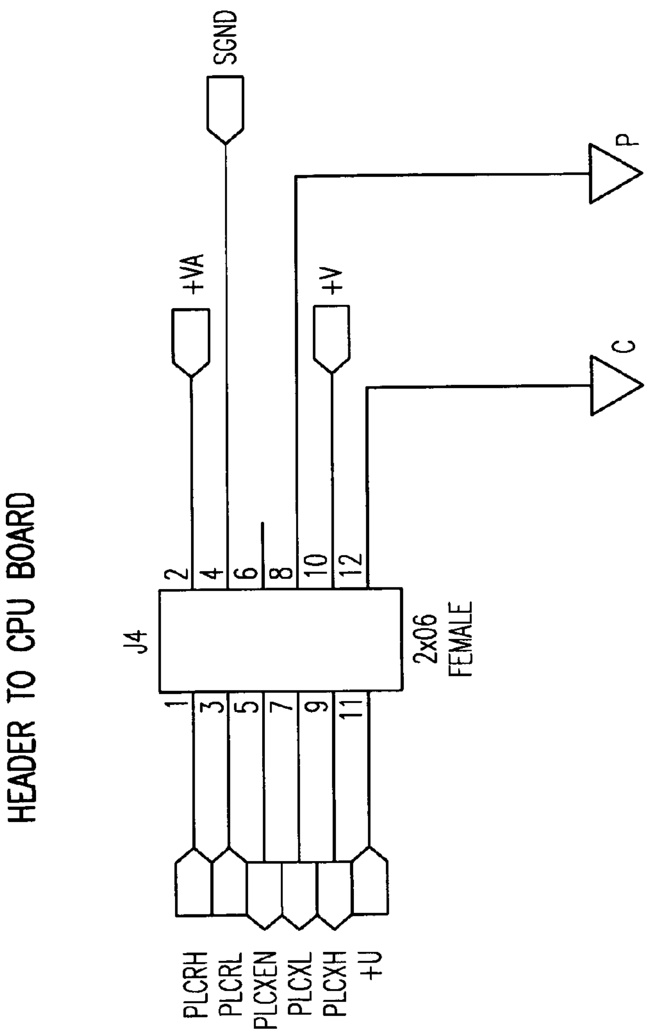
Figure 30A:
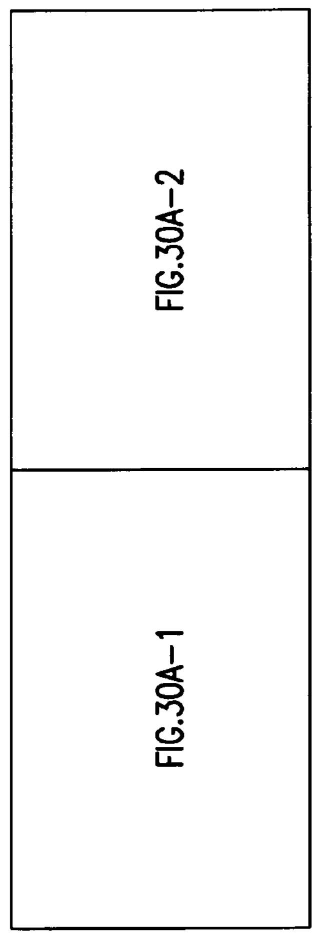
FIGS. 30A-G illustrate preferred schematics for an I/O extension board.
Figures 1, 30A:
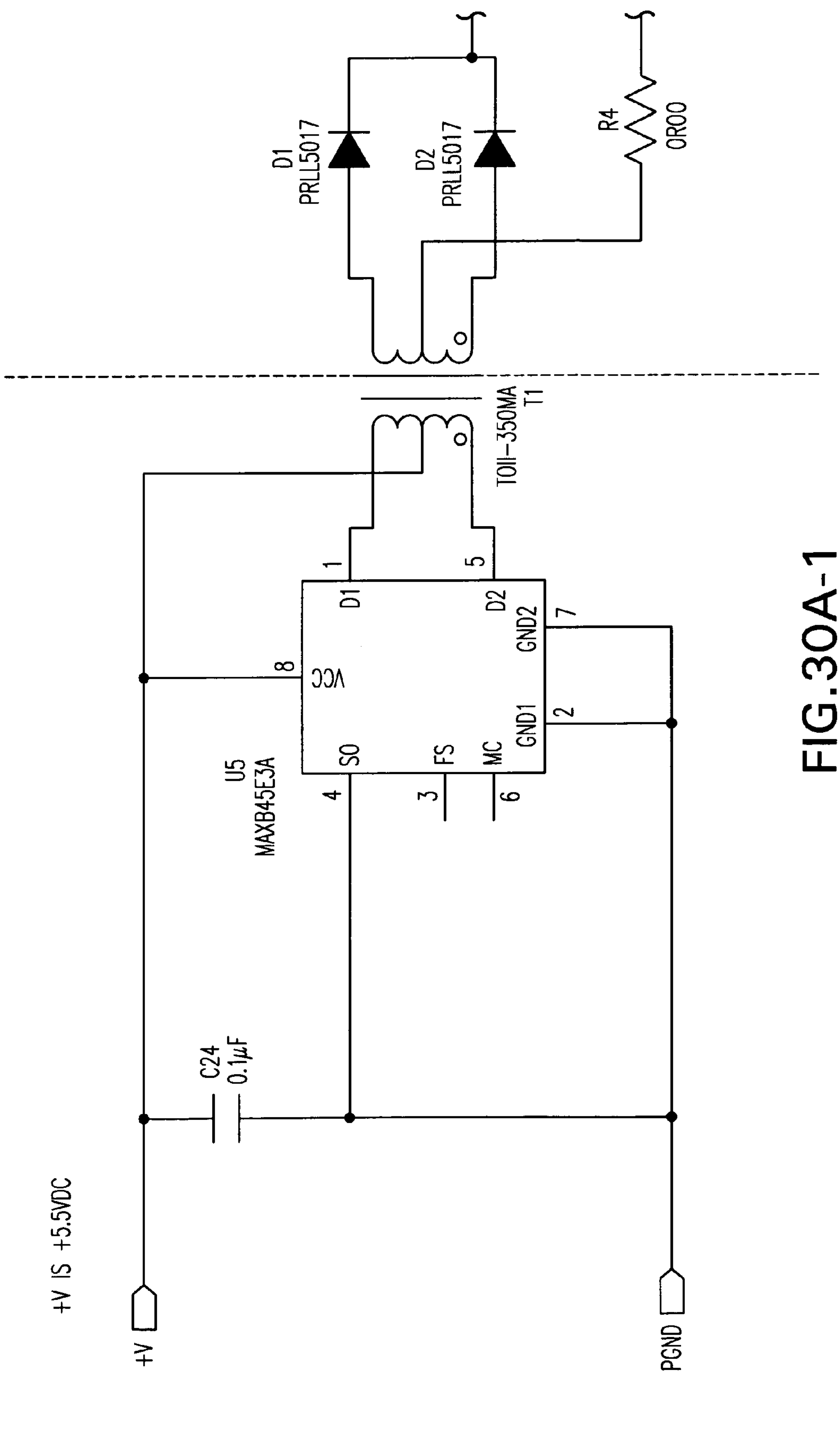
Figures 2, 30A:
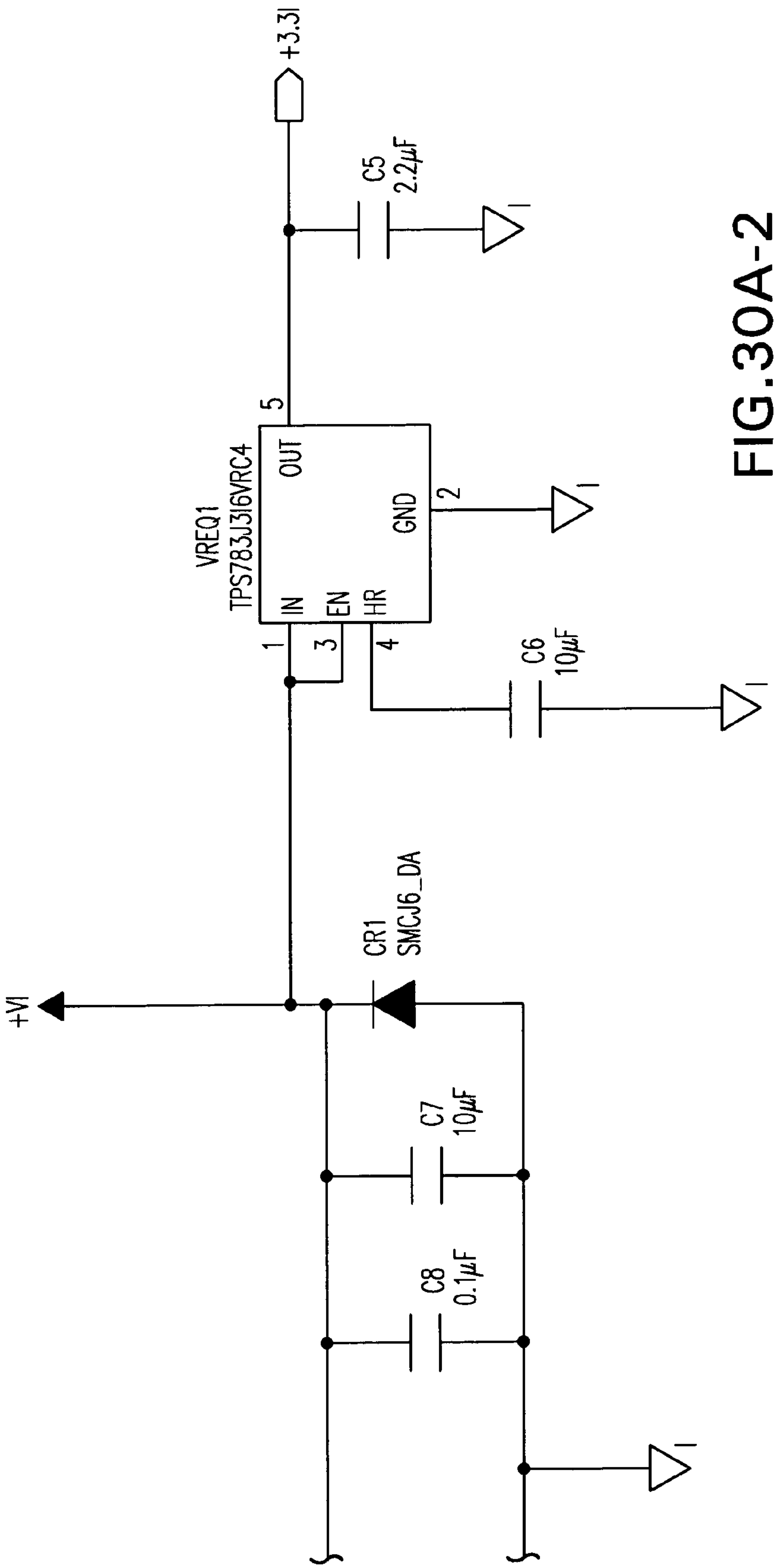
Figure 30B:
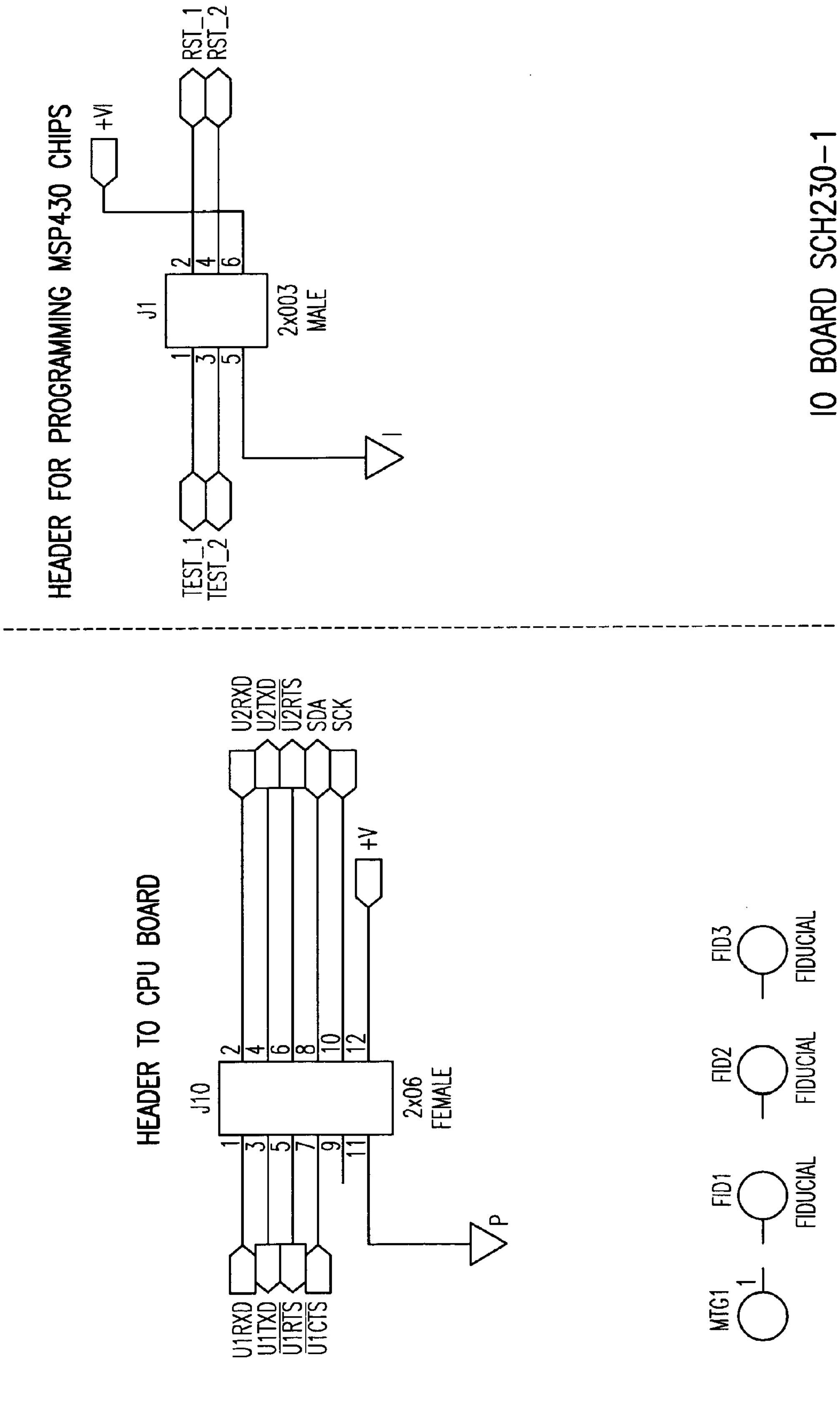
Figure 30C:
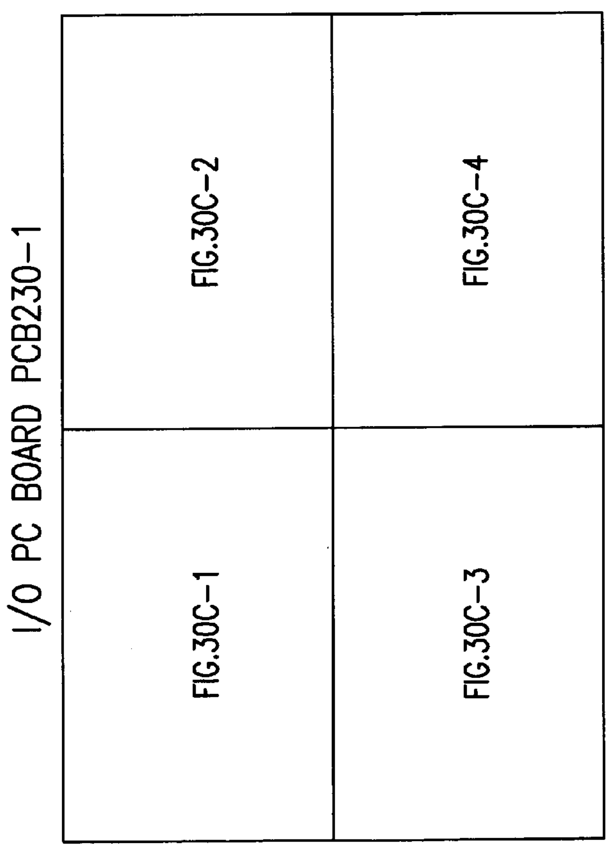
Figures 1, 30C:
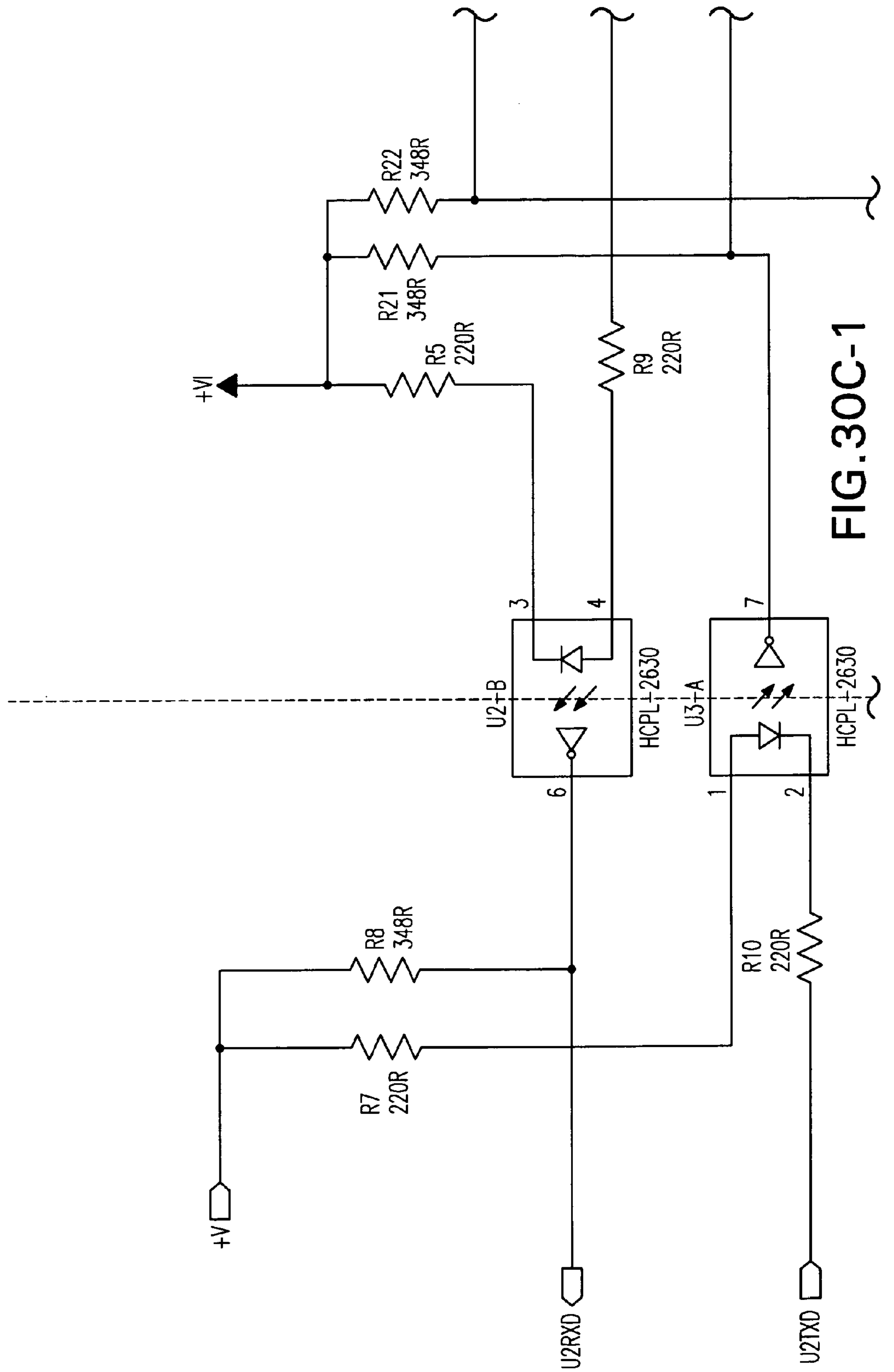
Figures 2, 30C:
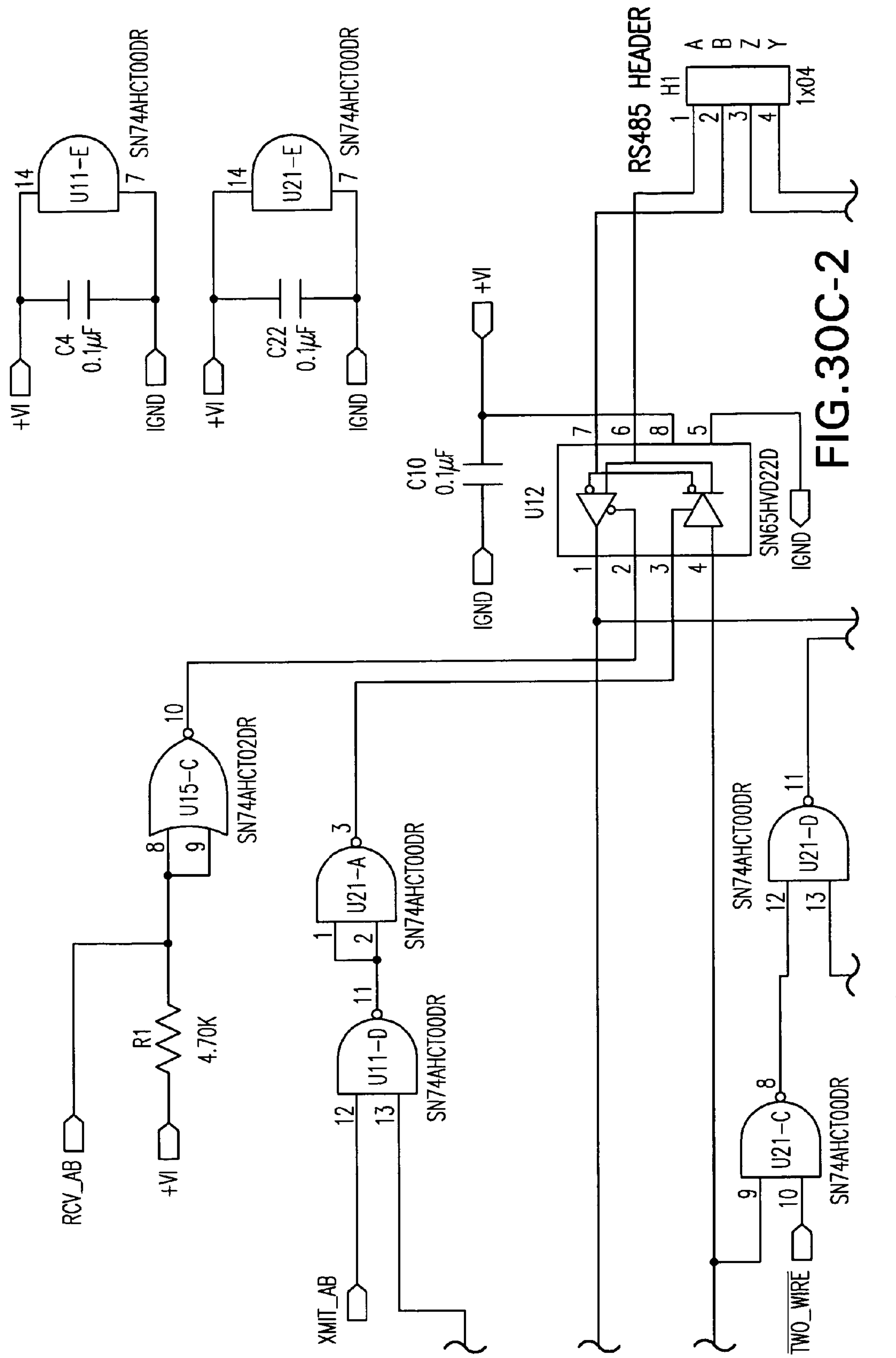
Figures 3, 30C:
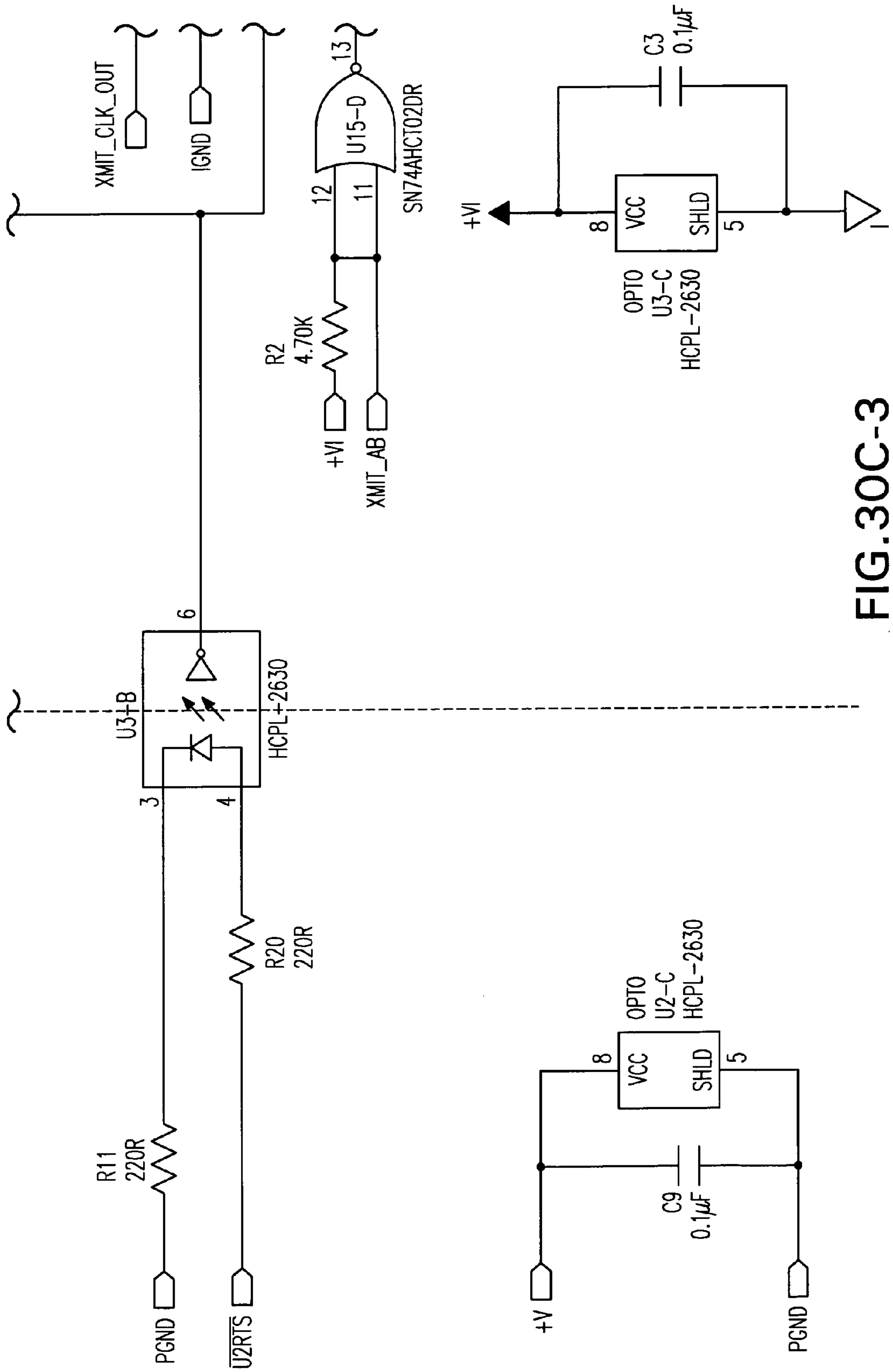
Figures 4, 30C:
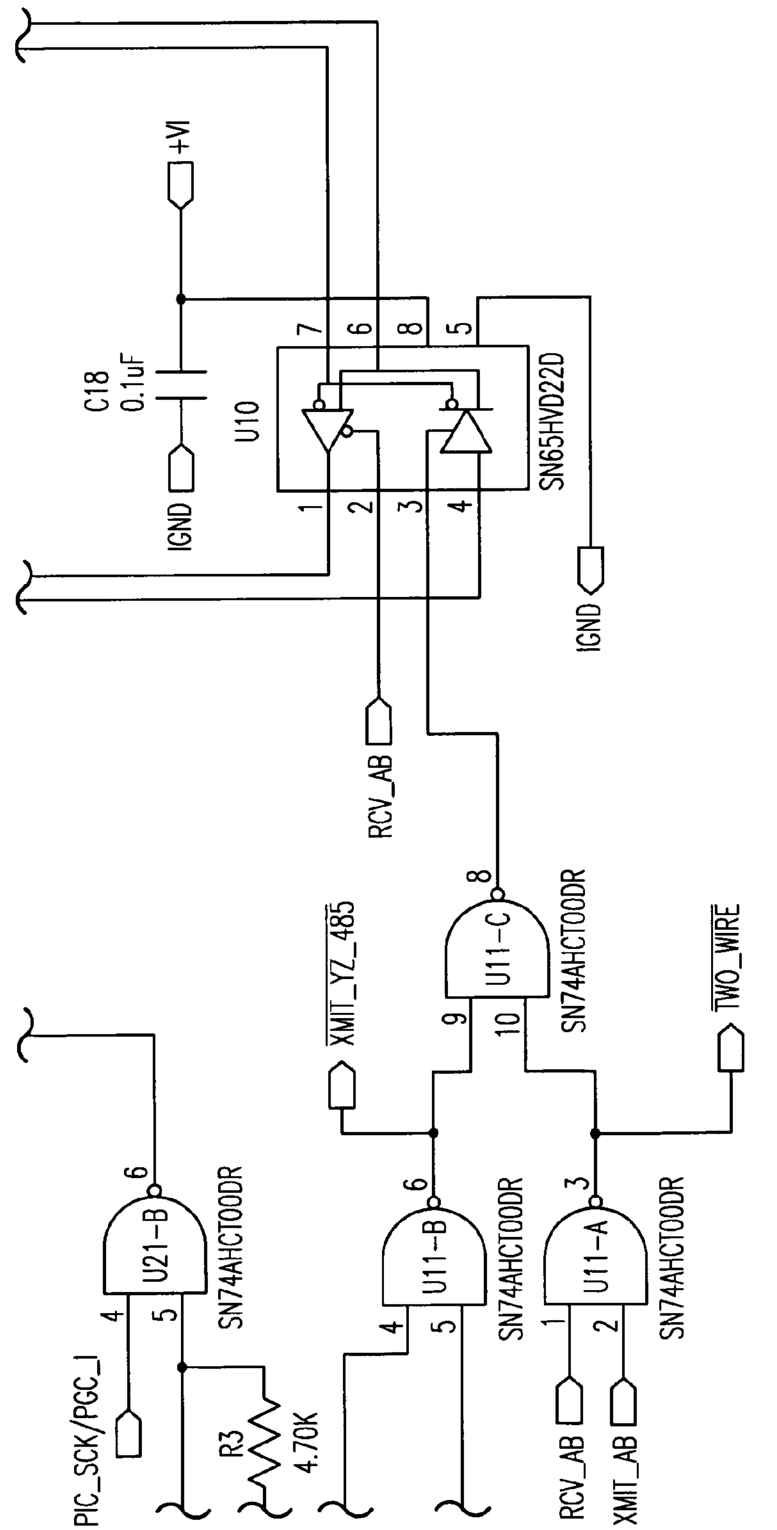
Figure 30D:
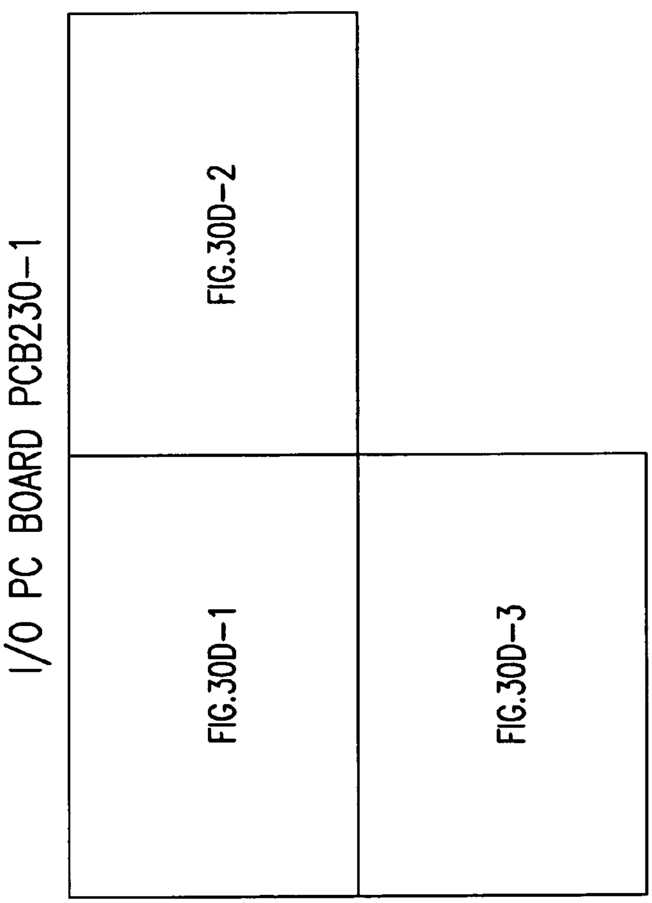
Figures 1, 30D:
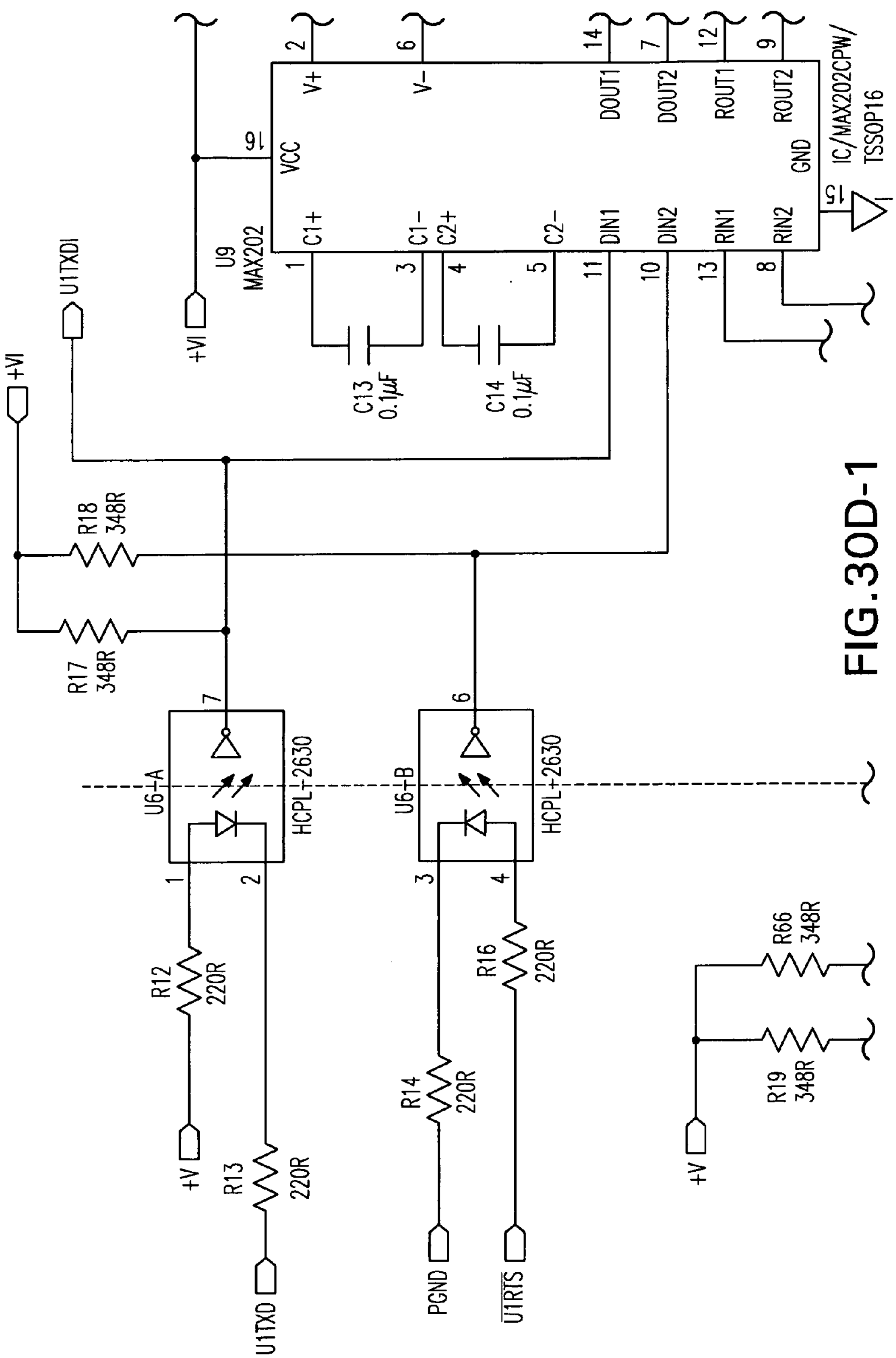
Figures 2, 30D:
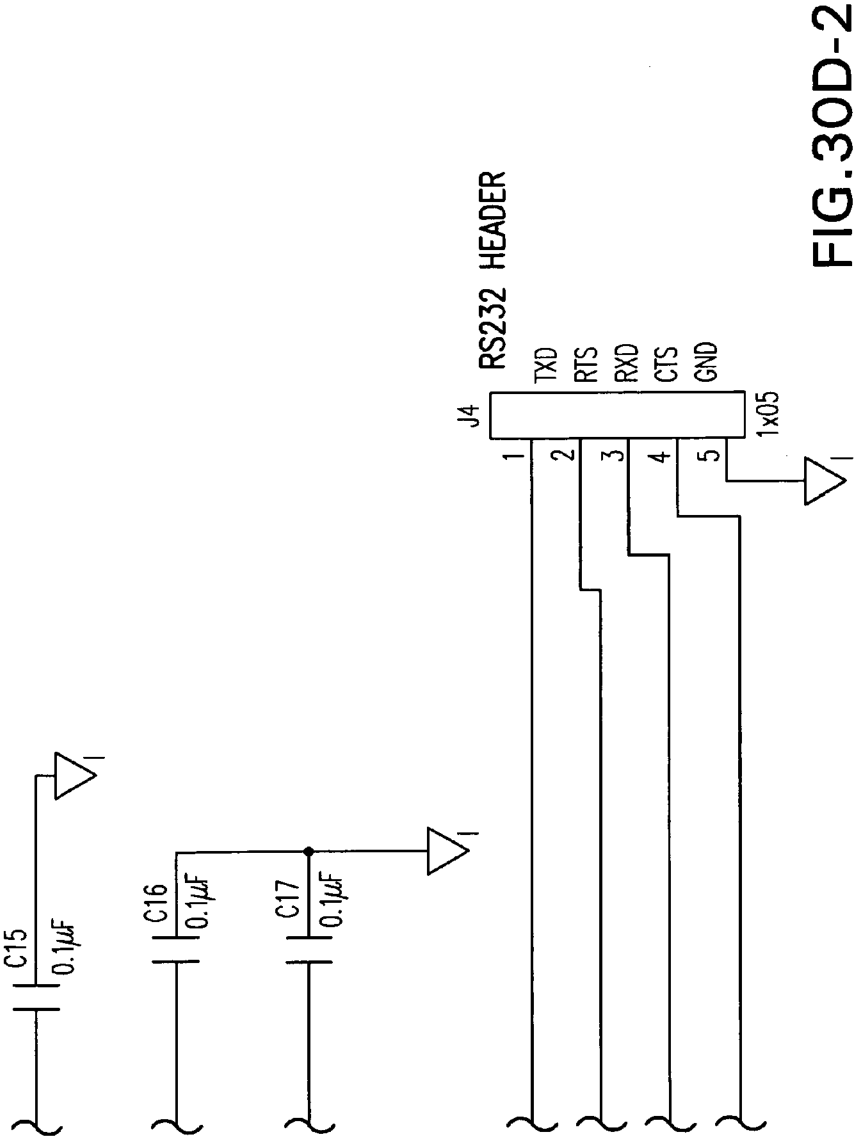
Figures 3, 30D:
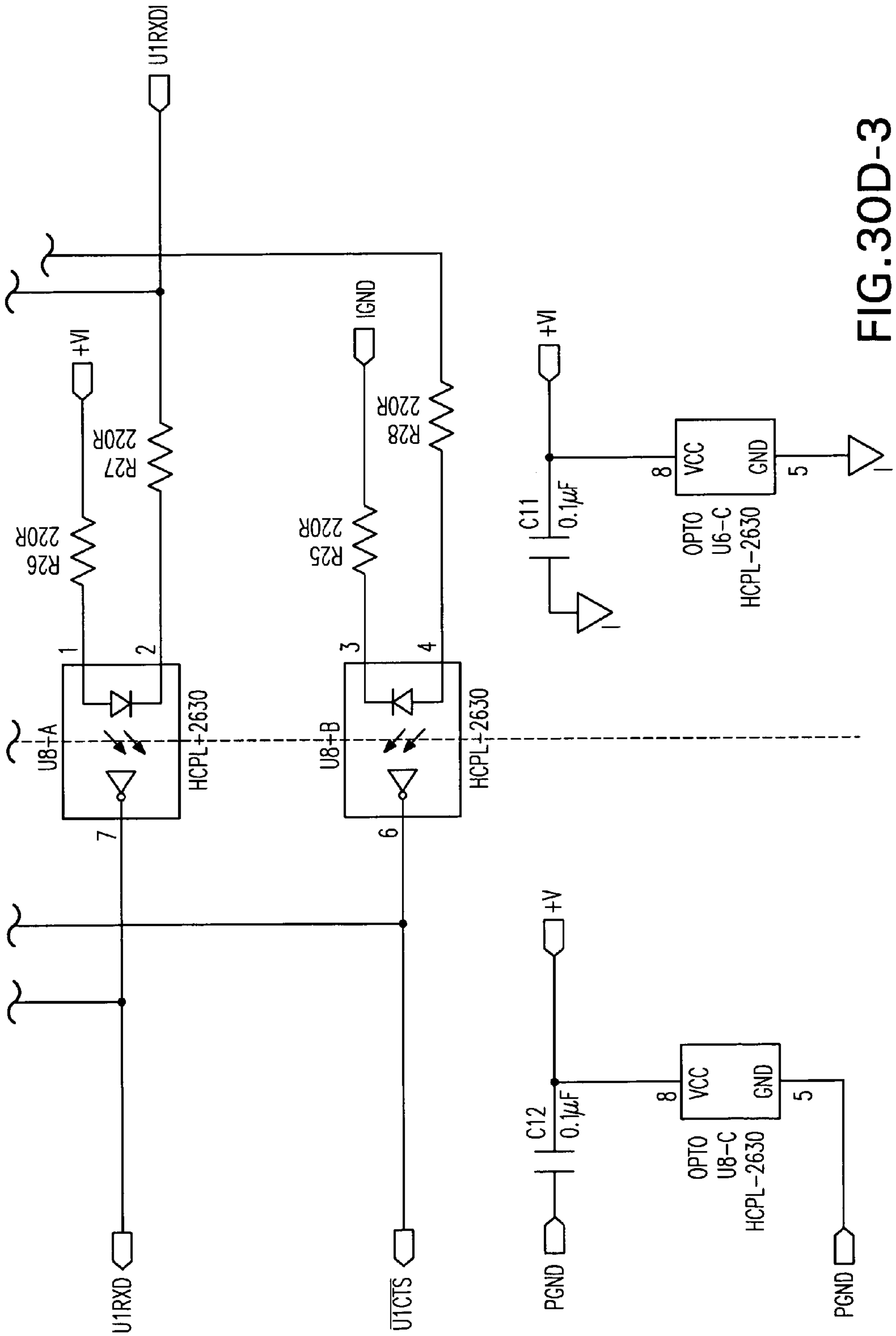
Figure 30E:
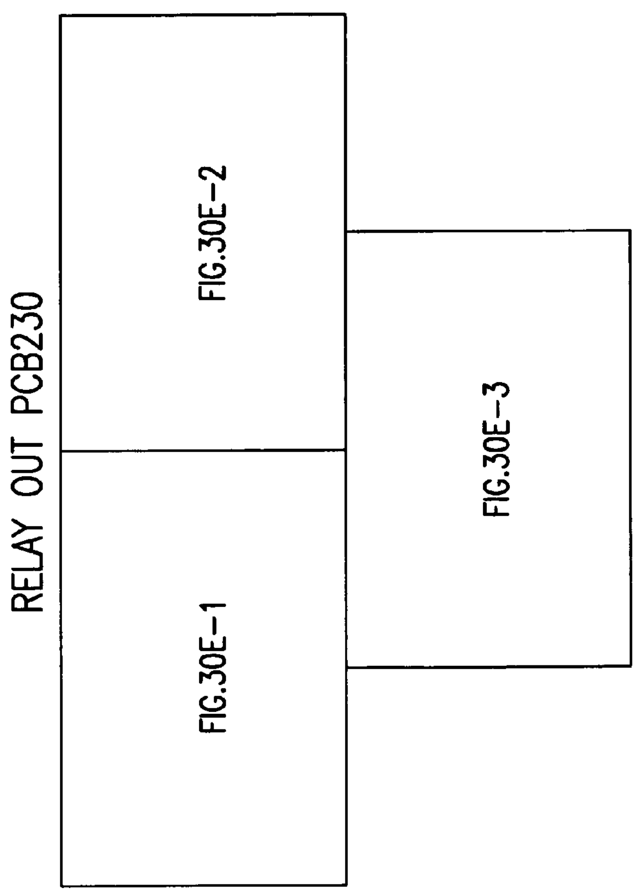
Figures 1, 30E:
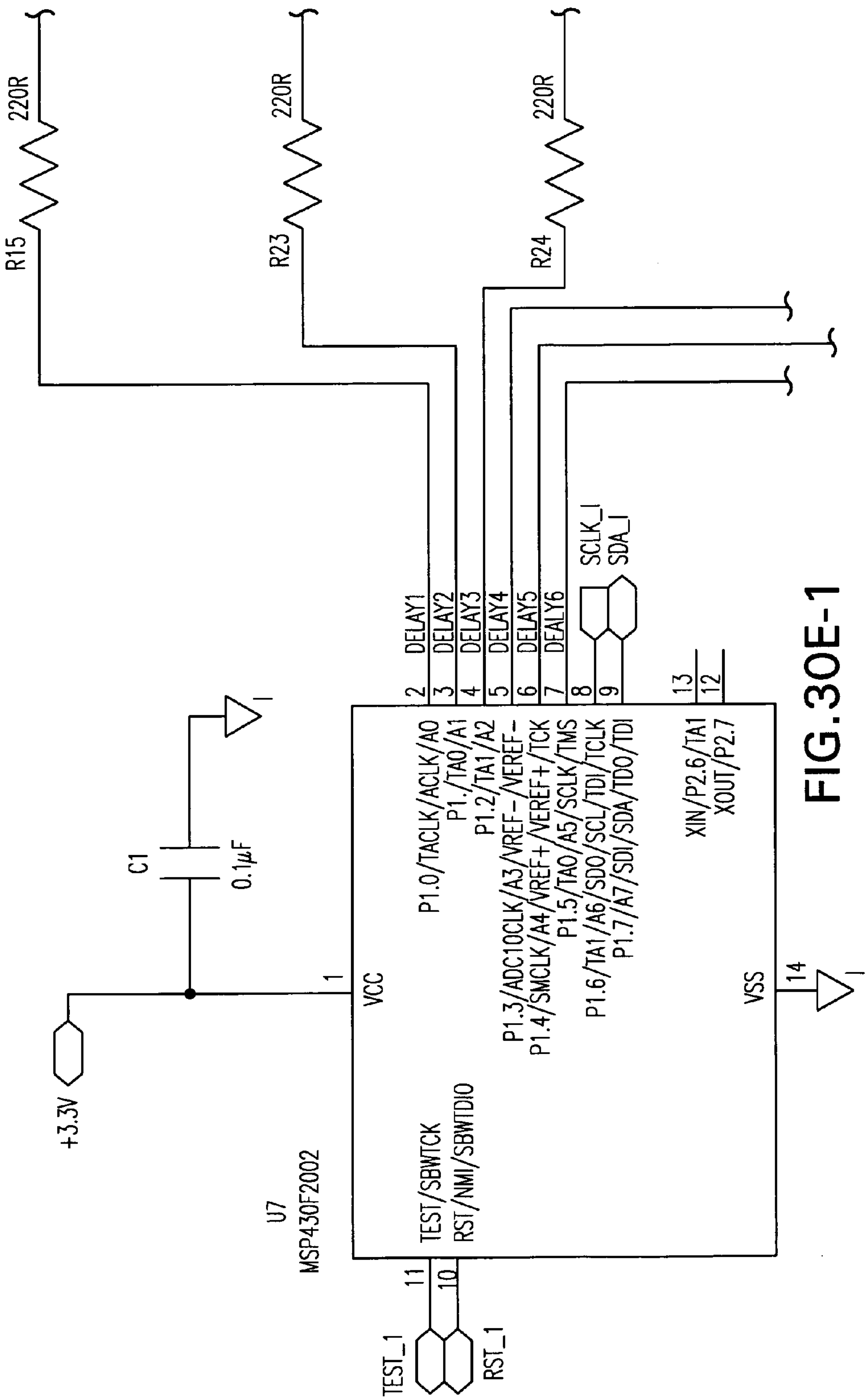
Figures 2, 30E:
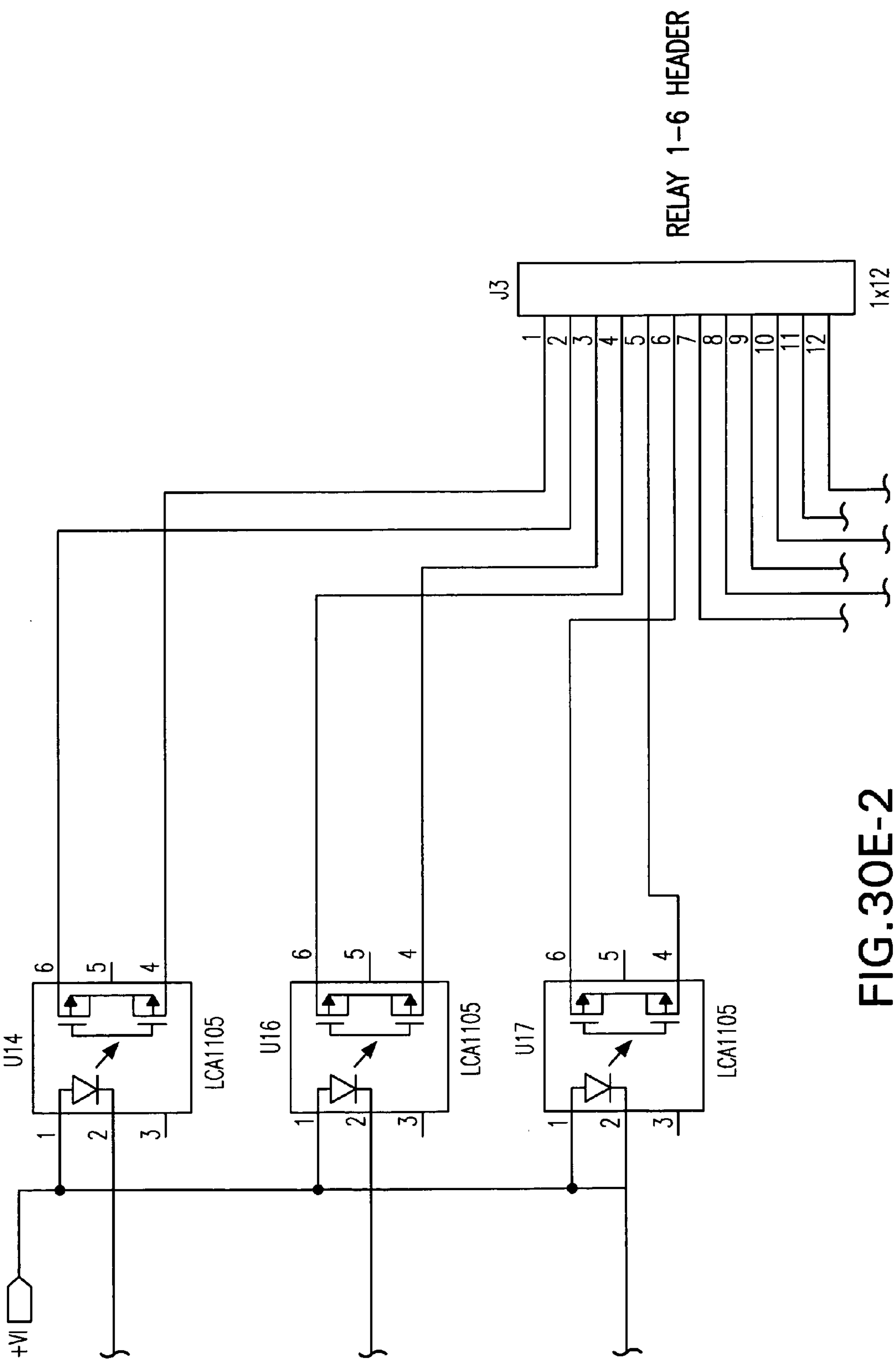
Figures 3, 30E:
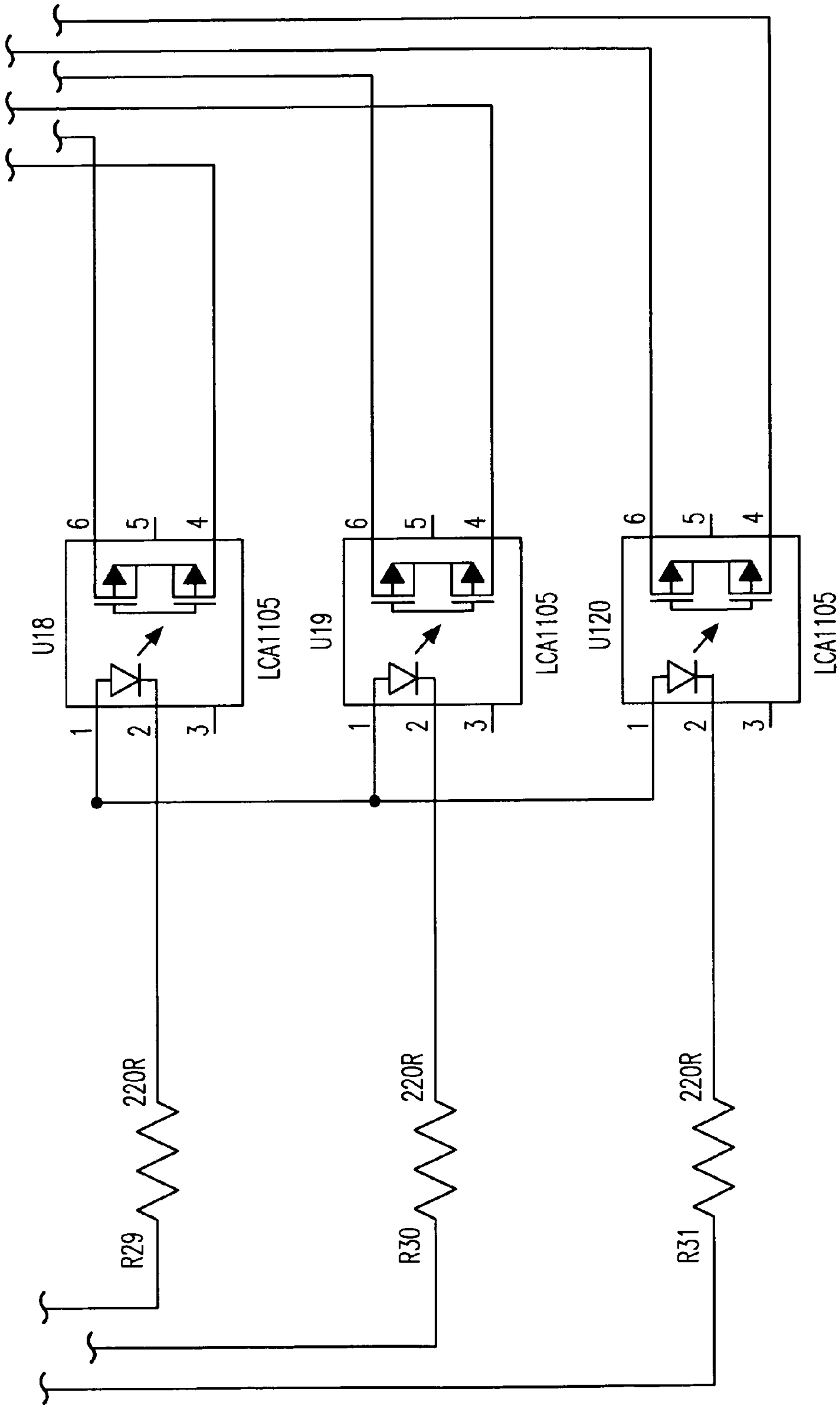
Figure 30F:
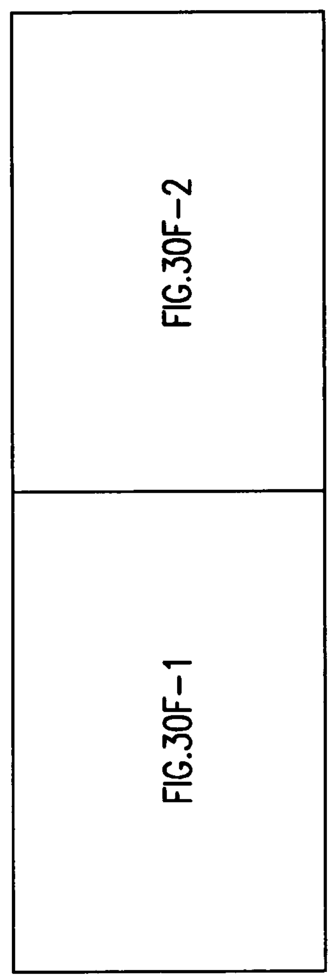
Figures 1, 30F:
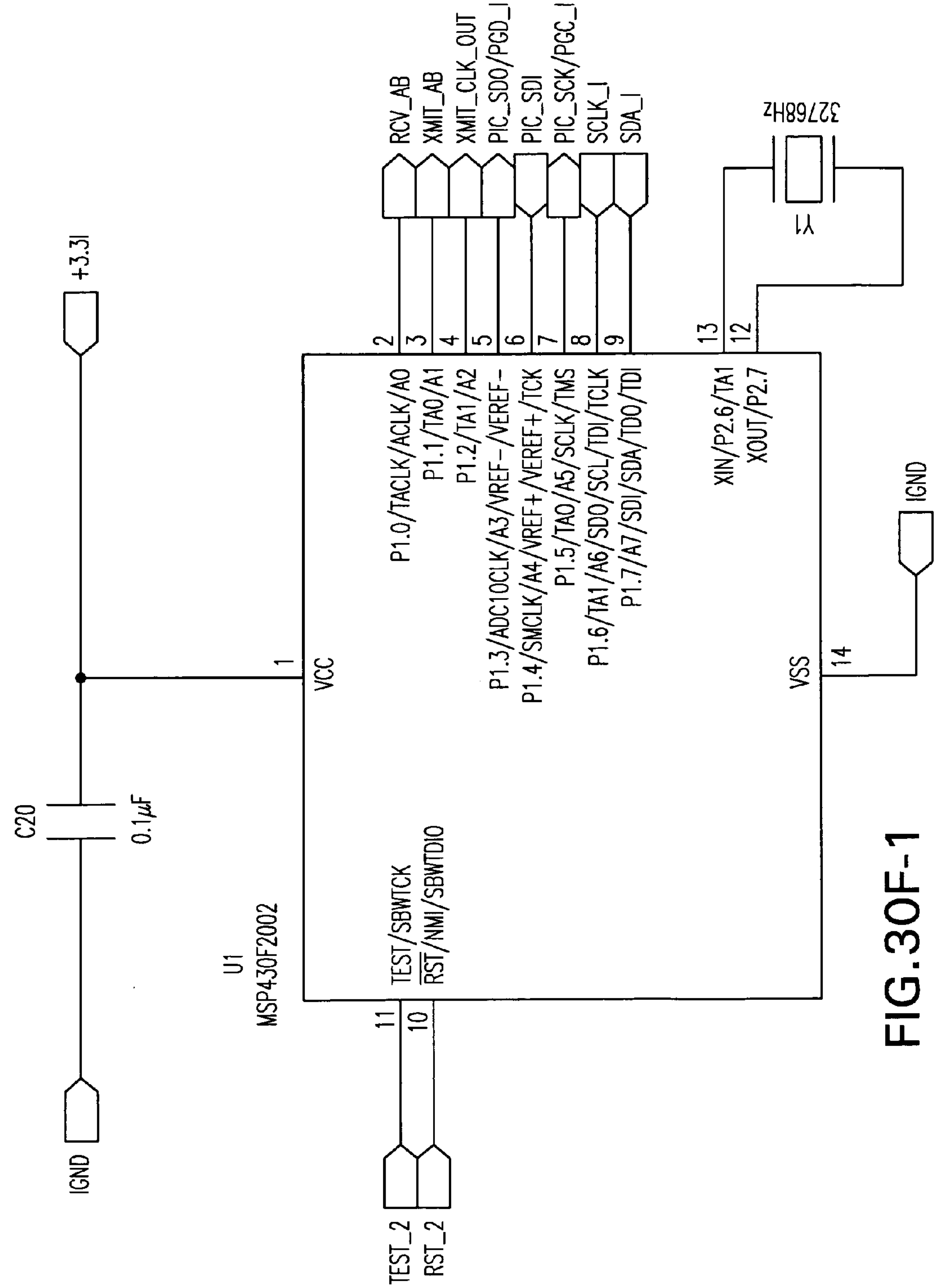
Figures 2, 30F:
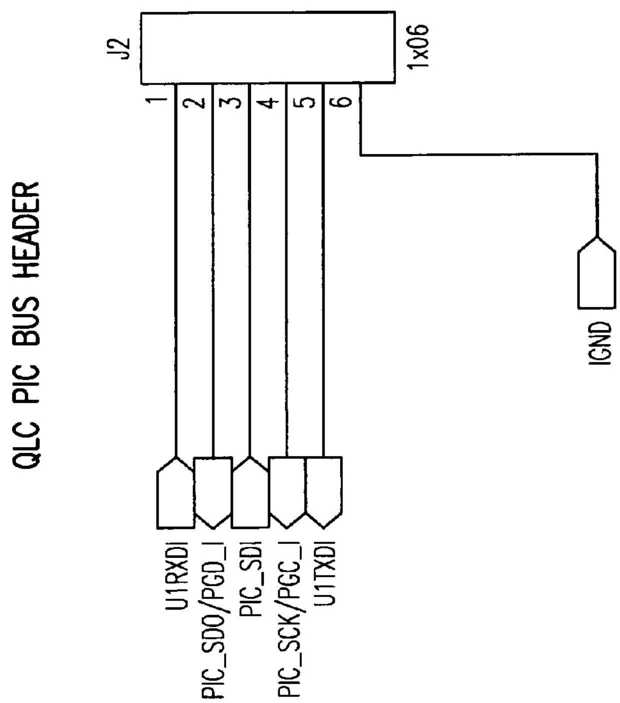
Figure 30G:
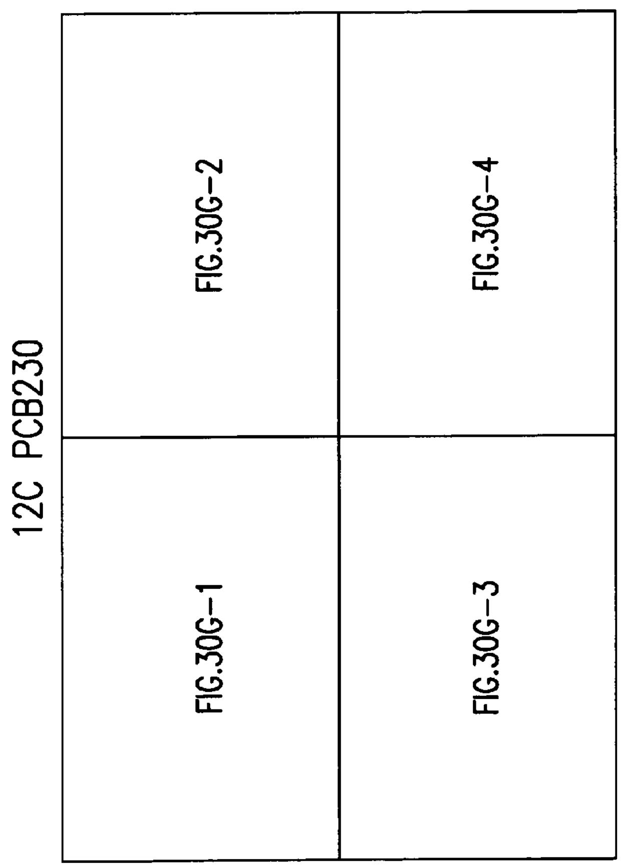
Figures 1, 30G:
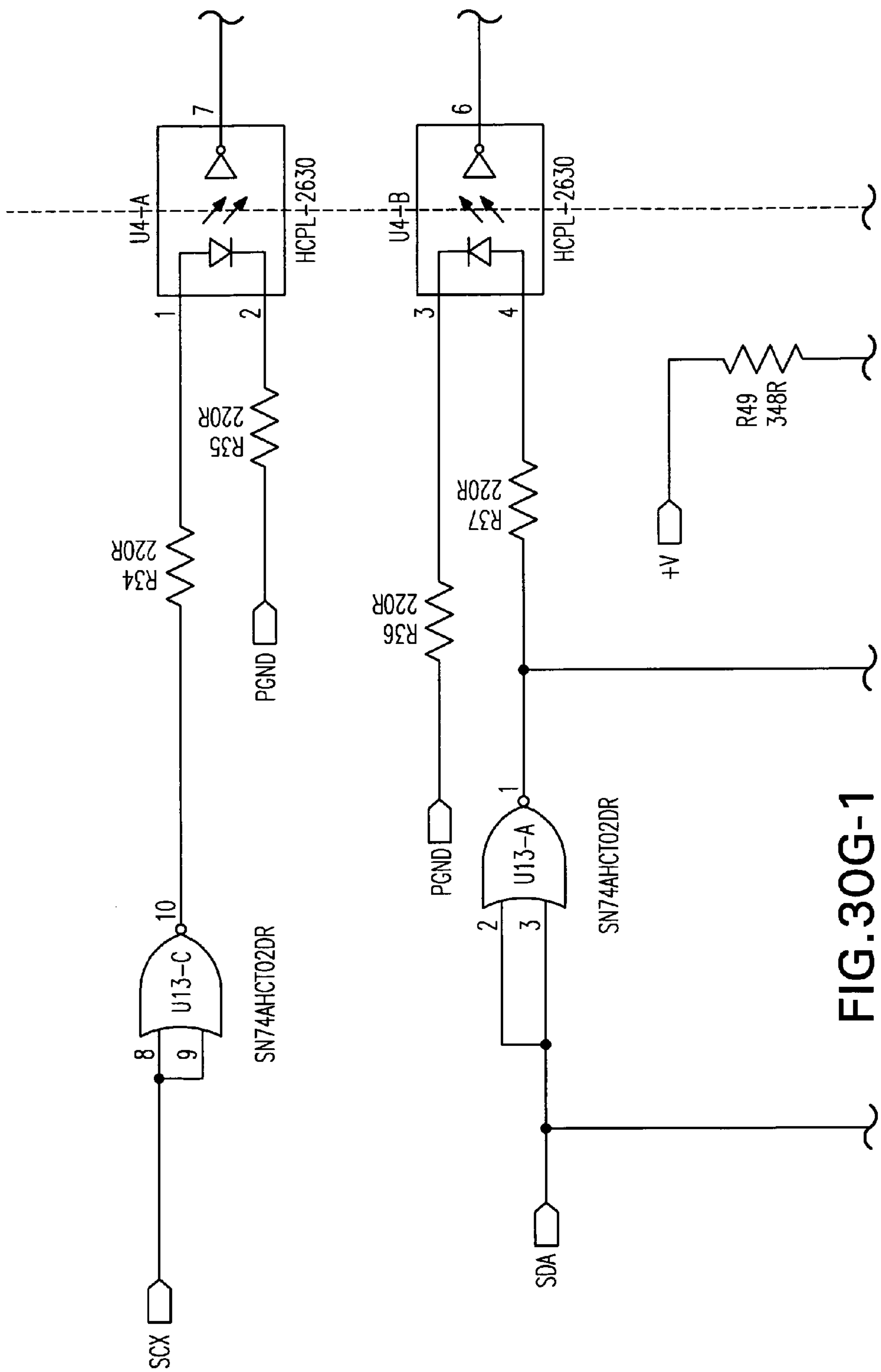
Figures 2, 30G:
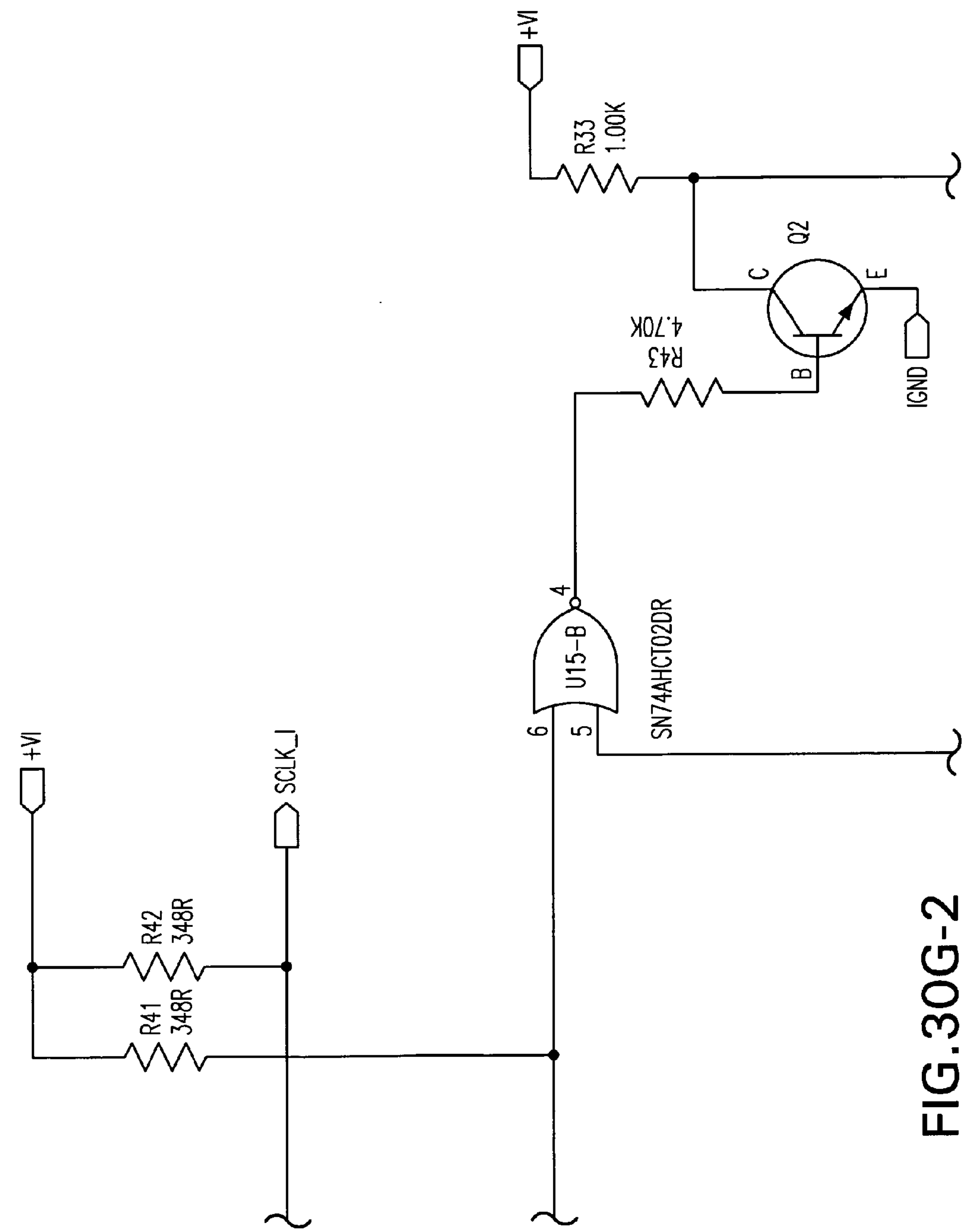
Figures 3, 30G:
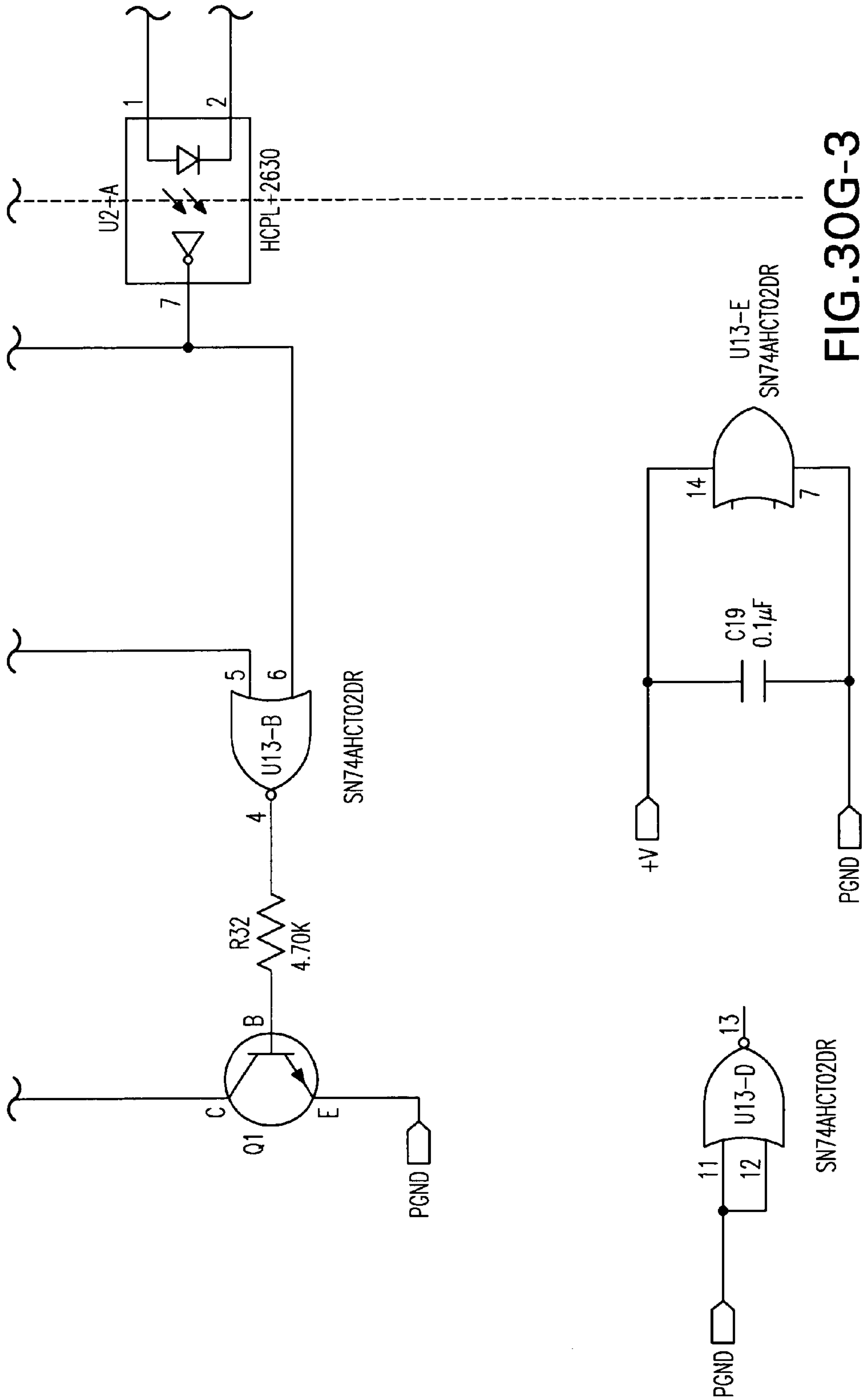
Figures 4, 30G:
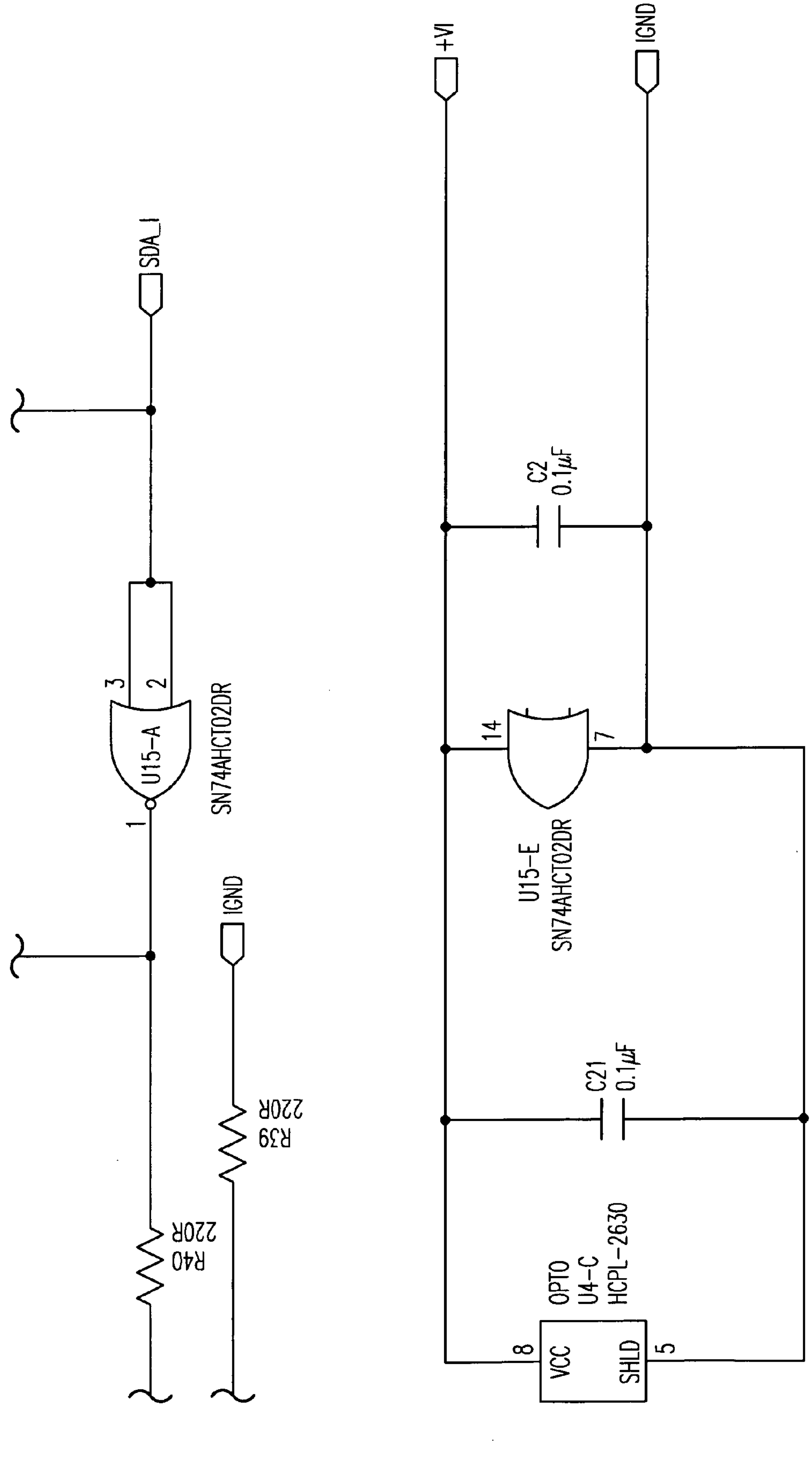
Figure 31A:
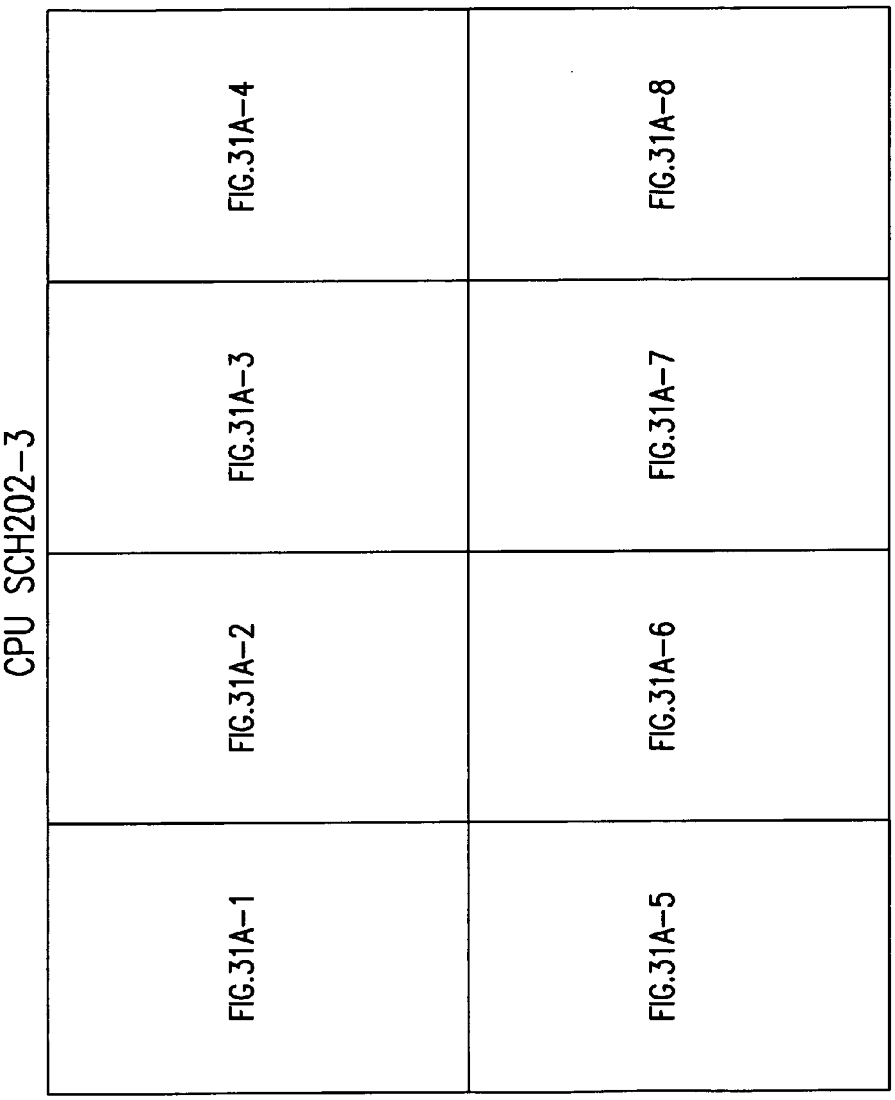
FIGS. 31A-R illustrate preferred schematics for a CPU board.
Figures 1, 31A:
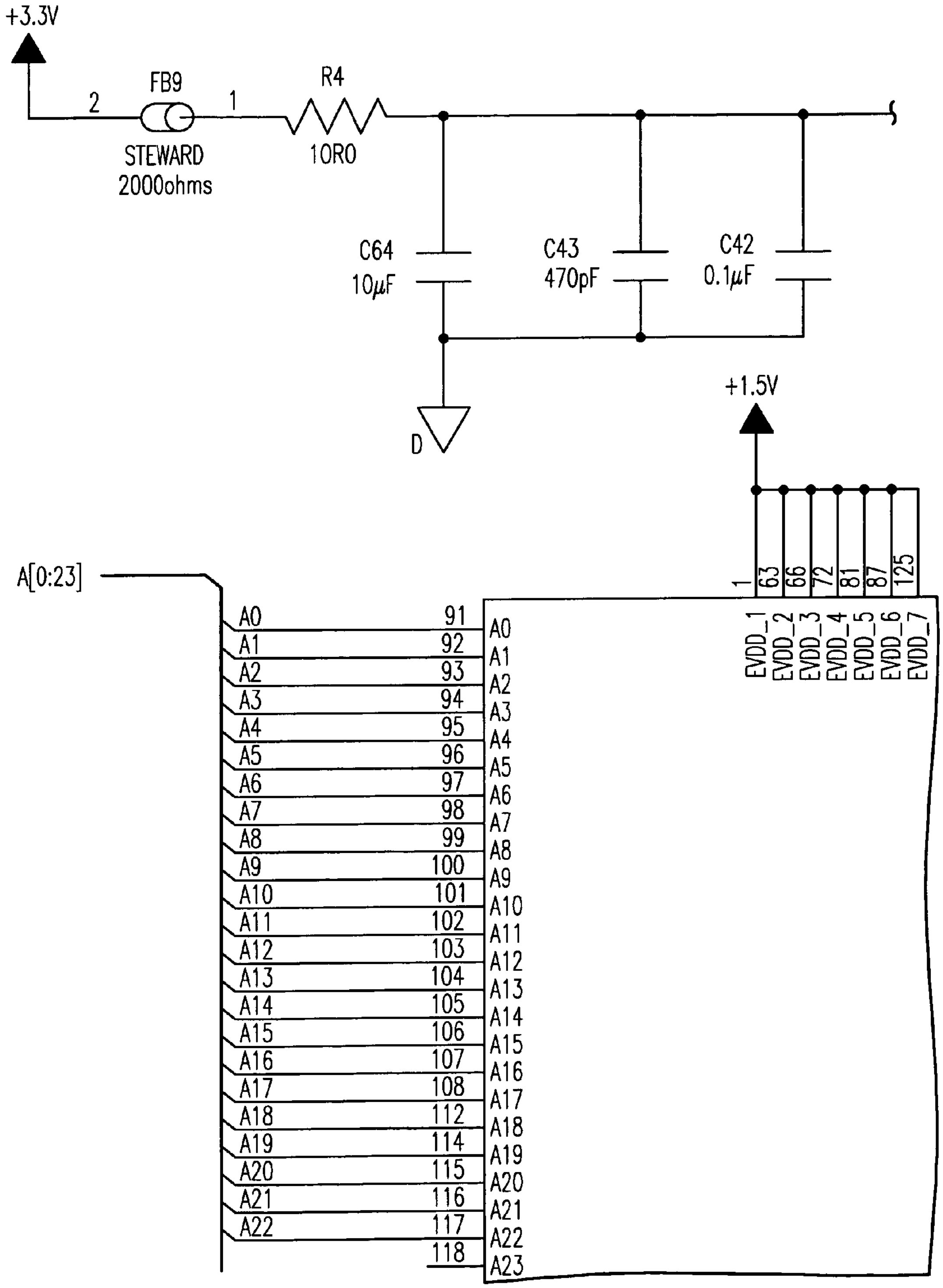
Figures 2, 31A:
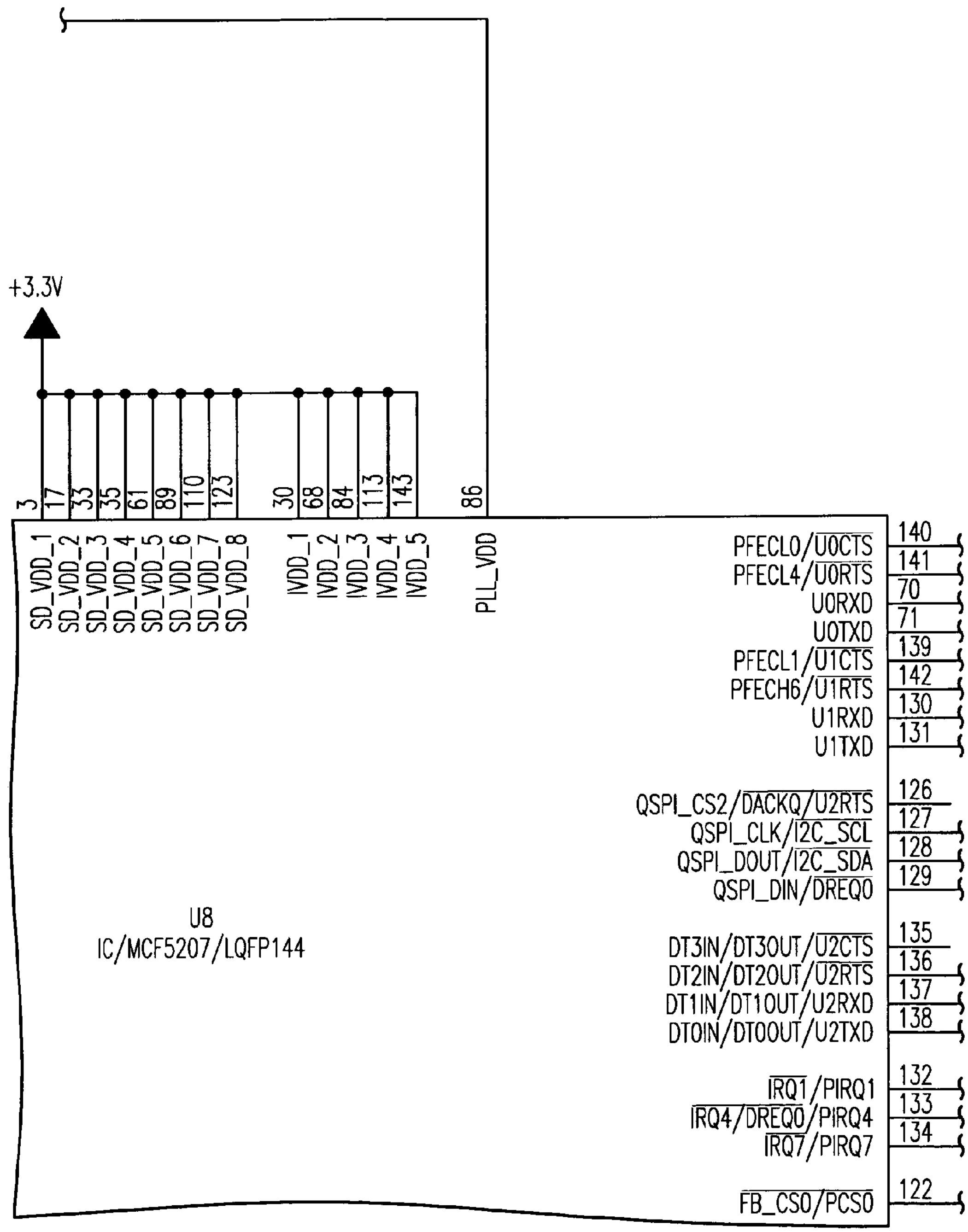
Figures 3, 31A:
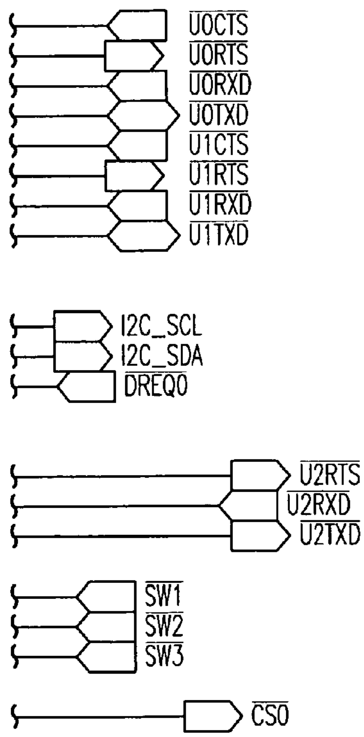
Figures 4, 31A:
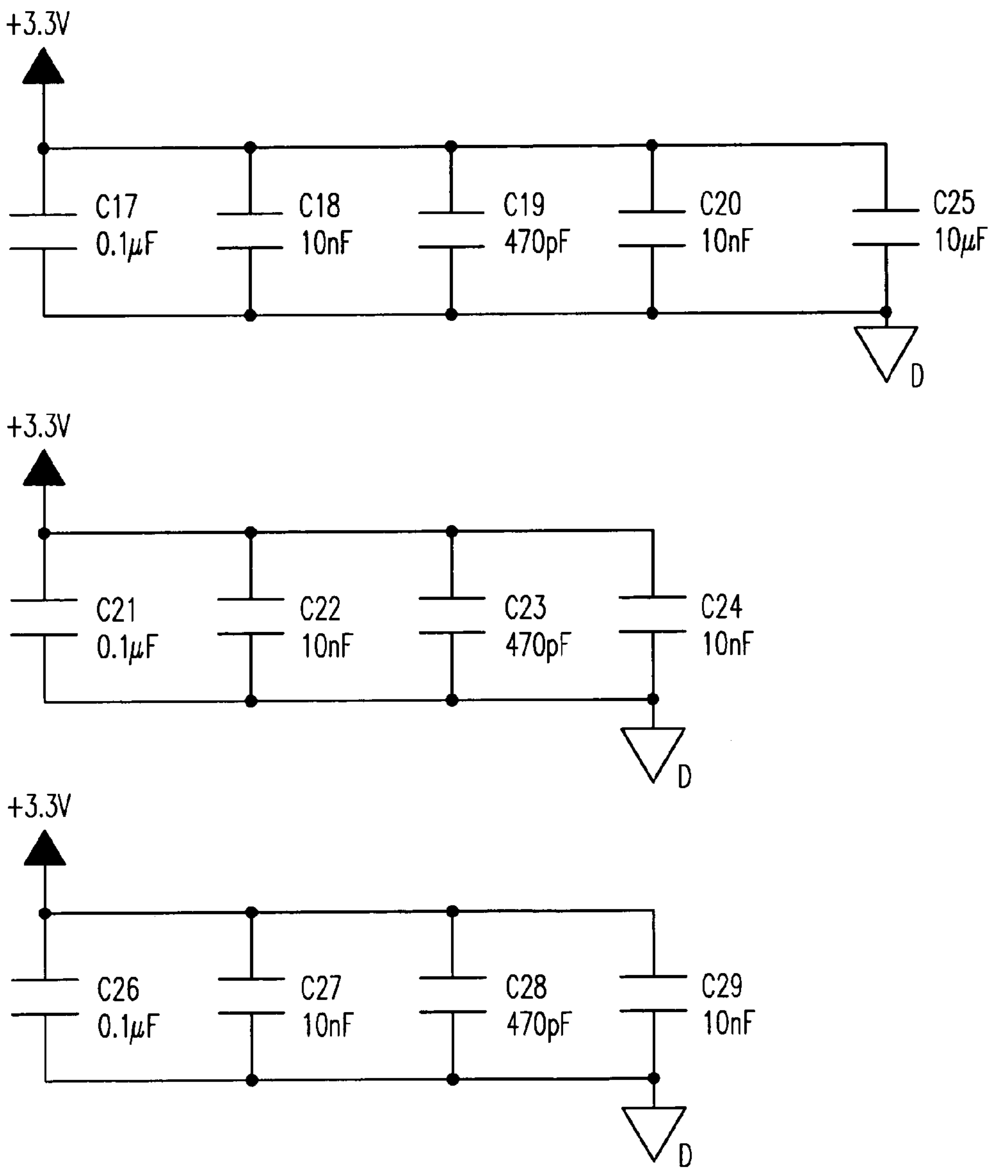
Figures 5, 31A:
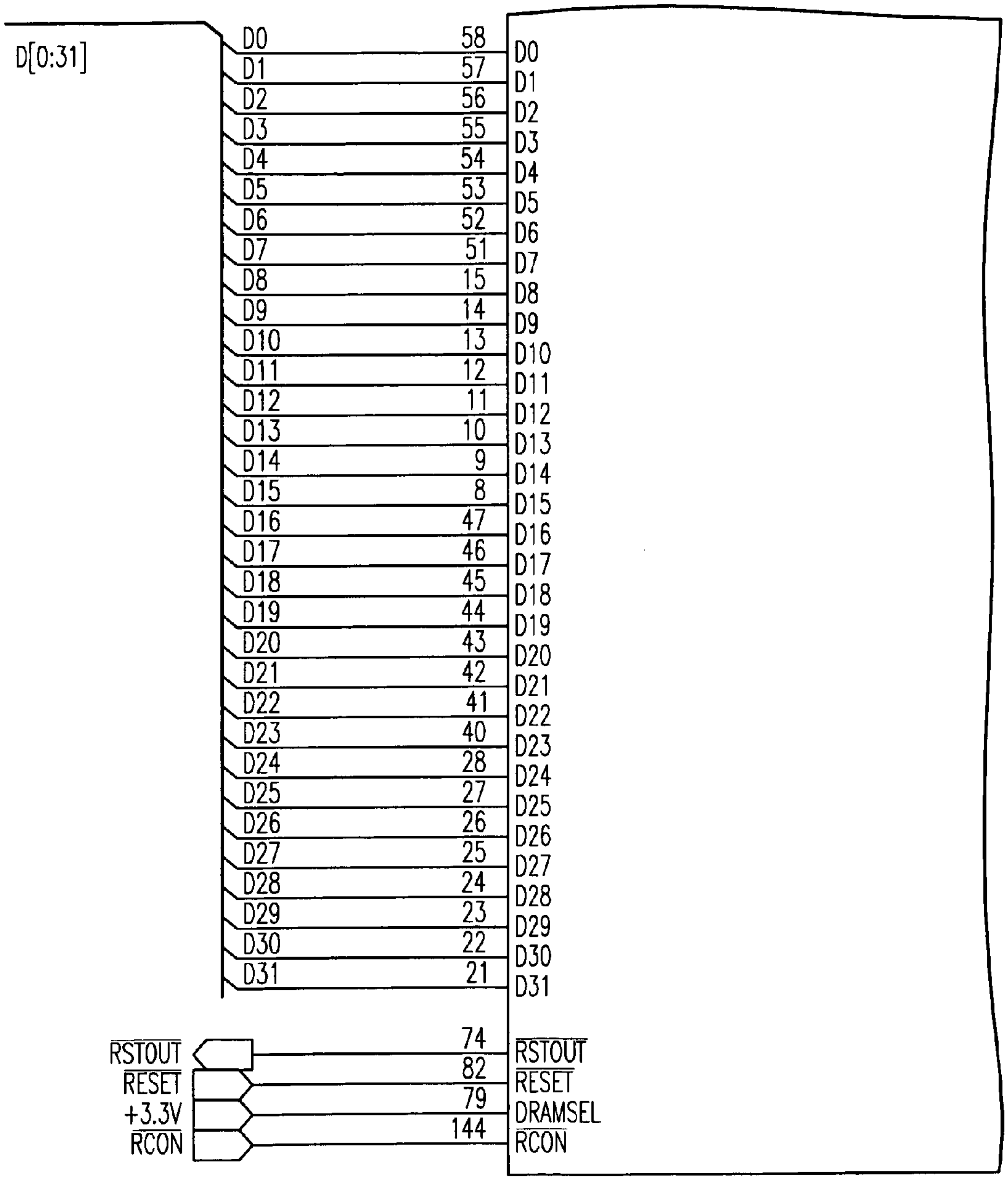
Figures 6, 31A:
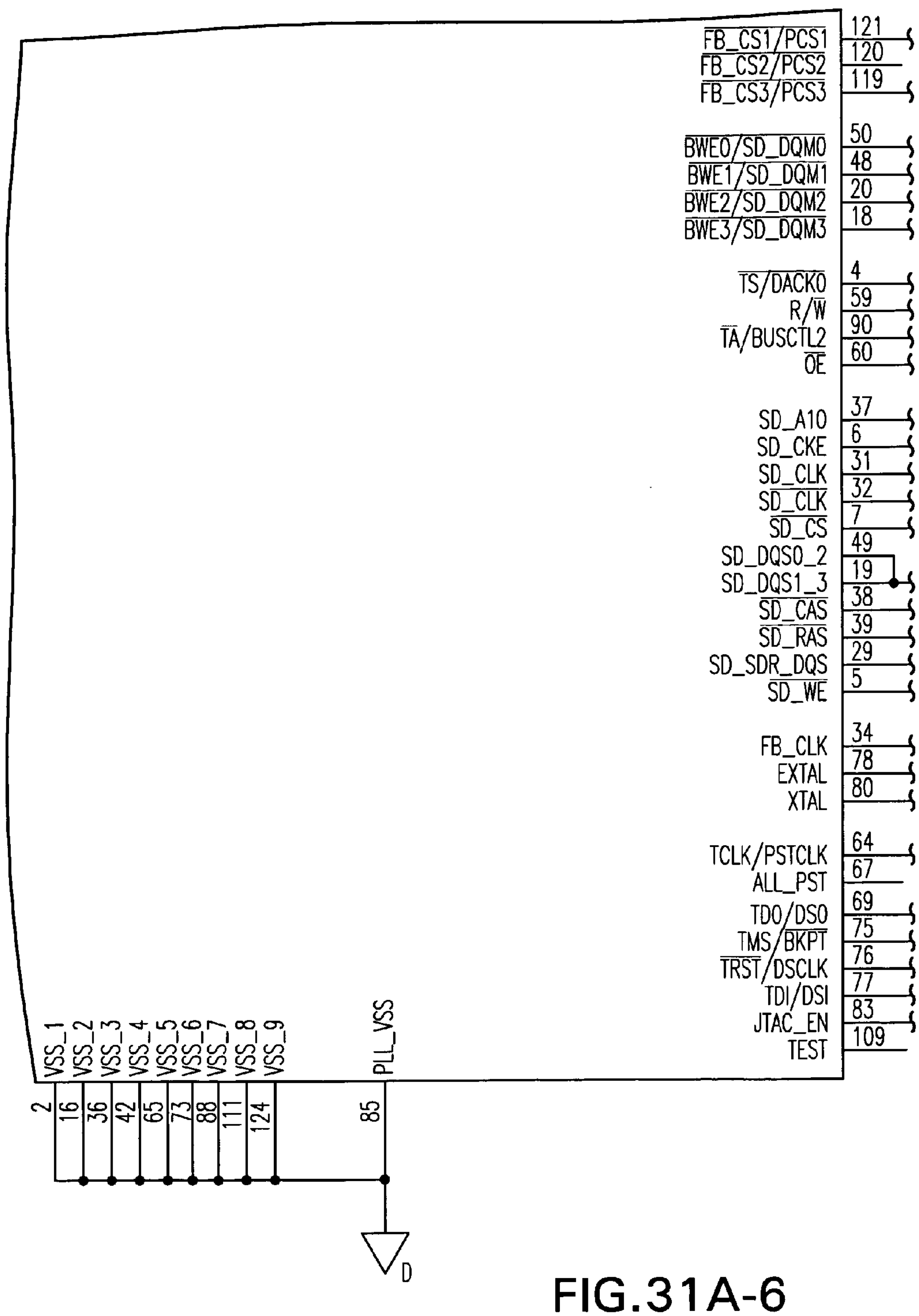
Figures 7, 31A:
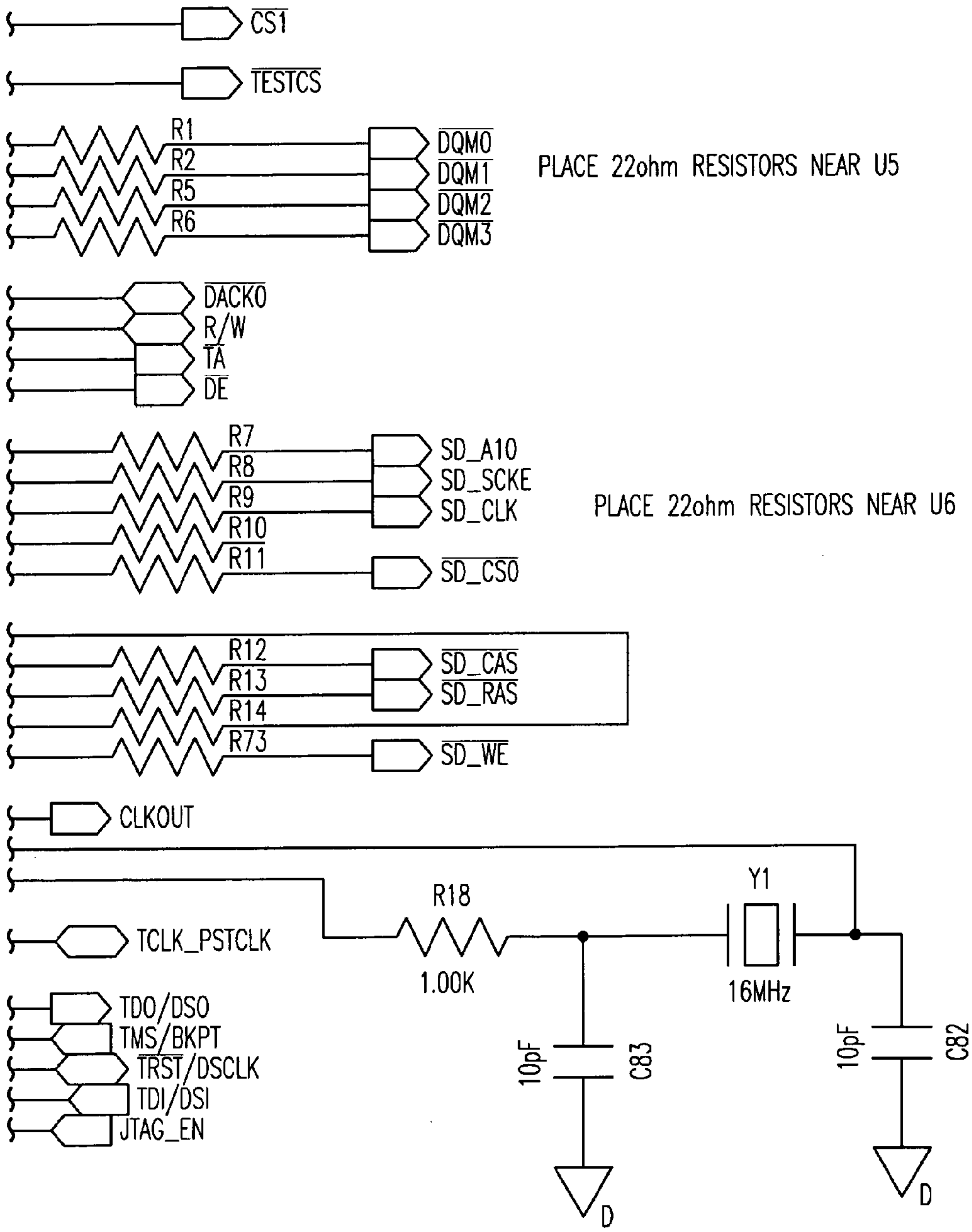
Figures 8, 31A:
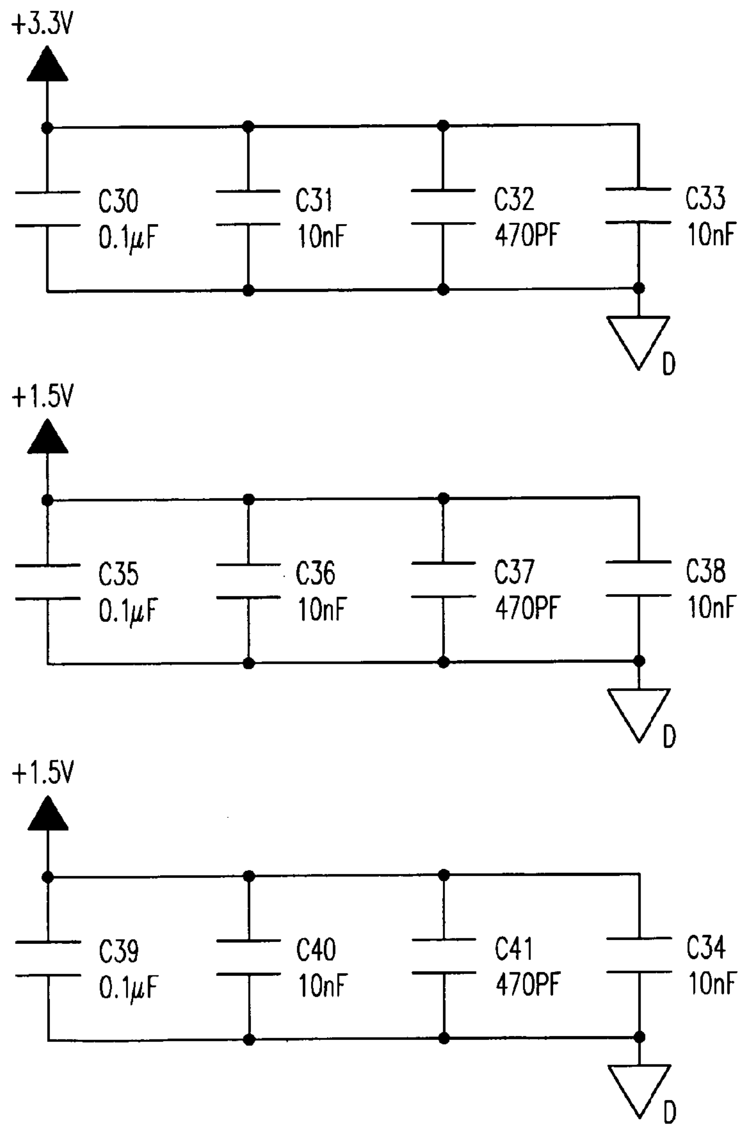
Figure 31B:
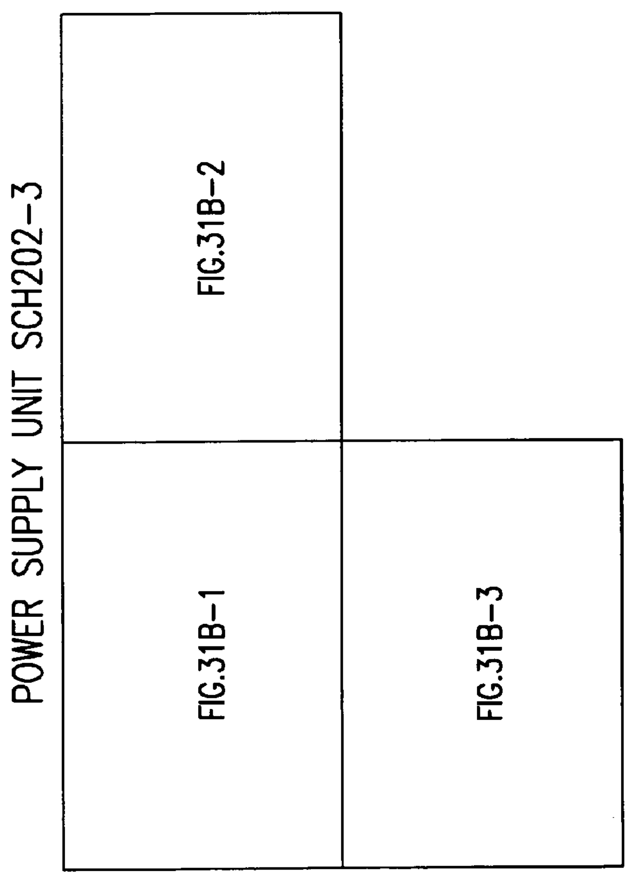
Figures 1, 31B:
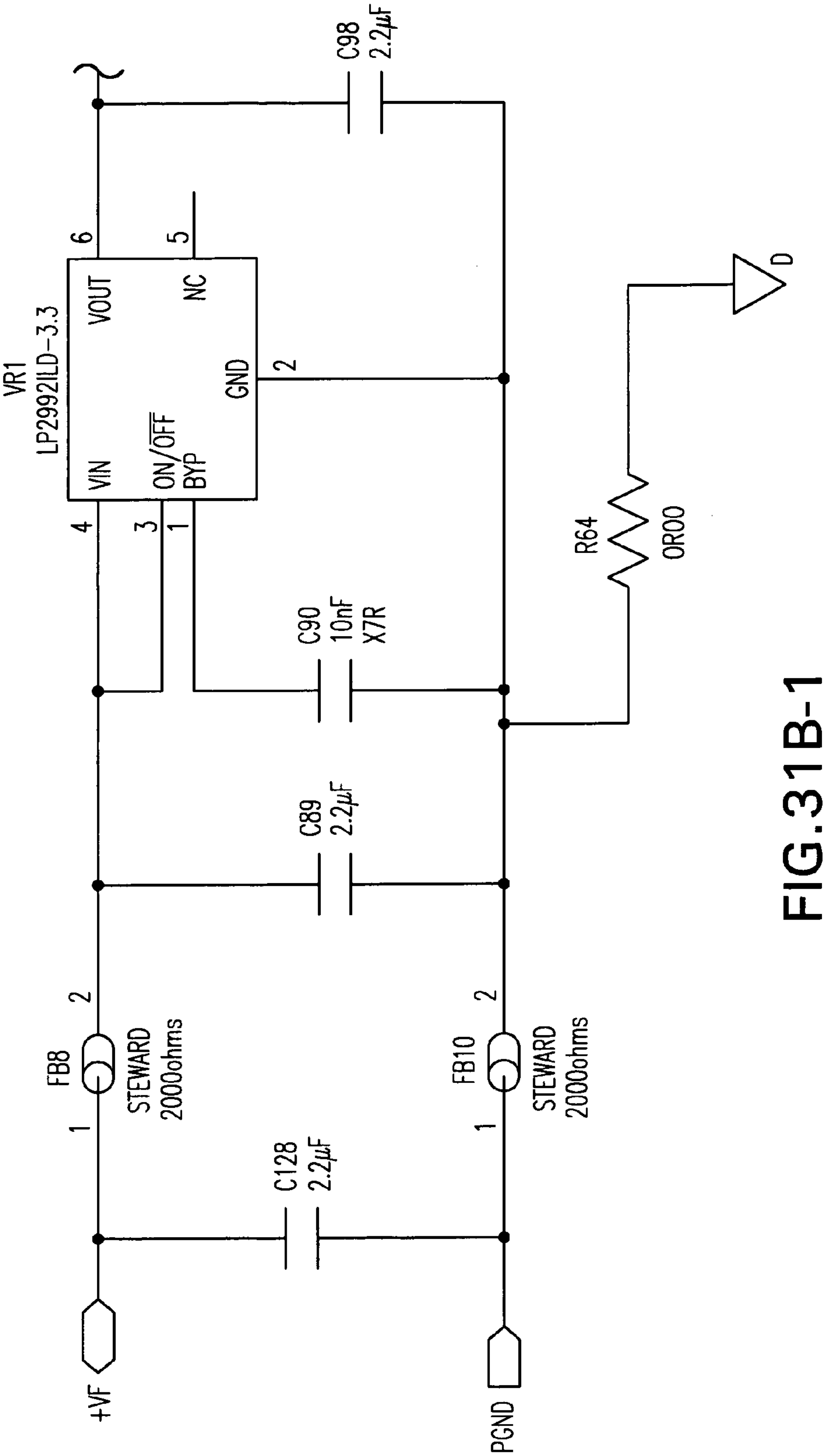
Figures 2, 31B:
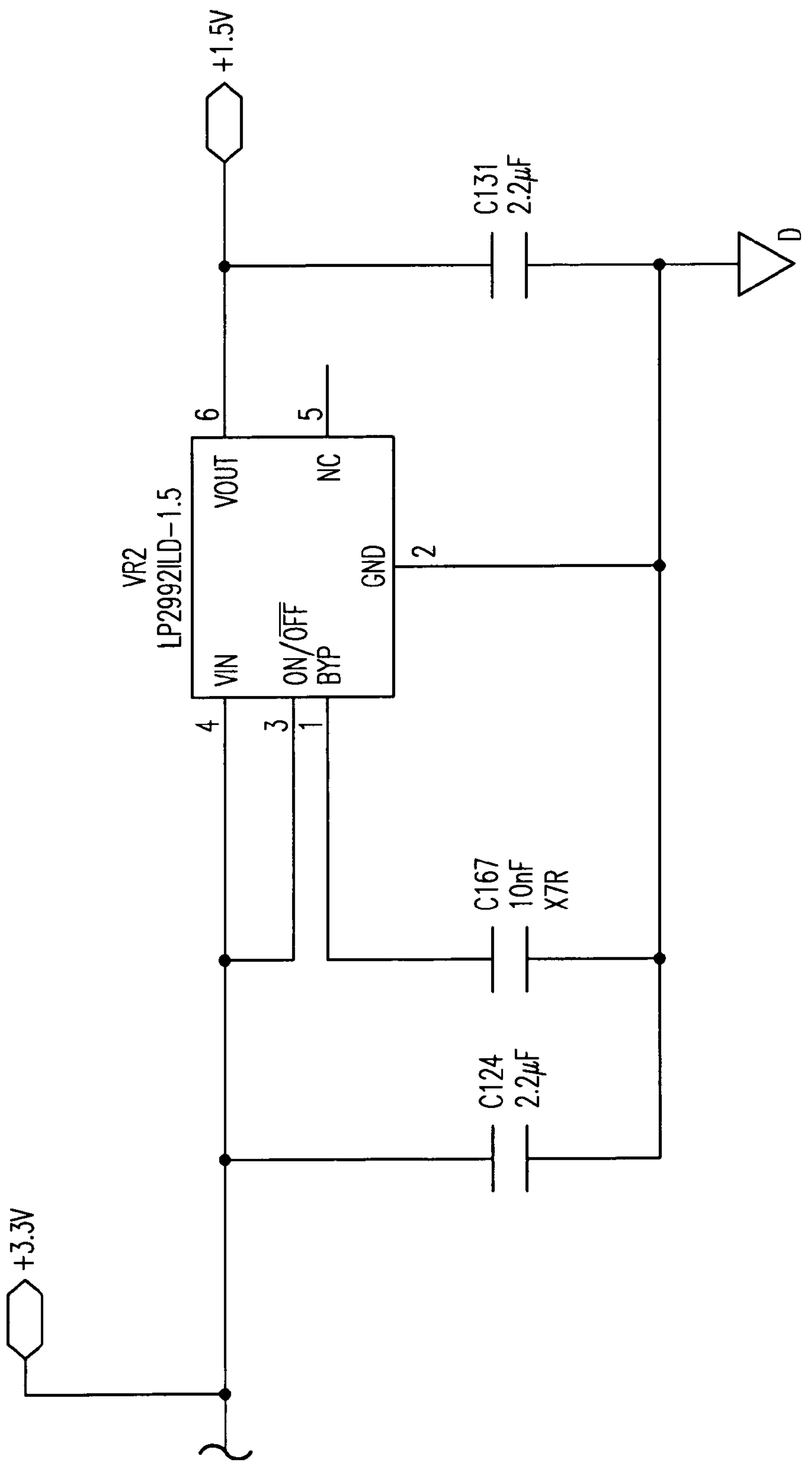
Figures 3, 31B:
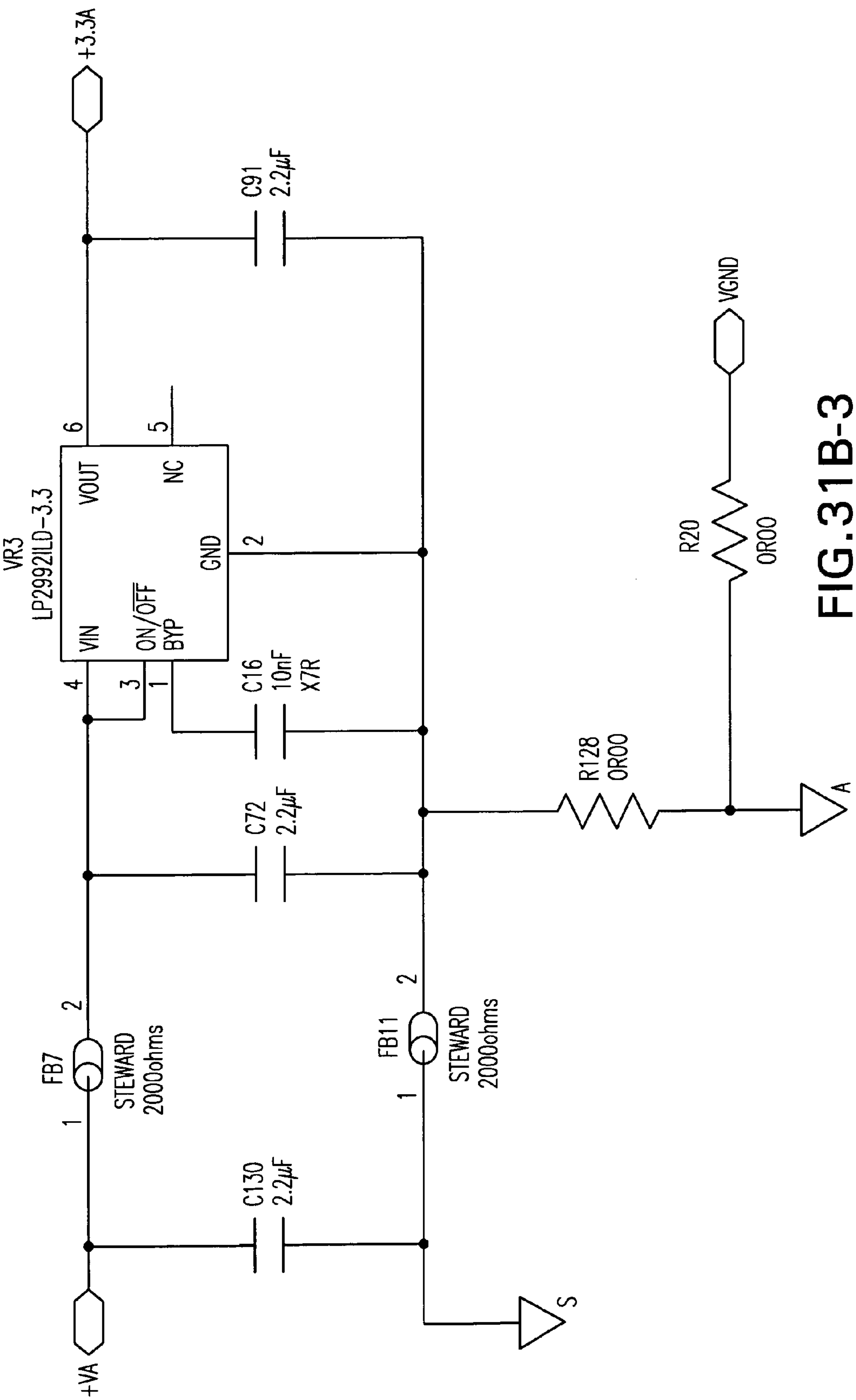
Figure 31C:
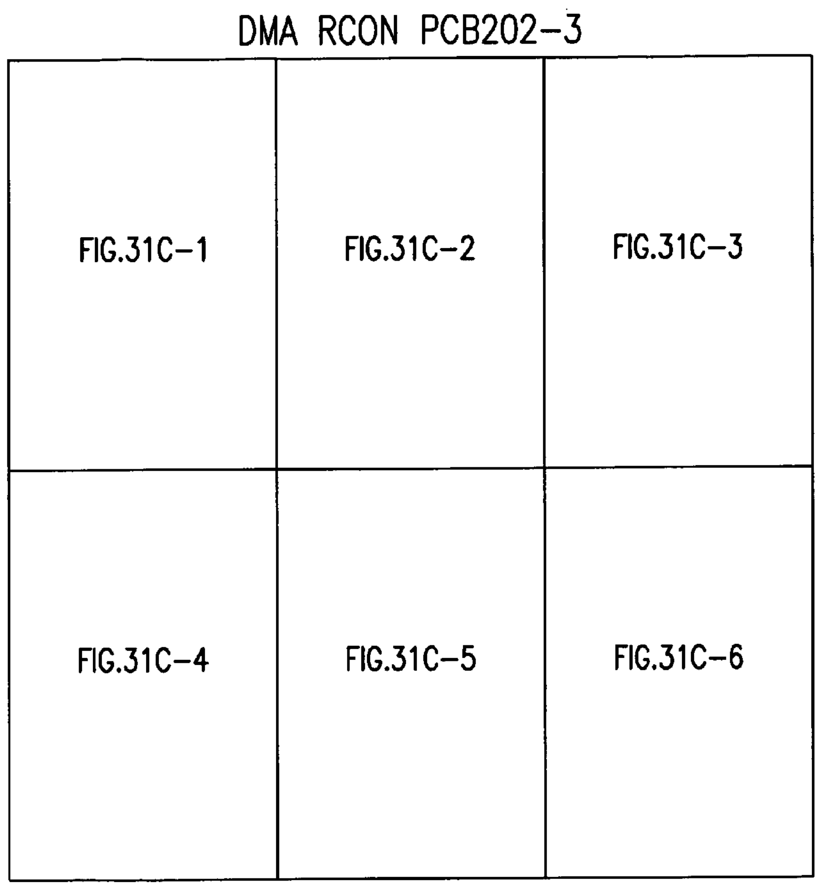
Figures 1, 31C:
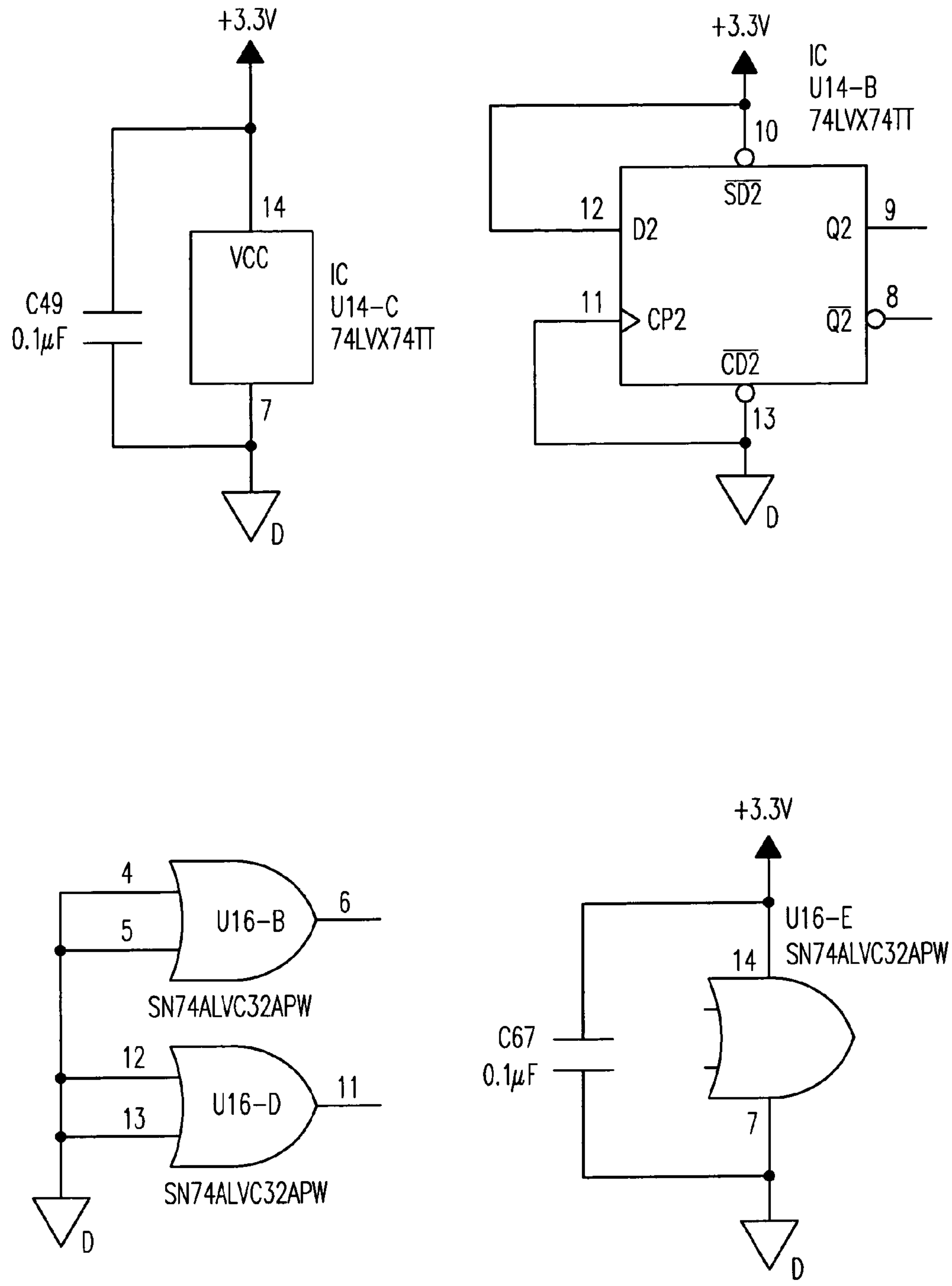
Figures 2, 31C:
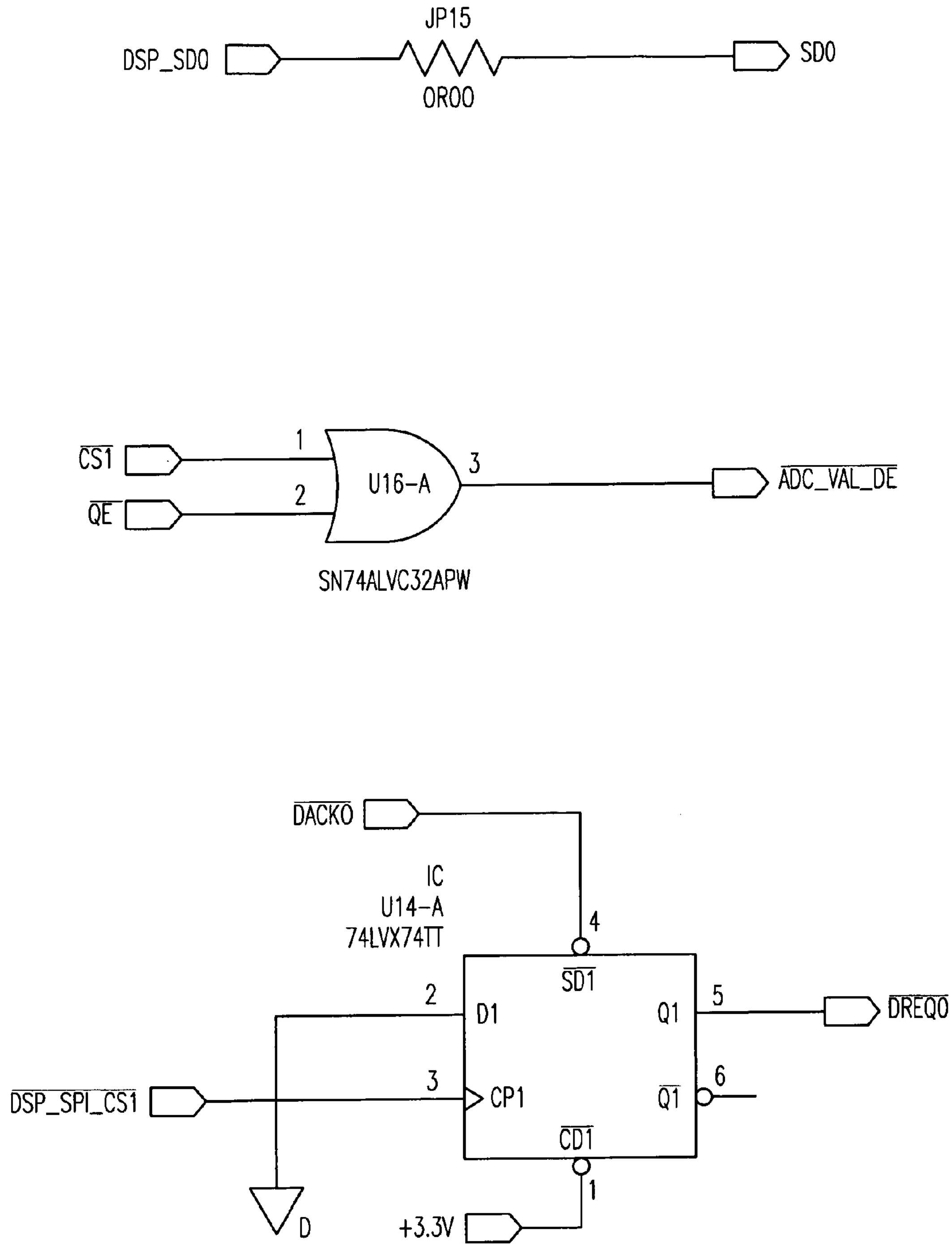
Figures 3, 31C:
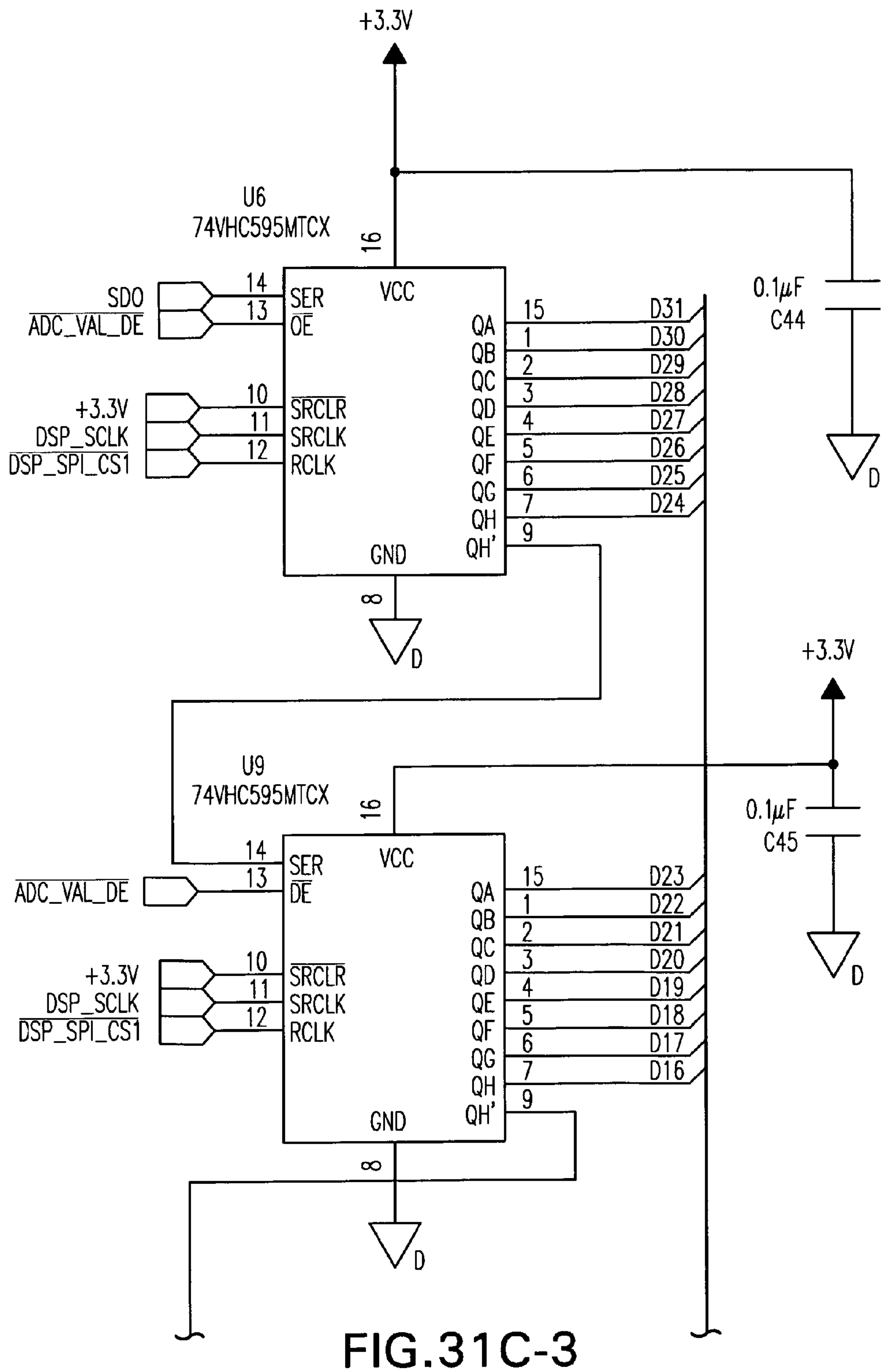
Figures 4, 31C:
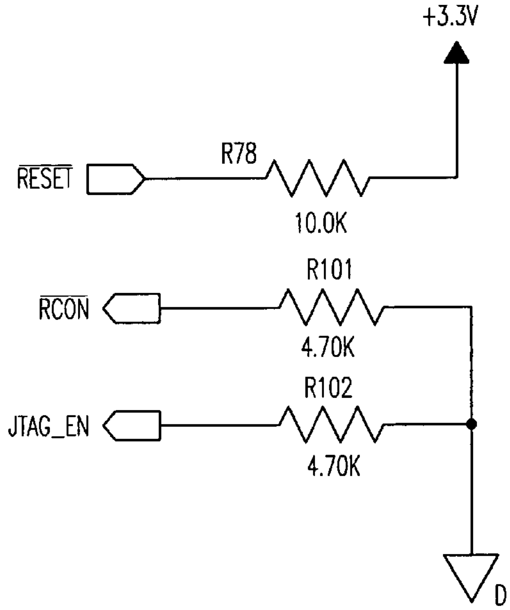
Figures 5, 31C:
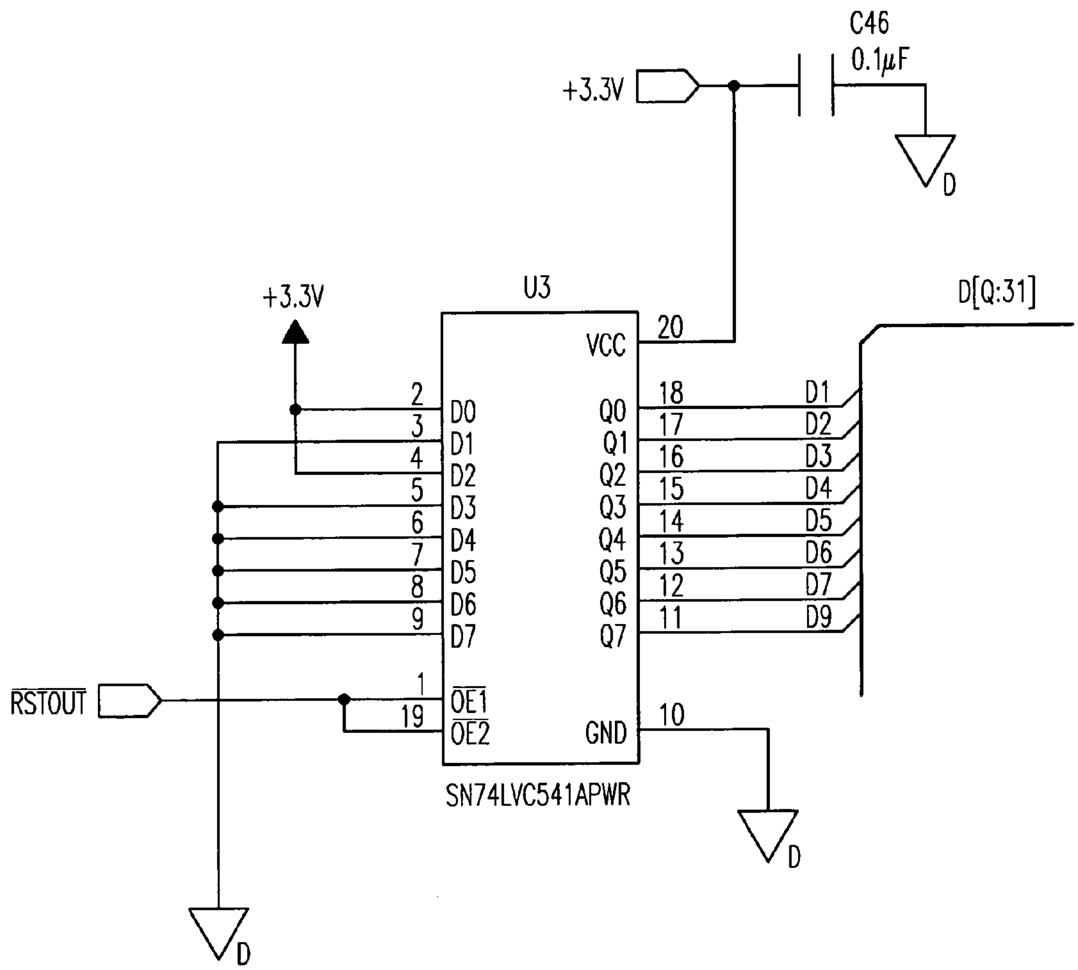
Figures 6, 31C:
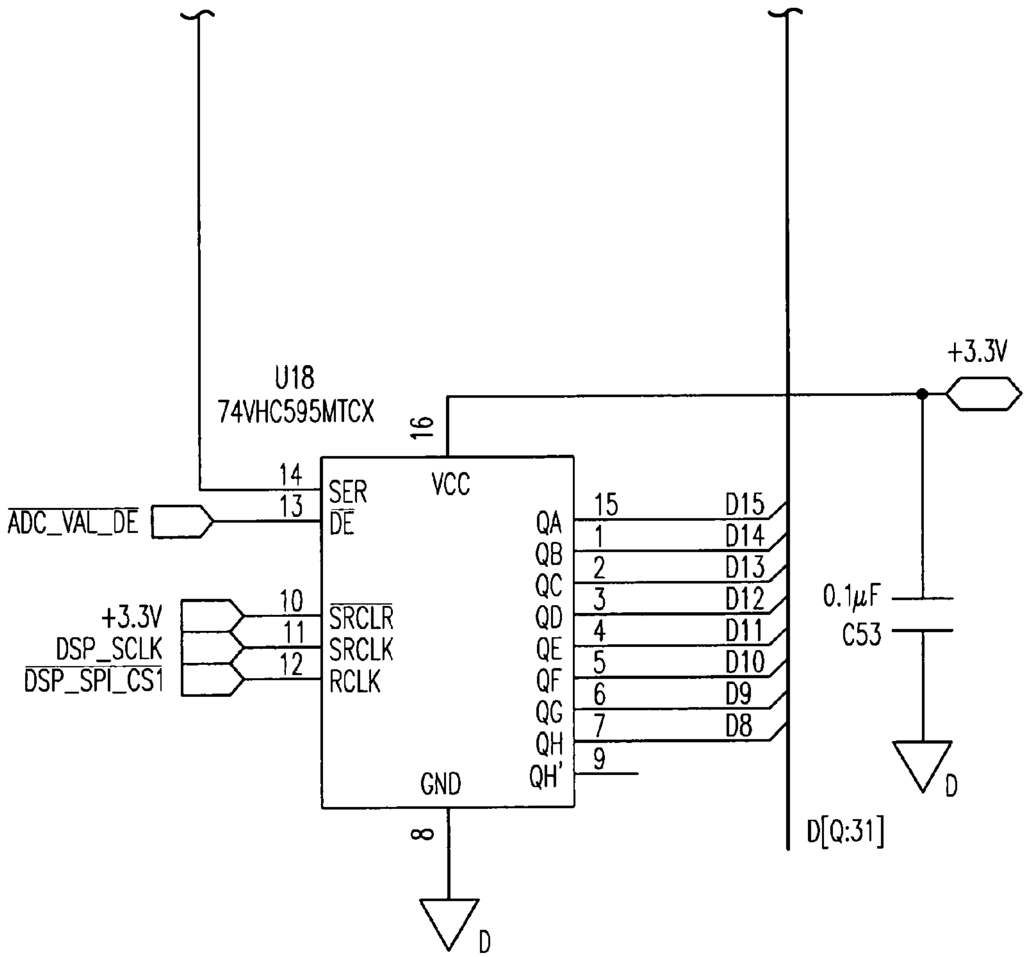
Figure 31D:
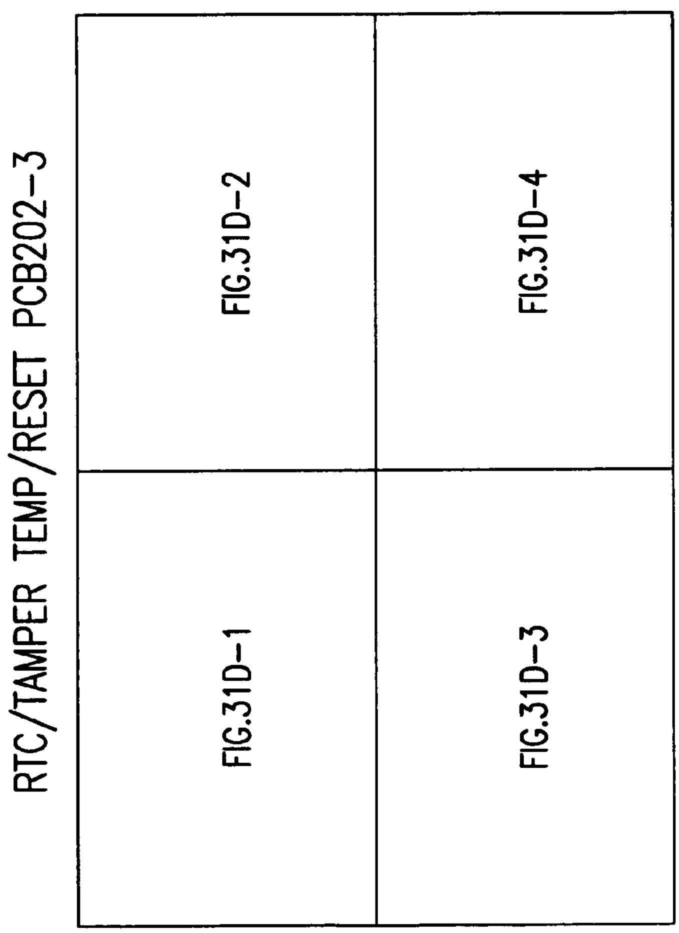
Figures 1, 31D:
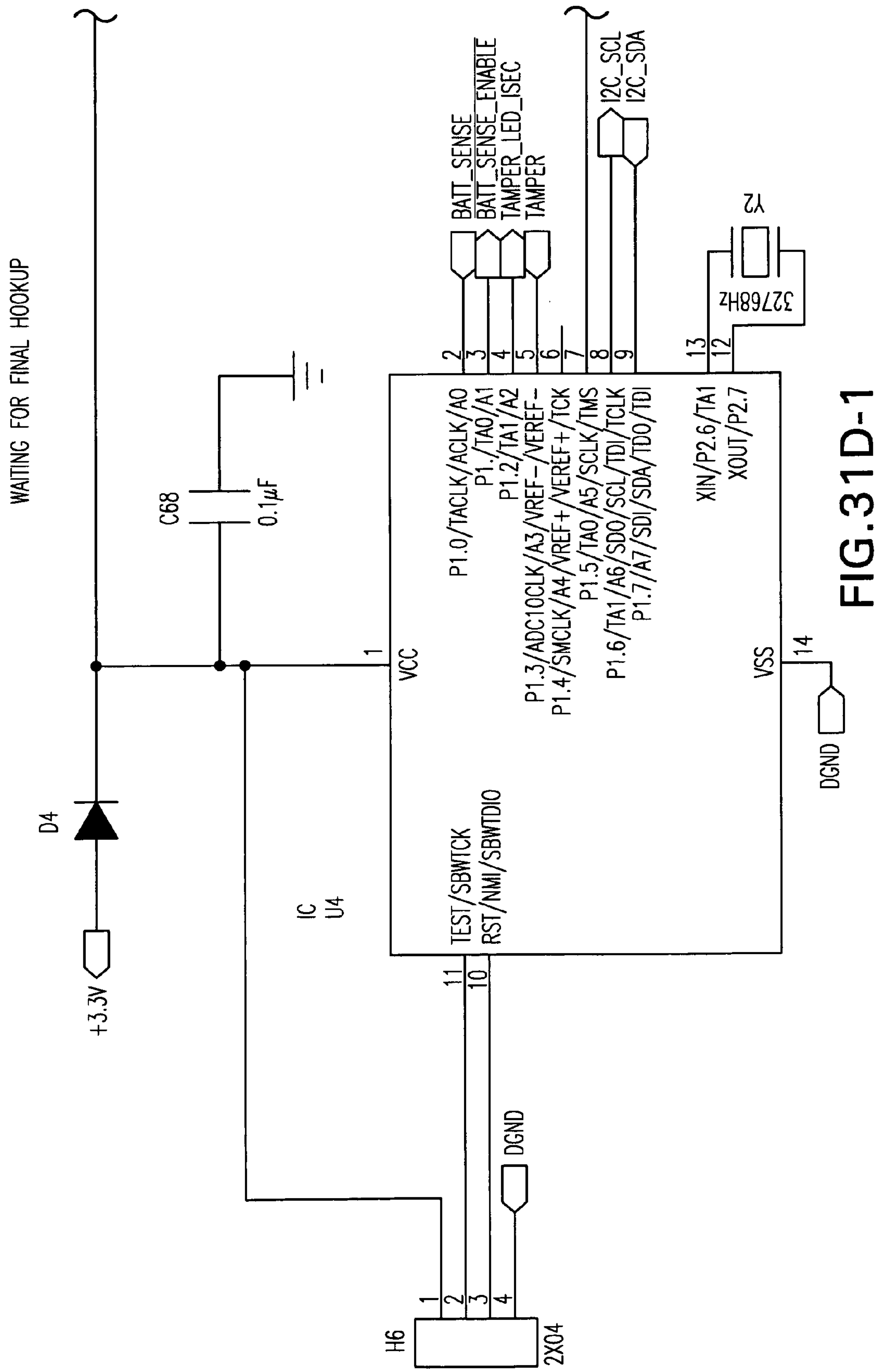
Figures 2, 31D:
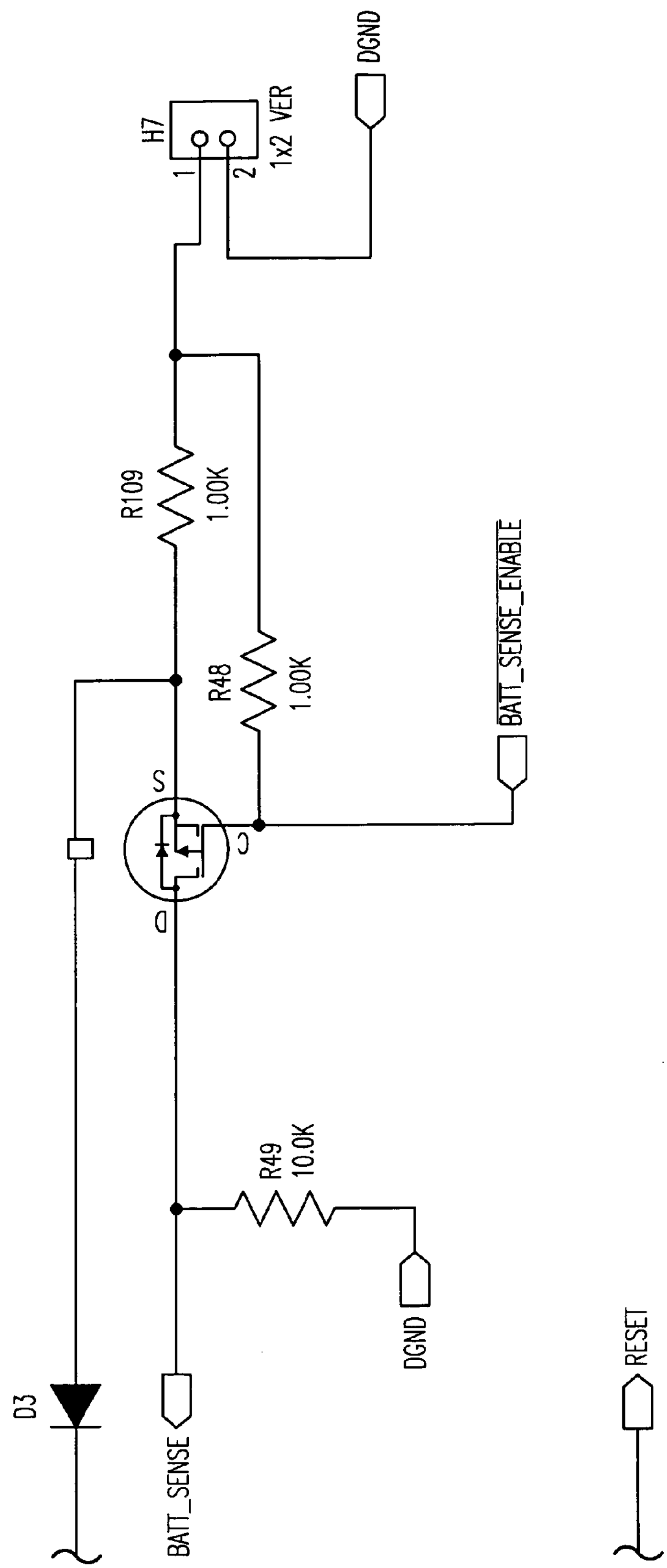
Figures 3, 31D:
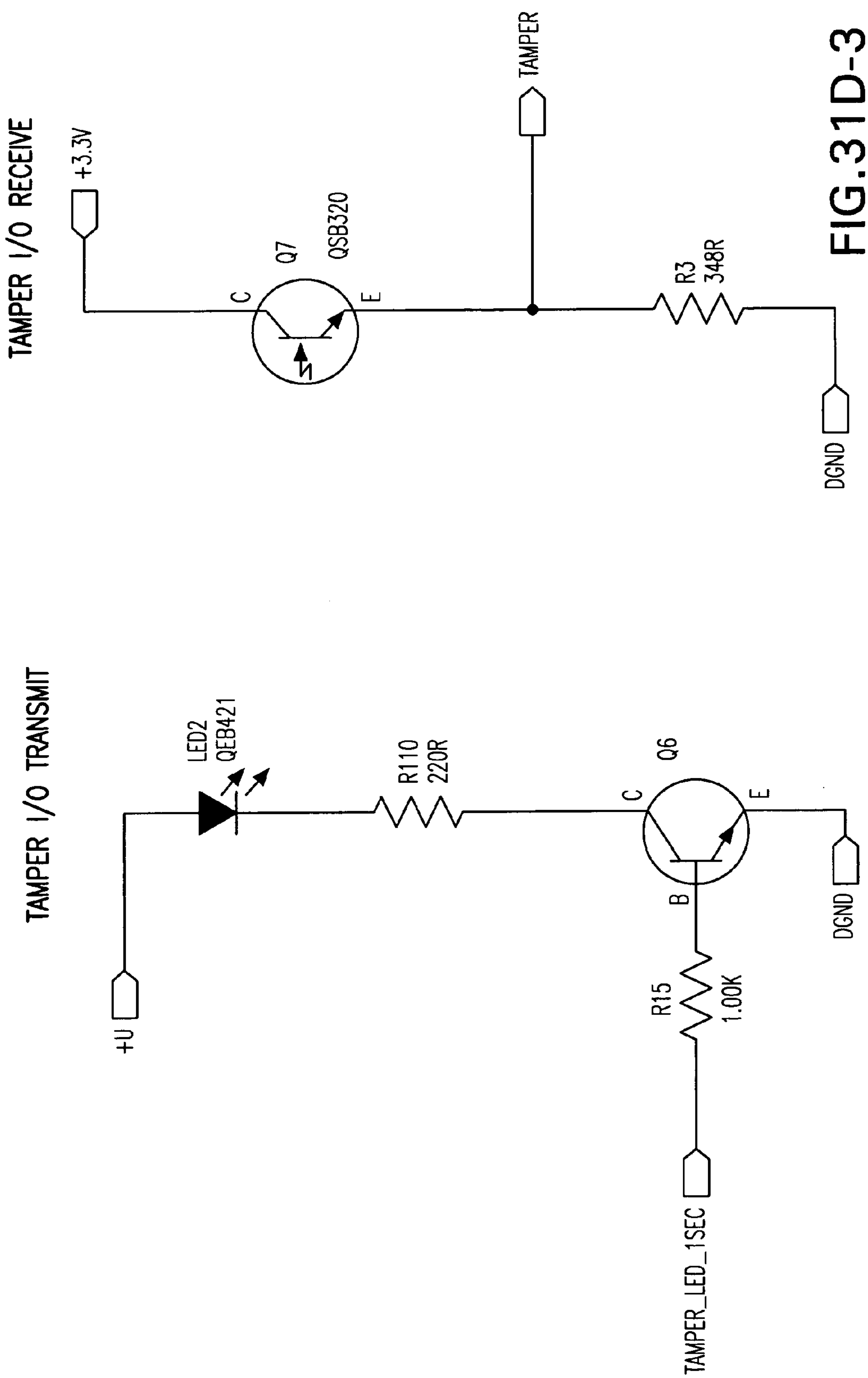
Figures 4, 31D:
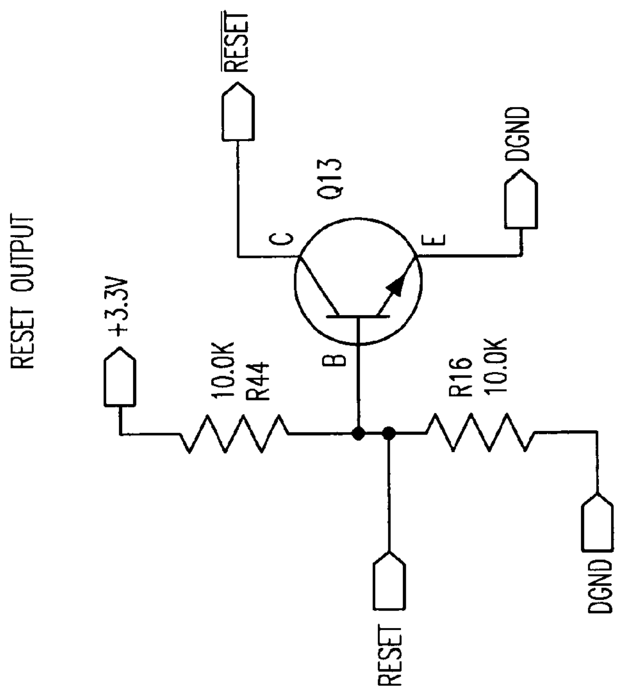
Figure 31E:
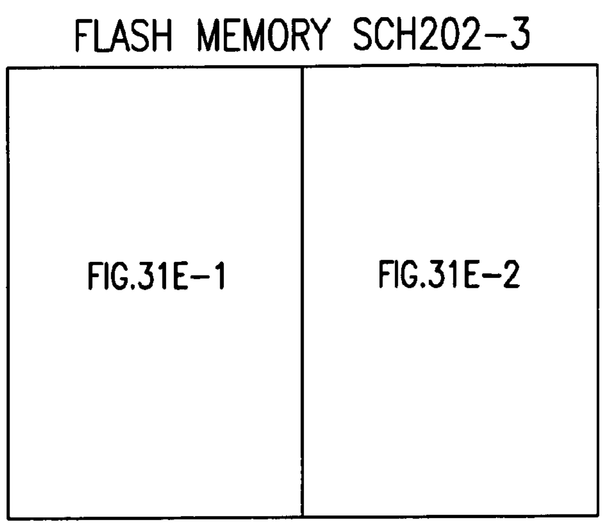
Figures 1, 31E:
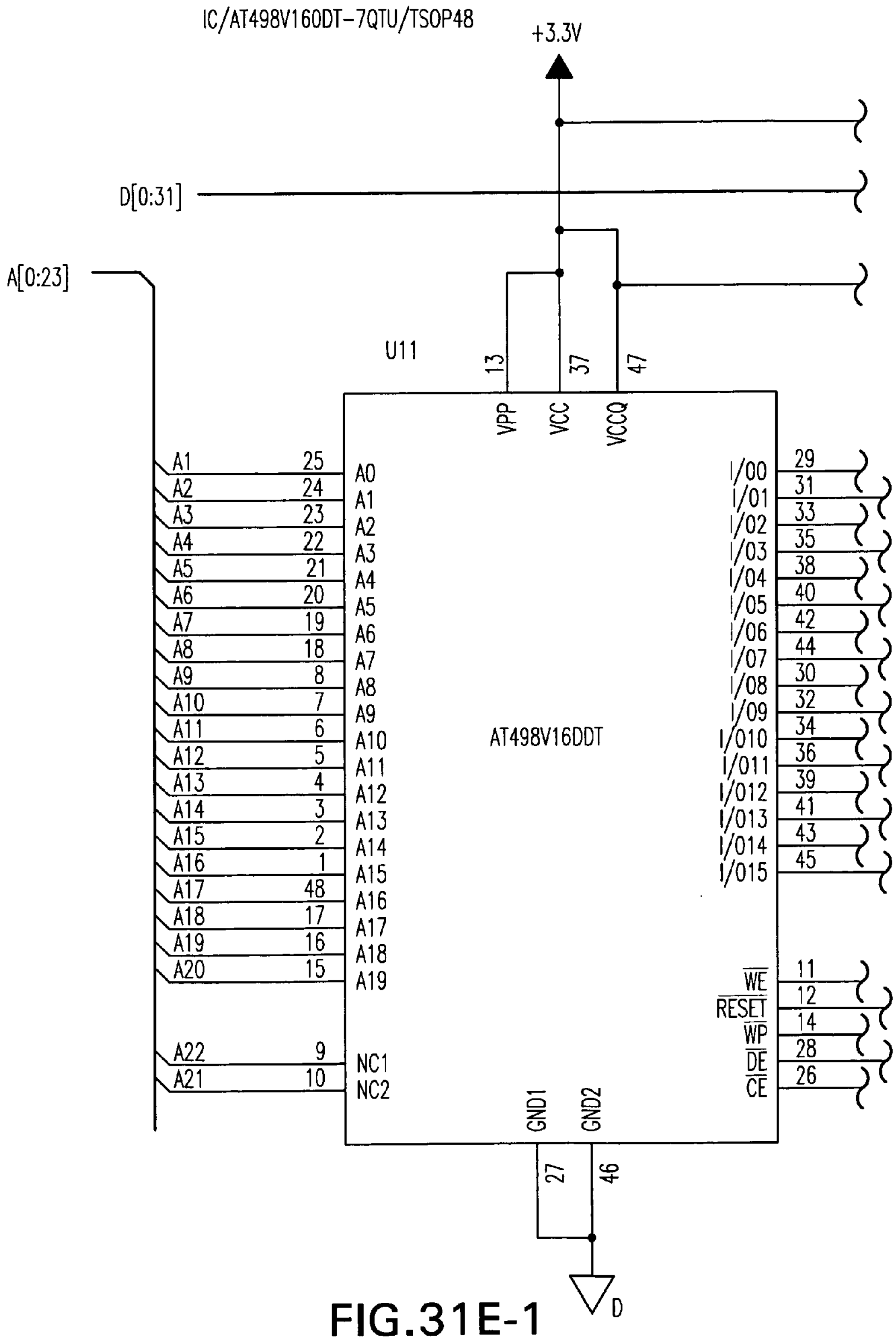
Figures 2, 31E:
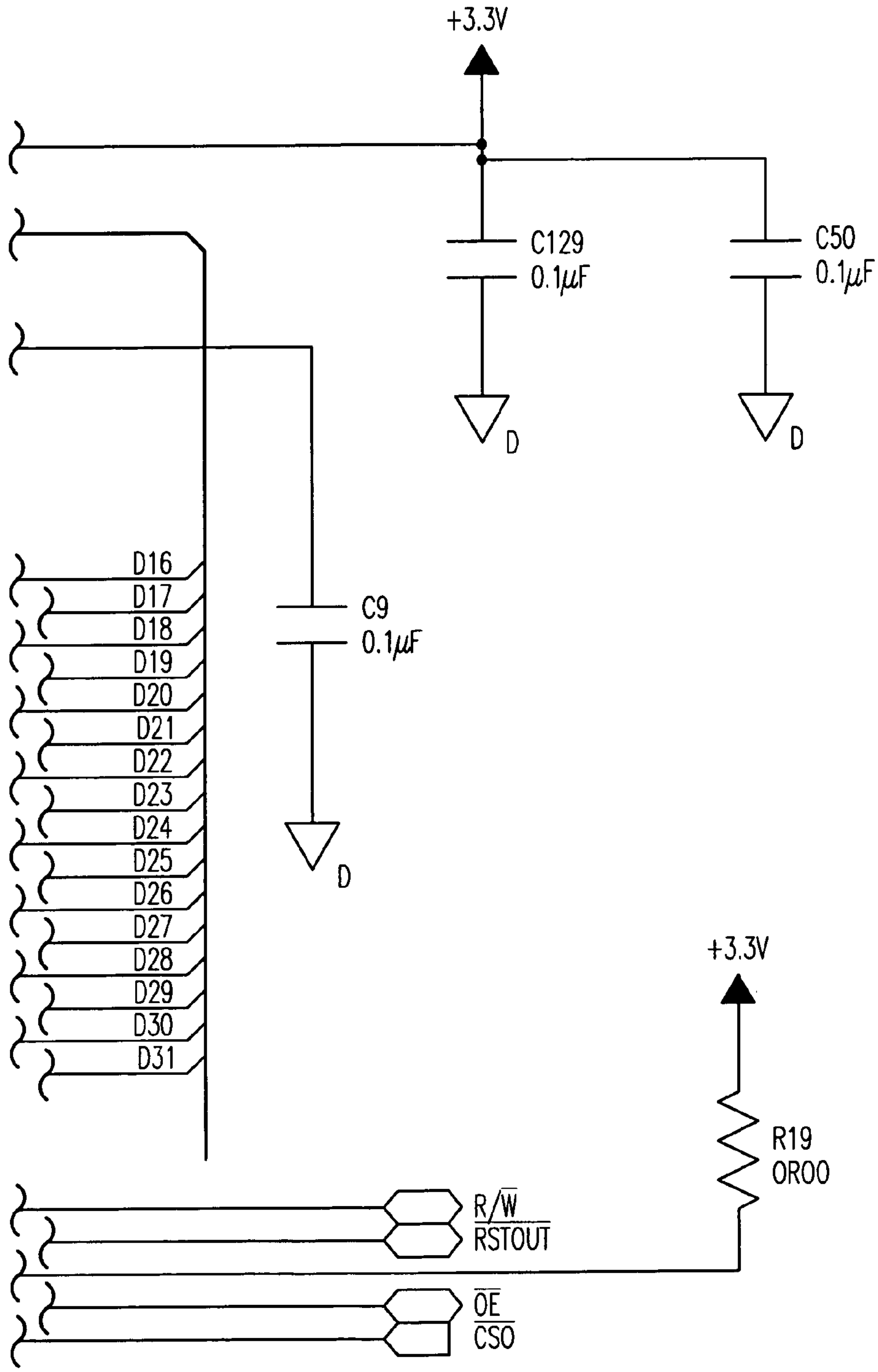
Figure 31F:
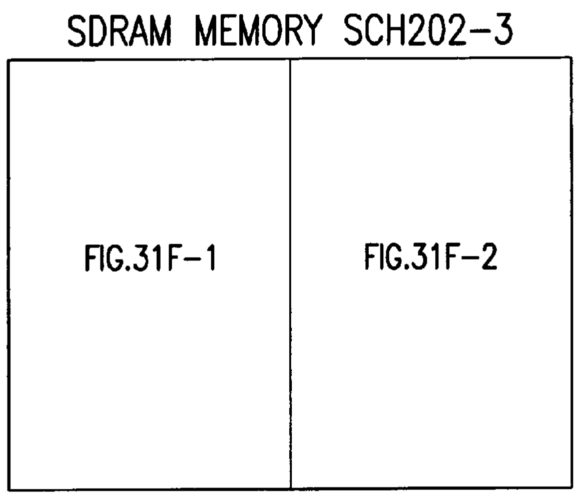
Figures 1, 31F:
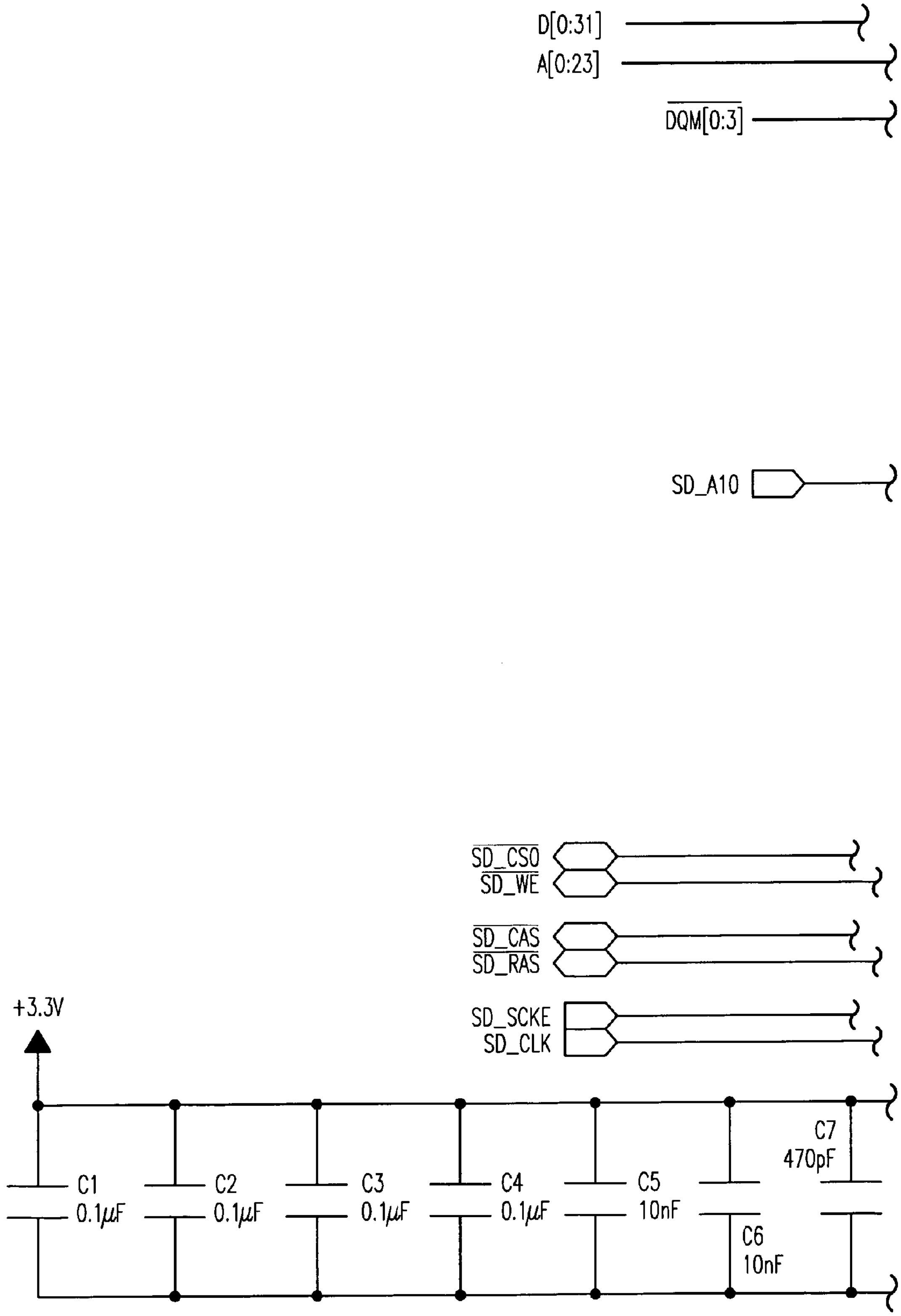
Figures 2, 31F:
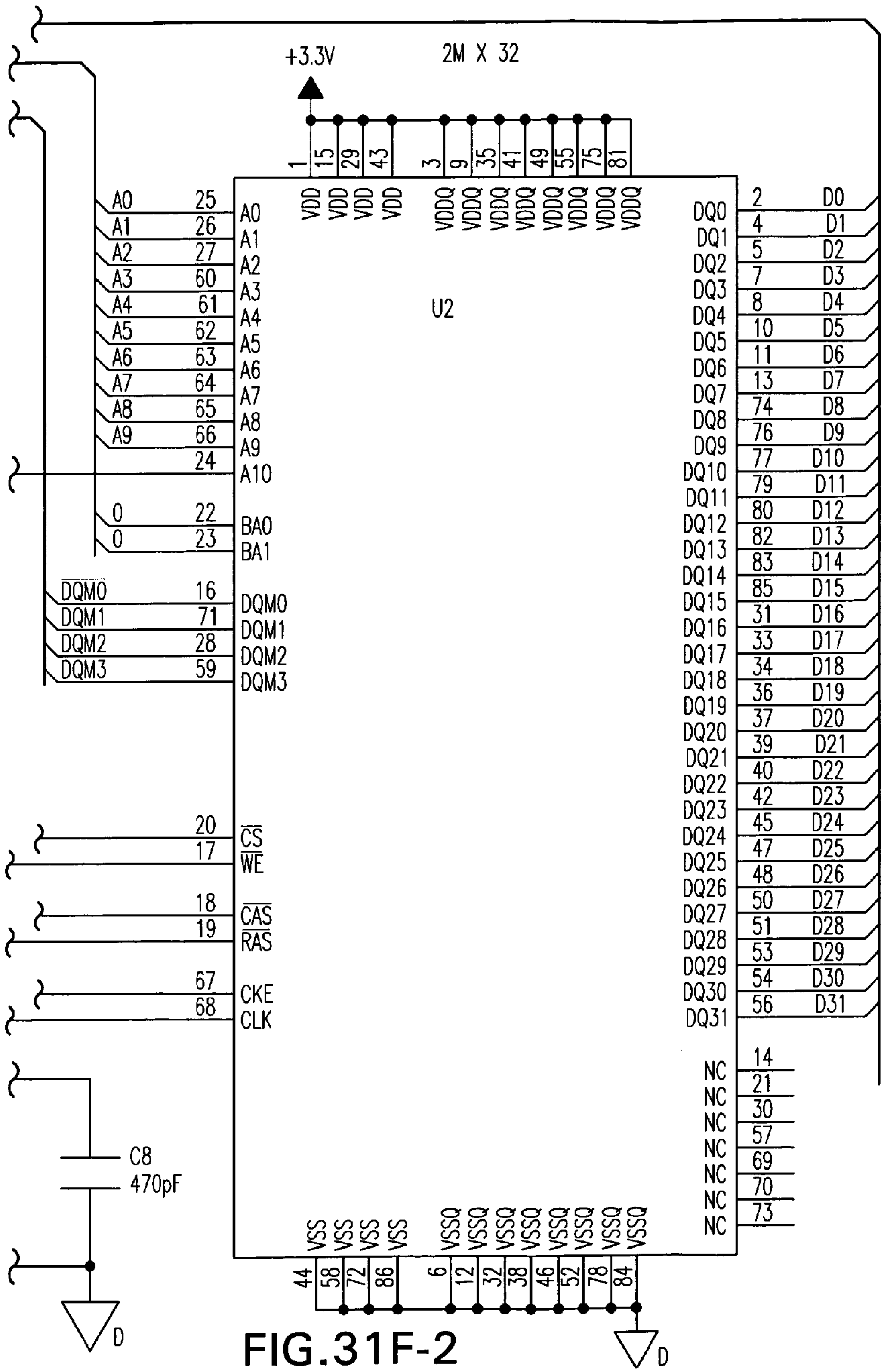
Figure 31G:
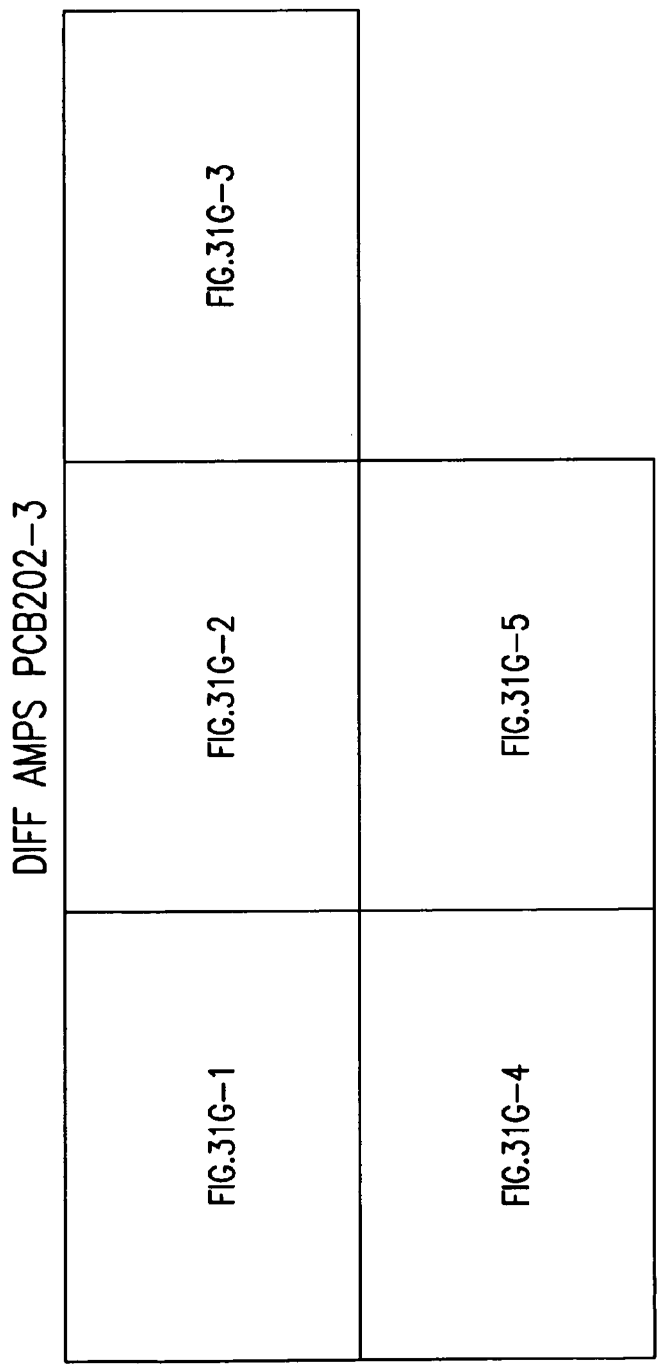
Figures 1, 31G:
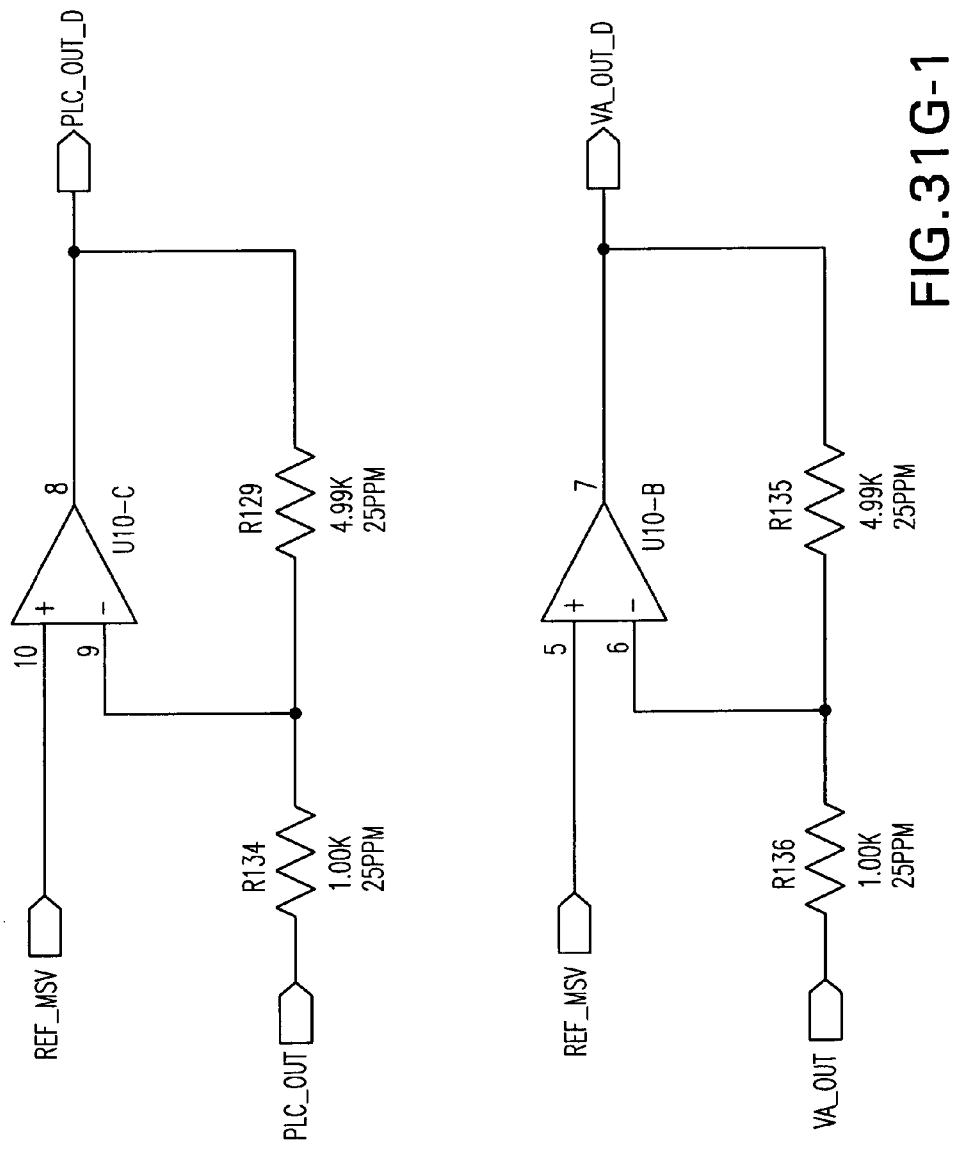
Figures 2, 31G:
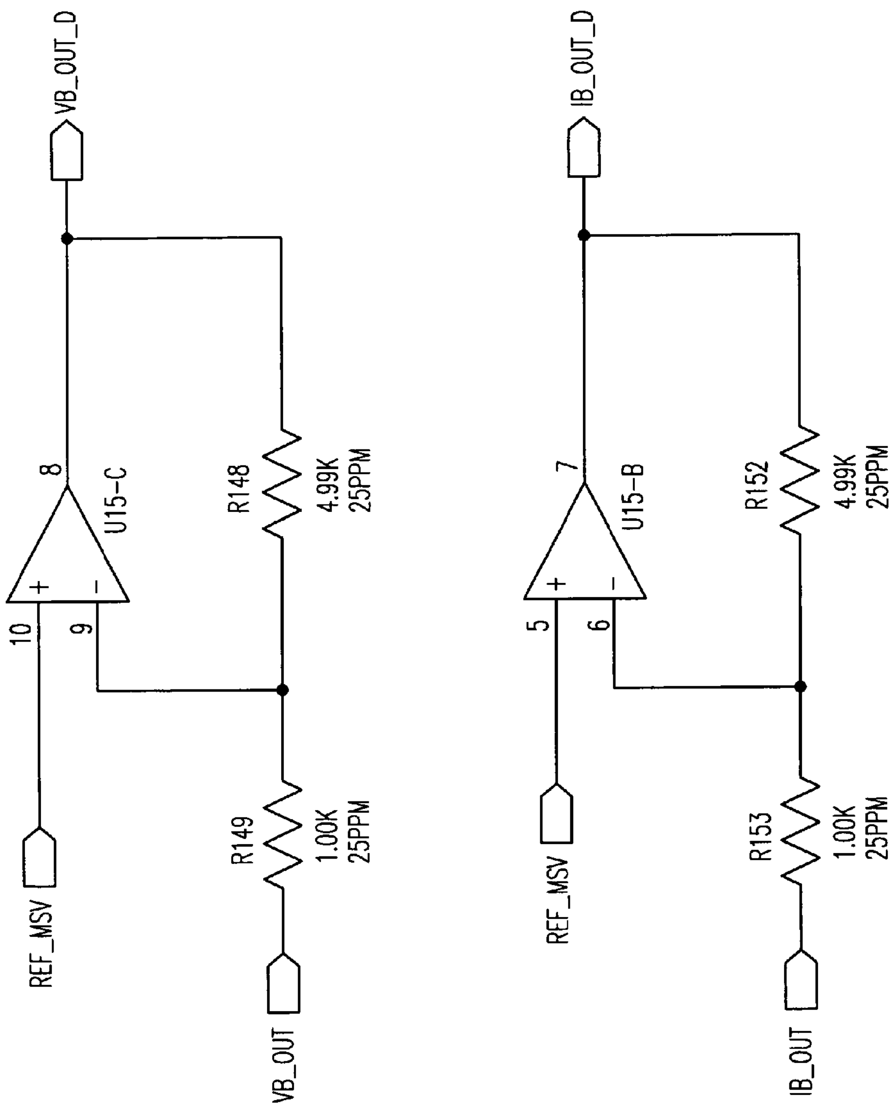
Figures 3, 31G:
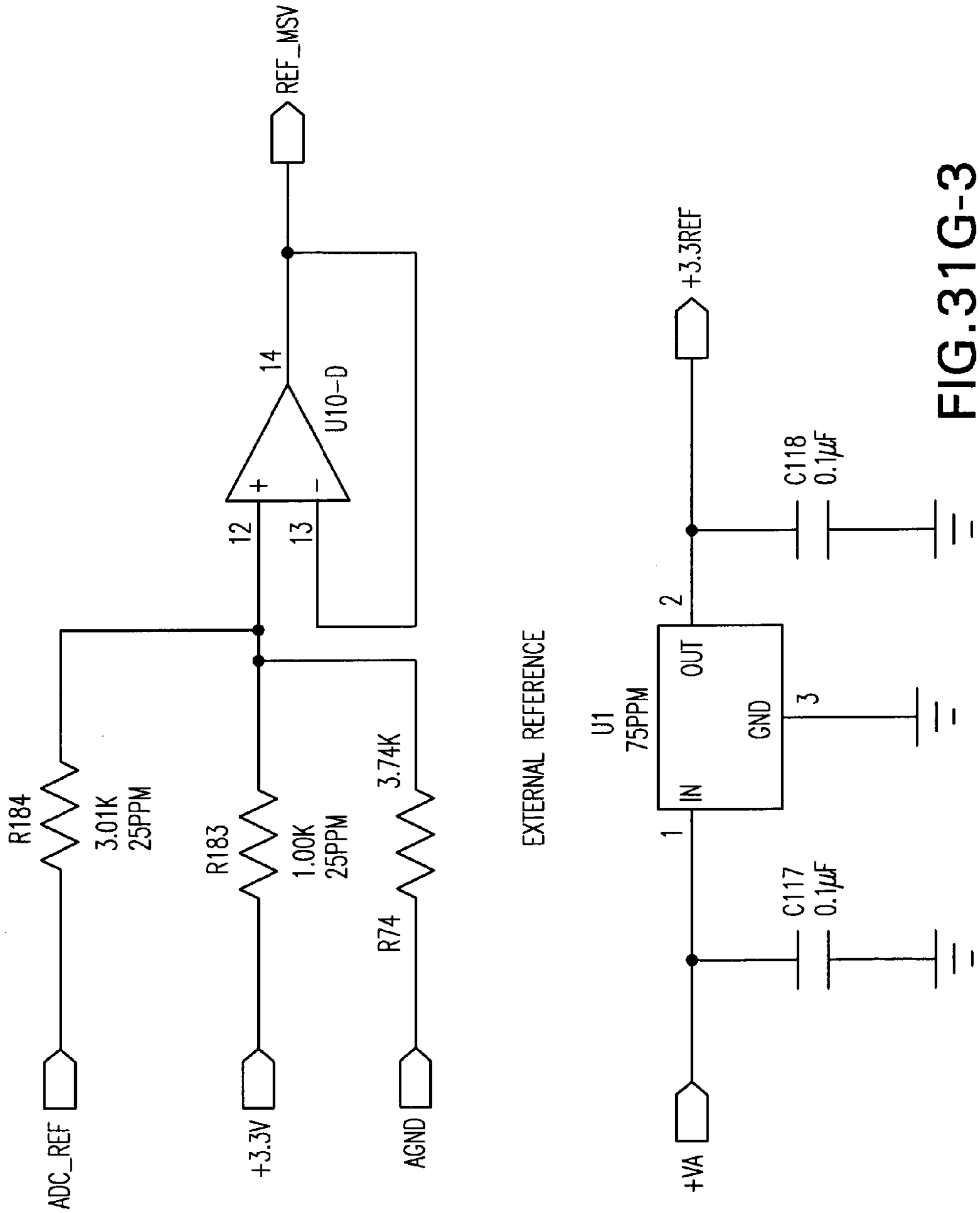
Figures 4, 31G:
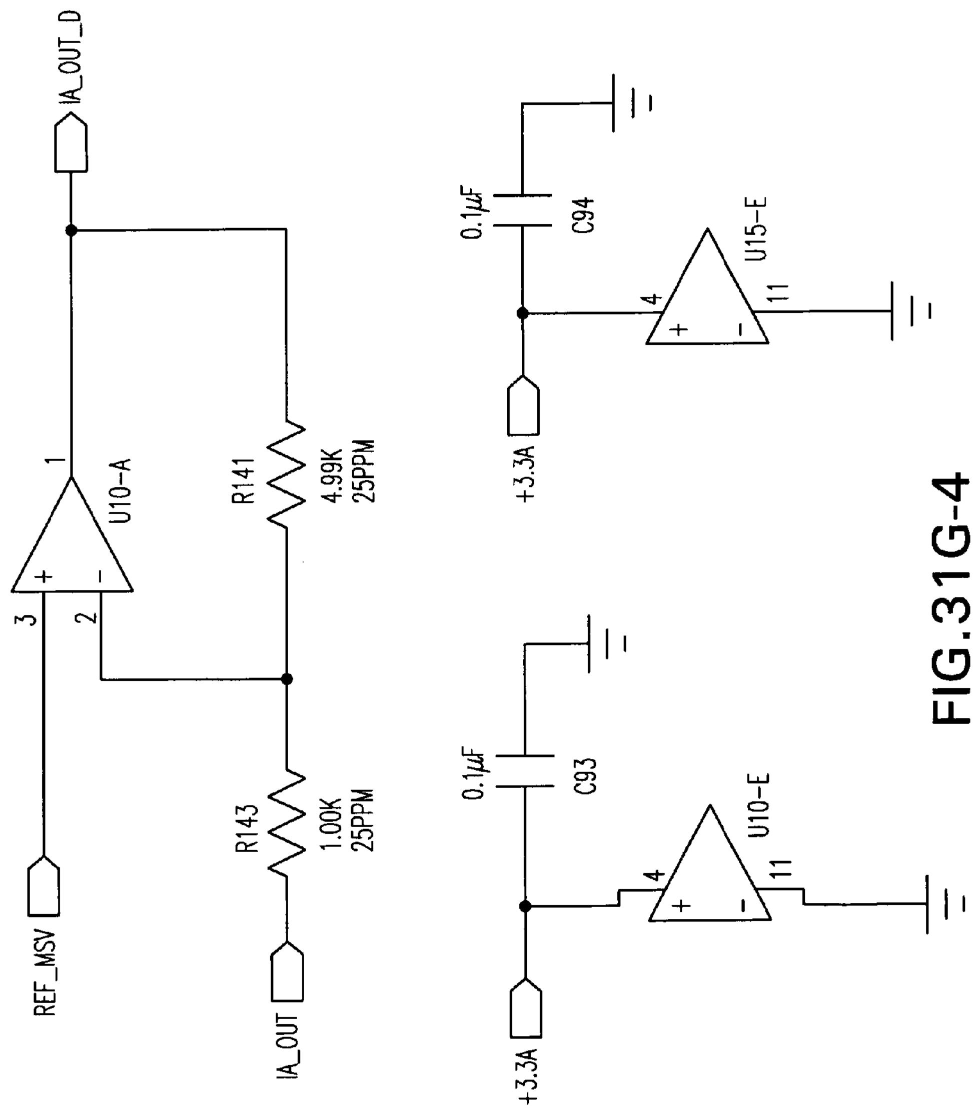
Figures 5, 31G:
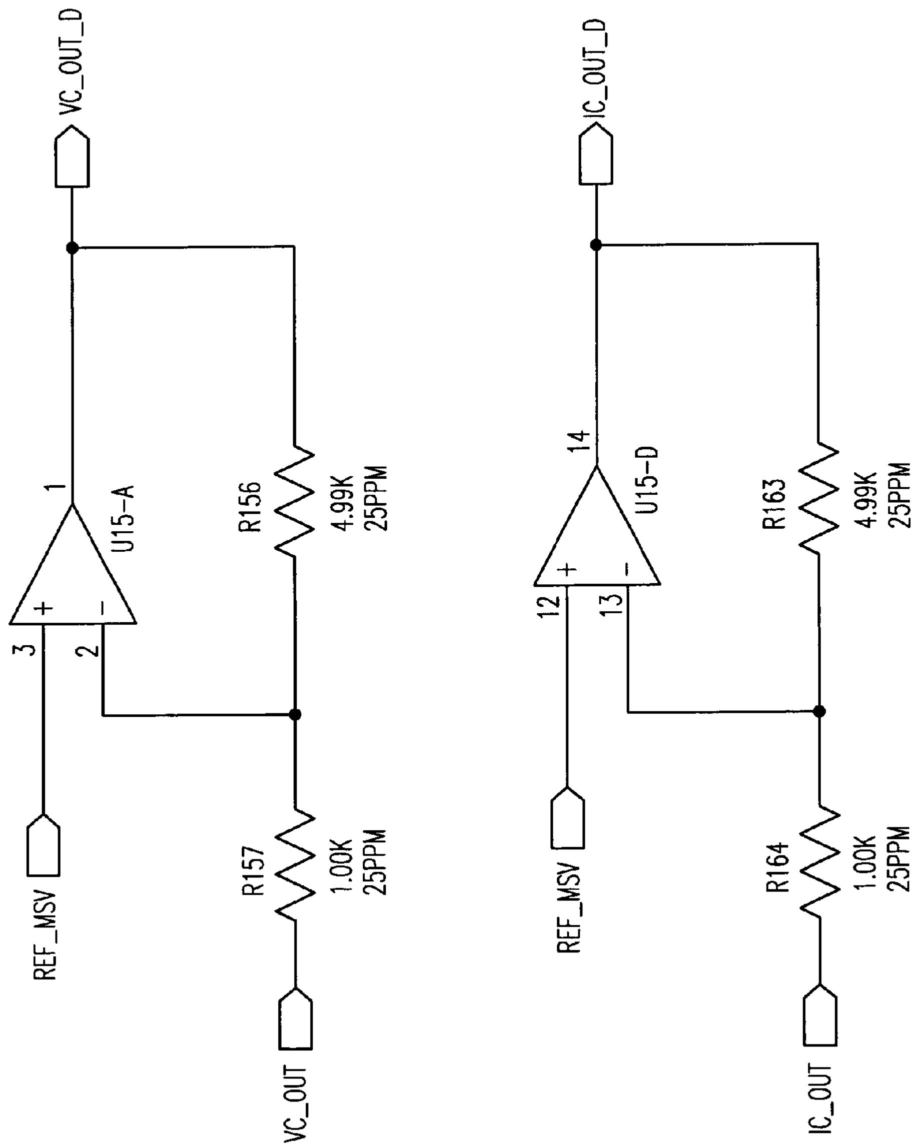
Figures 1, 31H:
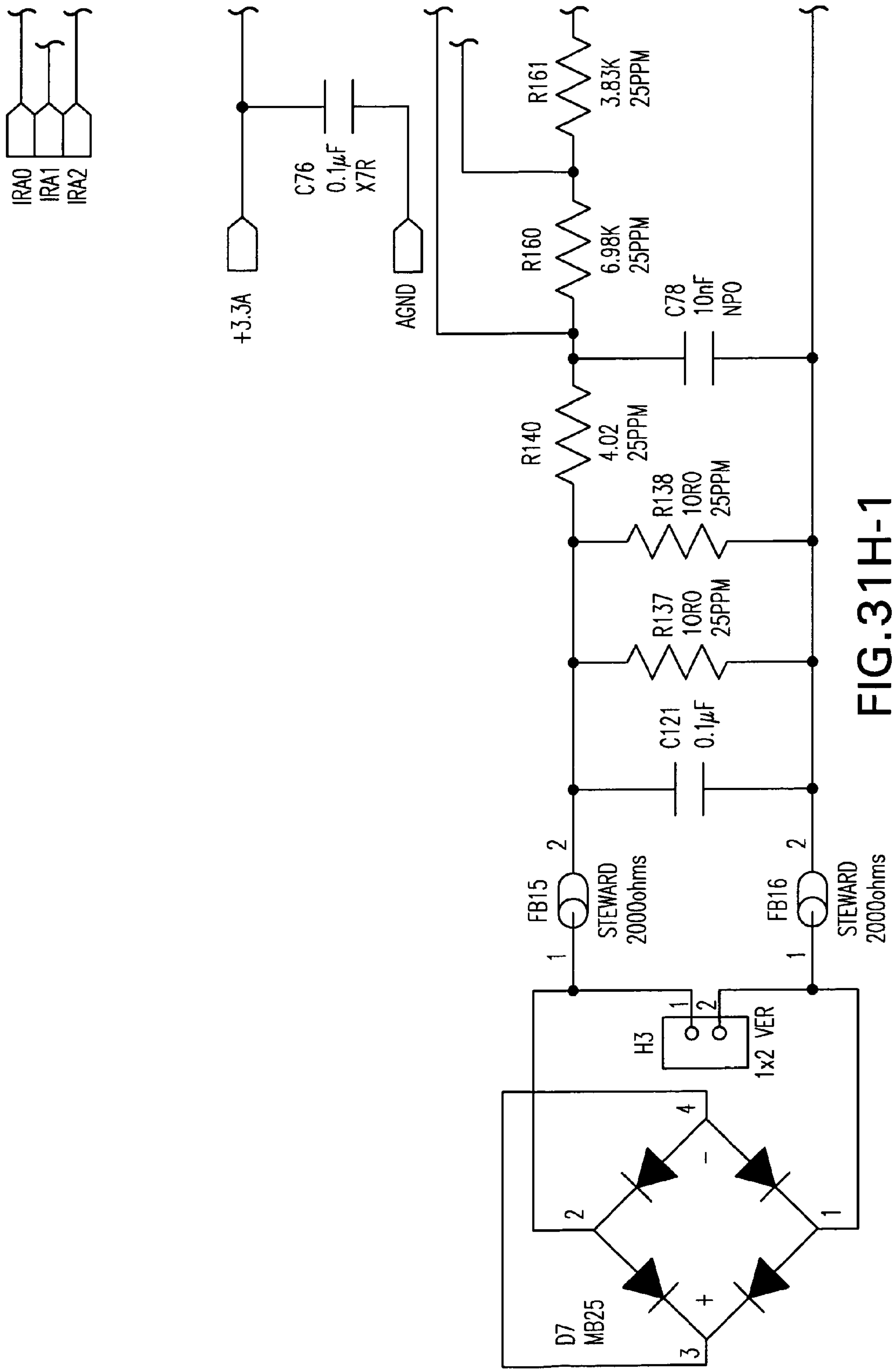
Figures 2, 31H:
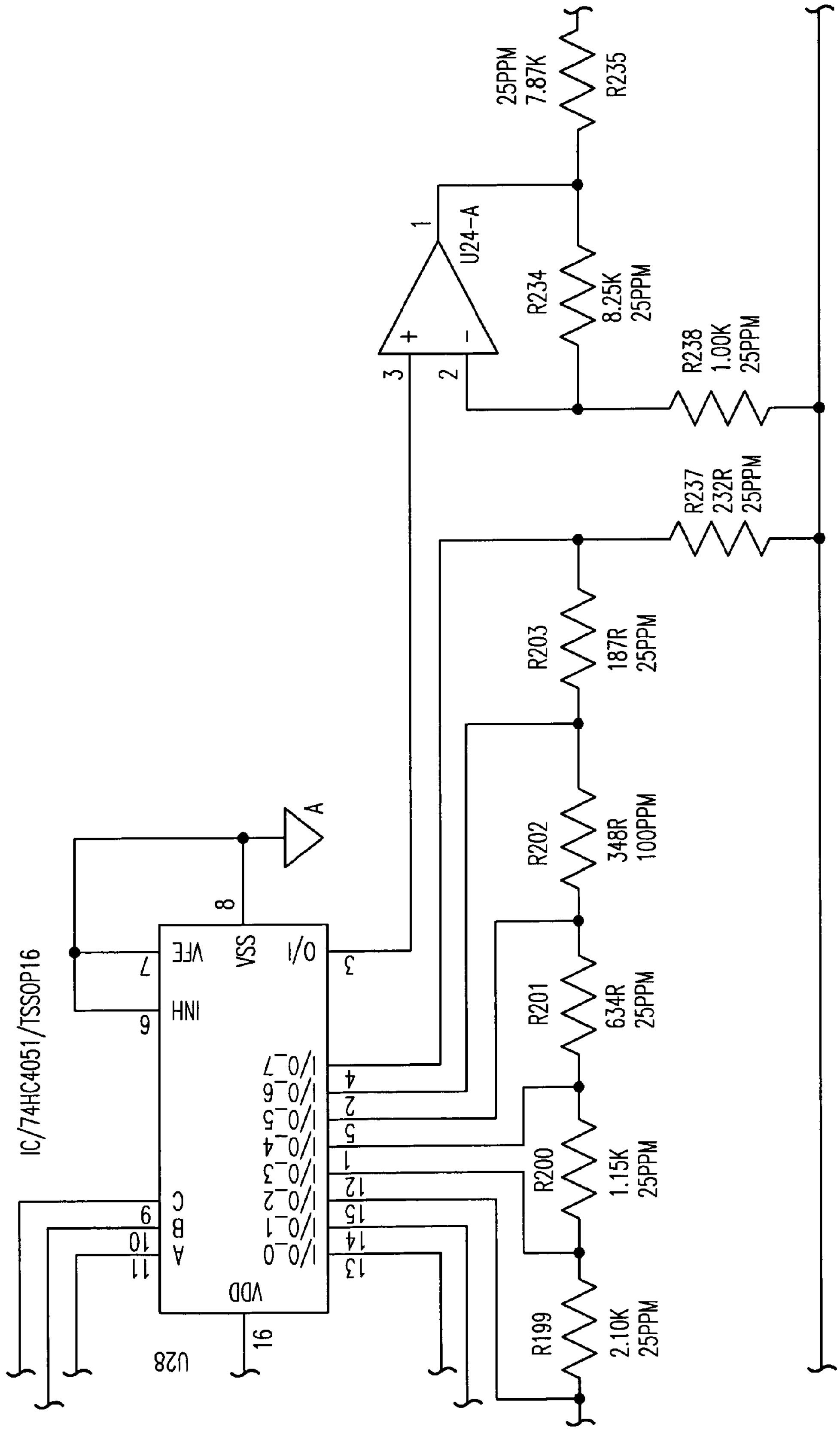
Figures 3, 31H:
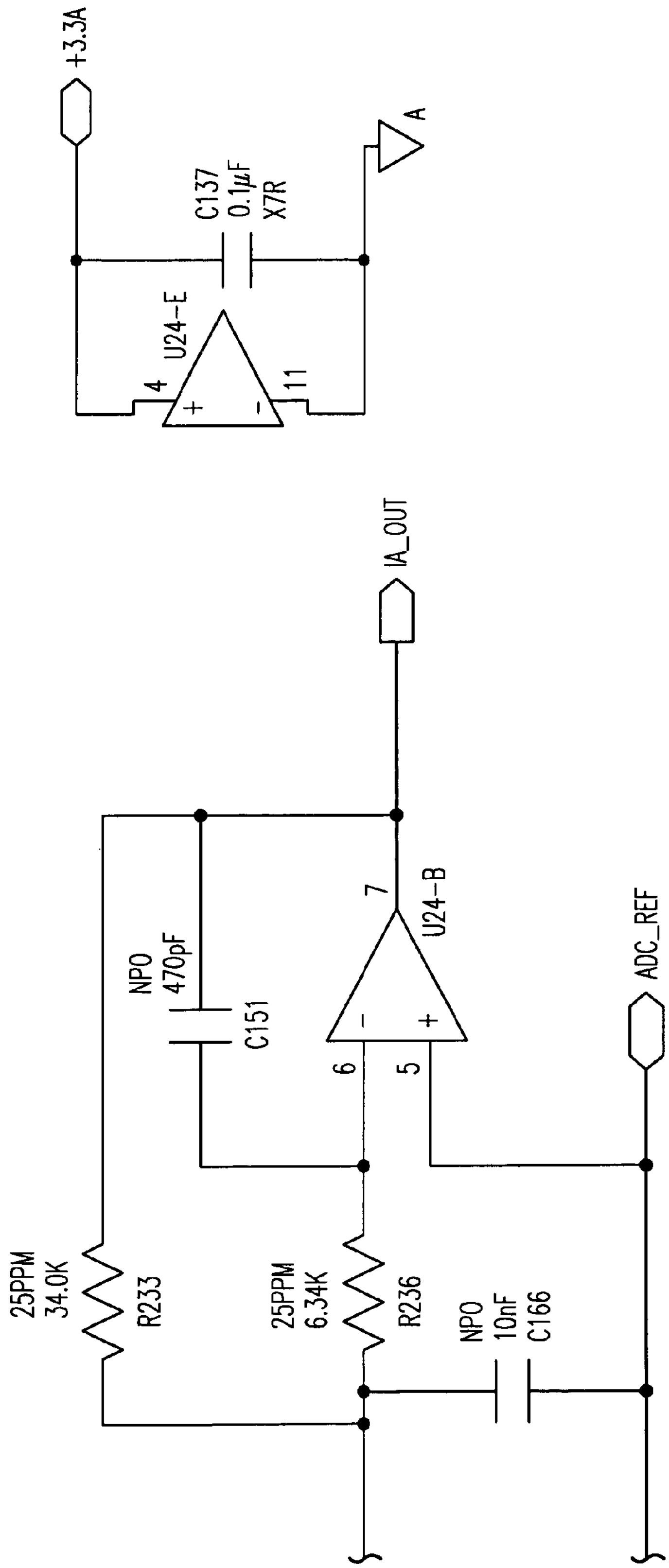
Figures 4, 31H:
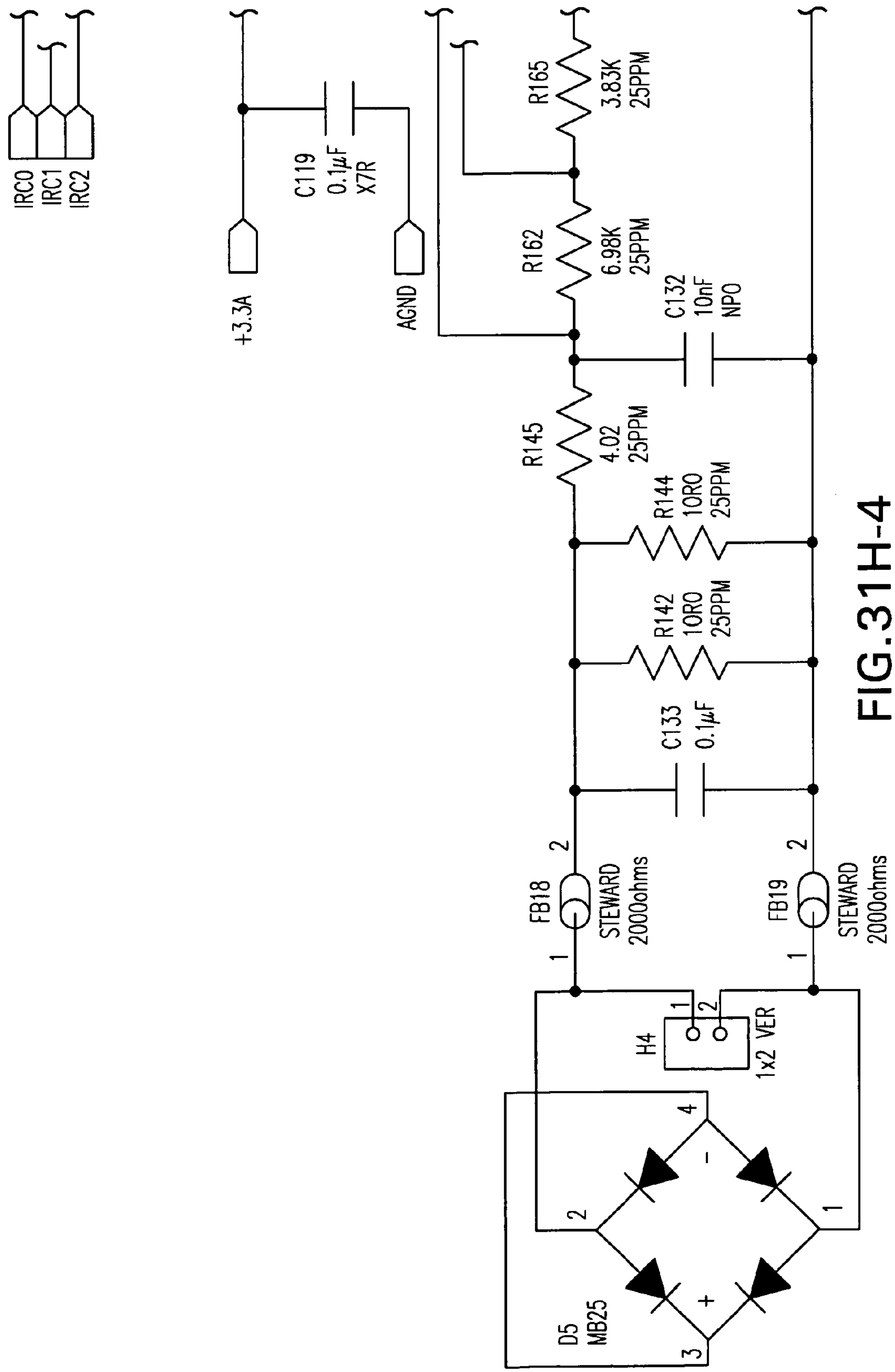
Figures 5, 31H:
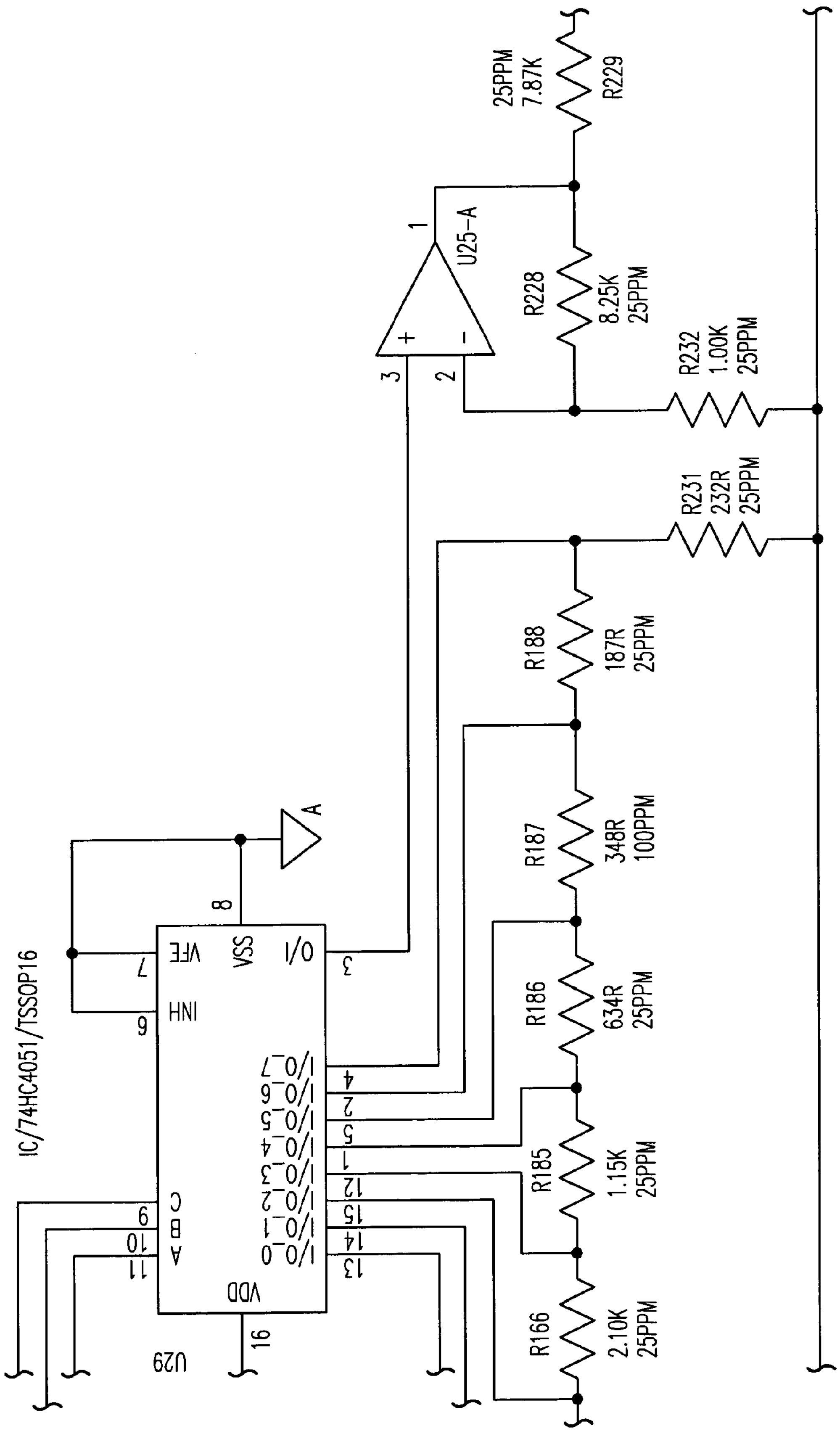
Figures 6, 31H:
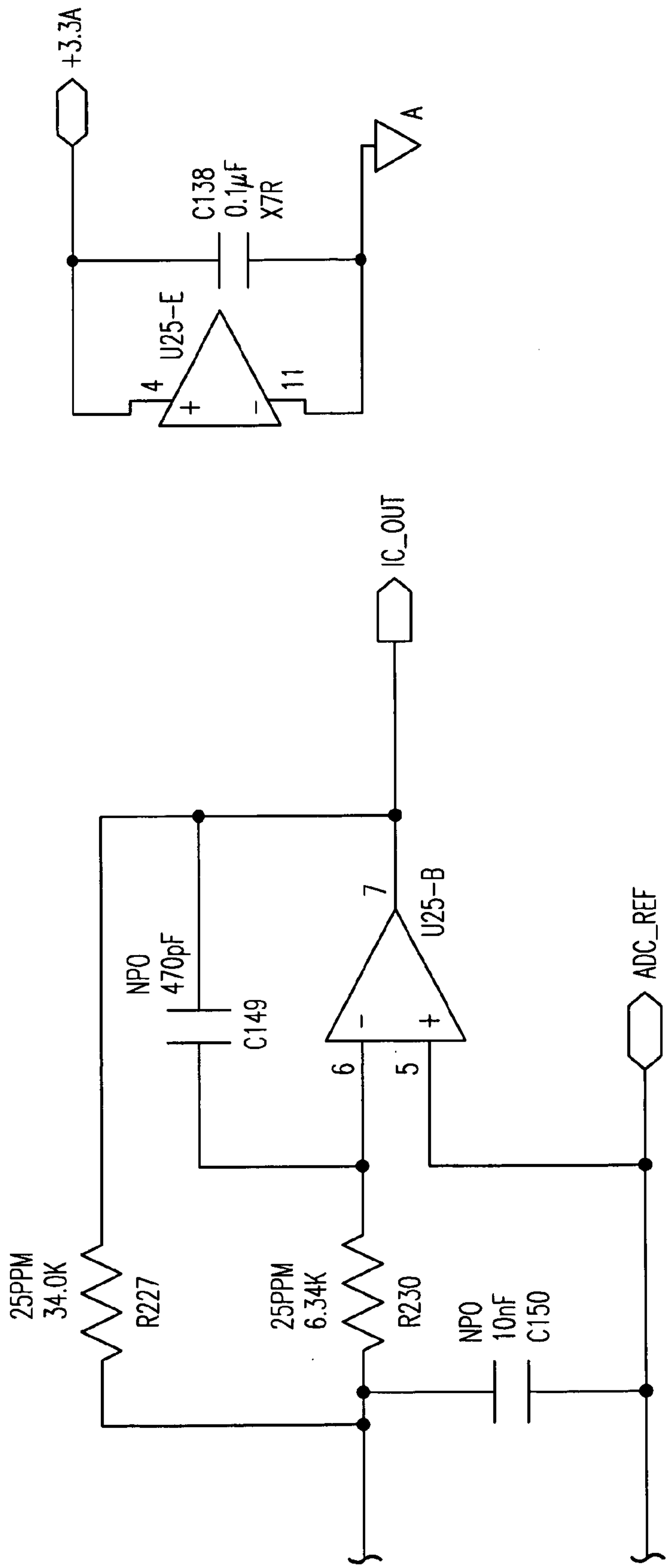
Figures 7, 31H:
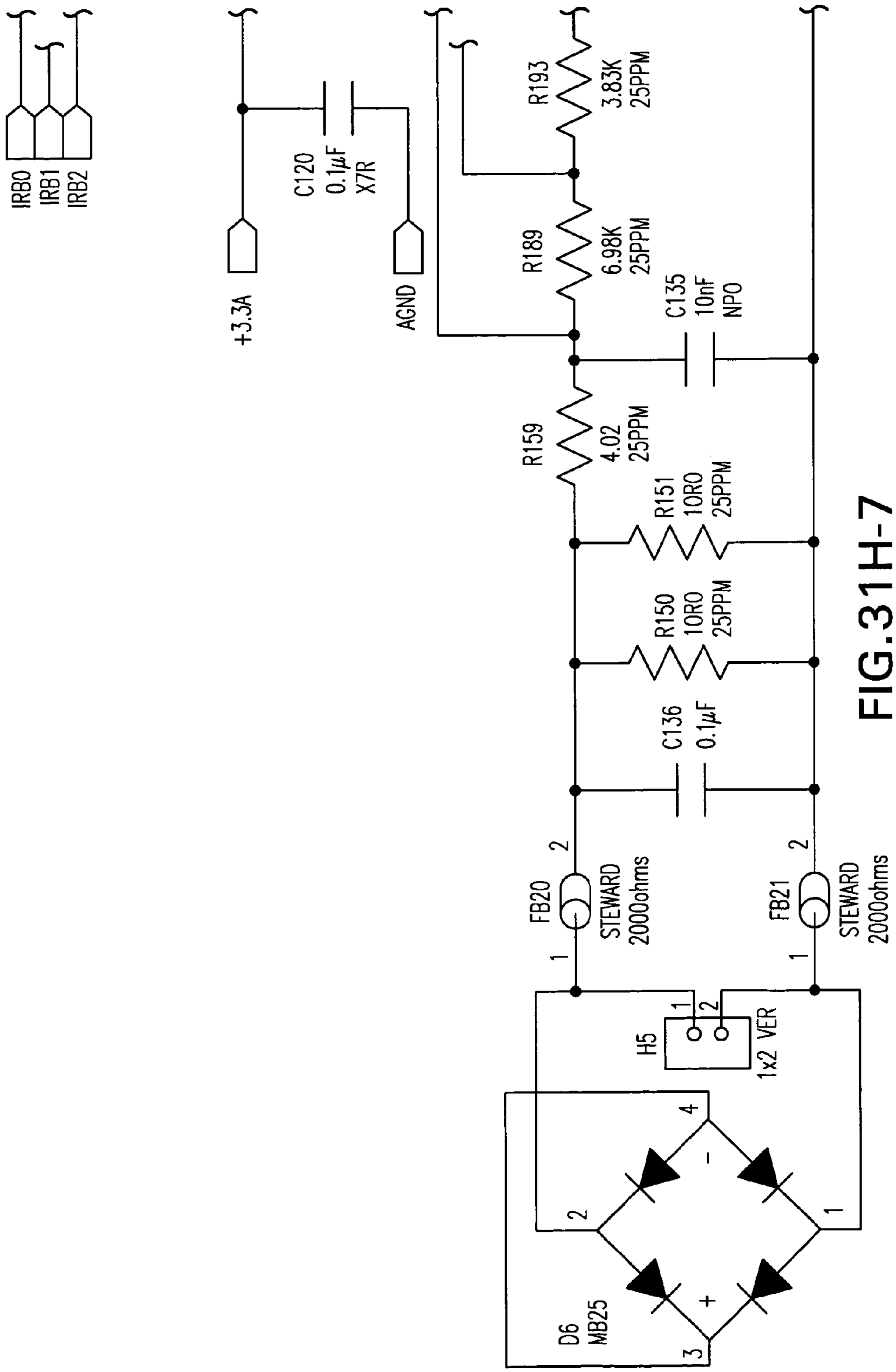
Figures 8, 31H:
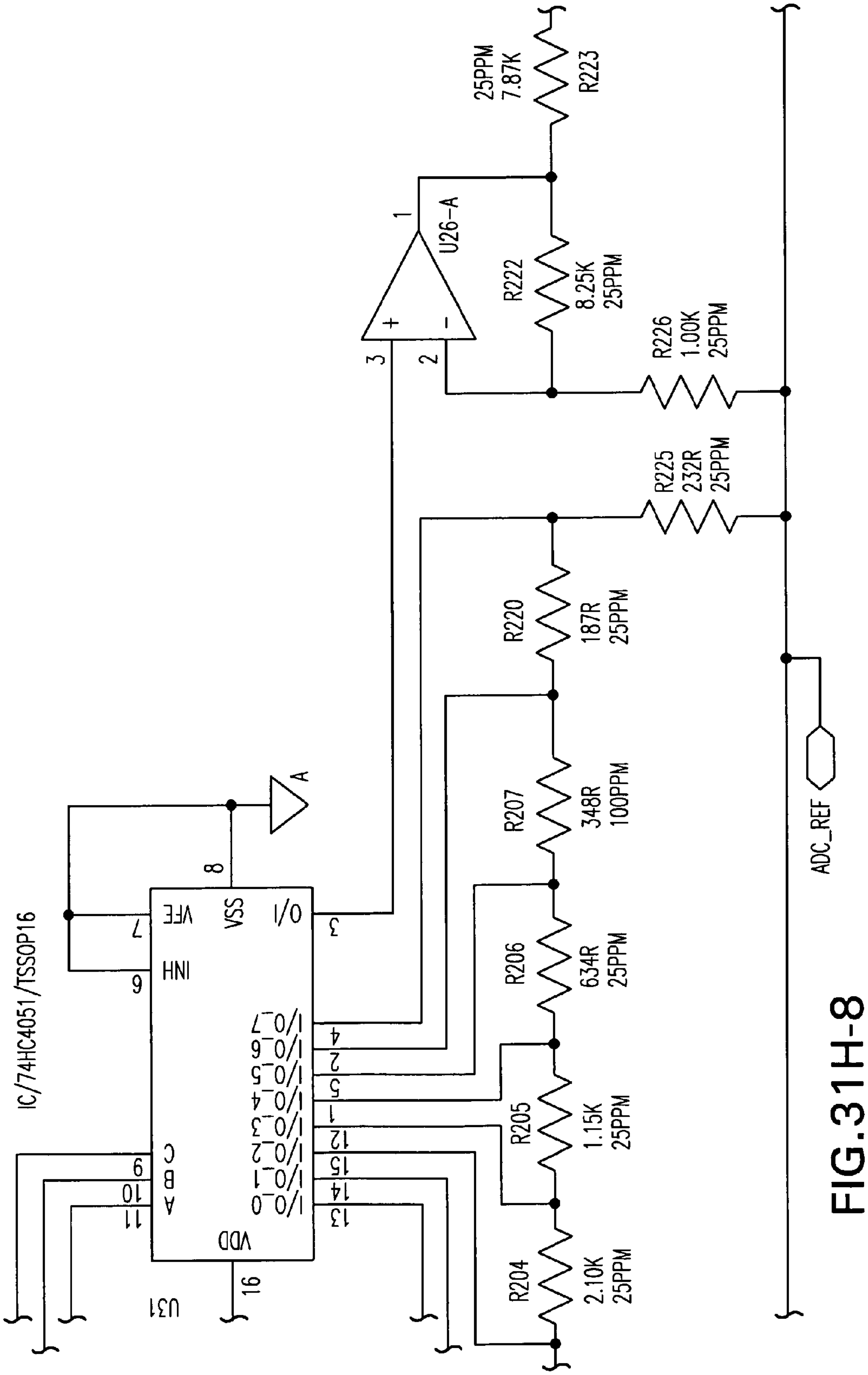
Figures 9, 31H:
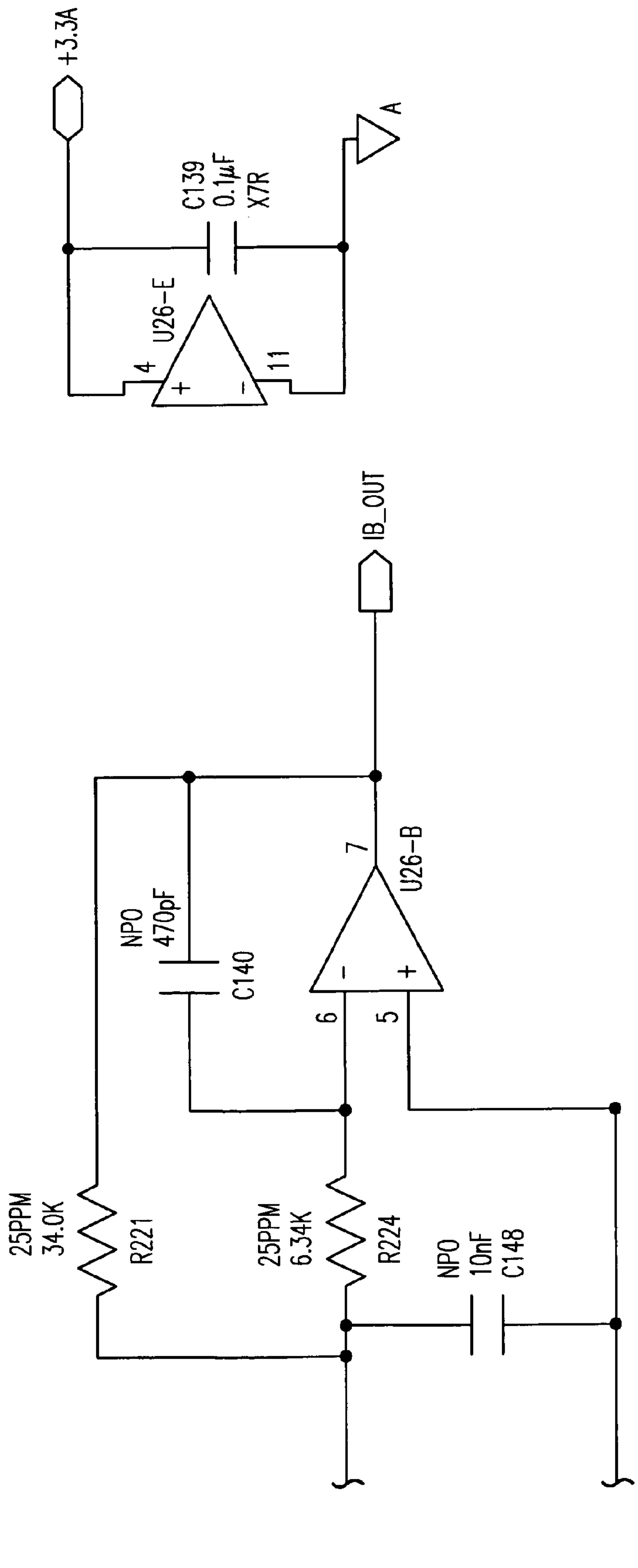
Figure 31I:
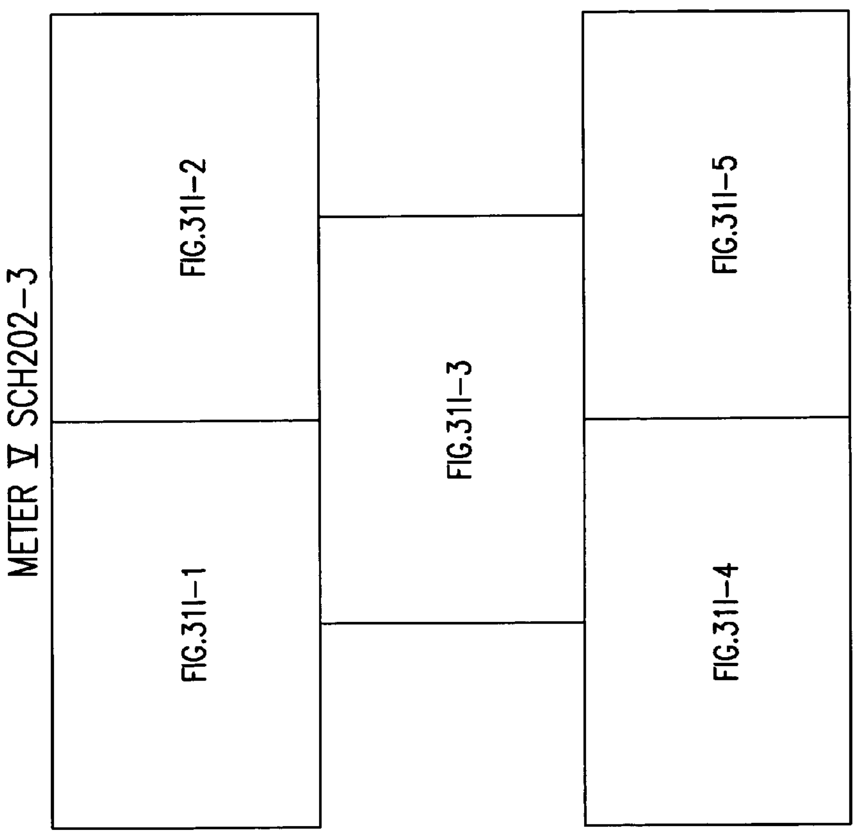
Figures 1, 31I:
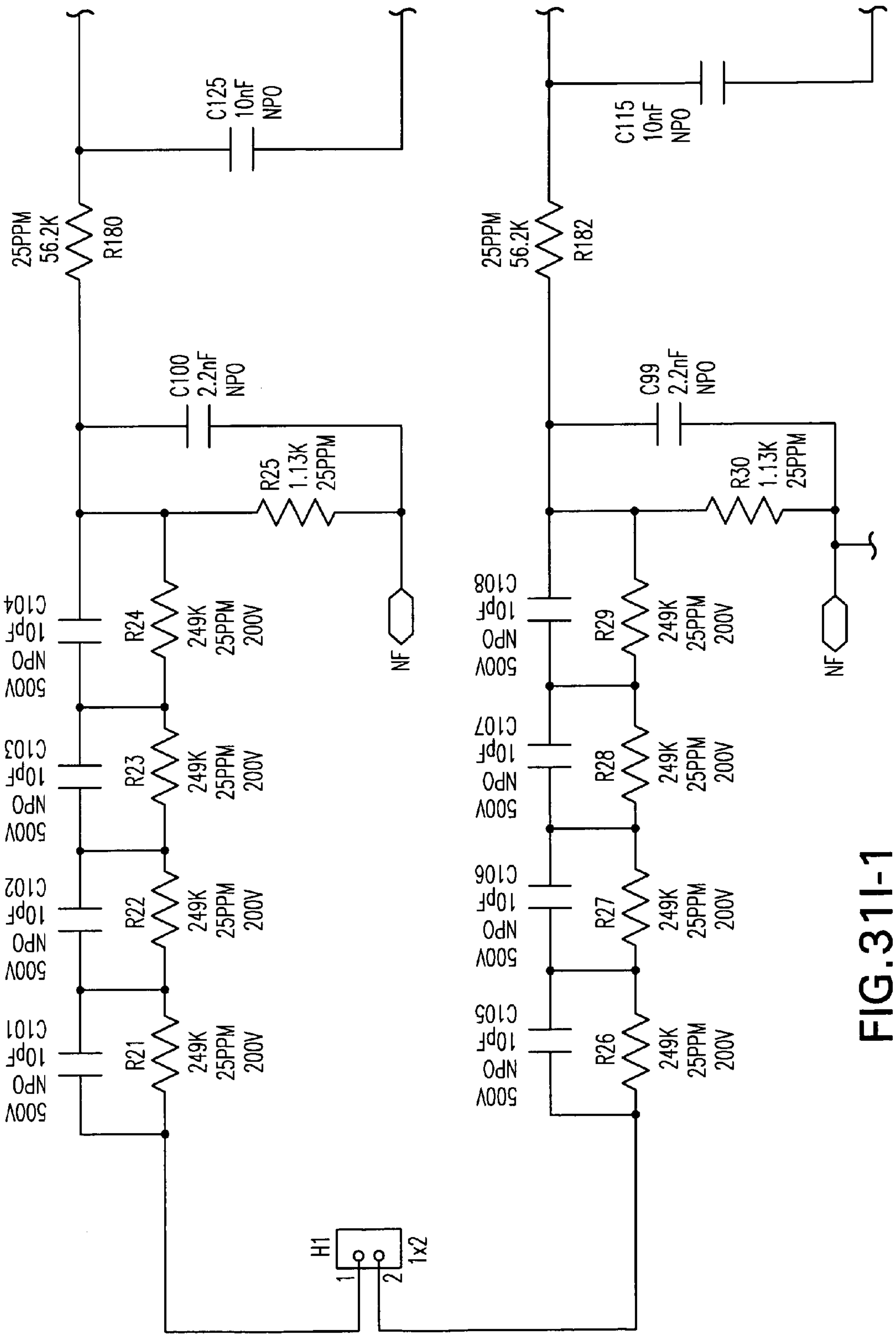
Figures 2, 31I:
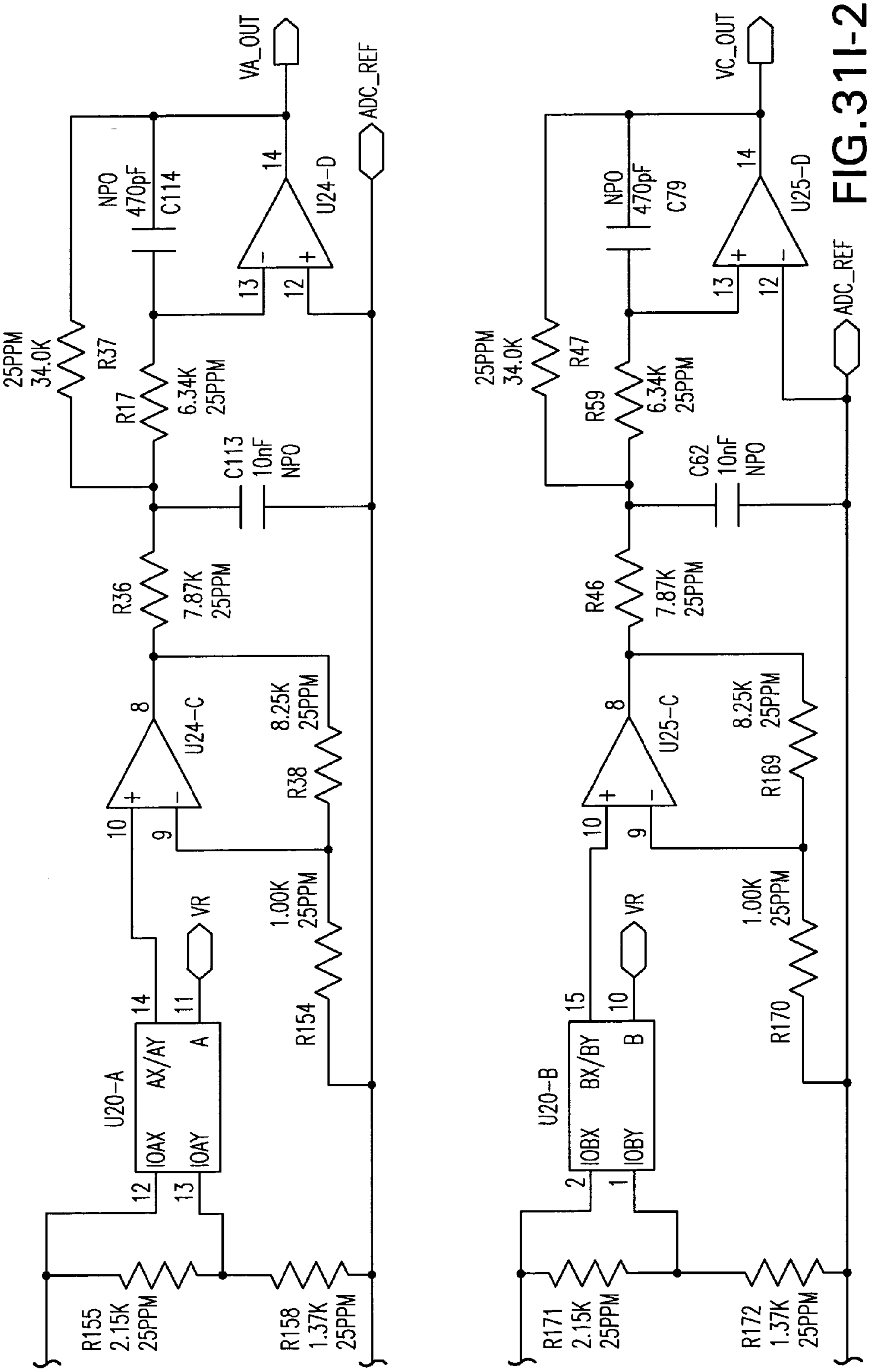
Figures 3, 31I:
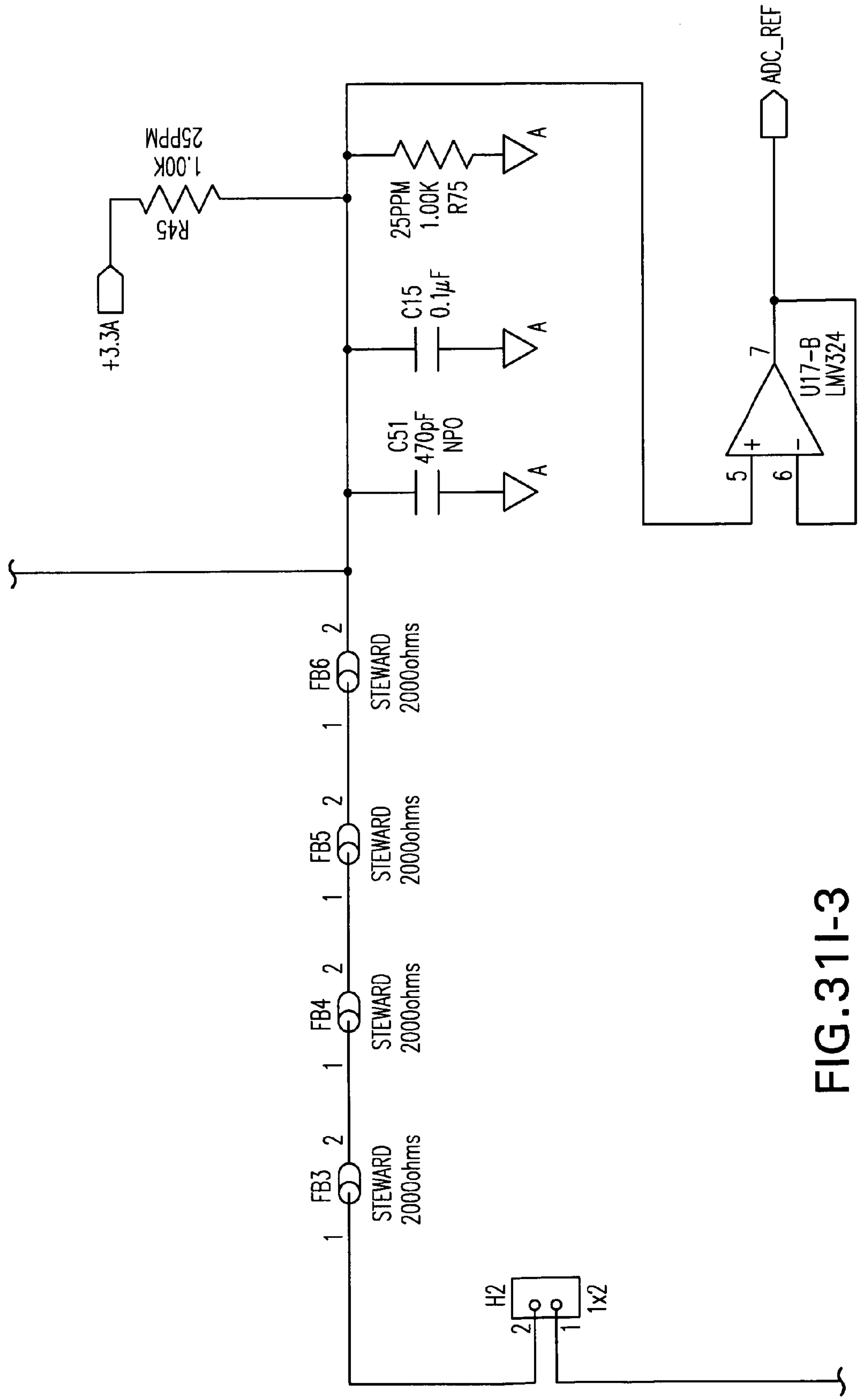
Figures 4, 31I:
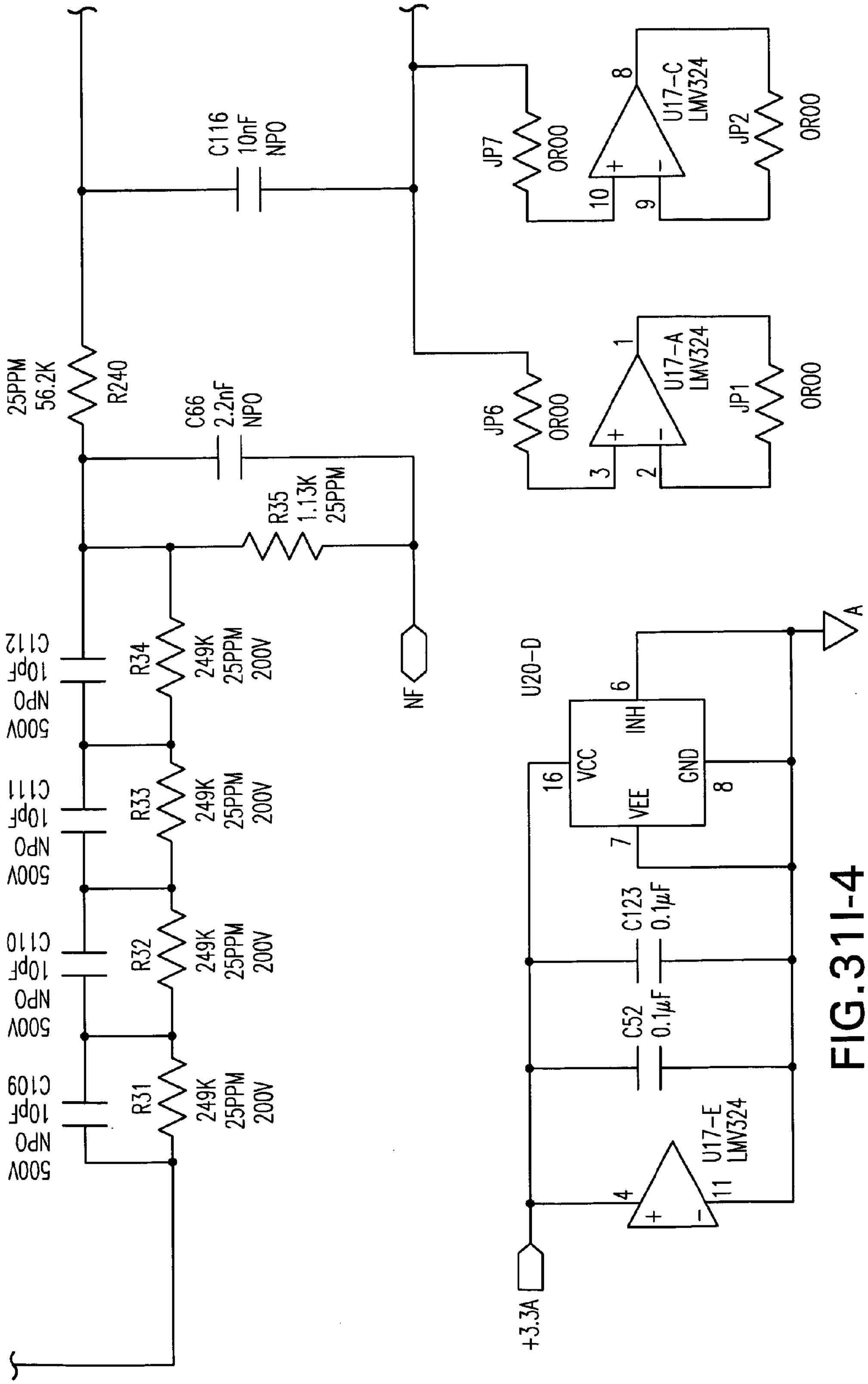
Figures 5, 31I:
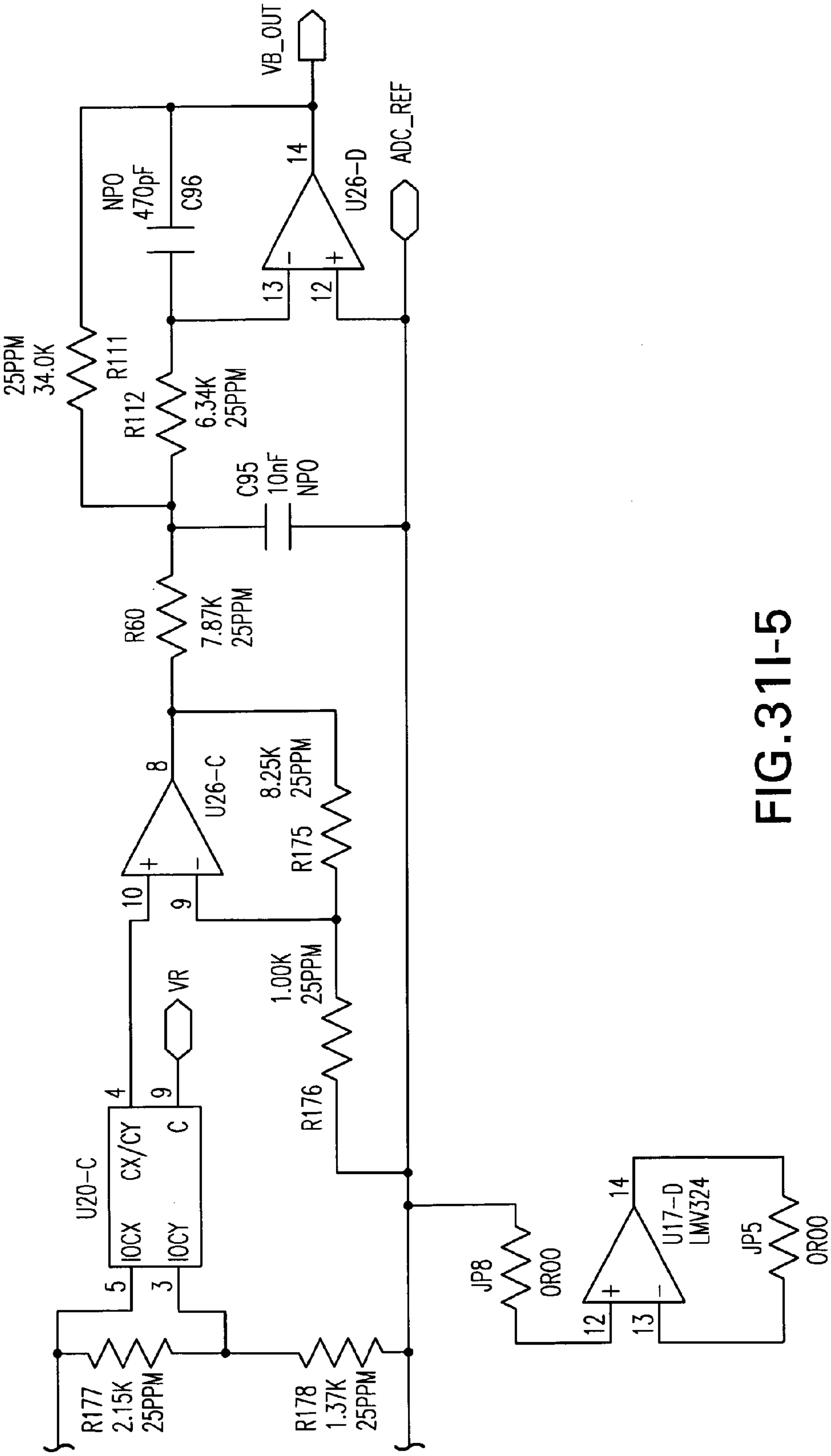
Figure 31J:
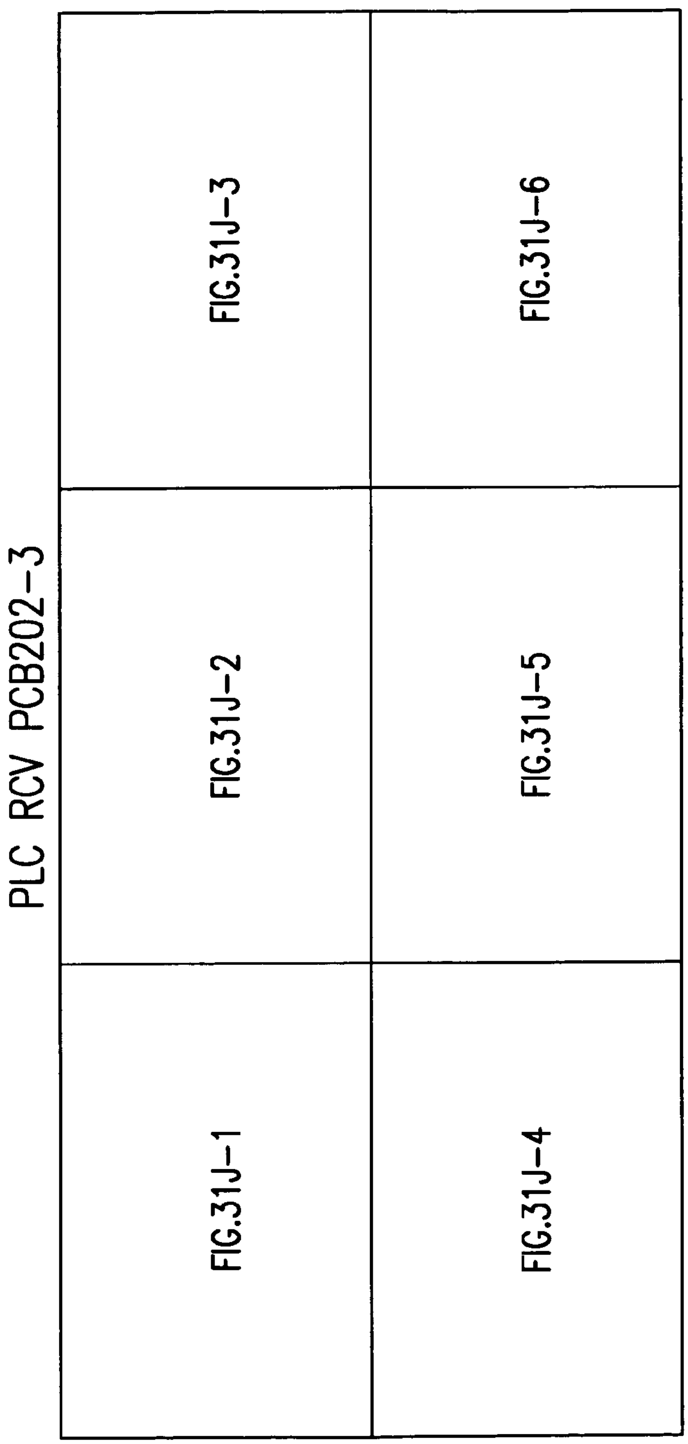
Figures 1, 31J:
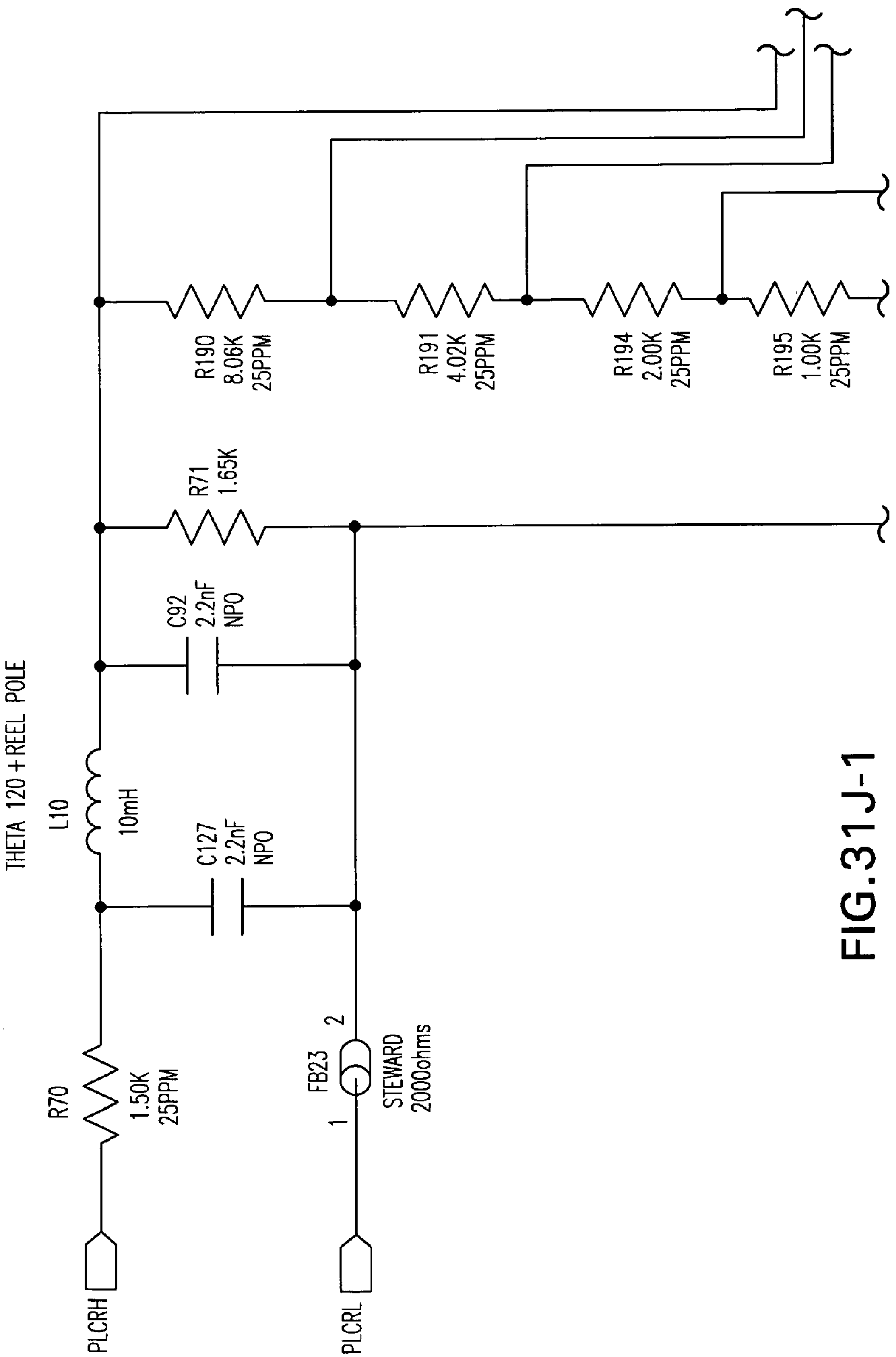
Figures 2, 31J:
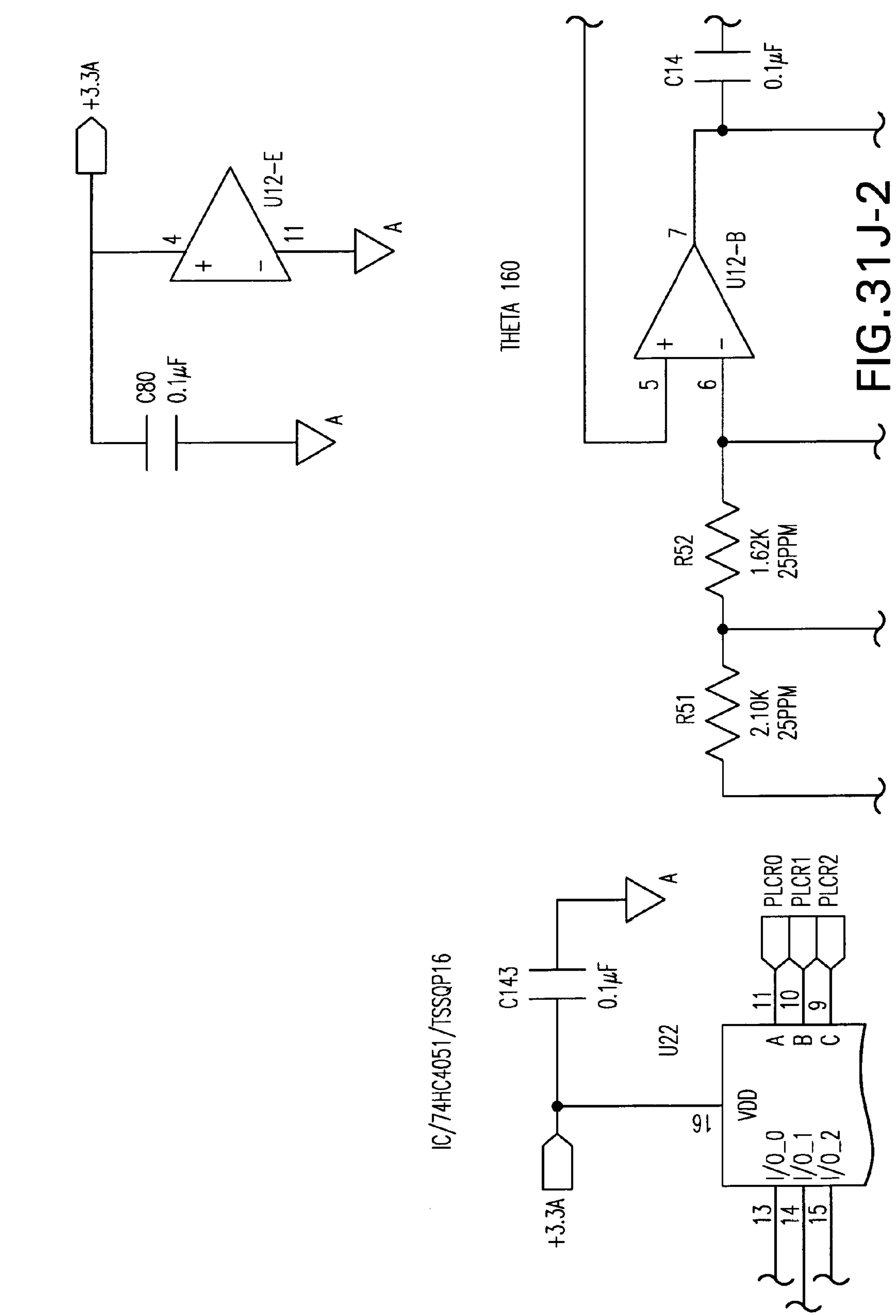
Figures 3, 31J:
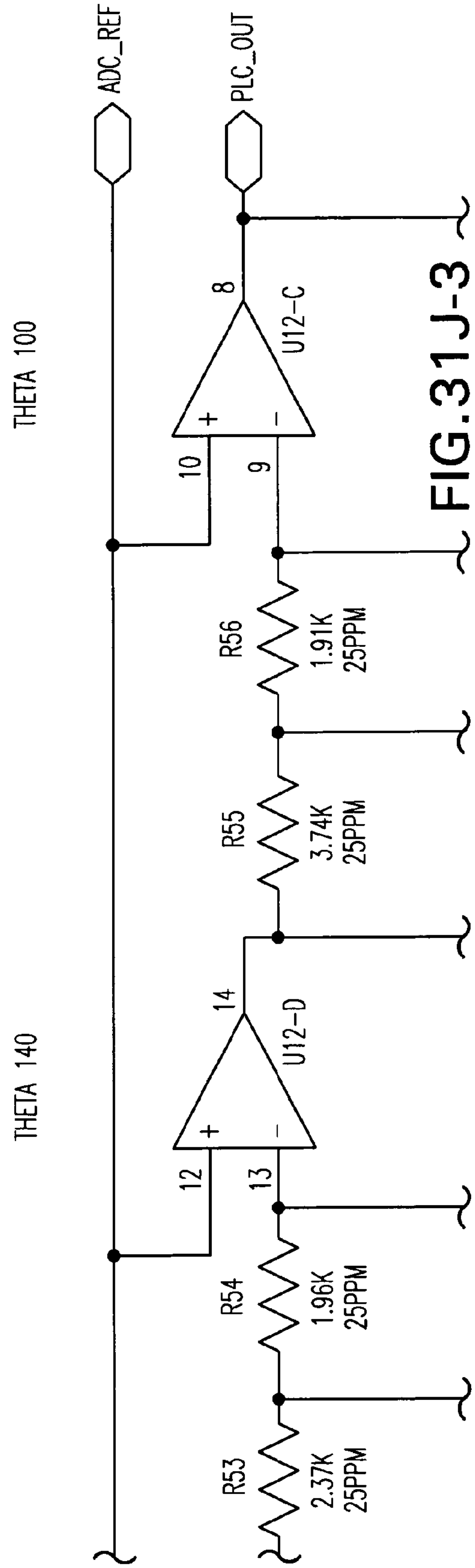
Figures 4, 31J:
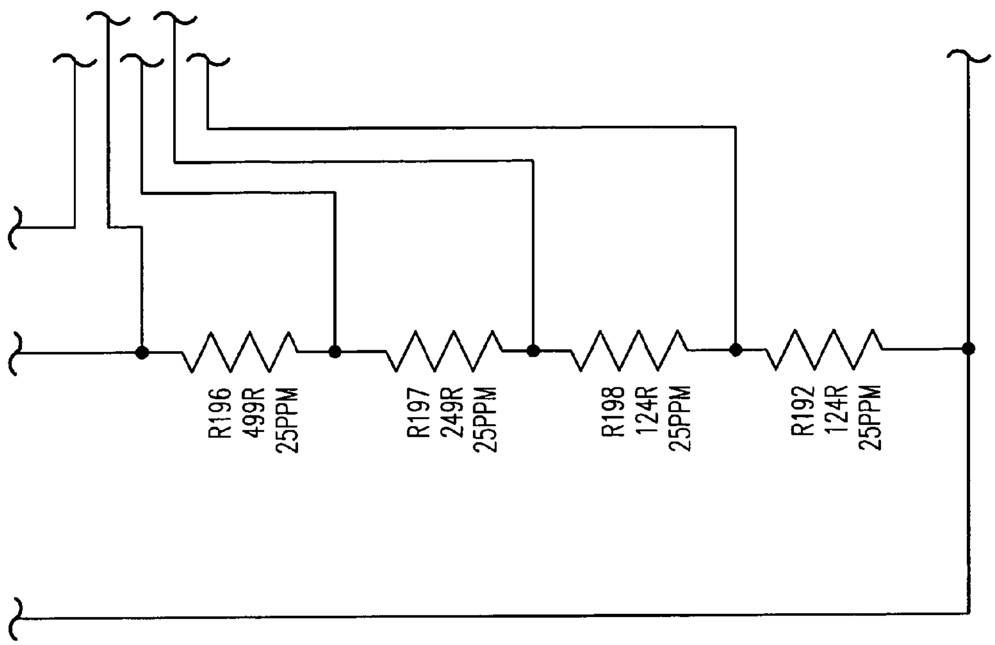
Figures 5, 31J:
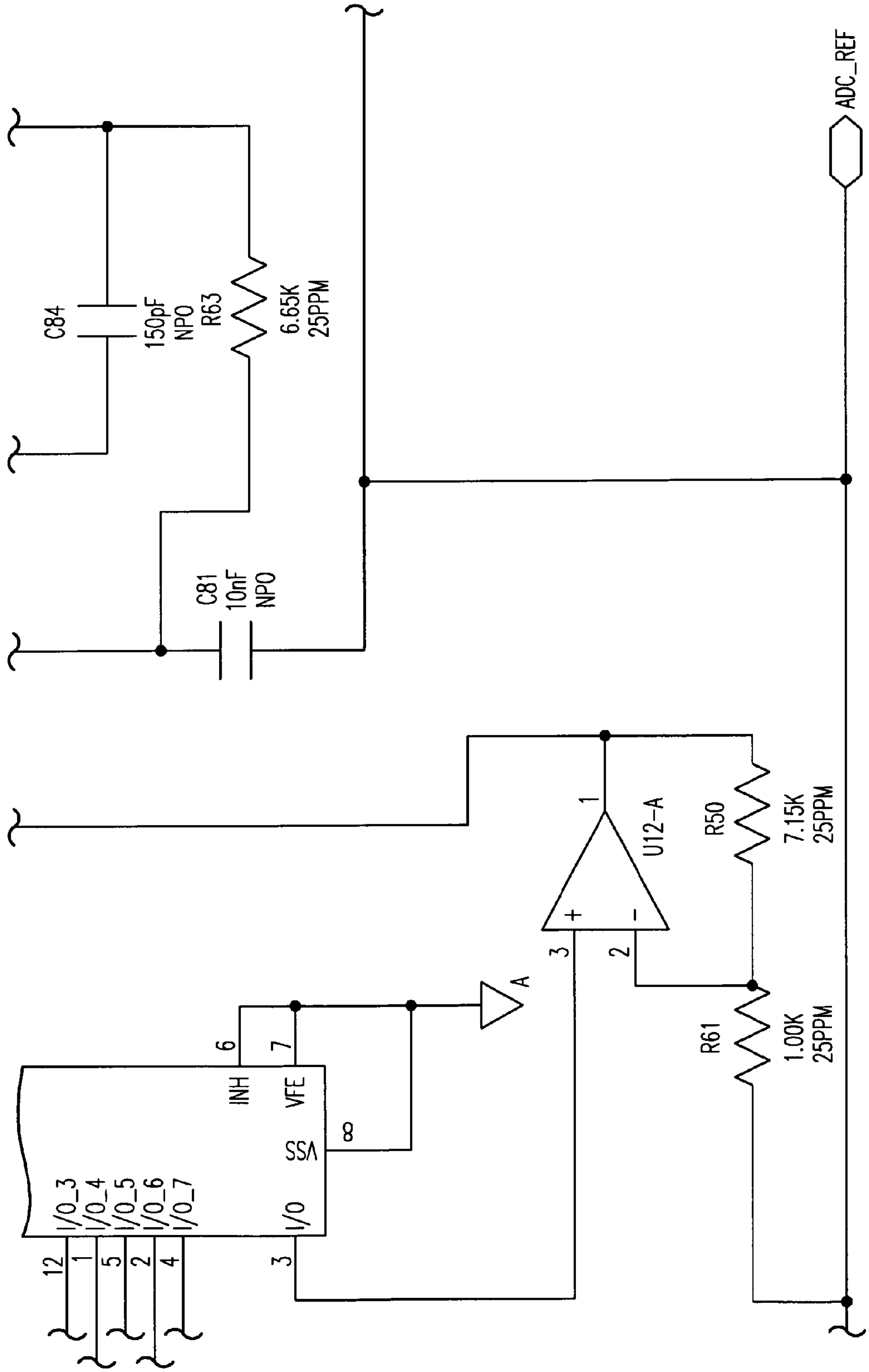
Figures 6, 31J:
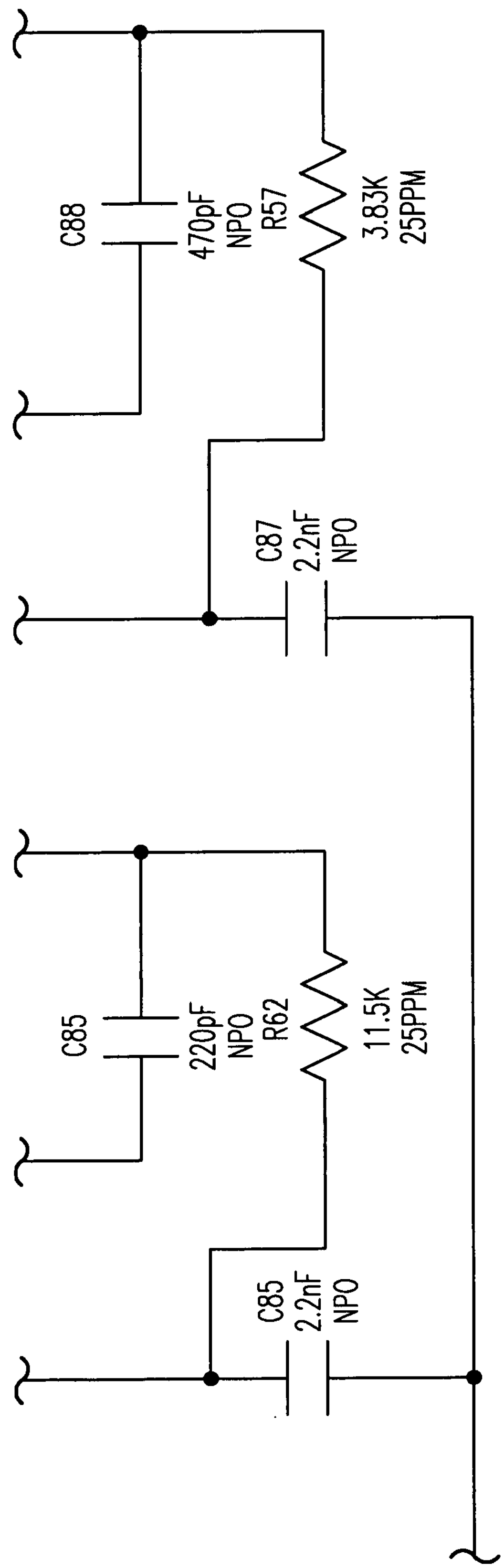
Figure 31K:
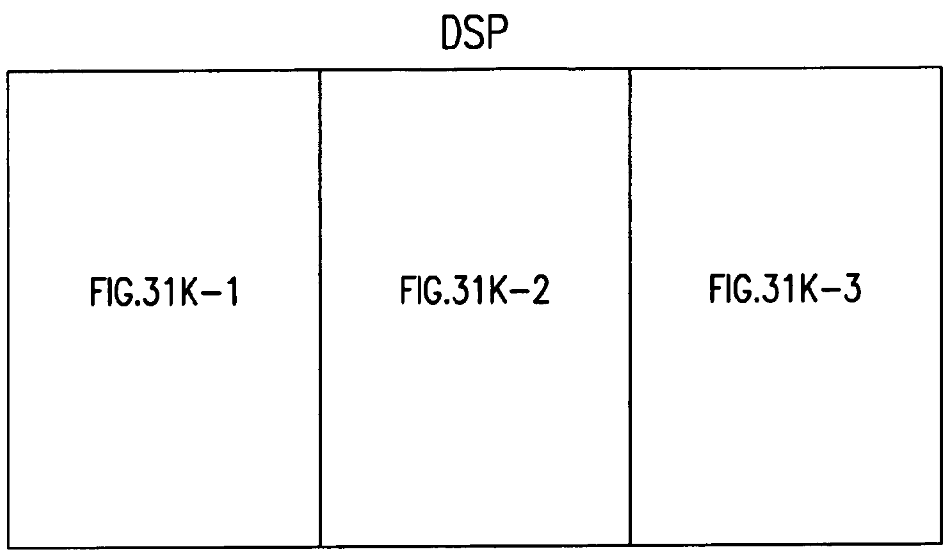
Figure 31K:
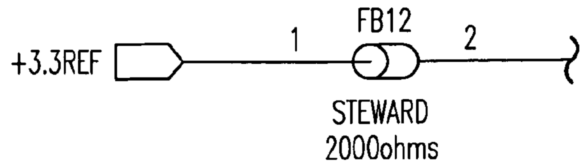
Figure 1:
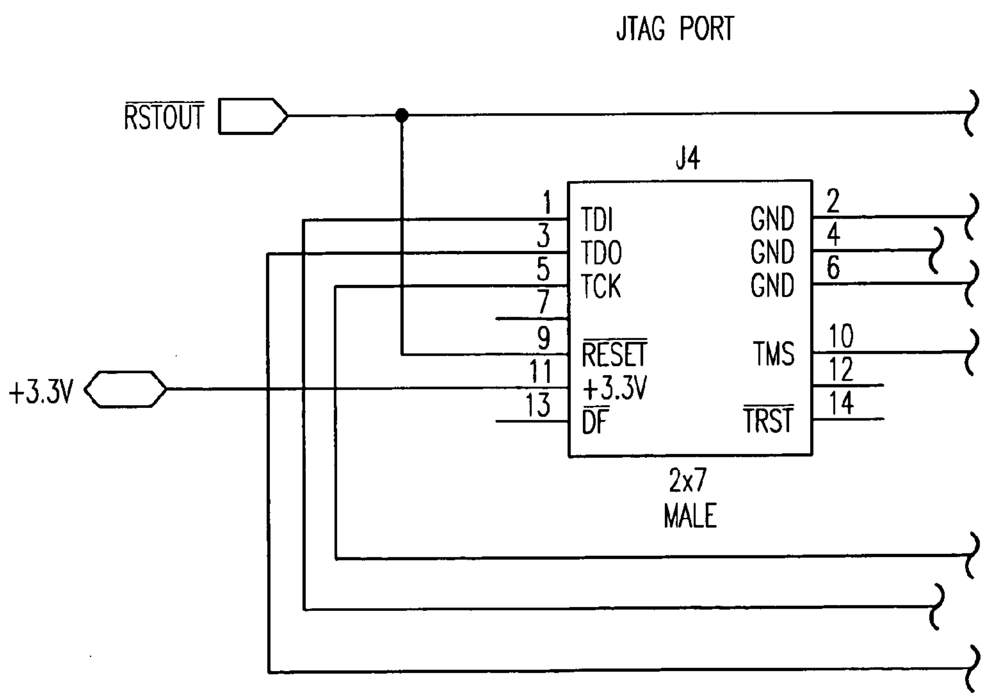
Figures 2, 31K:
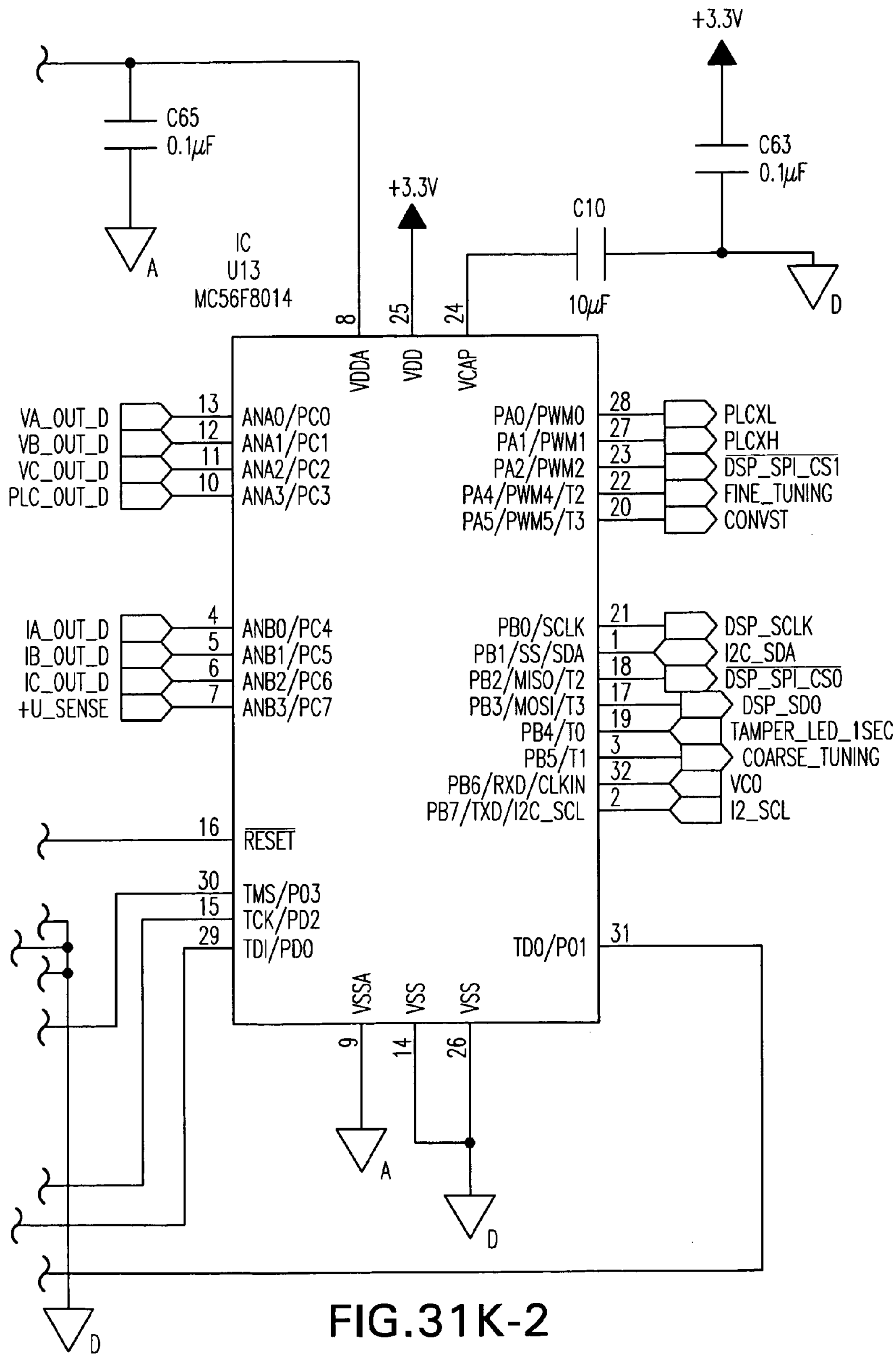
Figures 3, 31K:
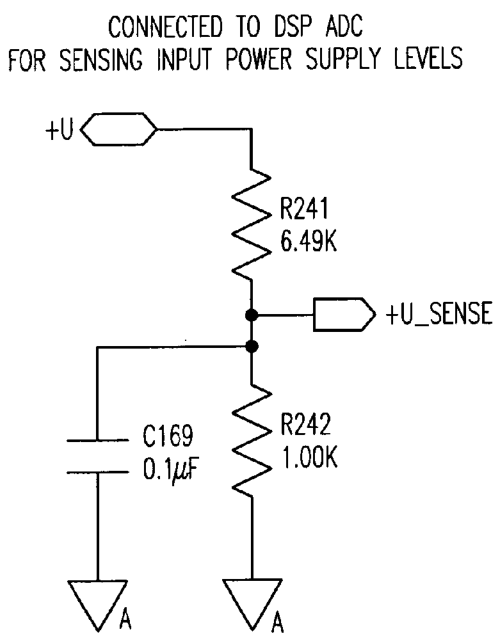
Figure 31L:
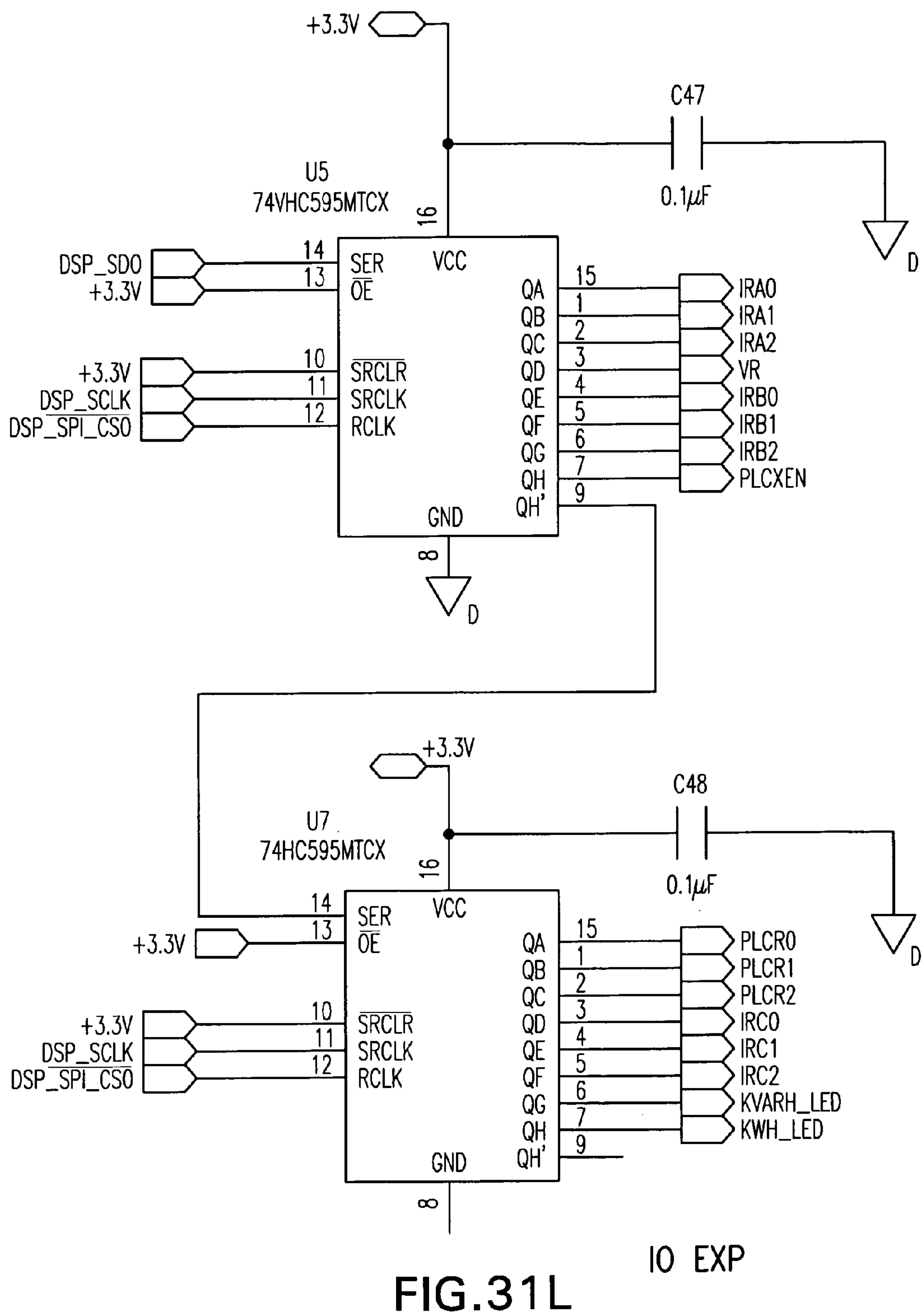
Figure 31M:
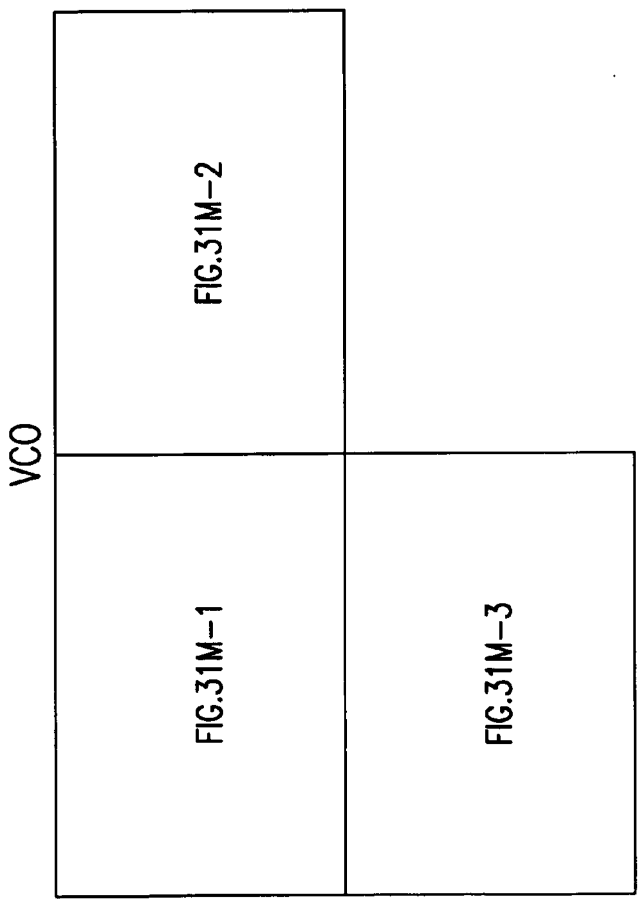
Figures 1, 31M:
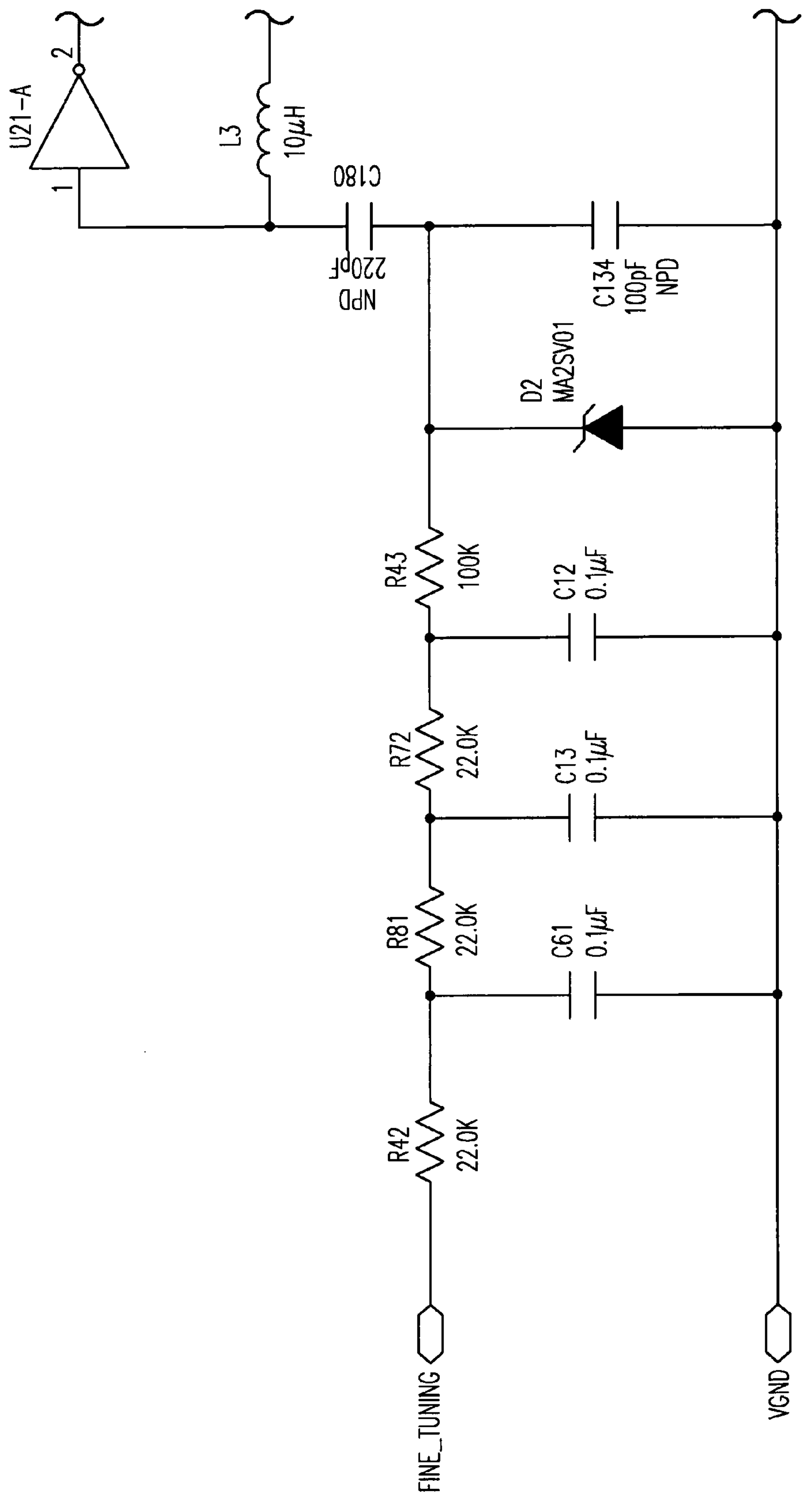
Figures 2, 31M:
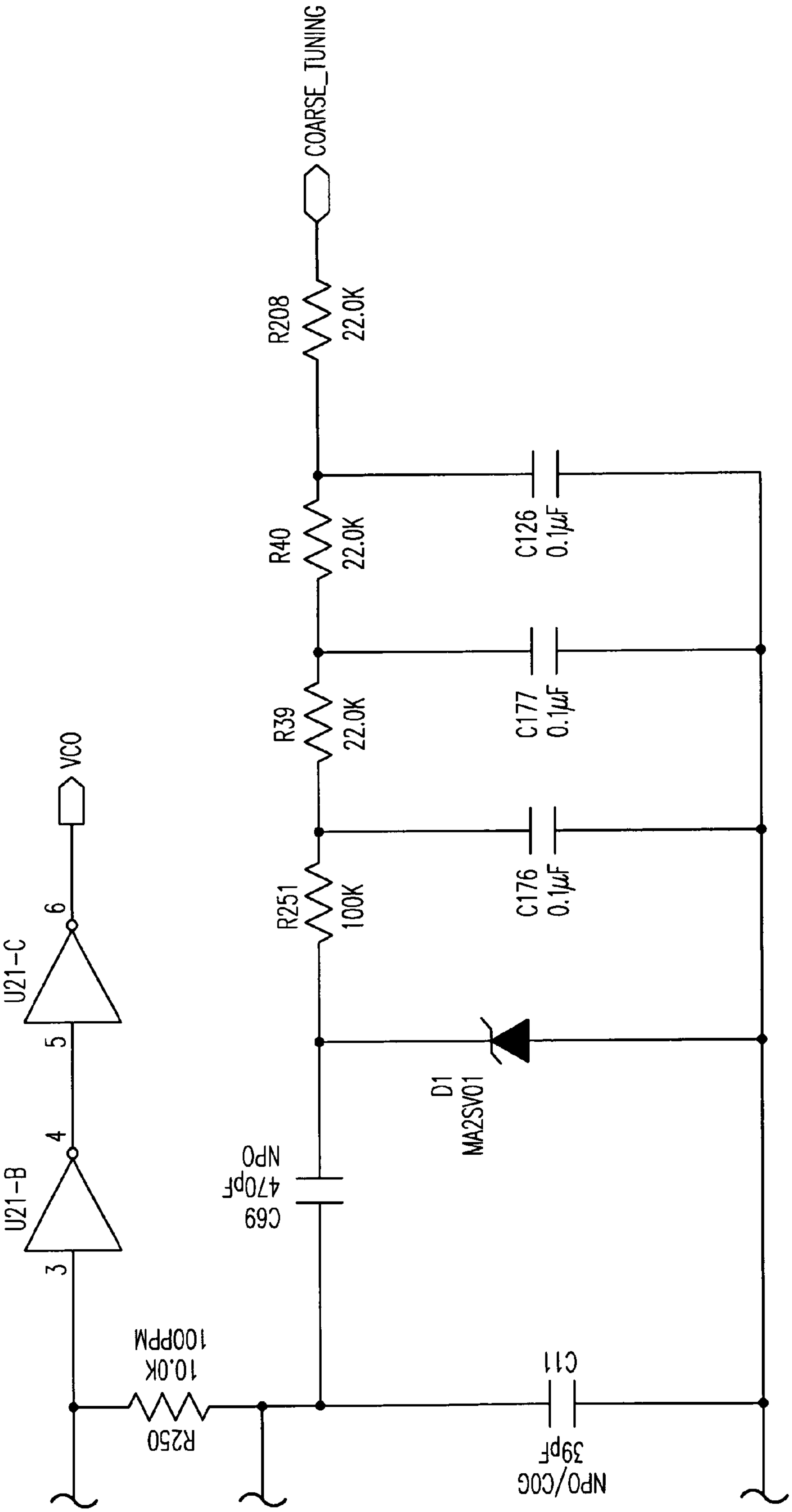
Figures 3, 31M:
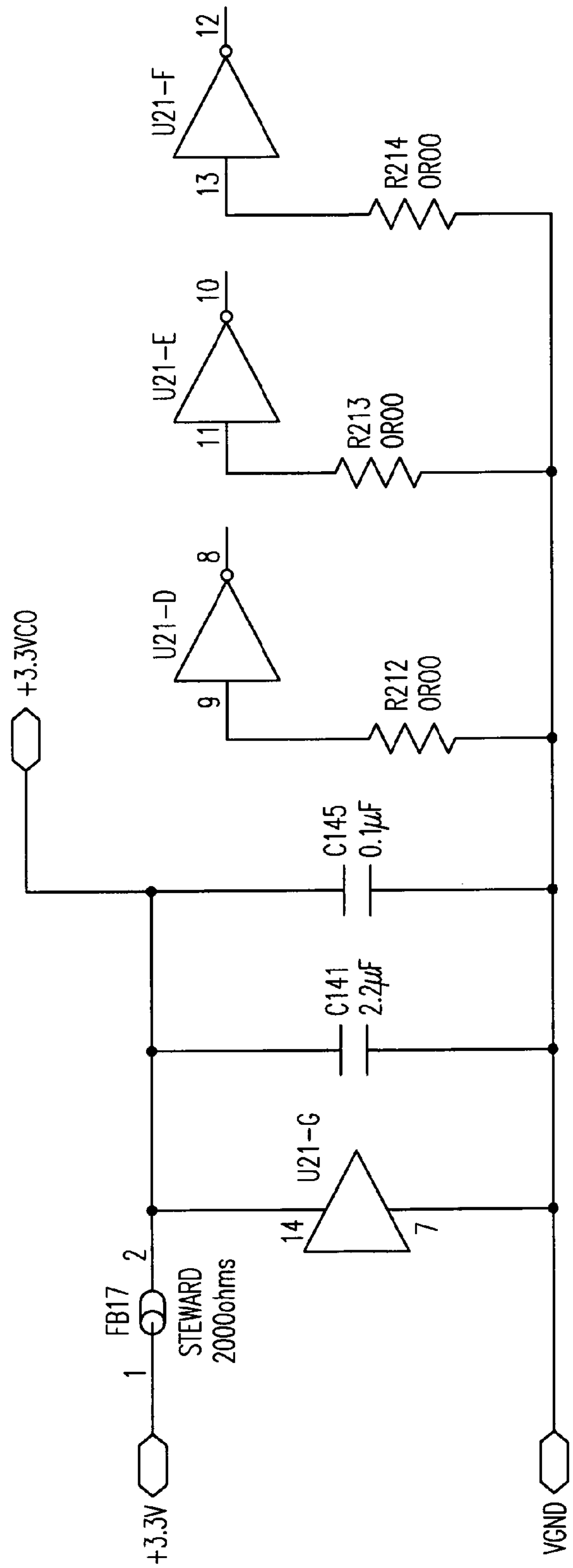
Figure 31N:
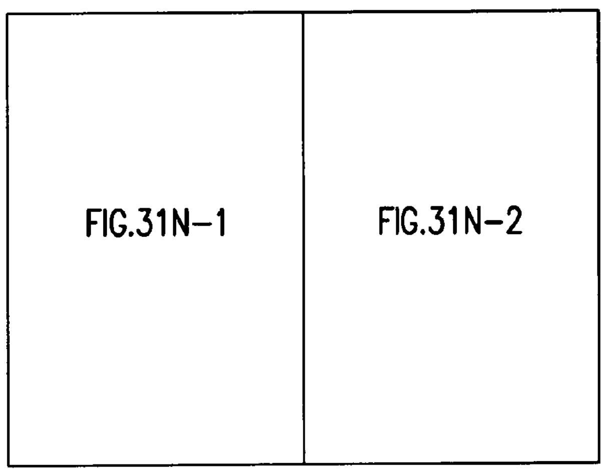
Figures 1, 31N:
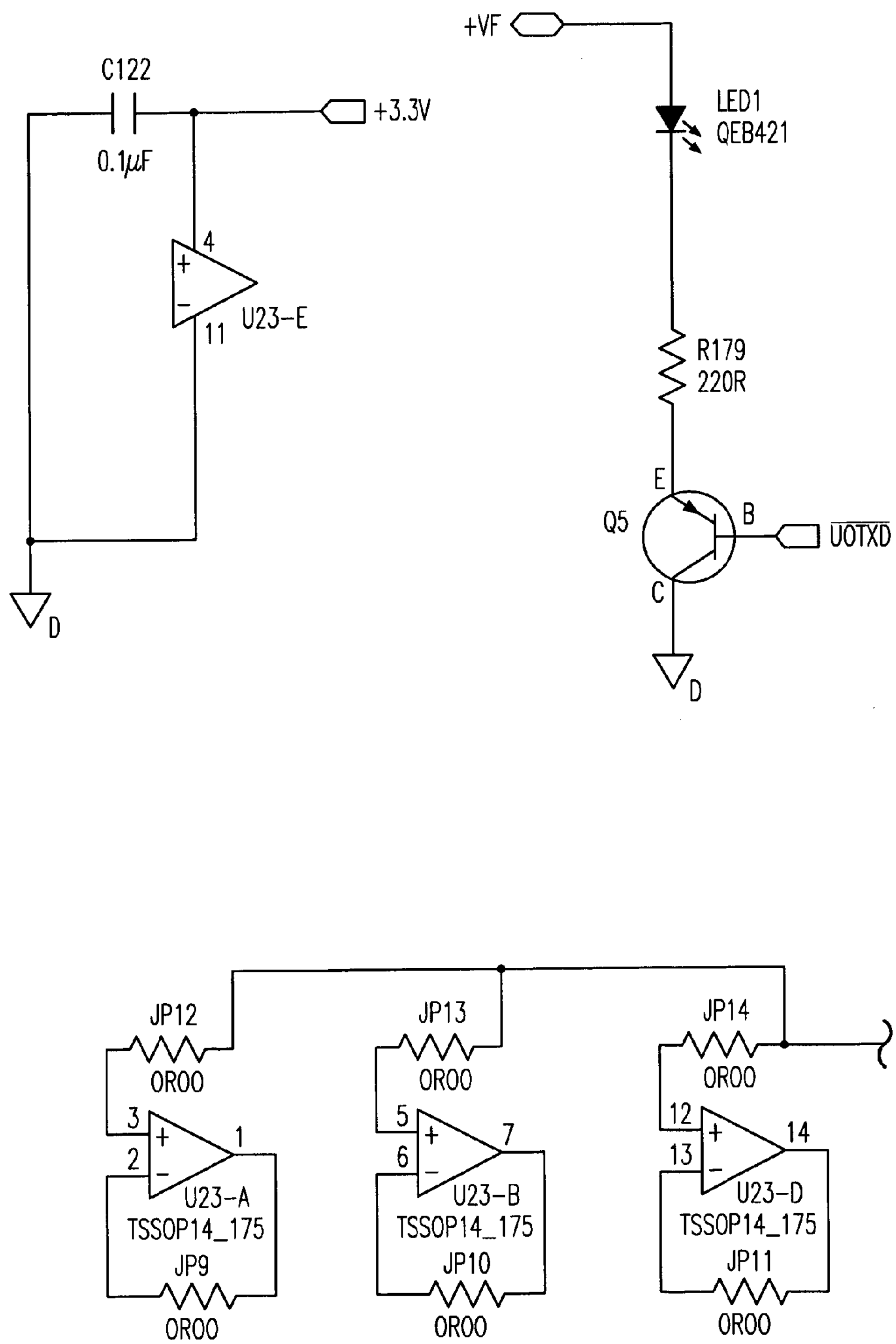
Figures 2, 31N:
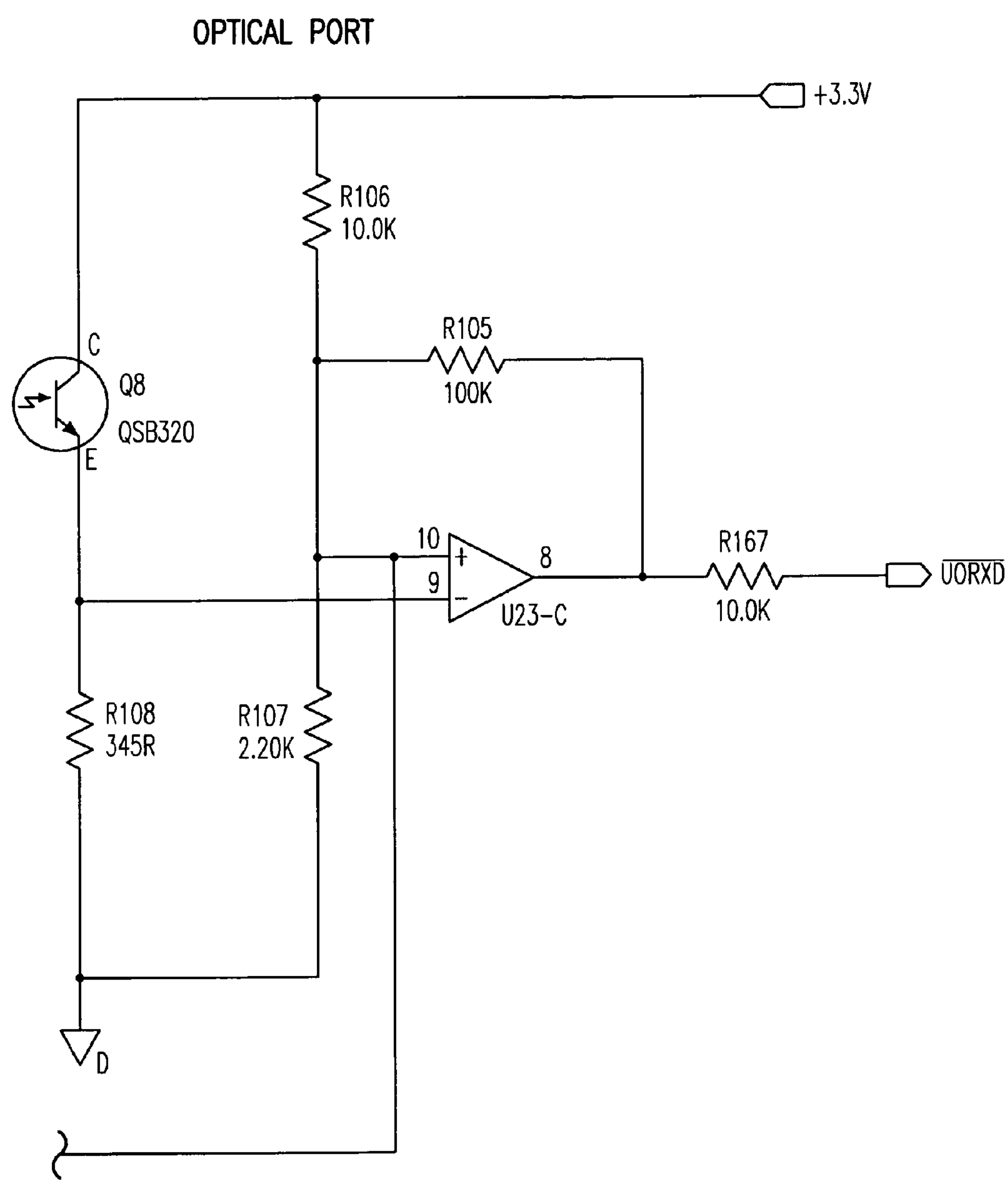
Figure 31O:
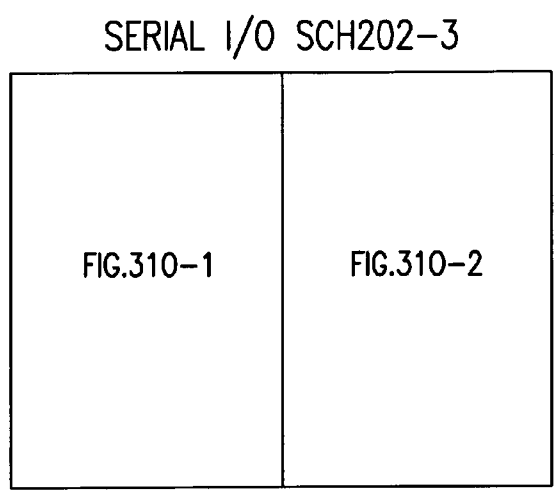
Figure 31O:
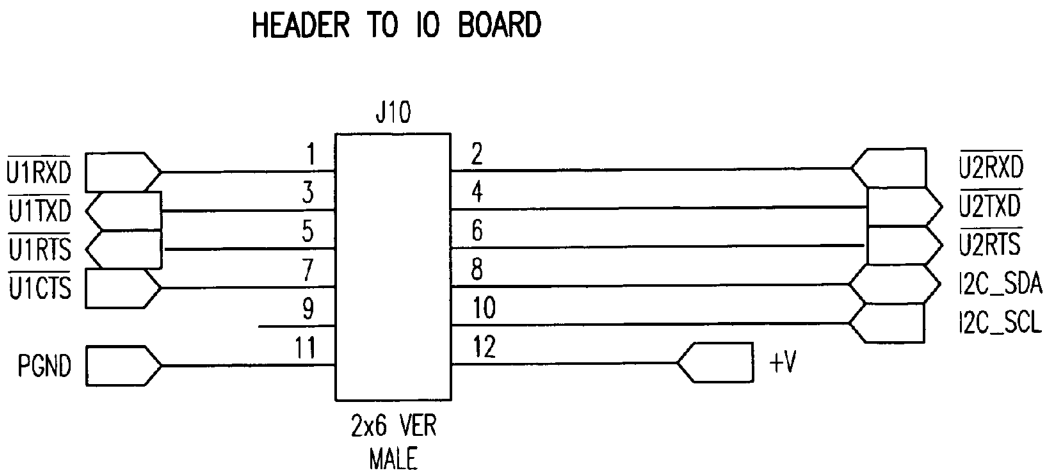
Figure 1:
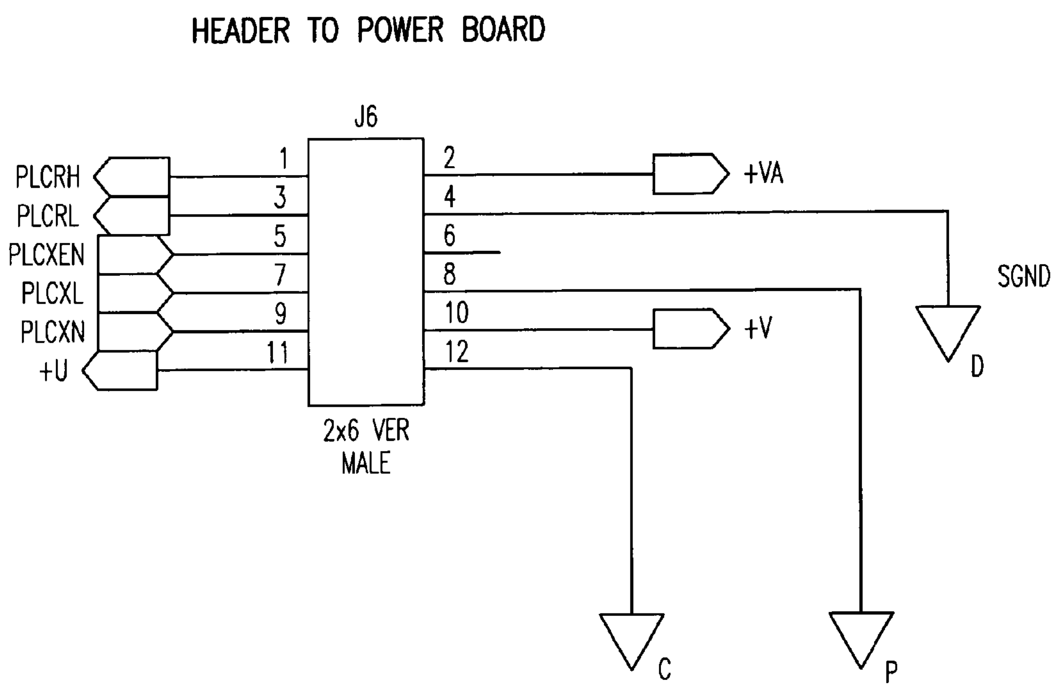
Figure 31O:
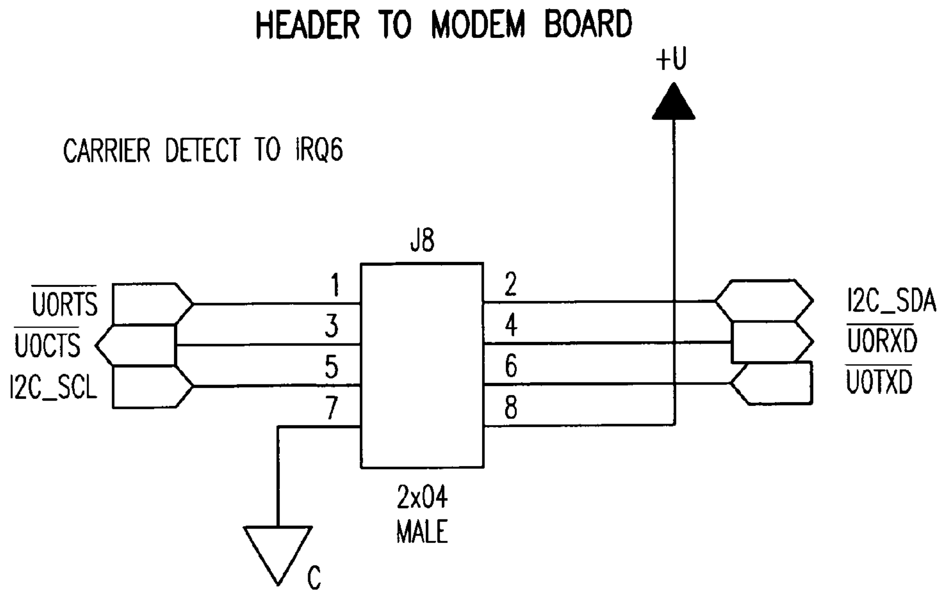
Figure 2:
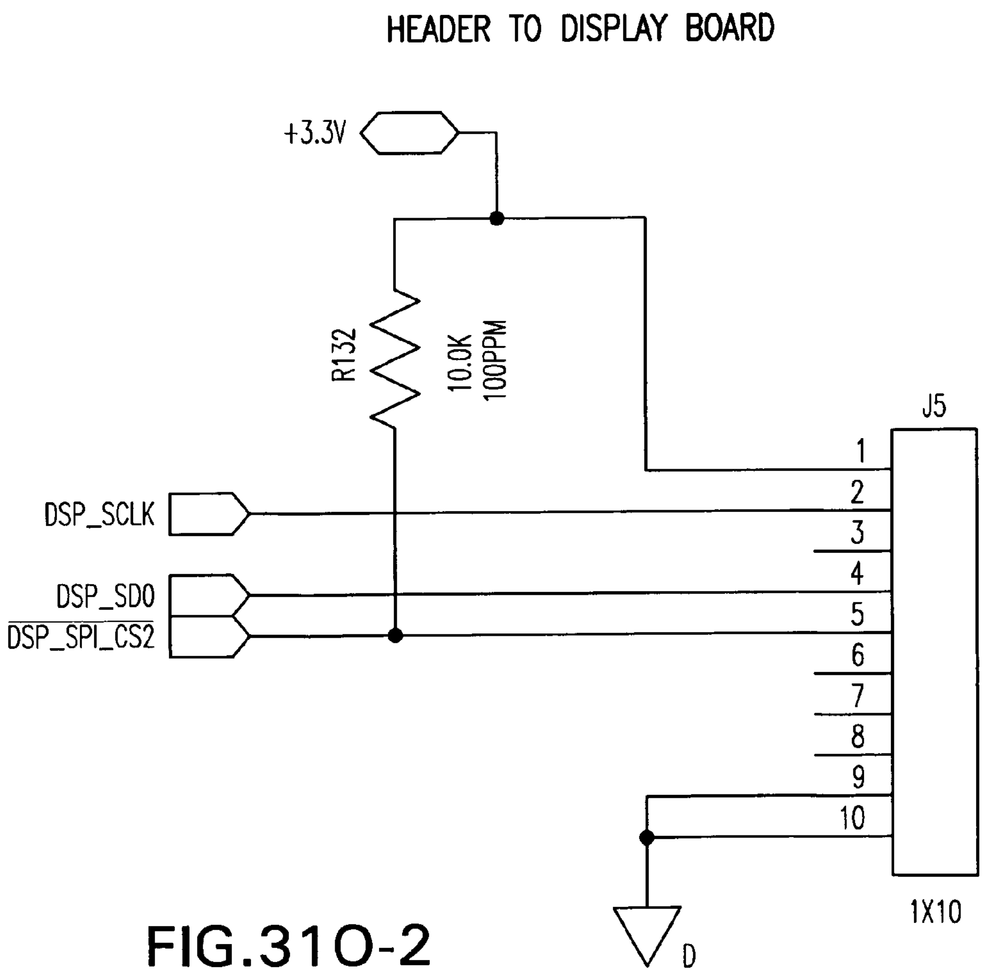
Figure 31P:
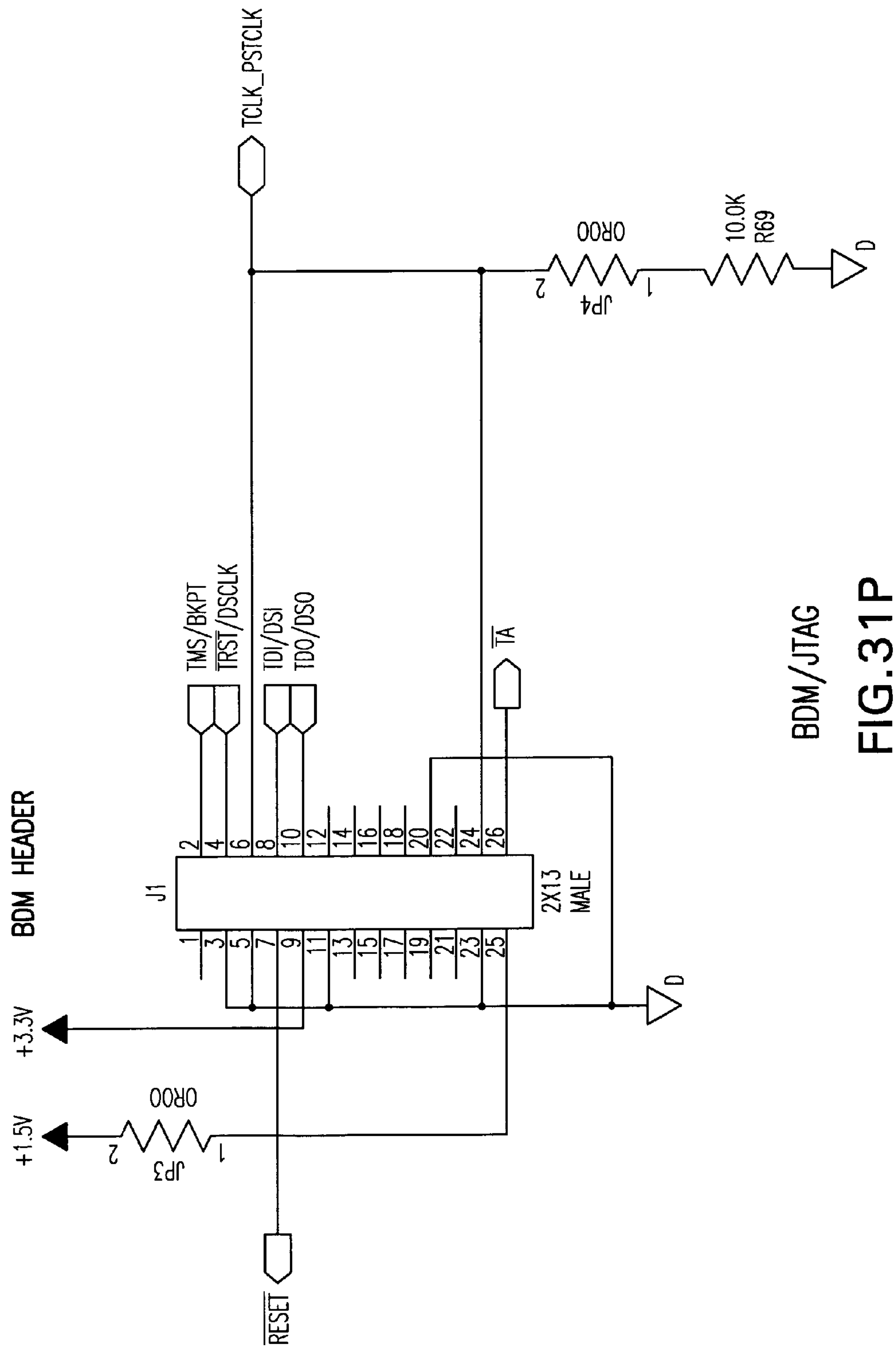
Figure 31Q:
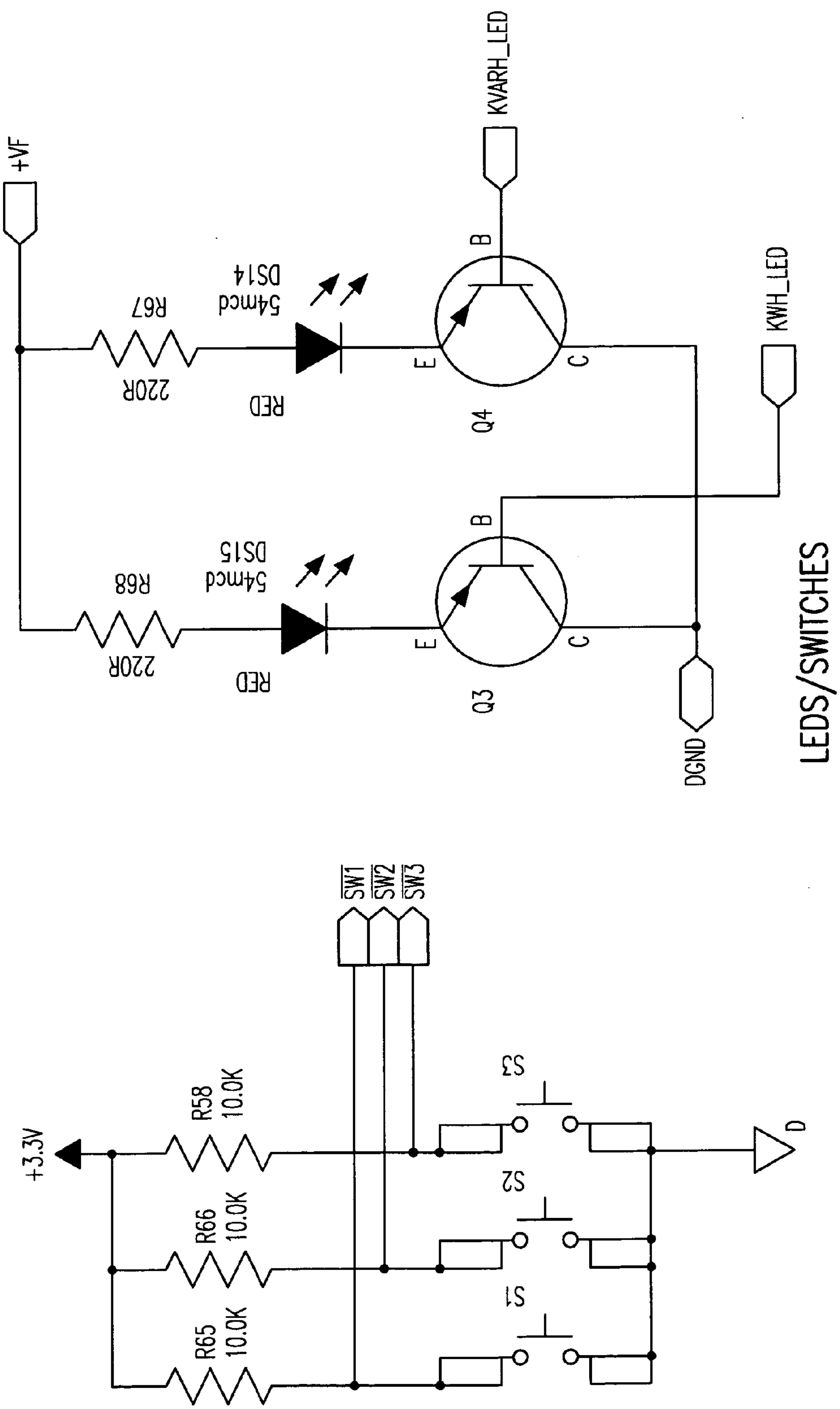
Figures 1, 31R:
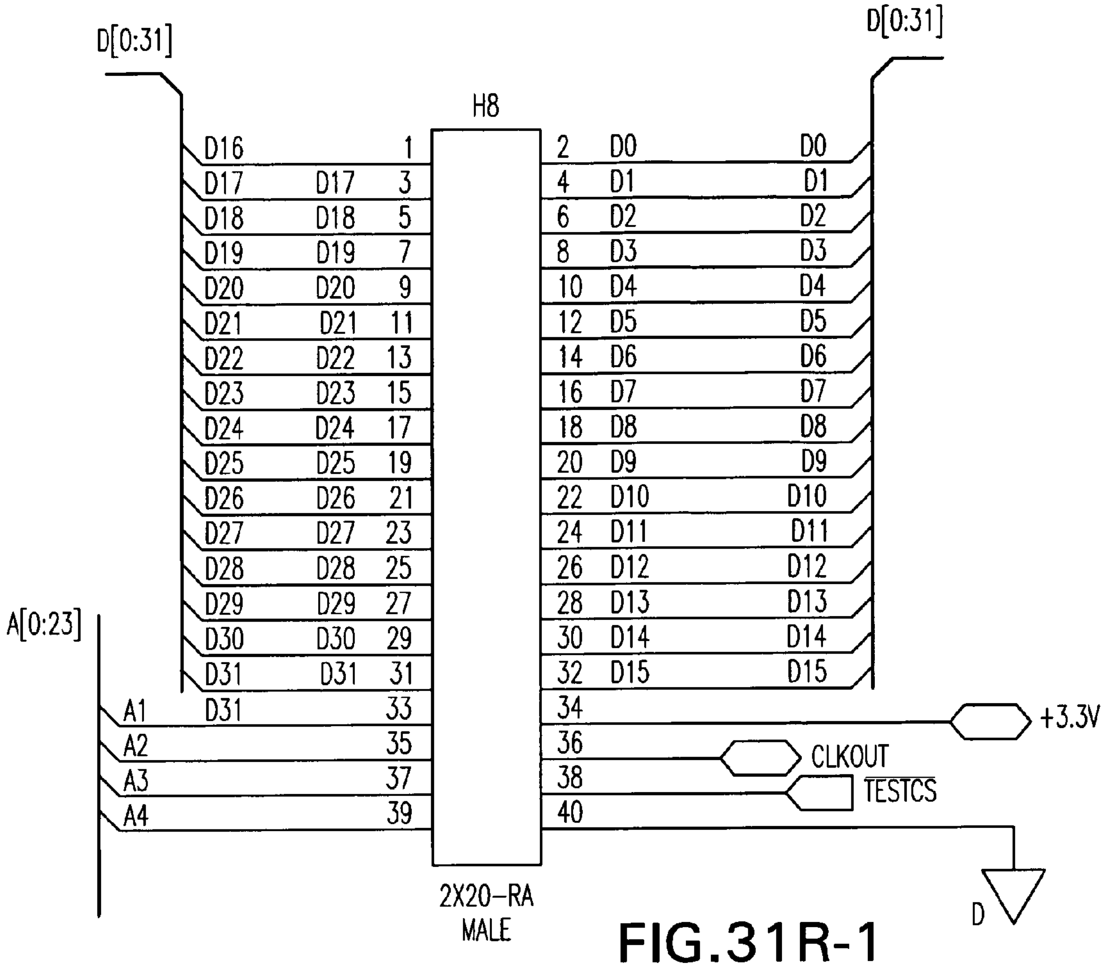
Figures 2, 31R:
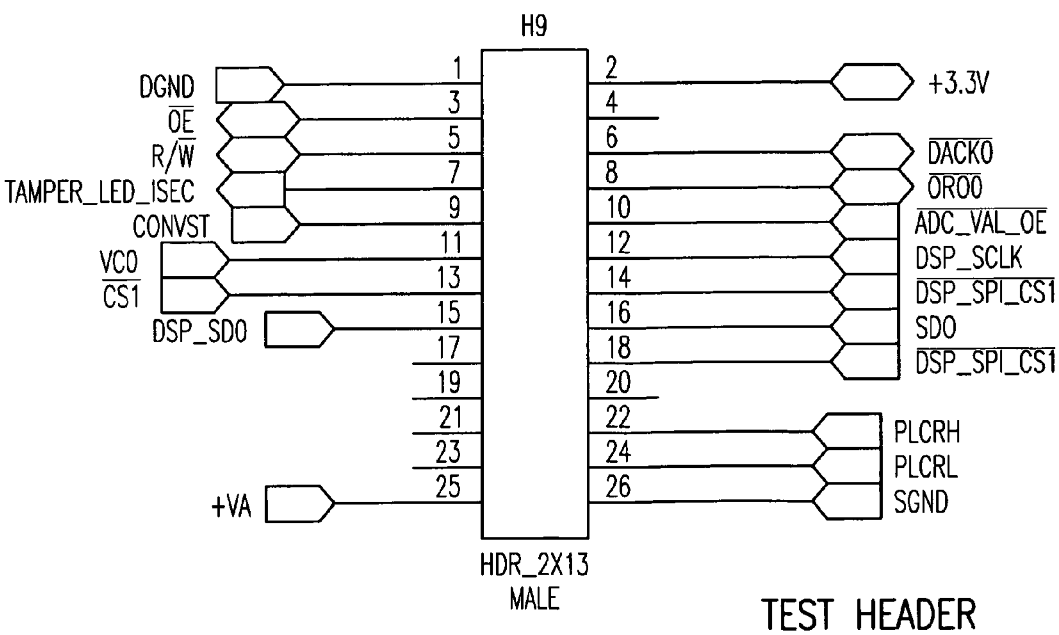

FIG. 25 shows a preferred Energy Guard layout for this embodiment. Each customer line has a corresponding Metering Module (PCB 203 and PCB 204, discussed below) (schematics shown in FIGS. 26 and 27).

A Back Place Board 2510 shown in FIG. 25 (PCB 234; see FIG. 28 for construction diagram and schematic) is the common bus that routes signals within the EG. There are two kinds of communication options on the Back Place Board 2510 to enable data transfer from Control Module 2520 to individual Metering Modules PCB 203. This can be done either using the 2 wire I2C option or the 1 wire serial option.

The Control Module 2520 comprises a Power Board (PCB 210; see FIG. 29 for schematic) is the power supply board that also has the PLC transmit and receive circuitry on it. The Power Board provides power to the CPU board and the electronics of 203 boards. The Control Module 2520 also comprises an I/O Extension Board (PCB 230; see FIG. 30 for schematic) is a board with several I/O extension options that enable communication from Metering Modules to the CPU board.

Control Module 2520 also comprises a CPU Board (PCB 202; see FIG. 31 for schematic), which has a Digital Signal Processing (DSP) processor on board.

Figure 32:
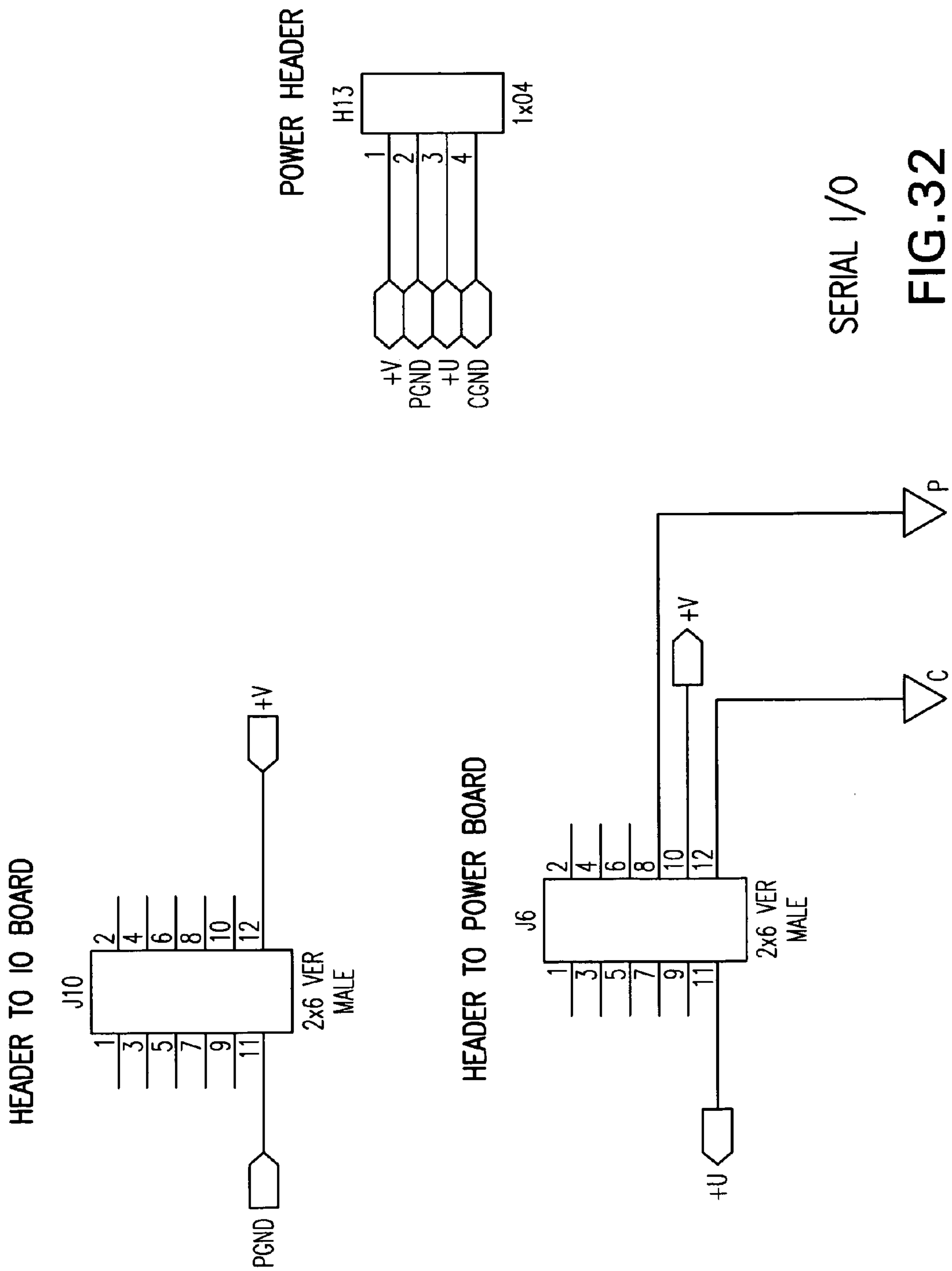
FIG. 32 has preferred schematics for a control module.
Figures 1, 33A:
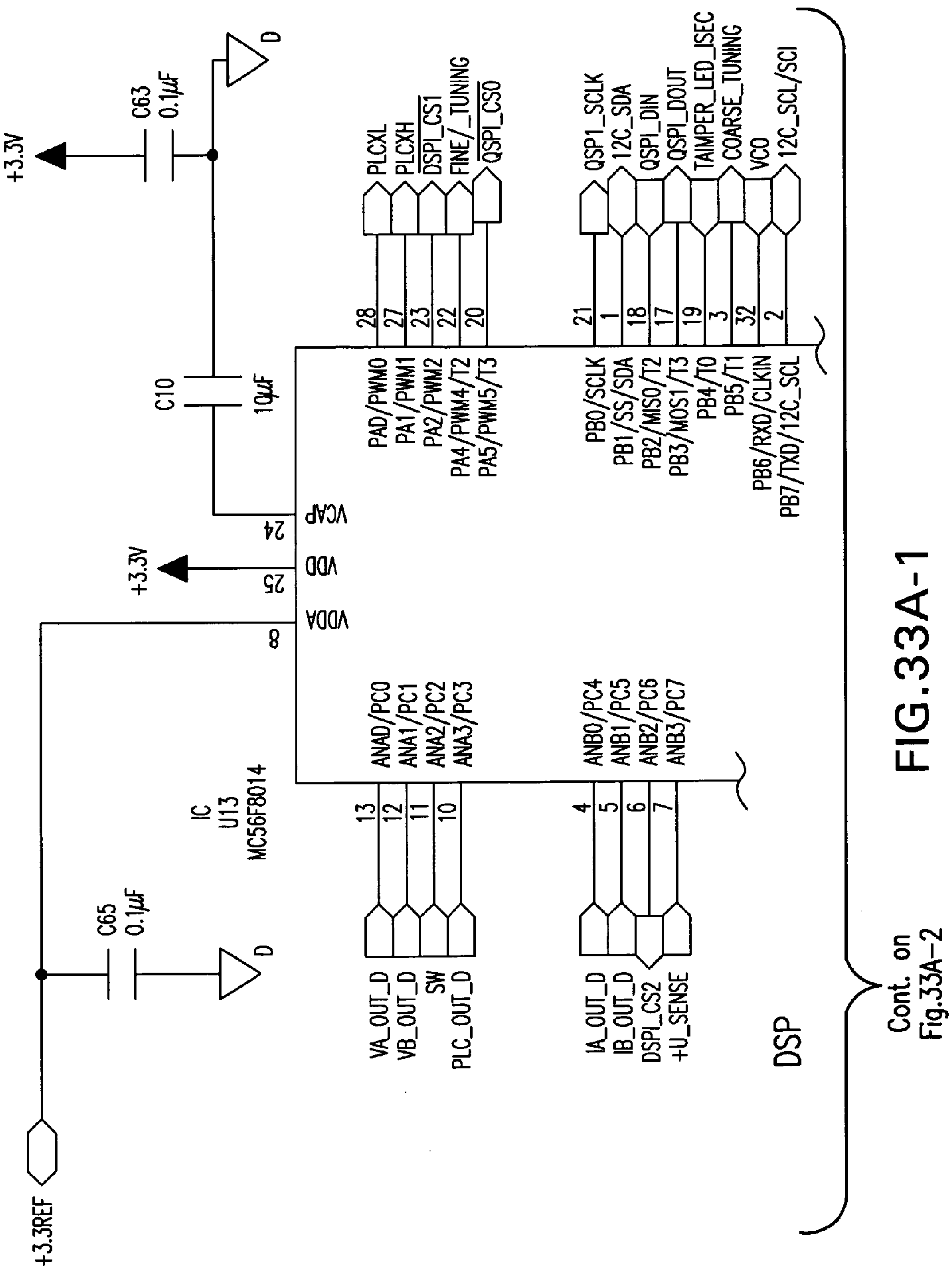
FIGS. 33A-N illustrate preferred schematics for metering and power supply circuitry for a customer display module.
Figures 2, 33A:
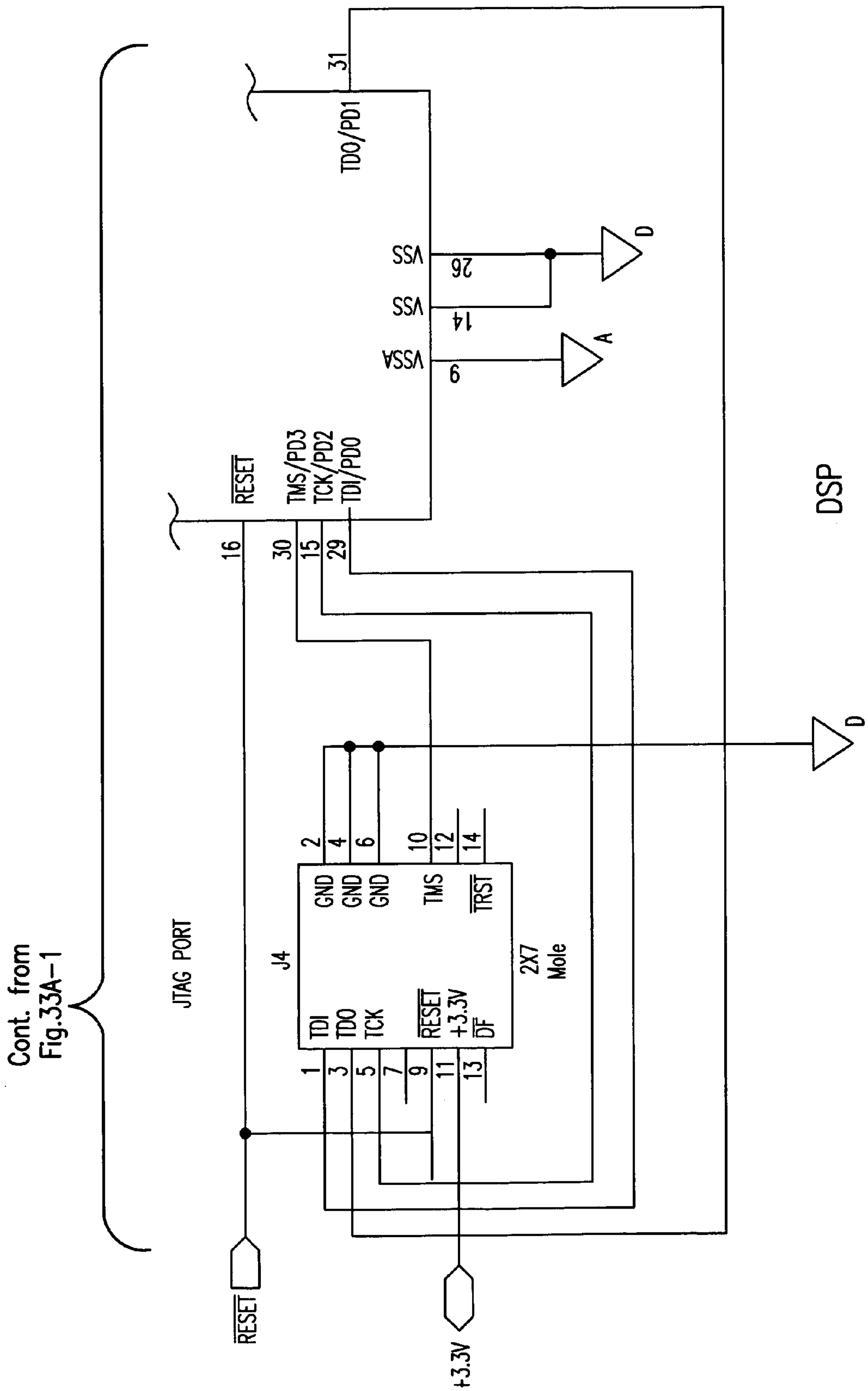
Figures 3, 33A:
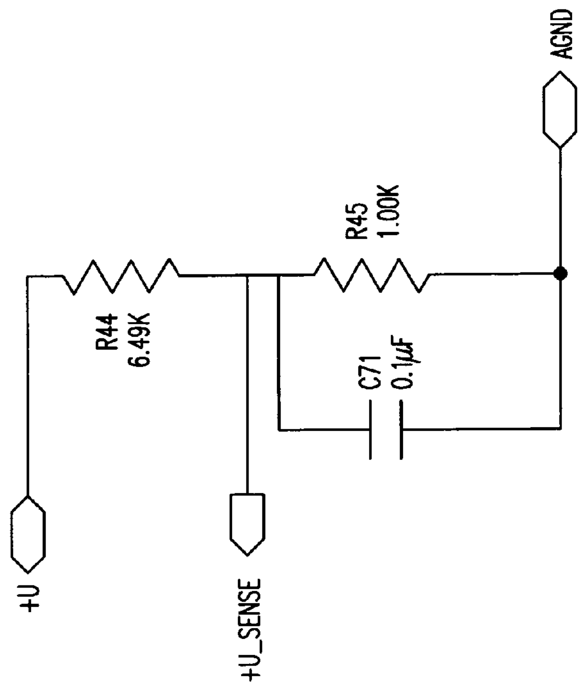
Figure 33B:
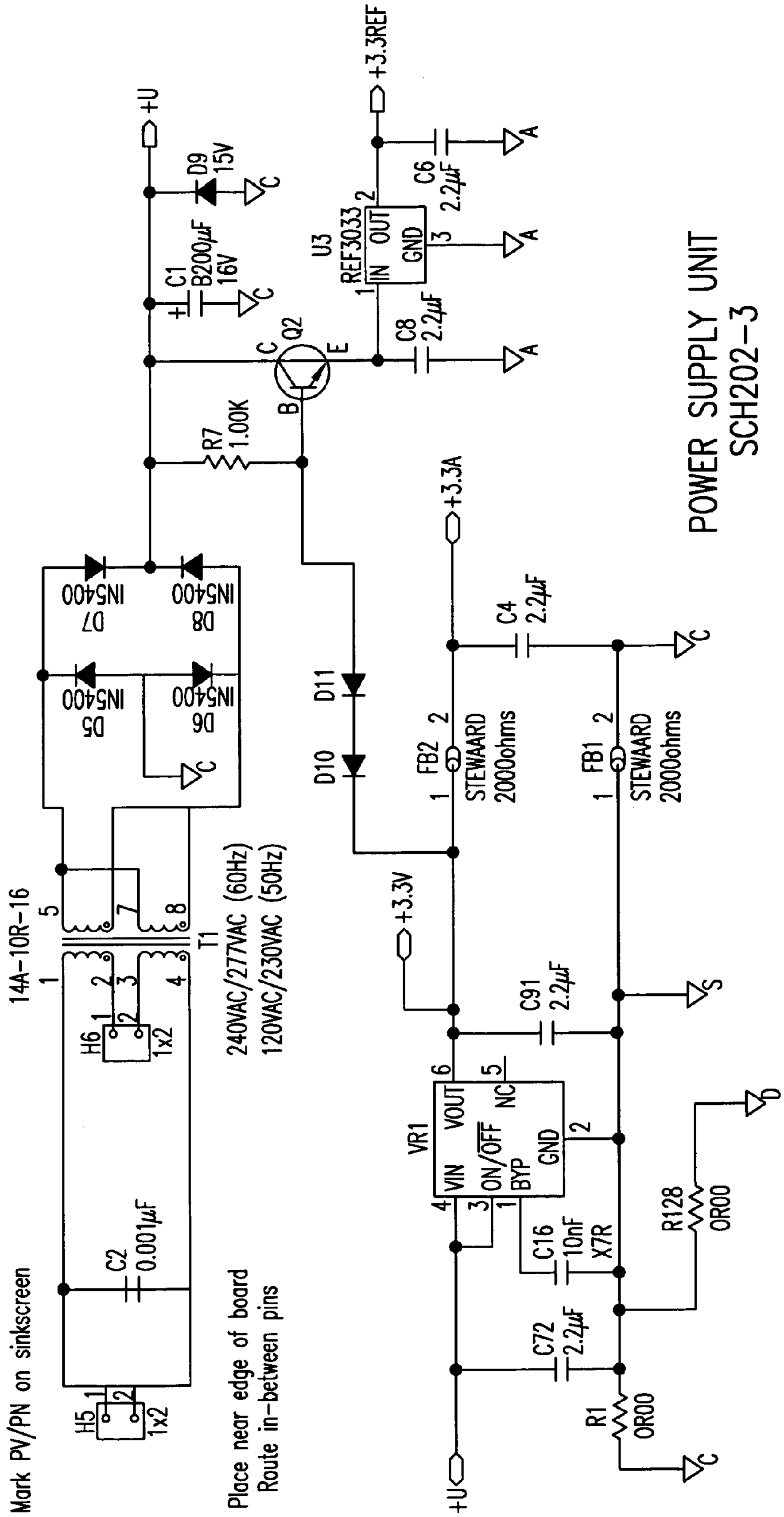
Figure 33C:
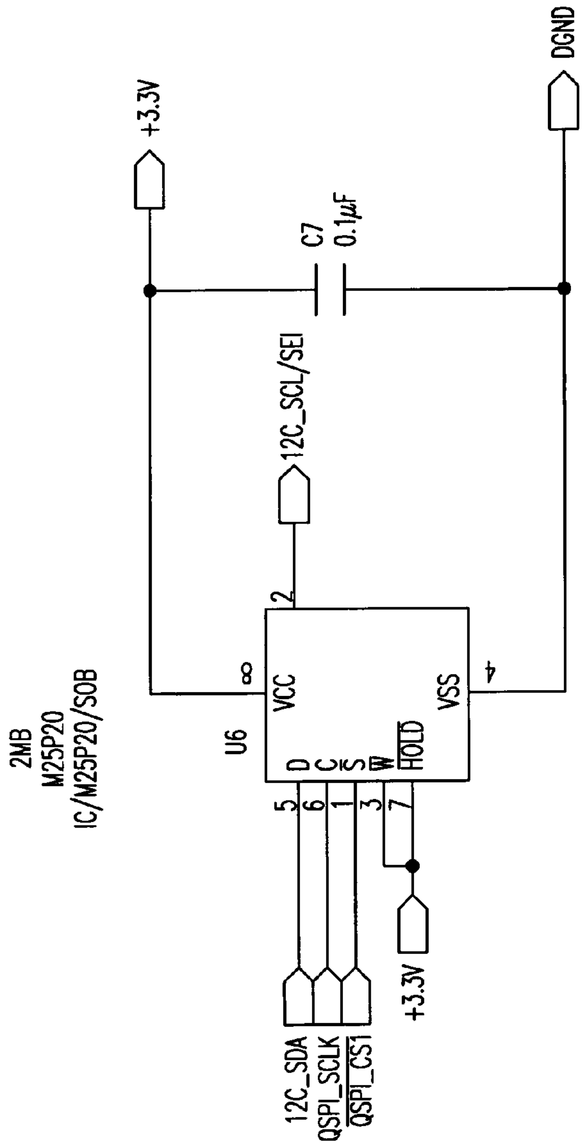
Figure 33D:
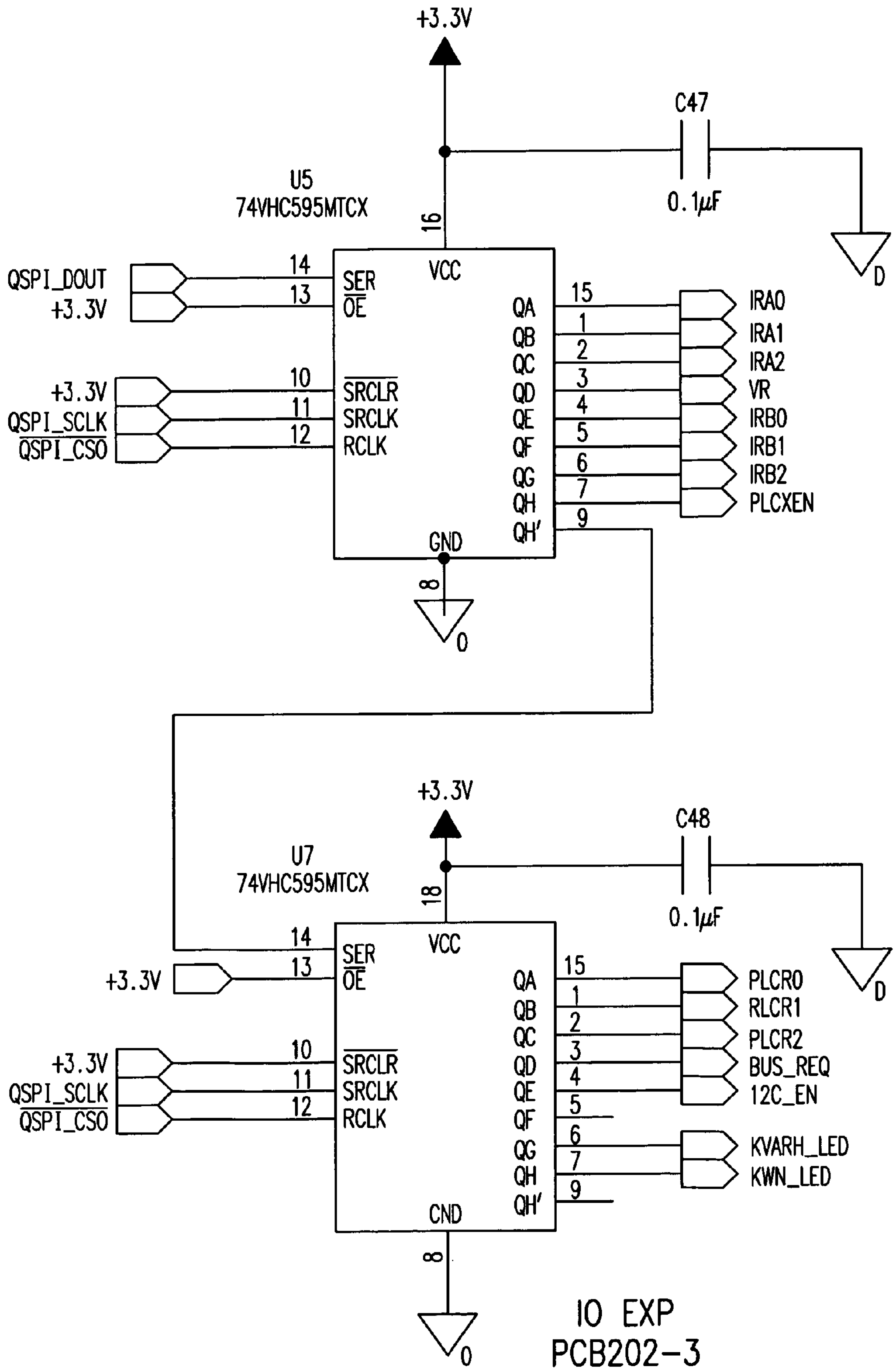
Figures 1, 33E:
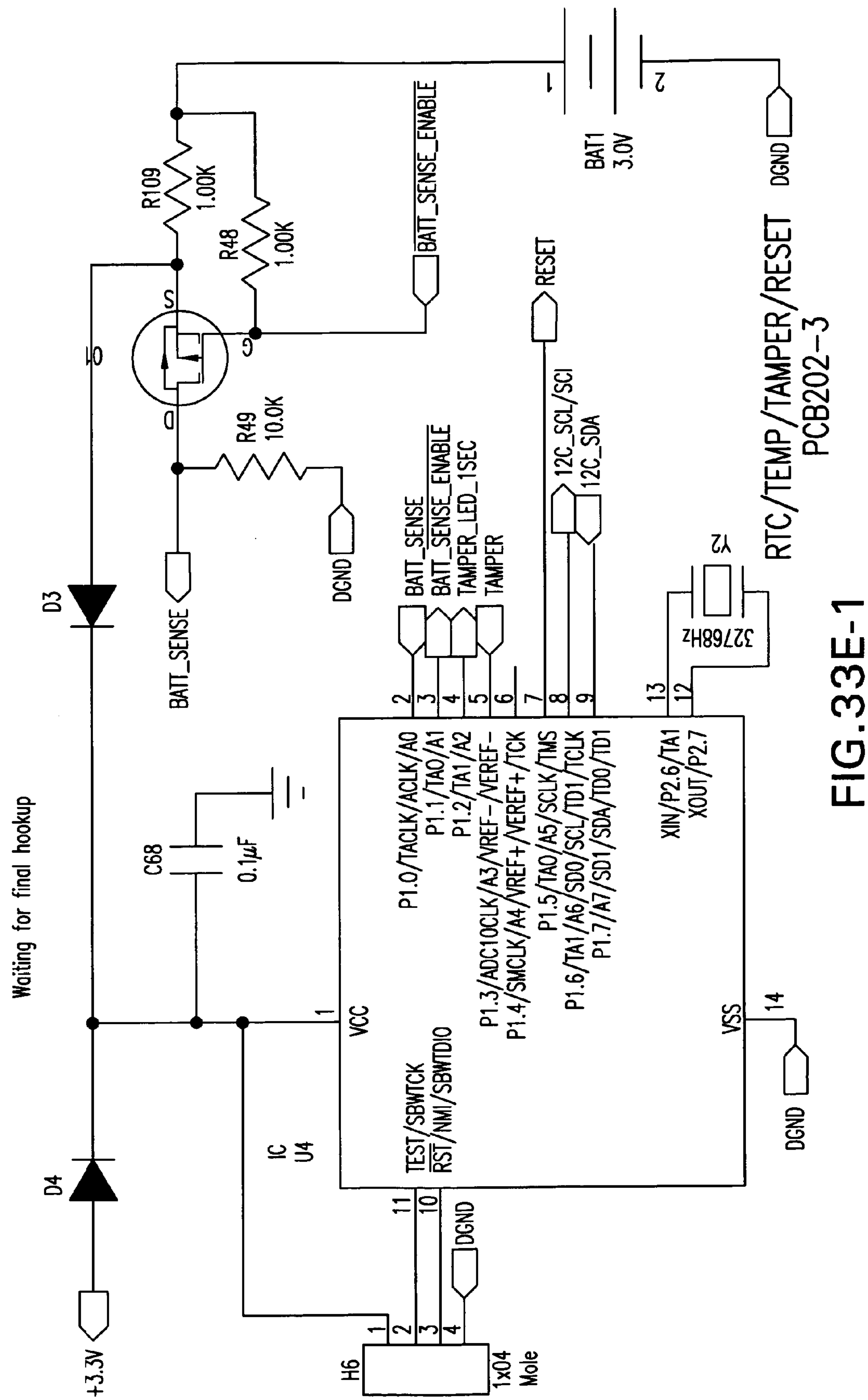
Figures 2, 33E:
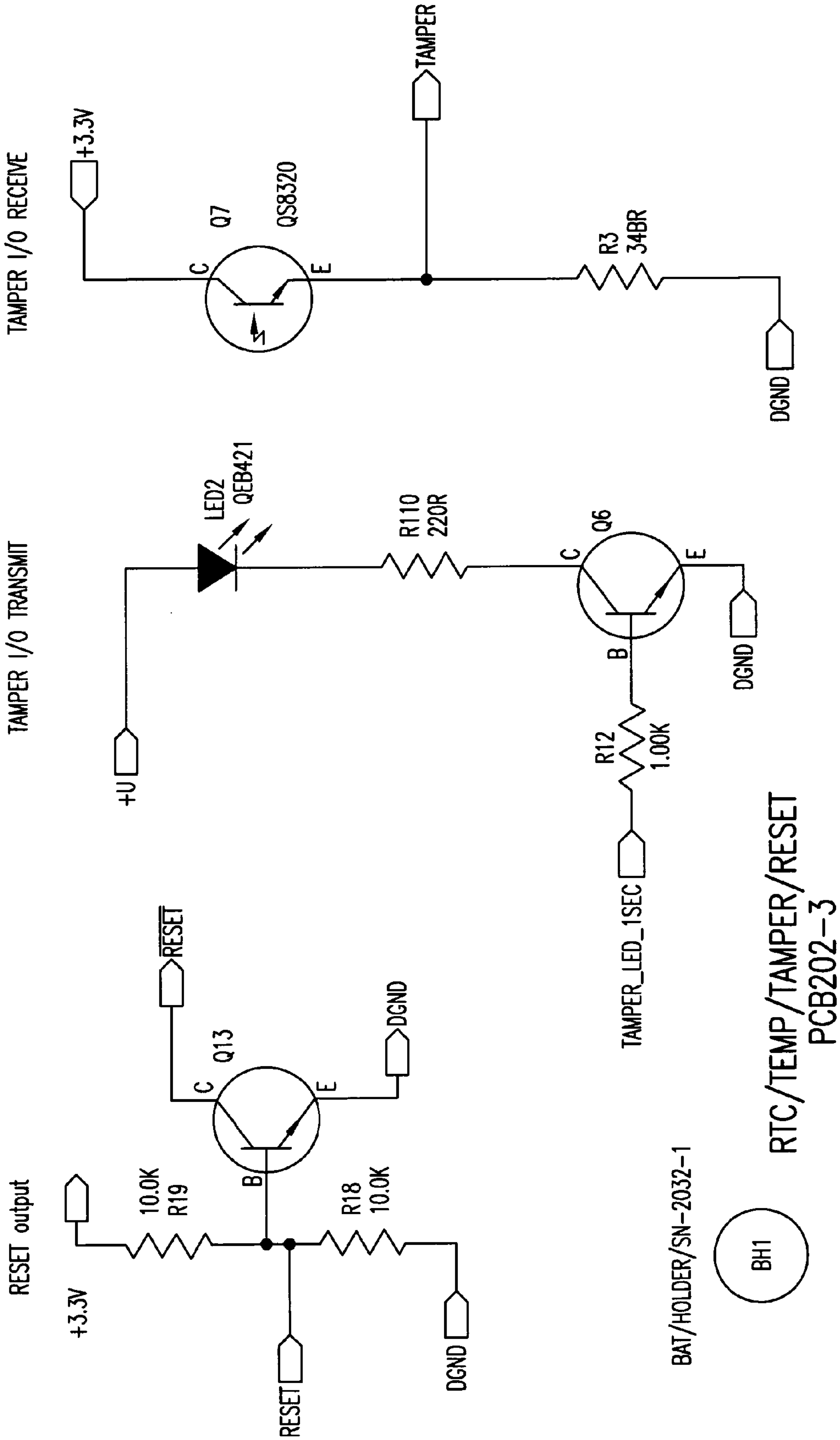
Figures 1, 33F:
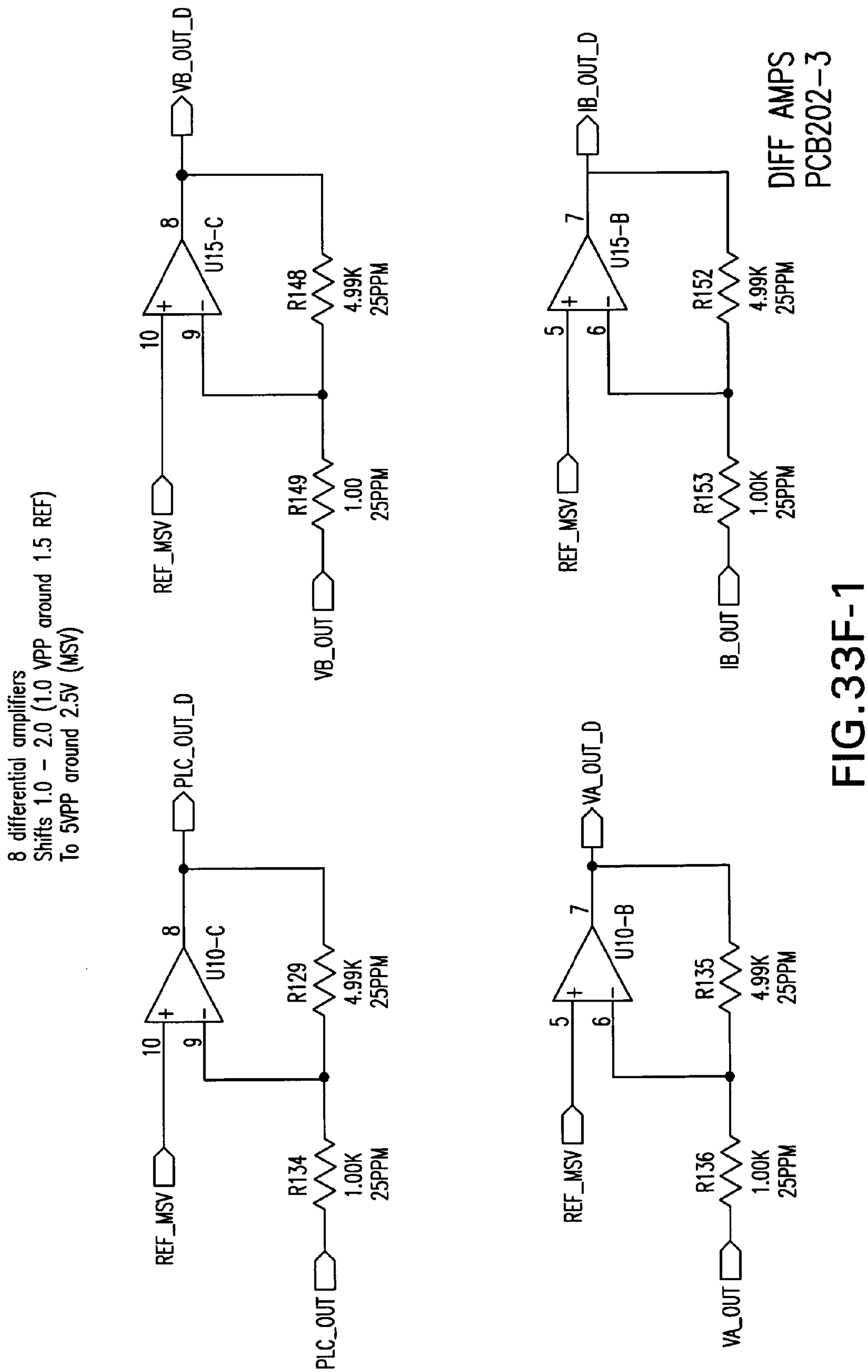
Figures 2, 33F:
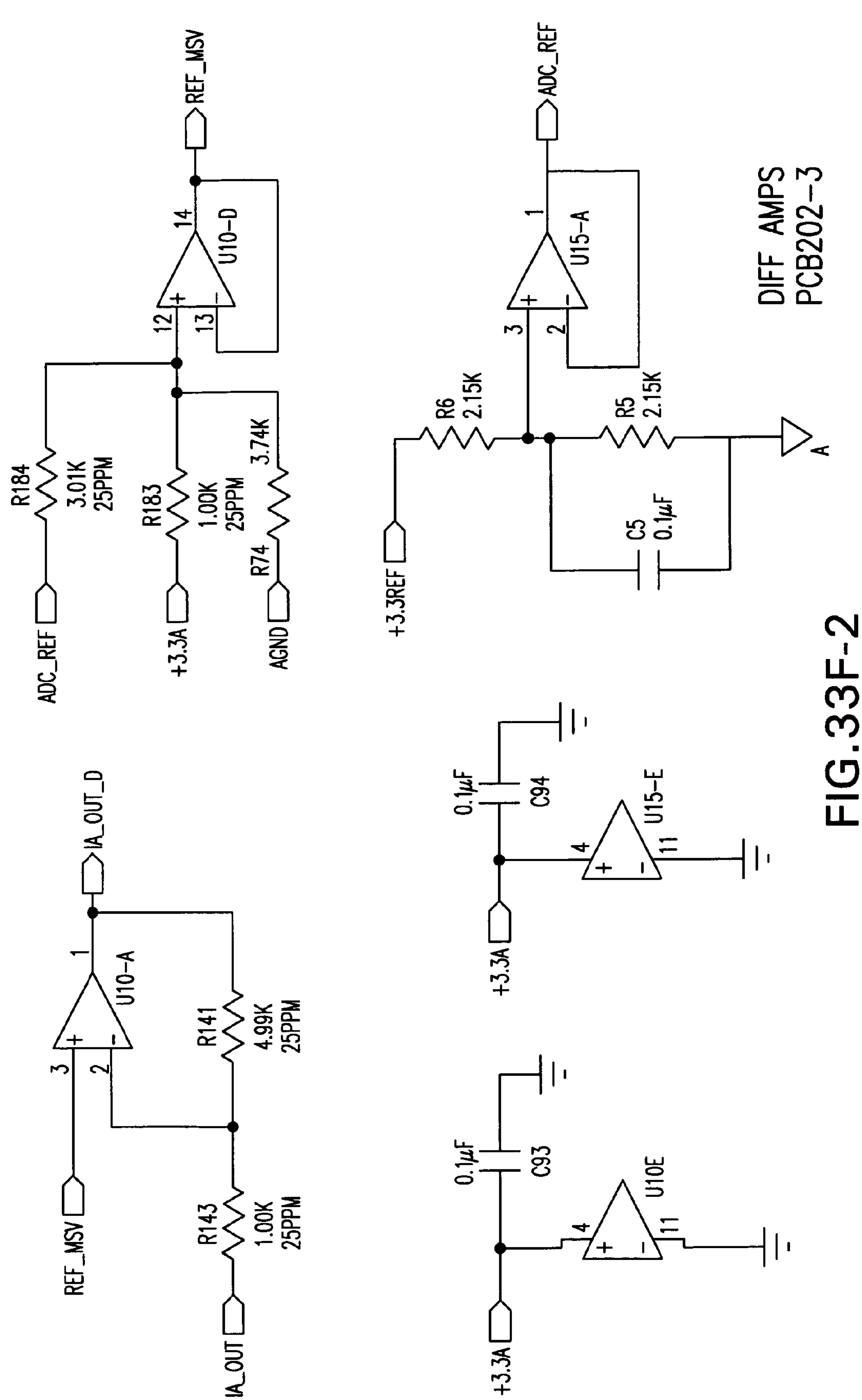
Figures 1, 33G:
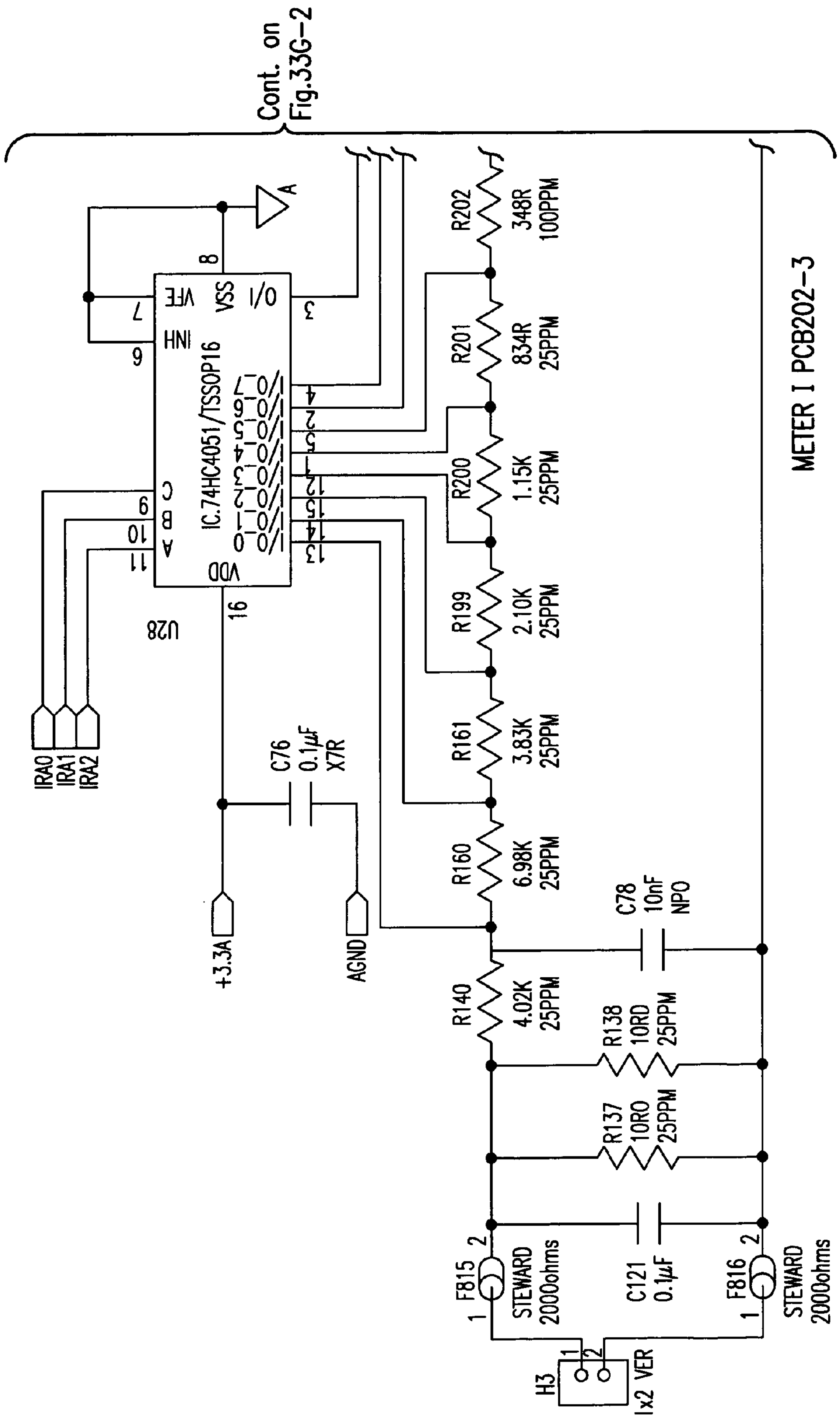
Figures 2, 33G:
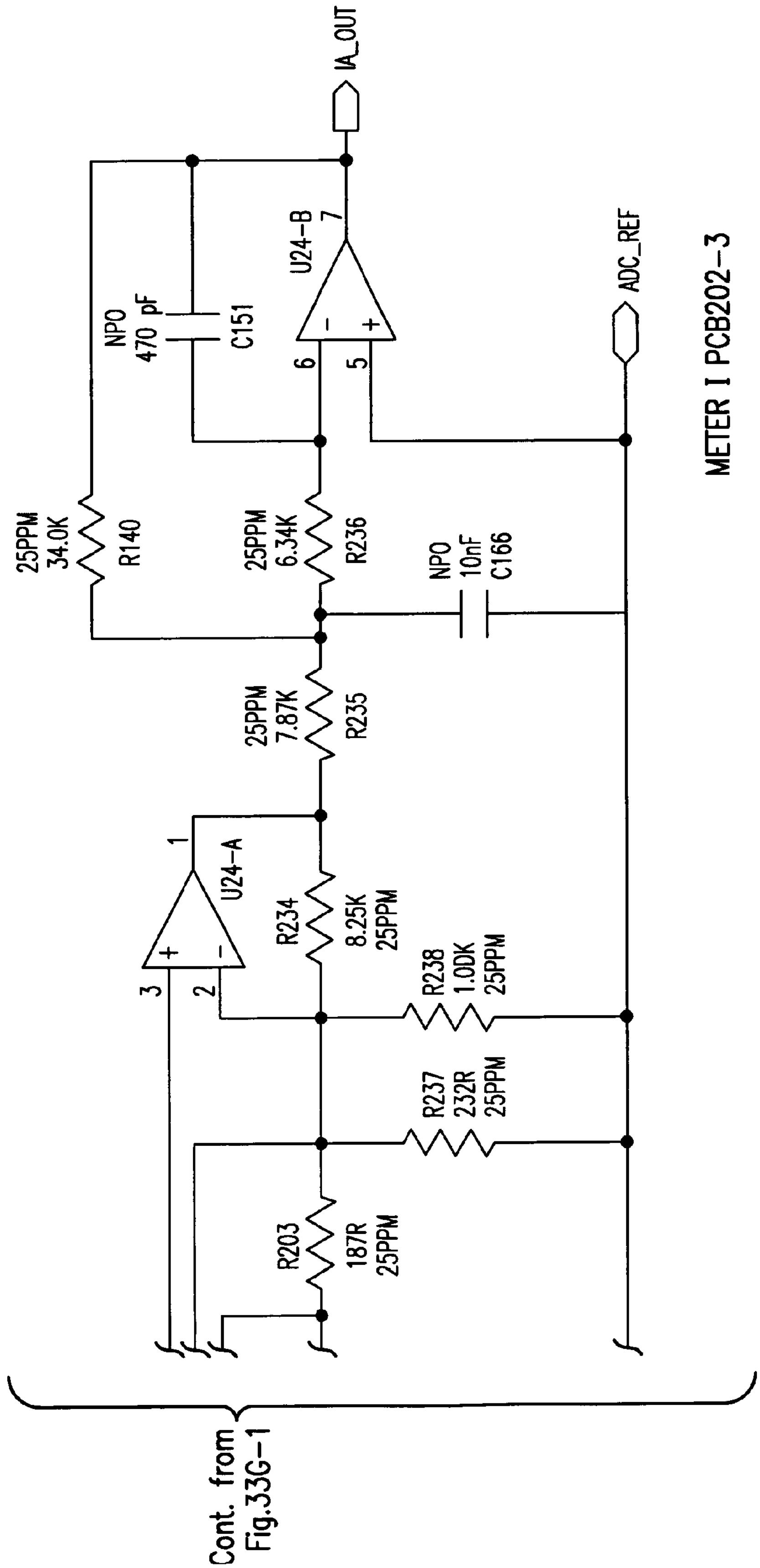
Figures 3, 33G:
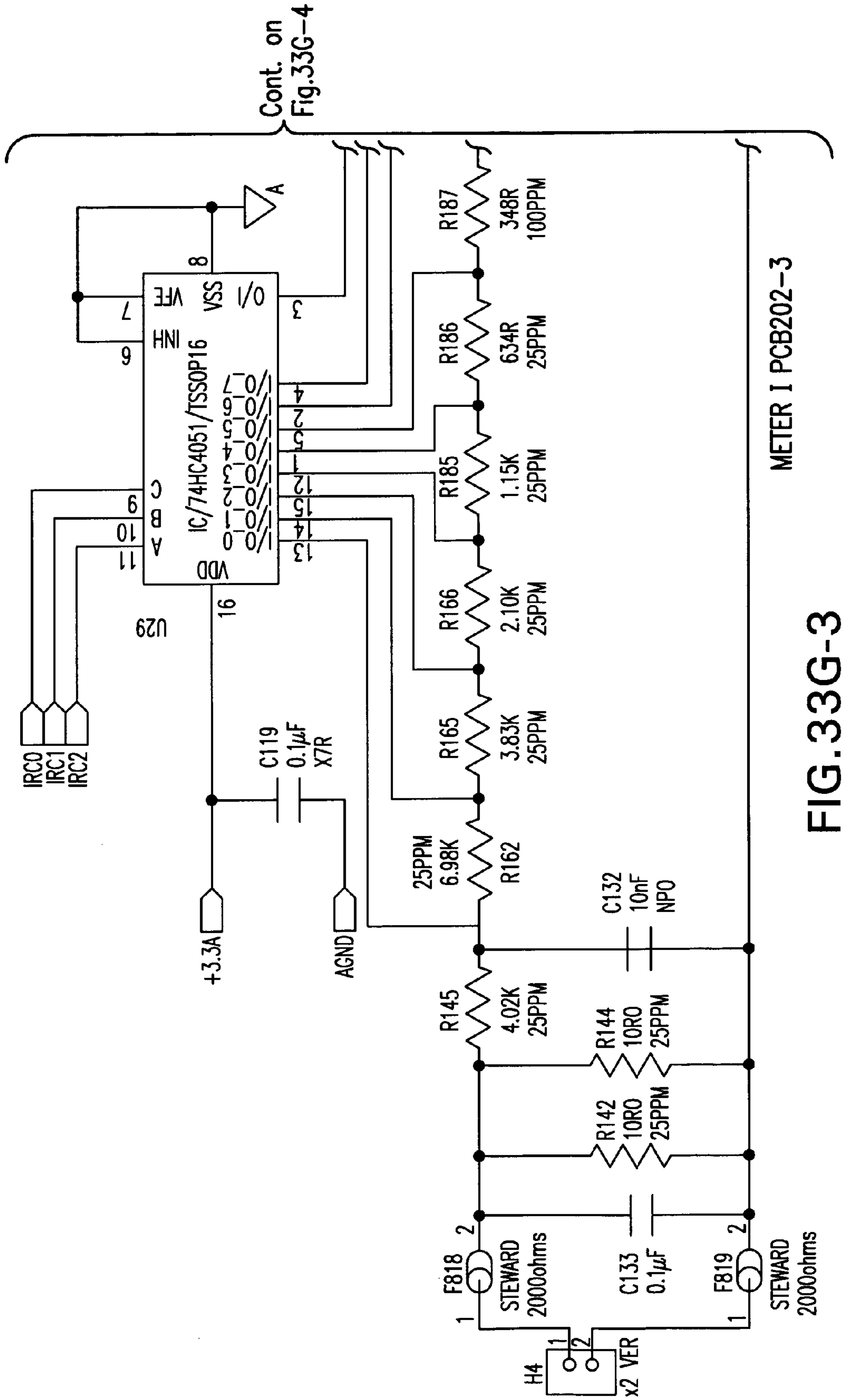
Figures 4, 33G:
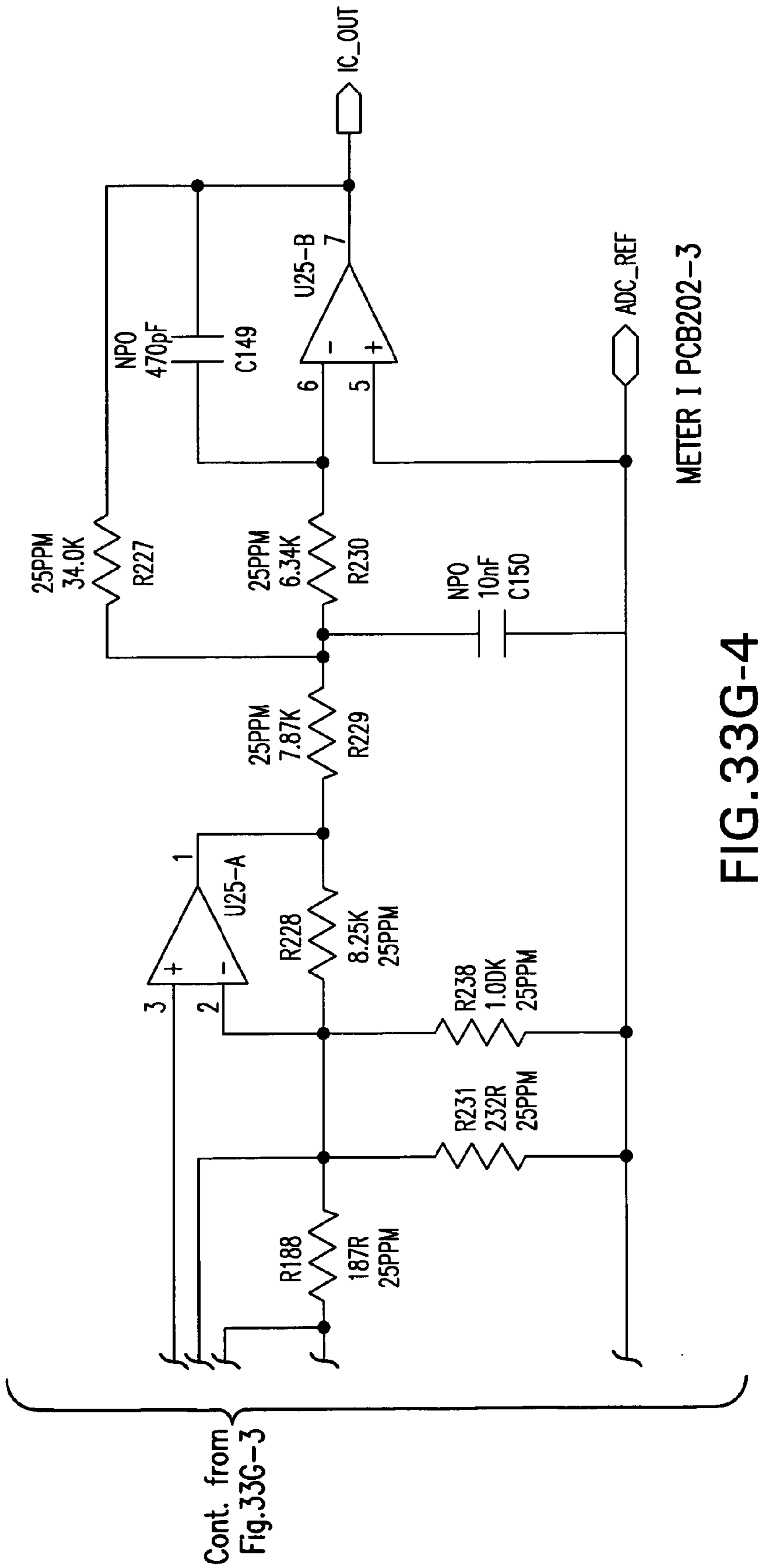
Figures 5, 33G:
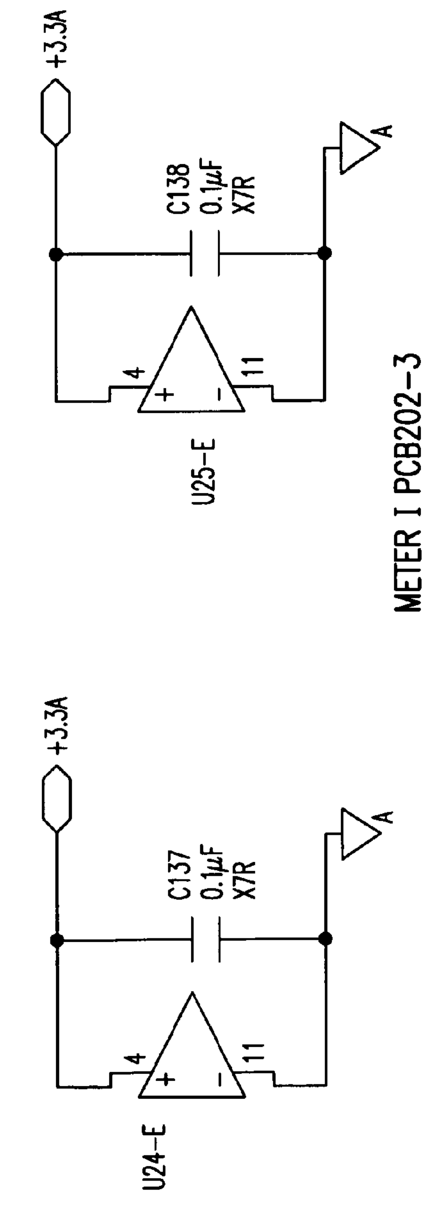
Figures 1, 33H:
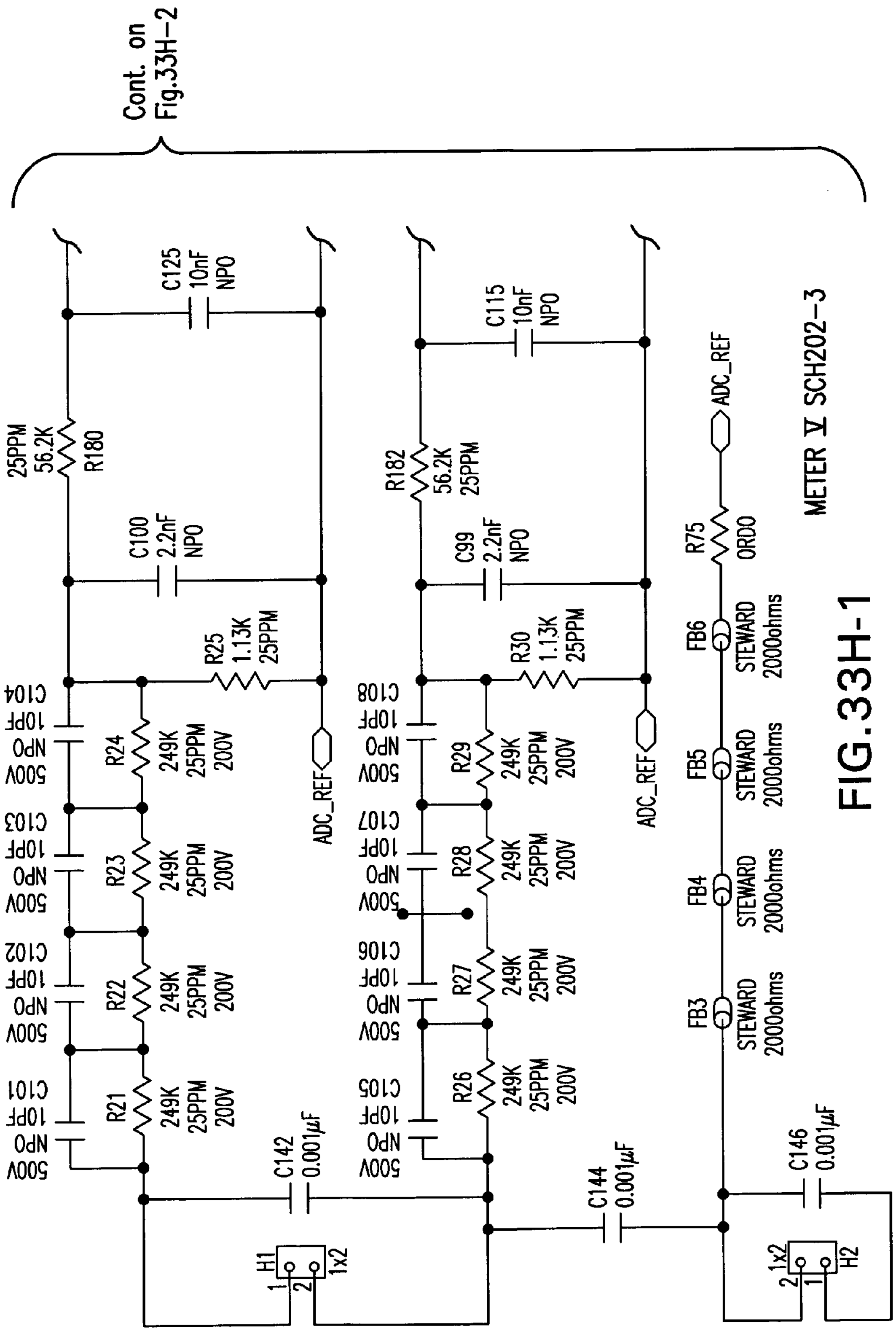
Figures 2, 33H:
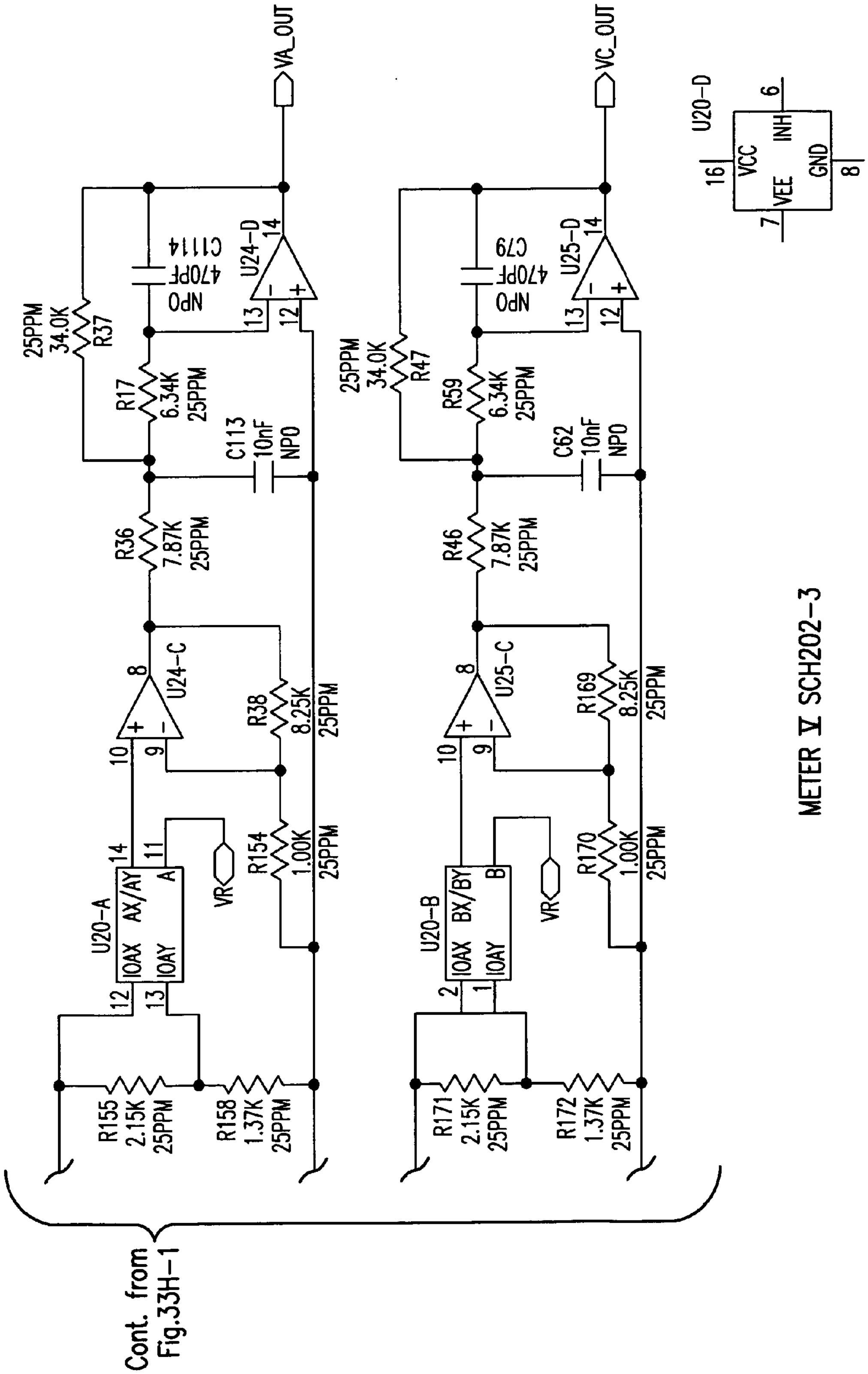
Figures 1, 33I:
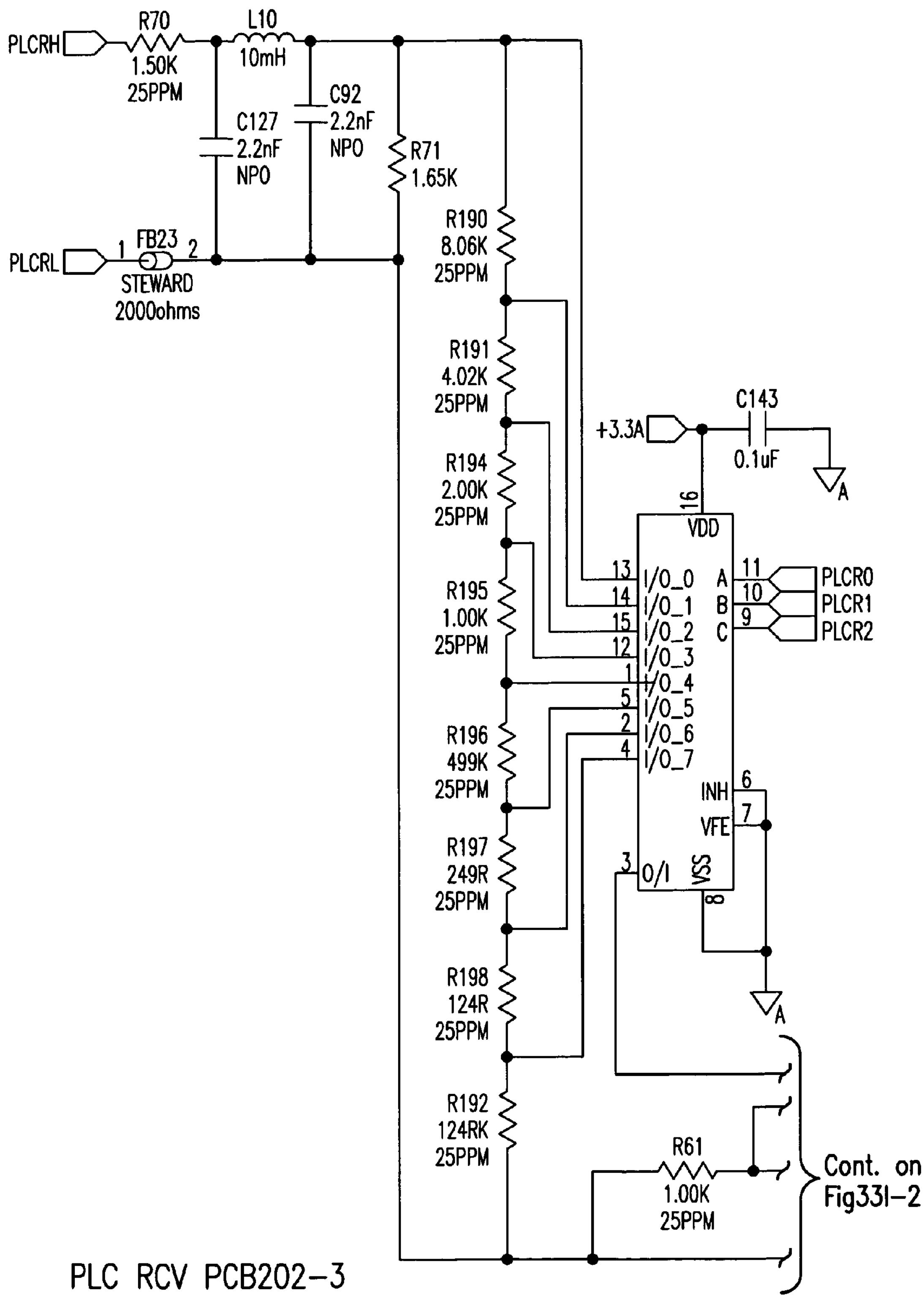
Figures 2, 33I:
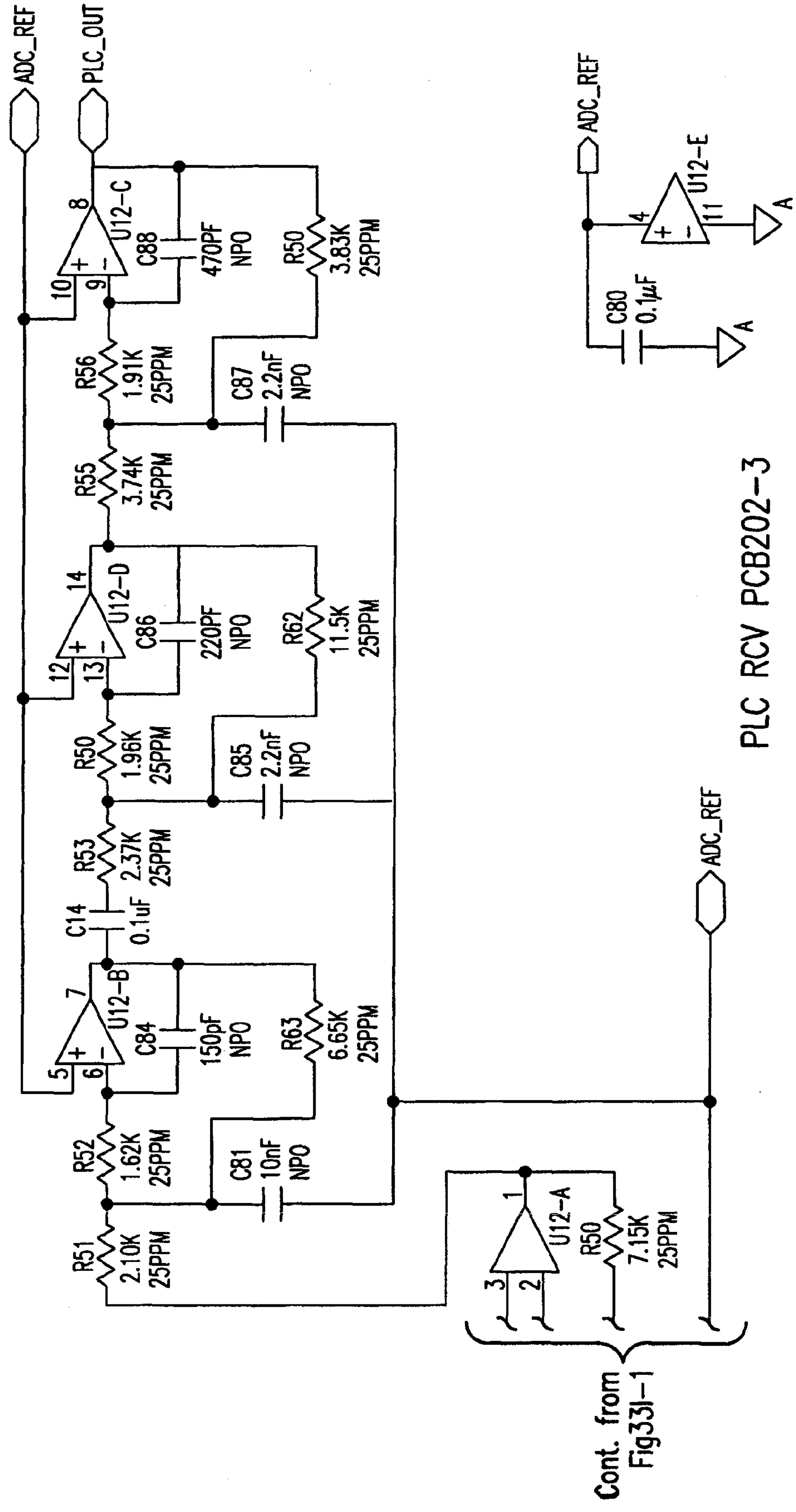
Figure 33J:
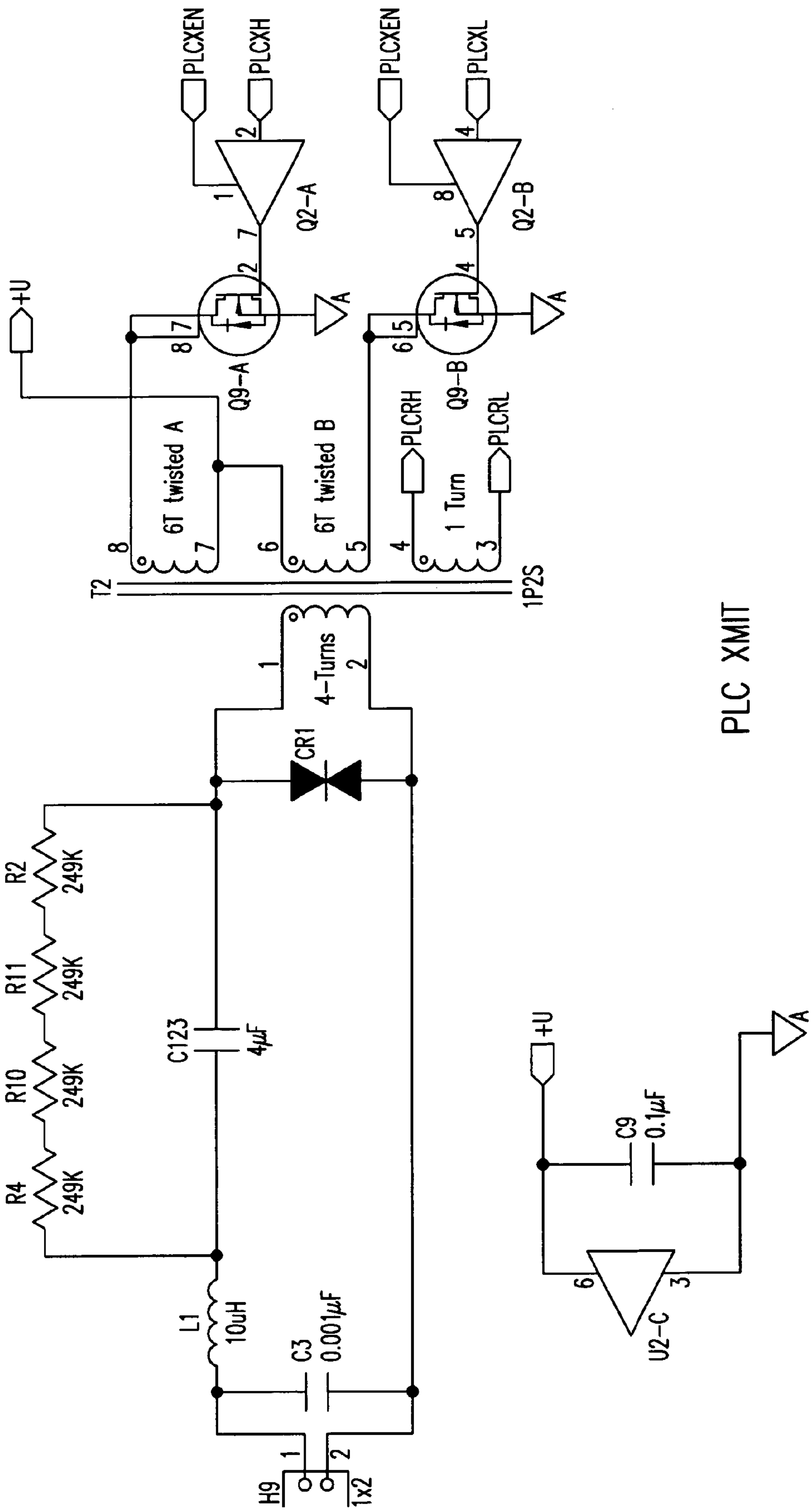
Figure 33K:
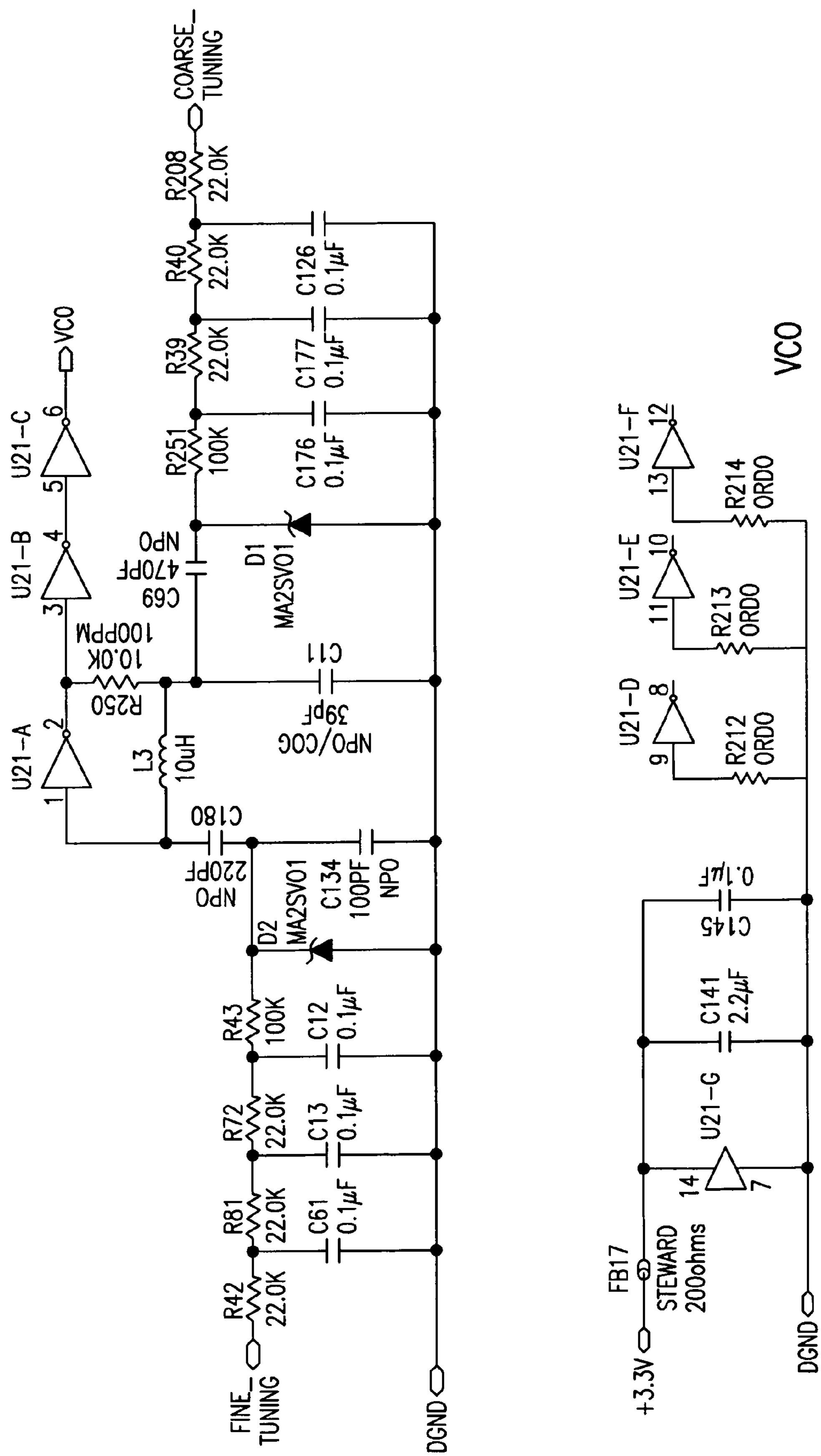
Figure 33L:
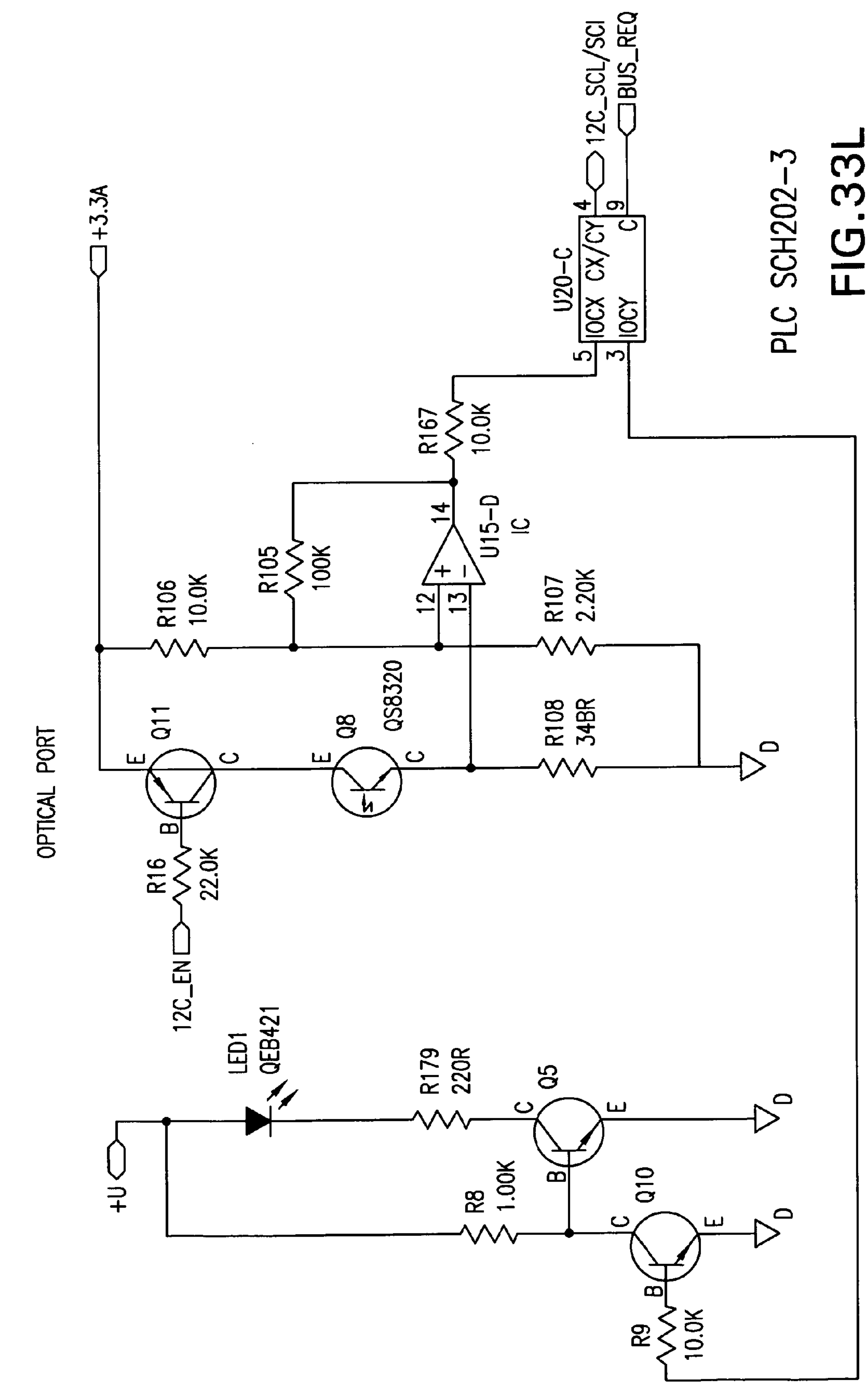
Figure 33M:
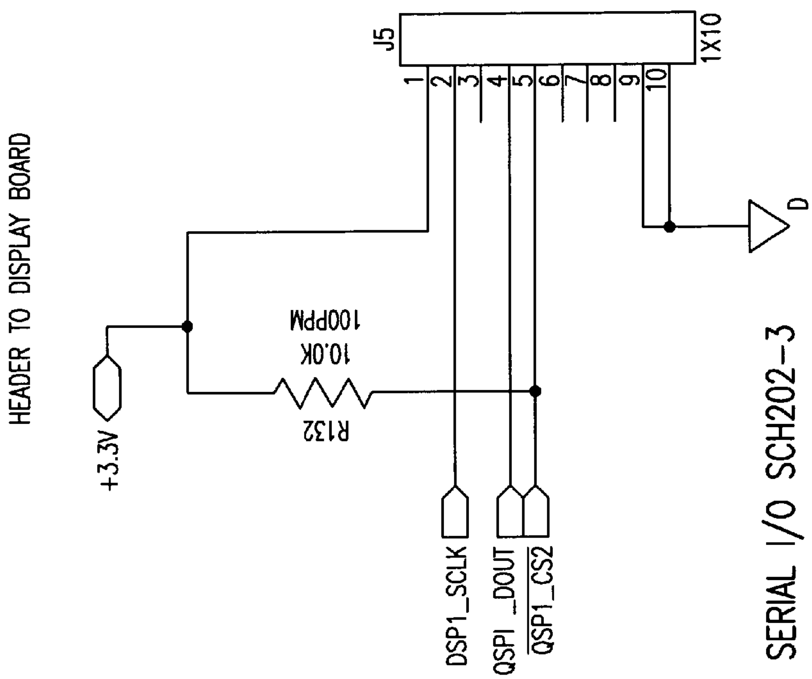
Figure 33N:
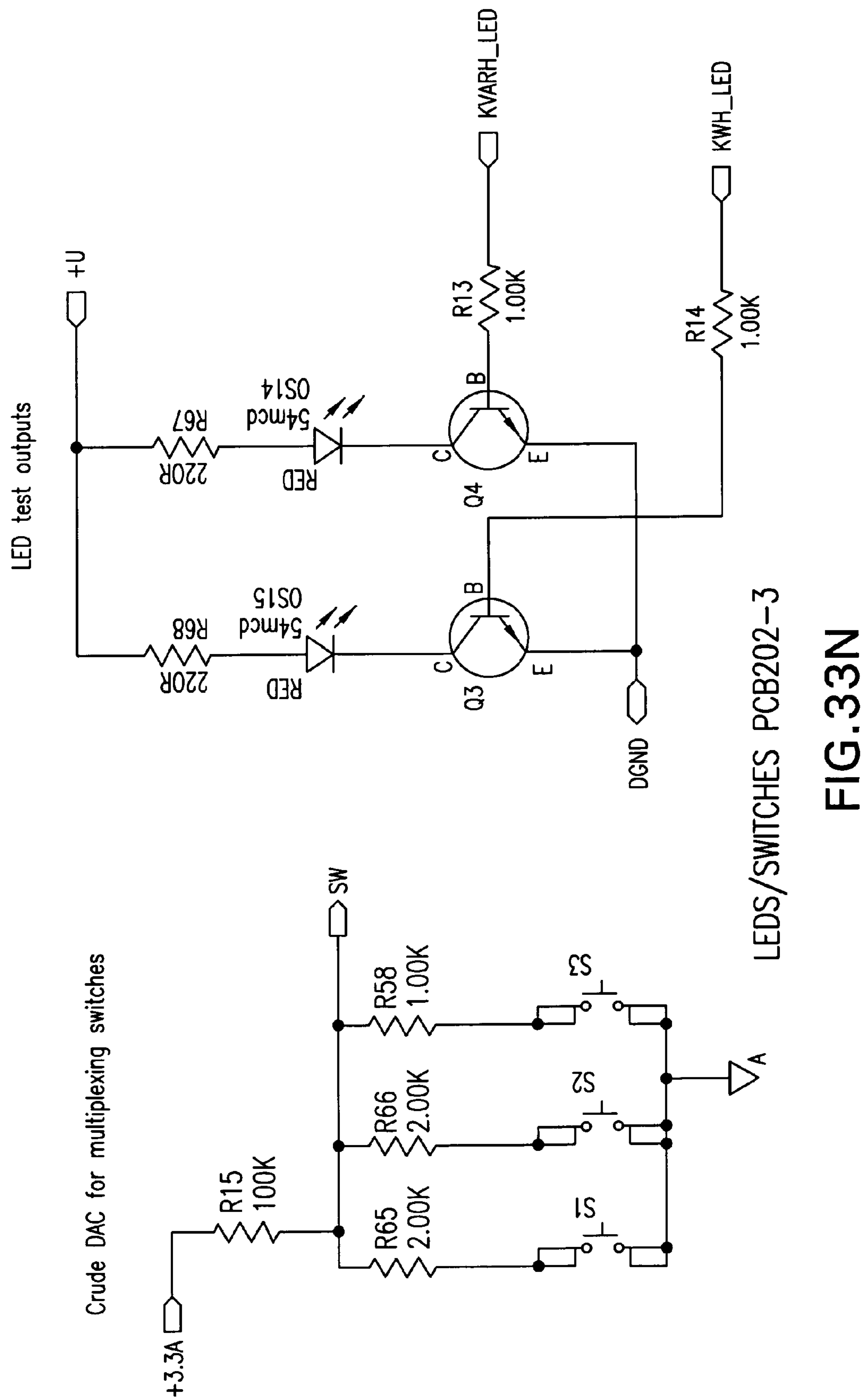

Finally, Control Module 2520 comprises a routing board (PCB 235; see FIG. 32 for schematic) with traces and a header with no electronic components on it.

Each Customer Display Module (CDM) 2530 is installed at the customer's premises and can bidirectionally communicate with the EG installed at the distribution transformer serving the customer. Two-way PLC enables utility-customer communication over low voltage power lines and allows the utility to send regular information, warnings, special information about outages, etc. to the customer.

Figure 34A:
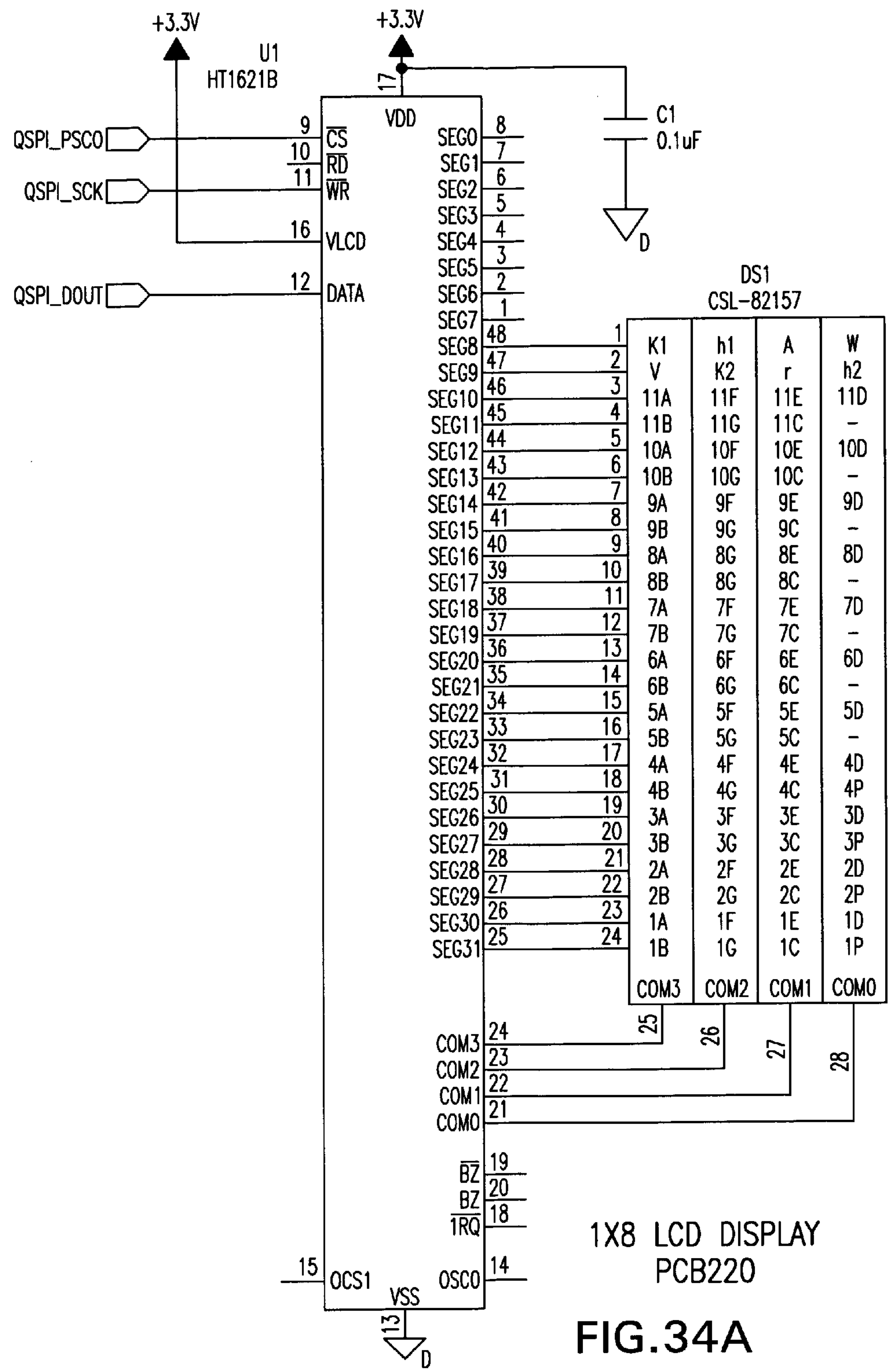
FIGS. 34A-B illustrate preferred schematics for a display board for the CDM.
Figure 34B:
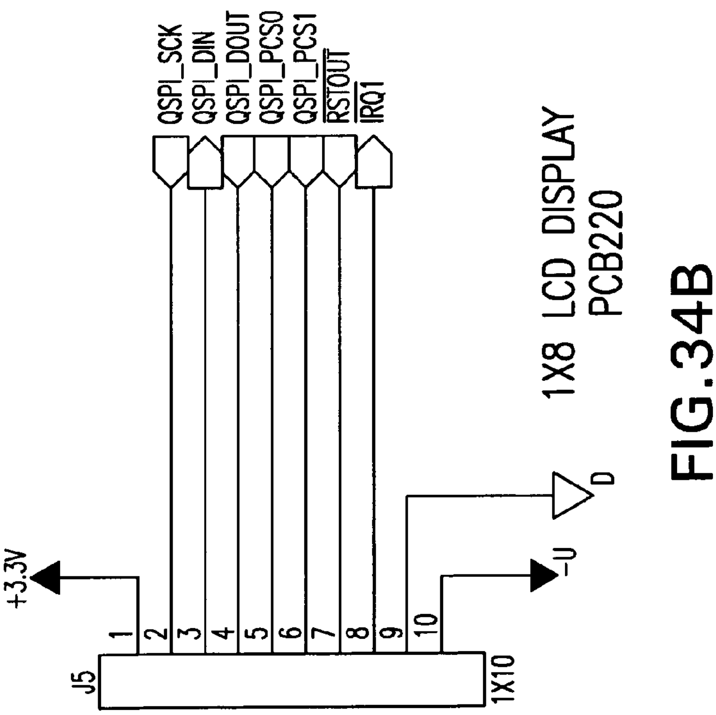

Each CDM 2530 comprises a selected combination of metering and power supply along with PLC circuitry on the same board (PCB 240; see FIG. 33 for schematic). Each CDM preferably also has a 9-digit display board (PCB 220; see FIG. 34 for schematic). This display communicates with EG and shows information about consumption, cautions, warnings, and other utility messages.

Hardware Implementation

In one embodiment, the Energy Guard implements Fast Fourier Transform (FFT) on the PLC communication signal both at the ST and the meter, and for metering purposes performs detailed harmonic analysis. This section discusses an implementation scheme of the Metering Modules, communication with Control Modules and PLC communication of the Control Module with a remotely located Scan Transponder.

The Control Module 2520 comprises power supply and PLC circuitry (PCB 210; see FIGS. 25 and 29); I/O extension (PCB 230; see FIG. 30) and CPU board named D Meter (PCB 202; see FIG. 31). The power supply supplies power to the D meter and I/O extension and contains the PLC transmitter and receiver circuitry. PCB 235 provides a trace routing and header connection between various boards.

The Metering Module may have two versions: 2-phase or 3-phase. The 2-phase version can be programmed by software to function as a single 2-phase meter or two 1-phase meters. The 2-phase version comprises a B2 meter (PCB 203 schematic shown in FIG. 26), whereas the 3-phase version comprises a B3 meter (PCB 204 schematic shown in FIG. 27). The B meters act as slaves to the D meter in Control Module 2520. The D and B meters can communicate via a serial ASCII protocol. The various B meters are interconnected via BPB 2510 to 2520 that provides power, a 1 Hz reference and serial communications to the D meter. The preferred DSP engine for the B meter is the Freescale 56F8014VFAE chip. The preferred microprocessor used for implementing the CPU on the D meter is one among the family of ColdFire Integrated Microprocessors, MCF5207. The use of a specific processor is determined by RAM and Flash requirements dictated by the meter version. A separate power supply and LCD board complete the electronic portion of the D meter as a product. Apart from acting as a master for B meters, the D meter is also a 3-phase meter and measures the total transformer output on which the EG is installed. As an anti-theft feature, this total is compared with the total consumption reported by the various B meters.

$$\sum_{n=1}^{24} kWh_n = \text{Total Transformer output}$$

The signal streams constituency is as follows:

B2: Two voltage, Two current, and No Power Line Carrier (PLC) Channel.

B3: Three voltage, Three current, and No PLC Channel.

D: Three voltage, Three current, and one PLC Channel.

Each stream has an associated circuit to effect analog amplification and anti-aliasing.

Specific to the D meter is the preferred implementation of:

- A Phase Locked Loop (PLL) to lock the sampling of the signal streams to a multiple of the incoming A/C line (synchronous sampling to the power line).
- A Voltage Controlled Oscillator (VCO) at 90-100 MHz controlled by DSP processor via two PWM modules directly driving the system clock hence making the DSP coherent with the PLL.
- A synchronous phase detector that responds only to the fundamental of the incoming line frequency wave and not to its harmonics.

Option for performing FSK and PSK modulation schemes.

Each metering and communication channel preferably comprises front-end analog circuitry followed by the signal processing. Unique to the analog circuitry is an anti-aliasing filter with fixed gain which provides first-order temperature tracking, hence eliminating the need to recalibrate meters when temperature drifts are encountered. This is discussed next, and then a preferred signal processing implementation is discussed.

Voltage and Current Analog Signal Chain

Figure 35:
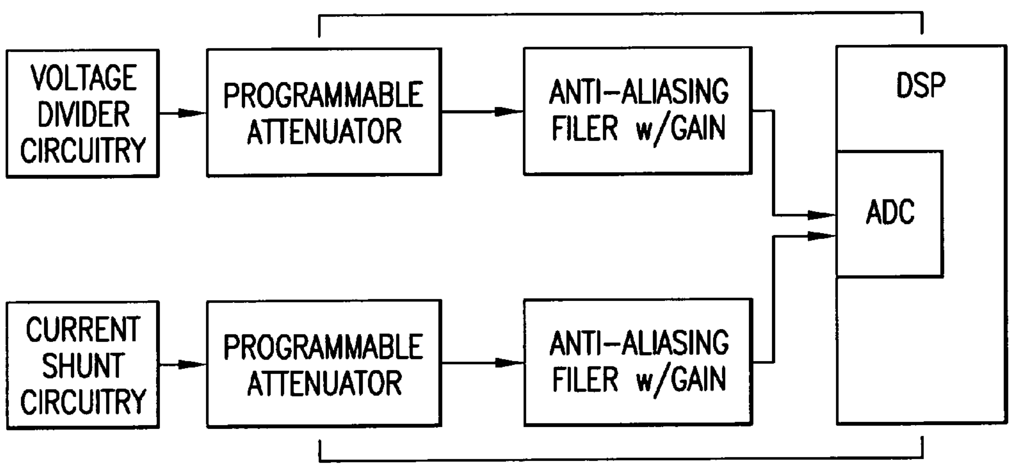
FIG. 35 is a block diagram of a preferred analog front end for metering.

The analog front-end for voltage (current) channels comprises voltage (current) sensing elements and a programmable attenuator, followed by an anti-aliasing filter. The attenuator reduces the incoming signal level so that no clipping occurs after the anti-aliasing filter. The constant gain anti-aliasing filter restores the signal to full value at the input of the Analog to Digital Converter (ADC). For metering, the anti-aliasing filter cuts off frequencies above 5 kHz. The inputs are then fed into the ADC which is a part of the DSP. See FIG. 35, which is a block diagram of a preferred analog front-end for metering.

Whereas a typical implementation would include a Programmable Gain Amplifier (PGA) followed by a low gain anti-aliasing filter, the invention, in this embodiment, implements a programmable attenuator followed by a large fixed-gain filter. In addition, the implementation of both the anti-aliasing filters on a single chip is the same using the same Quad Op Amps along with 25 ppm resistors and NPO/COG capacitors. This unique implementation by pairing the anti-aliasing filters ensures that the phase drifts encountered in both voltage and current channels are exactly identical and hence accuracy of the power calculation (given by the product of V and I) is not compromised. This provides a means for both V and I channels to track temperature drifts up to first order without recalibrating the meter.

In contrast, using a PGA along with a low gain filter cannot track the phase shift in the V and I signals introduced due to temperature. This is because the phase shift introduced by PGA is a function of the gain.

Voltage, Current and PLC Digital Signal Chain

Figure 36:
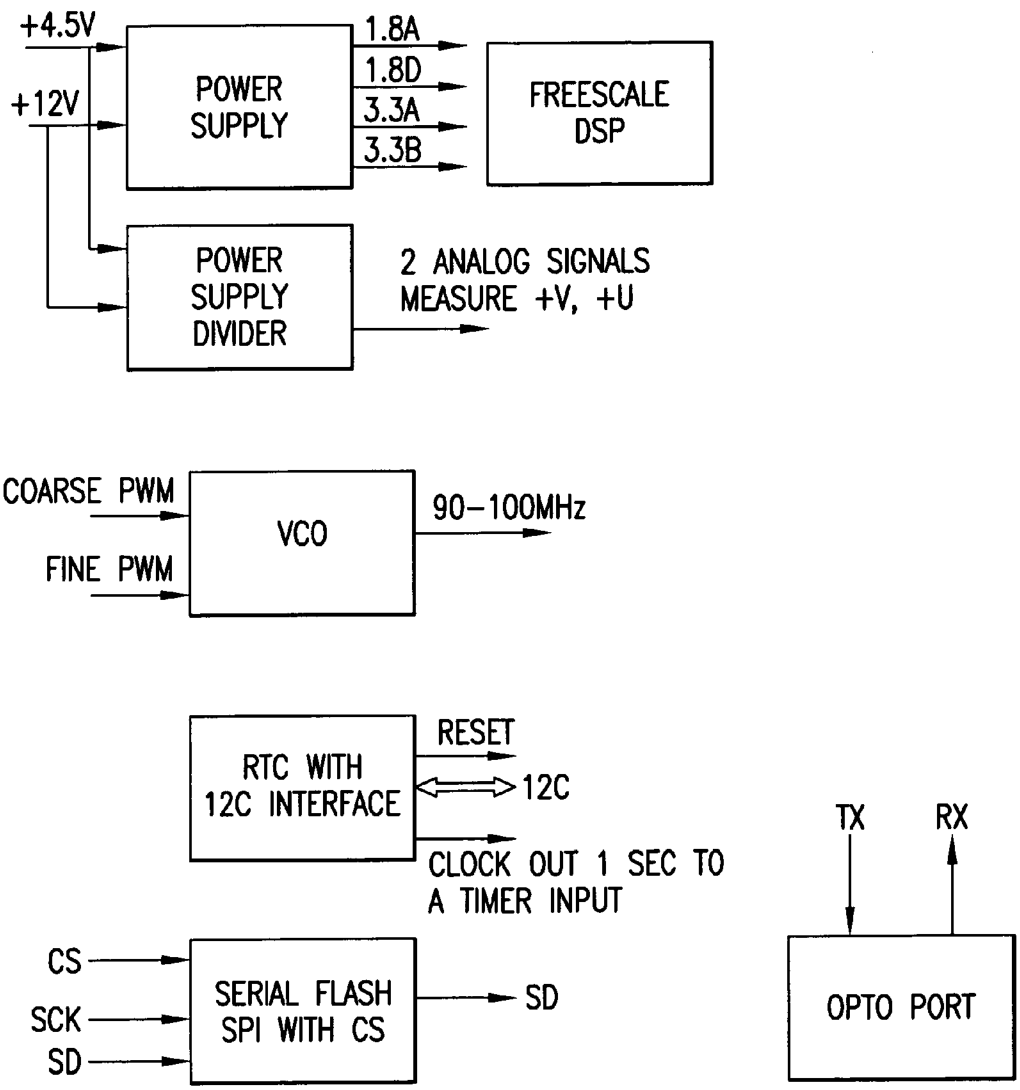
FIGS. 36 and 37 depict preferred DSP implementations.

FIG. 36 is a block diagram of the PCB 202 board; the functions of each block will be apparent to those skilled in the art. FIG. 36 shows a preferred DSP implementation.

Figure 37:
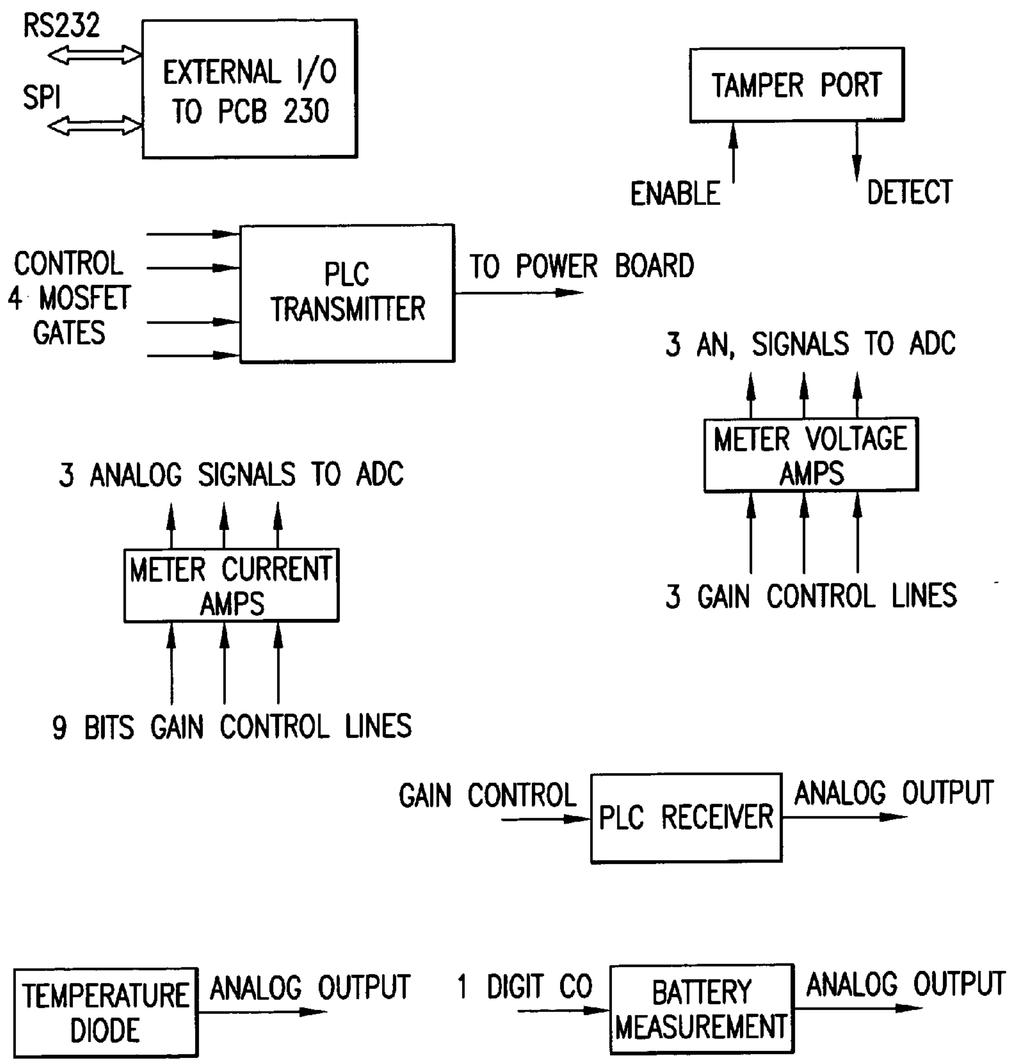

This embodiment preferably uses a PLL to lock the sampling of the signal streams to a multiple of the incoming A/C line frequency. In the embodiment discussed above, the sampling is at a rate asynchronous to the power line. In the D meter, there is a VCO at 90-100 MHz which is controlled by the DSP engine via two PWM modules. The VCO directly drives the system clock of the DSP chip (disabling the internal PLL), so the DSP becomes an integral part of the PLL. Locking the system clock of the DSP to the power line facilitates the alignment of the sampling to the waveform of the power line. The phase detector should function so as to respond only to the fundamental of the incoming 60 Hz wave and not to it harmonics. FIG. 37 is a block diagram of this preferred DSP implementation.

A DSP BIOS or voluntary context switching code provides three stacks, each for background, PLC communications and serial communications. The small micro communicates with the DSP using a I2C driver. The MSP430F2002 integrated circuit measures the power supplies, tamper port, temperature and battery voltage. The tasks of the MSP430F2002 include:

i. maintain an RTC;

ii. measure the battery voltage;

iii. measure the temperature;

iv. measure the +U power supply;

v. reset the DSP on brown out;

vi. provide an additional watchdog circuit; and vii. provide a 1-second reference to go into the DSP for a time reference to measure the 1-second reference against the system clock from the VCO.

D Meter PLC Communication Signal Chain

A typical installation consists of multiple EGs and STs communicating over the power lines. The D meter communicates bi-directionally with a remotely located Scan Transponder through the distribution transformer. To enable this, this embodiment uses a 10-25 kHz band for PLC communication. The PLC signal is sampled at about 240 kHz (212*60), synchronous with line voltage, following which a Finite Impulse Response (FIR) filter is applied to decimate the data. Preferred FIR specifications are given below:

| 10-25 kHz Band | |
|---|---|
| Number of Taps | 65 |
| Stop Band Attenuation | 71.23 dB |
| Pass band Upper Freq | 25 kHz |
| Stop band Lower Freq | 35 kHz |
| Sampled in | 60 * 4096 |
| Sample Out | 30 * 2048 |

Figure 38B:
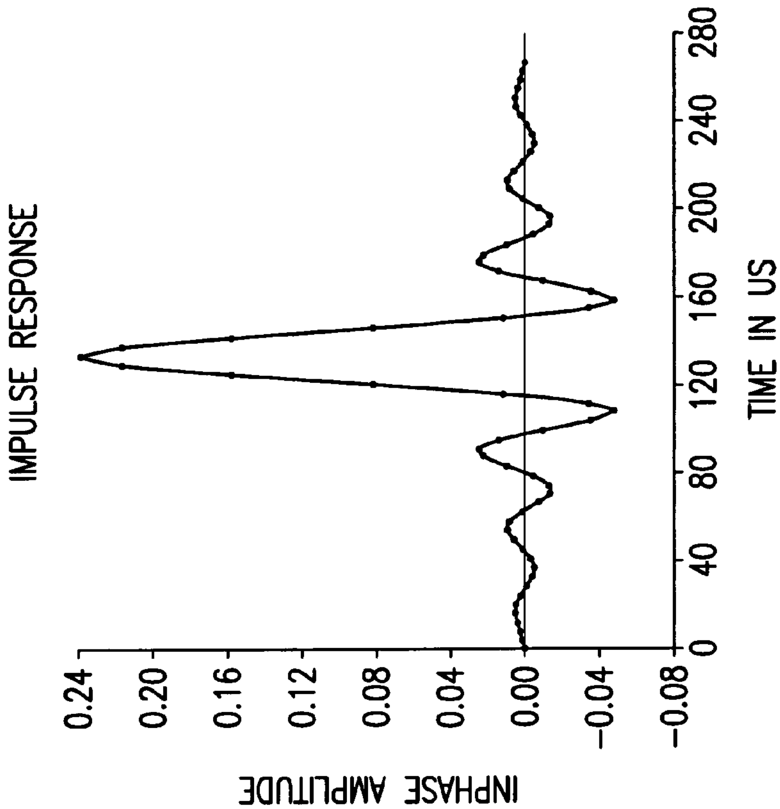
FIGS. 38A-B illustrate preferred in-phase filter frequency and implulse response characteristics.
Figure 38A:
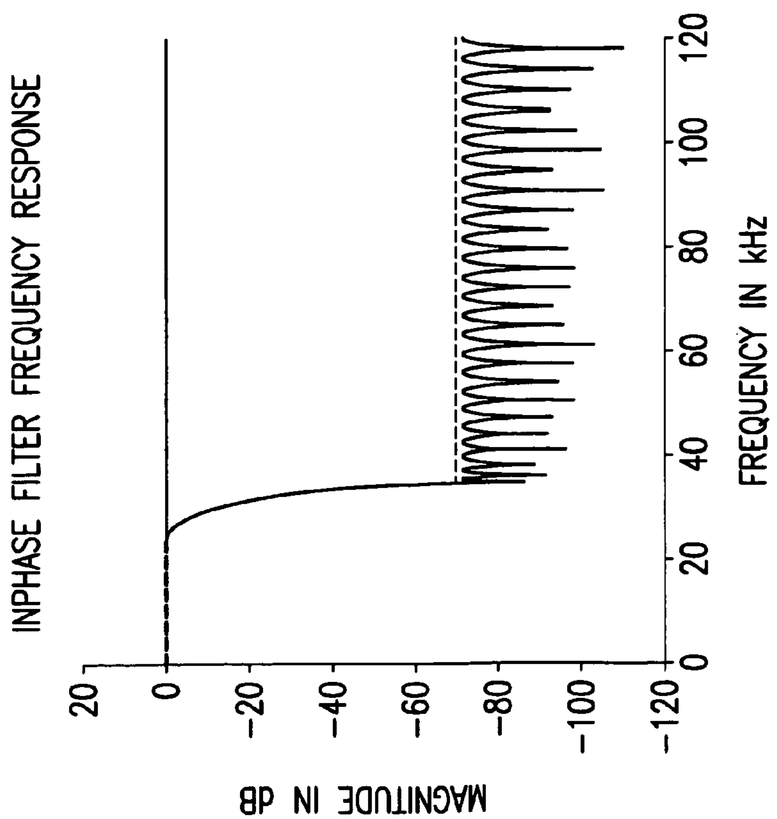

See FIG. 38 for preferred inphase filter frequency response and impulse response characteristics.

After the decimation is done to 60 kHz ($2^{11}$*30), a 2048-point FFT is then performed on the decimated data. The data rate is thus determined to be 30 baud depending on the choice of FIR filters. Every FFT yields two bits approximately every 66 msec when using FIR in the 10-25 kHz band to communicate through distribution transformers.

To circumvent the problem of communicating in the presence of line noise, this embodiment preferably implements a unique technique for robust and reliable communication. This is done by injecting PLC signals at frequencies that are half odd harmonics of the line frequency (60 Hz). This is discussed below, for an embodiment using a typical noise spectrum found on AC lines in the range 12-12.2 kHz.

Figure 39:
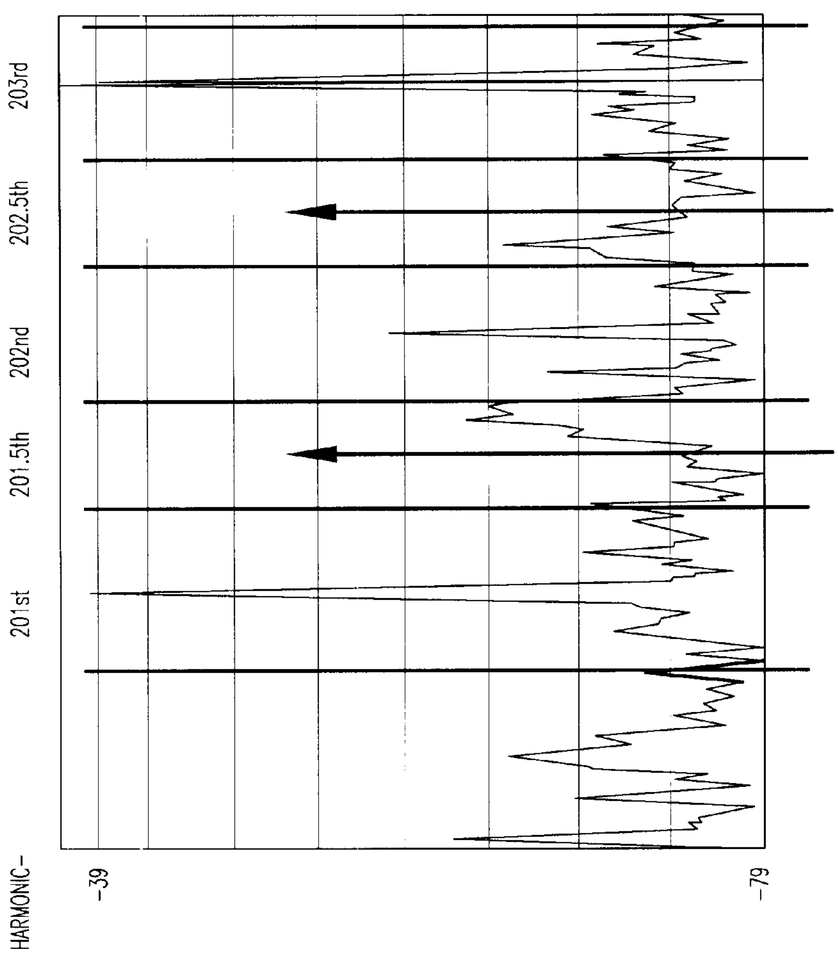
FIG. 39 illustrates injecting PLC signals at half-odd harmonics of 60 Hz.

FIG. 39 illustrates injecting PLC signals at half-odd harmonics of 60 Hz. Since FFT is done every 30 Hz and the harmonics are separated by 60 Hz, the data bits reside in the bin corresponding to the 201.5th and 202.5th harmonic of 60 Hz in FIG. 39. The algorithm considers these two bins of frequencies and compares the amplitude of the signal in the two to determine 1 or 0. This FSK scheme uses two frequencies and yields a data rate of 30 baud. Alternatively, QFSK, which uses 4 frequencies, can be implemented to yield 60 baud.

When traversing through transformers, both STs and D meters preferably perform FFT on the PLC and data signals every 30 Hz in a 10-25 kHZ range. Because the Phase Lock Loops (PLLs) implemented in both the ST and the D meter are locked to the line, the data frames are synchronized to the line frequency (60 Hz) as well. However, the data frames can shift in phase due to:

1. various transformer configurations that can exist in the path between the ST and meter (delta-Wye, etc.); and 2. a shift in phase due to the fact that STs are locked on a particular phase, whereas single and polyphase meters can be powered up by other phases.

Figure 40:
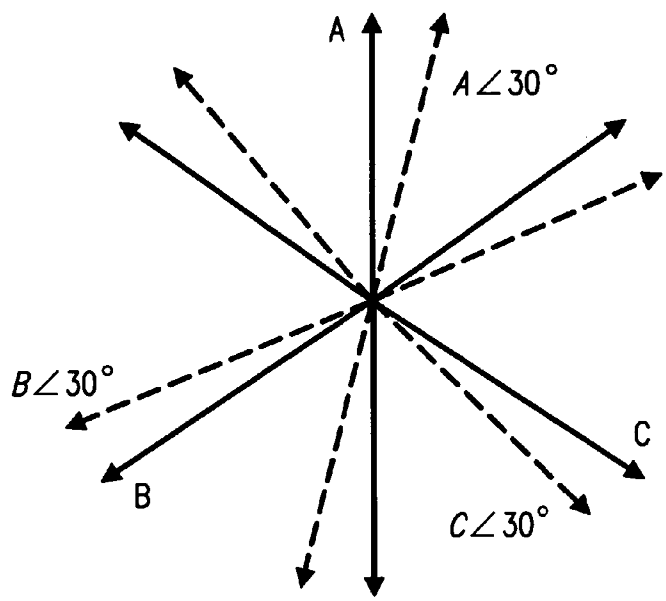
FIG. 40 depicts 12 possible ways in which an FFT frame received by a meter can be out of phase with a scan transponded FFT frame.

The signal to noise ratio (SNR) is maximized when the meter data frame and ST data frames are aligned close to perfection. From a meter's standpoint, this requires receiving PLC signal from all possible STs that it can "hear," decoding the signal, checking for SNR by aligning data frames, and then responding to the ST that is yielding maximum SNR. FIG. 40 depicts the 12 possible ways in which the FFT frame received by the meter can be out of phase with ST FFT frame. Dotted lines correspond to a 30 degree rotation accounting for a delta transformer in the signal path between ST and the meter.

In addition, because the data frames are available every 30 Hz on a 60 Hz line, there are two possibilities corresponding to the 2 possible phases obtained by dividing 60 Hz by 2. Hence, there are 24 ways that meter data frames can be misaligned with ST data frames.

In each frame of the ST, there are an odd integral number of cycles of the carrier frequency. Since the preferred modulation scheme is Frequency Shift Keying (FSK), if there are n cycles for transmitting bit 1, bit 0 is transmitted using n+2 cycles of the carrier frequency. It becomes vital for the meter to recognize its own 2 cycles of 60 Hz in order to be able to decode its data bits which are available every 1/30th of a second.

If the D meter decodes signals with misaligned data frames, there is energy that spills over into the adjacent (half-odd separated) frequencies. If the signal level that falls into the "adjacent" frequency bin is less than the noise floor, the signal can be decoded correctly. However, if the spill-over is more than the noise floor, the ability to distinguish between 1 and 0 decreases, and hence the overall SNR drops, resulting in an error in decoding. In conclusion:

a. If the frames are misaligned, smearing of data bits occurs and the SNR degrades.

b. In the event that the frequency changes and there are misaligned data frames, there is a substantial amount of energy that spills over into the adjacent FFT bins, hence interfering with the other STs in the system that communicate using frequencies in that specific bins.

Once the clock shift is determined corresponding to the highest SNR, the meter then locks until a significant change in SNR ratio is encountered by the meter, in which case the process repeats.

Implementation of Metering in D and B Meter Using FFT

Figure 41B:
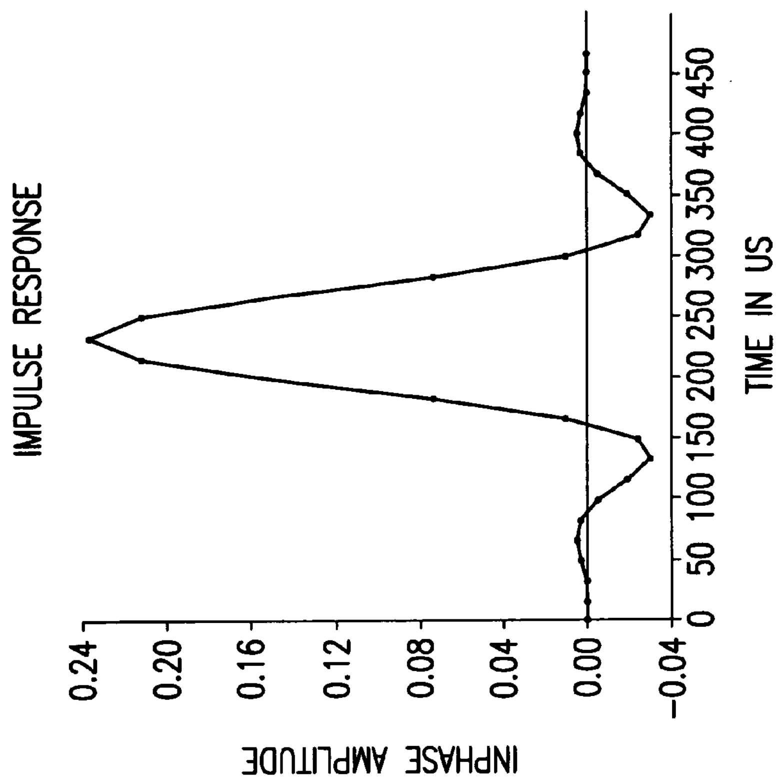
FIGS. 41A-B illustrate preferred FIR filter specifications.
Figure 41A:
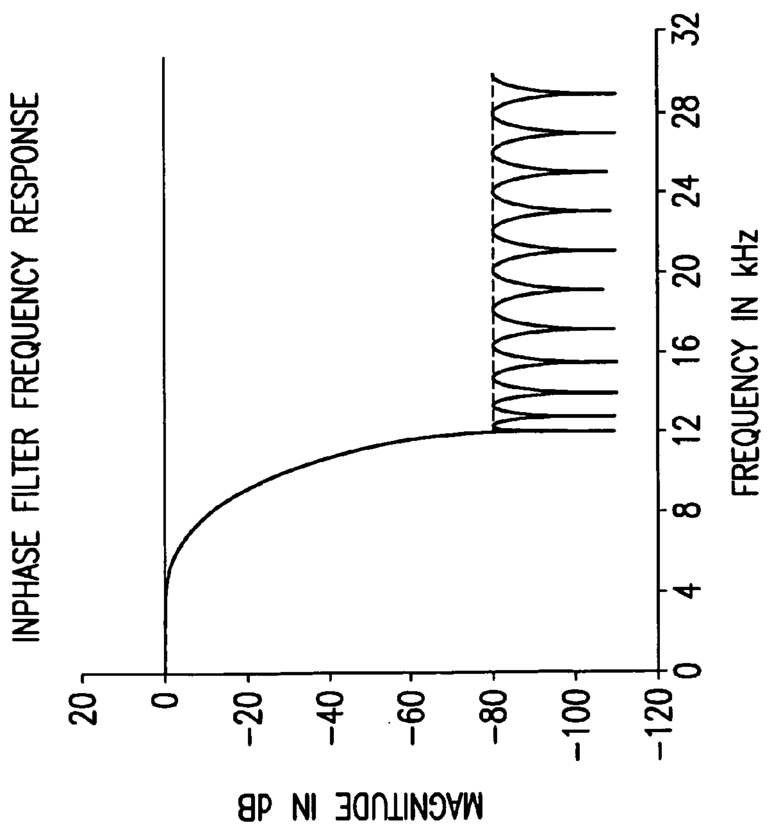

Whereas versions of the B meter and the D meter perform metering, the D meter also is responsible for collecting the metering information from the various B meters via PCB 234. Each data stream in the meters has an associated circuit to effect analog amplification and anti-aliasing. Each of the analog front end sections has a programmable attenuator that is controlled by the higher level code. The data stream is sampled at 60 kHz ($2^{10}$*60) and then an FIR filter is applied to decimate the data stream to ~15 kHz ($2^8$*60). Preferred filter specifications are shown in the table below and FIG. 41.

| | |
|---|---|
| Number of Taps | 29 |
| Stop Band Attenuation | 80.453 dB |
| Pass band Upper Freq | 3 kHz |
| Stop band Lower Freq | 12 kHz |

Since only the data up to 3 kHz is of interest, preferably a 3-12 kHz rolloff on the decimating FIR is used with ~15 KHZ sample rate. The frequencies from 0-3 kHz or 12-15 kHz are mapped into 0-3 kHZ. A real FFTs is performed to yield 2 streams of data which can be further decomposed into 4 streams of data: Real and Imaginary Voltage and Real and Imaginary Current. This is achieved by adding and subtracting positive and negative mirror frequencies for the real and imaginary parts, respectively. Since the aliased signal in the 12-15 kHZ range falls below 80 dB, the accuracy is achieved using the above-discussed FIR filter. Alternatively, a 256-point complex FFT can be performed on every phase of the decimated data stream. This yields 2 pairs of data streams: a real part, which is the voltage, and an imaginary part, which is the current. This approach requires a 256 complex FFT every 16.667 milliseconds.

Figure 42:
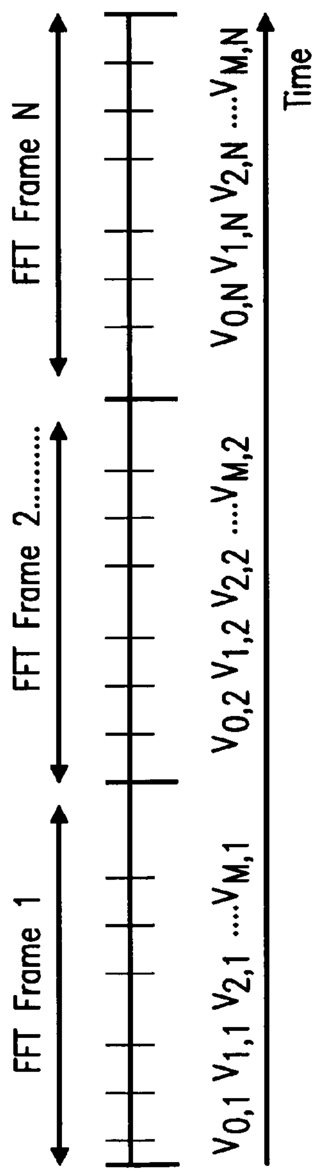
FIG. 42 depicts voltage and current resulting from a preferred FFT.

The results of performing either FFT are the voltage and current shown in FIG. 42, where the notation $V_{m,n}$ denotes the $m^{th}$ harmonic of the $n^{th}$ cycle number. For example, $V_{11}$ and $I_{11}$ correspond to the fundamental of the first cycle, and $V_{21}$ and $I_{21}$ to the first harmonic of the first cycle, etc., as shown in FIG. 42, which depicts FFT frames for voltage, indicating the harmonics.

The real and imaginary parts of the harmonic content of any $k^{th}$ cycle are given by:

$$V_{mk}=Re(V_{mk})+iIm(V_{mk});m=1 \ldots M$$

$$I_{mk}=Re(I_{mk})+iIm(I_{mk});k=1 \ldots n$$

The imaginary part of voltage is the measure of lack of synchronization between the PLL and the line frequency. In order to calculate metering quantities, the calculations are done in the time domain. In the time domain, the FFT functionality offers the flexibility to calculate metering quantities either using only the fundamental or including the harmonics. Using the complex form of voltage and current obtained from the FFT, the metering quantities are calculated as:

$$P=V_{mk}*I_{mk}*$$

$$W=Re(P)=Re(V_{mk})*Re(I_{mk})+Im(I_{mk})*Im(V_{mk})$$

$$Var=Im(P)=Re(I_{mk})*Im(V_{mk})-Re(V_{mk})*Im(I_{mk})$$

$$\text{PowerFactor}=W/P$$

However, in the above formulas, when the harmonics are included ($V_{mk}$&$I_{mk}$; m=1 . . . M, k=1 . . . n), all metering quantities include the effects of harmonics. On the other hand, when only the fundamental is used ($V_{1k}$&$I_{1k}$), all calculated quantities represent only the 60 Hz contribution. As an example, we show the calculations when only the fundamental is used to perform calculations. Only $V_1$ and $I_1$ are used from all FFT data frames. The following quantities are calculated for a given set of N frames and a line frequency of $f_{line}$:

$$kWh = \sum_{i=1}^{N} [\mathrm{Re}(V_{1i}) * \mathrm{Re}(I_{1i}) + \mathrm{Im}(V_{1i}) * \mathrm{Im}(I_{1i})] * \Delta t_i * 10^{-3}$$

$$kVAr = \sum_{i=1}^{N} [\mathrm{Re}(I_{1i}) * \mathrm{Im}(V_{1i}) - \mathrm{Re}(V_{1k}) * \mathrm{Im}(I_{1k})] * \Delta t_i * 10^{-3}$$

$$kVAh = \sum_{i=1}^{N} |V_{1i}| * |I_{1i}| * \Delta t_i * 10^{-3}$$

$$V^2 h = \sum_{i=1}^{N} |V_{1i}|^2 * \Delta t_i$$

$$I^2 h = \sum_{i=1}^{N} |I_{1i}|^2 * \Delta t_i$$

$$\Delta t = 1 / f_{line};$$

The displacement power factor is given by:

$$\mathrm{Cos}(\theta) = \left|\frac{W}{VA}\right|;$$

where W and VA include only the fundamentals and $$VA_1 = V_1 RMS * I_1 RMS; \text{ where}$$

$$V_1 RMS = \sqrt{\sum_{n=1}^{N} |V_{1,n}|^2} \ \& \ I_1 RMS = \sqrt{\sum_{n=1}^{N} |I_{1,n}|^2};$$

for N cycles.

This flexibility to either include or exclude the harmonics when calculating metering quantities translates to a significant improvement over the capabilities offered by the above-described embodiment. Yet another feature offered by this embodiment is the calculation of Total Harmonic Distortion (THD). The THD is the measurement of the harmonic distortion present, and is defined as the ratio of the sum of the powers of all harmonic components to the power of the fundamental. For the $n^{th}$ cycle, this is evaluated as:

$$VTHD_n = \frac{\sqrt{\sum_{m=2}^{M} V_{mn}^2}}{V_{1n}} \ \& \ ITHD_n = \frac{\sqrt{\sum_{m=2}^{M} I_{mn}^2}}{I_{1n}};$$

$V_{mn}(I_{mn})$ is the $m^{th}$ harmonic from the $n^{th}$ cycle obtained from the FFT, where $$V_{m,n}{}^2=Re(V_{m,n})^2+Im(V_{m,n})^2\&I_{m,n}{}^2=Re(I_{m,n})^2+Im(I_{m,n})^2$$

Customer Display Module

The customer display module is installed at the customer premises, communicates with Energy Guard near the transformer, and comprises: PCB 240, power supply and PLC circuitry (see FIG. 33); and PCB 220, LCD display (see FIG. 34). In one embodiment, the customer display unit installed at customer's residence is a bidirectional PLC unit that communicates with EG. For example, not only can the utility send messages, the customer can also request a consumption verification with the EG installed at the pole.

While certain specific embodiments of the invention have been described herein for illustrative purposes, the invention is not limited to the specific details, representative devices, and illustrative examples shown and described herein. Various modifications may be made without departing from the spirit or scope of the invention defined by the appended claims and their equivalents.

The invention claimed is:

1. An apparatus for remote multi-channel metering of electricity using power line communication, comprising:

a plurality of metering points located on a secondary side of a transformer and operable to separately measure electricity usage for each of a plurality of electricity consumer lines;

said apparatus in direct communication with a transponder located on a primary side of said transformer operable to transmit data to and receive data from said transponder via direct power line communication, said transponder operable to transmit data to and receive data from a remotely located computer;

said apparatus operable to control one or more load control modules operable to actuate connection and disconnection of each of a plurality of relays, each relay of said plurality of relays corresponding to one of said plurality of electricity consumer lines; and a box containing said plurality of metering points, said load control module, and said relays, wherein said distribution transformer converts medium tension distribution voltages to low tension voltages appropriate for supplying power to customers, and wherein said apparatus is operable to inject signals onto and receive signals from low voltage power lines that supply customers with electric power; said signals providing two-way communication between said meter head and said transponder and traversing said distribution transformer.

2. An apparatus as in claim 1, further comprising a tamper detector in communication with said meter head.

3. An apparatus as in claim 2, wherein said tamper detector comprises a light and a reflective surface, and wherein said meter head is operable to instruct said load control module to disconnect all of said customer lines if said tamper detector provides notification that said light is not detected reflecting from said reflective surface.

4. An apparatus as in claim 2, wherein said tamper detector comprises a detector of ambient light entering said box.

5. An apparatus as in claim 1, wherein said box is installed on a utility pole.

6. An apparatus as in claim 1, further comprising means for comparing transformer energy to total energy used by said consumer lines.

7. An apparatus as in claim 1, further comprising means for detecting reverse voltage flow through said consumer lines.

8. An apparatus as in claim 1, further comprising a computer readable memory in communication with said meter head and a counter in communication with said meter head, said counter corresponding to a customer line and operable to count down an amount of energy stored in said memory, and said meter head operable to send a disconnect signal to said load control module to disconnect said customer line when said counter reaches zero.

9. An apparatus as in claim 1, further comprising a computer readable memory in communication with said meter head, said memory operable to store a load limit for a customer line, and said meter head operable to send a disconnect signal to said load control module to disconnect said customer line when said load limit is exceeded.

10. An apparatus as in claim 1, further comprising a computer readable memory in communication with said meter head, said memory operable to store a usage limit for a customer line, and said meter head operable to send a disconnect signal to said load control module to disconnect said customer line when said usage limit is exceeded.

11. An apparatus as in claim 1, wherein said transponder is operable to communicate with said remotely located computer over medium tension power lines.

12. An apparatus as in claim 1, further comprising a display unit in communication with said meter head and operable to display data received from said meter head.

13. An apparatus as in claim 12, wherein said display unit is operable to display information regarding a customer's energy consumption.

14. An apparatus as in claim 12, wherein said display unit is operable to display warnings regarding a customer's energy usage or suspected theft of energy.

15. An apparatus as in claim 12, wherein said display unit is operable to transmit to said meter head information entered by a customer.

16. An apparatus as in claim 1, wherein said transponder is operable to communicate with said remotely located computer via at least one of: radio communications, fiber optics, and telephone lines.

17. An apparatus as in claim 1, wherein said apparatus is operable to transmit data directly to said transponder at frequencies within the range 10-25 kHz.

18. An apparatus as in claim 1, wherein said apparatus is operable to transmit data directly to said transponder at frequencies corresponding to half-odd harmonics of 60 Hz.

19. An apparatus as in claim 1, wherein said box is located in a secure area.

20. An apparatus for multi-channel metering of electricity, comprising:

a control module in communication with a secondary circuit of a distribution transformer, wherein said distribution transformer converts medium tension distribution voltages to low tension voltages appropriate for supplying power to customers;

said control module in direct communication with a transponder in communication with a primary circuit of said transformer and operable to transmit data to and receive data from said transponder via direct power line communication, through said distribution transformer, said transponder operable to transmit data to and receive data from a remotely located computer;

a plurality of meter modules in communication with said control module, each meter module operable to measure electricity usage on one of a plurality of electricity consumer lines fed from the secondary circuit of said distribution transformer;

one or more relays in communication with said control module and operable to actuate connection and disconnection of electricity to said electricity consumer lines; and a box containing said control module, said meter modules and said relays, wherein said apparatus is operable to inject signals onto and receive signals from low voltage power lines that supply customers with electric power; said signals providing two-way communication between said meter head and said transponder and traversing said distribution transformer to communicate at least partially over medium tension power lines to said remotely located computer.

21. An apparatus as in claim 20, wherein said one or more relays are operable to control each phase of said electricity consumer lines.

* * * * *